US007772532B2

(12) United States Patent
Olsen et al.

(10) Patent No.: US 7,772,532 B2
(45) Date of Patent: Aug. 10, 2010

(54) CAMERA AND METHOD HAVING OPTICS AND PHOTO DETECTORS WHICH ARE ADJUSTABLE WITH RESPECT TO EACH OTHER

(76) Inventors: Richard Ian Olsen, 31 Cervantes, Newport Beach, CA (US) 92660; Darryl L. Sato, 21 Pintail, Irvine, CA (US) 92604; Borden Moller, 330 Cajon Ter., Laguna Beach, CA (US) 92651; Olivera Vitomirov, 29 Tavella Pl., Foothill Ranch, CA (US) 92610; Jeffrey A. Brady, 16 Rue Deauville, Newport Beach, CA (US) 92660; Ferry Gunawan, 1151 Walnut Ave. #113, Tustin, CA (US) 92780; Remzi Oten, 4 Salto, Aliso Viejo, CA (US) 92656; Feng-Qing Sun, 339 Santa Barbara, Irvine, CA (US) 92606; James Gates, 2399 Jefferson #11, Carlsbad, CA (US) 92008

( * ) Notice: Subject to any disclaimer, the term of this patent is extended or adjusted under 35 U.S.C. 154(b) by 995 days.

(21) Appl. No.: 11/478,242

(22) Filed: Jun. 29, 2006

(65) Prior Publication Data

US 2007/0002159 A1 Jan. 4, 2007

Related U.S. Application Data

(60) Provisional application No. 60/695,946, filed on Jul. 1, 2005.

(51) Int. Cl.
*H01L 27/00* (2006.01)

(52) U.S. Cl. .............................. 250/208.1; 250/559.29; 396/103; 396/144

(58) Field of Classification Search .............. 250/208.1, 250/559.29; 396/103, 144
See application file for complete search history.

(56) References Cited

U.S. PATENT DOCUMENTS 3,609,367 A 9/1971 Barron (Continued)

FOREIGN PATENT DOCUMENTS

| | | |
|---|---|---|
| EP | 599470 | 6/1994 |
| EP | 1 032 045 | 8/2000 |
| JP | 62-011264 | 1/1987 |

OTHER PUBLICATIONS

International Search Report and Written Opinion for PCT/US2005/30256 mailed Jul. 7, 2008.
International Preliminary Report on Patentability for PCT/US2005/030256 issued Mar. 17, 2009.
International Search Report and Written Opinion for PCT/US2006/25781 mailed Jul. 22, 2008.

(Continued)

*Primary Examiner*—Seung C Sohn

(57) ABSTRACT

There are many inventions described herein. Some aspects are directed to methods and/or apparatus to provide relative movement between optics, or portion(s) thereof, and sensors, or portion(s) thereof, in a digital camera. The relative movement may be in any of various directions. In some aspects, relative movement between an optics portion, or portion(s) thereof, and a sensor portion, or portion(s) thereof, are used in providing any of various features and/or in the various applications disclosed herein, including, for example, but not limited to, increasing resolution, optical and electronic zoom, image stabilization, channel alignment, channel-channel alignment, image alignment, lens alignment, masking, image discrimination, range finding, 3D imaging, auto focus, mechanical shutter, mechanical iris, multi and hyperspectral imaging, and/or combinations thereof. In some aspects, movement is provided by actuators, for example, but not limited to MEMS actuators, and by applying appropriate control signal thereto.

45 Claims, 323 Drawing Sheets

U.S. PATENT DOCUMENTS 3,971,065 A 7/1976 Bayer
4,323,925 A 4/1982 Abell et al.
4,385,373 A 5/1983 Howe
4,894,672 A * 1/1990 Tanaka ........................ 396/79
5,005,083 A 4/1991 Grage et al.
5,051,830 A 9/1991 Von Hoessle
5,436,660 A 7/1995 Sakamoto
5,654,752 A 8/1997 Yamazaki
5,691,765 A 11/1997 Schieltz et al.
5,694,165 A 12/1997 Yamazaki et al.
5,742,659 A 4/1998 Atac et al.
5,760,832 A 6/1998 Yamanaka et al.
5,766,980 A 6/1998 Ohtagaki et al.
5,850,479 A 12/1998 Terry et al.
6,137,535 A 10/2000 Meyers
6,381,072 B1 4/2002 Burger
6,429,898 B1 8/2002 Shoda et al.
6,437,335 B1 8/2002 Bohn
6,570,613 B1 5/2003 Howell
6,611,289 B1 8/2003 Yu et al.
6,617,565 B2 9/2003 Wu
6,714,239 B2 3/2004 Guidash
6,727,521 B2 4/2004 Merrill et al.
6,765,617 B1 7/2004 Tangen et al.
6,833,873 B1 12/2004 Suda
6,834,161 B1 * 12/2004 Stiehler ...................... 396/103
6,841,816 B2 1/2005 Merrill et al.
6,859,229 B1 2/2005 Suda
6,882,368 B1 4/2005 Suda
6,885,404 B1 4/2005 Suda
6,885,508 B2 4/2005 Yamaguchi et al.
6,903,770 B1 6/2005 Kobayashi et al.
6,946,647 B1 9/2005 O'Neill et al.
6,952,228 B2 10/2005 Yoneda et al.
7,095,159 B2 8/2006 Machida
7,115,853 B2 10/2006 Jiang et al.
7,123,298 B2 10/2006 Schroeder et al.
7,170,665 B2 1/2007 Kaneko et al.
7,199,348 B2 4/2007 Olsen et al.
7,206,136 B2 4/2007 Labaziewicz et al.
7,214,926 B2 5/2007 Gruhlke et al.
7,223,954 B2 5/2007 McNulty
7,236,306 B2 6/2007 Janson, Jr. et al.
7,239,345 B1 7/2007 Rogina
7,256,944 B2 8/2007 Labaziewicz et al.
7,280,290 B2 10/2007 Araki et al.
7,305,180 B2 12/2007 Labaziewicz et al.
7,358,483 B2 4/2008 Mitsugi et al.
7,362,357 B2 4/2008 Brown et al.
7,379,104 B2 5/2008 Hattori et al.
7,417,674 B2 8/2008 Gruhlke
7,460,160 B2 12/2008 Hershey et al.
2002/0020845 A1 2/2002 Ogura et al.
2002/0024606 A1 2/2002 Yuki et al.
2002/0051071 A1 5/2002 Itano et al.
2002/0067416 A1 6/2002 Yoneda et al.
2002/0089596 A1 7/2002 Suda
2002/0113888 A1 8/2002 Sonoda et al.
2002/0122124 A1 9/2002 Suda
2002/0142798 A1 10/2002 Miyake
2003/0020814 A1 1/2003 Ono
2003/0086013 A1 5/2003 Aratani
2003/0160886 A1 8/2003 Misawa et al.
2003/0209651 A1 11/2003 Iwasaki
2003/0234907 A1 12/2003 Kawai
2004/0012688 A1 1/2004 Tinnerino et al.
2004/0012689 A1 1/2004 Tinnerino et al.
2004/0027687 A1 2/2004 Bittner et al.
2004/0095495 A1 5/2004 Inokuma et al.
2004/0183918 A1 9/2004 Squilla et al.
2005/0024731 A1 2/2005 Mitchell et al.
2005/0128335 A1 6/2005 Kolehmainen et al.
2005/0128509 A1 6/2005 Tokkonen et al.
2005/0134712 A1 6/2005 Gruhlke et al.
2005/0160112 A1 7/2005 Makela et al.
2006/0087572 A1 4/2006 Schroeder
2006/0108505 A1 5/2006 Gruhlke et al.
2006/0125936 A1 6/2006 Gruhlke et al.
2006/0187322 A1 8/2006 Janson, Jr. et al.
2006/0187338 A1 8/2006 May et al.
2007/0002159 A1 1/2007 Olsen et al.

OTHER PUBLICATIONS

International Preliminary Report on Patentability for PCT/US2006/025781 issued Mar. 10, 2009.
Office Action from U.S. Appl. No. 11/788,120, mailed May 19, 2009.
Notice of Allowance from U.S. Appl. No. 11/888,546, mailed Jun. 3, 2009.
"A Study of Multi-Stack Silicon-Direct Wafer Bonding for MEMS Manufacturing", Miki et al., 2002 IEEE, pp. 407-410.
"Artificial apposition compound eye fabricated by micro-optics technology", Duparré et al., Applied Optics, vol. 43, No. 22, Aug. 2004, pp. 4303-4310.
"Artificial compound eyes—different concepts and their application to ultra flat image acquisition sensors", Duparré et al., Proceedings of SPIE, vol. 5346 (SPIE, Bellingham, WA, 2004), pp. 89-100.
"Bimodal fingerprint capturing system based on compound-eye imaging module", Shogenji et al., Applied Optics, vol. 43, No. 6, Feb. 2004, pp. 1355-1359.
"Color imaging with an integrated compound imaging system", Tanida, Optics Express, vol. 11, No. 18, Sep. 2003, pp. 2109-2117.
"Compact image capturing system based on compound imaging and digital reconstruction", Tanida et al., Proceedings of SPIE, vol. 4455, 2001, pp. 34-41.
"Microoptical telescope compound eye", Duparré et al., Optics Express, vol. 13, No. 3, Feb. 2005, pp. 889-903.
"Miniaturization of Imaging Systems", Völkel et al., mstnews, Feb. 2003, pp. 36-38.
"Miniaturized imaging systems", Völkel et al.,Elsevier Science B.V., Microelectronic Engineering 67-68 (2003), pp. 461-472.
"Multispectral imaging using compact compound optics", Shogenji et al., Optics Express, vol. 12, No. 8, Apr. 2004, pp. 1643-1655.
"Reconstruction of a high-resolution image on a compound-eye image-capturing system", Kitamura et al., Applied Optics, vol. 43, No. 8, Mar. 2004, pp. 1719-1727.
"Replicated Micro-Optics for Automotive Applications", Stäger et al., SPIE European Workshop on Photonics in the Automobile, Geneva, 2004, (8 pages).
"Resolution Improvement for Compound Eye Images Through Lens Diversity", Wood et al., IEEE, Signal Processing Society, DSP/SPE Workshop, Aug. 2, 2004 (5 pages).
Shellcase Debuts Ultra-Thin Miniaturization for Optics, Robin Norvell, Jul. 8, 2005, 1 page.
"Theoretical analysis of an artificial superposition compound eye for application in ultra flat digital image acquisition devices", Duparré et al., Proceedings of SPIE, vol. 5249, 2004, pp. 408-418.
"Thin observation module by bound optics (TOMBO) with color filters", Miyatake et al., SPEI and IS&T, vol. 5301, 2004, pp. 7-12.
"Ultra-Thin Camera Based on Artificial Apposition Compound Eyes", Duparré et al., Proc. 10$^{th}$ Microoptics Conference MOC '04, Jena, 2004, Paper E-2 (2 pages).
Office Action for U.S. Appl. No. 11/825,382, mailed Oct. 29, 2009.
Office Action for U.S. Appl. No. 11/888,582, mailed Sep. 3, 2009.
Office Action for U.S. Appl. No. 11/788,120, mailed Sep. 18, 2009.
Office Action on U.S. Appl. No. 11/788,279, mailed Jan. 21, 2010.
Notice of Allowance on U.S. Appl. No. 11/888,546, mailed Dec. 14, 2009.
Office Action on U.S. Appl. No. 11/810,623 mailed Feb. 4, 2010.
Search Report for European Patent Application 05793927.4, dated Feb. 26, 2010.
First Office Action for Chinese Application No. 200580032374.0, notification date Feb. 5, 2010.

* cited by examiner

Optics
Sensor
262A
264A
392A
394A
395a
395b

606

| Position Schedule Mapping | | | | | | | | | | | | | | | | |
|---|---|---|---|---|---|---|---|---|---|---|---|---|---|---|---|---|
| Desired Operating Mode Represented by Inputs | Outputs | | | | | | | | | | | | | | | |
| | Desired Position Camera Channel 260A | | | | Desired Position Camera Channel 260B | | | | Desired Position Camera Channel 260C | | | | Desired Position Camera Channel 260D | | | |
| | Actuator | | | | Actuator | | | | Actuator | | | | Actuator | | | |
| | A | B | C | D | A | B | C | D | A | B | C | D | A | B | C | D |
| 608a Normal | 0 | 0 | 0 | 0 | 0 | 0 | 0 | 0 | 0 | 0 | 0 | 0 | 0 | 0 | 0 | 0 |
| 608b 2x resolution | 1 | 0 | 0 | 0 | 1 | 0 | 0 | 0 | 1 | 0 | 0 | 0 | 1 | 0 | 0 | 0 |
| 608c 3x resolution | 0 | 1 | 0 | 0 | 0 | 1 | 0 | 0 | 0 | 1 | 0 | 0 | 0 | 1 | 0 | 0 |
| 608d 4x resolution | 1 | 1 | 0 | 0 | 1 | 1 | 0 | 0 | 1 | 1 | 0 | 0 | 1 | 1 | 0 | 0 |
| 608e 2x zoom | 1 | 0 | 0 | 0 | 1 | 0 | 0 | 0 | 1 | 0 | 0 | 0 | 1 | 0 | 0 | 0 |
| 608f 3x zoom | 0 | 1 | 0 | 0 | 0 | 1 | 0 | 0 | 0 | 1 | 0 | 0 | 0 | 1 | 0 | 0 |
| 608g 4x zoom | 1 | 1 | 0 | 0 | 1 | 1 | 0 | 0 | 1 | 1 | 0 | 0 | 1 | 1 | 0 | 0 |
| 608h range finder | 1 | 0 | 0 | 0 | 0 | 0 | 0 | 0 | 1 | 0 | 0 | 0 | 0 | 0 | 0 | 0 |
| ⋮ | ⋮ | | | | ⋮ | | | | ⋮ | | | | ⋮ | | | |

CAMERA AND METHOD HAVING OPTICS AND PHOTO DETECTORS WHICH ARE ADJUSTABLE WITH RESPECT TO EACH OTHER

RELATED APPLICATIONS

This application claims priority to U.S. Provisional Application Ser. No. 60/695,946, entitled "Method and Apparatus for use in Camera and Systems Employing Same", filed Jul. 1, 2005 (hereinafter, the "Method and Apparatus for use in Camera and Systems Employing Same" provisional application), the entirety of which is expressly incorporated by reference herein.

FIELD OF THE INVENTION

The field of the invention is digital imaging.

BACKGROUND OF THE INVENTION

The recent technology transition from film to "electronic media" has spurred the rapid growth of the imaging industry with applications including still and video cameras, cell phones, other personal communications devices, surveillance equipment, automotive applications, computers, manufacturing and inspection devices, medical appliances, toys, plus a wide range of other and continuously expanding applications. The lower cost and size of digital cameras (whether as stand-alone products or imbedded in other appliances) is a primary driver for this growth and market expansion.

Most applications are continuously looking for all or some combination of higher performance (image quality), features, smaller size and/or lower cost. These market needs can often be in conflict: higher performance often requires larger size, improved features can require higher cost as well as a larger size, and conversely, reduced cost and/or size can come at a penalty in performance and/or features. As an example, consumers look for higher quality images from their cell phones, but are unwilling to accept the size or cost associated with putting stand-alone digital camera quality into their pocket sized phones.

One driver to this challenge is the lens system for digital cameras. As the number of photo detectors (pixels) increases, which increases image resolution, the lenses must become larger to span the increased size of the image sensor which carries the photo detectors. Also, the desirable "zoom lens" feature adds additional components, size and cost to a lens system. Zoom, as performed by the lens system, known as "optical zoom", is a highly desired feature. Both these attributes, although benefiting image quality and features, add a penalty in camera size and cost.

Digital camera suppliers have one advantage over traditional film providers in the area of zoom capability. Through electronic processing, digital cameras can provide "electronic zoom" which provides the zoom capability by cropping the outer regions of an image and then electronically enlarging the center region to the original size of the image. In a manner similar to traditional enlargements, a degree of resolution is lost when performing this process. Further, since digital cameras capture discrete input to form a picture rather than the ubiquitous process of film, the lost resolution is more pronounced. As such, although "electronic zoom" is a desired feature, it is not a direct substitute for "optical zoom."

SUMMARY OF INVENTION

It should be understood that there are many inventions described and illustrated herein. Indeed, the present invention is not limited to any single aspect or embodiment thereof nor to any combinations and/or permutations of such aspects and/or embodiments.

Moreover, each of the aspects of the present invention, and/or embodiments thereof, may be employed alone or in combination with one or more of the other aspects of the present invention and/or embodiments thereof. For the sake of brevity, many of those permutations and combinations will not be discussed separately herein.

In a first aspect, a digital camera includes a first array of photo detectors to sample an intensity of light; and a second array of photo detectors to sample an intensity of light; a first optics portion disposed in an optical path of the first array of photo detectors; a second optics portion disposed in an optical path of the second array of photo detectors; a processor, coupled to the first and second arrays of photo detectors, to generate an image using (i) data which is representative of the intensity of light sampled by the first array of photo detectors, and/or (ii) data which is representative of the intensity of light sampled by the second array of photo detectors; and at least one actuator to provide relative movement between at least one portion of the first array of photo detectors and at least one portion of the first optics portion and to provide relative movement between at least one portion of the second array of photo detectors and at least one portion of the second optics portion.

In one embodiment, the at least one actuator includes: at least one actuator to provide relative movement between at least one portion of the first array of photo detectors and at least one portion of the first optics portion; and at least one actuator to provide relative movement between at least one portion of the second array of photo detectors and at least one portion of the second optics portion.

In another embodiment, the at least one actuator includes: a plurality of actuators to provide relative movement between at least one portion of the first array of photo detectors and at least one portion of the first optics portion; and at least one actuator to provide relative movement between at least one portion of the second array of photo detectors and at least one portion of the second optics portion.

In another embodiment, the first array of photo detectors define an image plane and the second array of photo detectors define an image plane.

In another embodiment, the at least one actuator includes: at least one actuator to provide movement of at least one portion of the first optics portion in a direction parallel to the image plane defined by the first array of photo detectors; and at least one actuator to provide movement of at least one portion of the second optics portion in a direction parallel to the image plane defined by the second array of photo detectors.

In another embodiment, the at least one actuator includes: at least one actuator to provide movement of at least one portion of the first optics portion in a direction perpendicular to the image plane defined by the first array of photo detectors; and at least one actuator to provide movement of at least one portion of the second optics portion in a direction perpendicular to the image plane defined by the second array of photo detectors.

In another embodiment, the at least one actuator includes: at least one actuator to provide movement of at least one portion of the first optics portion in a direction oblique to the image plane defined by the first array of photo detectors; and at least one actuator to provide movement of at least one portion of the second optics portion in a direction oblique to the image plane defined by the second array of photo detectors.

In another embodiment, the at least one actuator includes: at least one actuator to provide angular movement between the first array of photo detectors and at least one portion of the first optics portion; and at least one actuator to provide angular movement between the second array of photo detectors and at least one portion of the second optics portion.

In another embodiment, the first array of photo detectors, the second array of photo detectors, and the processor are integrated on or in the same semiconductor substrate.

In another embodiment, the first array of photo detectors, the second array of photo detectors, and the processor are disposed on or in the same semiconductor substrate.

In another embodiment, the processor comprises a processor to generate an image using (i) data which is representative of the intensity of light sampled by the first array of photo detectors with a first relative positioning of the first optics portion and the first array of photo detectors and (ii) data which is representative of the intensity of light sampled by the first array of photo detectors with a second relative positioning of the first optics portion and the first array of photo detectors.

In another embodiment, the processor comprises a processor to generate an image using (i) data which is representative of the intensity of light sampled by the first array of photo detectors with a first relative positioning of the first optics portion and the first array of photo detectors, (ii) data which is representative of the intensity of light sampled by the first array of photo detectors with a second relative positioning of the first optics portion and the first array of photo detectors, (iii) data which is representative of the intensity of light sampled by the second array of photo detectors with a first relative positioning of the second optics portion and the second array of photo detectors and (ii) data which is representative of the intensity of light sampled by the second array of photo detectors with a second relative positioning of the second optics portion and the second array of photo detectors.

In another embodiment, the at least one portion of the first optics portion comprises a lens.

In another embodiment, the at least one portion of the first optics portion comprises a filter.

In another embodiment, the at least one portion of the first optics portion comprises a mask and/or polarizer.

In another embodiment, the processor is configured to receive at least one input signal indicative of a desired operating mode and to provide, in response at least thereto, at least one actuator control signal.

In another embodiment, the at least one actuator includes at least one actuator to receive the at least one actuator control signal from the processor and in response at least thereto, to provide relative movement between the first array of photo detectors and the at least one portion of the first optics portion.

In another embodiment, the at least one actuator includes: at least one actuator to receive at least one actuator control signal and in response thereto, to provide relative movement between the first array of photo detectors and the at least one portion of the first optics portion; and at least one actuator to receive at least one actuator control signal and in response thereto, to provide relative movement between the second array of photo detectors and the at least one portion of the second optics portion.

In another embodiment, the first array of photo detectors sample an intensity of light of a first wavelength; and the second array of photo detectors sample an intensity of light of a second wavelength different than the first wavelength.

In another embodiment, the first optics portion passes light of the first wavelength onto an image plane of the photo detectors of the first array of photo detectors; and the second optics portion passes light of the second wavelength onto an image plane of the photo detectors of the second array of photo detectors.

In another embodiment, the first optics portion filters light of the second wavelength; and the second optics portion filters light of the first wavelength.

In another embodiment, the digital camera further comprises a positioner including: a first portion that defines a seat for at least one portion of the first optics portion; and a second portion that defines a seat for at least one portion of the second lens.

In another embodiment, the first portion of the positioner blocks light from the second optics portion and defines a path to transmit light from the first optics portion, and the second portion of the positioner blocks light from the first optics portion and defines a path to transmit light from the second optics portion.

In another embodiment, the at least one actuator includes: at least one actuator coupled between the first portion of the positioner and a third portion of the positioner to provide movement of the at least one portion of the first optics portion; and at least one actuator coupled between the second portion of the positioner and a fourth portion of the positioner to provide movement of the at least one portion of the second optics portion.

In another embodiment, the digital camera further includes an integrated circuit die that includes the first array of photo detectors and the second array of photo detectors.

In another embodiment, the positioner is disposed superjacent the integrated circuit die.

In another embodiment, the positioner is bonded to the integrated circuit die.

In another embodiment, the digital camera further includes a spacer disposed between the positioner and the integrated circuit die, wherein the spacer is bonded to the integrated circuit die and the positioner is bonded to the spacer.

In another embodiment, the at least one actuator includes at least one actuator that moves the at least one portion of the first optics portion along a first axis.

In another embodiment, the at least one actuator further includes at least one actuator that moves the at least one portion of the first optics portion along a second axis different than the first axis.

In another embodiment, the at least one actuator includes at least one MEMS actuator.

In a second aspect, a digital camera includes a plurality of arrays of photo detectors, including: a first array of photo detectors to sample an intensity of light; and a second array of photo detectors to sample an intensity of light; a first lens disposed in an optical path of the first array of photo detectors; a second lens disposed in an optical path of the second array of photo detectors; signal processing circuitry, coupled to the first and second arrays of photo detectors, to generate an image using (i) data which is representative of the intensity of light sampled by the first array of photo detectors, and/or (ii) data which is representative of the intensity of light sampled by the second array of photo detectors; and at least one actuator to provide relative movement between the first array of photo detectors and the first lens and to provide relative movement between the second array of photo detectors and the second lens.

In one embodiment, the at least one actuator includes: at least one actuator to provide relative movement between the first array of photo detectors and the first lens; and at least one actuator to provide relative movement between the second array of photo detectors and the second lens.

In another embodiment, the at least one actuator includes: a plurality of actuators to provide relative movement between the first array of photo detectors and the first lens; and a plurality of actuators to provide relative movement between the second array of photo detectors and the second lens.

In another embodiment, the first array of photo detectors define an image plane and the second array of photo detectors define an image plane.

In another embodiment, the at least one actuator includes: at least one actuator to provide movement of the first lens in a direction parallel to the image plane defined by the first array of photo detectors; and at least one actuator to provide movement of the second lens in a direction parallel to the image plane defined by the second array of photo detectors.

In another embodiment, the at least one actuator includes: at least one actuator to provide movement of the first lens in a direction perpendicular to the image plane defined by the first array of photo detectors; and at least one actuator to provide movement of the second lens in a direction parallel to the image plane defined by the second array of photo detectors.

In another embodiment, the at least one actuator includes: at least one actuator to provide movement of the first lens in a direction oblique to the image plane defined by the first array of photo detectors; and at least one actuator to provide movement of the second lens in a direction oblique to the image plane defined by the second array of photo detectors.

In another embodiment, the at least one actuator includes: at least one actuator to provide angular movement between the first array of photo detectors and the first lens; and at least one actuator to provide angular movement between the second array of photo detectors and the second lens.

In another embodiment, the first array of photo detectors, the second array of photo detectors, and the signal processing circuitry are integrated on or in the same semiconductor substrate.

In another embodiment, the first array of photo detectors, the second array of photo detectors, and the signal processing circuitry are disposed on or in the same semiconductor substrate.

In another embodiment, the signal processing circuitry comprises a processor to generate an image using (i) data which is representative of the intensity of light sampled by the first array of photo detectors with a first relative positioning of the first lens and the first array of photo detectors and (ii) data which is representative of the intensity of light sampled by the first array of photo detectors with a second relative positioning of the first lens and the first array of photo detectors.

In another embodiment, the signal processing circuitry comprises signal processing circuitry to generate an image using (i) data which is representative of the intensity of light sampled by the first array of photo detectors with the first lens and the first array of photo detectors in a first relative positioning, (ii) data which is representative of the intensity of light sampled by the second array of photo detectors with the second lens and the second array of photo detectors in a second relative positioning, (iii) data which is representative of the intensity of light sampled by the first array of photo detectors with the first lens and the first array of photo detectors in a second relative positioning and (iv) data which is representative of the intensity of light sampled by the second array of photo detectors with the second lens and the second array of photo detectors in a second relative positioning.

In another embodiment, the at least one actuator includes at least one actuator to receive at least one actuator control signal and in response thereto, to provide relative movement between the first array of photo detectors and the first lens and to provide relative movement between the second array of photo detectors and the second lens.

In another embodiment, the signal processing circuitry is configured to receive at least one input signal indicative of a desired operating mode and to provide, in response at least thereto, at least one actuator control signal.

In another embodiment, the at least one actuator includes at least one actuator to receive the at least one actuator control signal from the signal processing circuitry and in response at least thereto, to provide relative movement between the first array of photo detector and the first lens.

In another embodiment, the first array of photo detectors sample an intensity of light of a first wavelength; and the second array of photo detectors sample an intensity of light of a second wavelength different than the first wavelength.

In another embodiment, the first lens passes light of the first wavelength onto an image plane of the photo detectors of the first array of photo detectors; and the second lens passes light of the second wavelength onto an image plane of the photo detectors of the second array of photo detectors.

In another embodiment, the first lens filters light of the second wavelength; and the second lens filters light of the first wavelength.

In another embodiment, the digital camera further comprises a frame including a first frame portion that defines a seat for the first lens; and a second frame portion that defines a seat for the second lens.

In another embodiment, the first frame portion blocks light from the second lens and defines a path to transmit light from the first lens, and the second frame portion blocks light from the first lens and defines a path to transmit light from the second lens.

In another embodiment, the at least one actuator includes: at least one actuator coupled between the first frame portion and a third frame portion of the frame to provide movement of the first lens; and at least one actuator coupled between the second frame portion and a fourth frame portion of the frame to provide movement of the second lens.

In another embodiment, the digital camera further includes an integrated circuit die that includes the first array of photo detectors and the second array of photo detectors.

In another embodiment, the frame is disposed superjacent the integrated circuit die. In another embodiment, the frame is bonded to the integrated circuit die.

In another embodiment, the digital camera further includes a spacer disposed between the frame and the integrated circuit die, wherein the spacer is bonded to the integrated circuit die and the frame is bonded to the spacer.

In another embodiment, the at least one actuator includes at least one actuator that moves the first lens along a first axis.

In another embodiment, the at least one actuator further includes at least one actuator that moves the first lens along a second axis different than the first axis.

In another embodiment, the at least one actuator includes at least one MEMS actuator.

In another embodiment, the digital camera further includes a third array of photo detectors to sample the intensity of light of a third wavelength, and wherein the signal processing circuitry is coupled to the third array of photo detectors and generates an image using (i) data which is representative of the intensity of light sampled by the first array of photo detectors, (ii) data which is representative of the intensity of light sampled by the second array of photo detectors, and/or (ii) data which is representative of the intensity of light sampled by the third array of photo detectors.

In another aspect, a digital camera includes: a first array of photo detectors to sample an intensity of light; and a second array of photo detectors to sample an intensity of light; a first optics portion disposed in an optical path of the first array of photo detectors; a second optics portion disposed in an optical path of the second array of photo detectors; processor means, coupled to the first and second arrays of photo detectors, for generating an image using (i) data which is representative of the intensity of light sampled by the first array of photo detectors, and/or (ii) data which is representative of the intensity of light sampled by the second array of photo detectors; actuator means for providing relative movement between at least one portion of the first array of photo detectors and at least one portion of the first optics portion and for providing relative movement between at least one portion of the second array of photo detectors and at least one portion of the second optics portion.

In another aspect, a method for use in a digital camera includes providing a first array of photo detectors to sample an intensity of light; providing a second array of photo detectors to sample an intensity of light; providing a first optics portion disposed in an optical path of the first array of photo detectors; providing a second optics portion disposed in an optical path of the second array of photo detectors; providing relative movement between at least one portion of the first array of photo detectors and at least one portion of the first optics portion; providing relative movement between at least one portion of the second array of photo detectors and at least one portion of the second optics portion; and generating an image using (i) data representative of the intensity of light sampled by the first array of photo detectors, and/or (ii) data representative of the intensity of light sampled by the second array of photo detectors.

In one embodiment, providing relative movement includes moving the at least one portion of the first optics portion by an amount less than two times a width of one photo detector in the first array of photo detectors.

In another embodiment, providing relative movement includes moving the at least one portion of the first optics portion by an amount less than 1.5 times a width of one photo detector in the first array of photo detectors.

In another embodiment, providing relative movement includes moving the at least one portion of the first optics portion by an amount less than a width of one photo detector in the first array of photo detectors.

In some aspects, the movement may include movement in one or more of various directions. In some embodiments, for example, movement is in the x direction, y direction, z direction, tilting, rotation and/or any combination thereof.

In some aspects, relative movement between an optics portion, or portion(s) thereof, and a sensor portion, or portion(s) thereof, are used in providing any of various features and/or in the various applications disclosed herein, including, for example, but not limited to, increasing resolution, optical and electronic zoom, image stabilization, channel alignment, channel-channel alignment, image alignment, lens alignment, masking, image discrimination, range finding, 3D imaging, auto focus, mechanical shutter, mechanical iris, multi and hyperspectral imaging, and/or combinations thereof.

Again, there are many inventions described and illustrated herein. This Summary of the Invention is not exhaustive of the scope of the present inventions. Moreover, this Summary of the Invention is not intended to be limiting of the invention and should not be interpreted in that manner. Thus, while certain aspects and embodiments have been described and/or outlined in this Summary of the Invention, it should be understood that the present invention is not limited to such aspects, embodiments, description and/or outline. Indeed, many others aspects and embodiments, which may be different from and/or similar to, the aspects and embodiments presented in this Summary, will be apparent from the description, illustrations and/or claims, which follow.

It should be understood that the various aspects and embodiments of the present invention that are described in this Summary of the Invention and do not appear in the claims that follow are preserved for presentation in one or more divisional/continuation patent applications. It should also be understood that all aspects and/or embodiments of the present invention that are not described in this Summary of the Invention and do not appear in the claims that follow are also preserved for presentation in one or more divisional/continuation patent applications.

In addition, although various features, attributes and advantages have been described in this Summary of the Invention and/or are apparent in light thereof, it should be understood that such features, attributes and advantages are not required, and except where stated otherwise, need not be present in the aspects and/or the embodiments of the present invention.

Moreover, various objects, features and/or advantages of one or more aspects and/or embodiments of the present invention will become more apparent from the following detailed description and the accompanying drawings. It should be understood however, that any such objects, features, and/or advantages are not required, and except where stated otherwise, need not be present in the aspects and/or embodiments of the present invention.

BRIEF DESCRIPTION OF DRAWINGS

In the course of the detailed description to follow, reference will be made to the attached drawings. These drawings show different aspects and embodiments of the present invention and, where appropriate, reference numerals illustrating like structures, components, materials and/or elements in different figures are labeled similarly. It is understood that various combinations of the structures, components, materials and/or elements, other than those specifically shown, are contemplated and are within the scope of the present invention.

FIGS. 12T-12AA are block diagram representations showings example configurations of optics portions, sensor portions, a processor and one or more actuators that may be employed in the digital camera apparatus of FIG. 4, in accordance with various embodiments of the present invention;

FIG. 35B is a table representing one embodiment of a mapping that may be employed by a position scheduler of the controller of FIG. 35A;

FIG. 37B is a graphical representation of a neighborhood of pixel values and a plurality of spatial directions;

FIG. 37C is a flowchart of steps that may be employed in one embodiment of a double sampler, which may be employed in the channel processor of FIG. 37A;

FIG. 37D shows a flowchart of steps employed in one embodiment of a defective pixel identifier, which may be employed in the channel processor of FIG. 37A;

FIG. 37E is a block diagram of another embodiment of an image pipeline that may be employed in the image processor of FIG. 36A;

FIG. 37F is a block diagram of one embodiment of an image plane integrator that may be employed in the image pipeline of FIG. 37E;

FIG. 37G is a graphical representation of a multi-phase clock that may be employed in the image plane integrator of FIG. 37F;

FIG. 37H is a block diagram of one embodiment of automatic exposure control that may be employed in the image pipeline of FIG. 37E;

FIG. 37I is a graphical representation showing an example of operation of a gamma correction stage that may be employed in the image pipeline of FIG. 37E;

FIG. 37J is a block diagram of one embodiment of a gamma correction stage that may be employed in the image pipeline of FIG. 37E;

FIG. 37K is a block diagram of one embodiment of a color correction stage that may be employed in the image pipeline of FIG. 37E;

FIG. 37L is a block diagram of one embodiment of a high pass filter stage that may be employed in the image pipeline of FIG. 37E;

FIG. 38 is a block diagram of another embodiment of a channel processor that may be employed in the image processor of FIG. 36A;

Figure 6A:
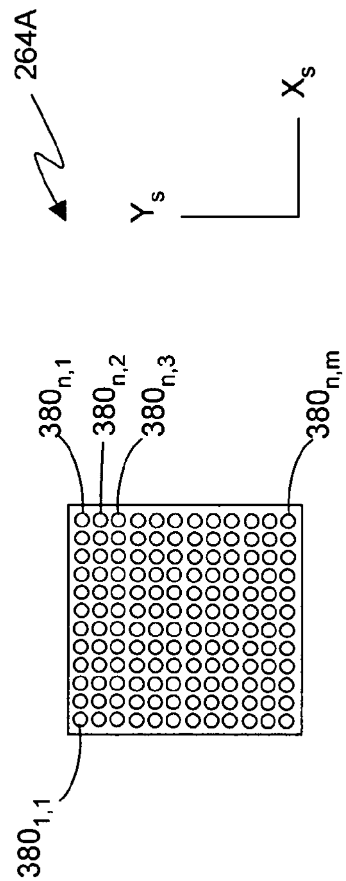
FIG. 6A is a schematic representation of one embodiment of a sensor portion that may be employed in the digital camera apparatus of FIG. 4, in accordance with certain aspects of the present invention.
Figure 36A:
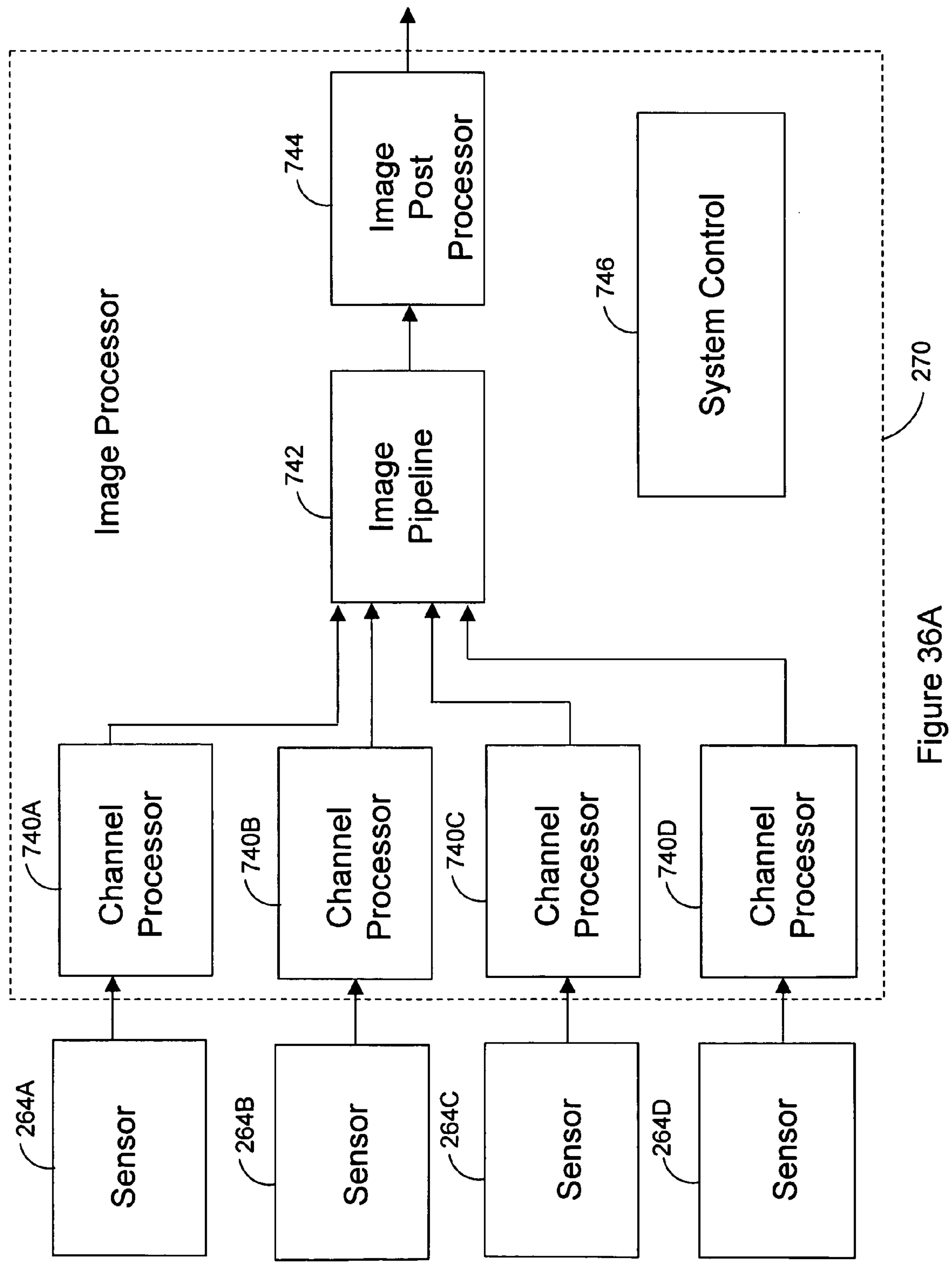
FIG. 36A is a block diagram of sensor portions and an image processor that may be employed in the digital camera apparatus of FIG. 4, in accordance with one embodiment of aspects of the present invention.
Figure 39:
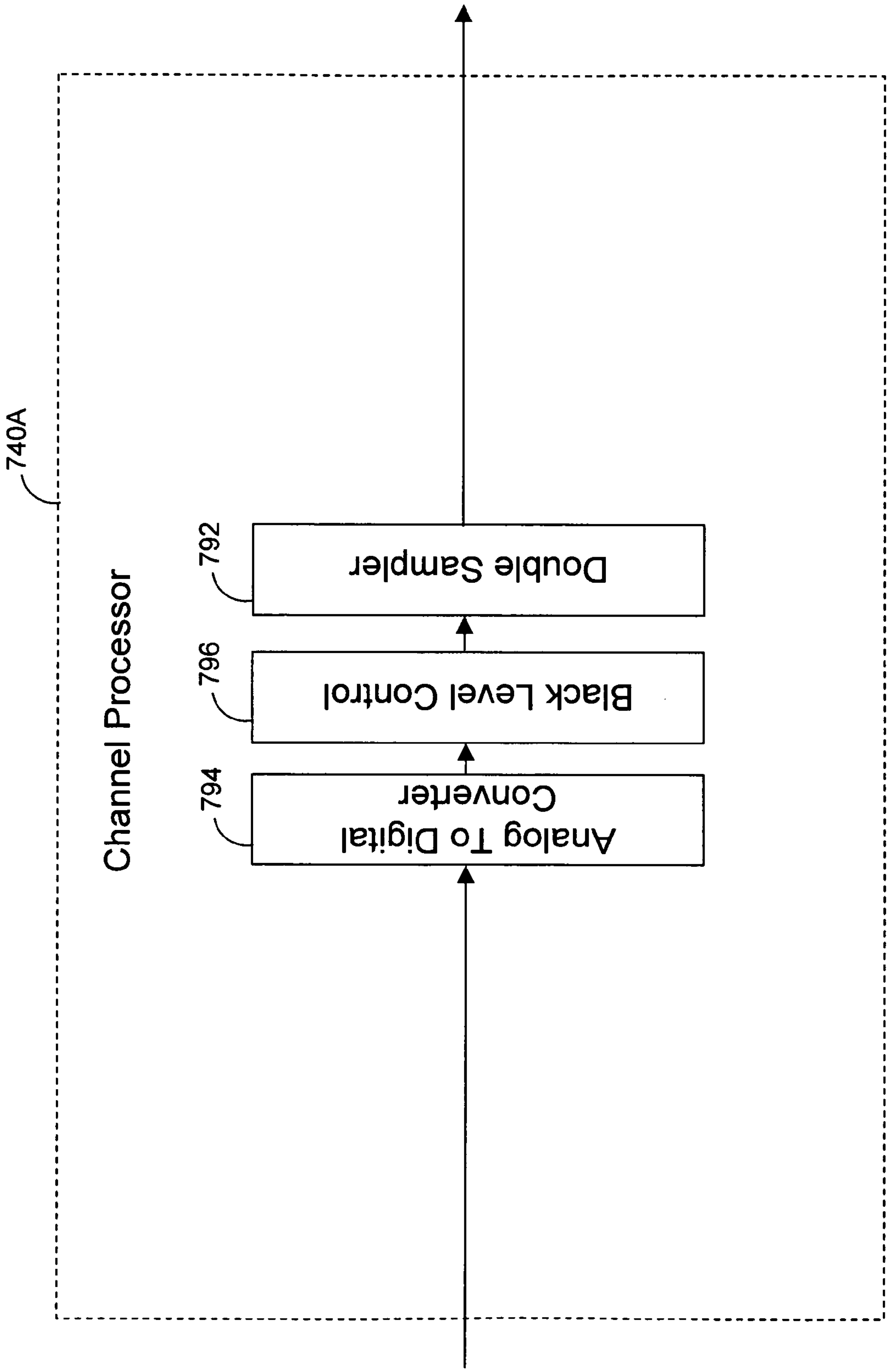
Figure 40:
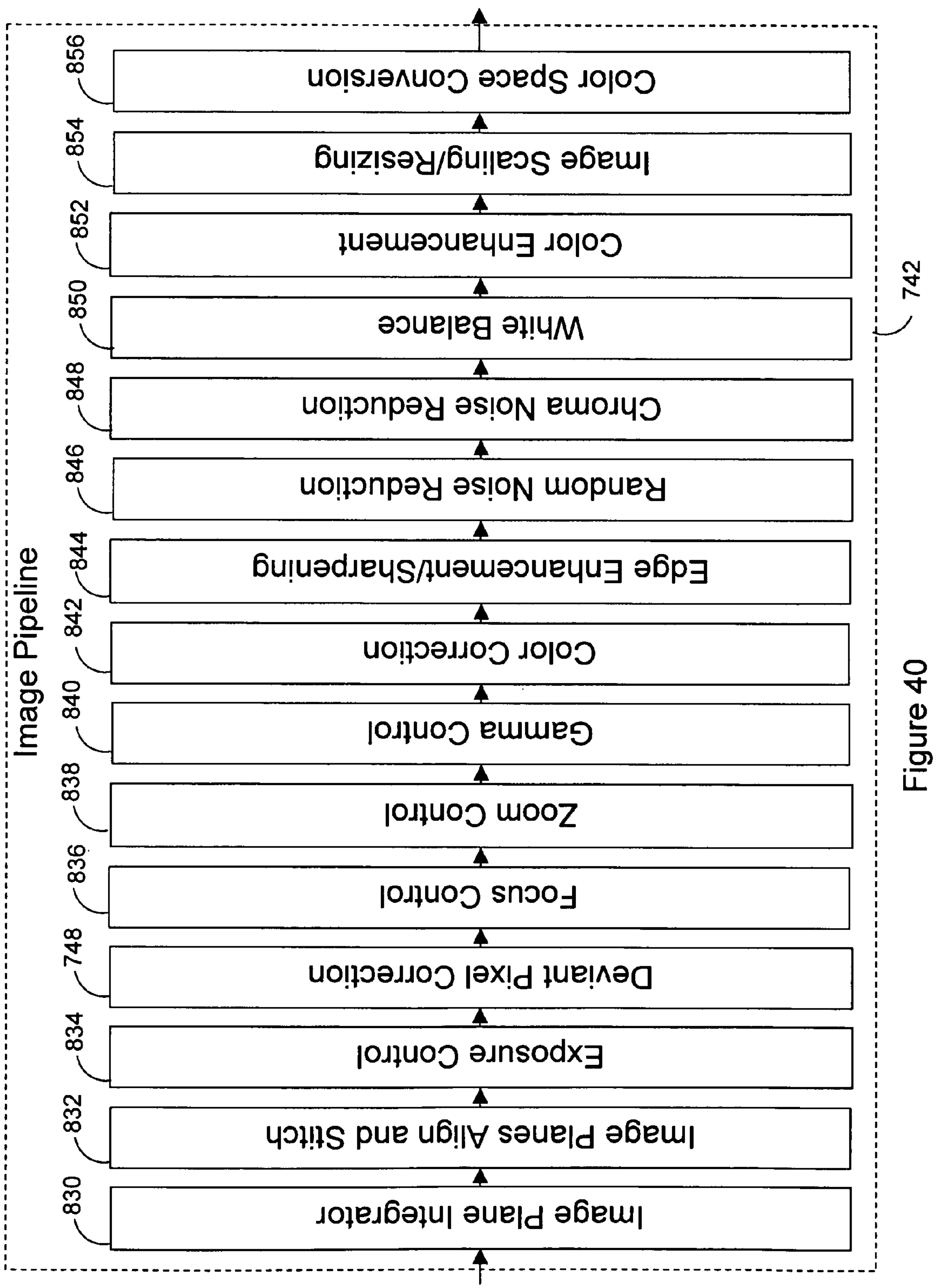
Figure 41B:
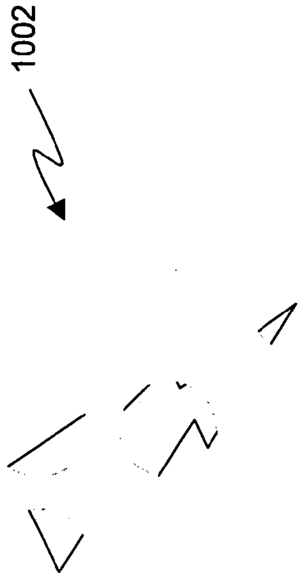
Figure 41A:
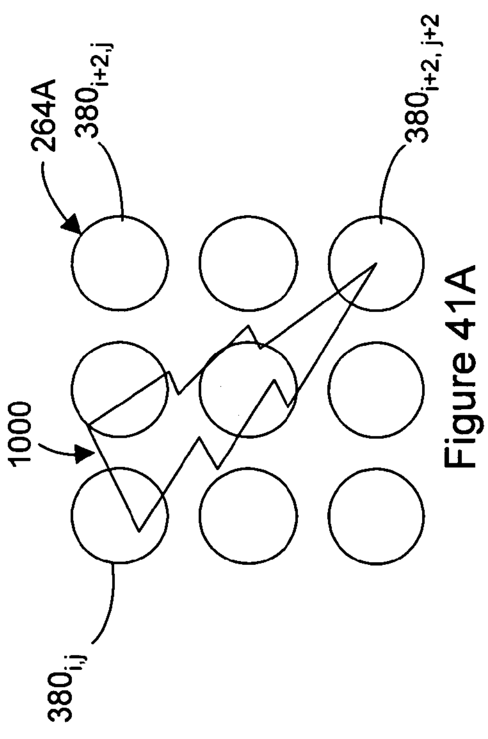
Figure 41D:
Figure 41C:
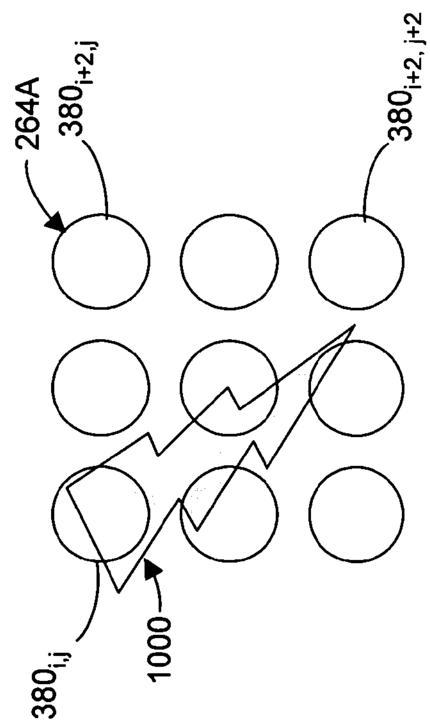
Figure 41E:
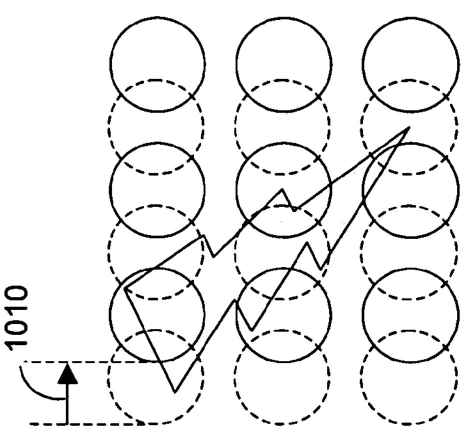
Figure 41F:
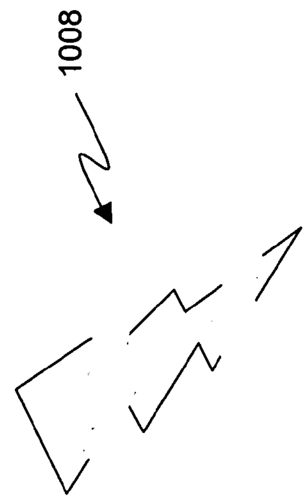
Figure 41G:
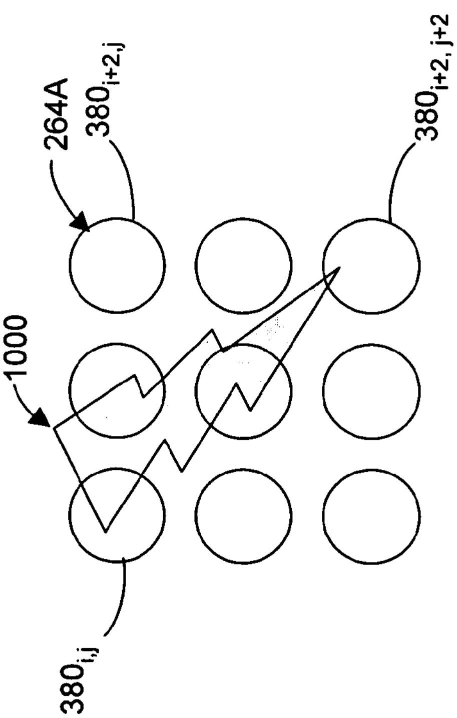
Figure 41H:
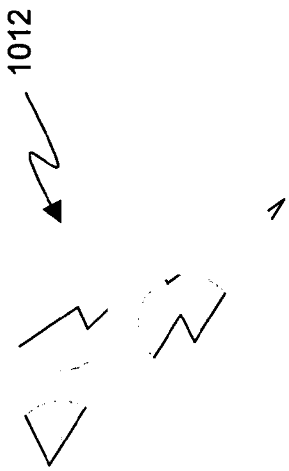
Figure 41I:
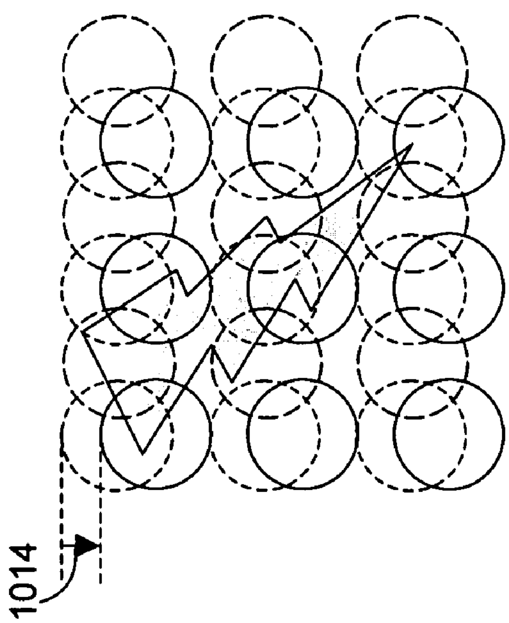
Figure 41J:
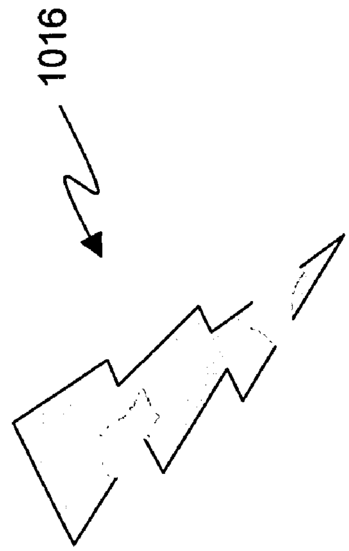
Figure 42A:
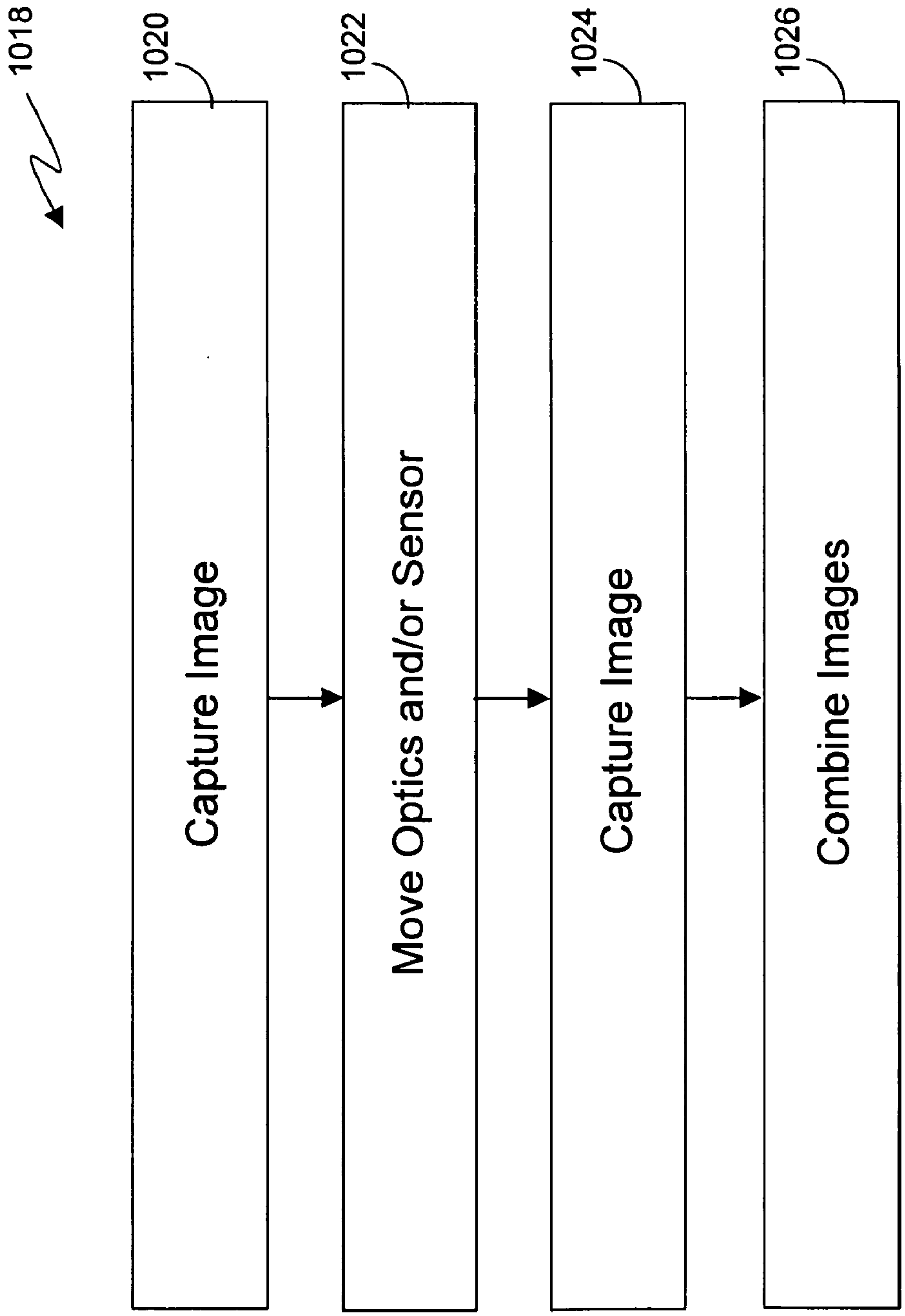

FIG. 39 is a block diagram of another embodiment of a channel processor that may be employed in the image processor of FIG. 36A;

FIG. 40 is a block diagram of another embodiment of an image pipeline that may be employed in the image processor of FIG. 36A;

FIG. 41A is an enlarged view of a portion of a sensor, for example, the sensor of FIG. 6A, and a representation of an image of an object striking the portion of the sensor, with the sensor and associated optics in a first relative positioning;

FIG. 41B is a representation of a portion of the image of FIG. 41A captured by the portion of the sensor of FIG. 41A, with the sensor and the optics in the first relative positioning;

FIG. 41C is an enlarged view of the portion of the sensor of FIG. 41A and a representation of the image of the object striking the portion of the sensor, with the sensor and the associated optics in a second relative positioning;

FIG. 41D is a representation of a portion of the image of FIG. 41C captured by the portion of the sensor of FIG. 41C, with the sensor and the optics in the second relative positioning;

FIG. 41E is an explanatory view showing a relationship between the first relative positioning and the second relative positioning, wherein dotted circles indicate the position of sensor elements relative to the image of the object with the sensor and the optics in the first relative positioning, and solid circles indicate the position of the sensor elements relative to the image of the object with the sensor and optics in the second relative positioning;

FIG. 41F is a representation showing a combination of the portion of the image captured with the first relative positioning, as represented in FIG. 41B, and the portion of the image captured with the second relative positioning, as represented in FIG. 41D;

FIG. 41G is an enlarged view of the portion of the sensor of FIG. 41A and a representation of the image of the object striking the portion of the sensor, with the sensor and the associated optics in a third relative positioning;

FIG. 41H is a representation of a portion of the image of FIG. 41G captured by the portion of the sensor of FIG. 41G, with the sensor and the optics in the third relative positioning;

FIG. 41I is an explanatory view showing a relationship between the first relative positioning, the second relative positioning and the third relative positioning, wherein a first set of dotted circles indicate the position of the sensor elements relative to the image of the object with the sensor and the optics in the first relative positioning, a second set of dotted circles indicate the position of the sensor elements relative to the image of the object with the sensor and the optics in the second relative positioning, and solid circles indicate the position of the sensor elements relative to the image of the object with the sensor and the optics in the third relative positioning;

FIG. 41J is a representation showing a combination of the portion of the image captured with the first relative positioning, as represented in FIG. 41B, the portion of the image captured with the second relative positioning, as represented in FIG. 41D, and the portion of the image captured with the third relative positioning, as represented in FIG. 41H;

FIG. 42A shows a flowchart of steps that may be employed in increasing resolution, in accordance with one embodiment of the present invention.

Figure 42C:
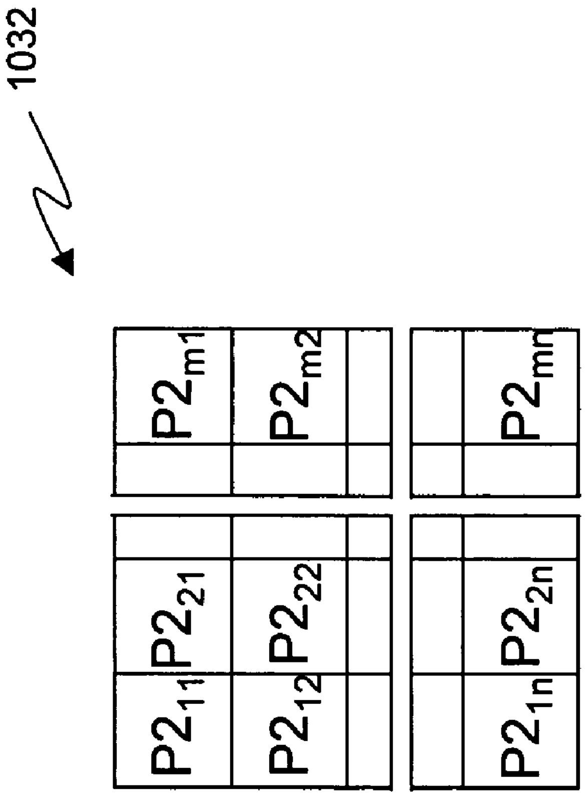
Figure 42B:
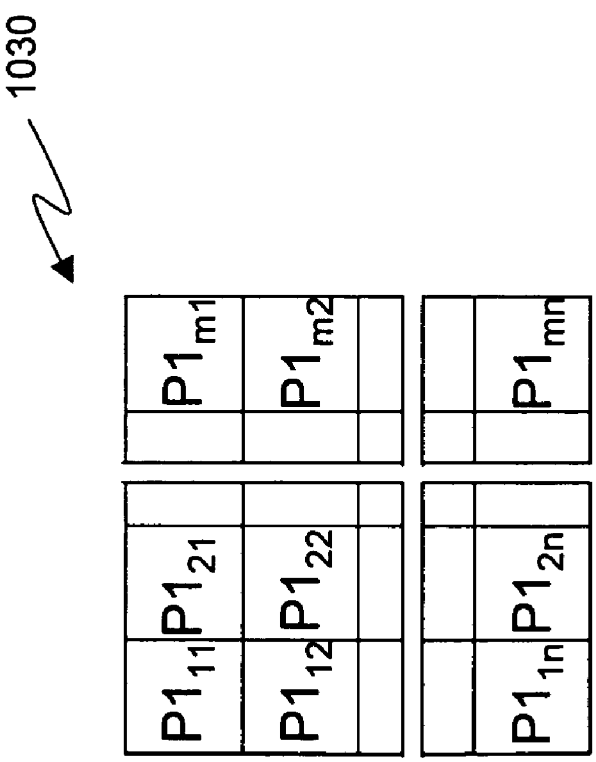
Figure 42E:
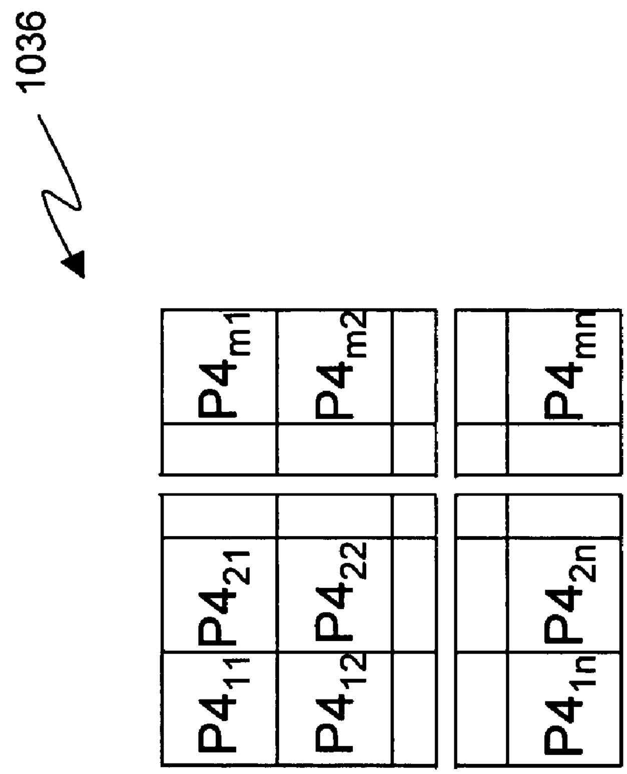
Figure 42D:
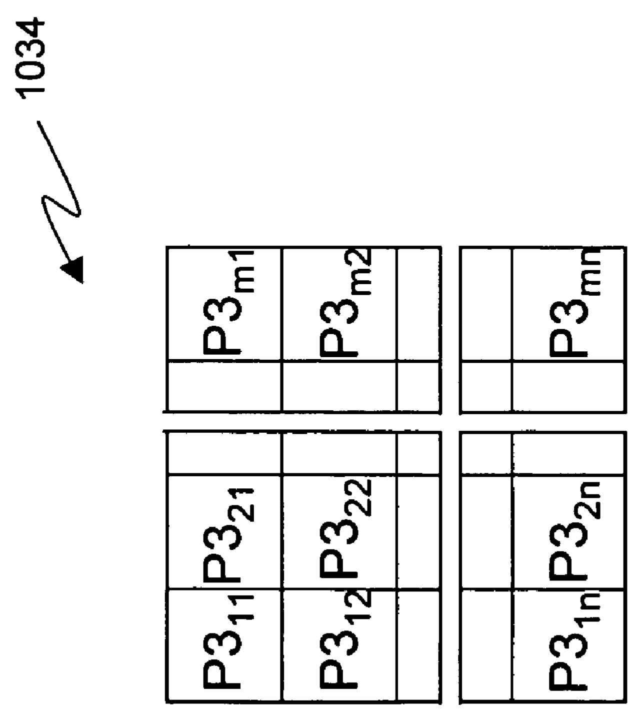
Figure 42F:
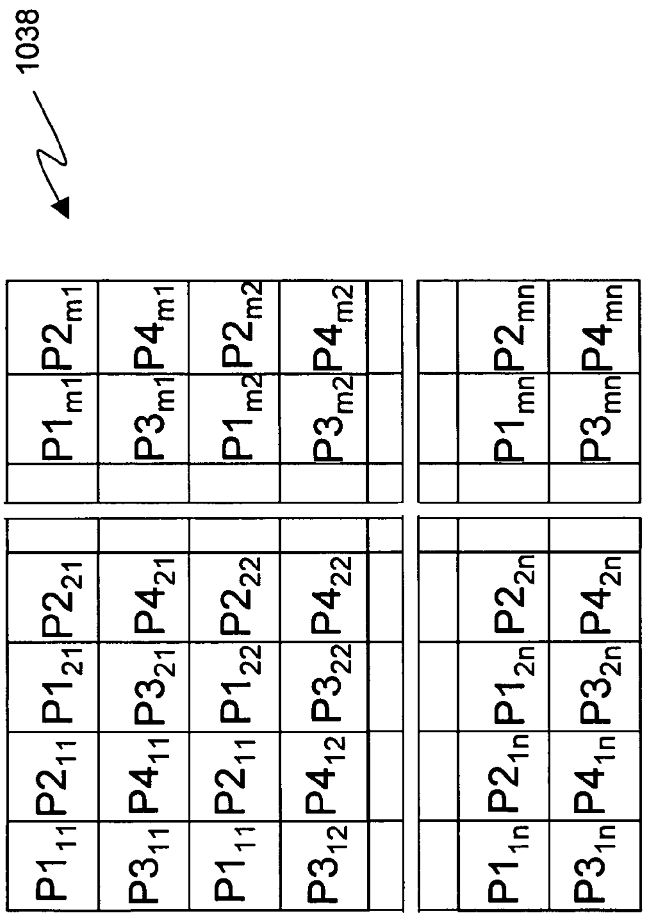
Figure 42G:
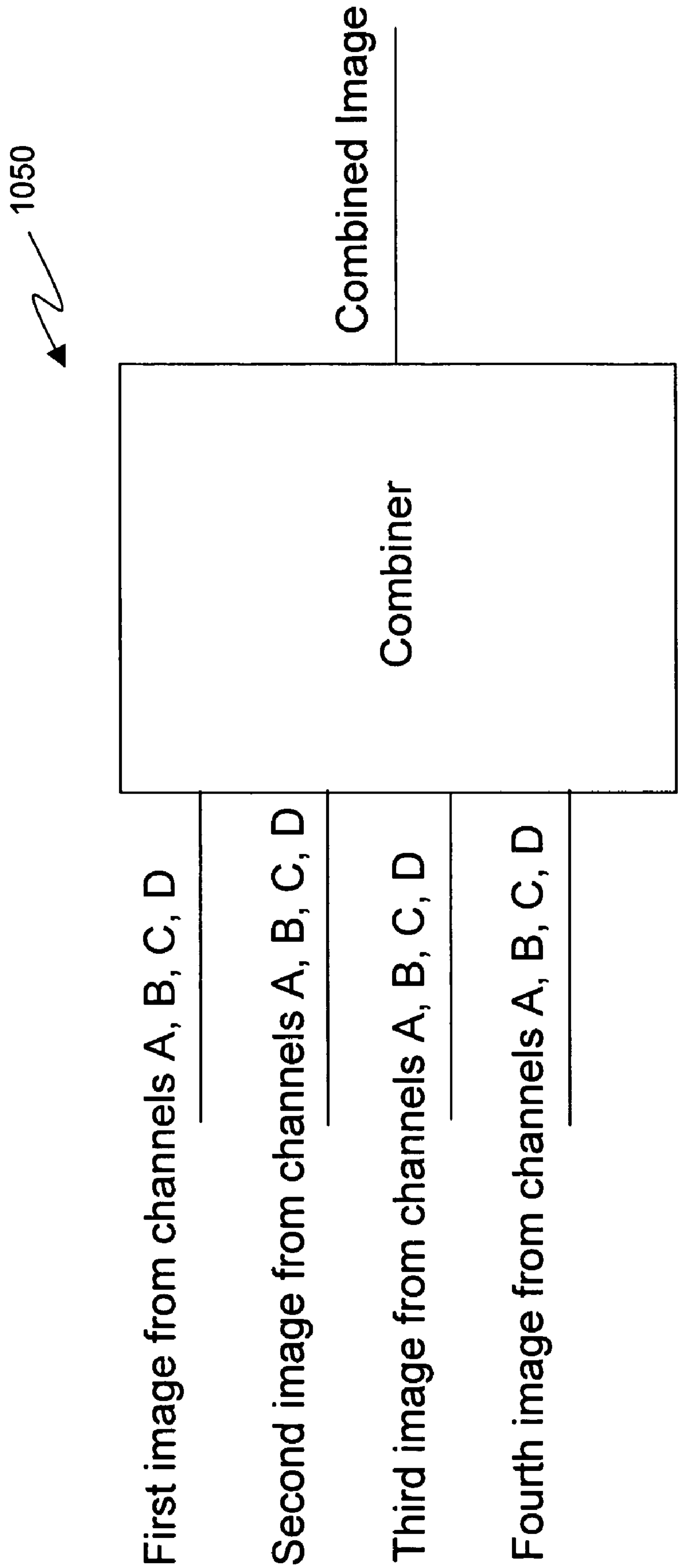
Figure 42H:
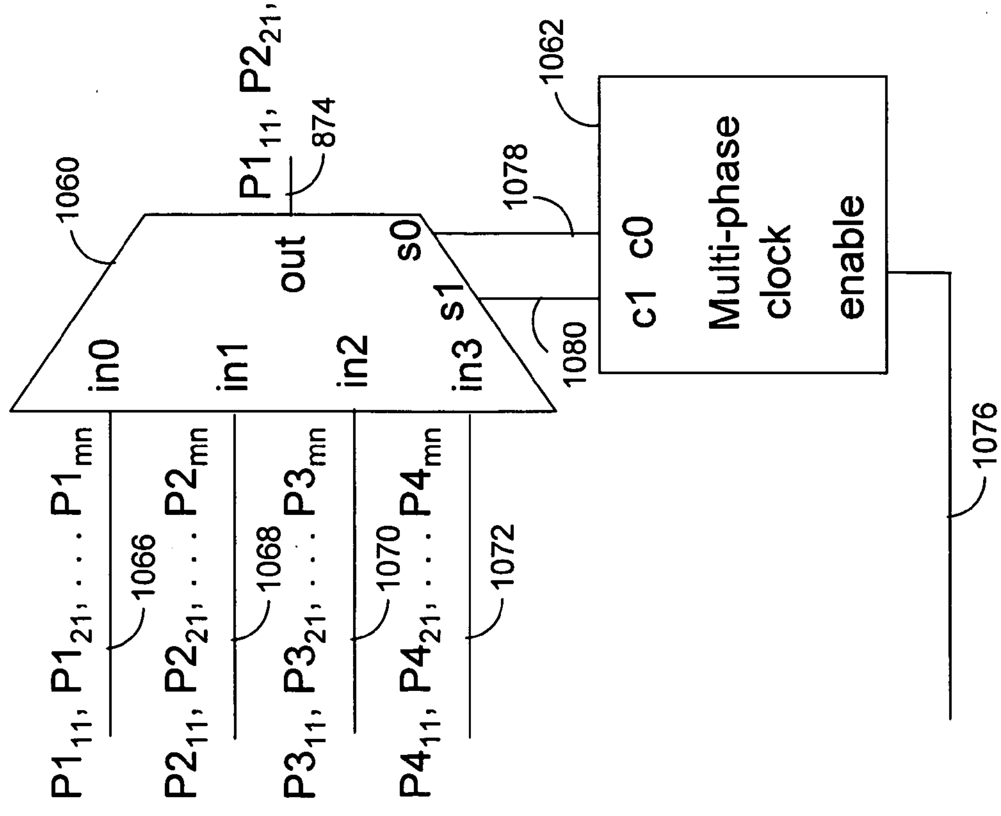
Figure 42I:
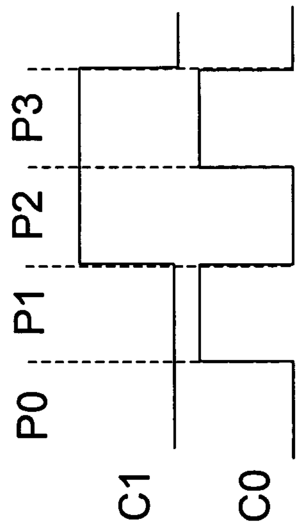
Figure 43:
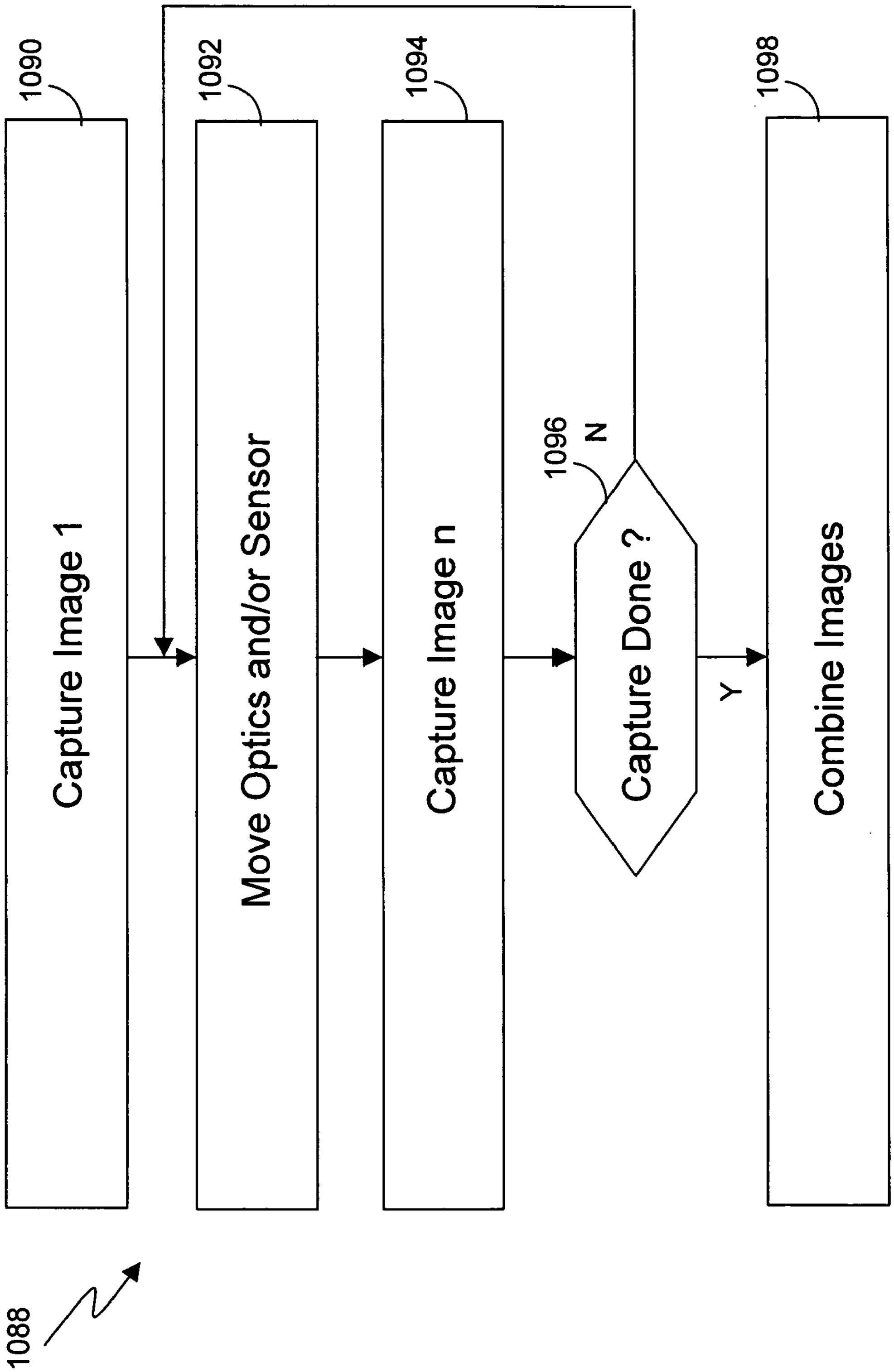

FIGS. 42B-42E are diagrammatic representations of pixel values corresponding to four images;

FIG. 42F is a diagrammatic representation of pixel values corresponding to one embodiment of an image that is a combination of the four images represented in FIGS. 42B-42E;

FIG. 42G is a block diagram of one embodiment of an image combiner;

FIG. 42H is a block diagram of one embodiment of the image combiner of FIG. 42G;

FIG. 42I is a graphical representation of a multi-phase clock that may be employed in the image combiner of FIG. 42H;

FIG. 43 is a flowchart of steps that may be employed in increasing resolution, in accordance with another embodiment of the present invention.

Figure 8A:
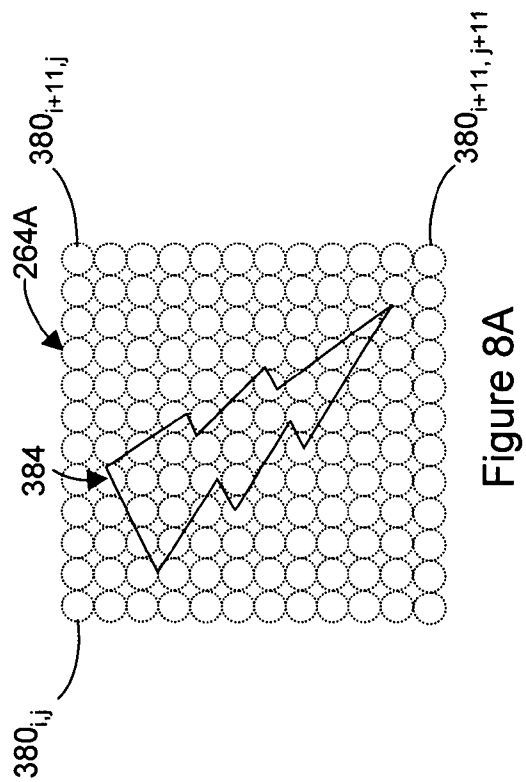
FIG. 8A is an enlarged view of a portion of another embodiment of the sensor portion and a representation of an image of an object striking the portion of the sensor portion.
Figure 44A:
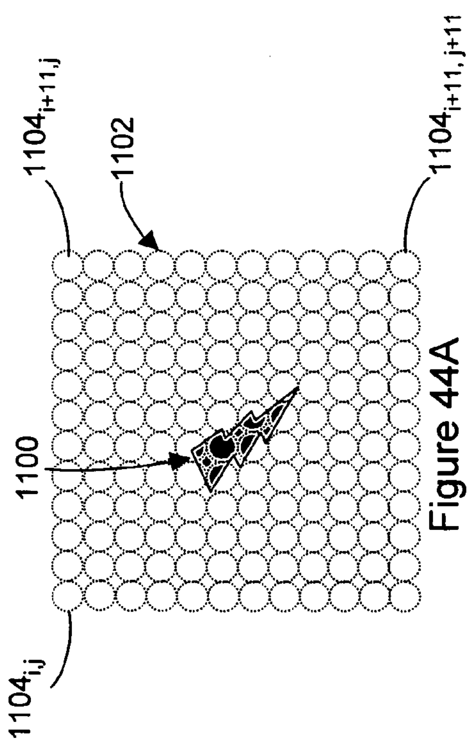
Figure 44B:
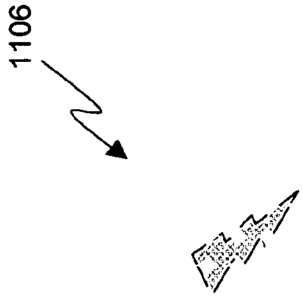
Figure 44C:
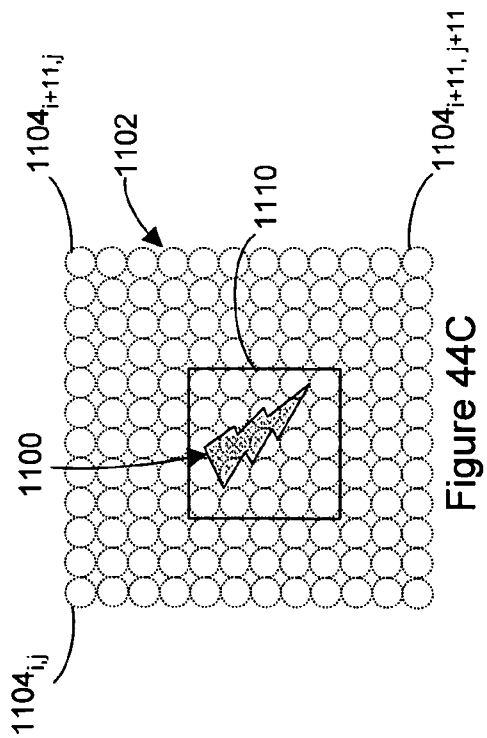
Figure 44D:
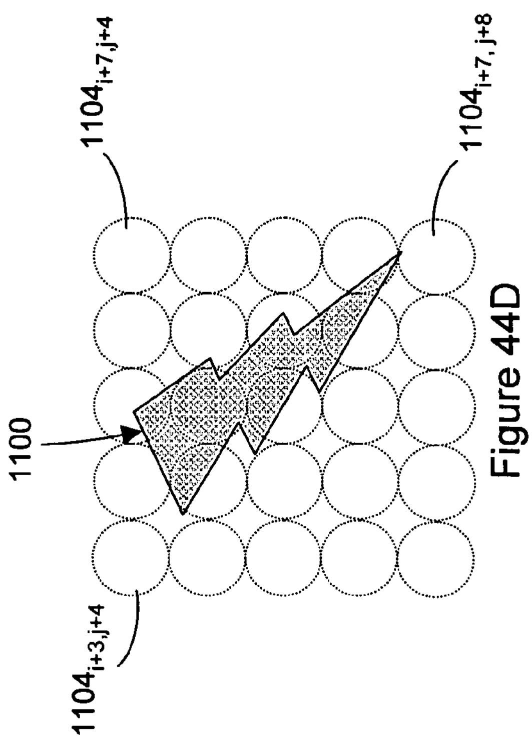
Figure 44E:
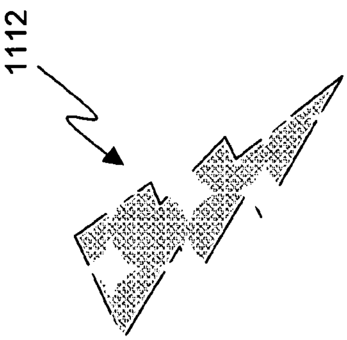
Figure 44G:
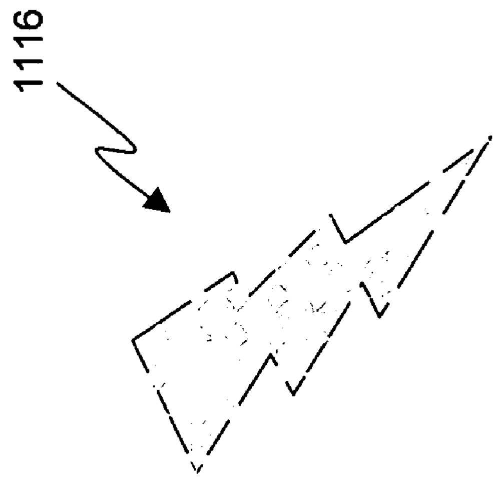
Figure 44F:
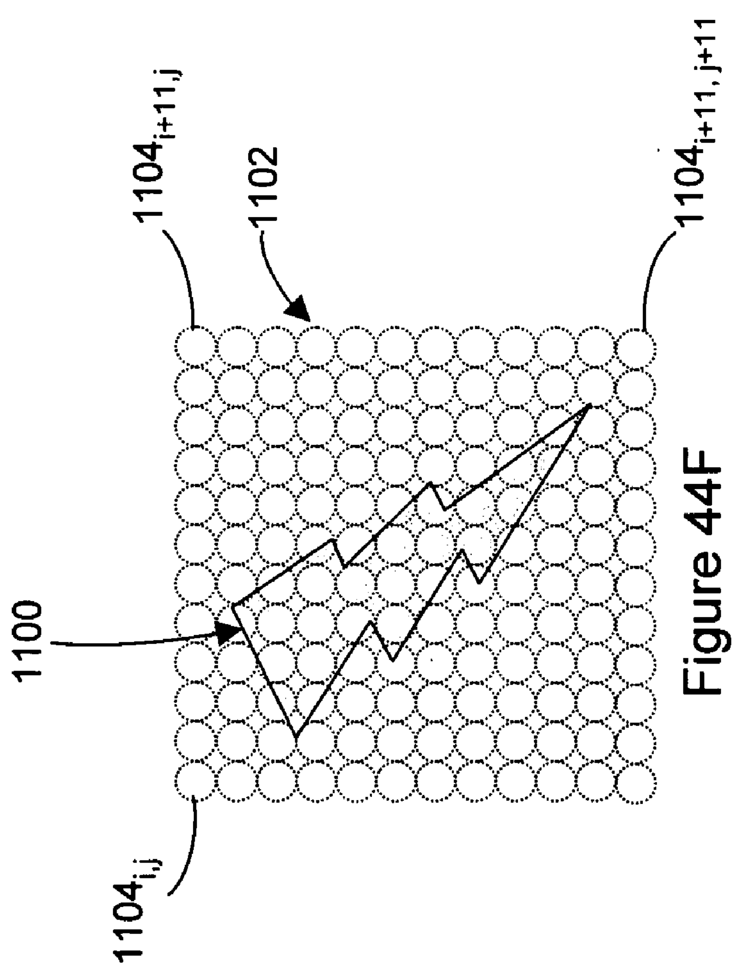
Figure 45A:
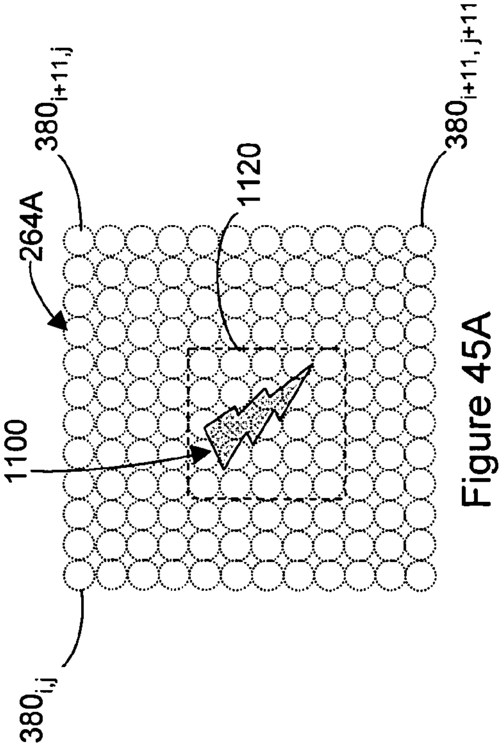
Figure 45B:
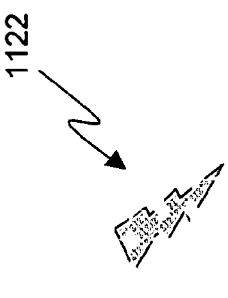
Figure 45C:
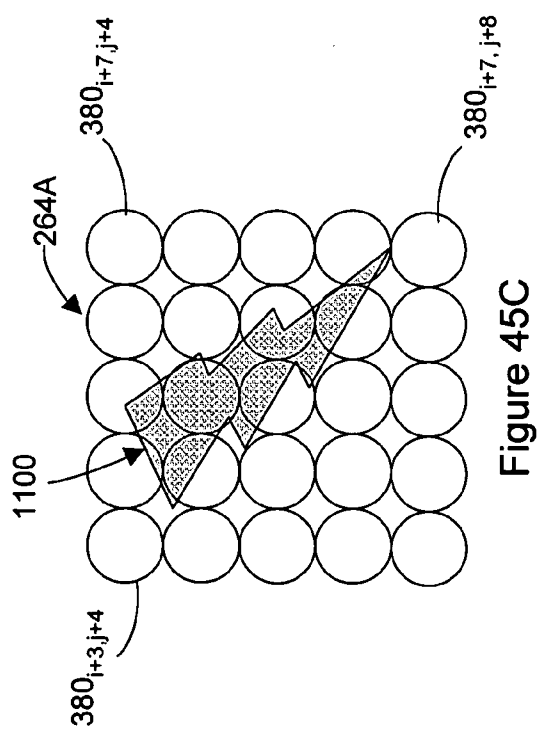
Figure 45D:
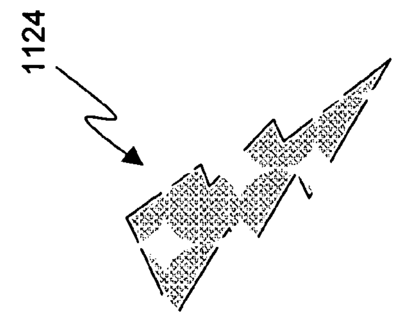
Figure 45E:
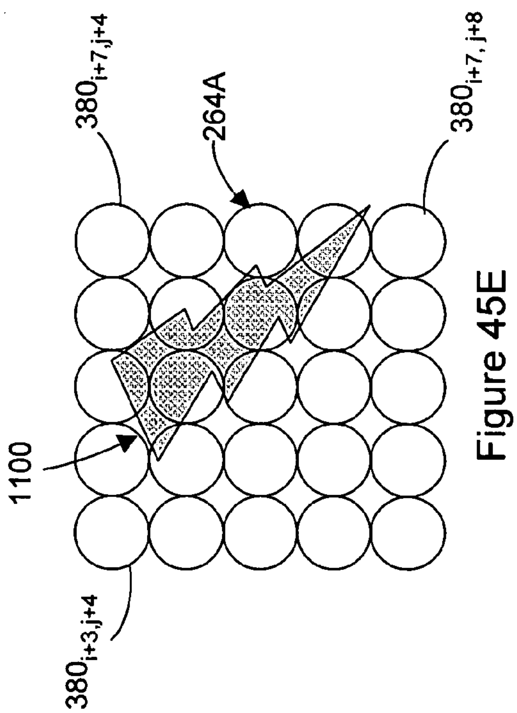
Figure 45F:
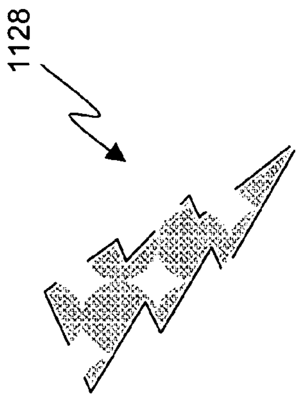
Figure 45G:
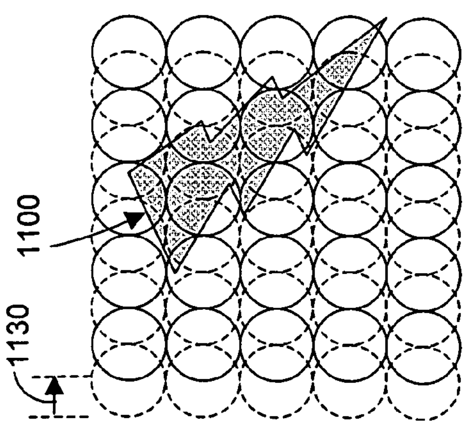
Figure 45H:
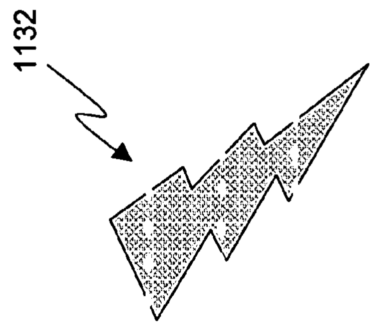
Figure 45I:
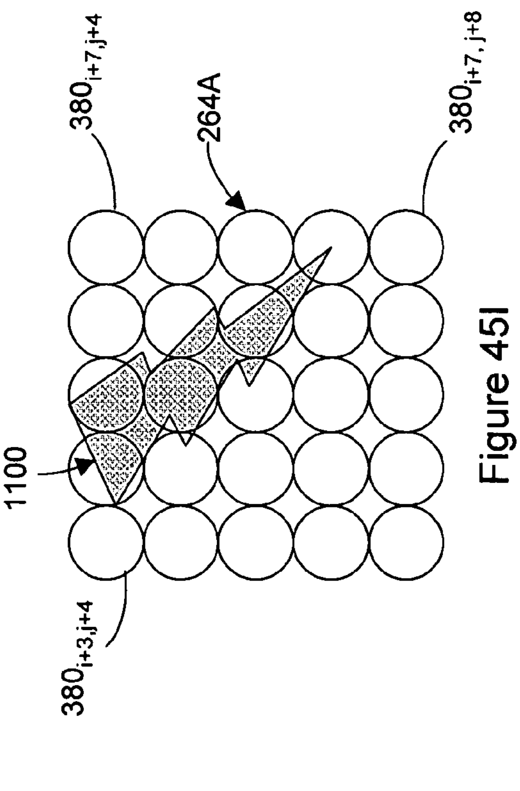
Figure 45J:
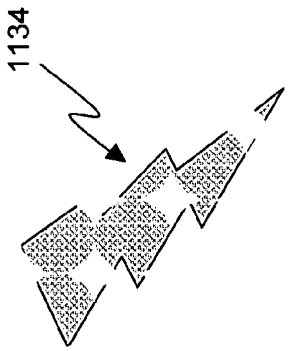
Figure 45K:
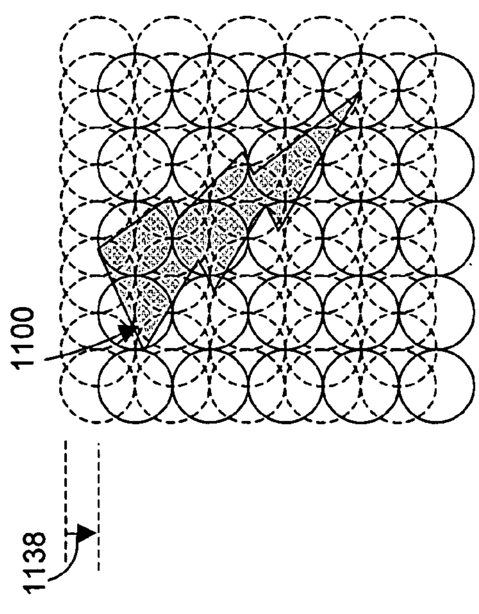
Figure 45L:
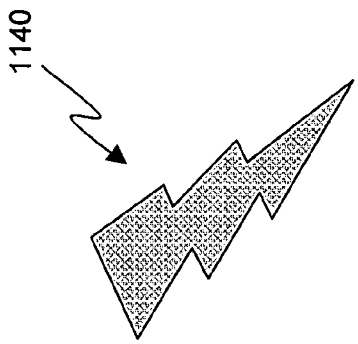
Figure 46A:
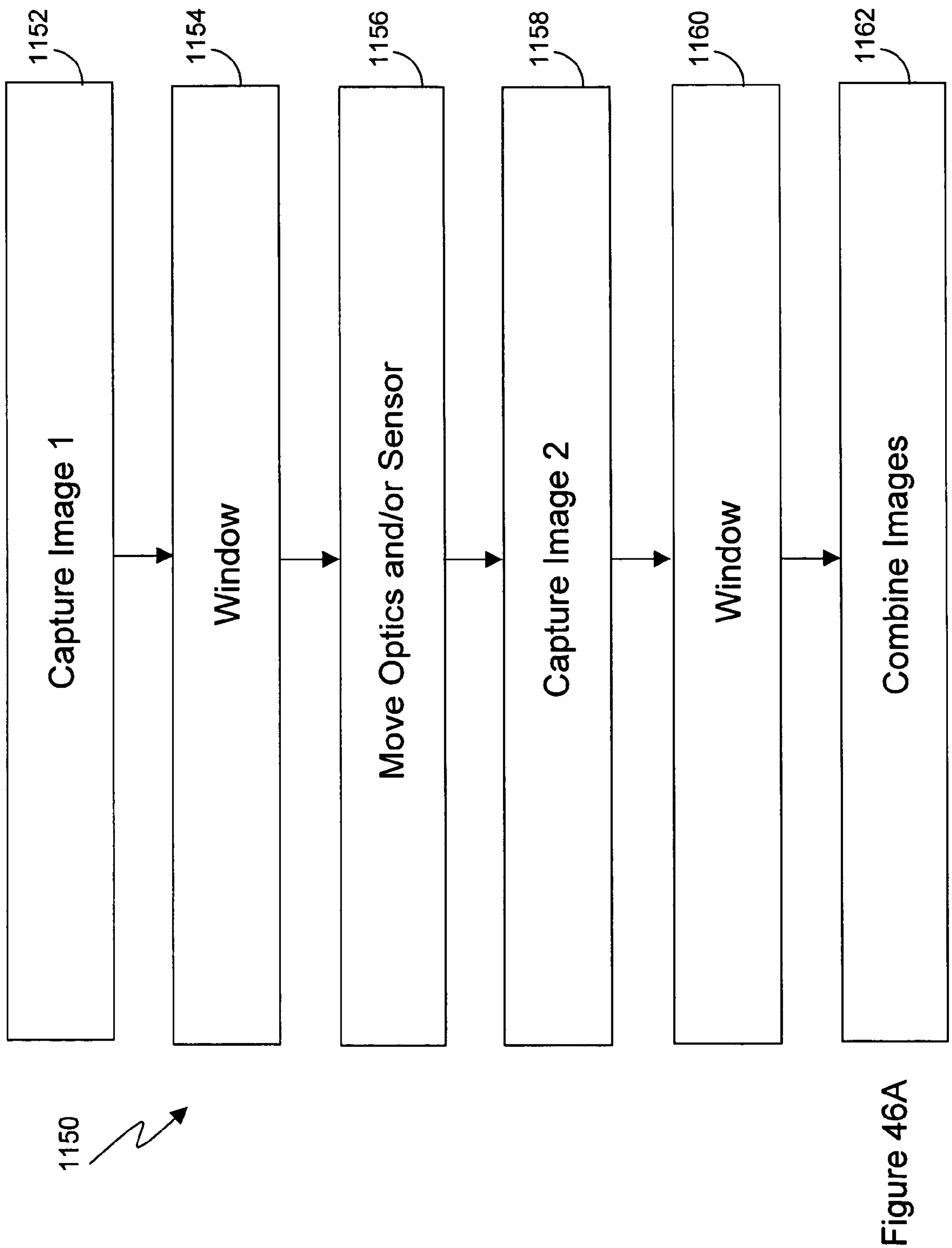

FIG. 44A is an enlarged view of a portion of a sensor, for example, the sensor of FIG. 8A, and a representation of an image of an object striking the portion of the sensor;

FIG. 44B is a representation of a portion of the image of FIG. 44A captured by the portion of the sensor of FIG. 44A;

FIG. 44C is a view of the portion of the sensor of FIG. 44A and a representation of the image of FIG. 44A, and a window identifying a portion to be enlarged;

FIG. 44D is an enlarged view of a portion of the sensor of FIG. 44C within the window of FIG. 44C and an enlarged representation of a portion of the image of FIG. 44C within the window of FIG. 44C;

FIG. 44E is a representation of an image produced by enlarging the portion of the image of FIG. 44C within the window of FIG. 44C;

FIG. 44F is a view of the portion of the sensor of FIG. 44A and a representation of an image of an object striking the portion of the sensor after optical zooming;

FIG. 44G is a representation of an image produced by optical zooming;

FIG. 45A is an enlarged view of a portion of a sensor, for example, the sensor of FIG. 8A, a representation of an image of an object striking the portion of the sensor, and a window identifying a portion to be enlarged;

FIG. 45B is a representation of a portion of the image of FIG. 45A captured by the portion of the sensor of FIG. 45A;

FIG. 45C is an enlarged view of a portion of the sensor of FIG. 45A within the window of FIG. 45A and an enlarged representation of a portion of the image of FIG. 45A within the window of FIG. 45A;

FIG. 45D is an representation of a portion of the image of FIG. 45C captured by the portion of the sensor of FIG. 45C;

FIG. 45E is an enlarged view of the portion of the sensor of FIG. 45C and a representation of the image of the object striking the portion of the sensor, with the sensor and the associated optics in a second relative positioning;

FIG. 45F is a representation of a portion of the image captured by the portion of the sensor of FIG. 45E, with the sensor and the optics in the second relative positioning;

FIG. 45G is an explanatory view showing a relationship between the first relative positioning and the second relative positioning, wherein dotted circles indicate the position of sensor elements relative to the image of the object with the sensor and the optics in the first relative positioning and solid circles indicate the position of the sensor elements relative to the image of the object with the sensor and the optics in the second relative positioning;

FIG. 45H is a representation showing a combination of the portion of the image captured with the first relative positioning, as represented in FIG. 45D and the portion of the image captured with the second relative positioning, as represented in FIG. 45F;

FIG. 45I is an enlarged view of the portion of the sensor of FIG. 45C and a representation of the image of the object striking the portion of the sensor, with the sensor and the associated optics in a third relative positioning;

FIG. 45J is a representation of a portion of the image captured by the portion of the sensor of FIG. 45I, with the sensor and the optics in the third relative positioning;

FIG. 45K is an explanatory view showing a relationship between the first relative positioning, the second relative positioning and the third relative positioning, wherein a first set of dotted circles indicate the position of sensor elements relative to the image of the object with the sensor and the optics in the first relative positioning, a second set of dotted circles indicate the position of sensor elements relative to the image of the object with the sensor and the optics in the second relative positioning, and solid circles indicate the position of the sensor elements relative to the image of the object with the sensor and the optics in the third relative positioning;

FIG. 45L is a representation showing a combination of the portion of the image captured with the first relative positioning, as represented in FIG. 45D, the portion of the image captured with the second relative positioning, as represented in FIG. 45F, and the portion of the image captured with the second relative positioning, as represented in FIG. 45J;

FIG. 46A is a flowchart of steps that may be employed in providing zoom, according to one embodiment of the present invention.

Figure 46B:
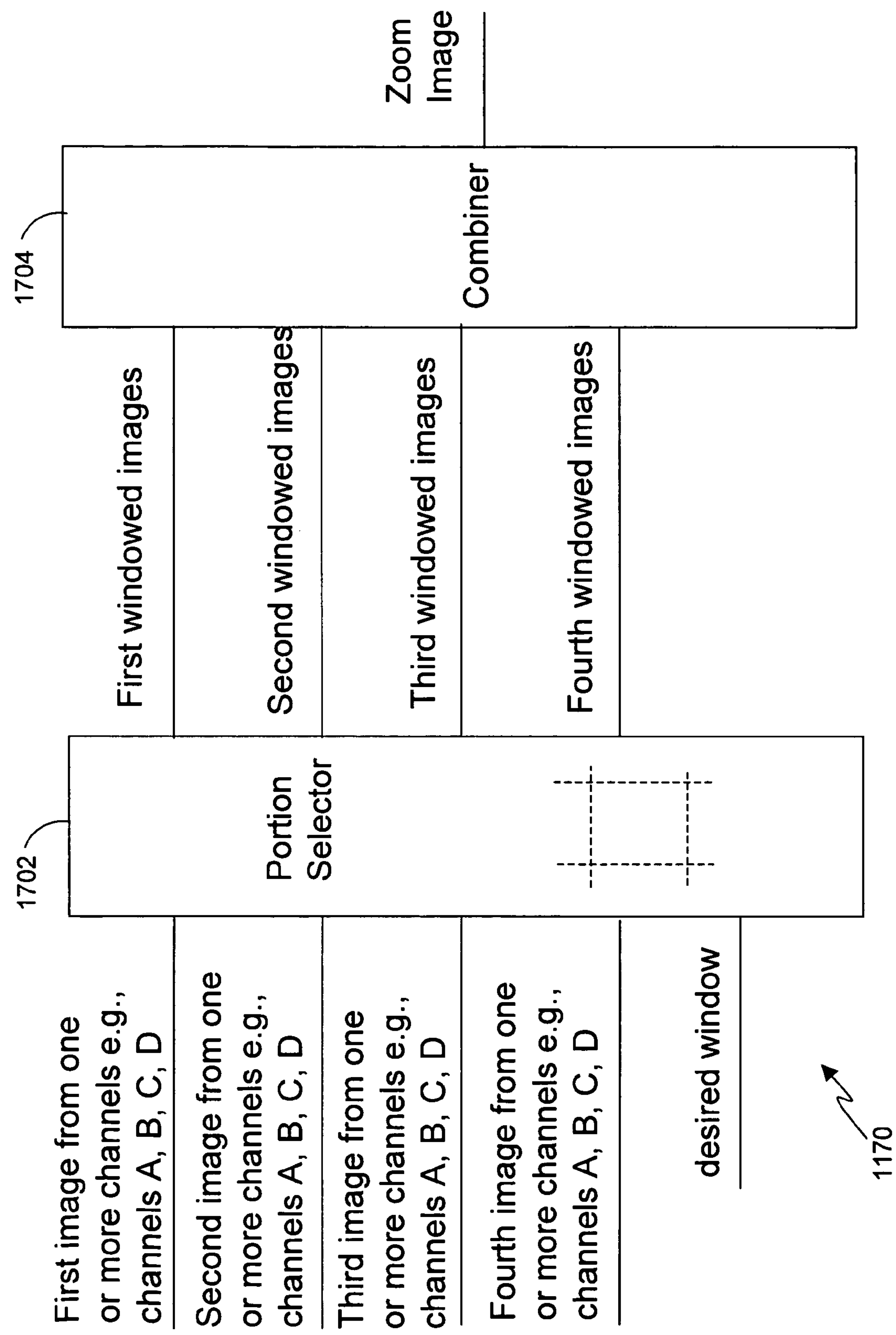
Figure 47A:
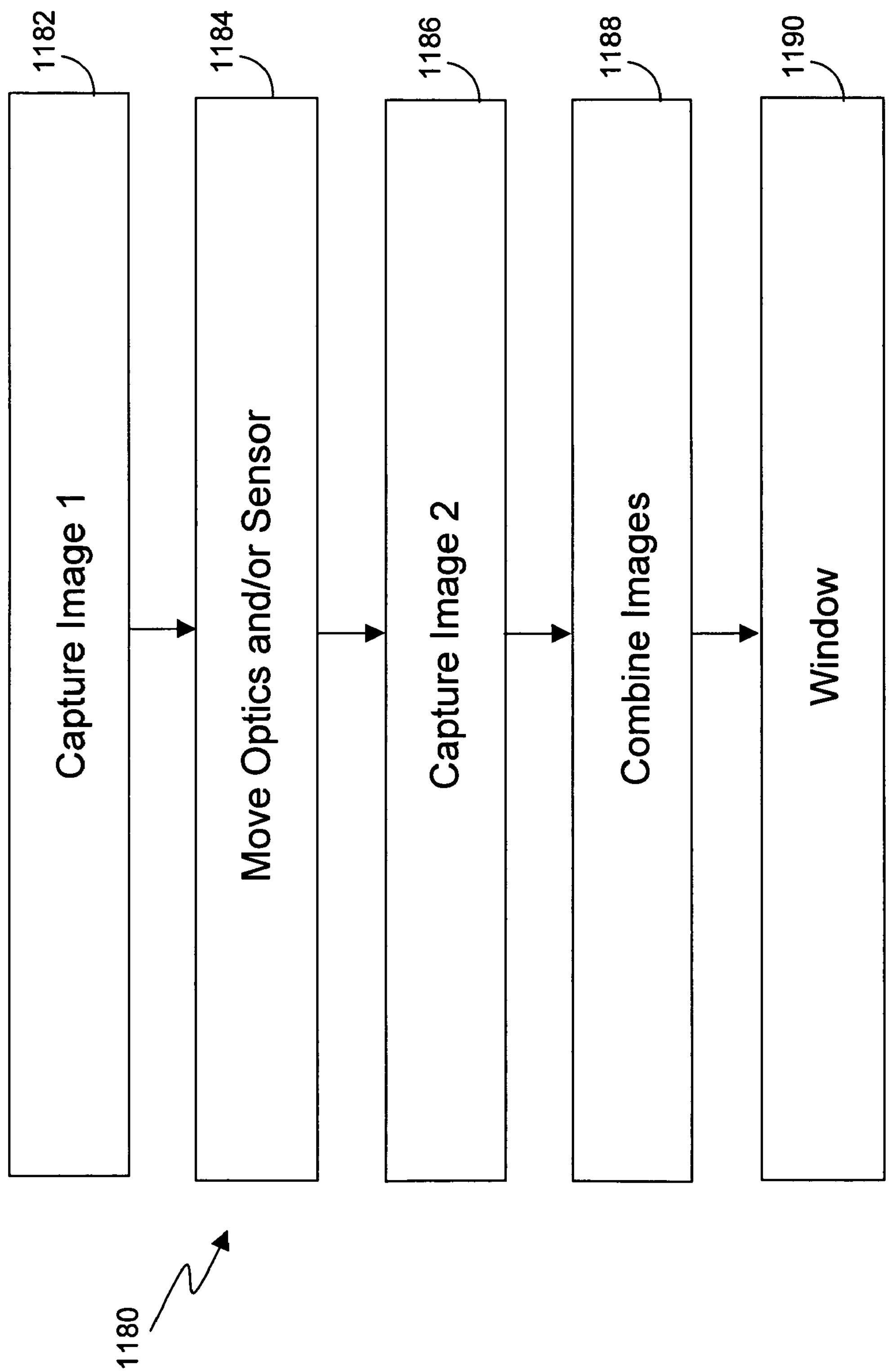

FIG. 46B is a block diagram of one embodiment that may be employed in generating a zoom image;

FIG. 47A is a flowchart of steps that may be employed in providing zoom, according to another embodiment of the present invention.

Figure 47B:
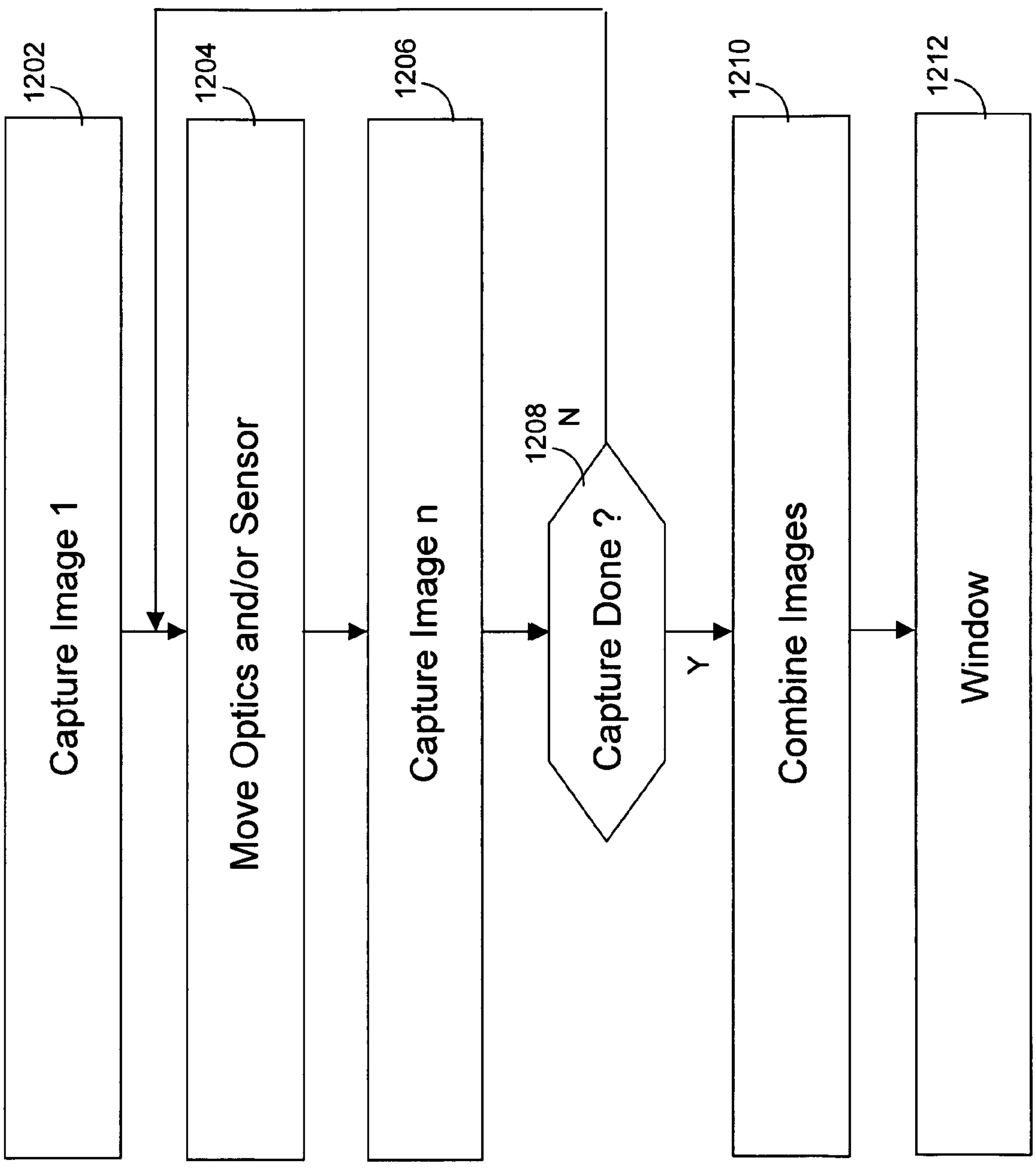

FIG. 47B is a flowchart of steps that may be employed in providing zoom, according to another embodiment of the present invention.

FIGS. 48A-48G show steps used in providing image stabilization according to one embodiment of aspects of the present invention.

Figure 4:
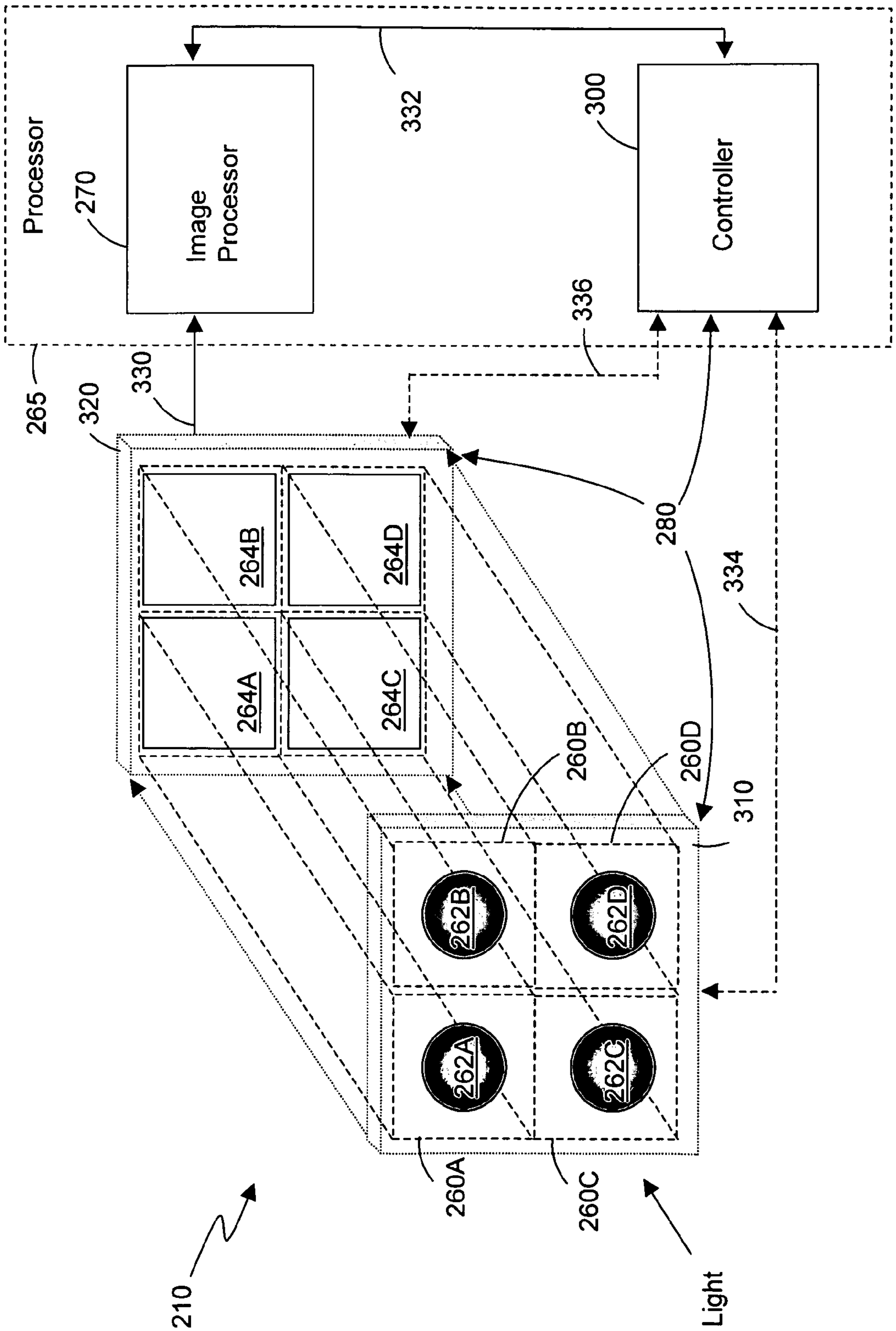
FIG. 4 shows one embodiment of a digital camera apparatus employed in the digital camera of FIG. 3, partially in schematic, partially exploded, perspective view, and partially in block diagram representation, in accordance with certain aspects of the present invention.
Figure 49A:
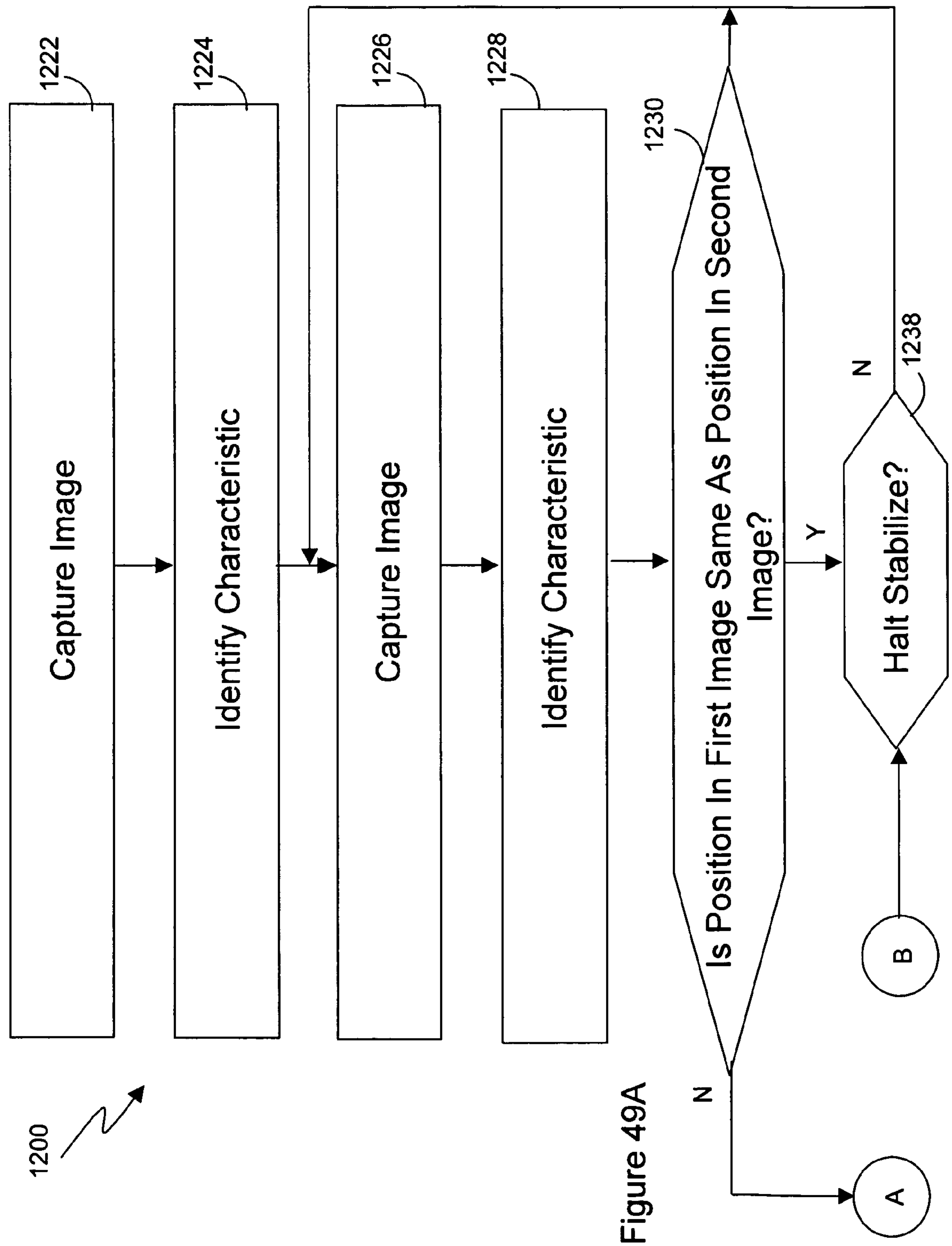
Figure 49B:
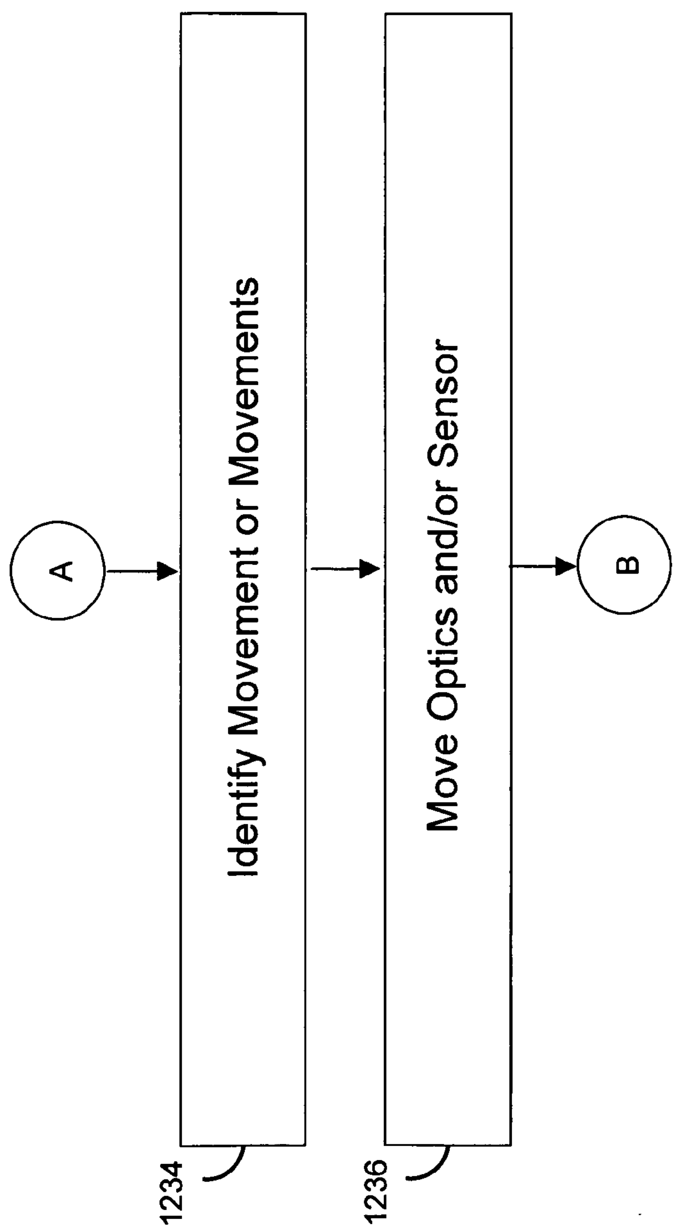
Figure 50A:
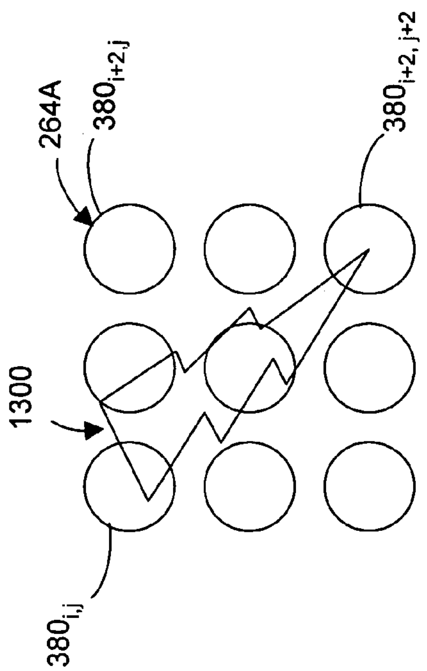
Figure 50B:
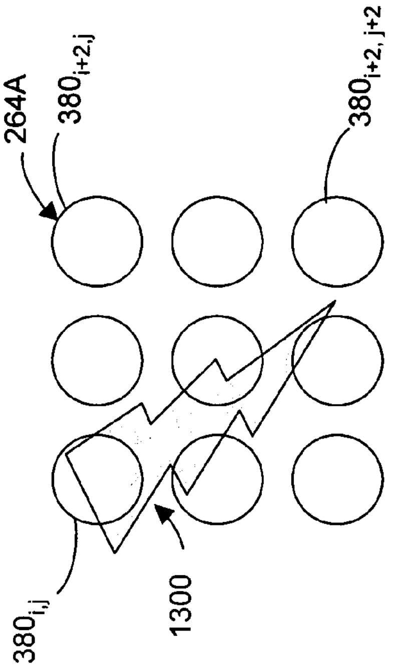
Figure 50C:
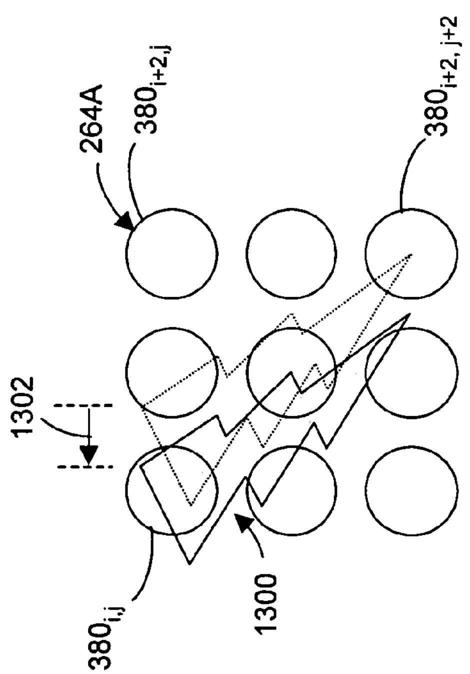
Figure 50D:
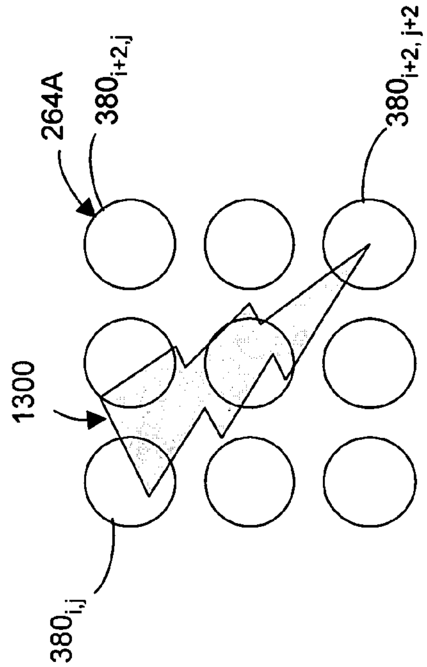
Figure 50E:
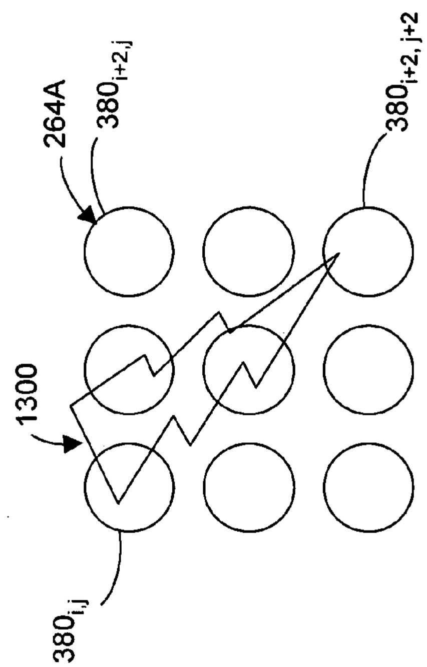
Figure 50G:
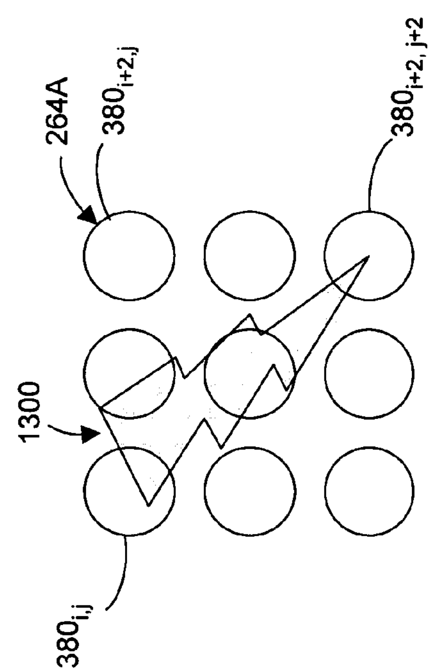
Figure 50F:
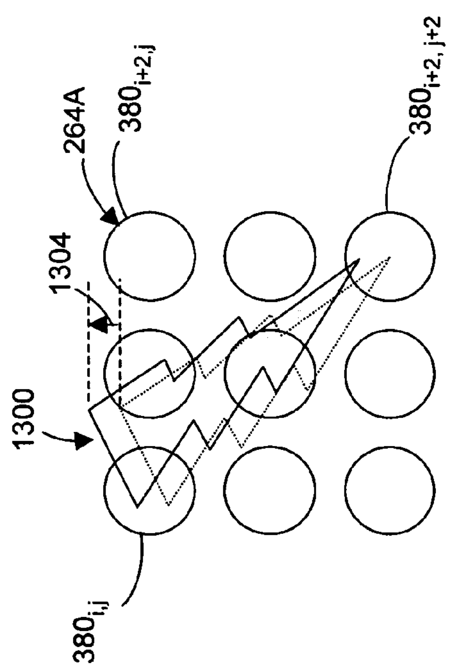
Figure 50H:
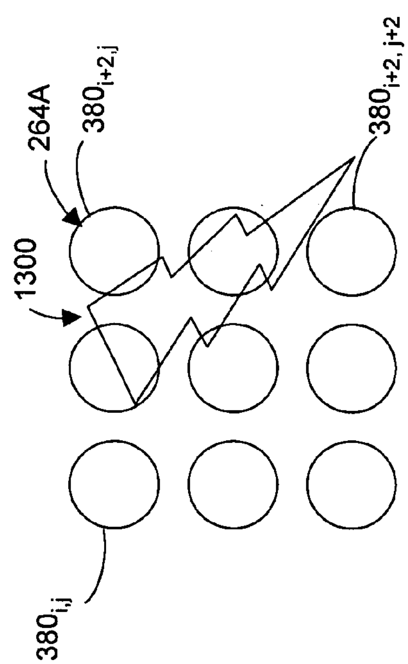
Figure 50I:
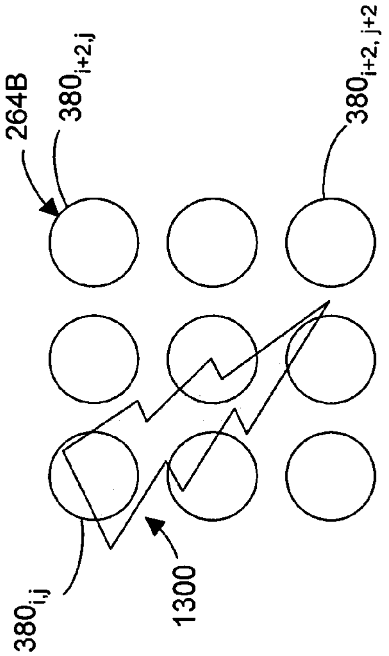
Figure 50J:
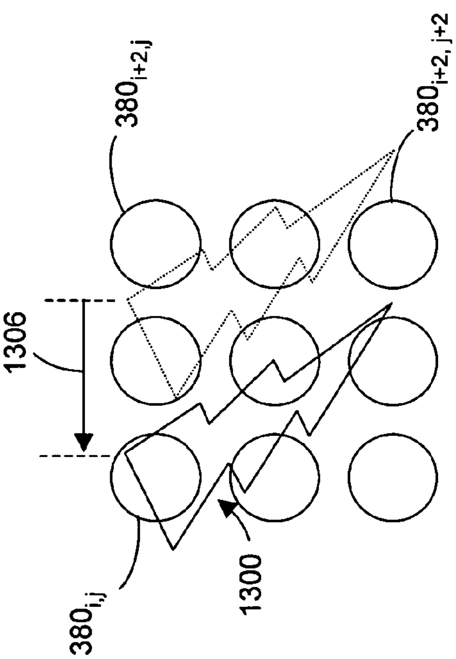
Figure 50K:
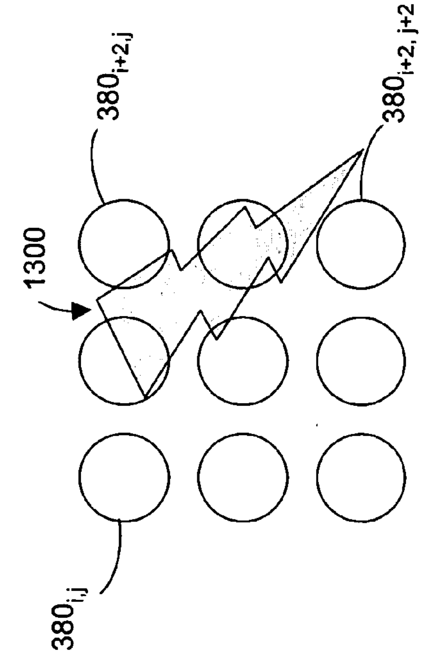
Figure 50L:
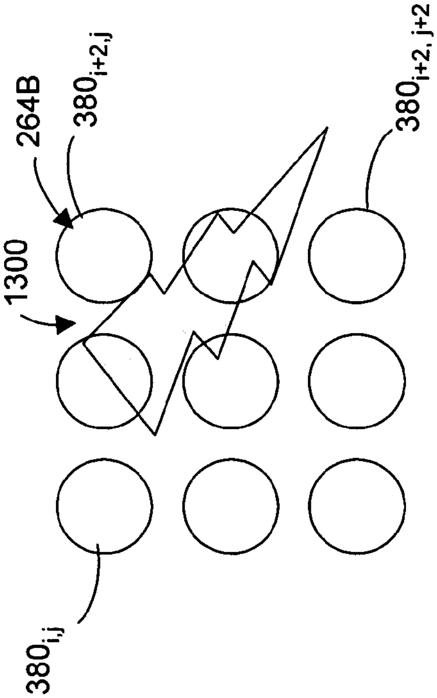
Figure 50N:
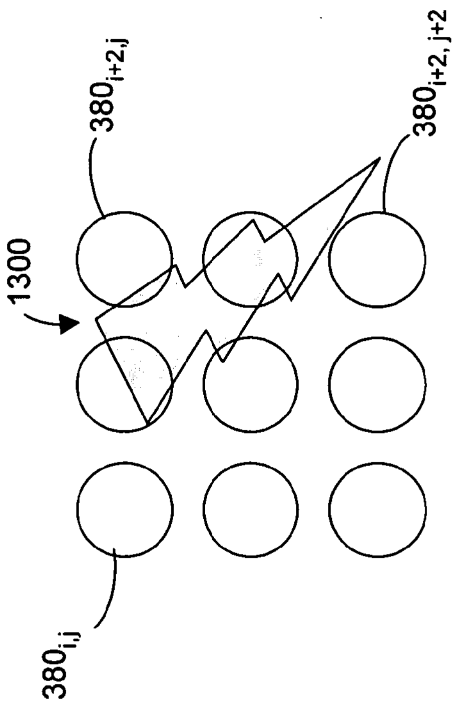
Figure 51A:
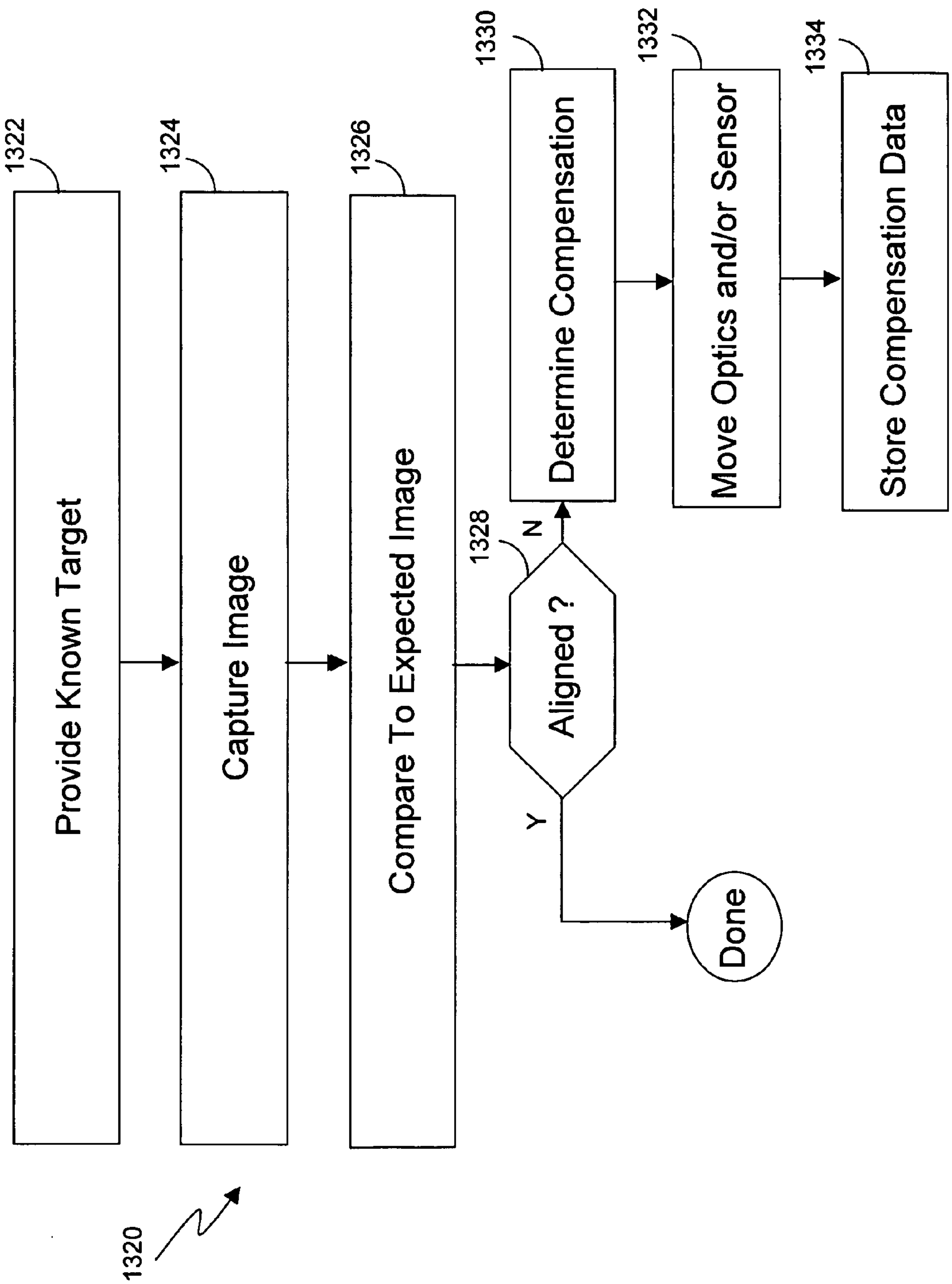
Figure 51B:
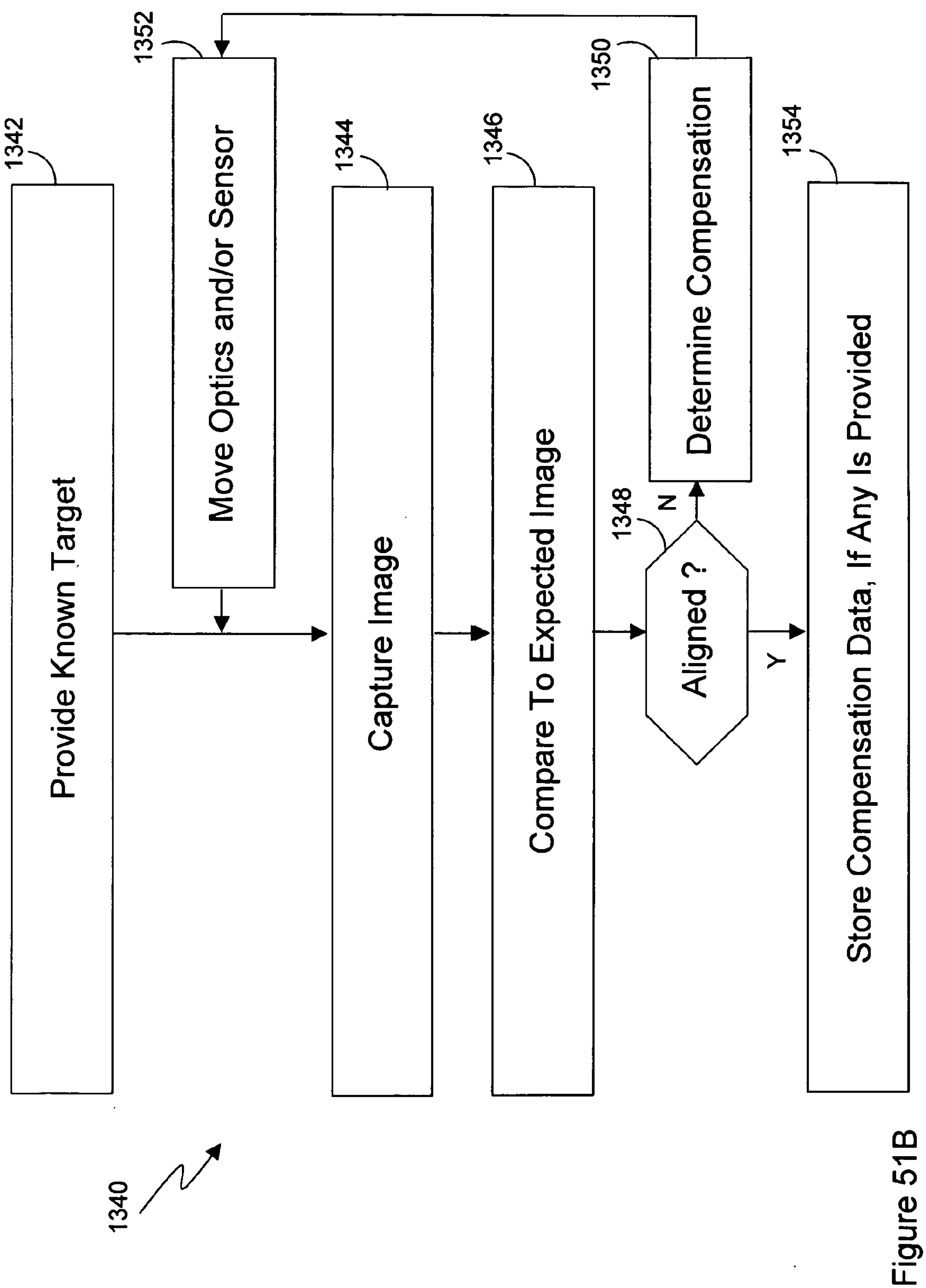
Figure 52A:
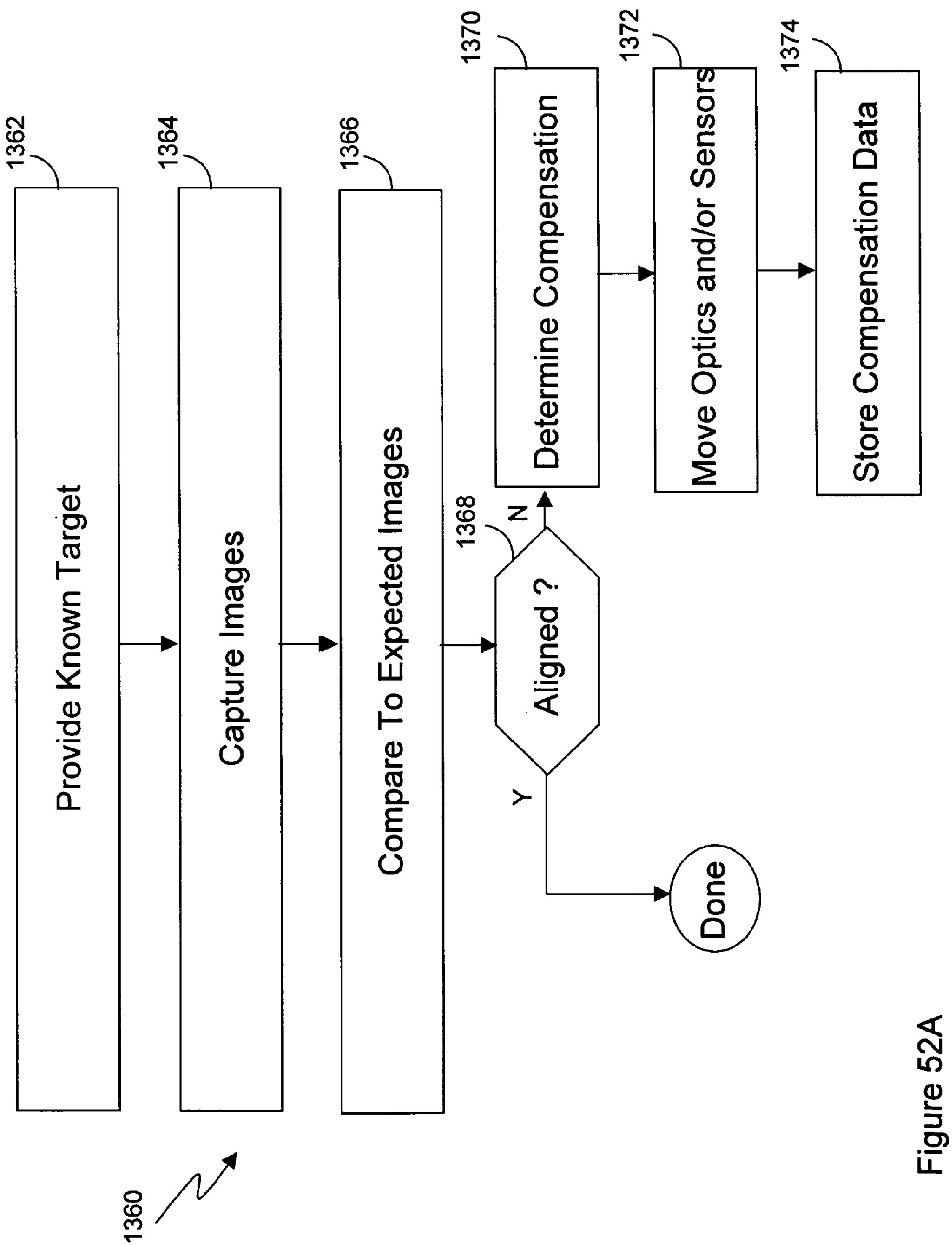
Figure 52B:
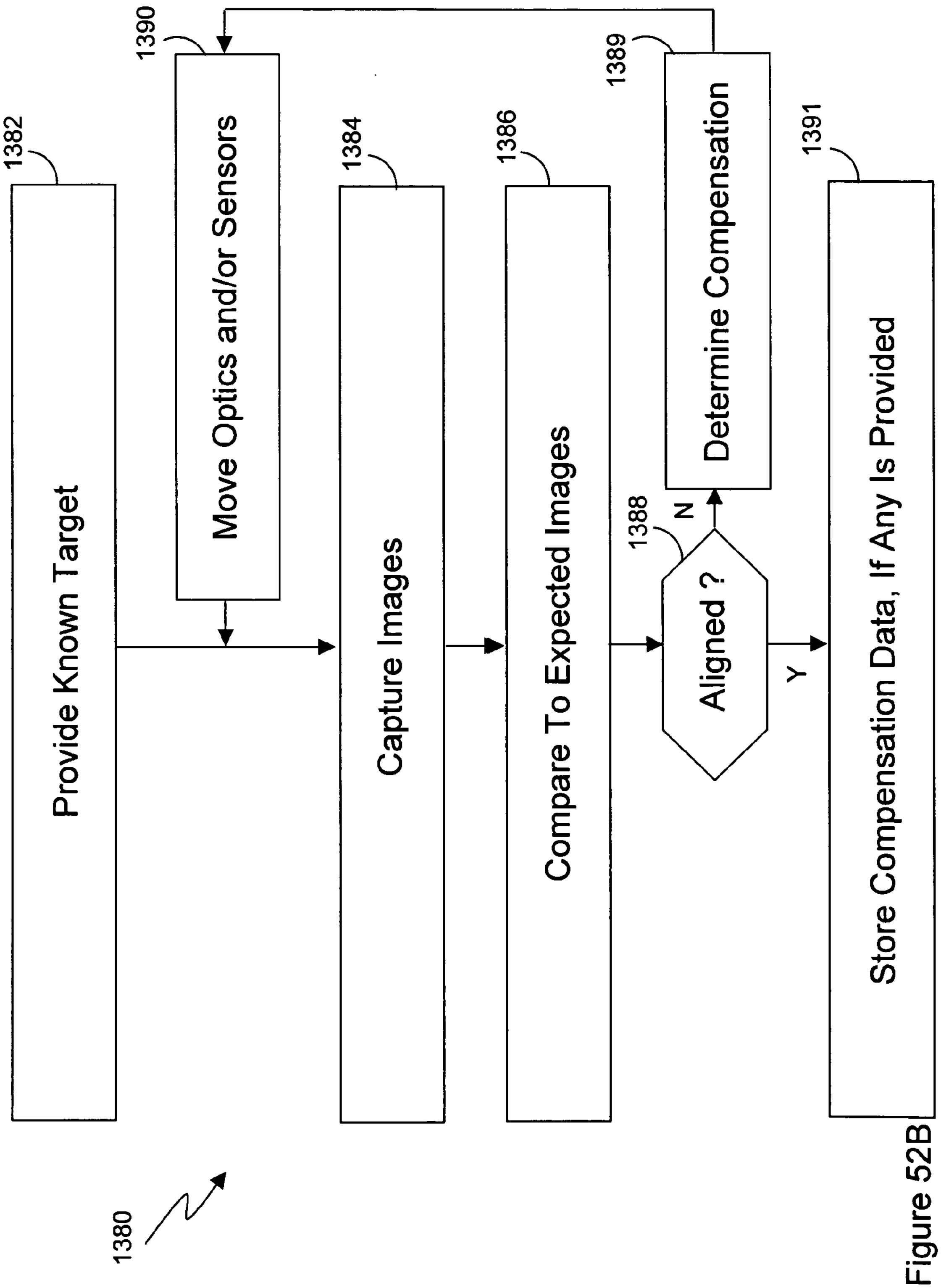
Figure 52C:
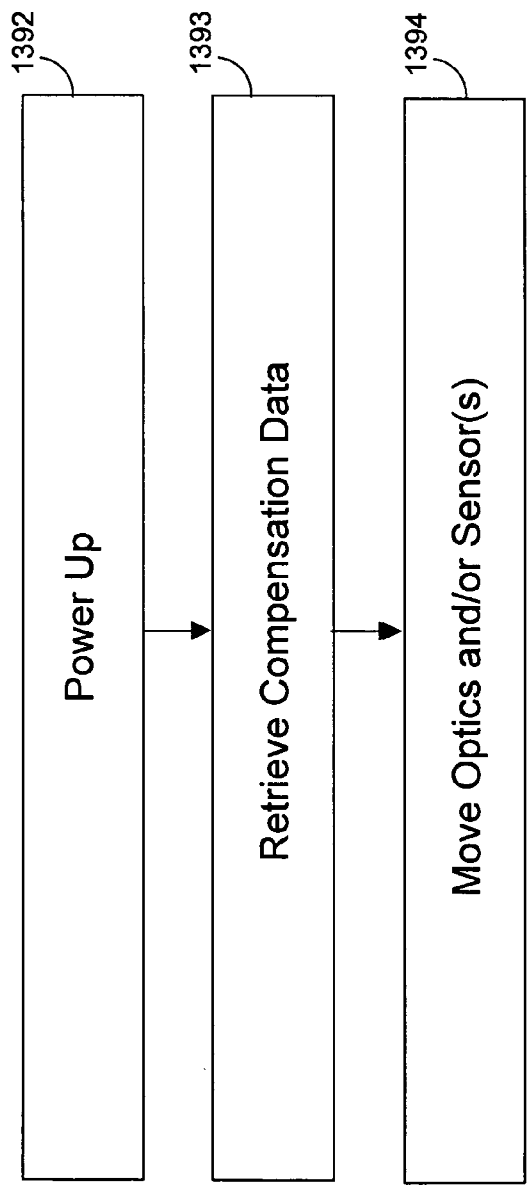
Figure 53A:
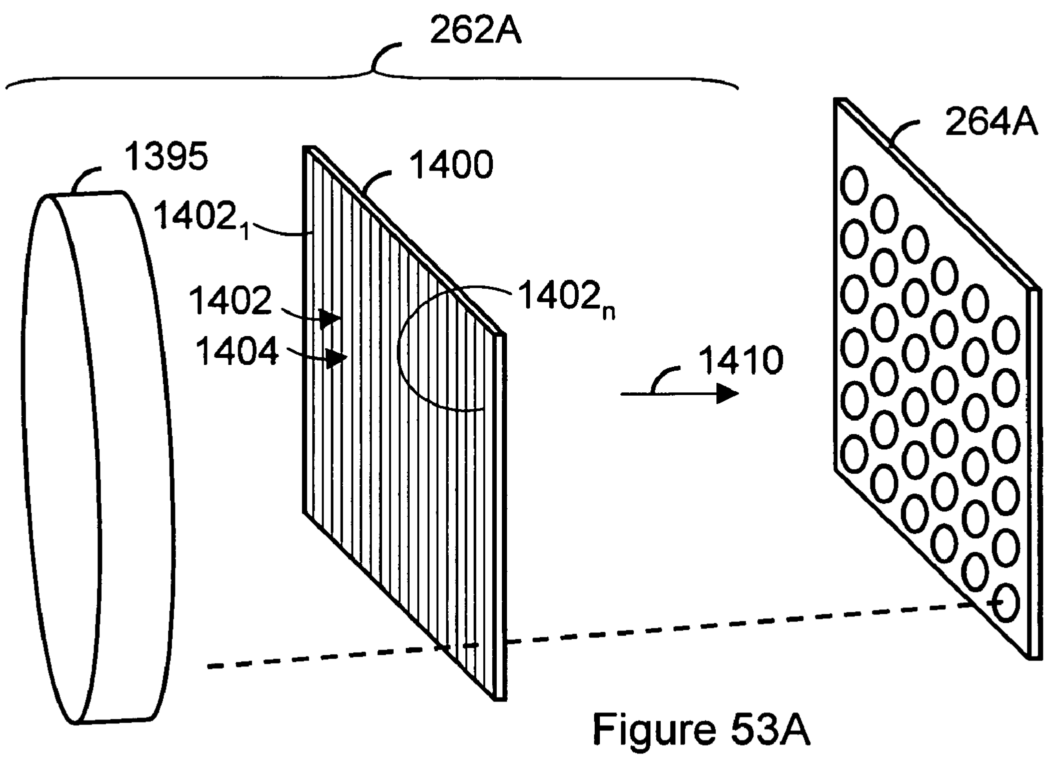
Figure 53B:
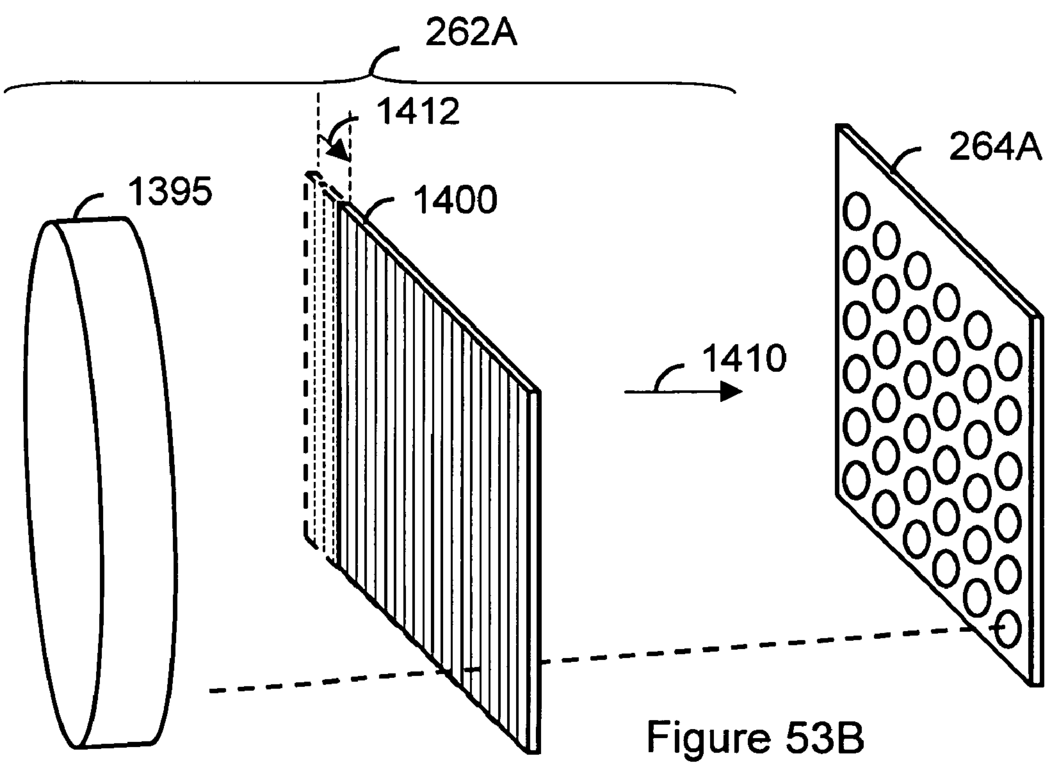
Figure 53C:
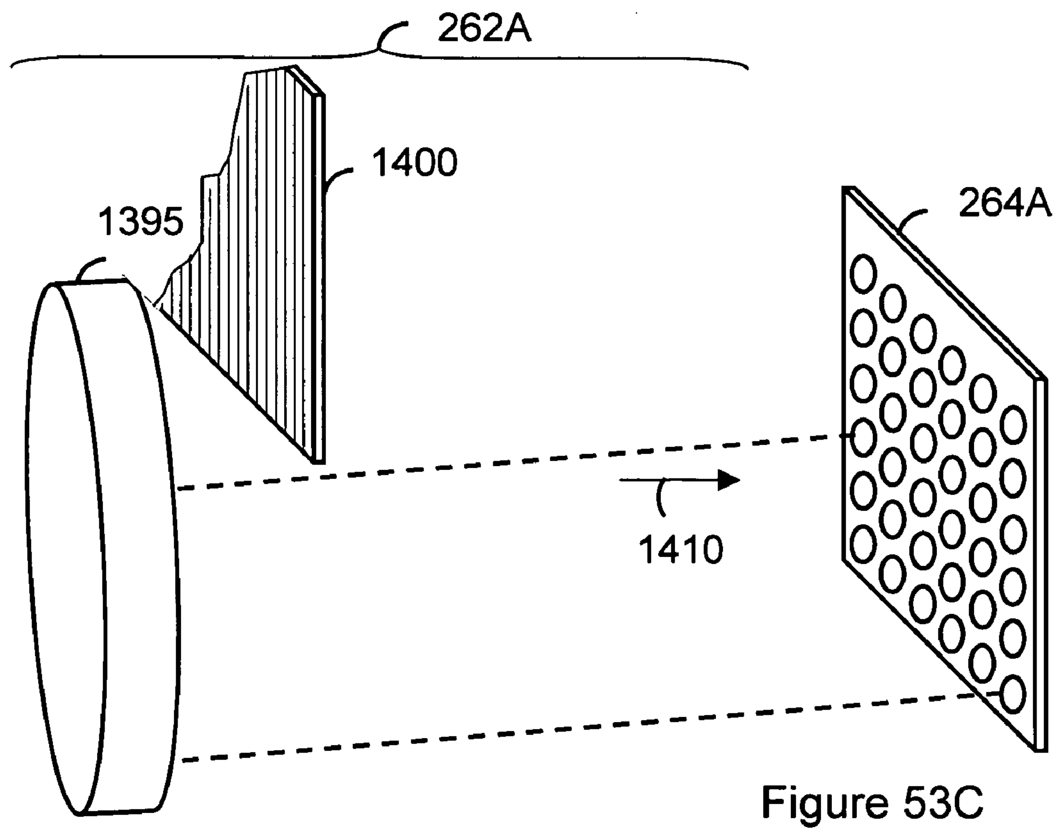
Figure 53D:
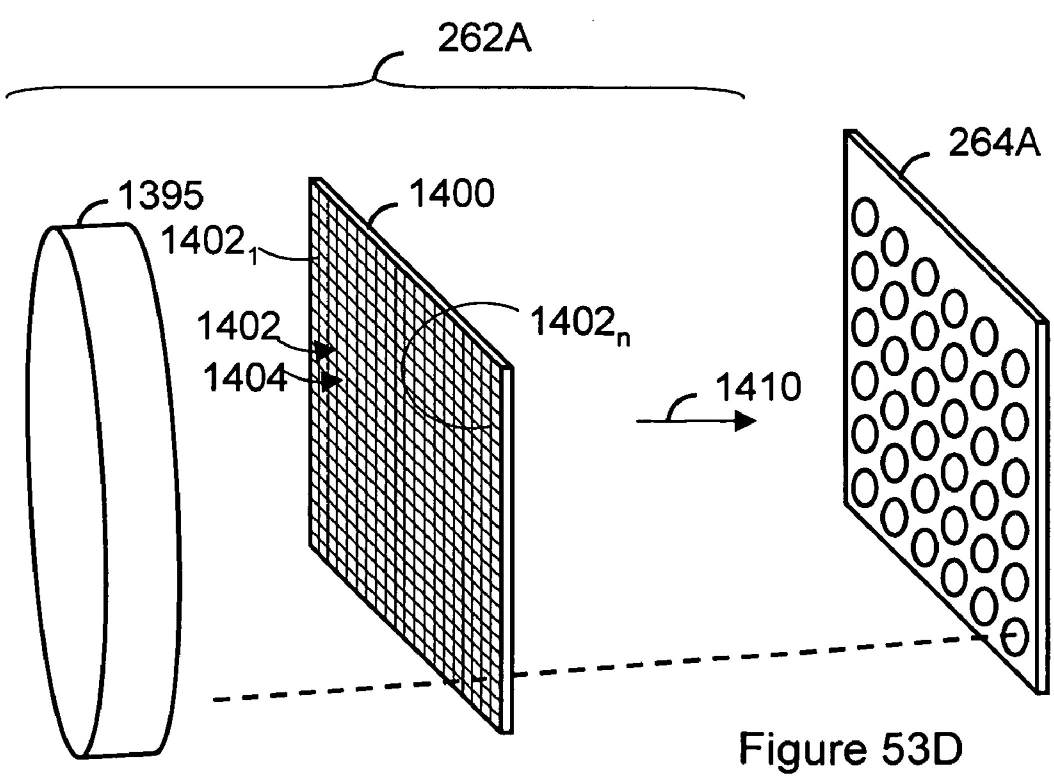
Figure 53E:
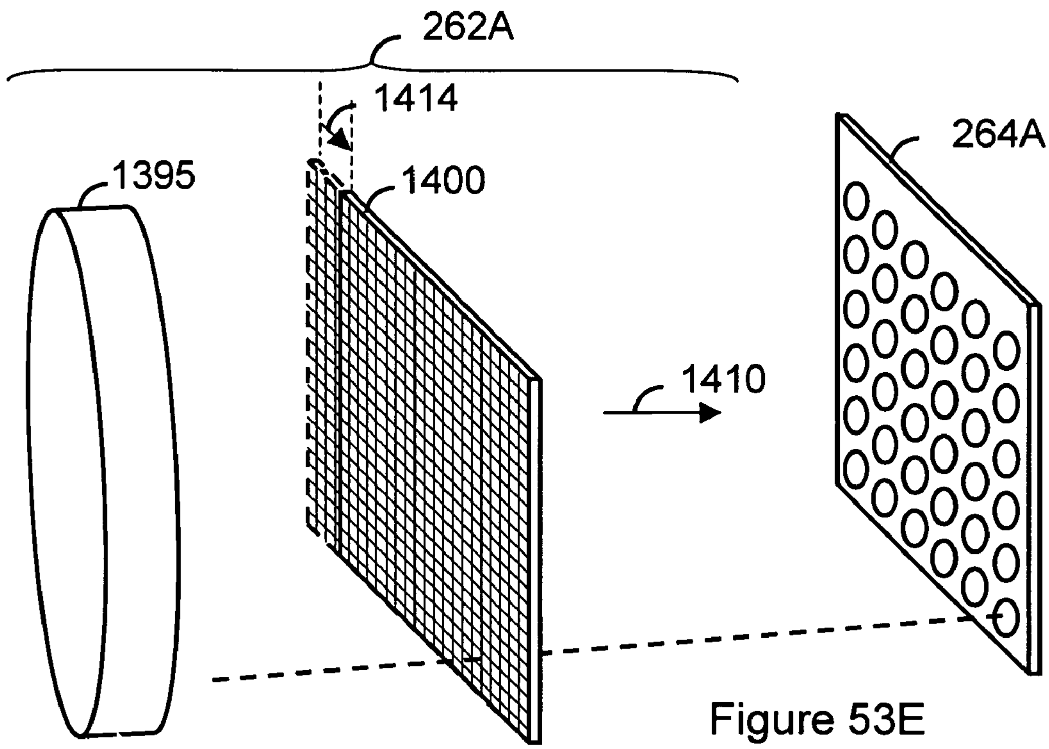
Figure 53F:
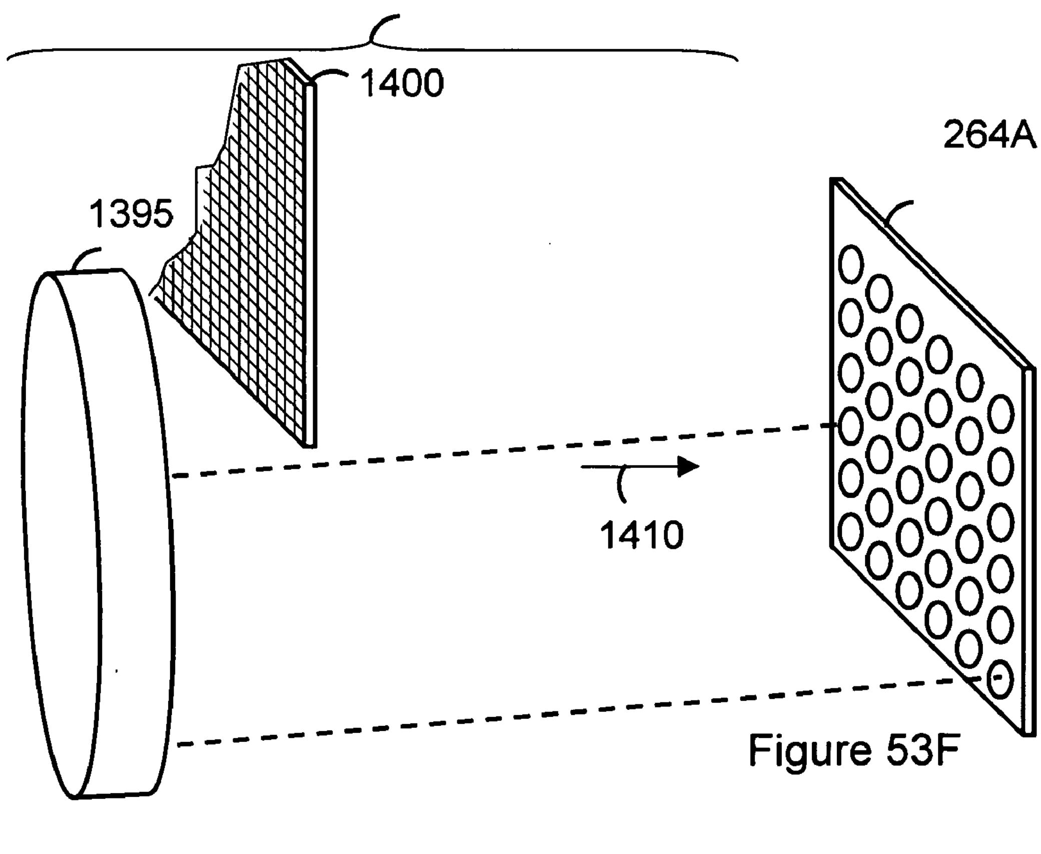
Figure 53G:
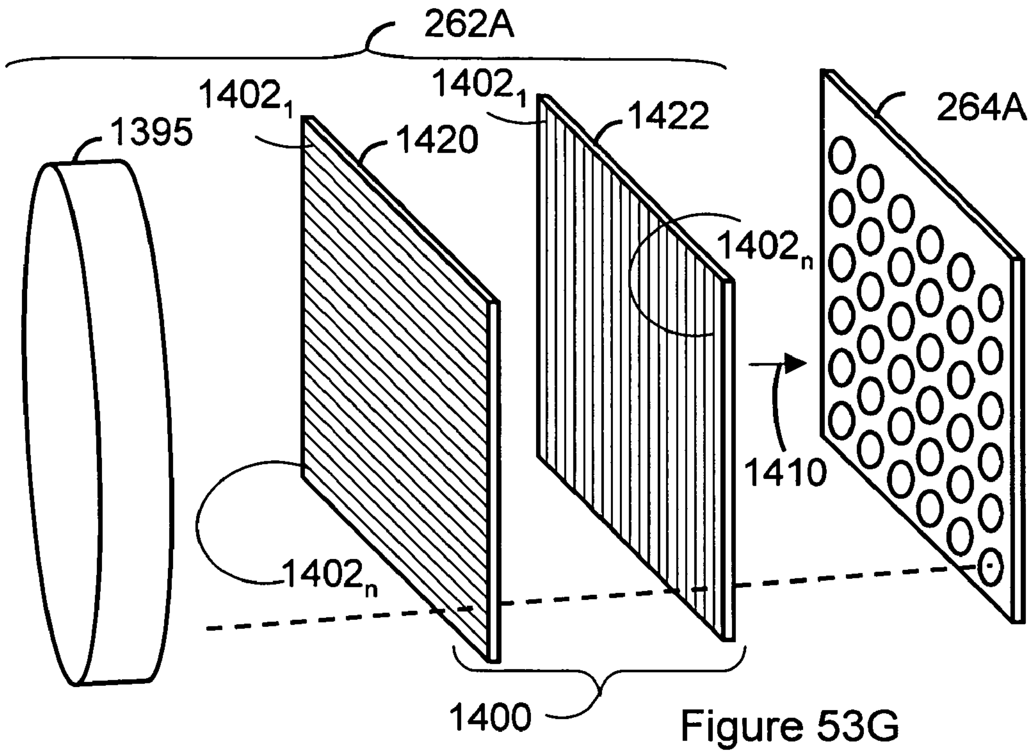
Figure 53H:
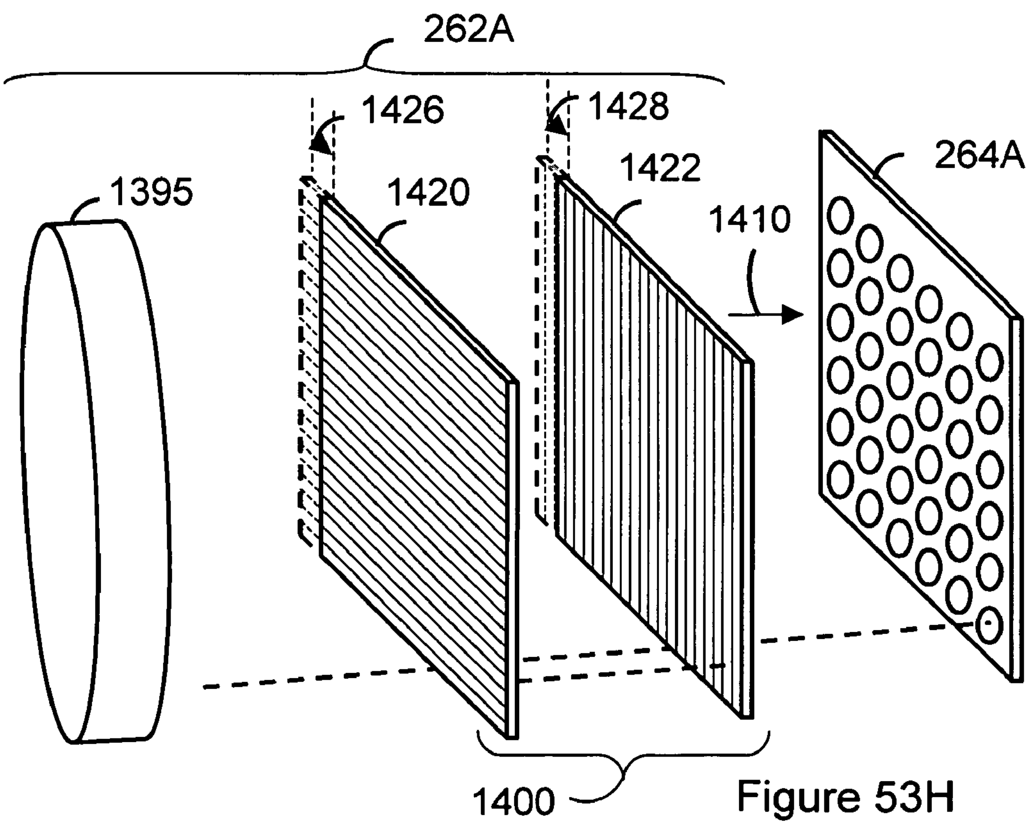
Figure 53I:
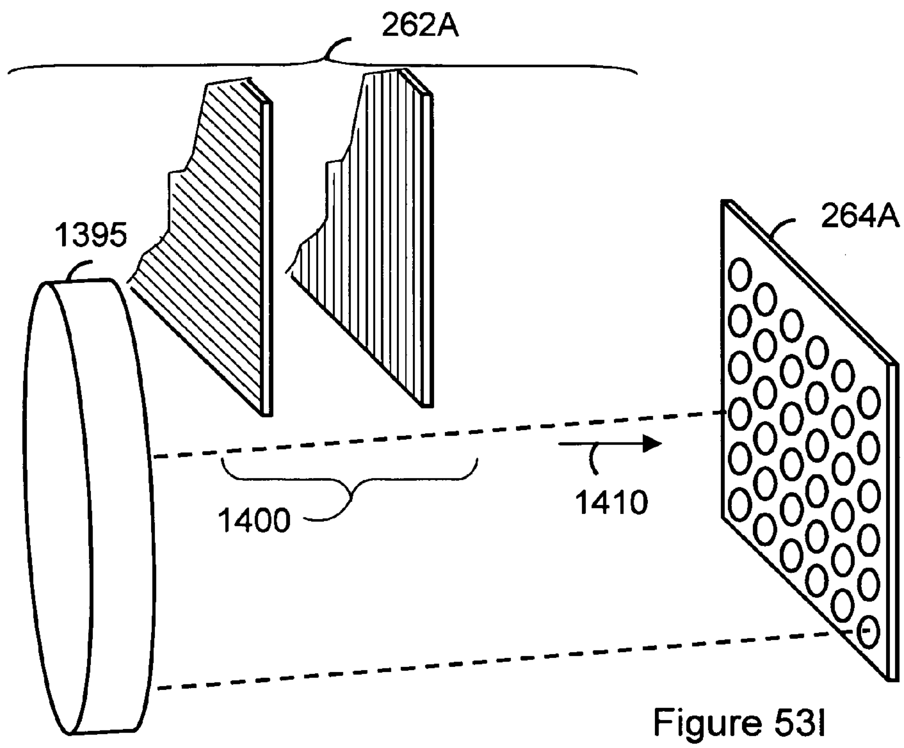
Figure 54:
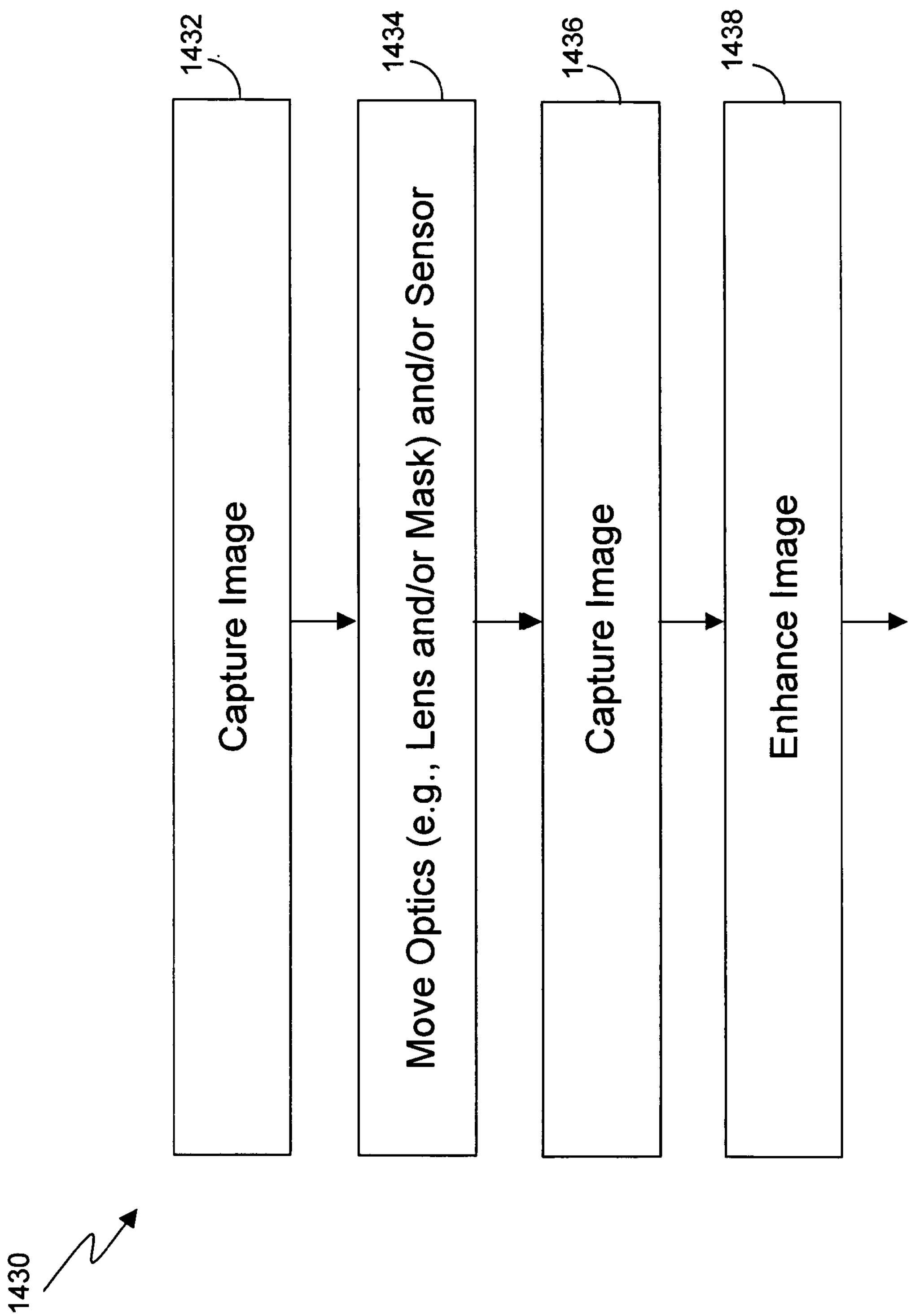
Figure 55A:
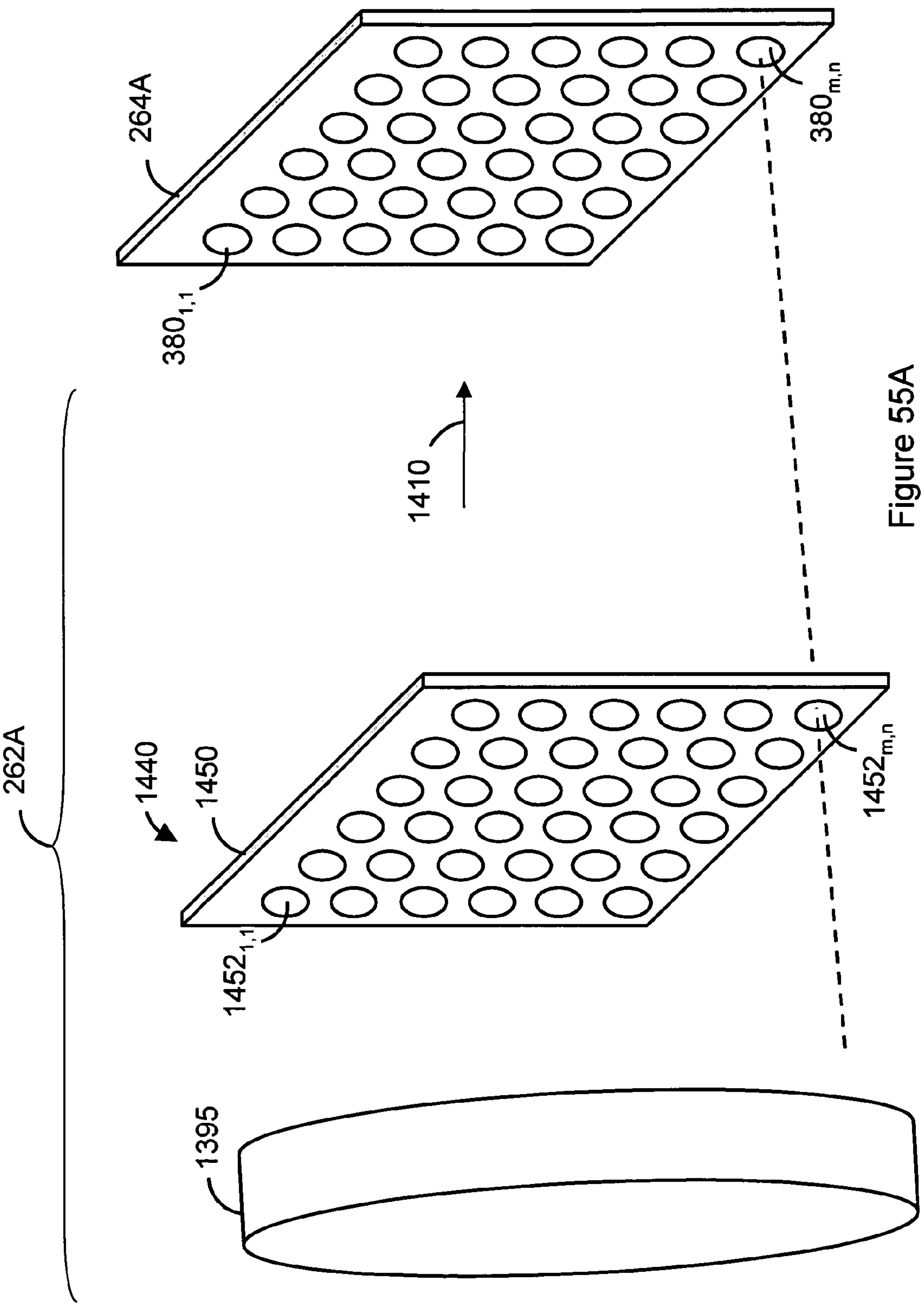
Figure 55B:
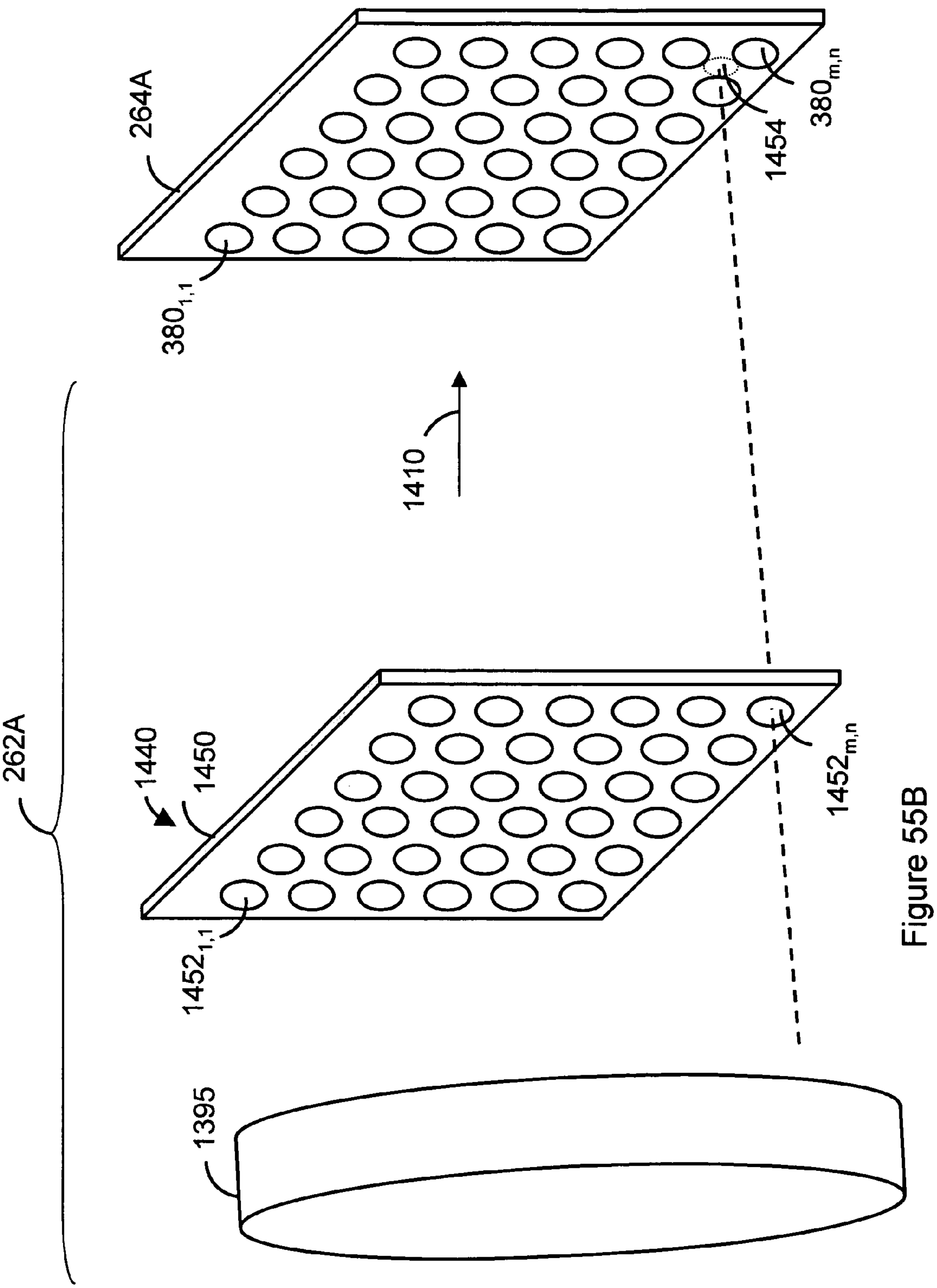
Figure 55C:
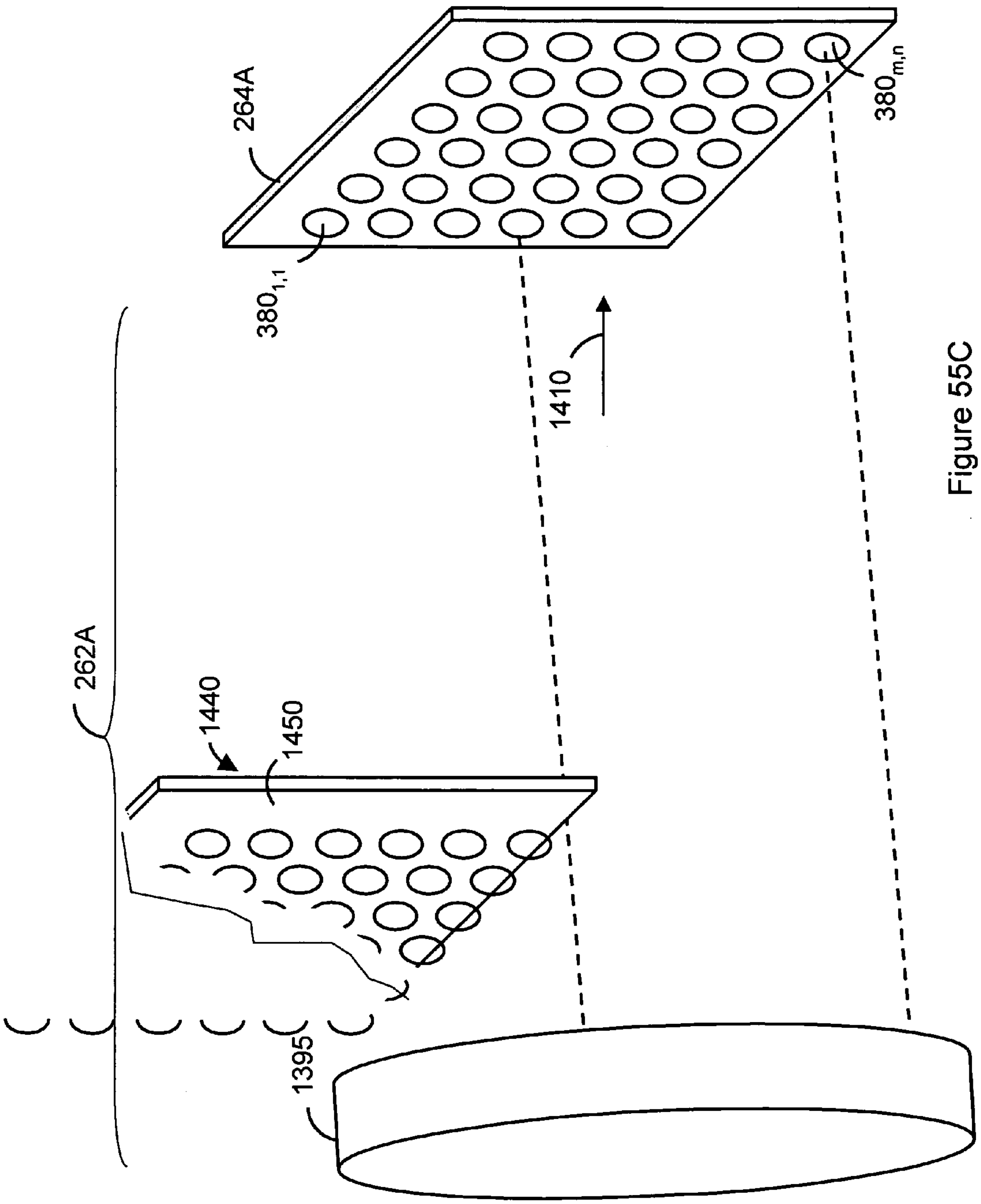
Figure 55D:
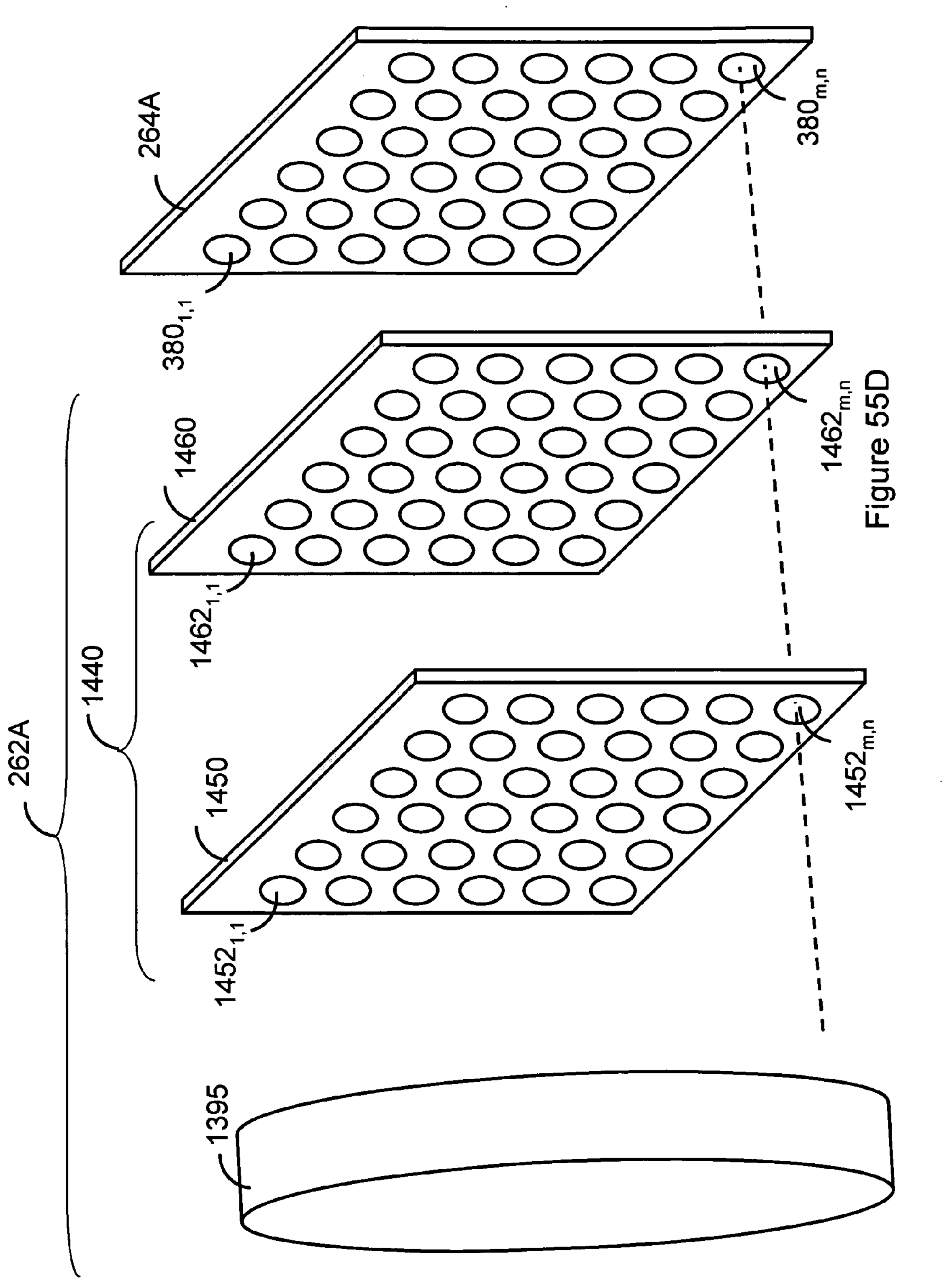
Figure 55E:
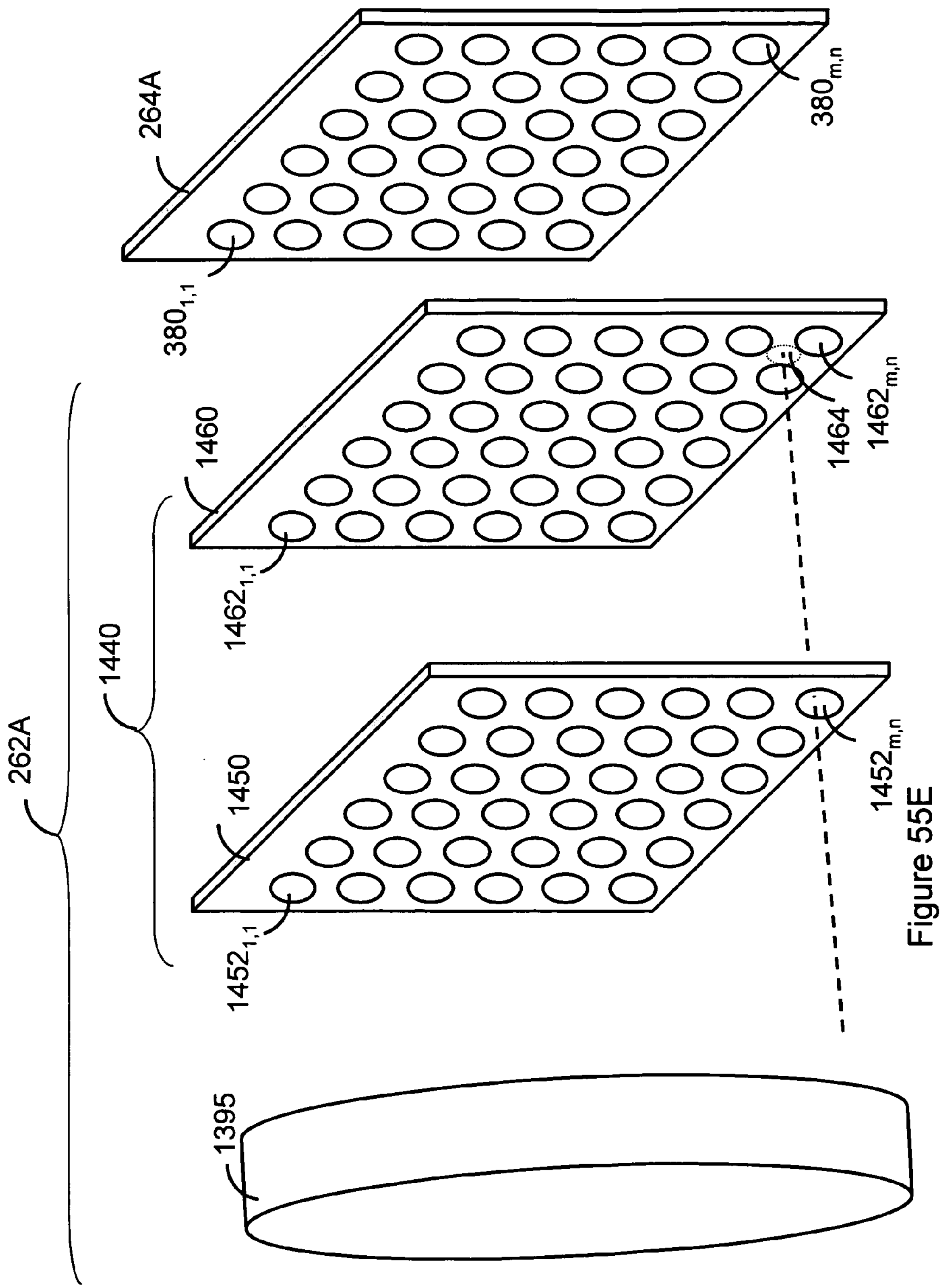
Figure 55F:
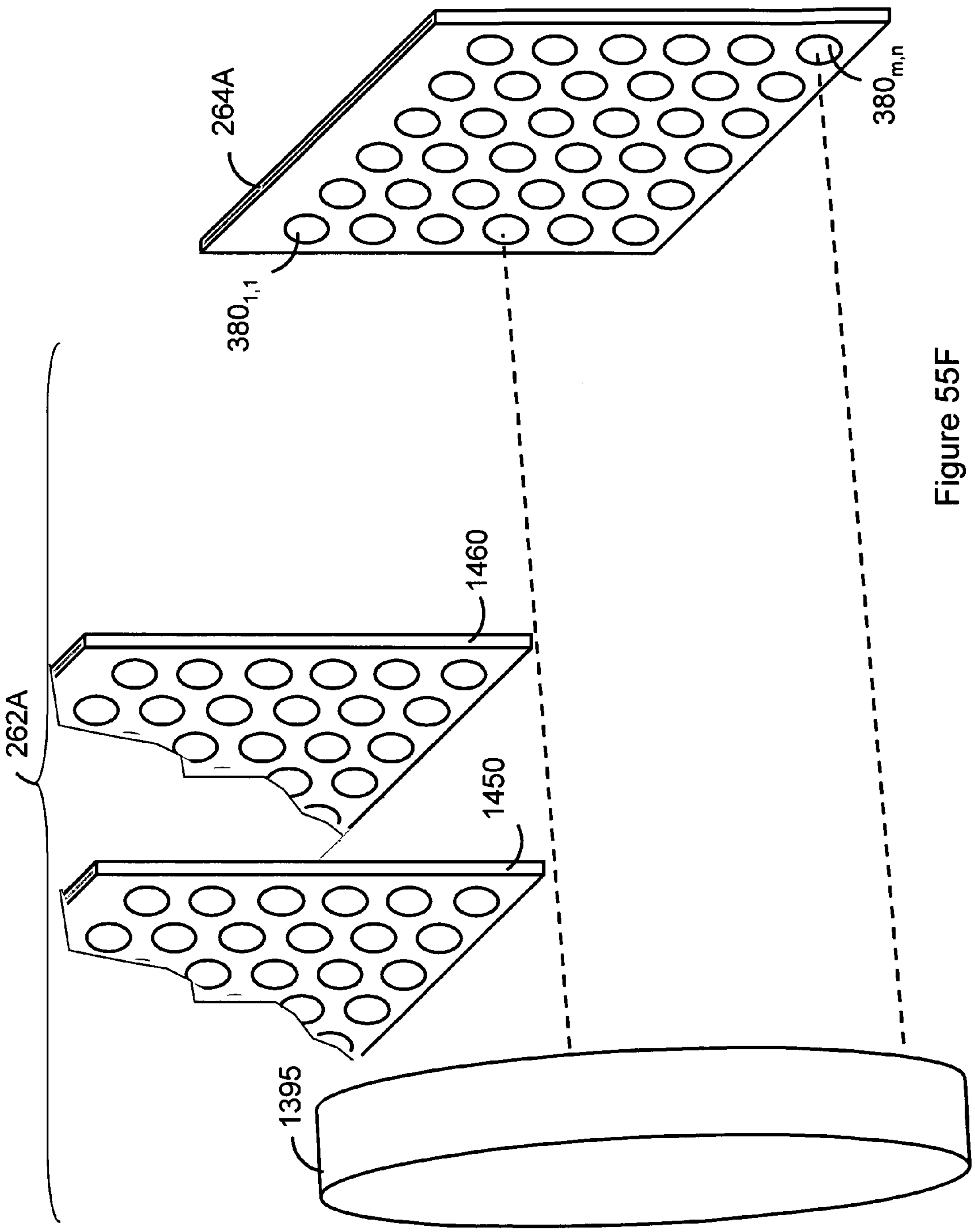
Figure 56:
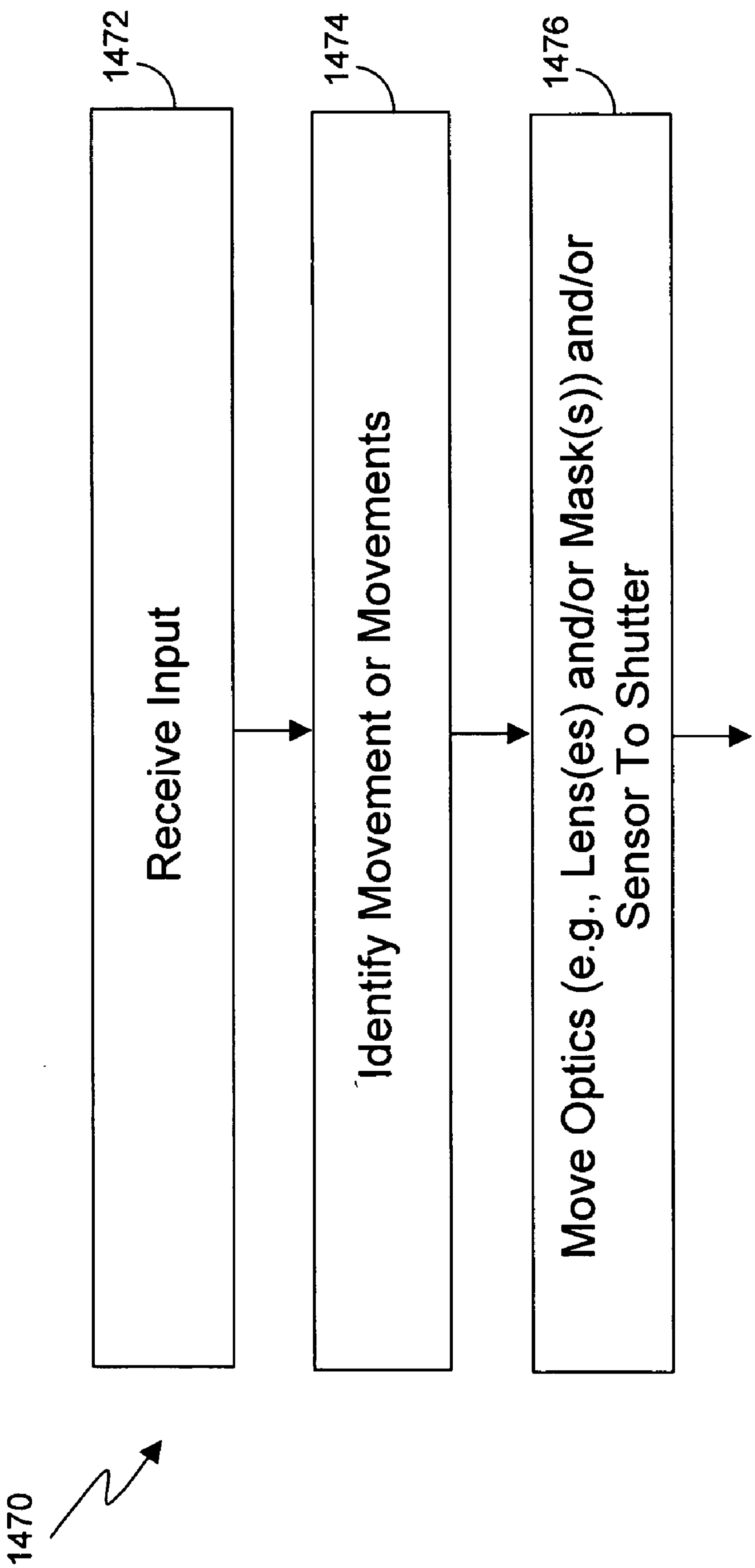
Figure 57A:
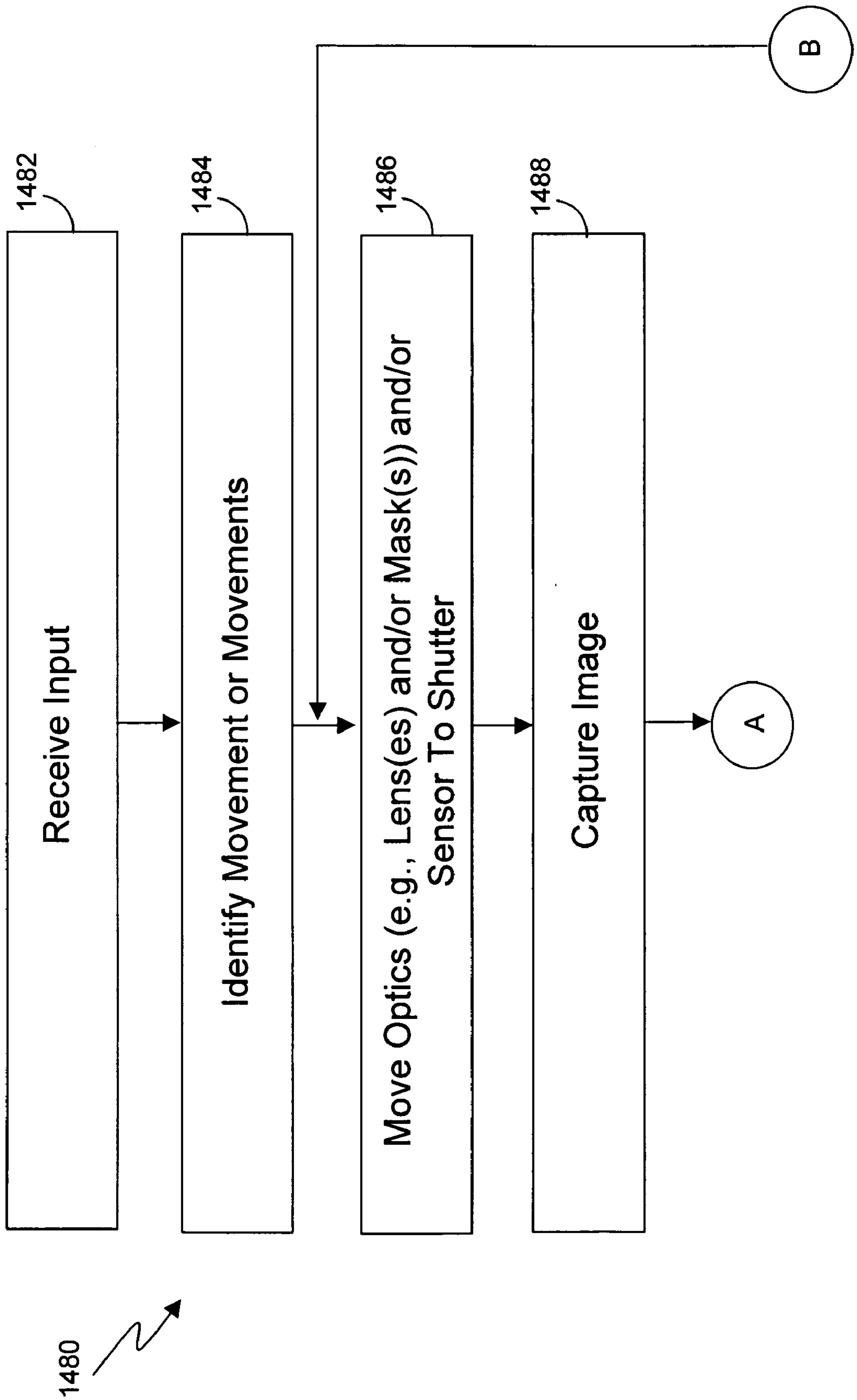
Figure 57B:
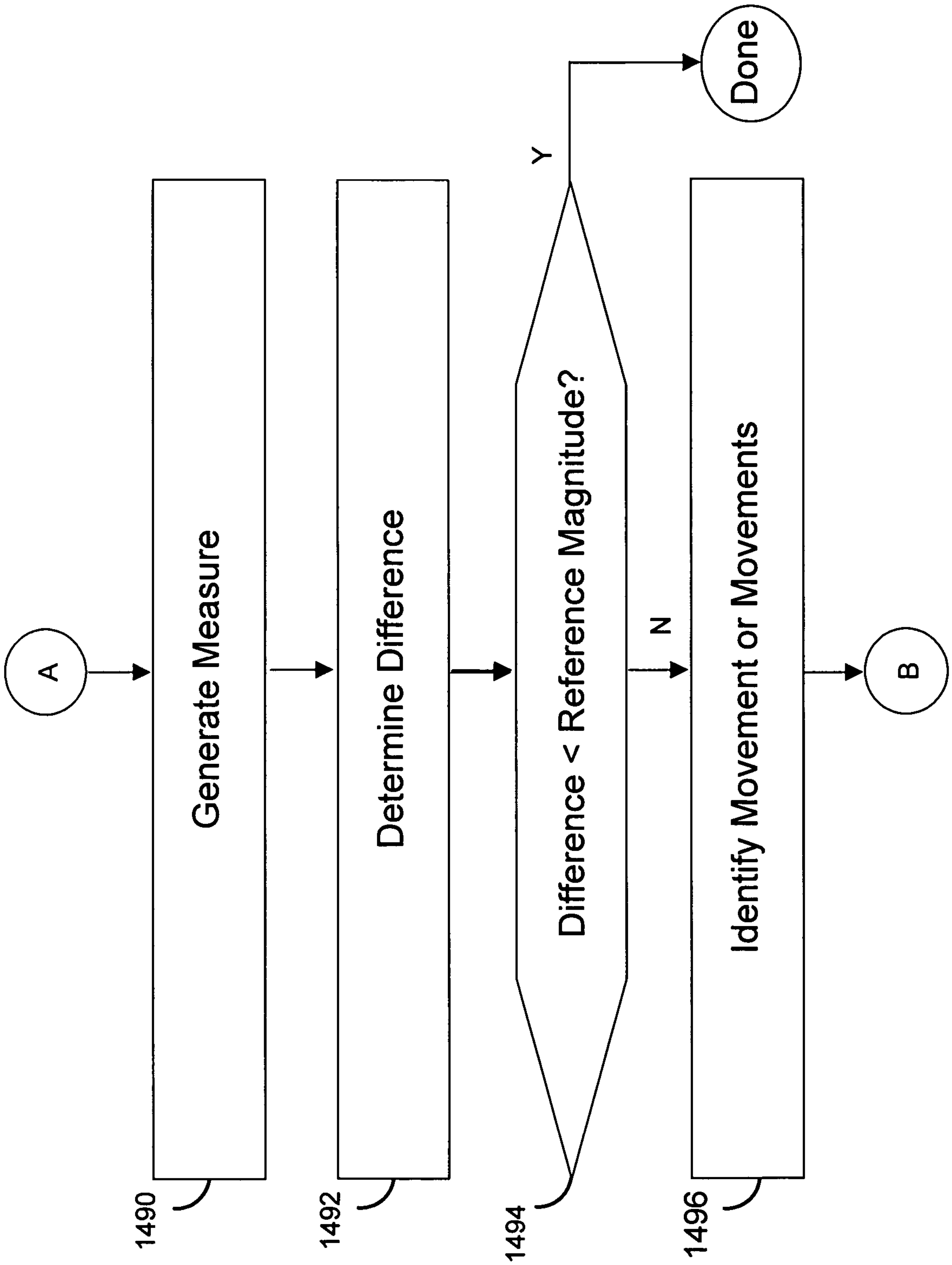

FIGS. 49A-49B are a flowchart of the steps used in providing image stabilization in one embodiment of aspects of the present invention;

FIGS. 50A-50N show examples of misalignment of one or more camera channels in the digital camera apparatus of FIG. 4 and one or more movements that could be used to compensate for such;

FIG. 51A is a flowchart of steps that may be employed in providing alignment, according to one embodiment of the present invention;

FIG. 51B is a flowchart of steps that may be employed in providing alignment; according to another embodiment of the present invention;

FIG. 52A is a flowchart of steps that may be employed in providing alignment, according to another embodiment of the present invention;

FIG. 52B is a flowchart of steps that may be employed in providing alignment, according to another embodiment of the present invention;

FIG. 52C is a flowchart of steps that may be employed in providing alignment; according to one embodiment of the present invention;

FIG. 53A is a schematic perspective view of a portion of a digital camera apparatus that includes an optics portion having a mask in accordance with one embodiment of aspects of the present invention, with the mask, a lens and a sensor portion being shown in a first relative positioning;

FIG. 53B is a schematic perspective view of the portion of the digital camera apparatus of FIG. 53A, with the mask, the lens and the sensor portion being shown in a second relative positioning;

FIG. 53C is a schematic perspective view of the portion of the digital camera apparatus of FIG. 53A, with the mask, the lens and the sensor portion being shown in a third relative positioning;

FIG. 53D is a schematic perspective view of a portion of a digital camera apparatus that includes an optics portion having a mask in accordance with another embodiment of aspects of the present invention, with the mask, a lens and a sensor portion being shown in a first relative positioning;

FIG. 53E is a schematic perspective view of the portion of the digital camera apparatus of FIG. 53D, with the mask, the lens and the sensor portion being shown in a second relative positioning;

FIG. 53F is a schematic perspective view of the portion of the digital camera apparatus of FIG. 53C, with the mask, the lens and the sensor portion being shown in a third relative positioning;

FIG. 53G is a schematic perspective view of a portion of a digital camera apparatus that includes an optics portion having a mask in accordance with another embodiment of aspects of the present invention, with the mask, a lens and a sensor portion being shown in a first relative positioning;

FIG. 53H is a schematic perspective view of the portion of the digital camera apparatus of FIG. 53G, with the mask, the lens and the sensor portion being shown in a second relative positioning;

FIG. 53I is a schematic perspective view of the portion of the digital camera apparatus of FIG. 53G, with the mask, the lens and the sensor portion being shown in a third relative positioning;

FIG. 54 is a flowchart of steps that may be employed in association with one or more masks in providing one or more masking effects, according to one embodiment of the present invention;

FIG. 55A is a schematic perspective view of a portion of a digital camera apparatus that includes an optics portion having a mechanical shutter in accordance with one embodiment of aspects of the present invention, with the mechanical shutter, a lens and a sensor portion being shown in a first relative positioning;

FIG. 55B is a schematic perspective view of the portion of the digital camera apparatus of FIG. 55A, with the mechanical shutter, the lens and the sensor portion being shown in a second relative positioning;

FIG. 55C is a schematic perspective view of the portion of the digital camera apparatus of FIG. 55A, with the mechanical shutter, the lens and the sensor portion being shown in a third relative positioning;

FIG. 55D is a schematic perspective view of a portion of a digital camera apparatus that includes an optics portion having a mechanical shutter in accordance with another embodiment of aspects of the present invention, with the mechanical shutter, a lens and a sensor portion being shown in a first relative positioning;

FIG. 55E is a schematic perspective view of the portion of the digital camera apparatus of FIG. 55D, with the mechanical shutter, the lens and the sensor portion being shown in a second relative positioning;

FIG. 55F is a schematic perspective view of the portion of the digital camera apparatus of FIG. 55D, with the mechanical shutter, the lens and the sensor portion being shown in a third relative positioning;

FIG. 56 is a flowchart of steps that may be employed in association with a mechanical shutter, according to one embodiment of the present invention;

FIGS. 57A-57B are a flowchart of steps that may be employed in association with a mechanical shutter, according to another embodiment of the present invention.

Figure 58A:
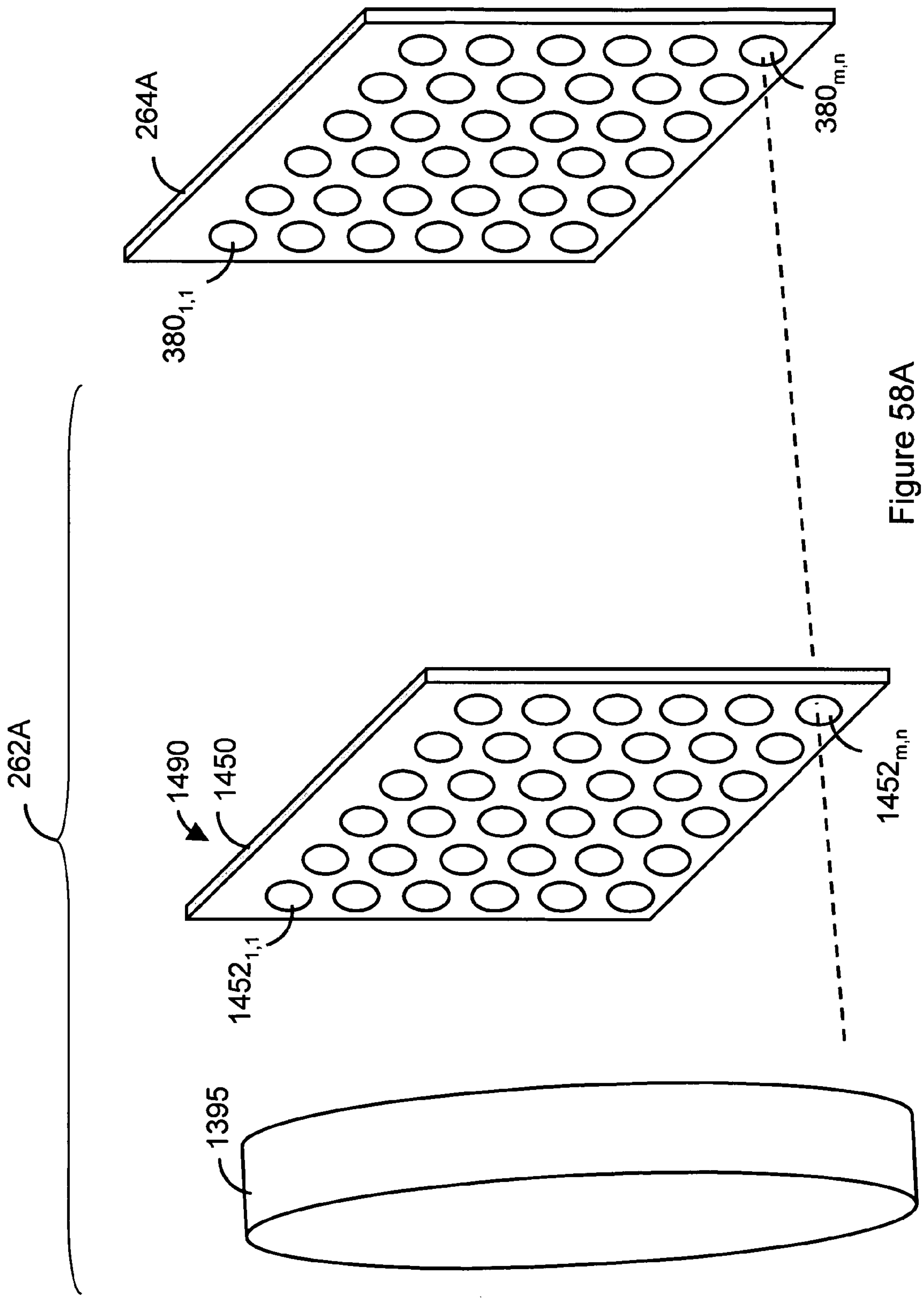
Figure 58B:
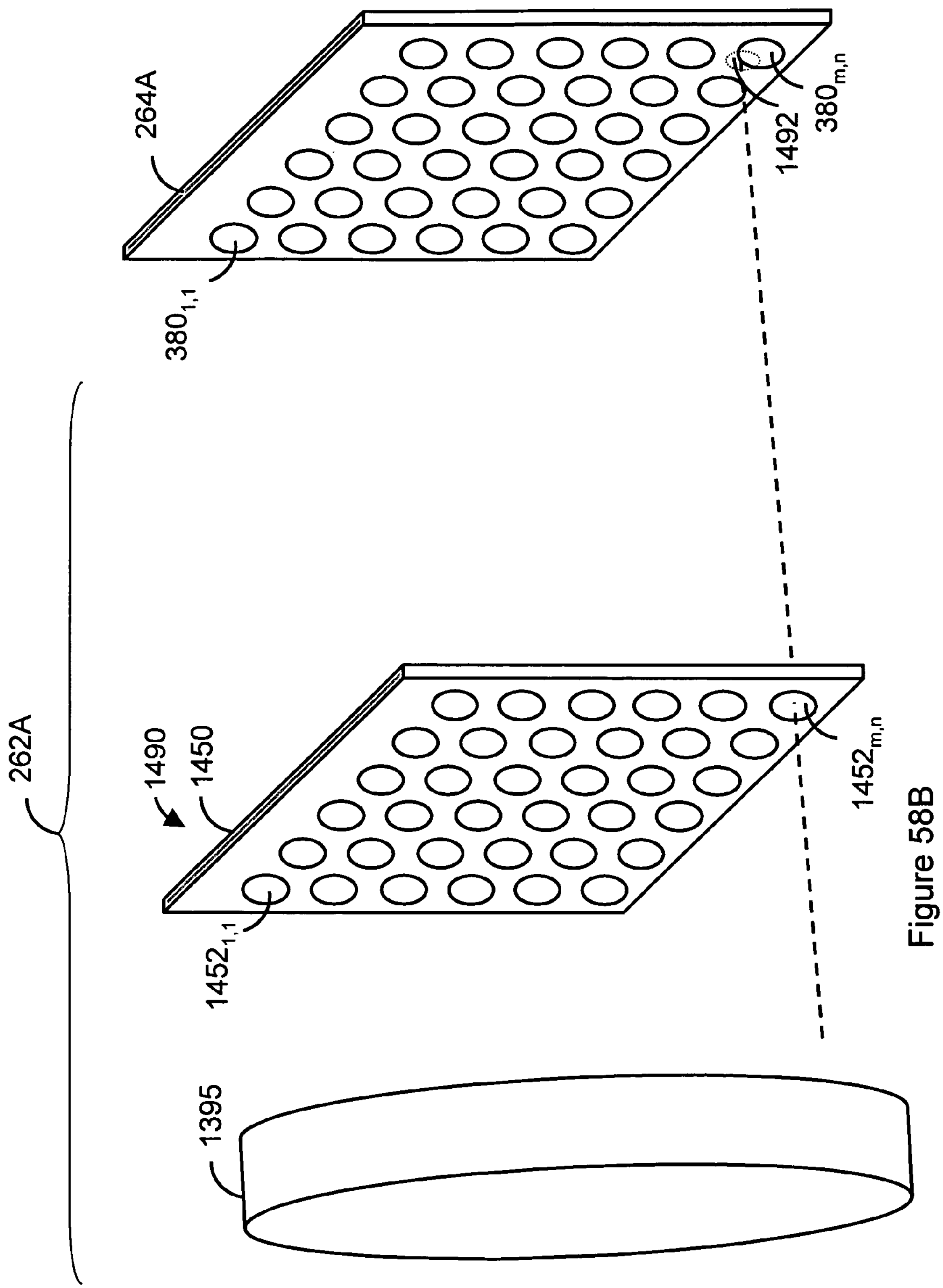
Figure 58C:
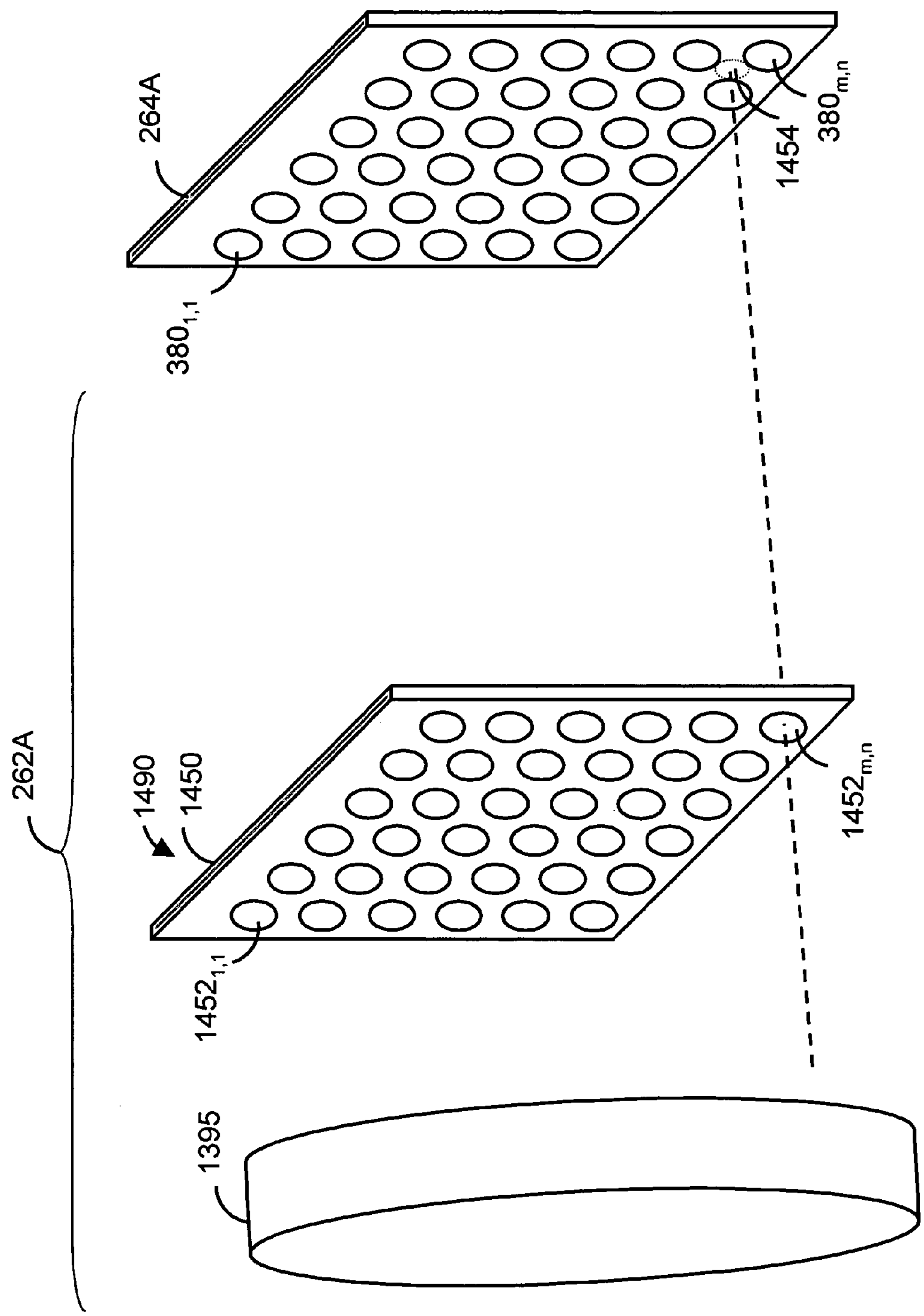
Figure 58D:
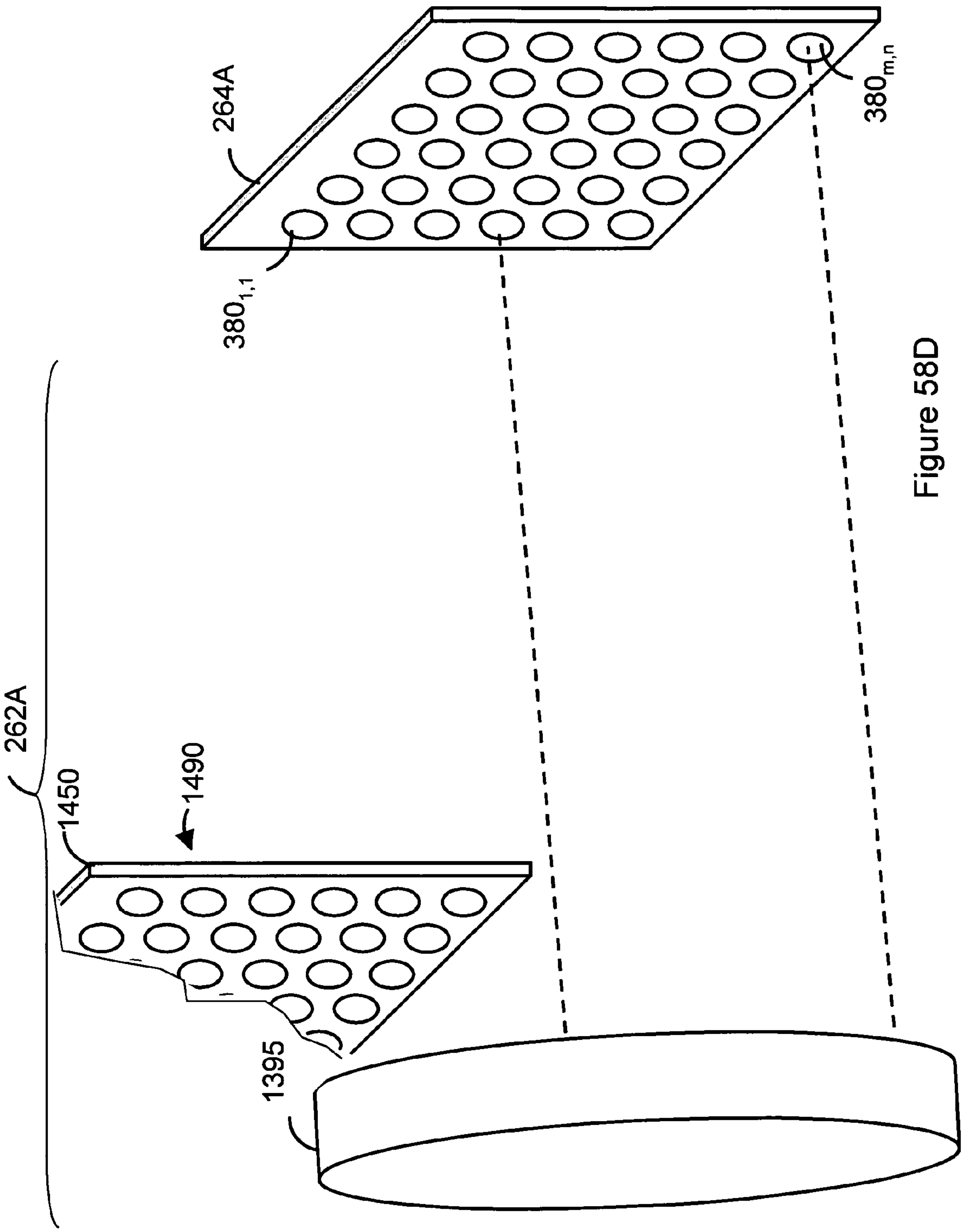
Figure 58E:
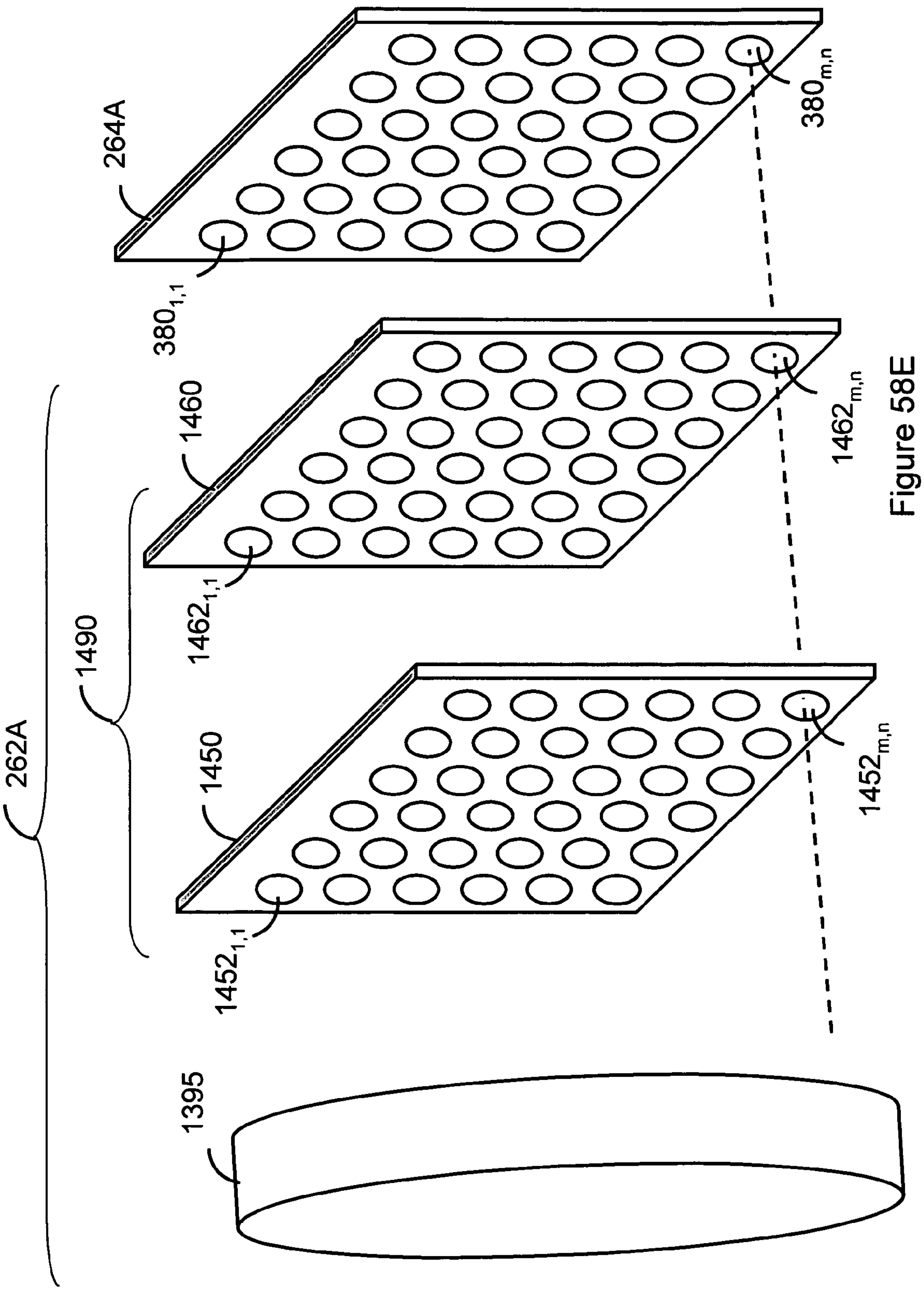
Figure 58F:
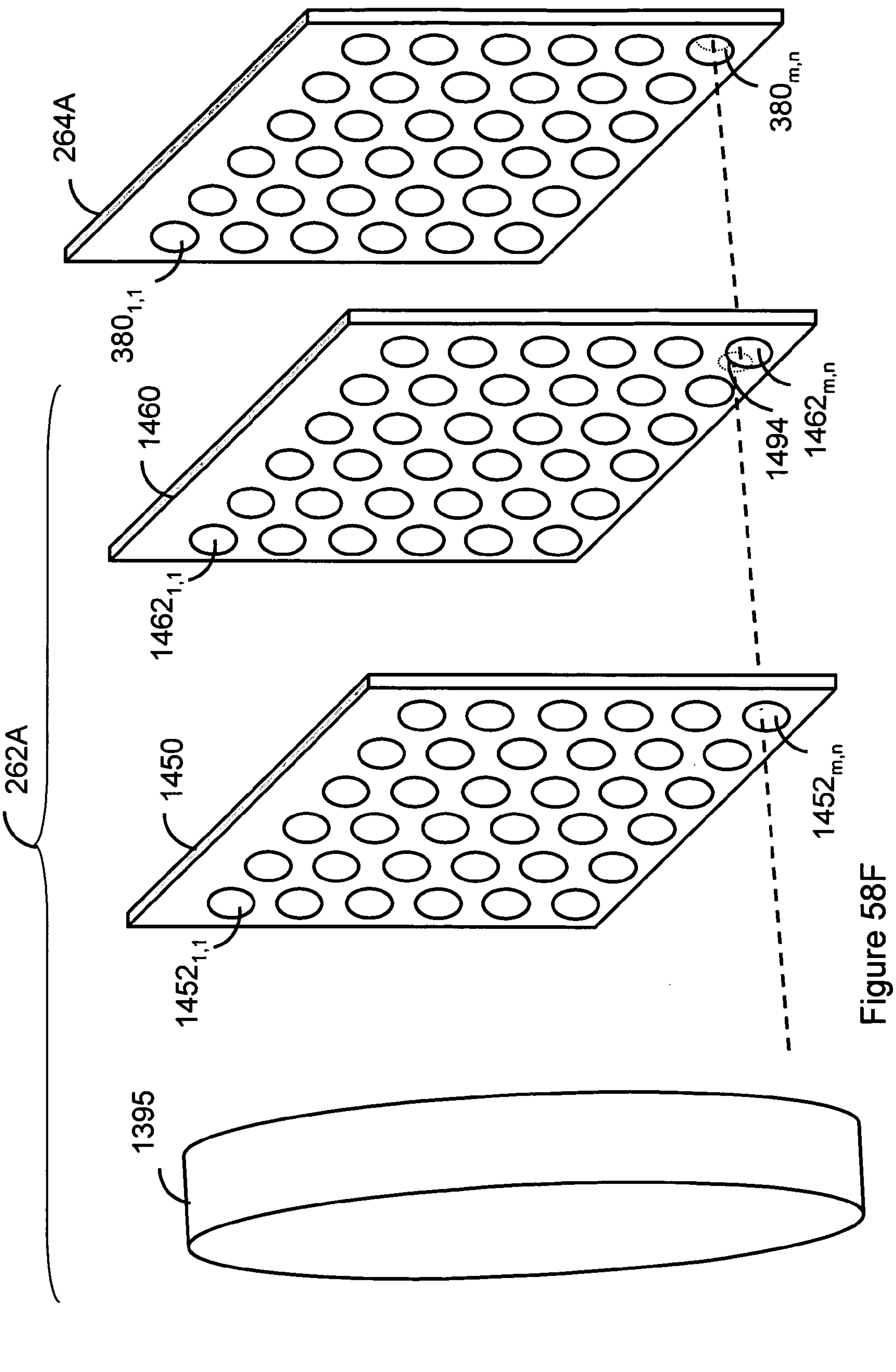
Figure 58G:
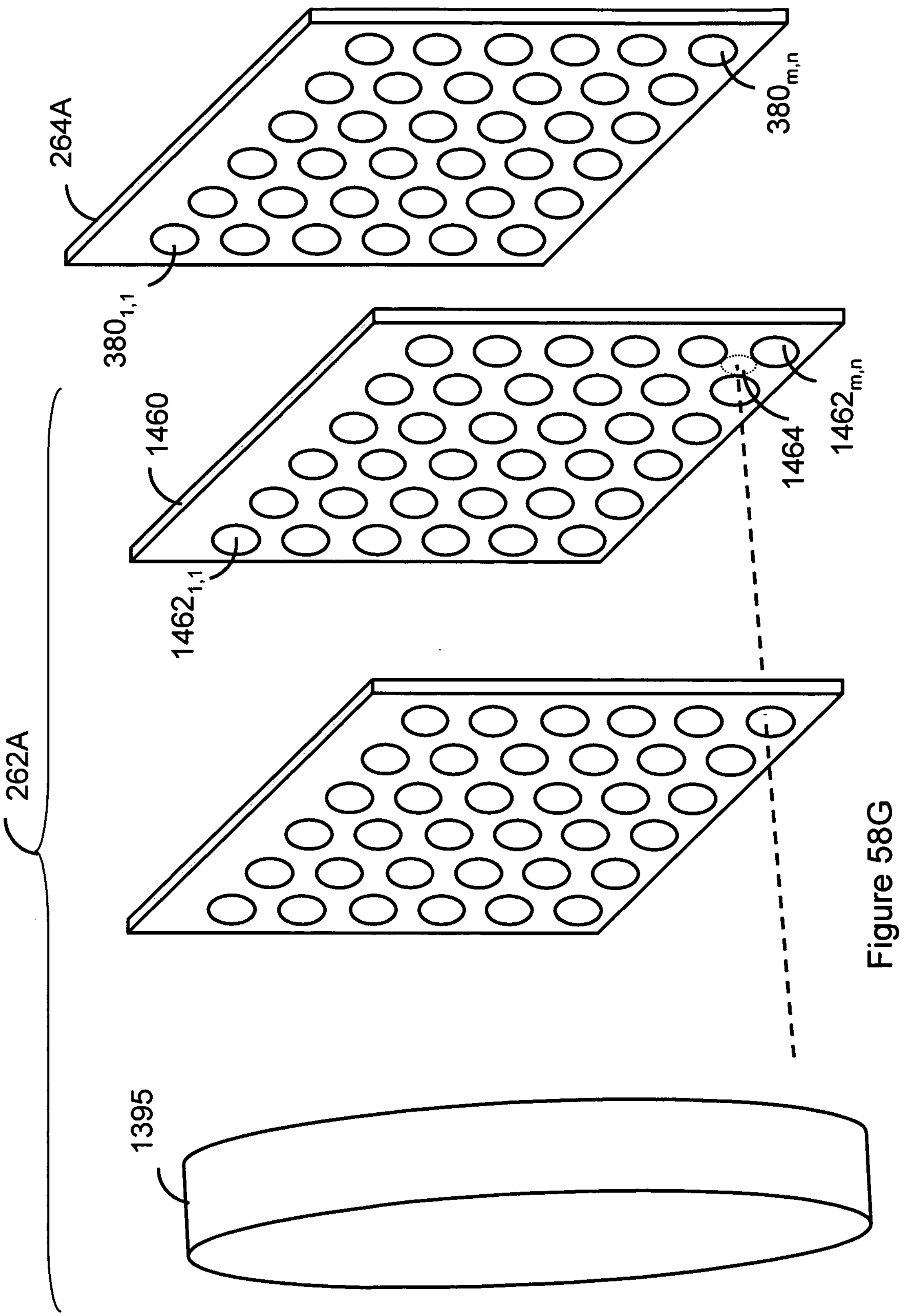
Figure 58H:
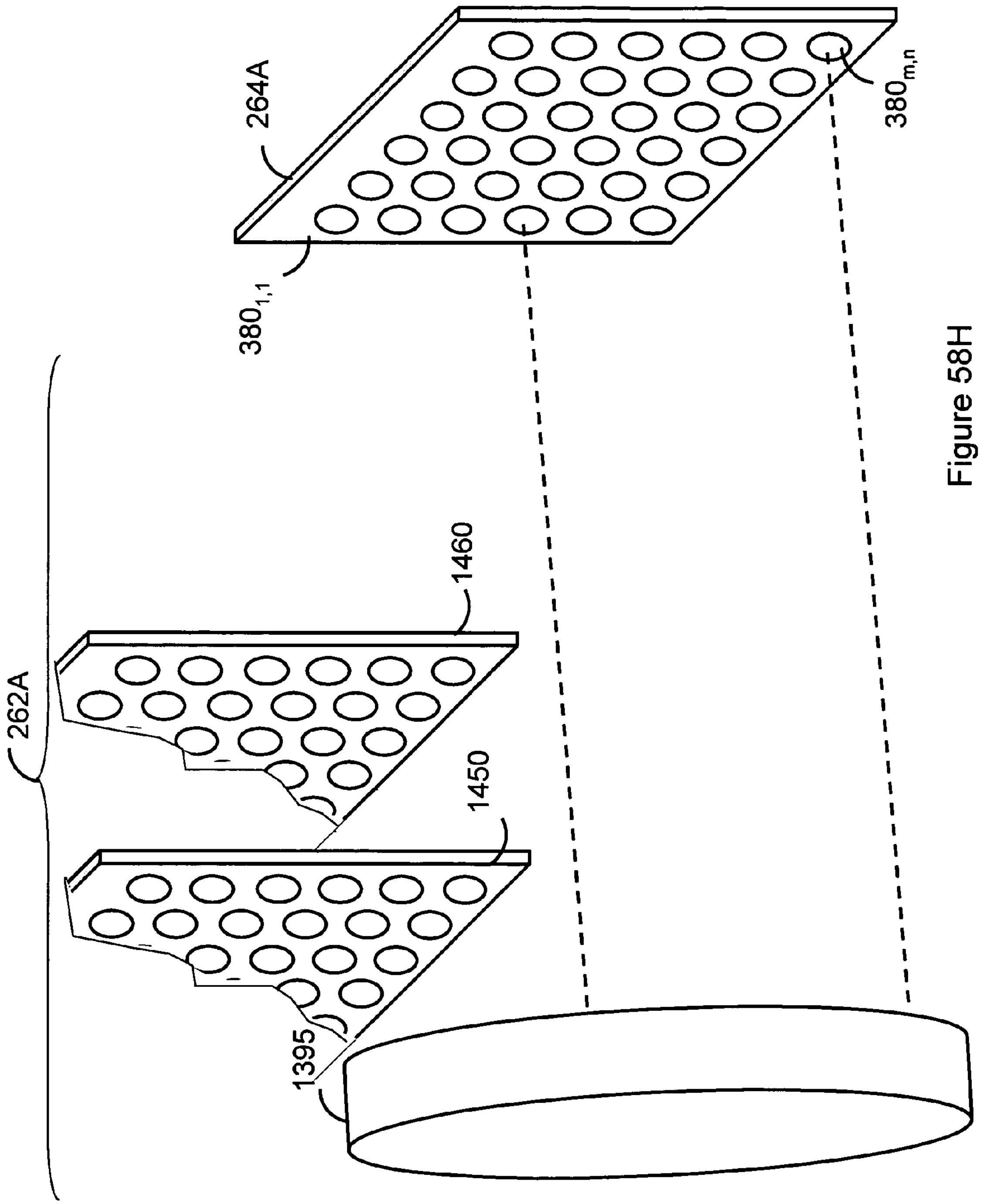
Figure 59:
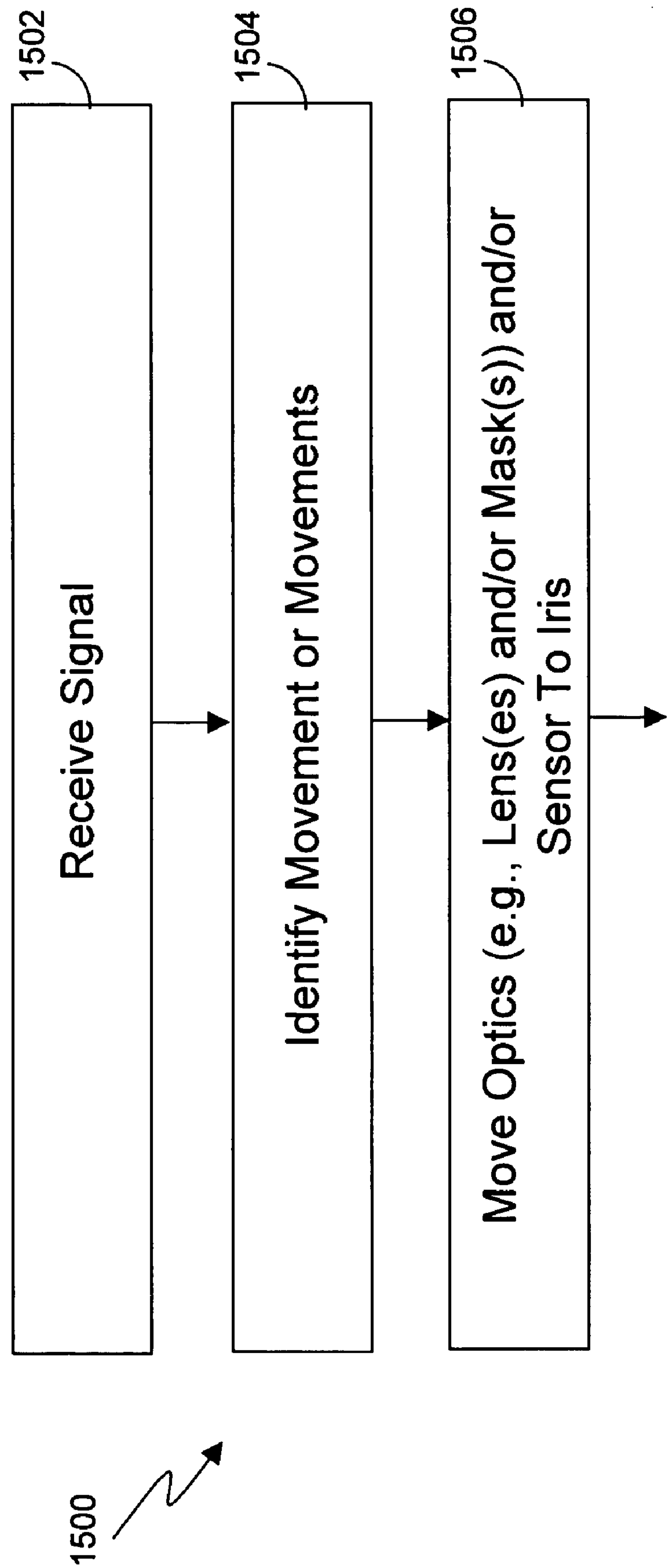

FIG. 58A is a schematic perspective view of a portion of a digital camera apparatus that includes an optics portion having a mechanical iris in accordance with one embodiment of aspects of the present invention, with the mechanical iris, a lens and a sensor portion being shown in a first relative positioning;

FIG. 58B is a schematic perspective view of the portion of the digital camera apparatus of FIG. 58A, with the mechanical iris, the lens and the sensor portion being shown in a second relative positioning;

FIG. 58C is a schematic perspective view of the portion of the digital camera apparatus of FIG. 58A, with the mechanical iris, the lens and the sensor portion being shown in a third relative positioning;

FIG. 58D is a schematic perspective view of the portion of the digital camera apparatus of FIG. 58A, with the mechanical iris, the lens and the sensor portion being shown in a fourth relative positioning;

FIG. 58E is a schematic perspective view of a portion of a digital camera apparatus that includes an optics portion having a mechanical iris in accordance with another embodiment of aspects of the present invention, with the mechanical iris, a lens and a sensor portion being shown in a first relative positioning;

FIG. 58F is a schematic perspective view of the portion of the digital camera apparatus of FIG. 58E, with the mechanical iris, the lens and the sensor portion being shown in a second relative positioning;

FIG. 58G is a schematic perspective view of the portion of the digital camera apparatus of FIG. 58E, with the mechanical iris, the lens and the sensor portion being shown in a third relative positioning;

FIG. 58H is a schematic perspective view of the portion of the digital camera apparatus of FIG. 58E, with the mechanical iris, the lens and the sensor portion being shown in a fourth relative positioning;

FIG. 59 is a flowchart of steps that may be employed in association with a mechanical iris, according to one embodiment of the present invention.

Figure 60A:
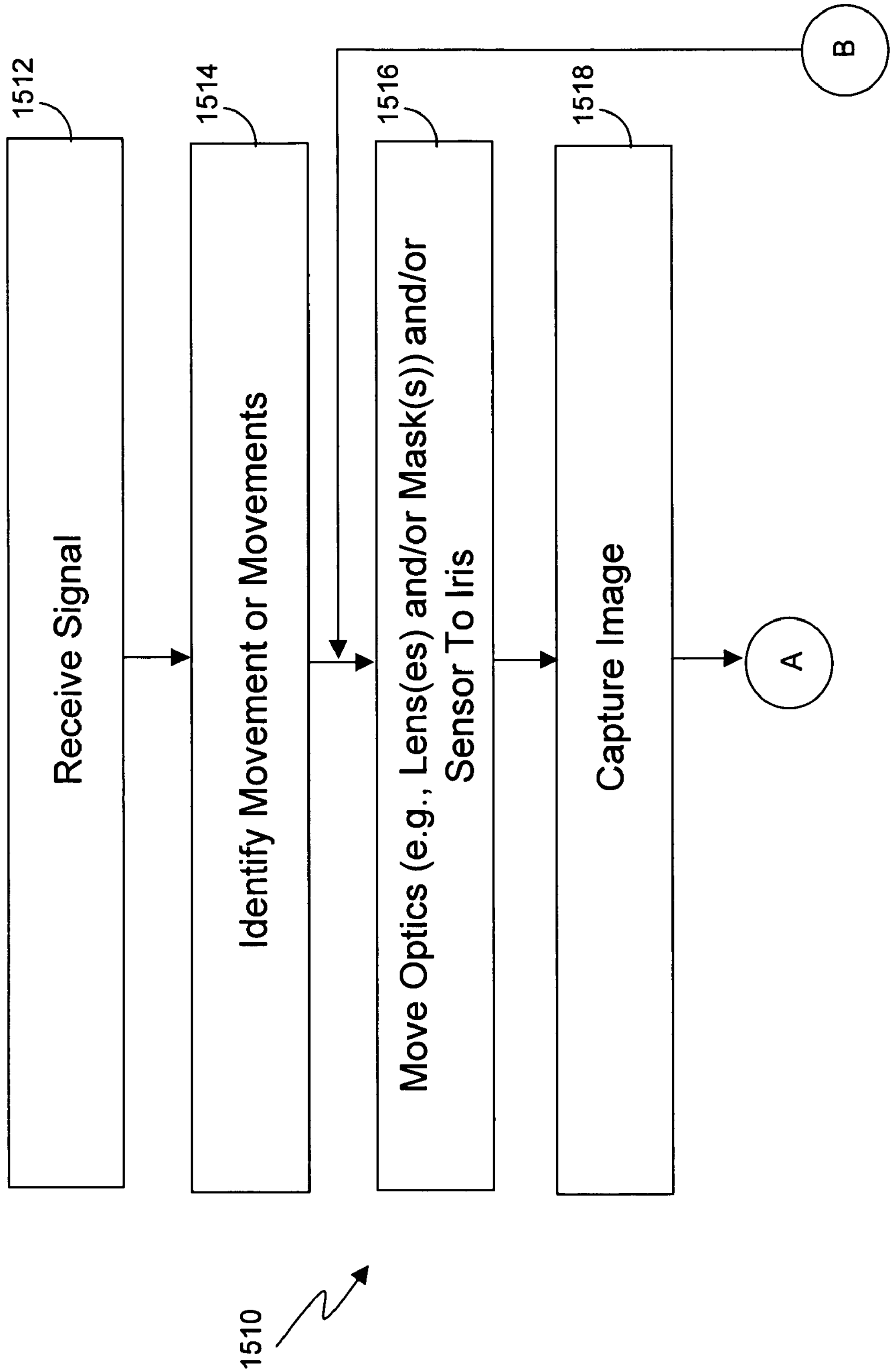
Figure 60B:
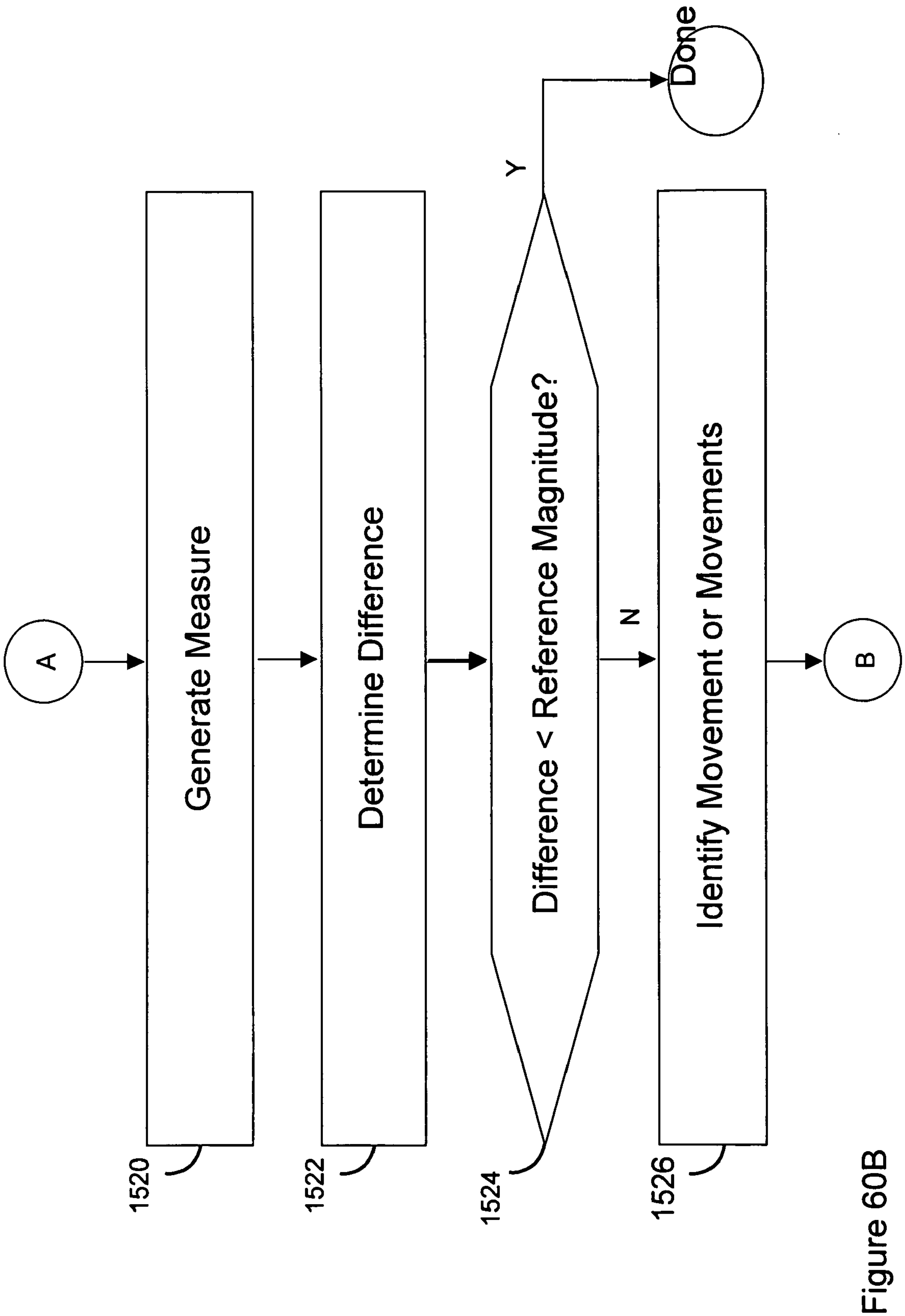

FIGS. 60A-60B are a flowchart of steps that may be employed in association with a mechanical iris, according to another embodiment of the present invention.

Figure 61B:
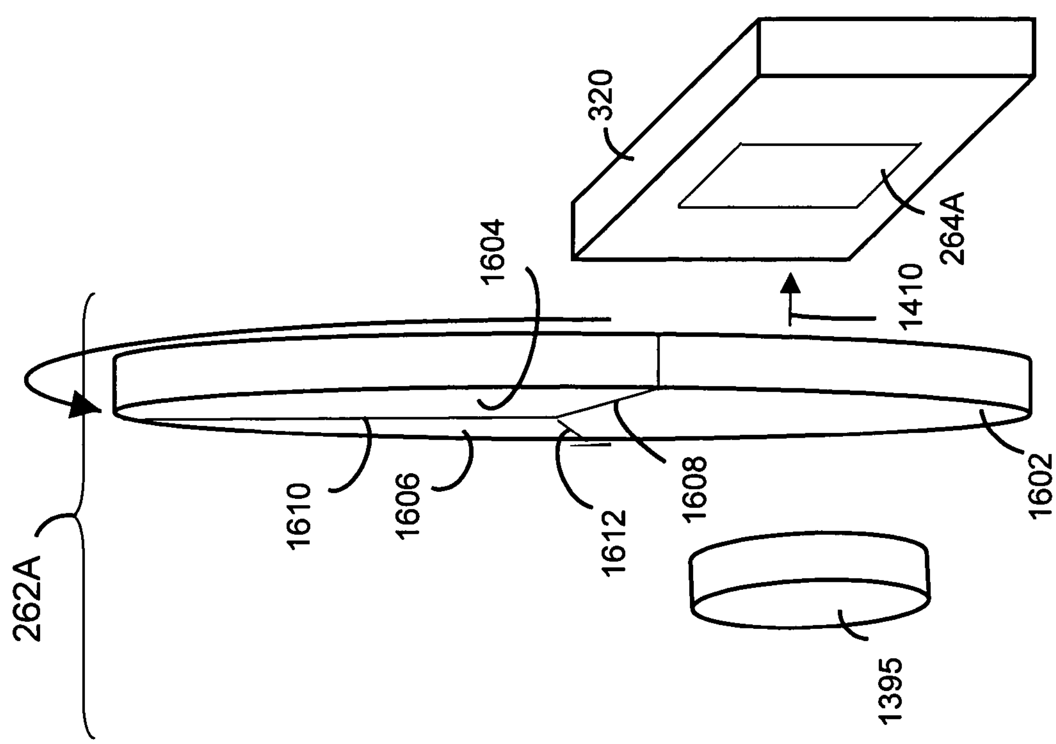
Figure 61A:
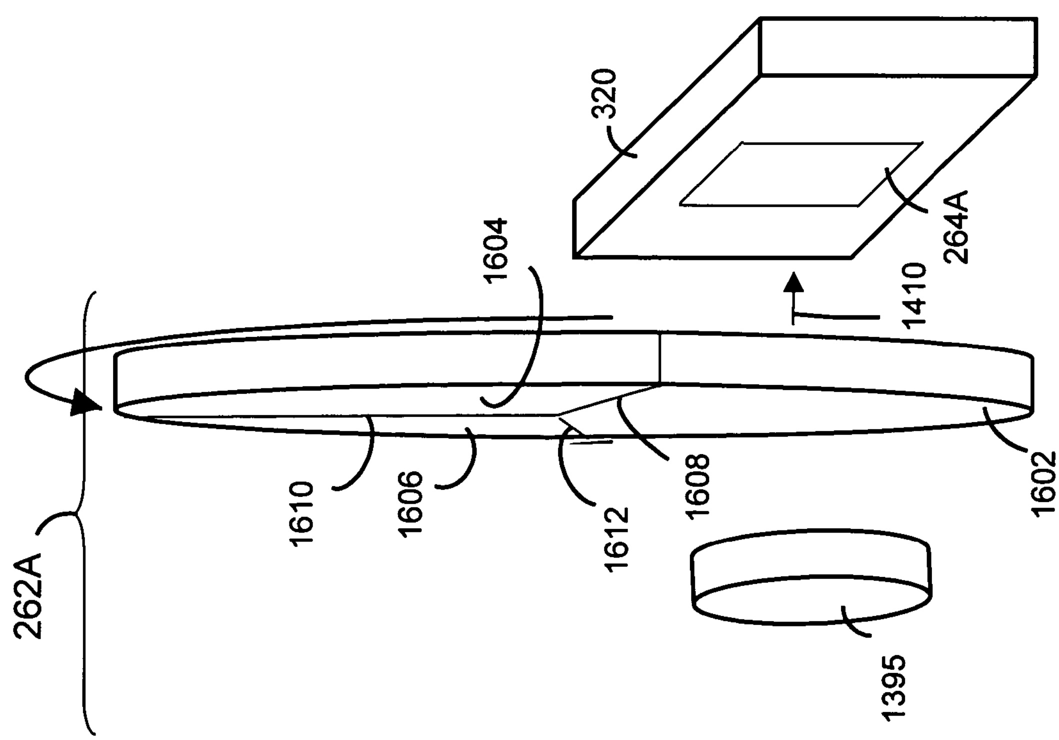
Figure 61C:
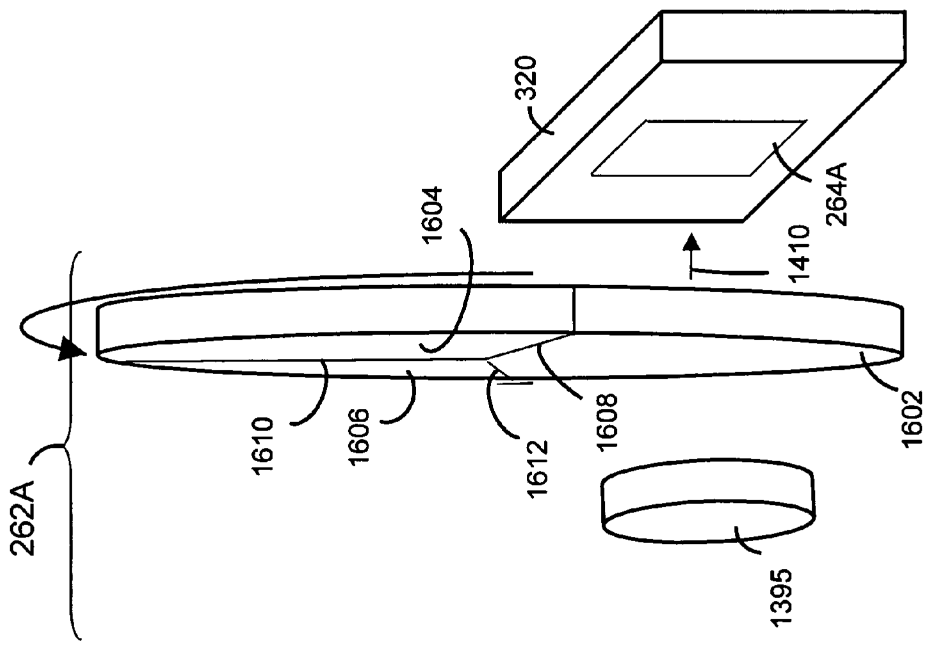
Figure 62A:
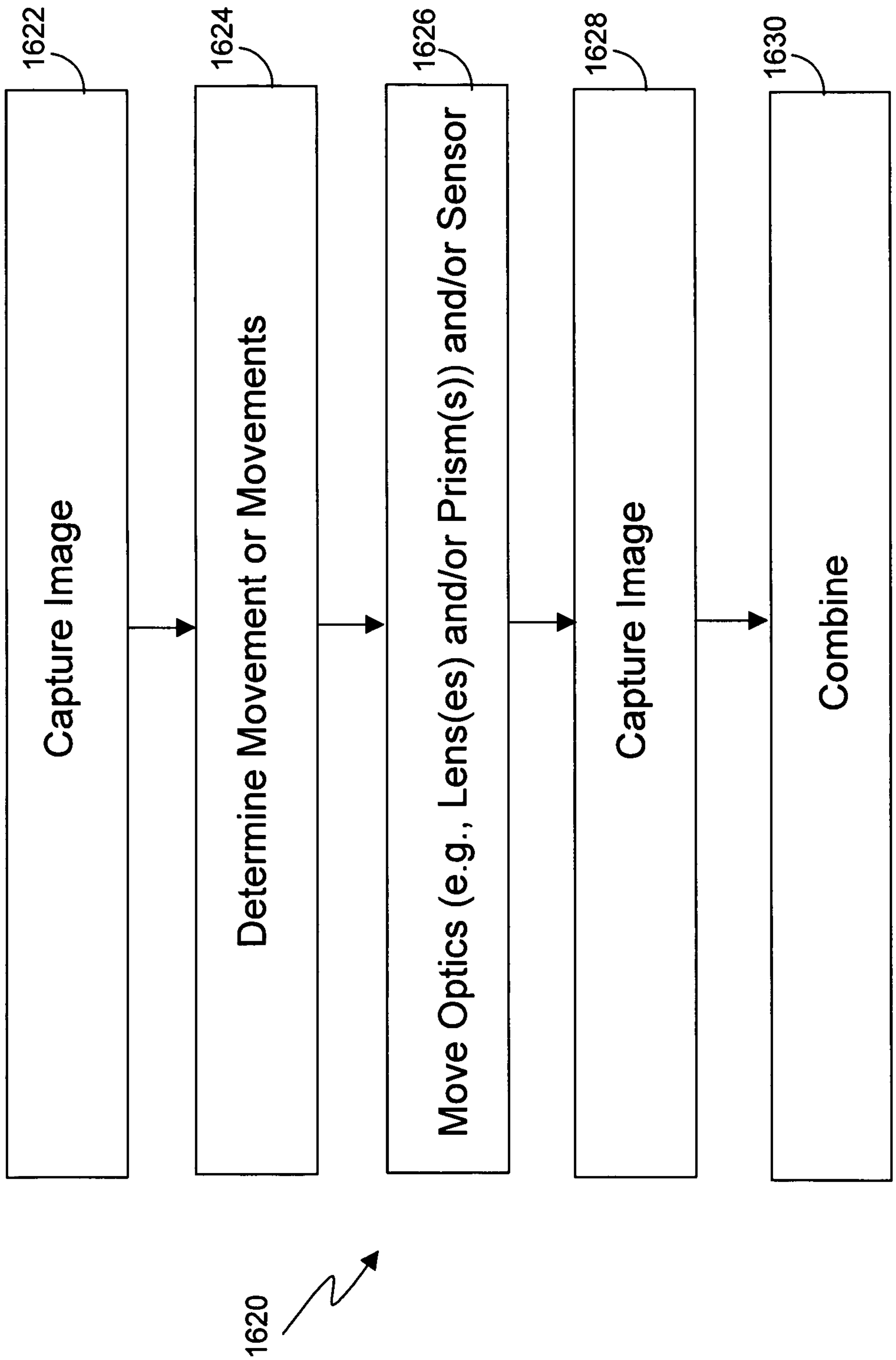
Figure 62B:
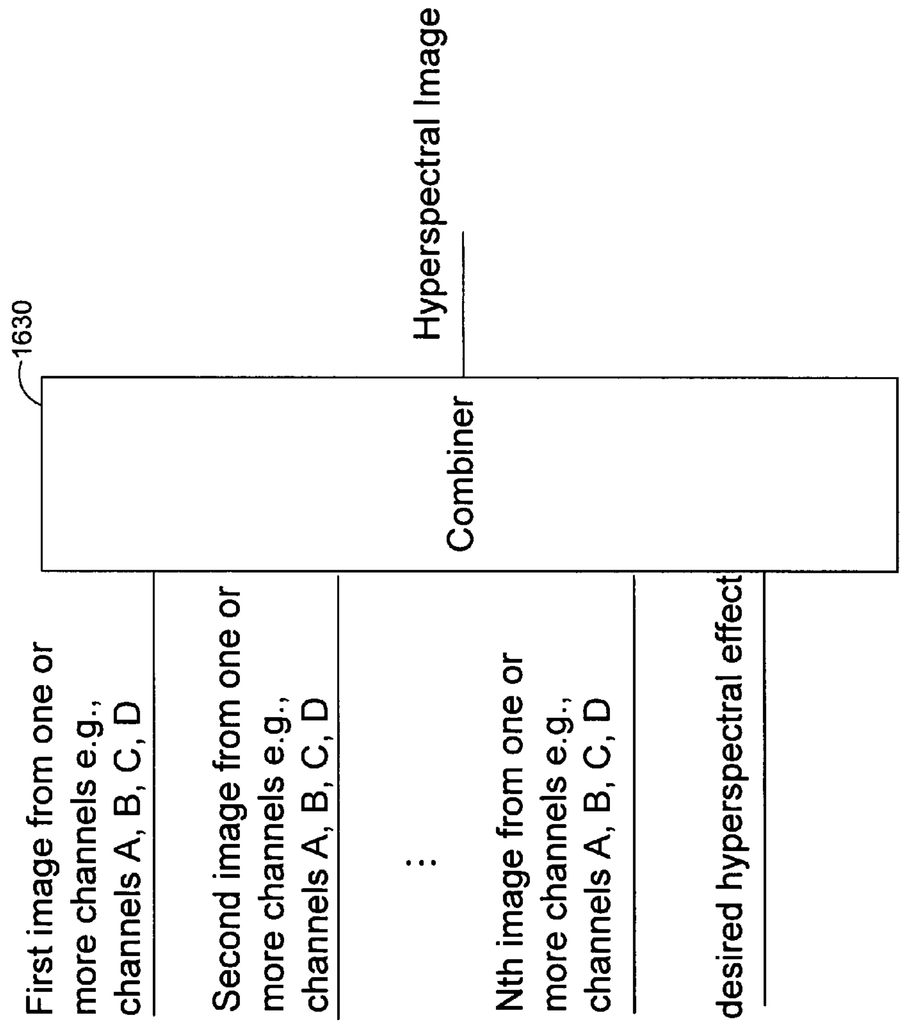
Figure 63:
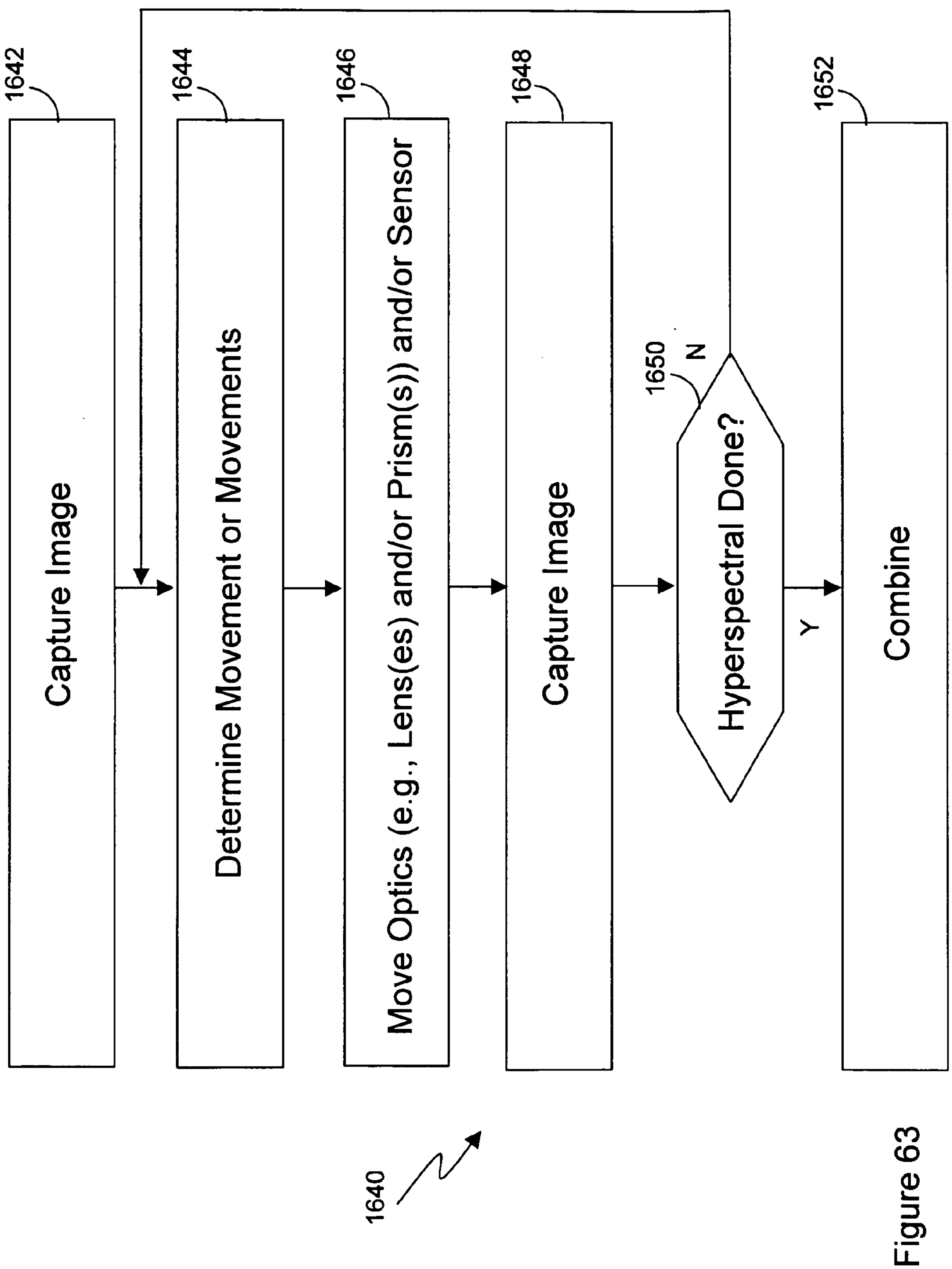
Figure 65B:
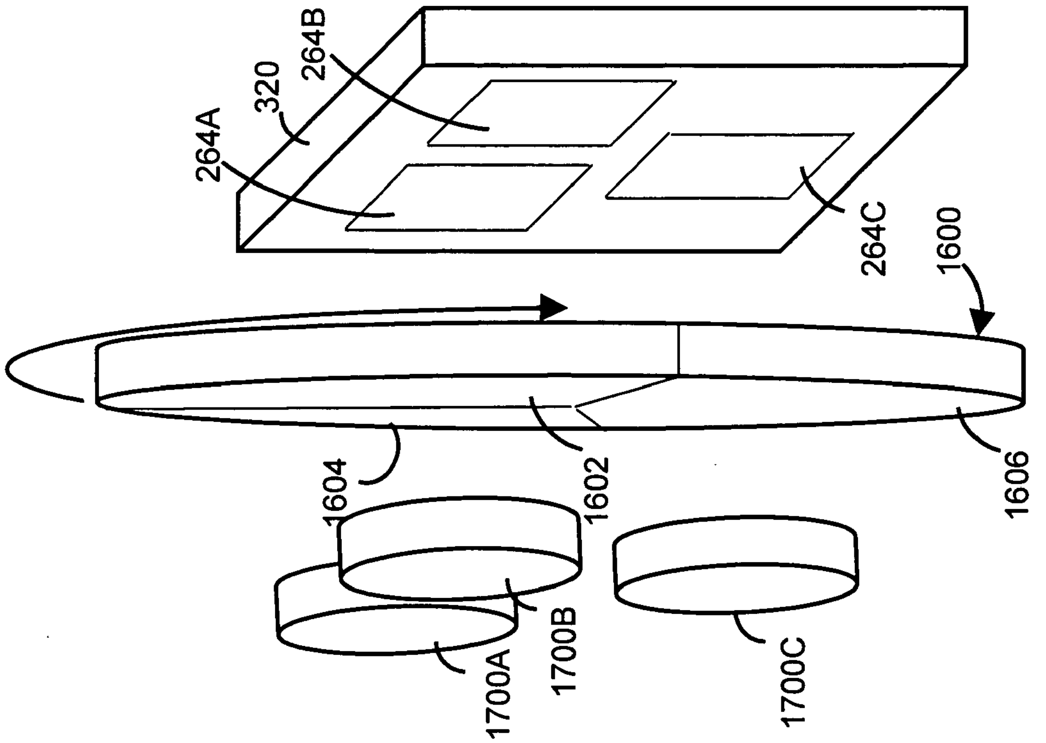
Figure 65A:
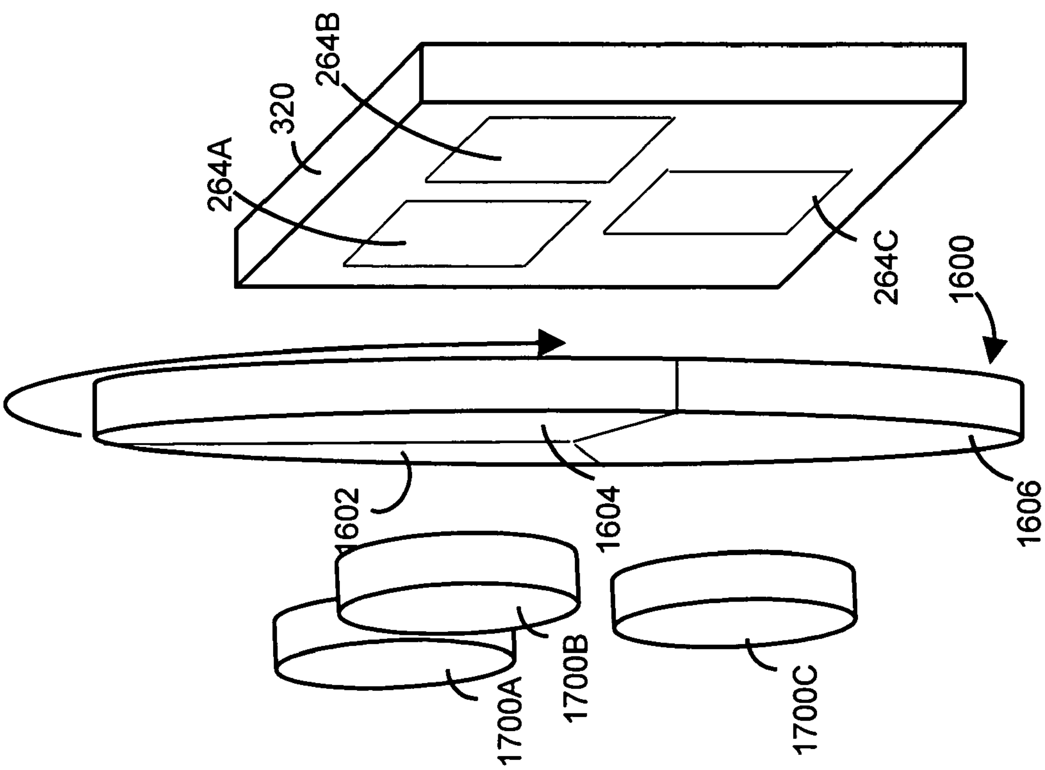
Figure 65D:
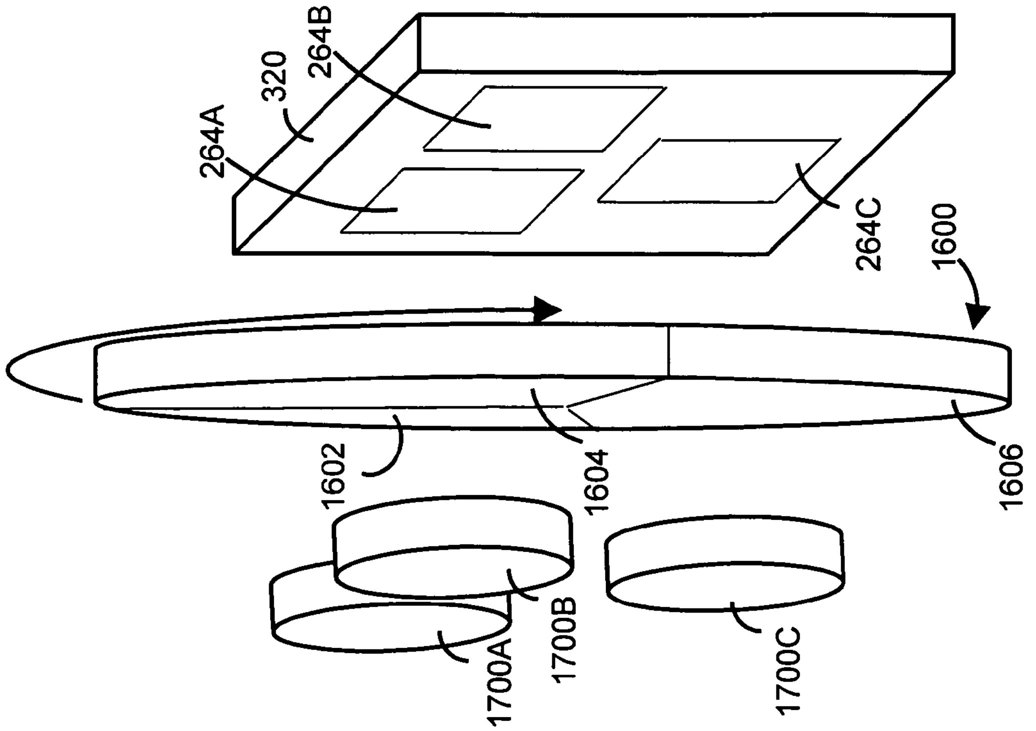
Figure 65C:
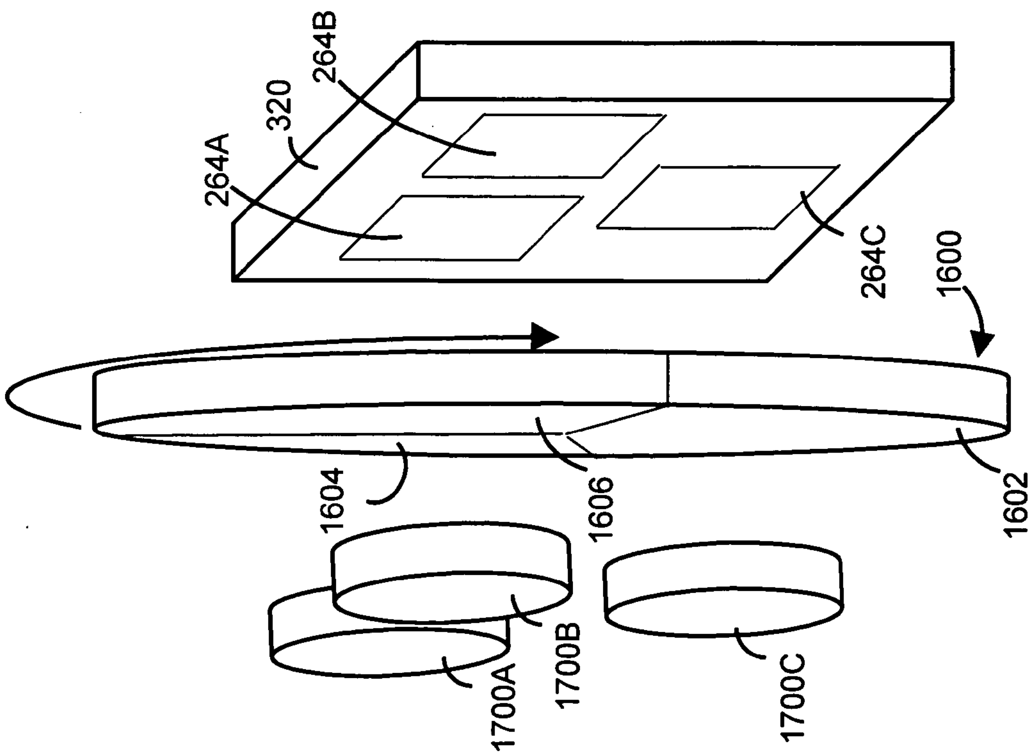
Figure 66B:
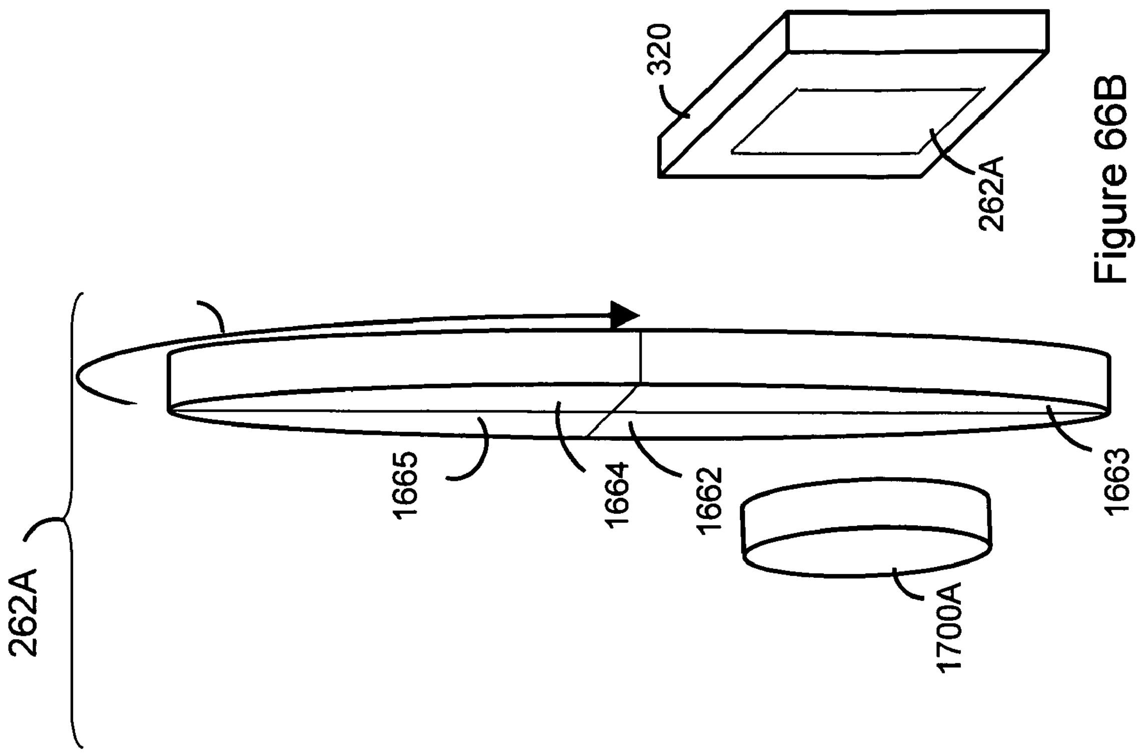
Figure 66A:
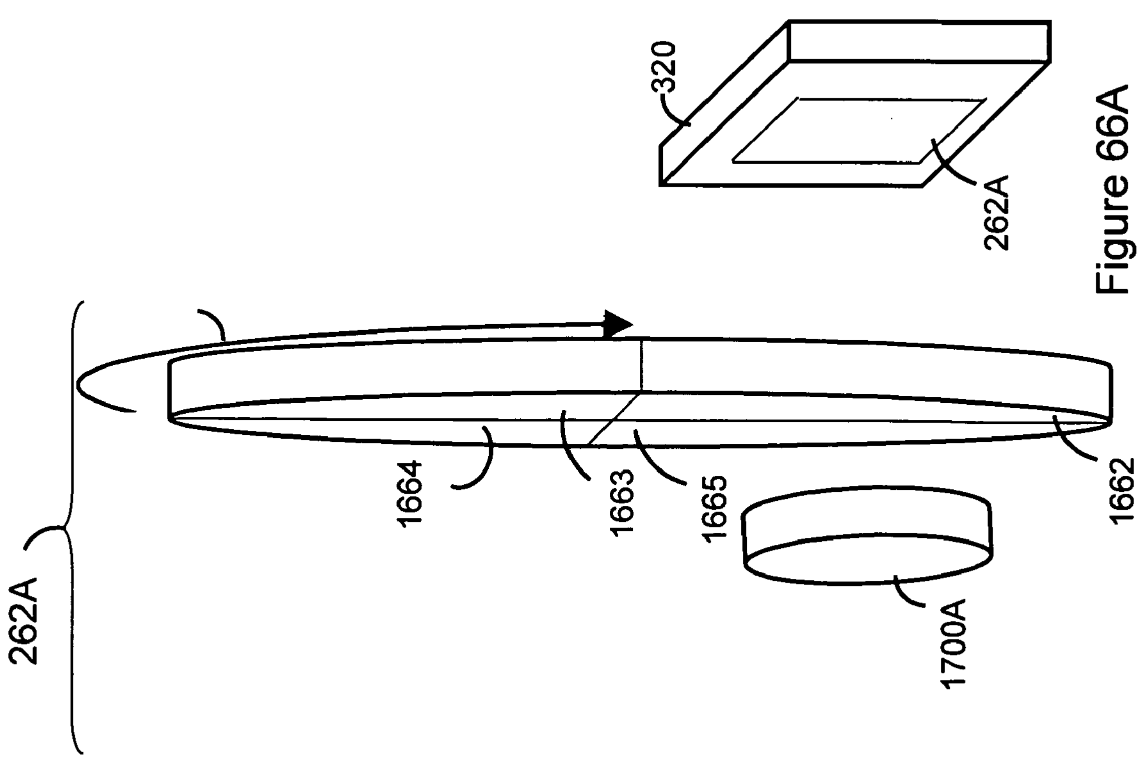
Figure 66D:
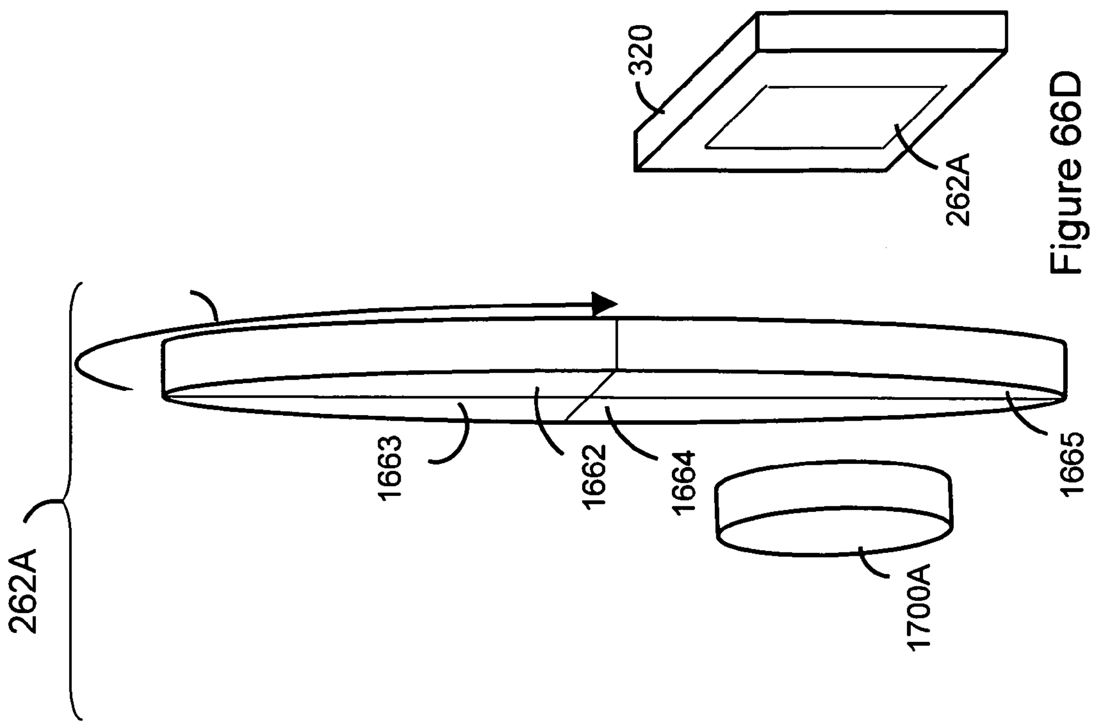
Figure 66C:
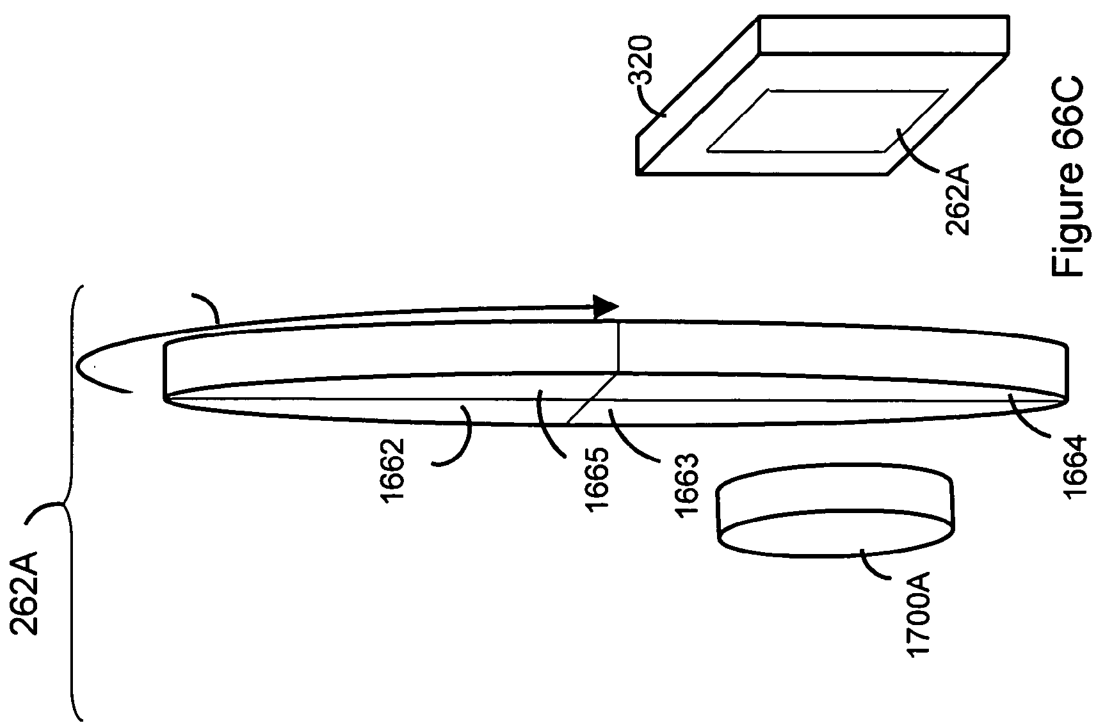
Figure 66F:
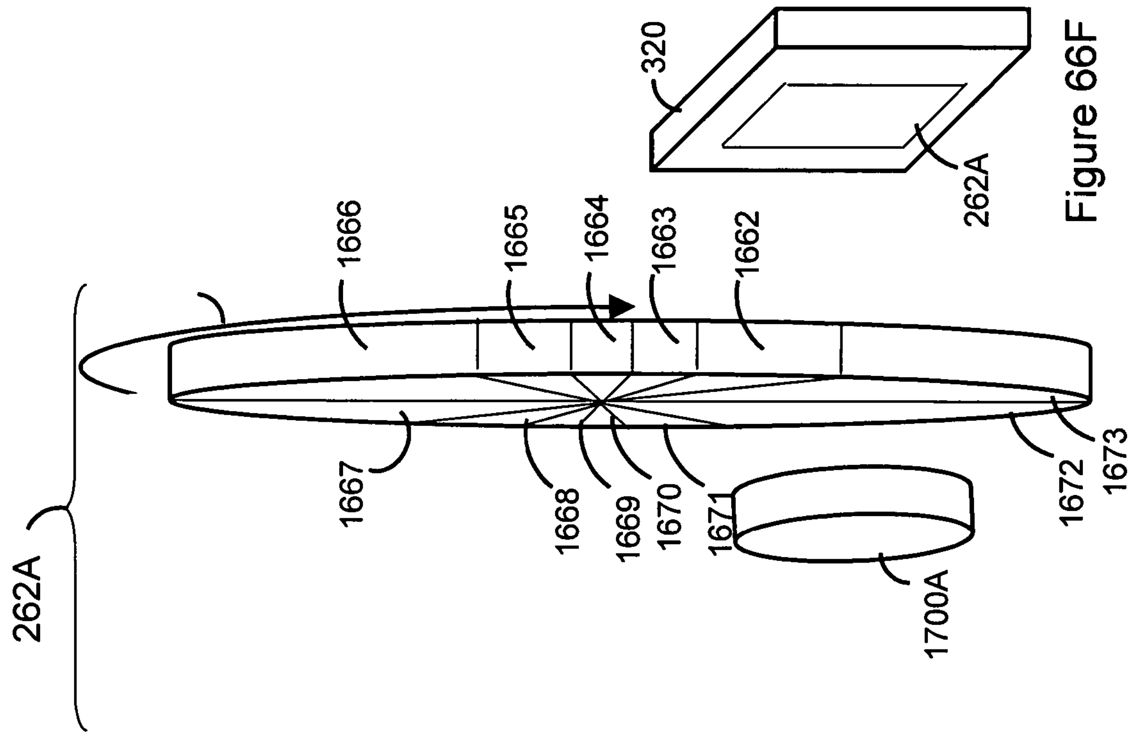
Figure 66E:
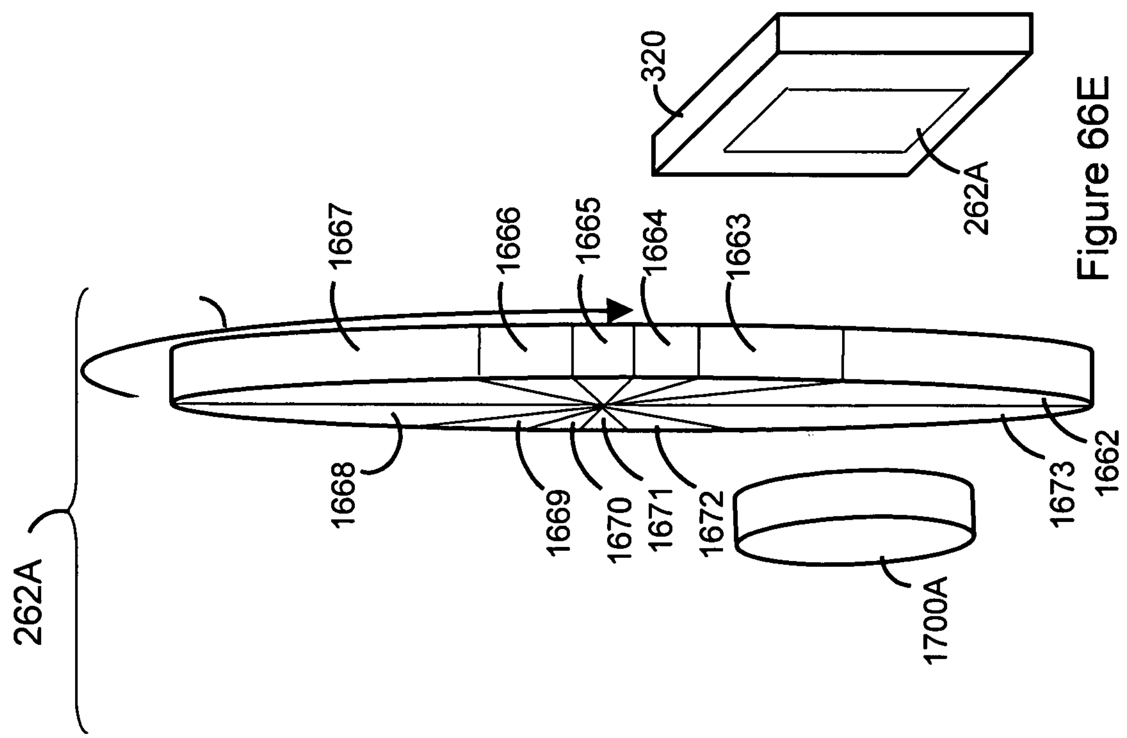
Figure 67B:
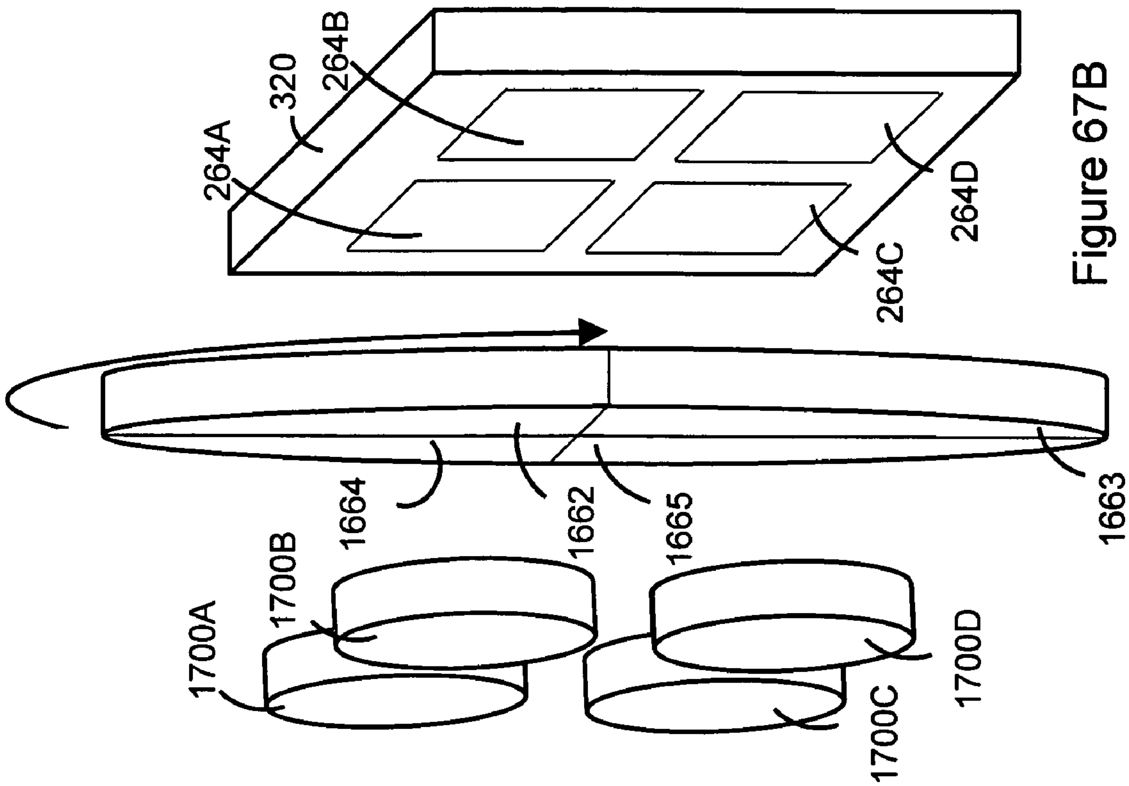
Figure 67A:
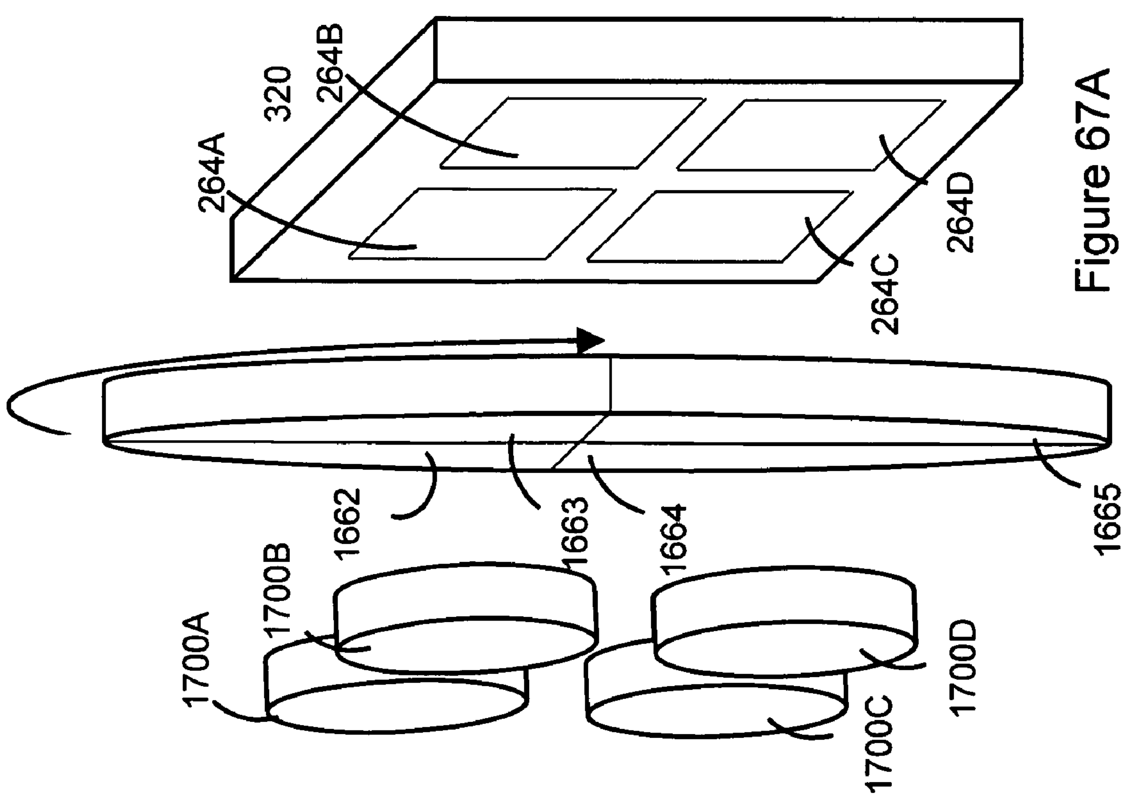
Figure 67D:
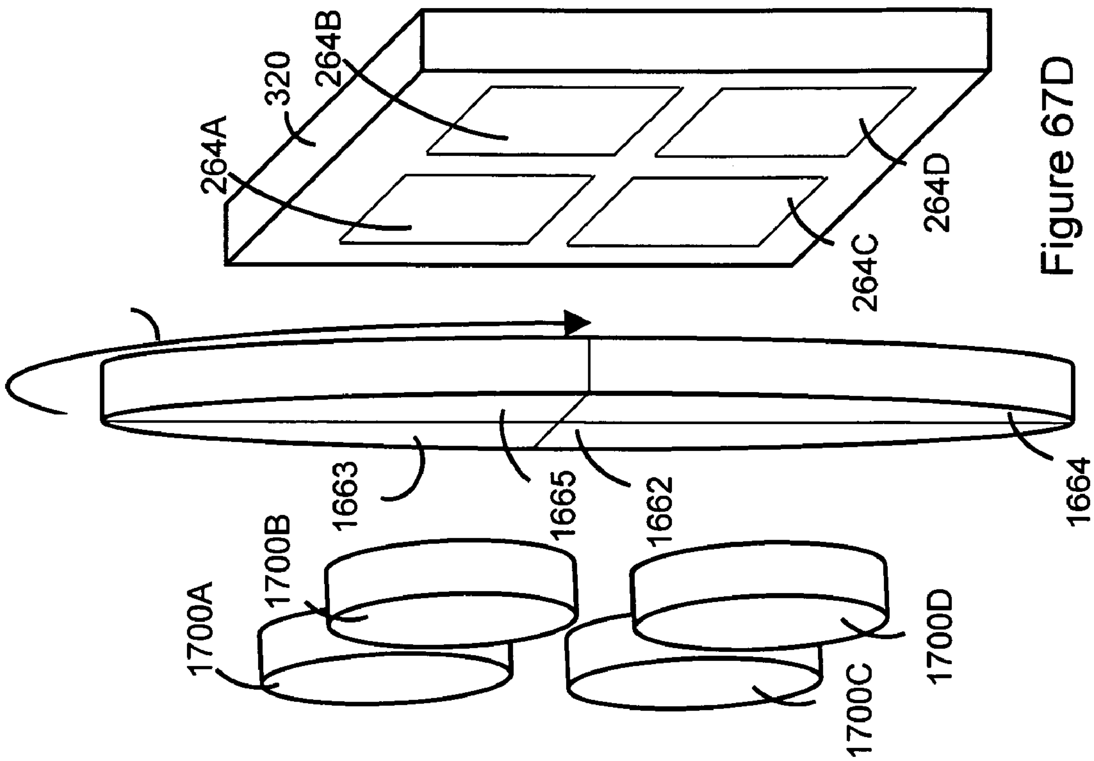
Figure 67C:
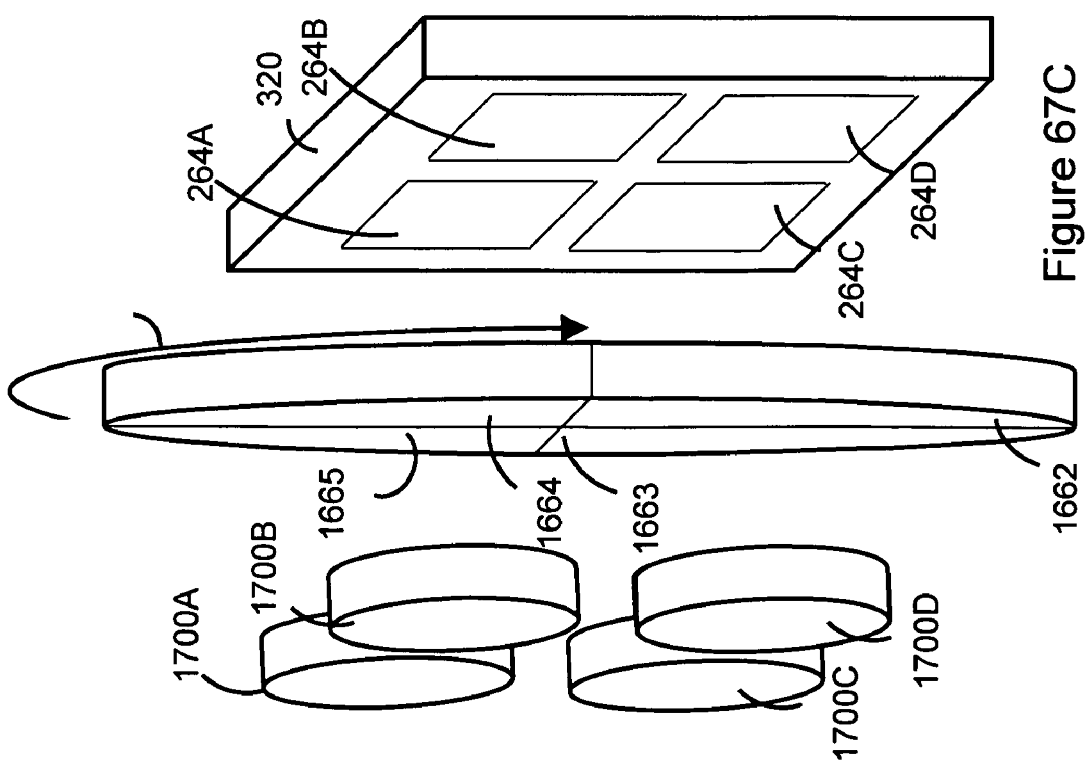
Figure 69:
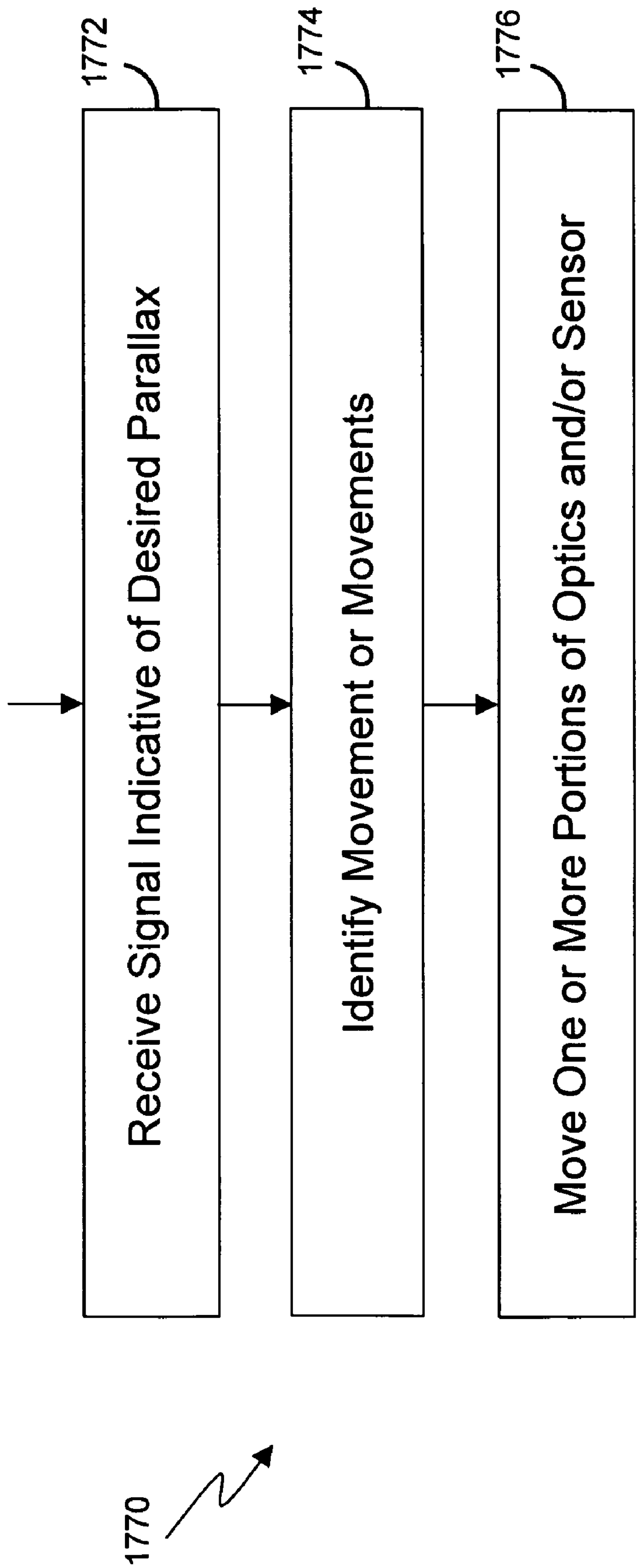

FIG. 61A is a schematic perspective view of a portion of a digital camera apparatus that includes an optics portion having a multispectral and/or hyperspectral filter in accordance with one embodiment of aspects of the present invention, with the hyperspectral filter, a lens and a sensor portion being shown in a first relative positioning;

FIG. 61B is a schematic perspective view of the portion of the digital camera apparatus of FIG. 61A, with the hyperspectral filter, the lens and the sensor portion being shown in a second relative positioning;

FIG. 61C is a schematic perspective view of the portion of the digital camera apparatus of FIG. 61A, with the hyperspectral filter, the lens and the sensor portion being shown in a third relative positioning;

FIG. 62A is a flowchart of steps that may be employed in providing hyperspectral imaging, according to one embodiment of the present invention;

FIG. 62B is a block diagram representation of one embodiment of a combiner for generating a hyperspectral image;

FIG. 63 is a flowchart of steps that may be employed in providing hyperspectral imaging, according to another embodiment of the present invention;

FIGS. 64A-64F are schematic plan views of various embodiments of filters that may be employed in hyperspectral imaging;

FIG. 65A is a schematic perspective view of a portion of a digital camera apparatus that includes an optics portion having a hyperspectral filter in accordance with another embodiment of aspects of the present invention, with the hyperspectral filter, a lens and a sensor portion being shown in a first relative positioning;

FIG. 65B is a schematic perspective view of the portion of the digital camera apparatus of FIG. 65A, with the hyperspectral filter, the lens and the sensor portion being shown in a second relative positioning;

FIG. 65C is a schematic perspective view of the portion of the digital camera apparatus of FIG. 65A, with the hyperspectral filter, the lens and the sensor portion being shown in a third relative positioning;

FIG. 65D is a schematic perspective view of the portion of the digital camera apparatus of FIG. 65A, with the hyperspectral filter, the lens and the sensor portion being shown in a fourth relative positioning;

FIG. 66A is a schematic perspective view of a portion of a digital camera apparatus that includes an optics portion having a hyperspectral filter in accordance with another embodiment of aspects of the present invention, with the hyperspectral filter, a lens and a sensor portion being shown in a first relative positioning;

FIG. 66B is a schematic perspective view of the portion of the digital camera apparatus of FIG. 66A, with the hyperspectral filter, the lens and the sensor portion being shown in a second relative positioning;

FIG. 66C is a schematic perspective view of the portion of the digital camera apparatus of FIG. 66A, with the hyperspectral filter, the lens and the sensor portion being shown in a third relative positioning;

FIG. 66D is a schematic perspective view of the portion of the digital camera apparatus of FIG. 66A, with the hyperspectral filter, the lens and the sensor portion being shown in a fourth relative positioning;

FIG. 66E is a schematic perspective view of a portion of a digital camera apparatus that includes an optics portion having a hyperspectral filter in accordance with another embodiment of aspects of the present invention, with the hyperspectral filter, a lens and a sensor portion being shown in a first relative positioning;

FIG. 66F is a schematic perspective view of the portion of the digital camera apparatus of FIG. 66E, with the hyperspectral filter, the lens and the sensor portion being shown in a second relative positioning;

FIG. 67A is a schematic perspective view of a portion of a digital camera apparatus that includes an optics portion having a hyperspectral filter in accordance with another embodiment of aspects of the present invention, with the hyperspectral filter, a lens and a sensor portion being shown in a first relative positioning;

FIG. 67B is a schematic perspective view of the portion of the digital camera apparatus of FIG. 67A, with the hyperspectral filter, the lens and the sensor portion being shown in a second relative positioning;

FIG. 67C is a schematic perspective view of the portion of the digital camera apparatus of FIG. 67A, with the hyperspectral filter, the lens and the sensor portion being shown in a third relative positioning;

FIG. 67D is a schematic perspective view of the portion of the digital camera apparatus of FIG. 67A, with the hyperspectral filter, the lens and the sensor portion being shown in a fourth relative positioning;

FIGS. 68A-68E show an example of parallax in the x direction in the digital camera apparatus 210;

FIGS. 68F-68I show an example of parallax in the y direction in the digital camera apparatus of FIG. 4;

FIGS. 68J-68M show an example of parallax having an x component and a y component in the digital camera apparatus of FIG. 4;

FIGS. 68N-68R show an example of an effect of using movement to help decrease parallax in the digital camera apparatus;

FIGS. 68S-68W show an example of an effect of using movement to help increase parallax in the digital camera apparatus;

FIG. 69 is a flowchart of steps that may be employed to increase and/or decrease parallax, according to one embodiment of the present invention.

Figure 70:
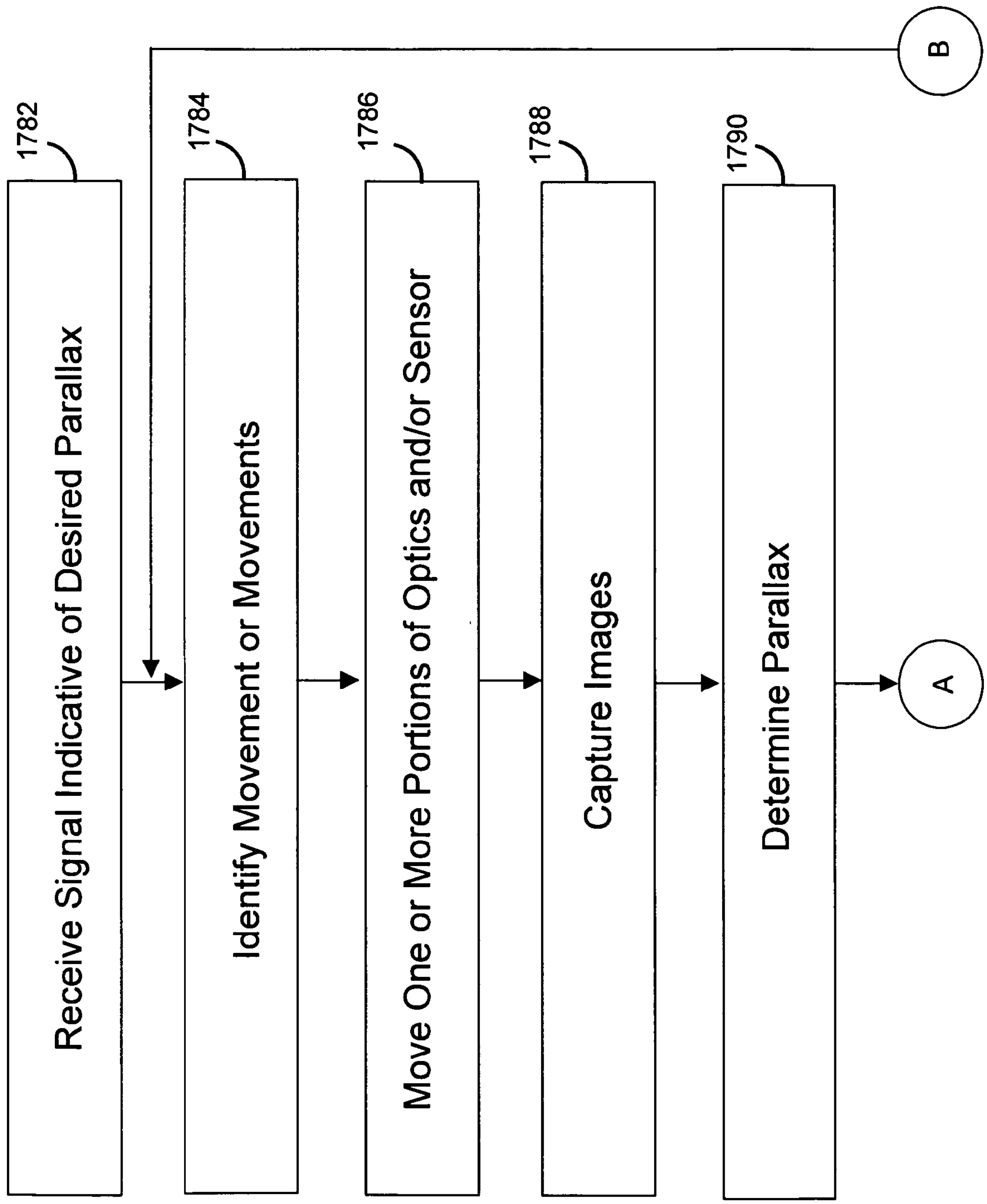
Figure 71:
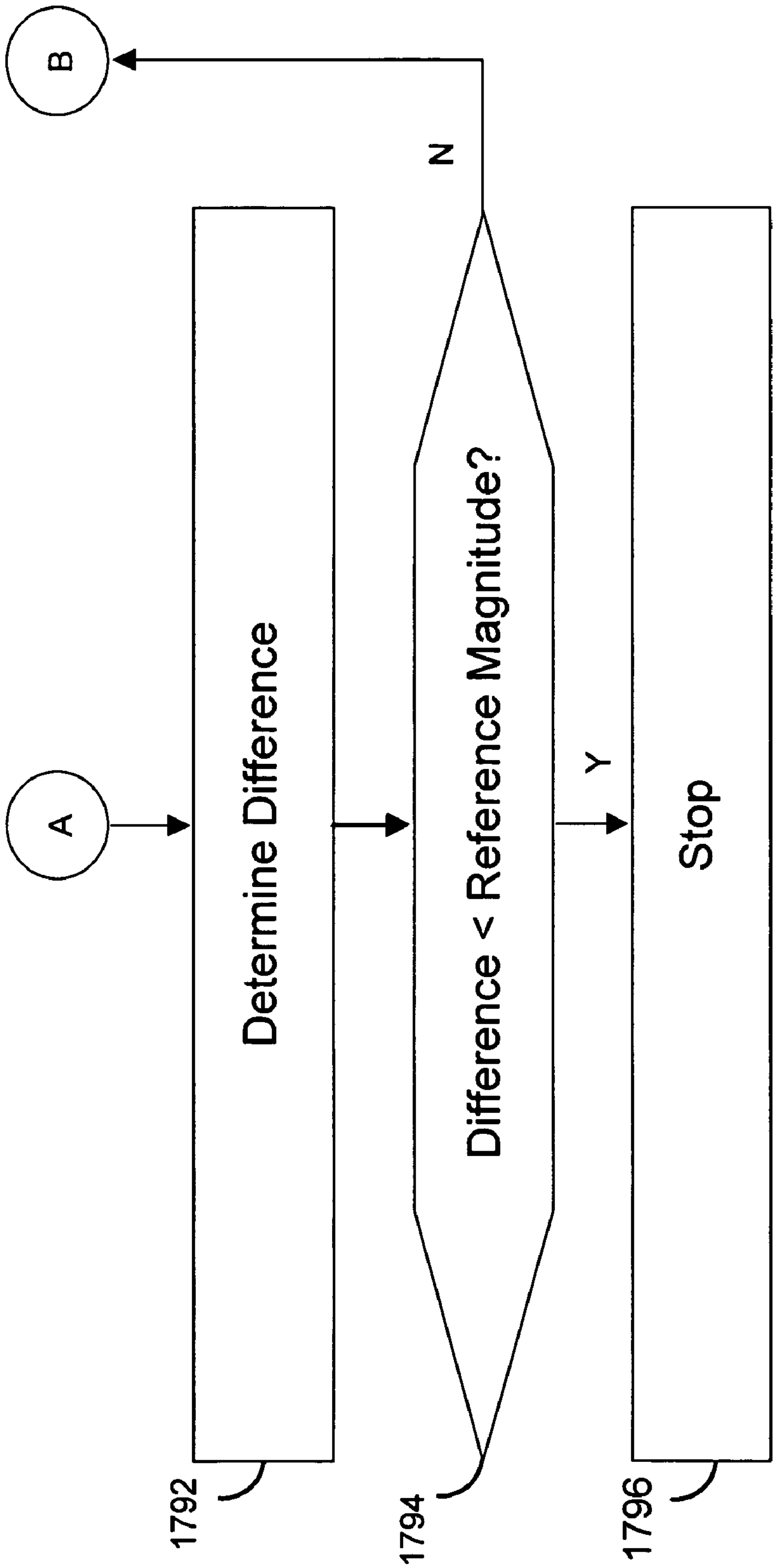

FIGS. 70-71 show a flowchart of steps that may be employed and/or decrease parallax in another embodiment of the present invention.

Figure 72A:
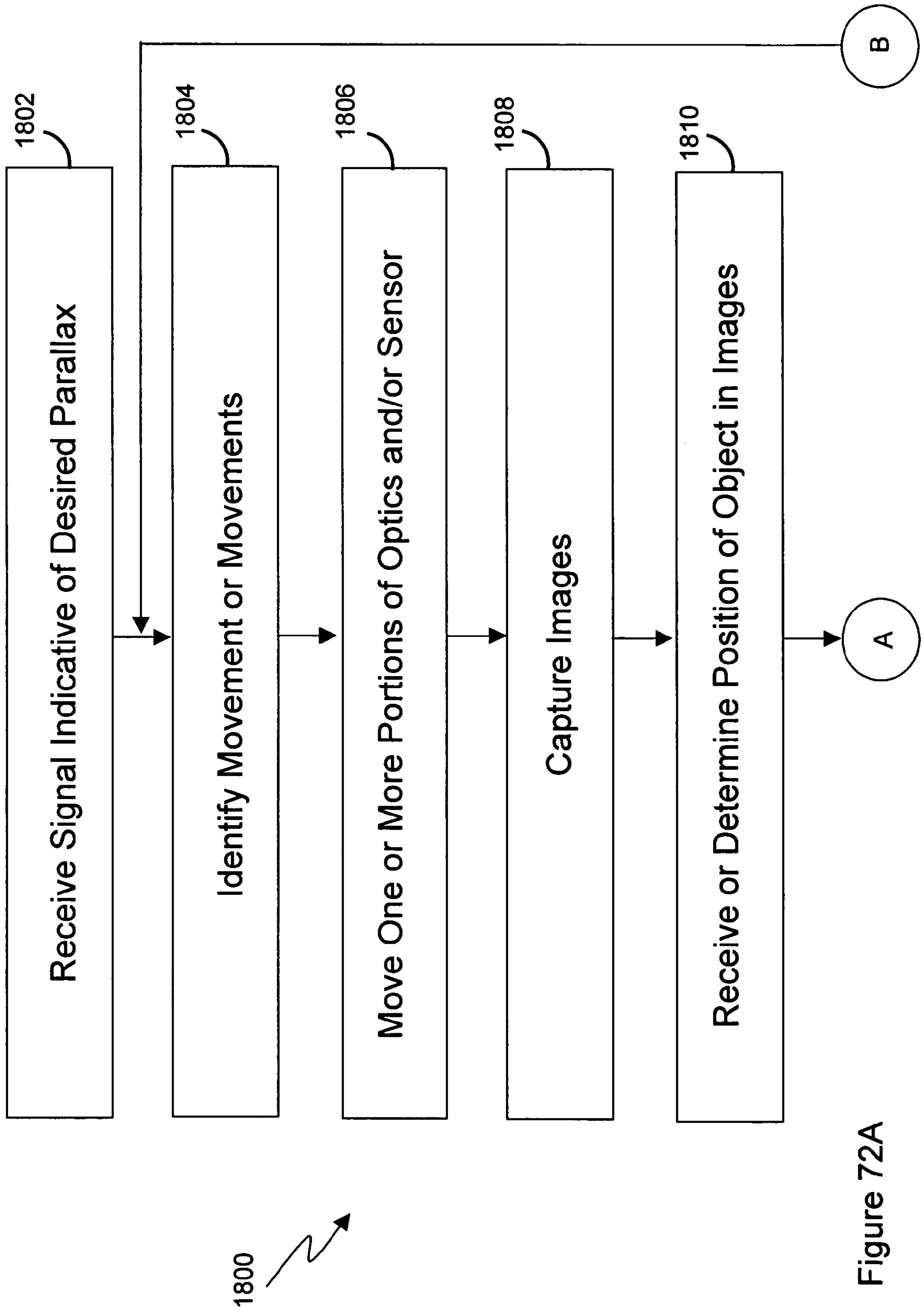
Figure 72B:
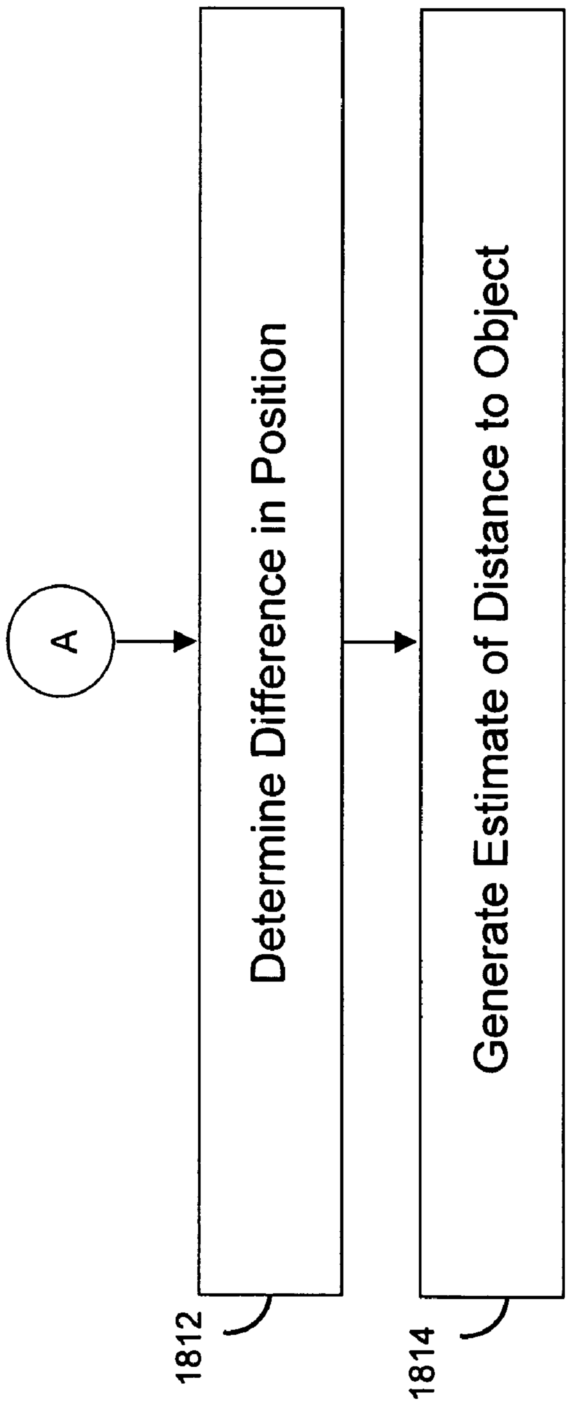

FIGS. 72A-72B is a flowchart of steps that may be employed in generating an estimate of a distance to an object, or portion thereof, according to one embodiment of the present invention.

Figure 73:
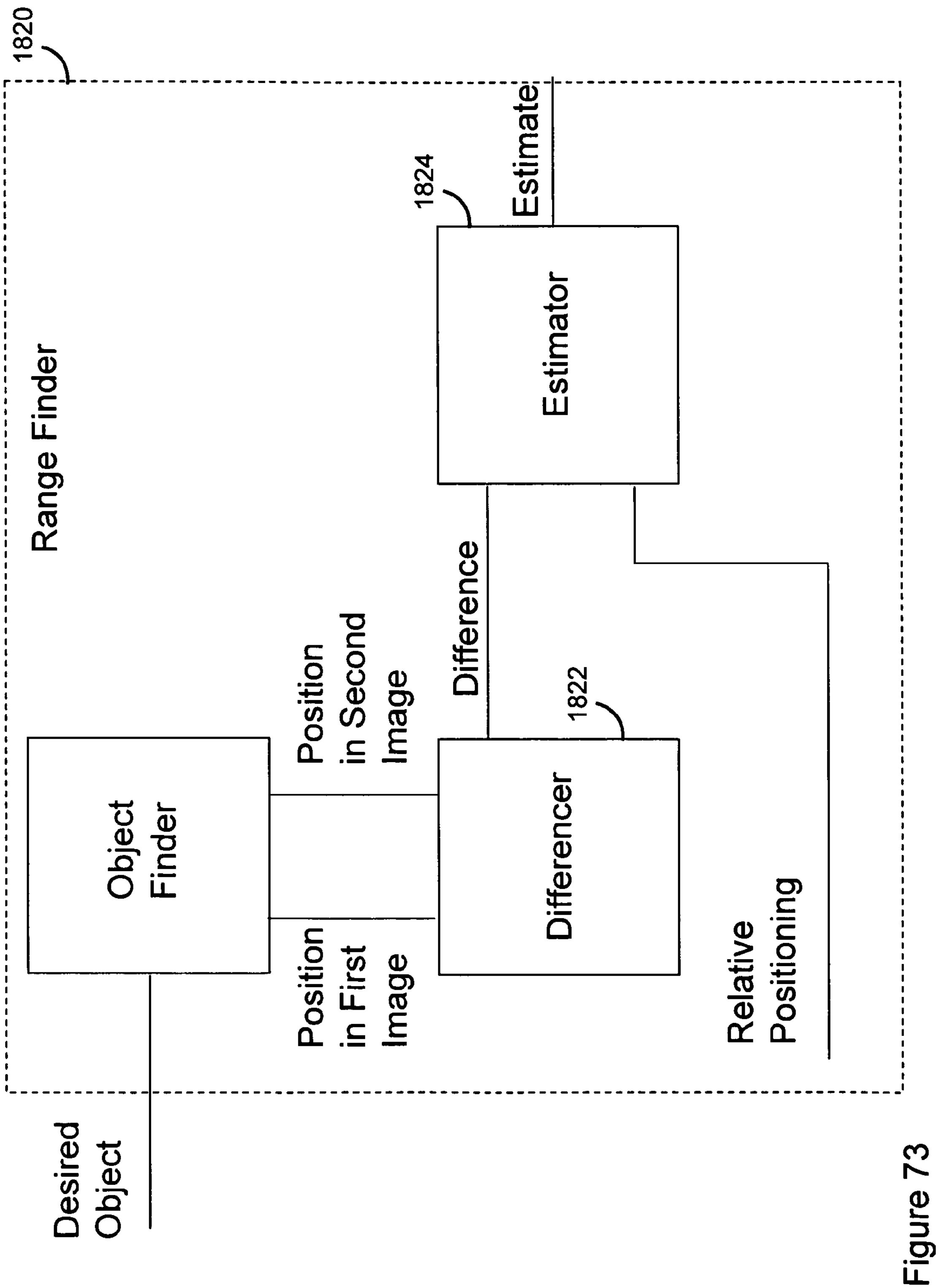
Figure 74B:
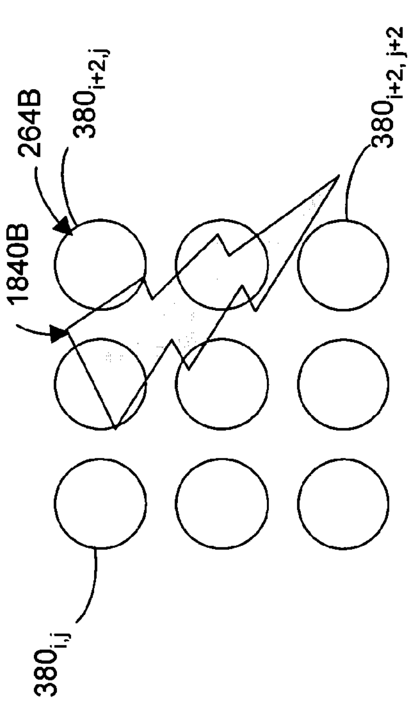
Figure 76:
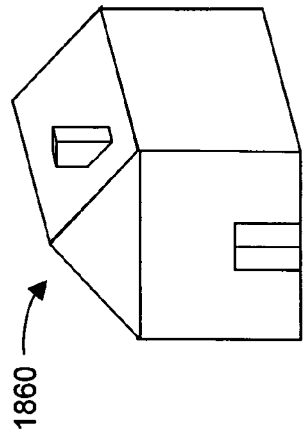
Figure 74A:
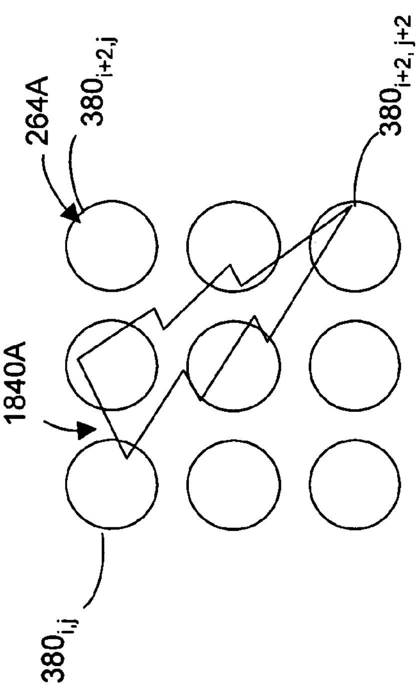
Figure 75:
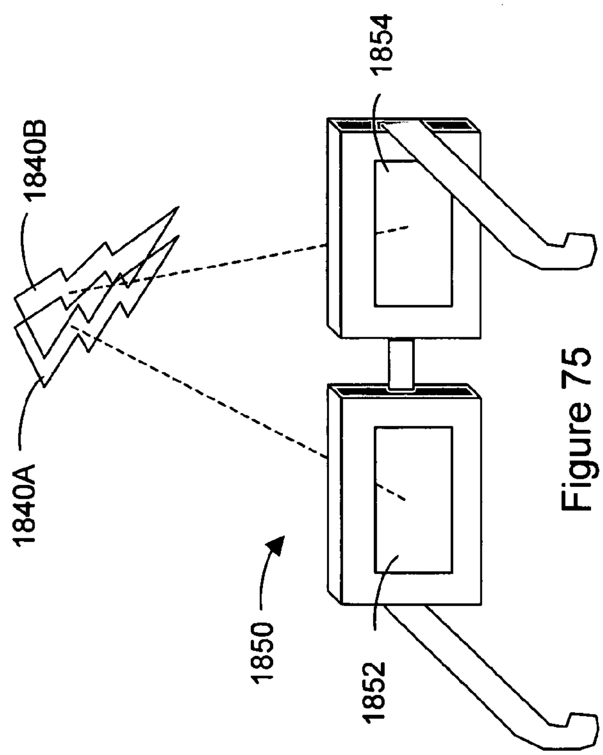
Figure 77A:
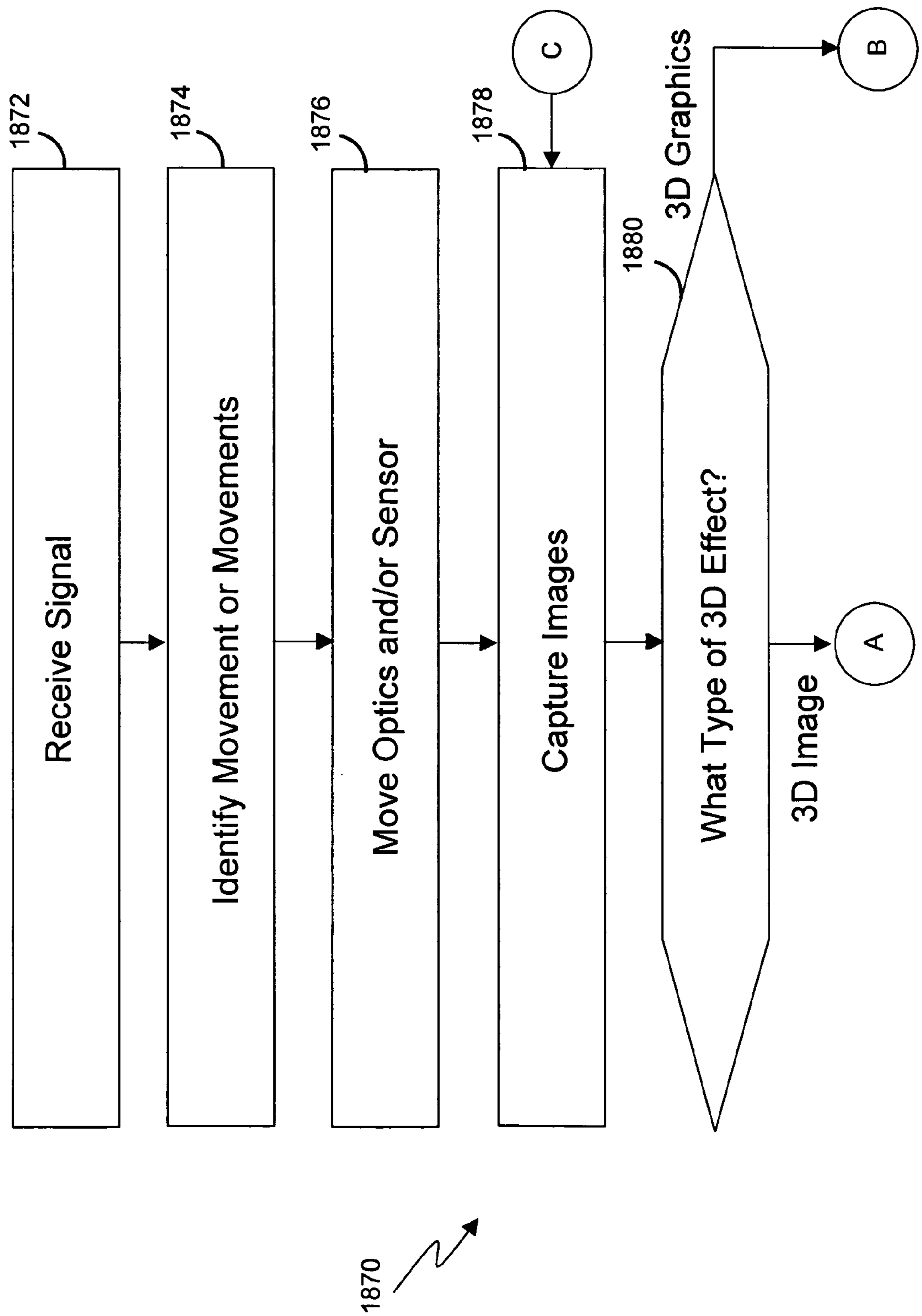
Figure 77B:
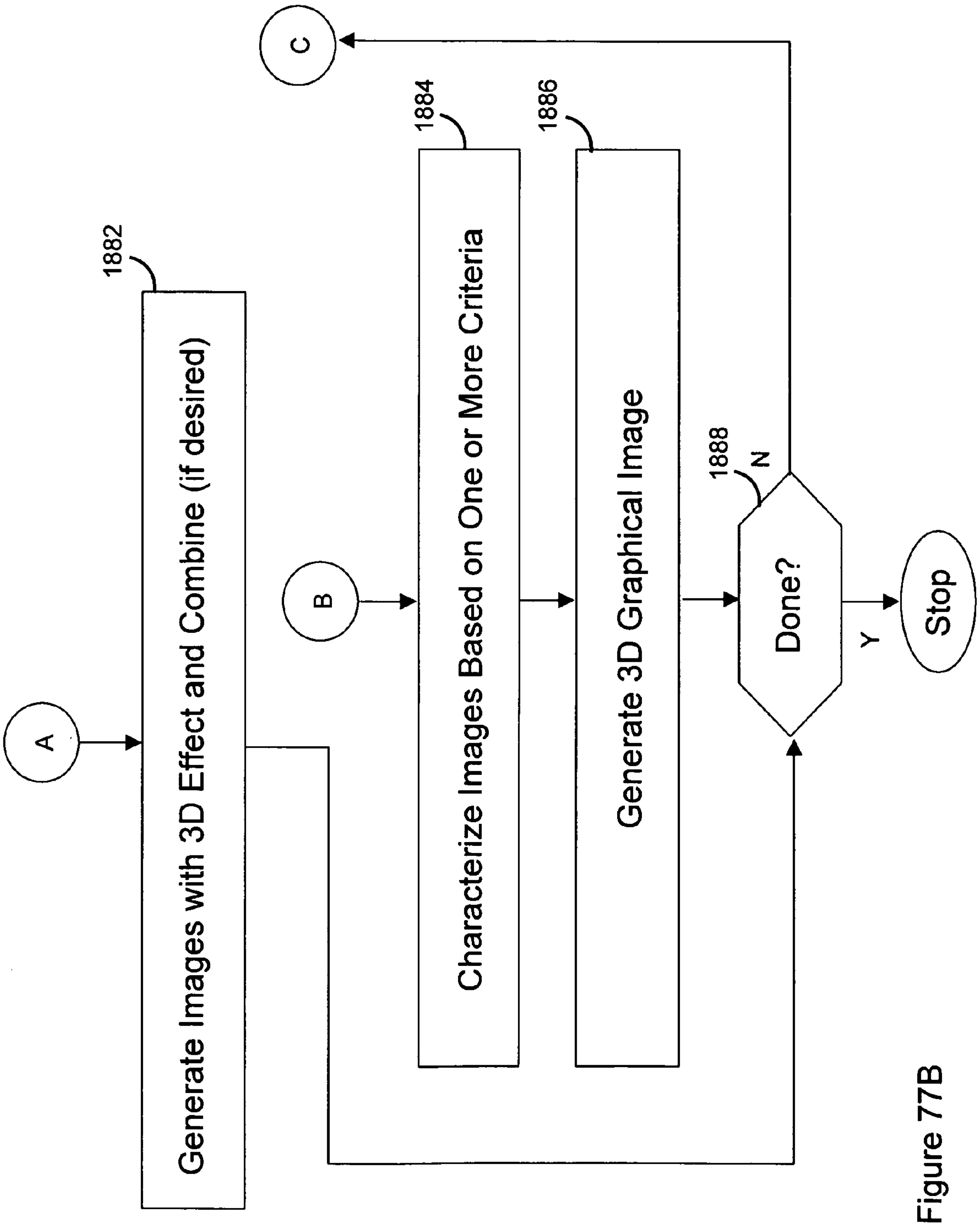

FIG. 73 is a block diagram of a portion of one embodiment of a range finder that may be employed in generating an estimate of a distance to an object, or portion thereof;

FIGS. 74A-74B show an example of images that may be employed in providing stereovision;

FIG. 75 shows one embodiment of eyewear that may be employed in providing stereovision;

FIG. 76 is a representation of one embodiment of an image with a 3D effect;

FIGS. 77A-77B show a flowchart of steps that may be employed in providing 3D imaging, according to one embodiment of the present invention.

Figure 78:
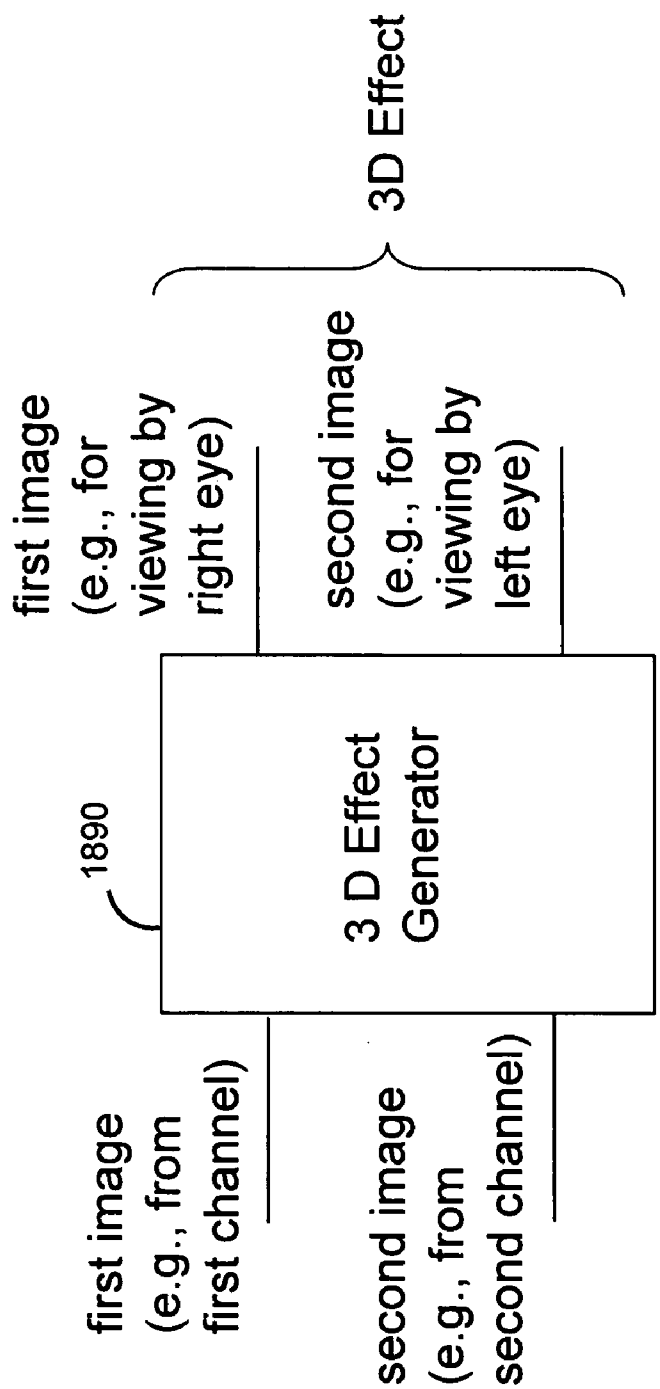
Figure 79:
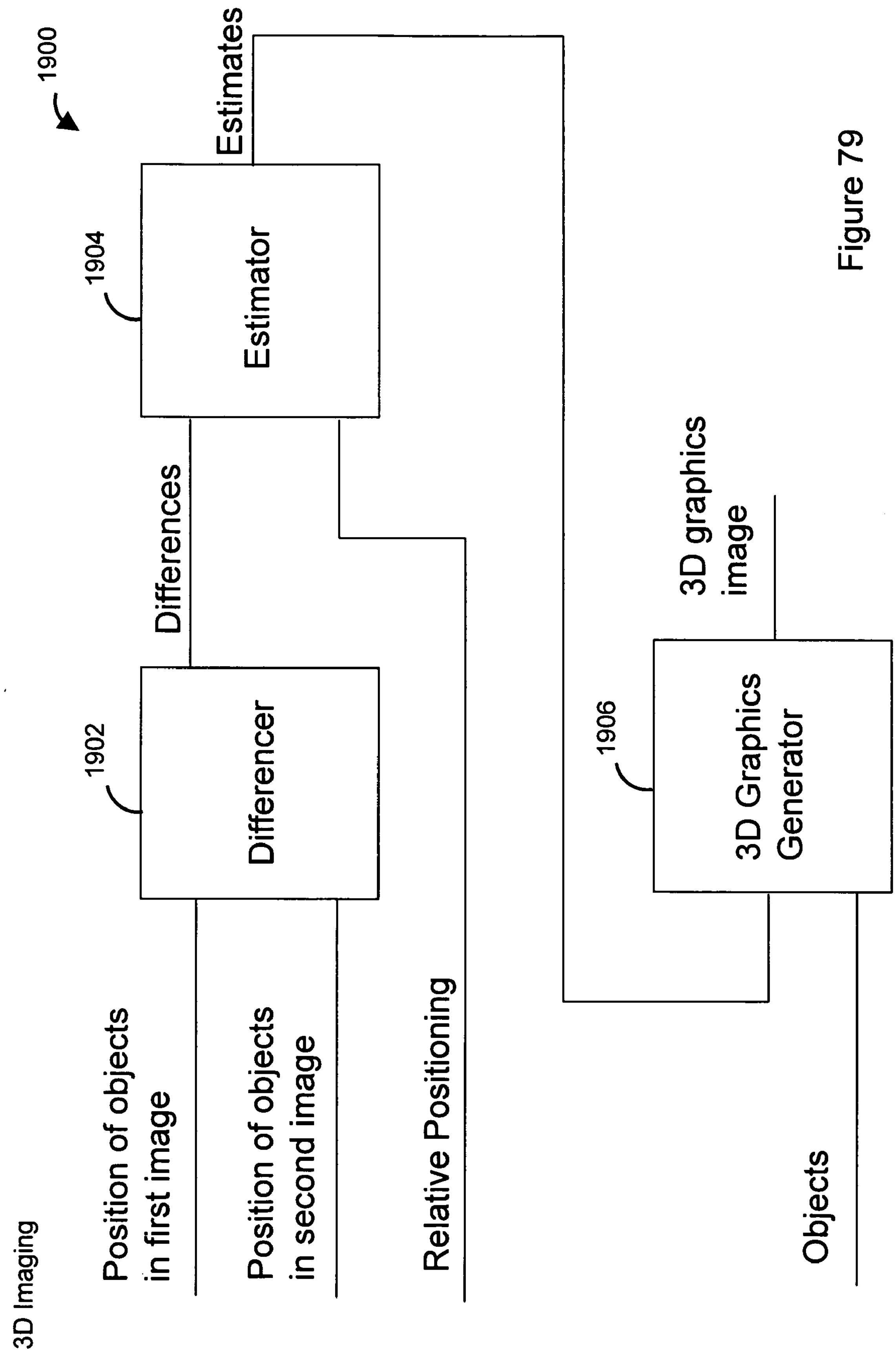
Figure 80:
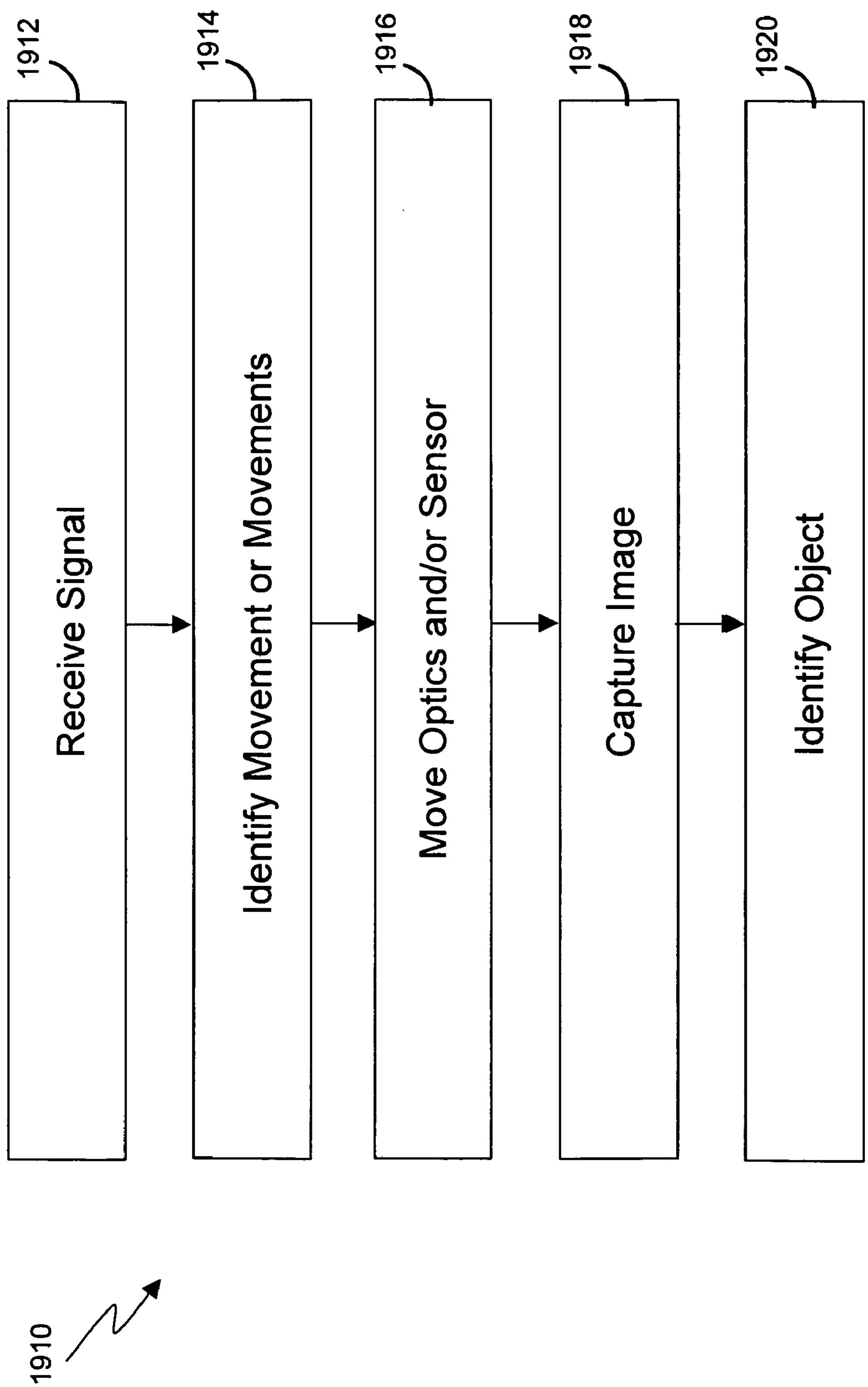

FIG. 78 is a block diagram of one embodiment for generating an image with a 3D effect;

FIG. 79 is a block diagram of one embodiment for generating an image with 3D graphics;

FIG. 80 is a flowchart of steps that may be employed in providing image discrimination, according to one embodiment of the present invention.

Figure 81A:
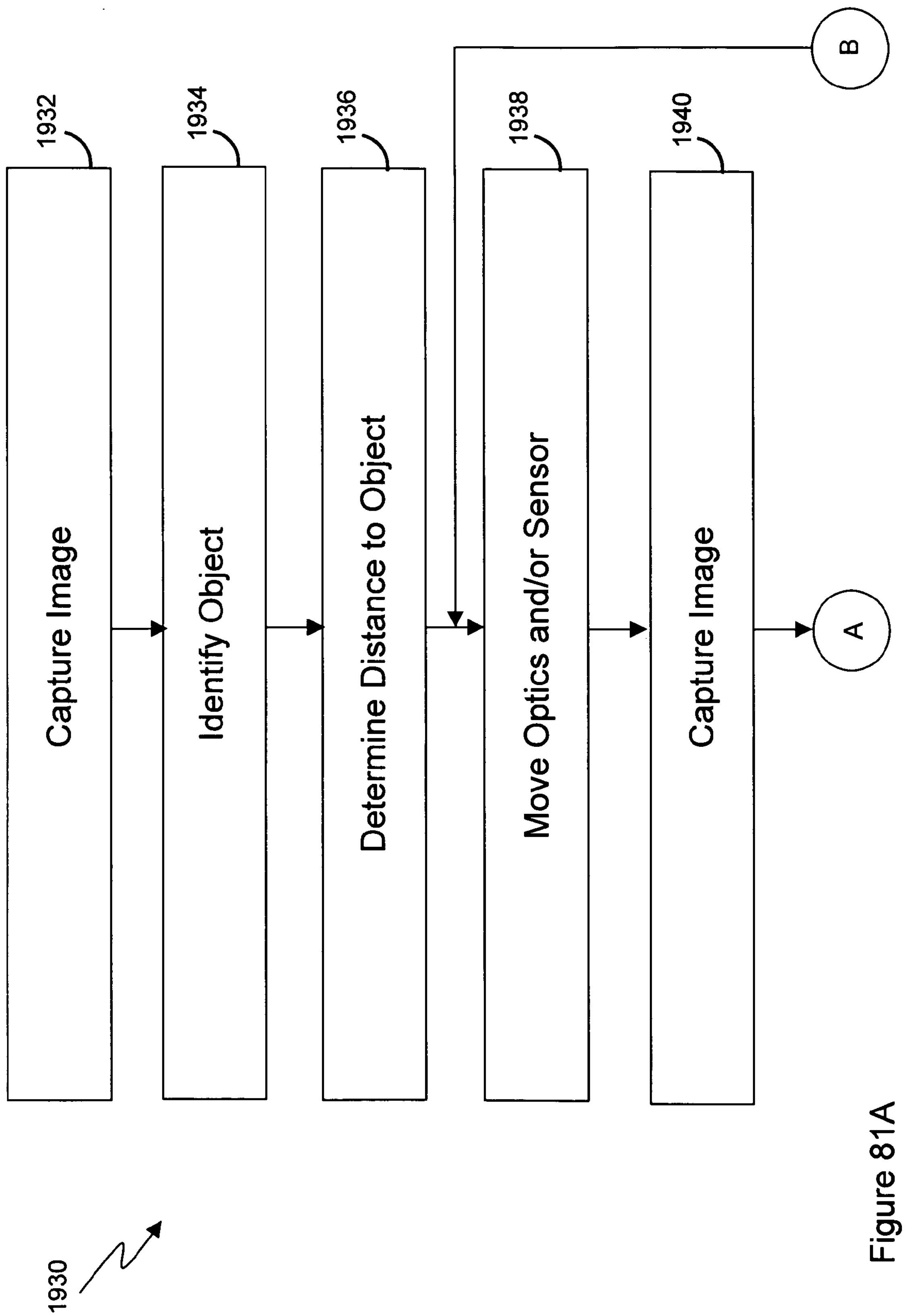
Figure 81B:
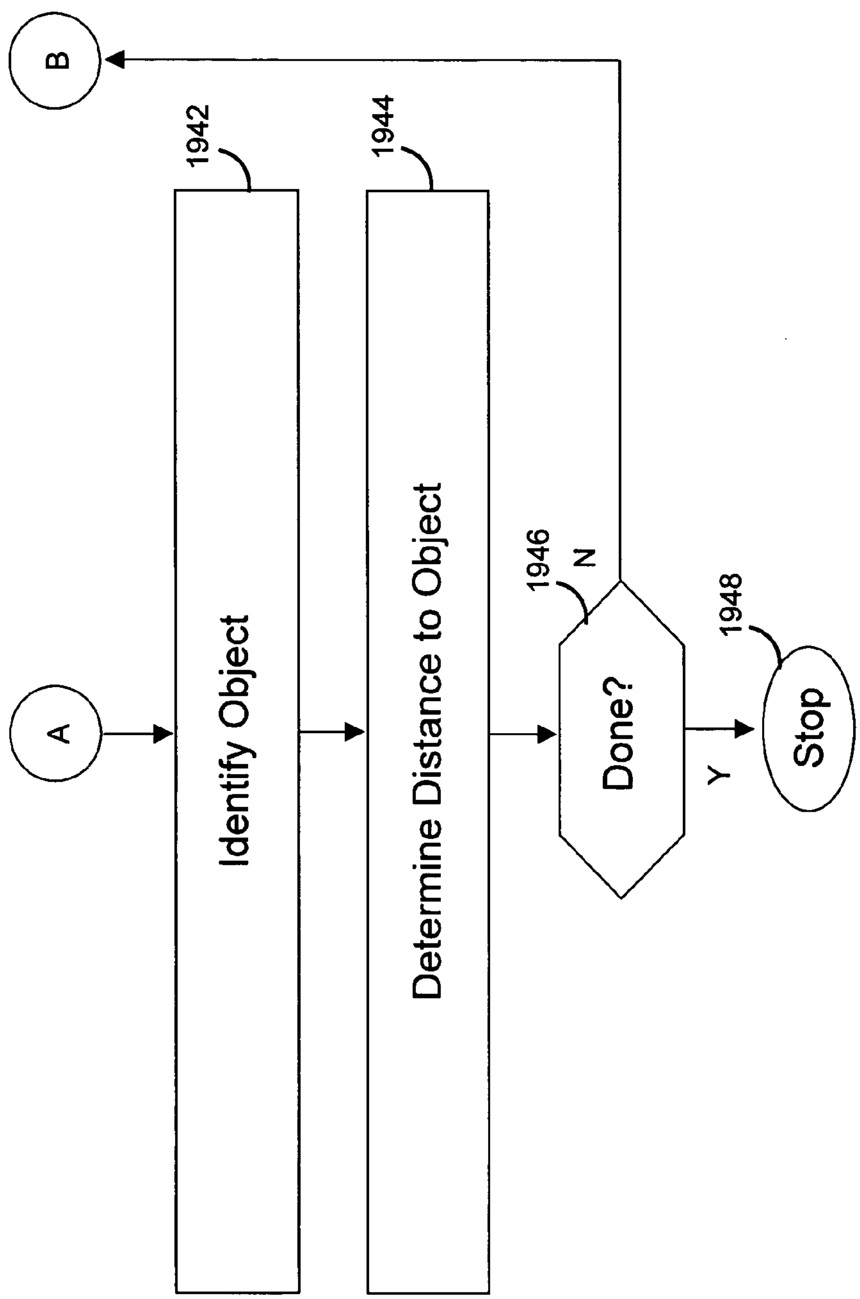

FIGS. 81A-81B show a flowchart of steps that may be employed in providing image discrimination, according to another embodiment of the present invention.

Figure 82:
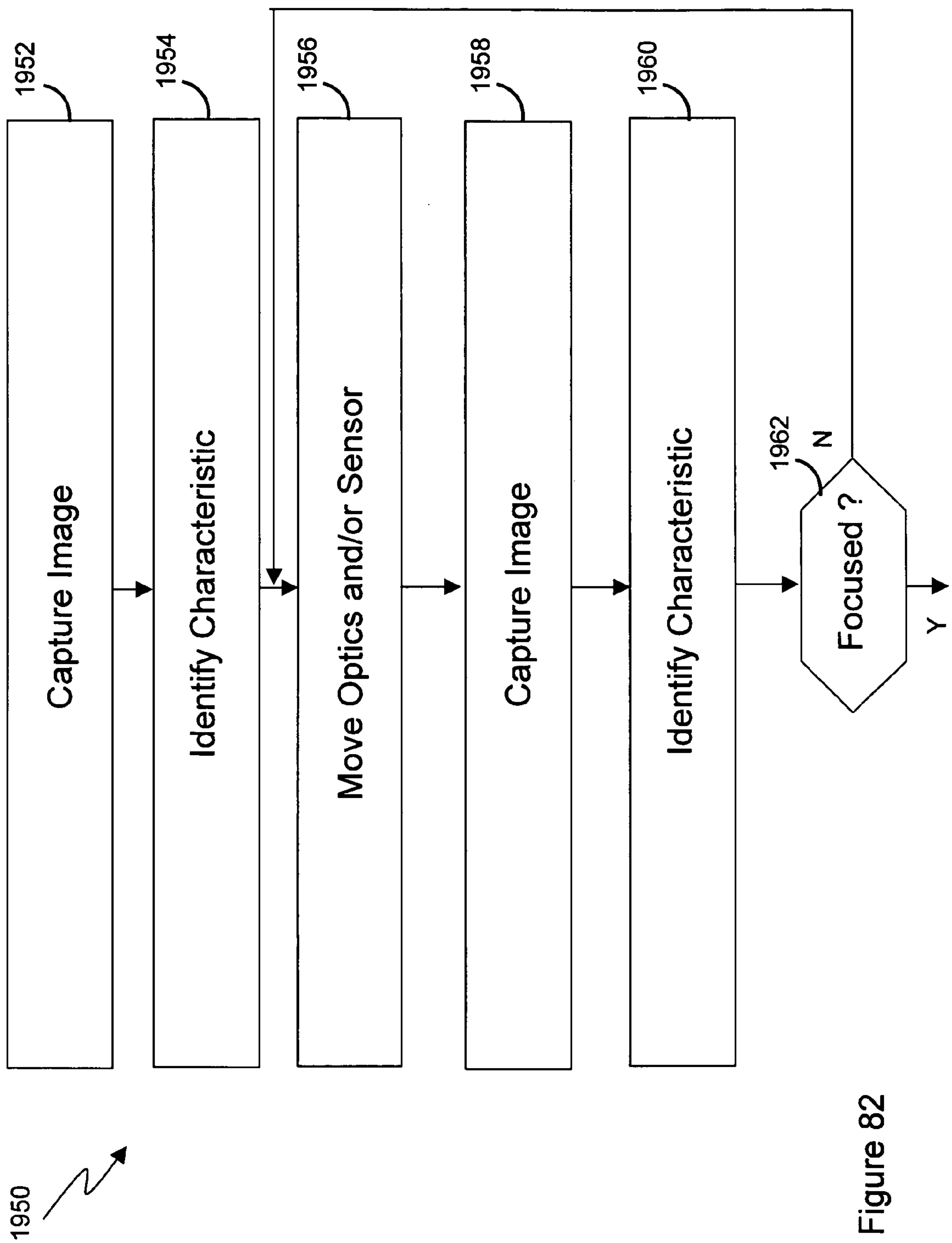

FIG. 82 shows a flowchart of steps that may be employed in providing auto focus, according to one embodiment of the present invention.

Figure 15A:
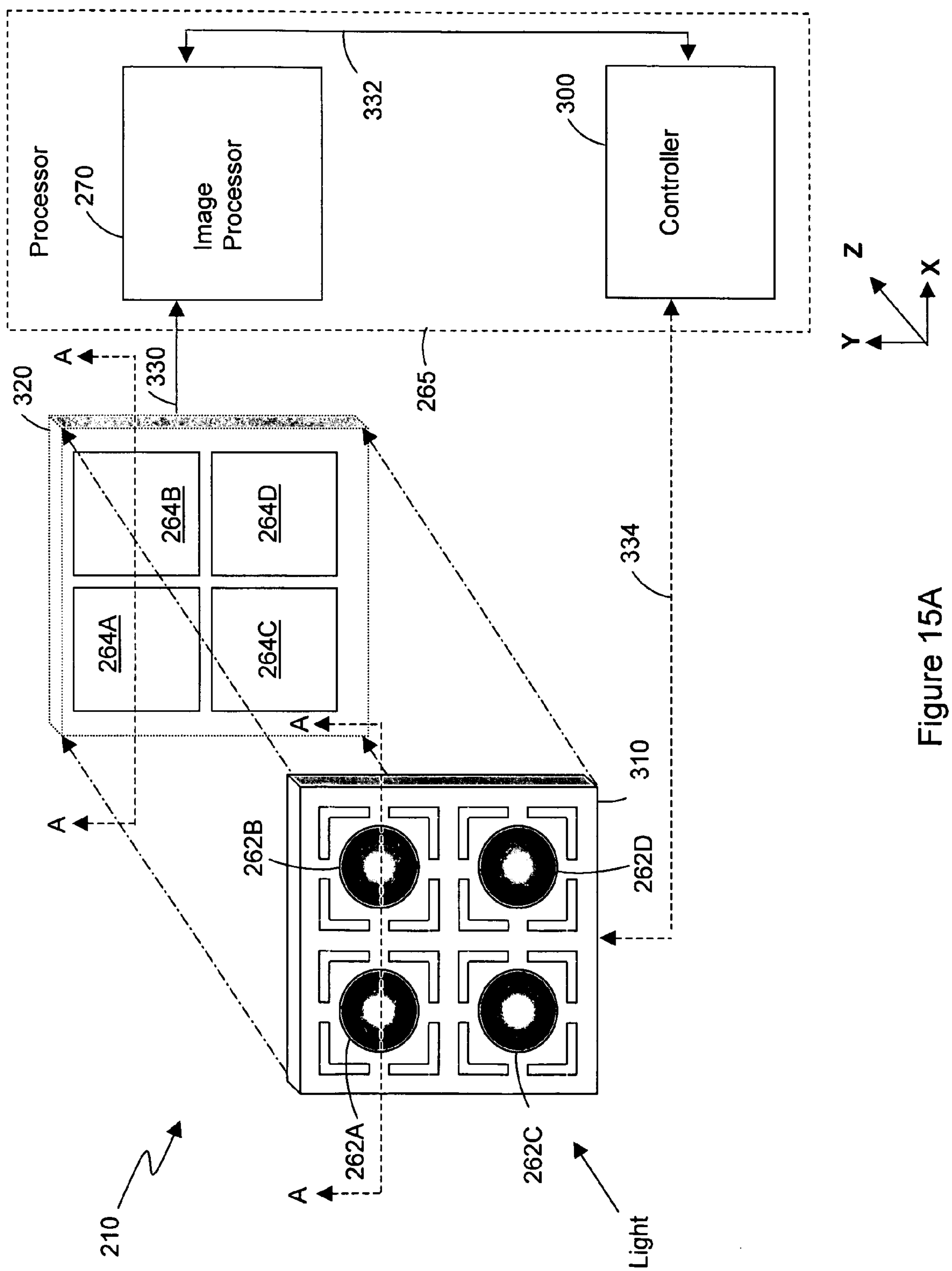
FIG. 15A shows one embodiment of the digital camera apparatus of FIG. 4, partially in schematic, partially exploded, perspective view and partially in block diagram representation.
Figure 15B:
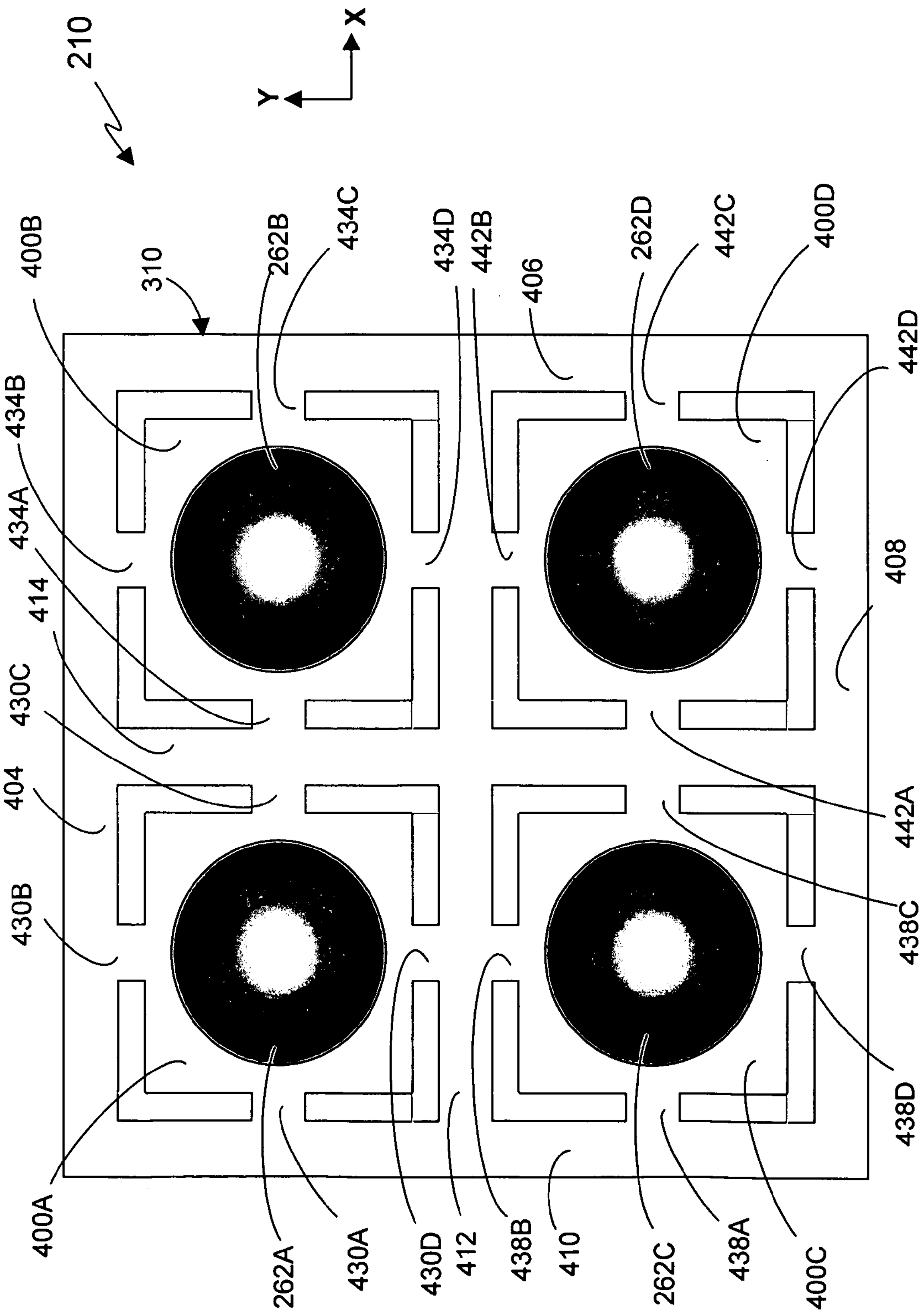
FIGS. 15B-15C are an enlarged schematic plan view and an enlarged schematic representation, respectively, of one embodiment of optics portions and a positioner employed in the digital camera apparatus of FIG. 15A.
Figure 15C:
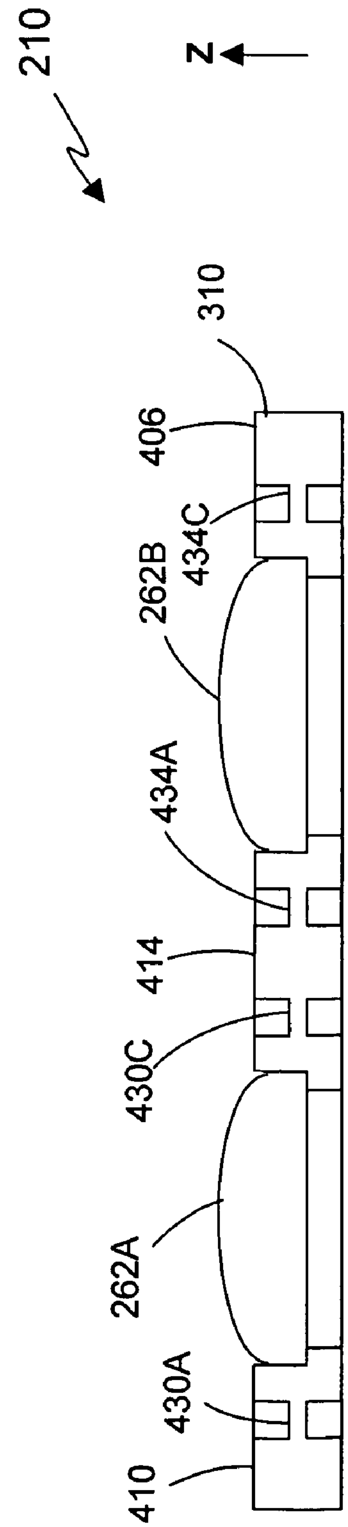
Figure 17A:
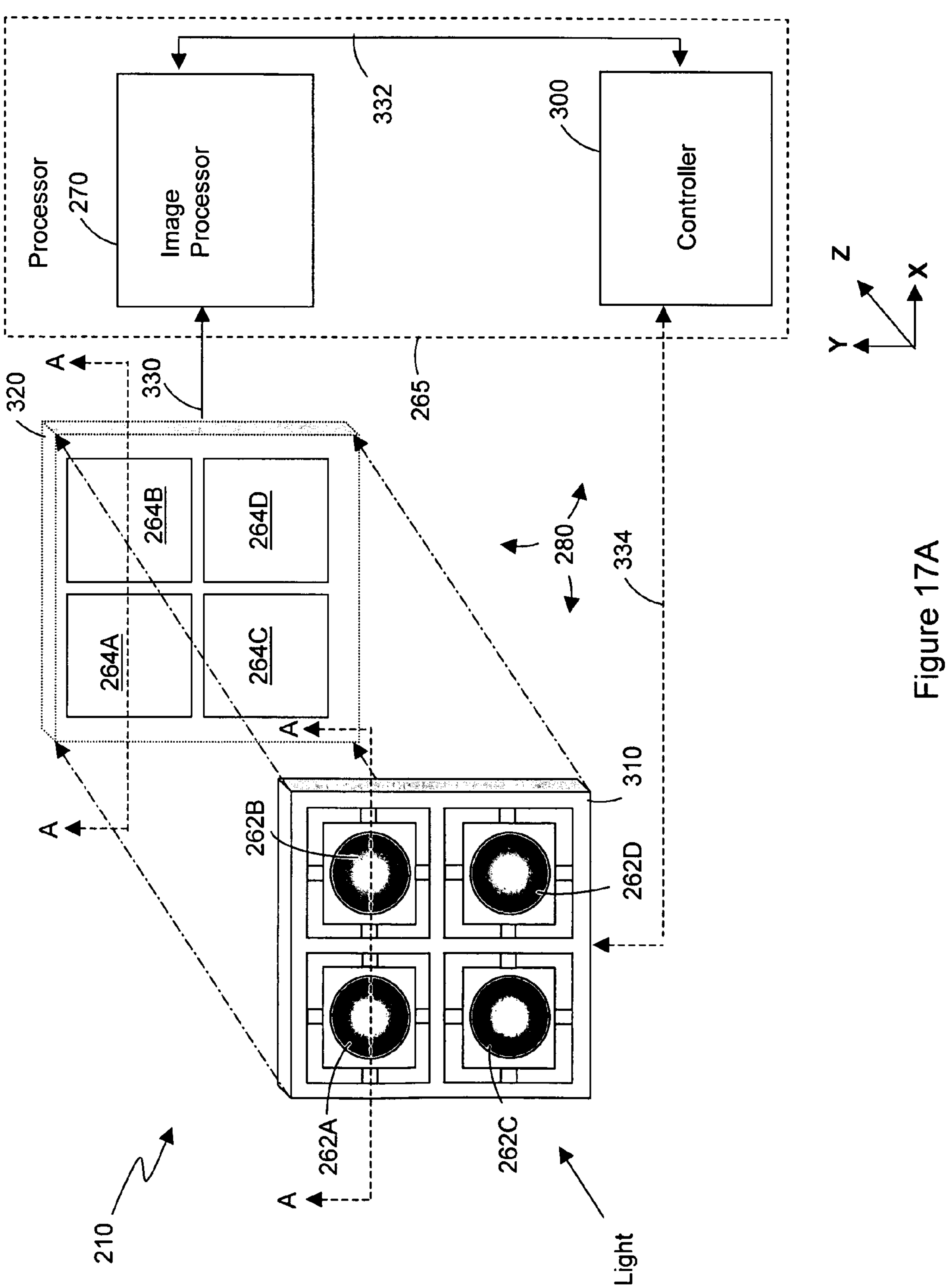
FIG. 17A shows another embodiment of the digital camera apparatus of FIG. 4, partially in schematic, partially exploded, perspective view and partially in block diagram representation.
Figure 17B:
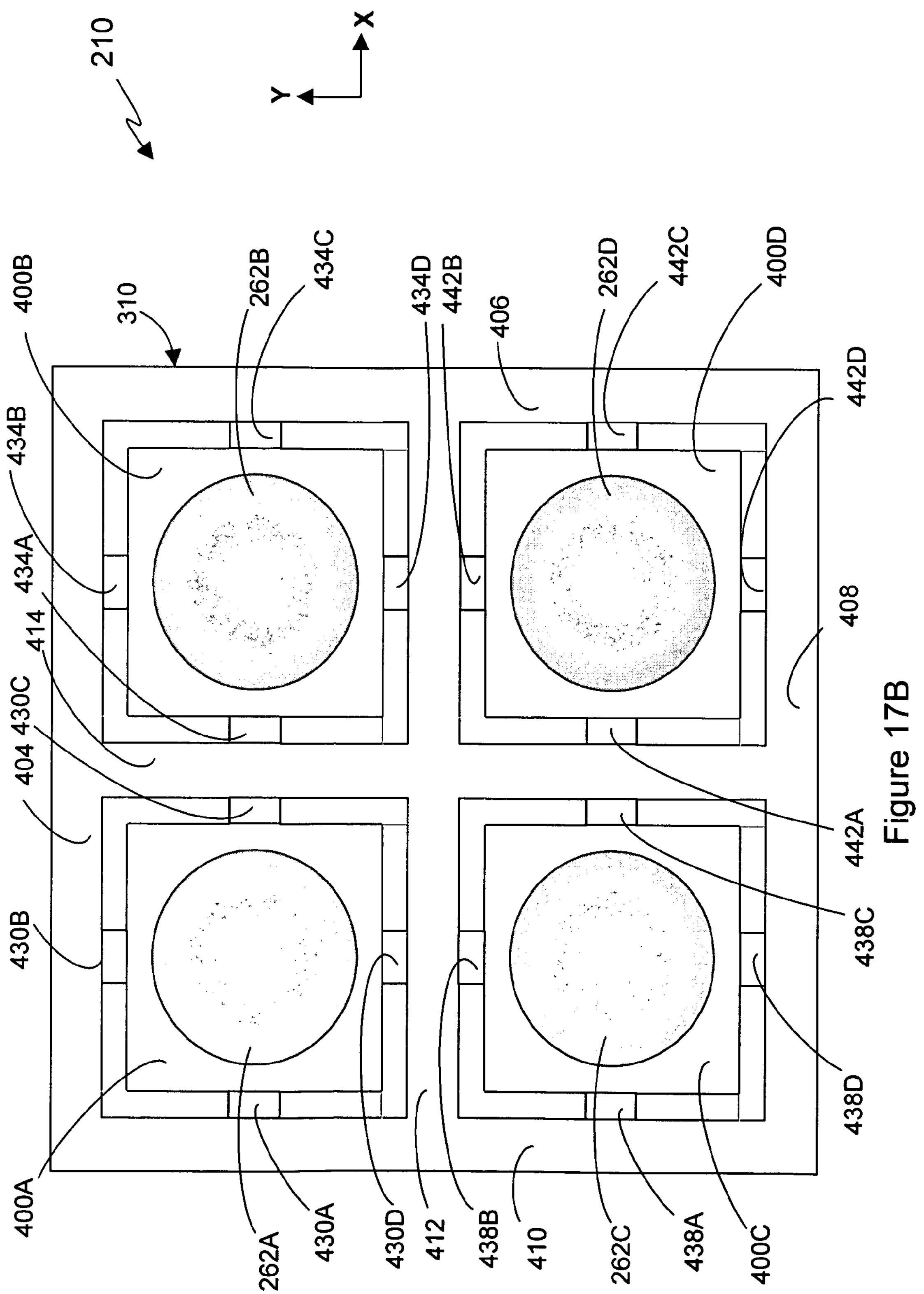
FIGS. 17B-17C are an enlarged schematic plan view and an enlarged schematic representation, respectively, of one embodiment of optics portions and a positioner employed in the digital camera apparatus of FIG. 17A.
Figure 17C:
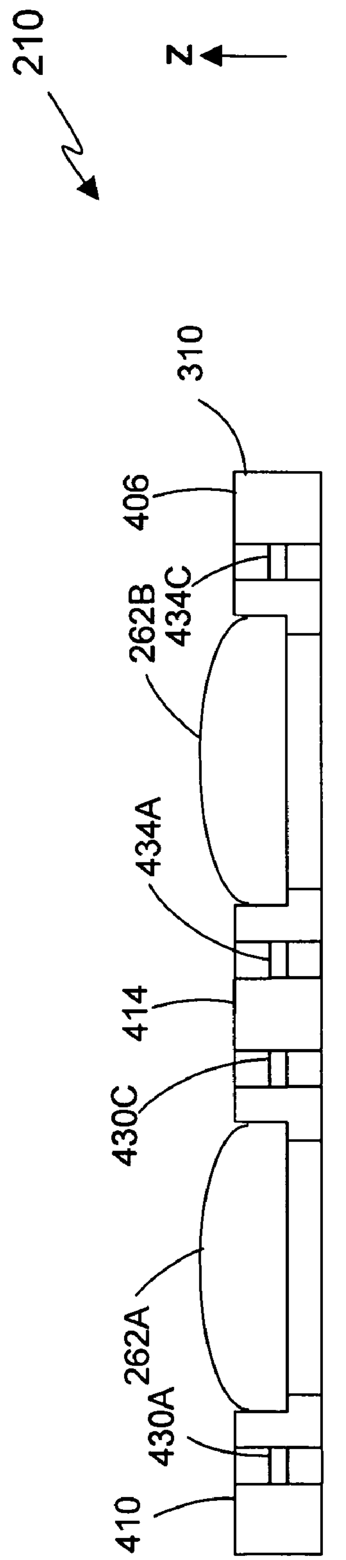
Figure 83A:
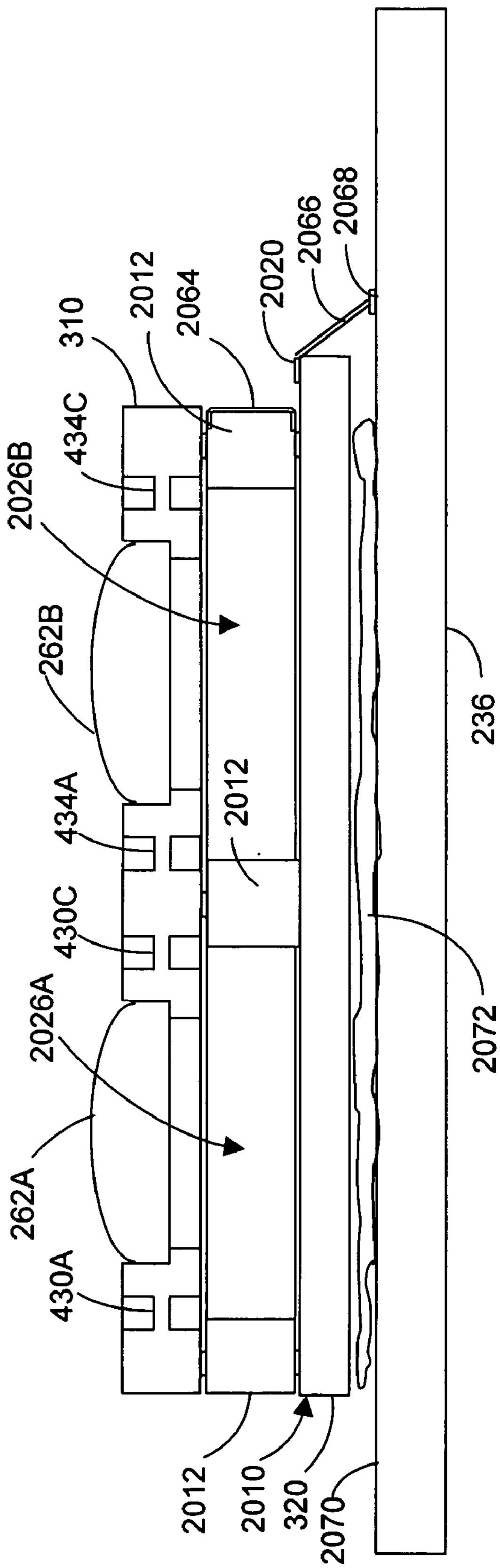
Figure 83B:
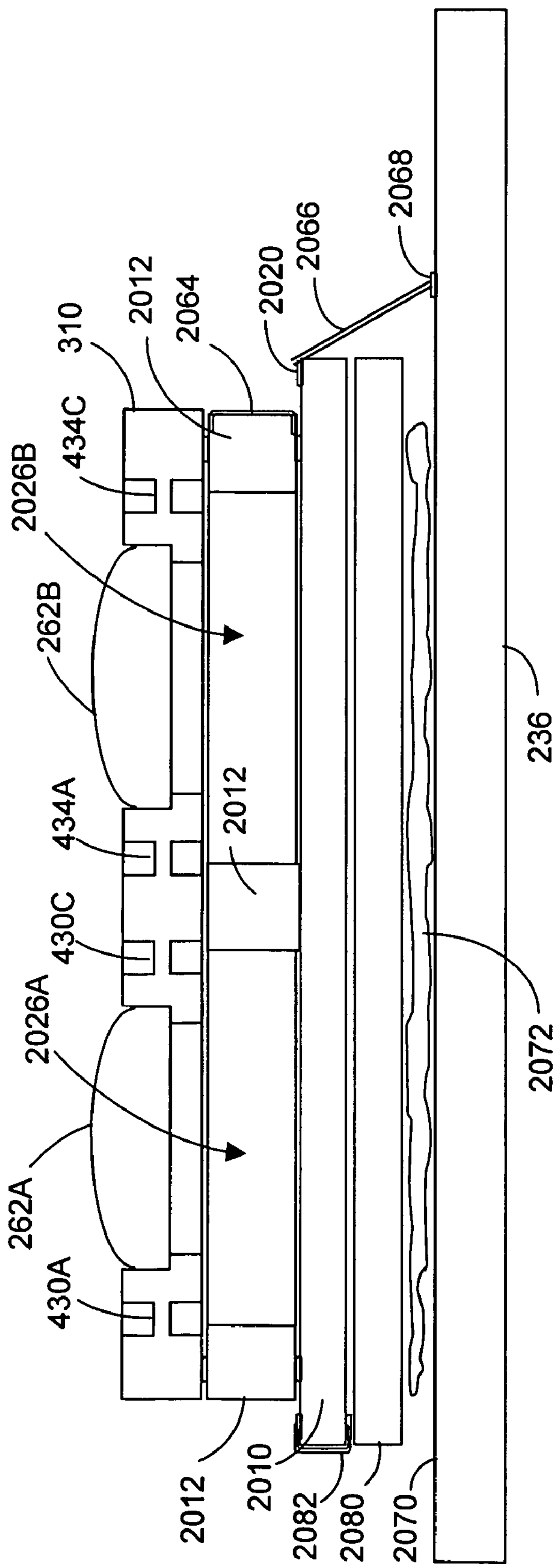
Figure 83C:
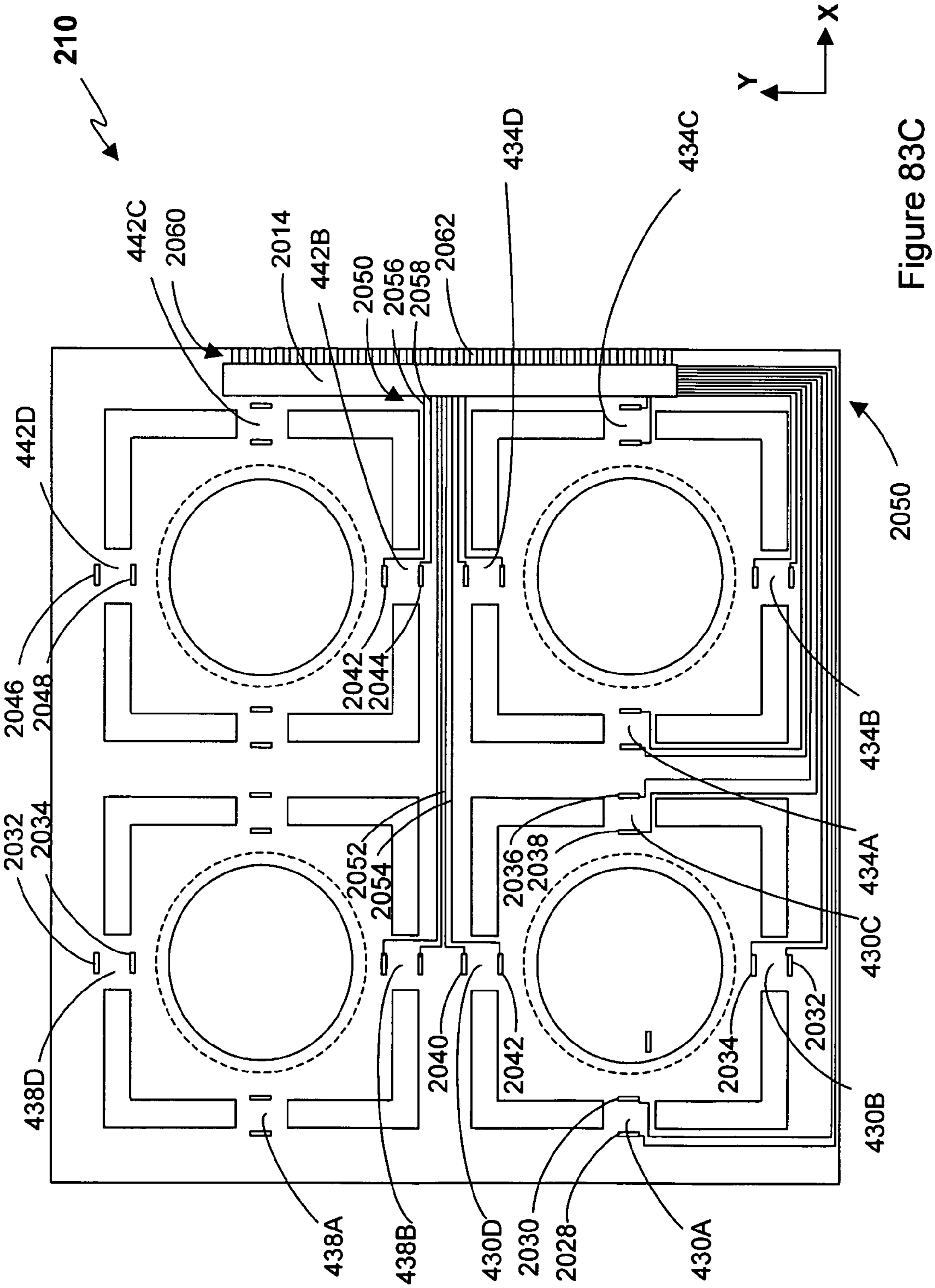
Figure 83D:
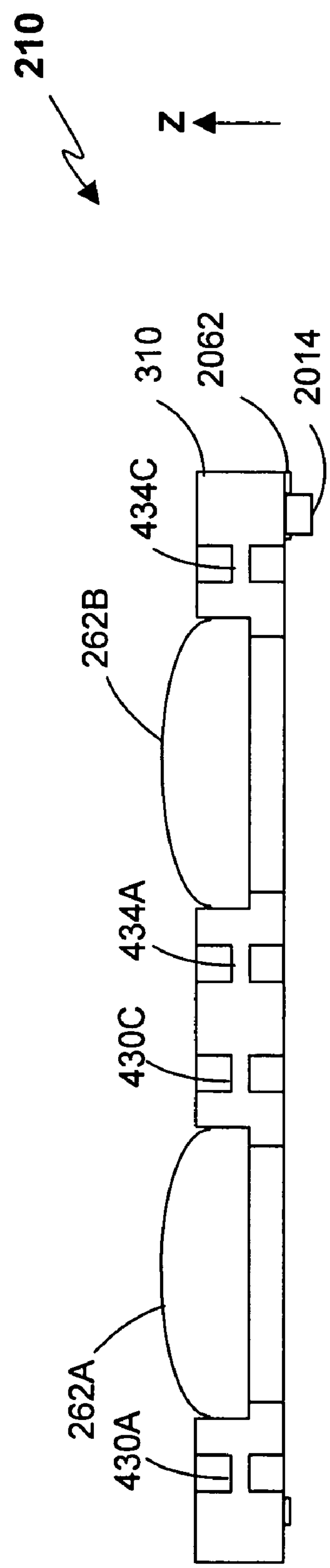

FIG. 83A is a schematic cross sectional view (taken, for example, in a direction such as direction A-A shown on FIGS. 15A, 17A) of one embodiment of the digital camera apparatus and a circuit board of a digital camera on which the digital camera apparatus may be mounted;

FIG. 83B is a schematic cross sectional view (taken, for example, in a direction such as direction A-A shown on FIGS. 15A, 17A) of another embodiment of the digital camera apparatus and a circuit board of the digital camera on which the digital camera apparatus may be mounted;

FIG. 83C is a schematic plan view of one side of one embodiment of a positioner of the digital camera apparatus of FIG. 83A;

FIG. 83D is a schematic cross section view of one embodiment of optics portions, a positioner and a second integrated circuit of the digital camera apparatus of FIG. 83A.

Figures 83E, 83F:
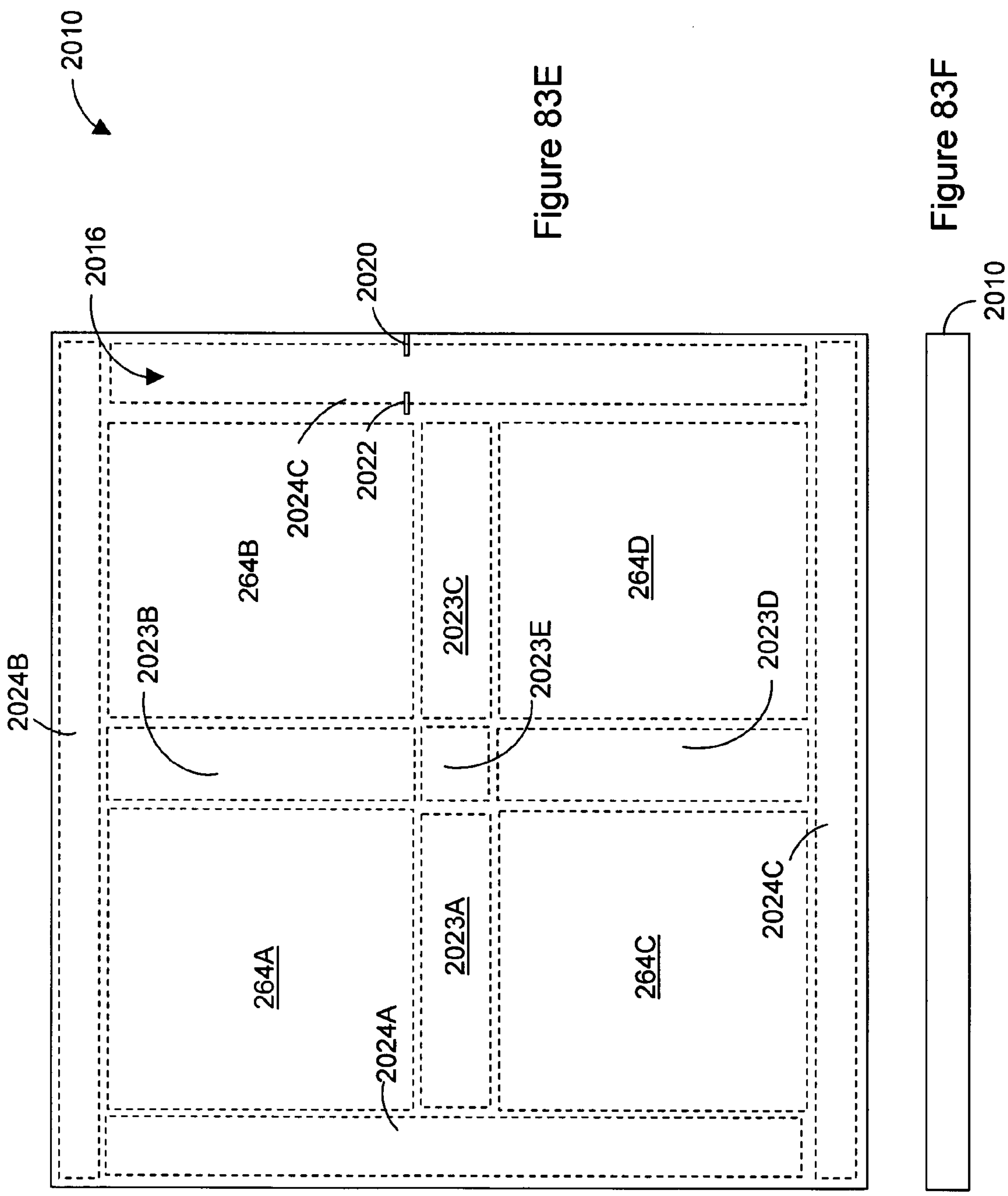
Figure 84A:
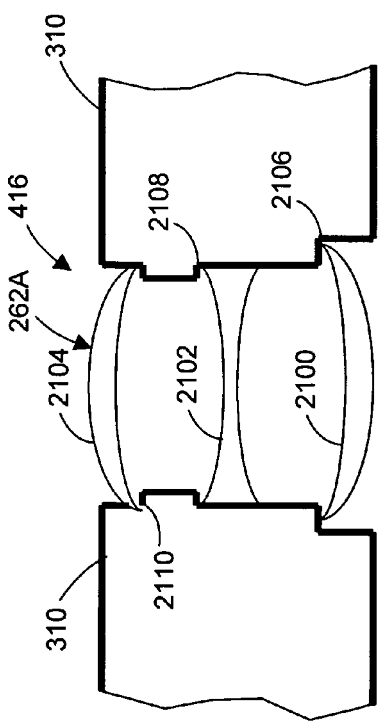
Figure 84B:
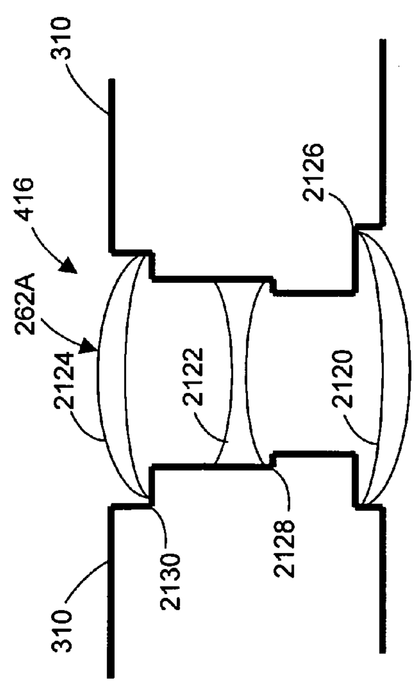
Figure 84C:
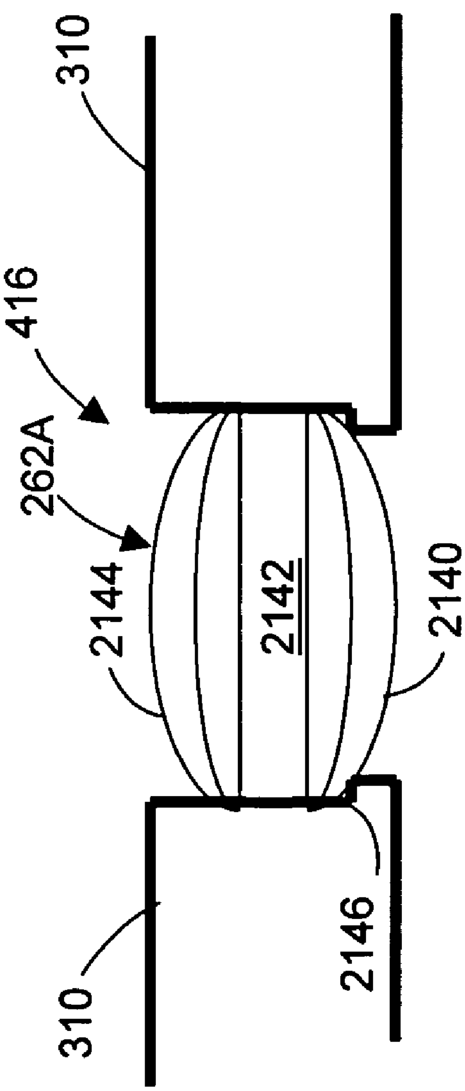
Figure 85A:
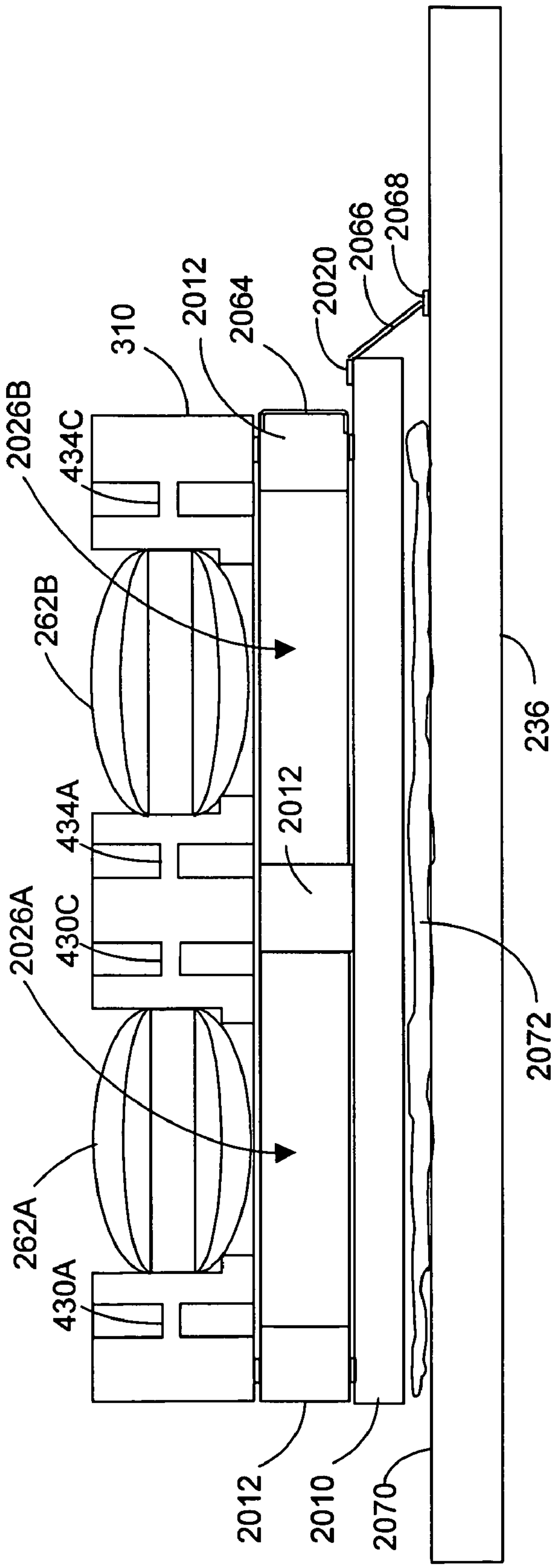
Figure 85B:
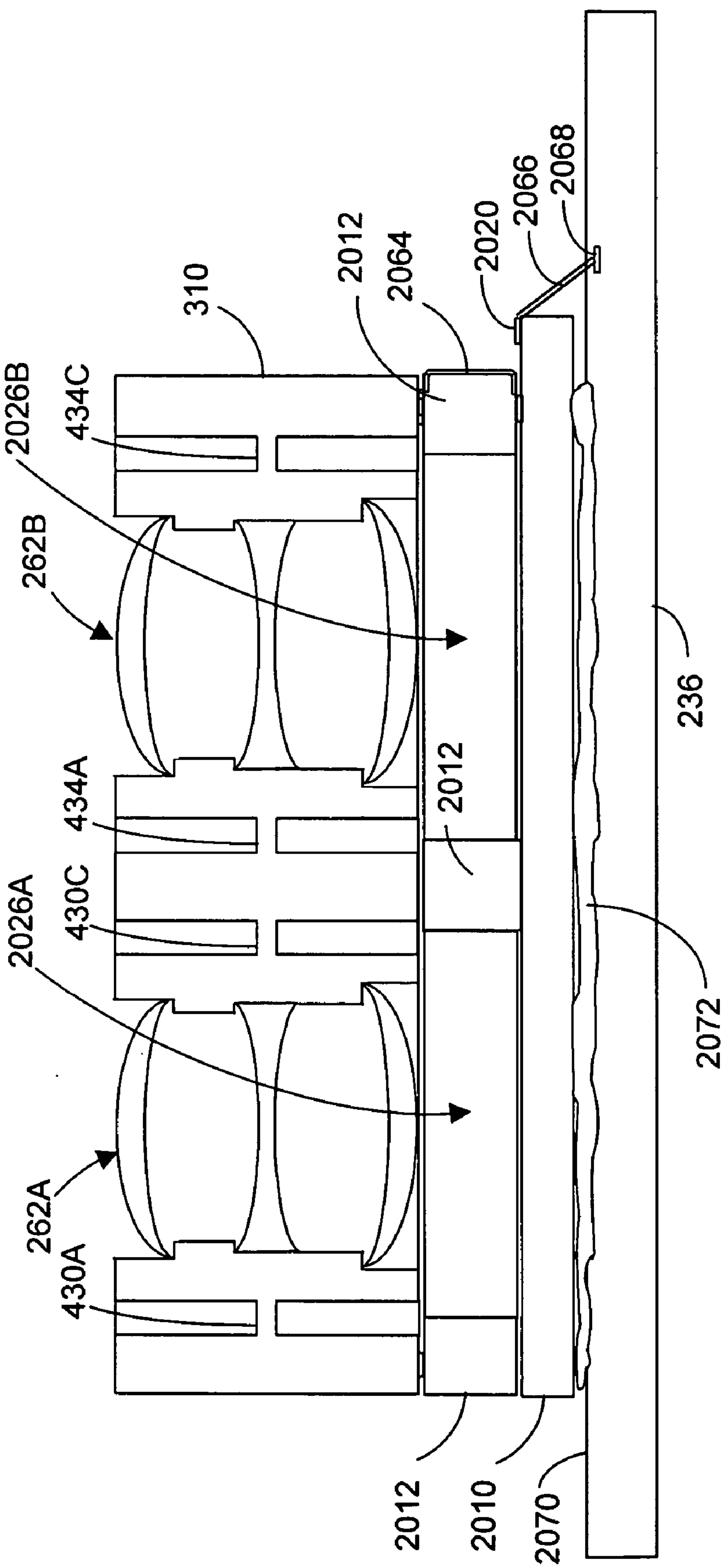
Figure 85C:
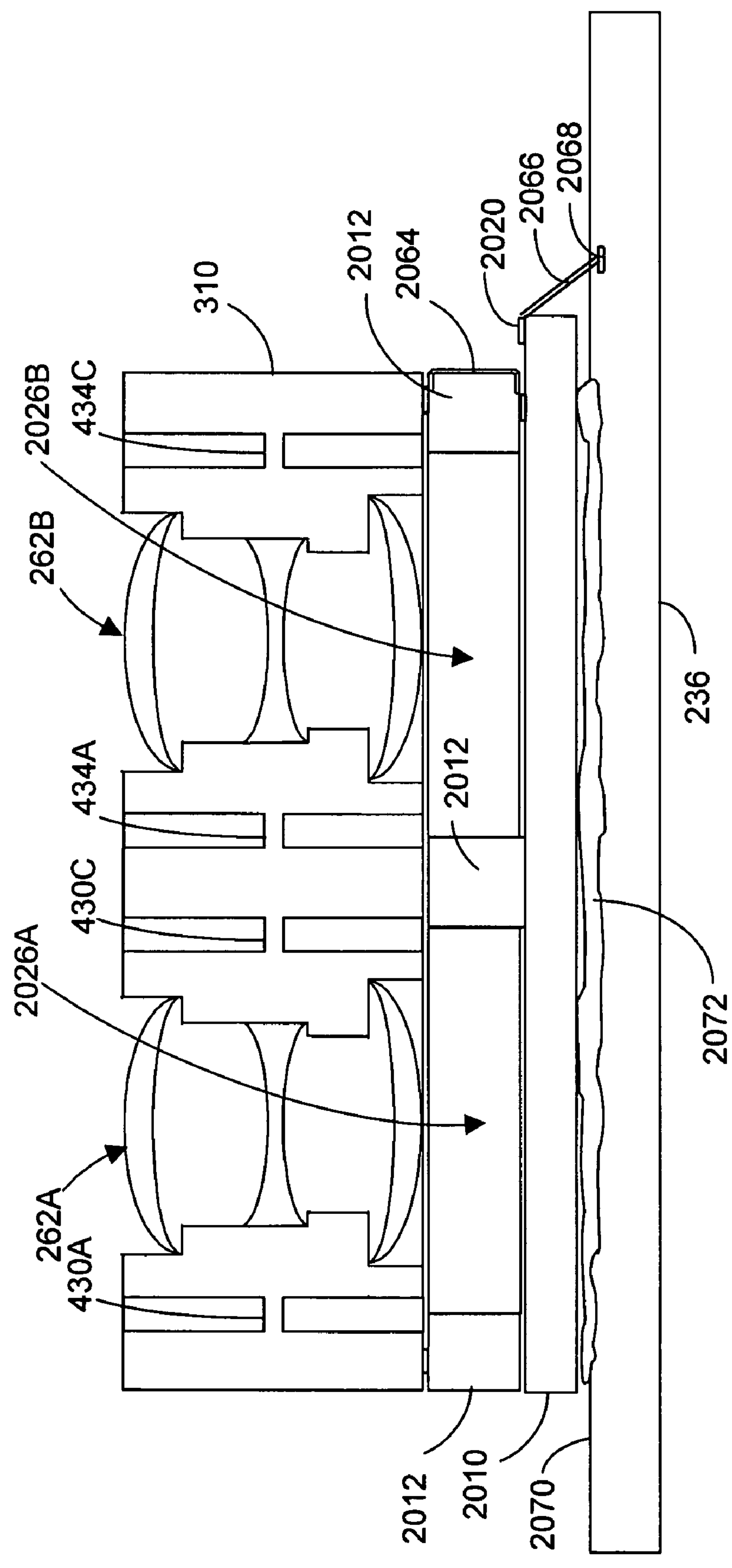
Figure 86A:
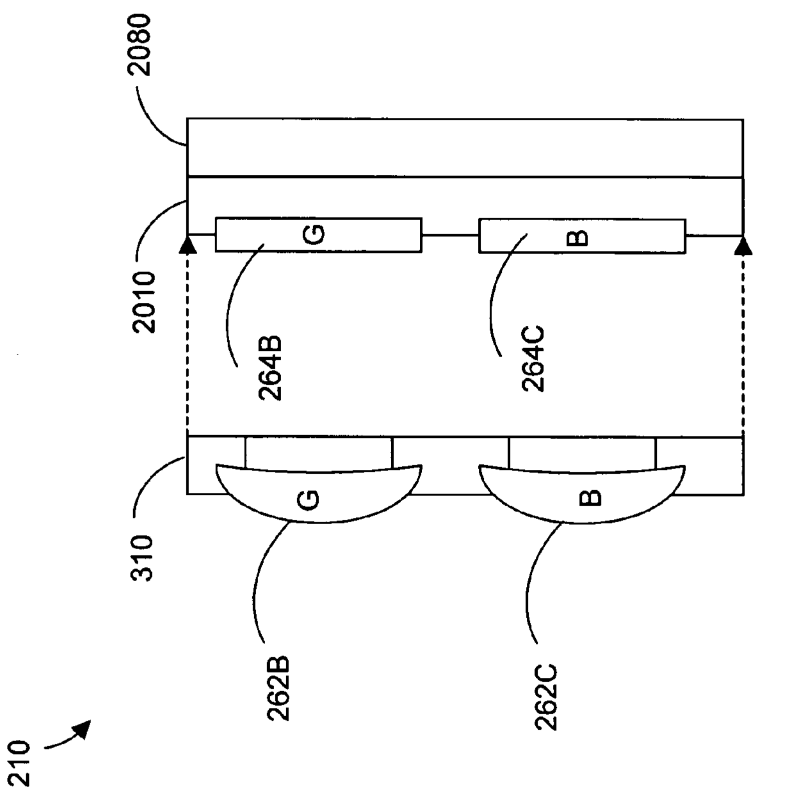
Figure 86B:
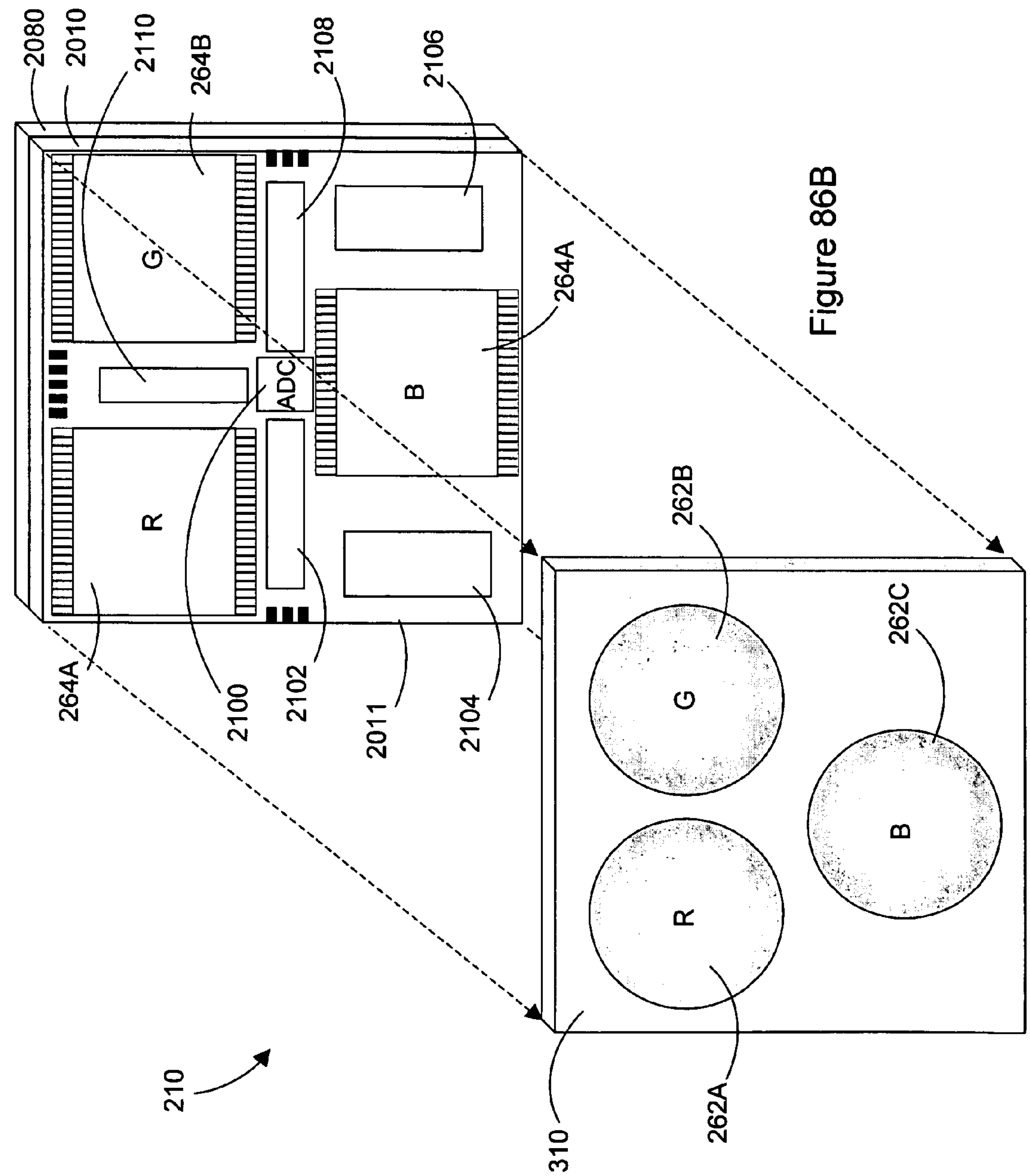
Figure 87A:
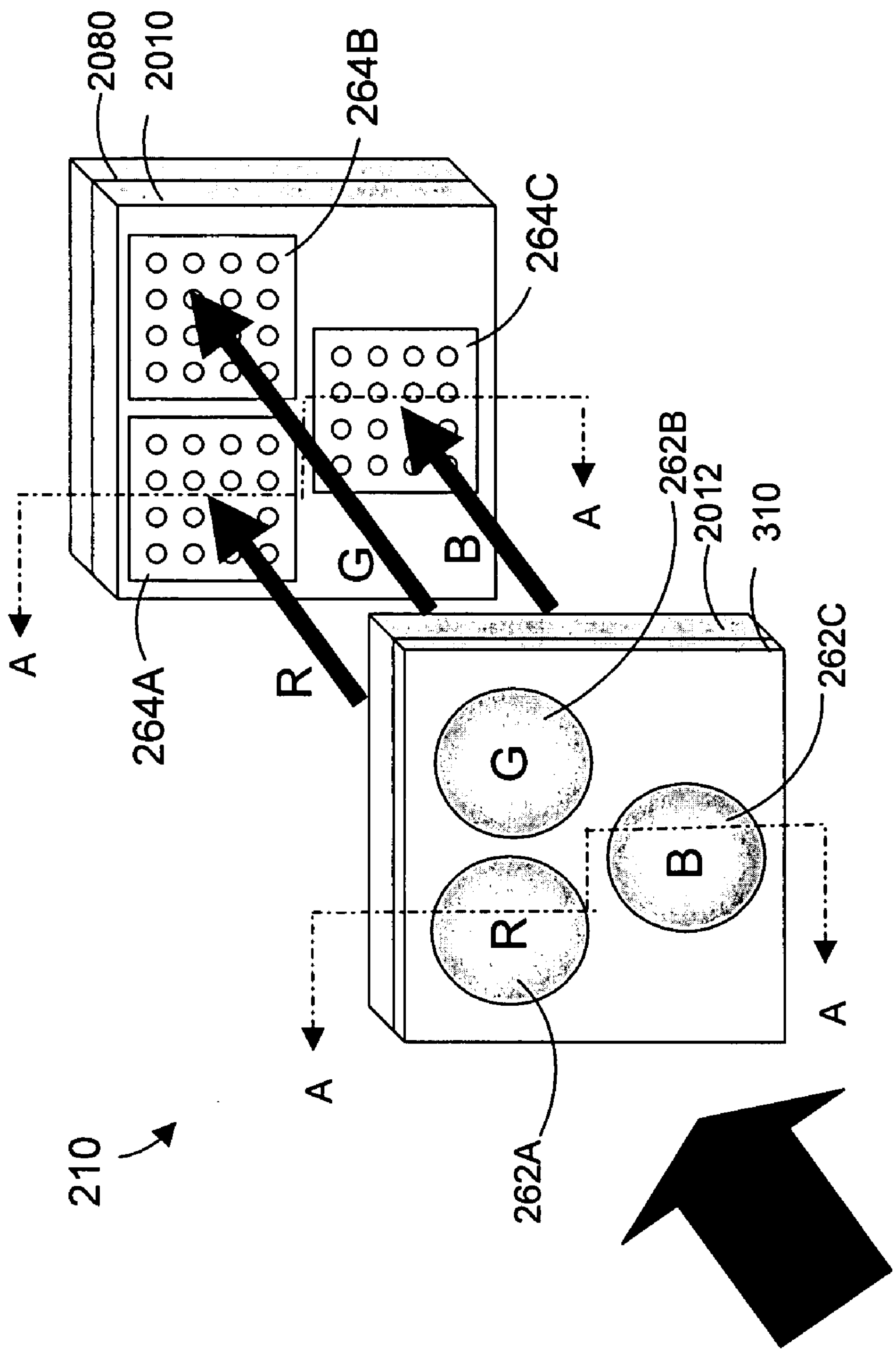
Figure 87B:
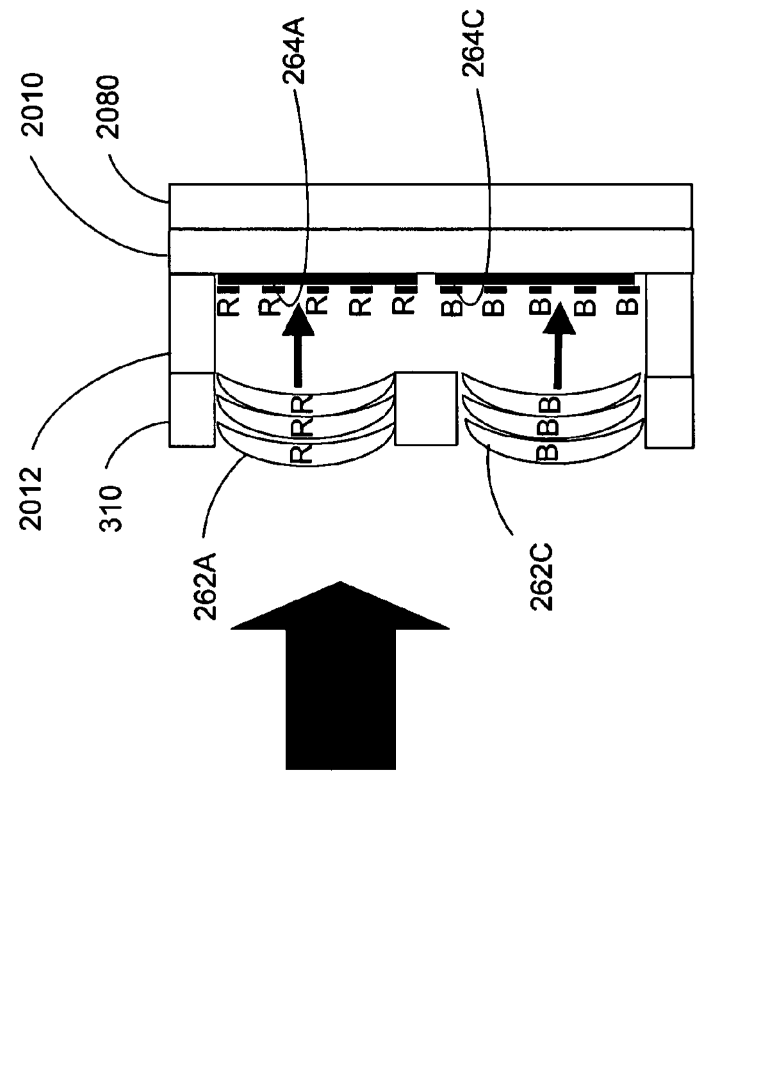
Figure 87C:
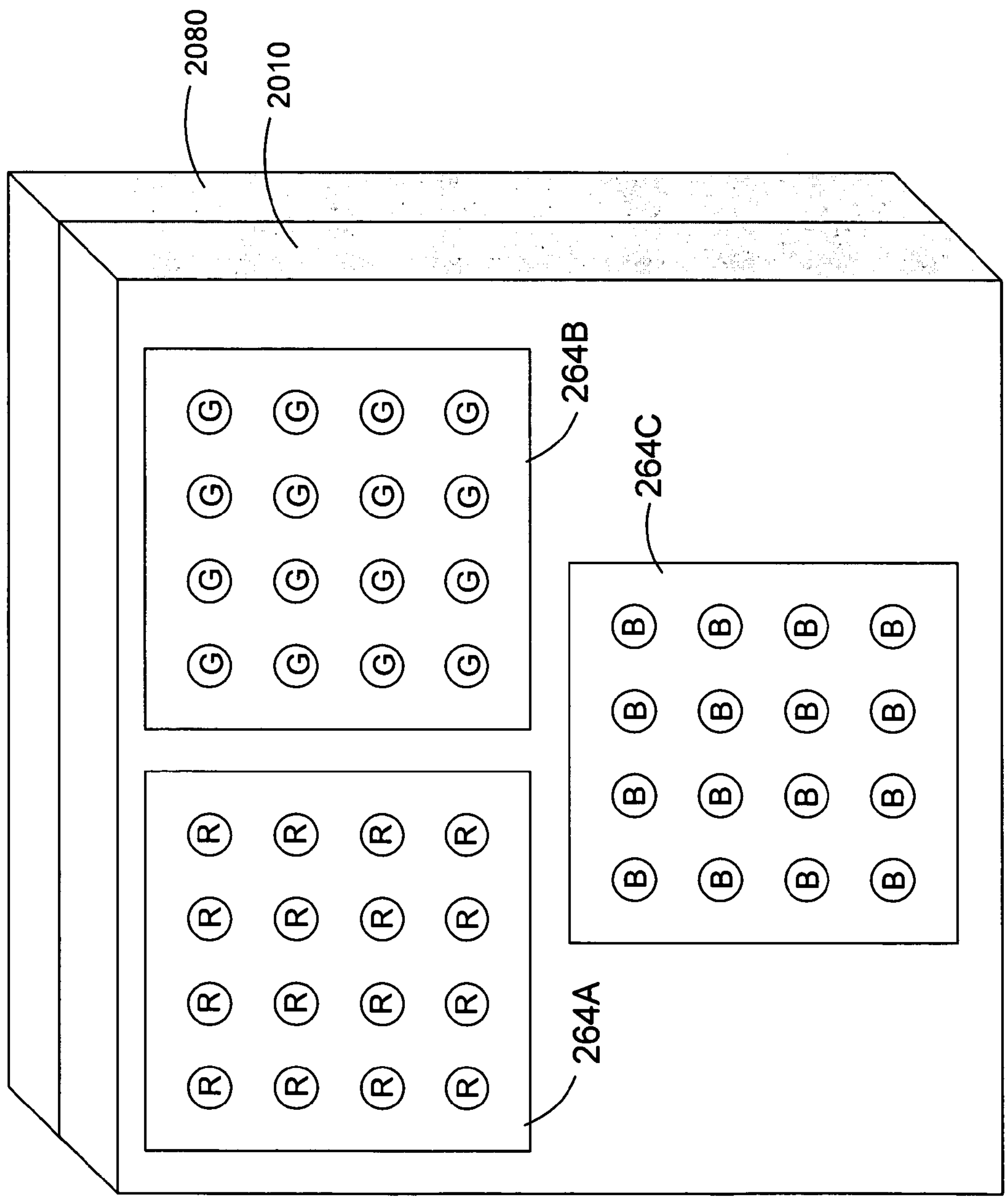
Figure 89:
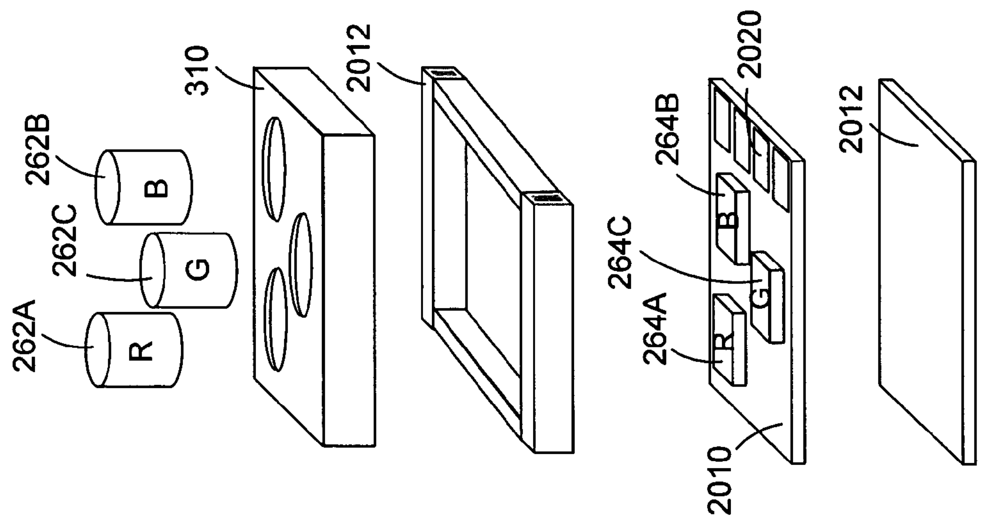
Figure 88:
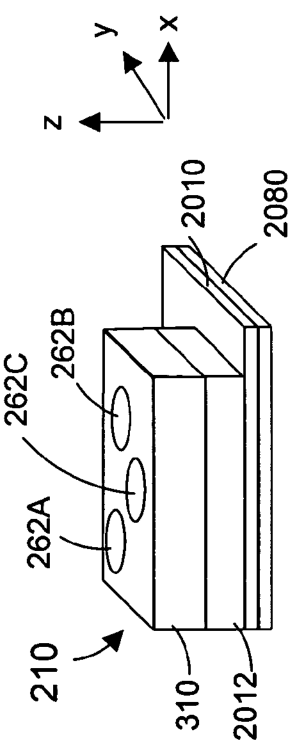
Figure 91:
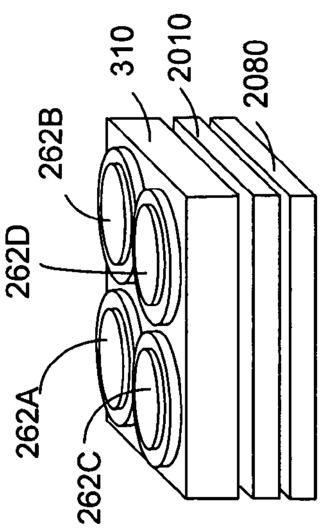
Figure 92A:
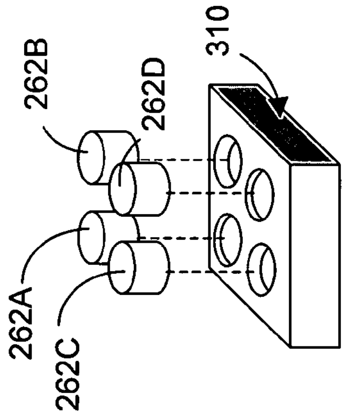
Figure 92B:
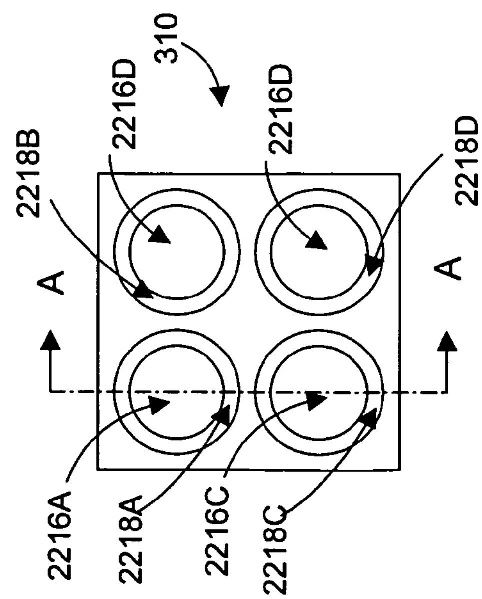
Figure 92C:
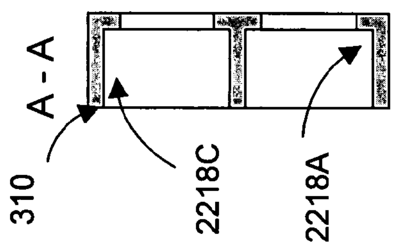
Figure 92D:
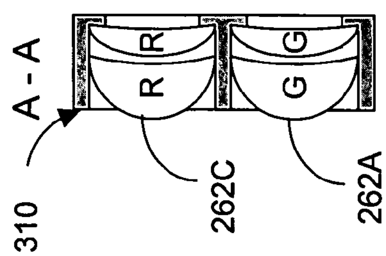
Figure 93:
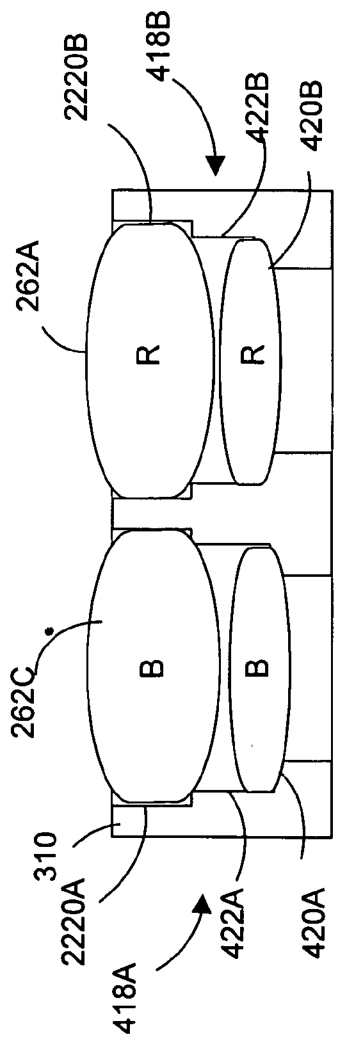
Figure 94:
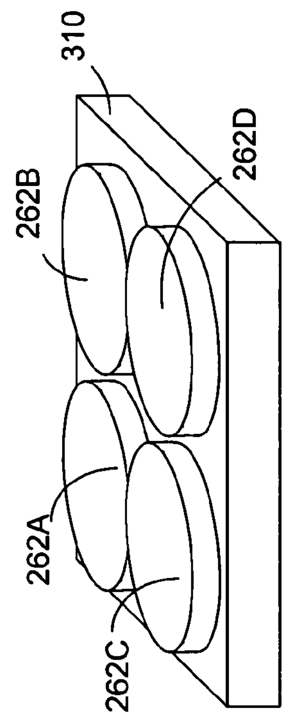
Figure 95B:
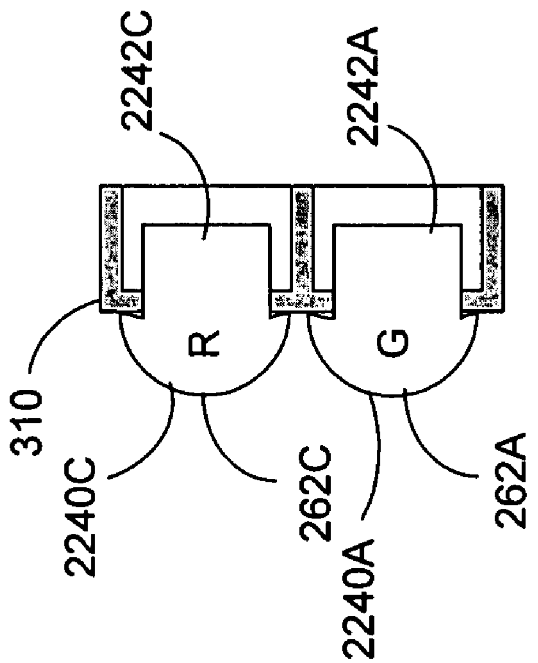
Figure 95A:
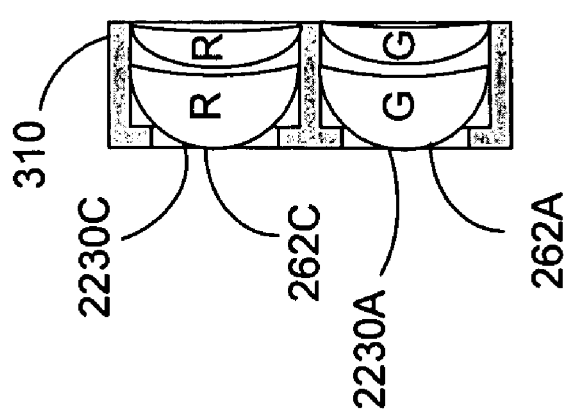
Figure 96:
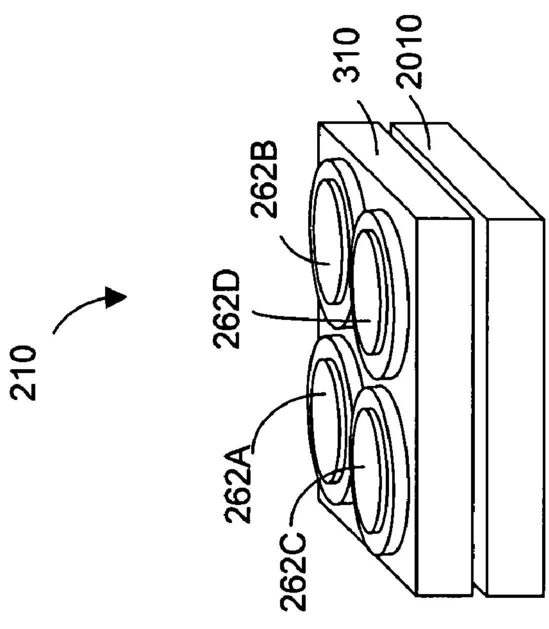
Figure 97:
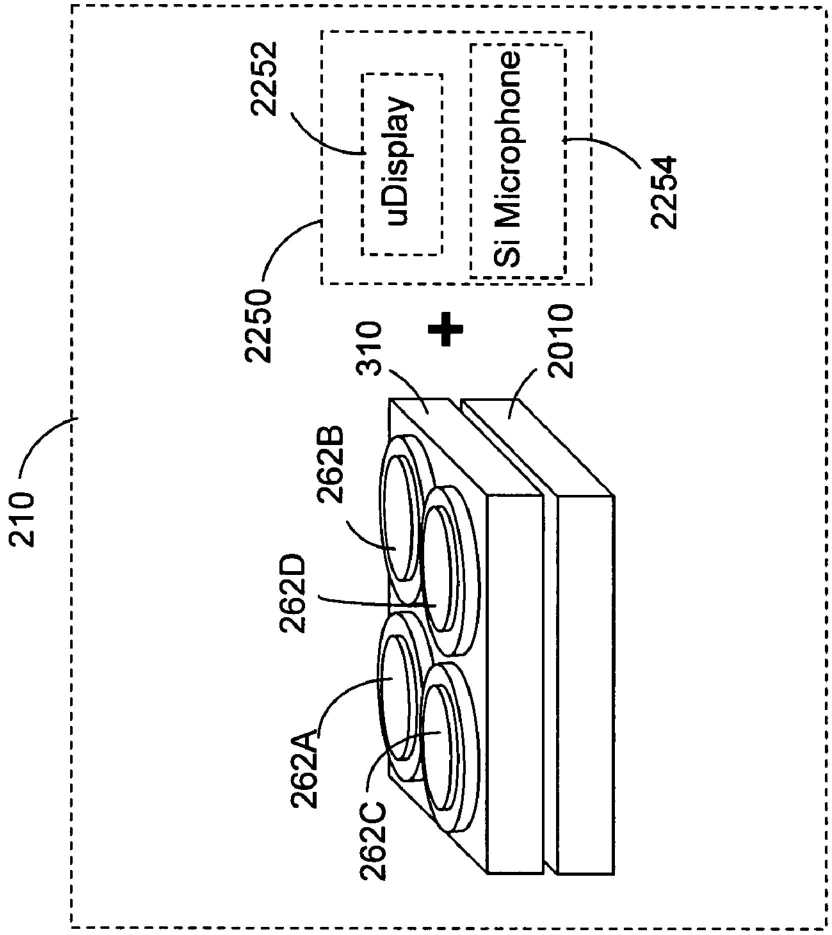
Figure 98:
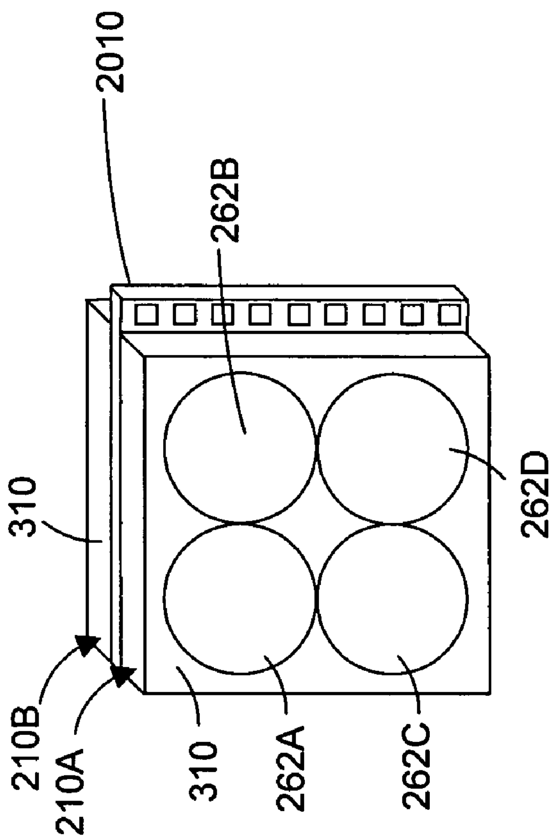
Figure 100:
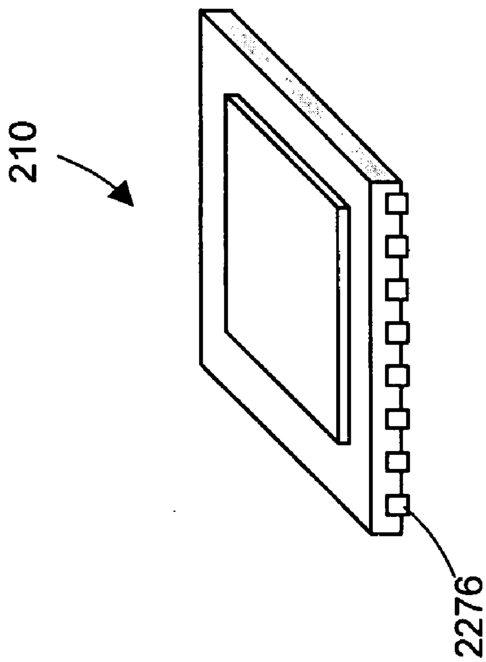
Figure 99:
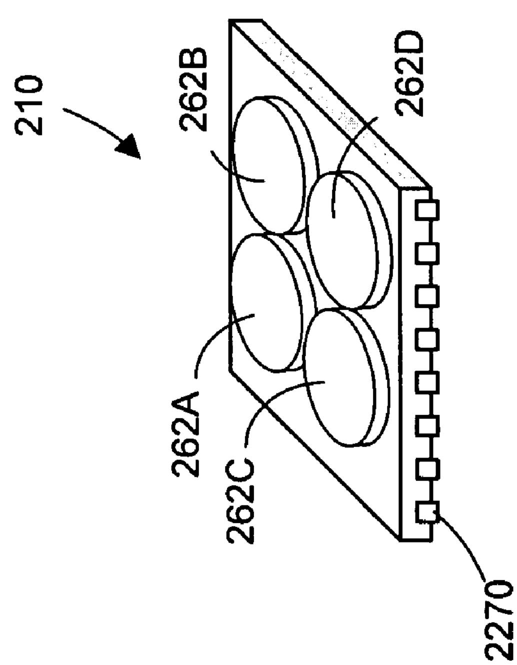
Figure 104A:
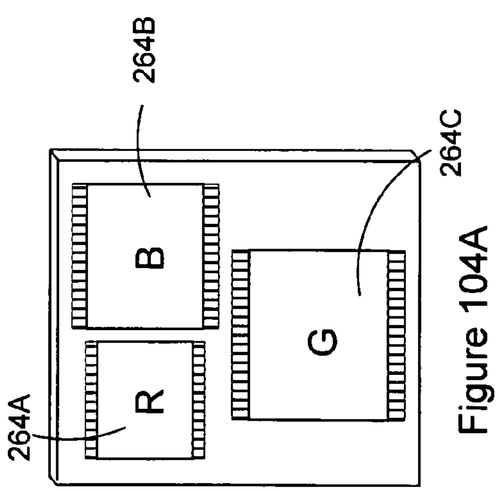
Figure 104B:
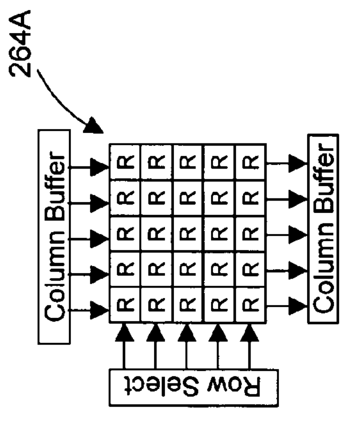
Figure 104C:
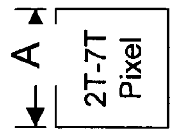
Figure 104D:
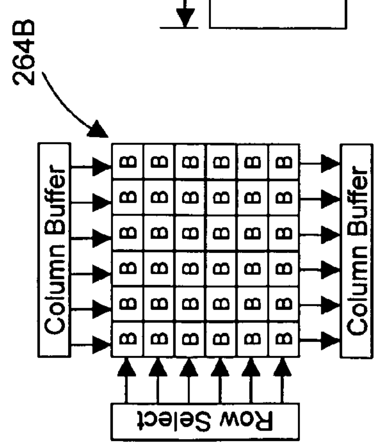
Figure 104E:
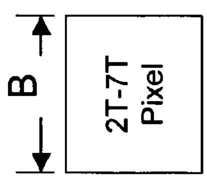
Figure 104F:
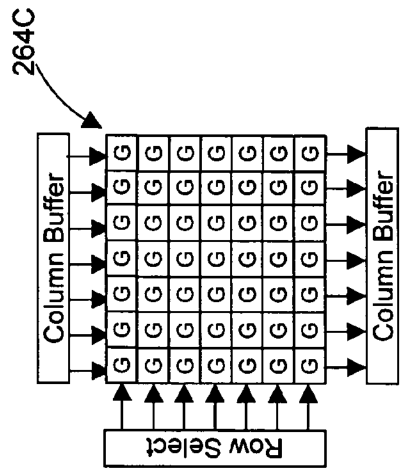
Figure 104G:
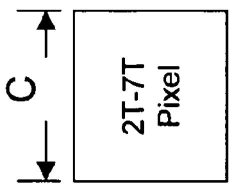
Figure 105A:
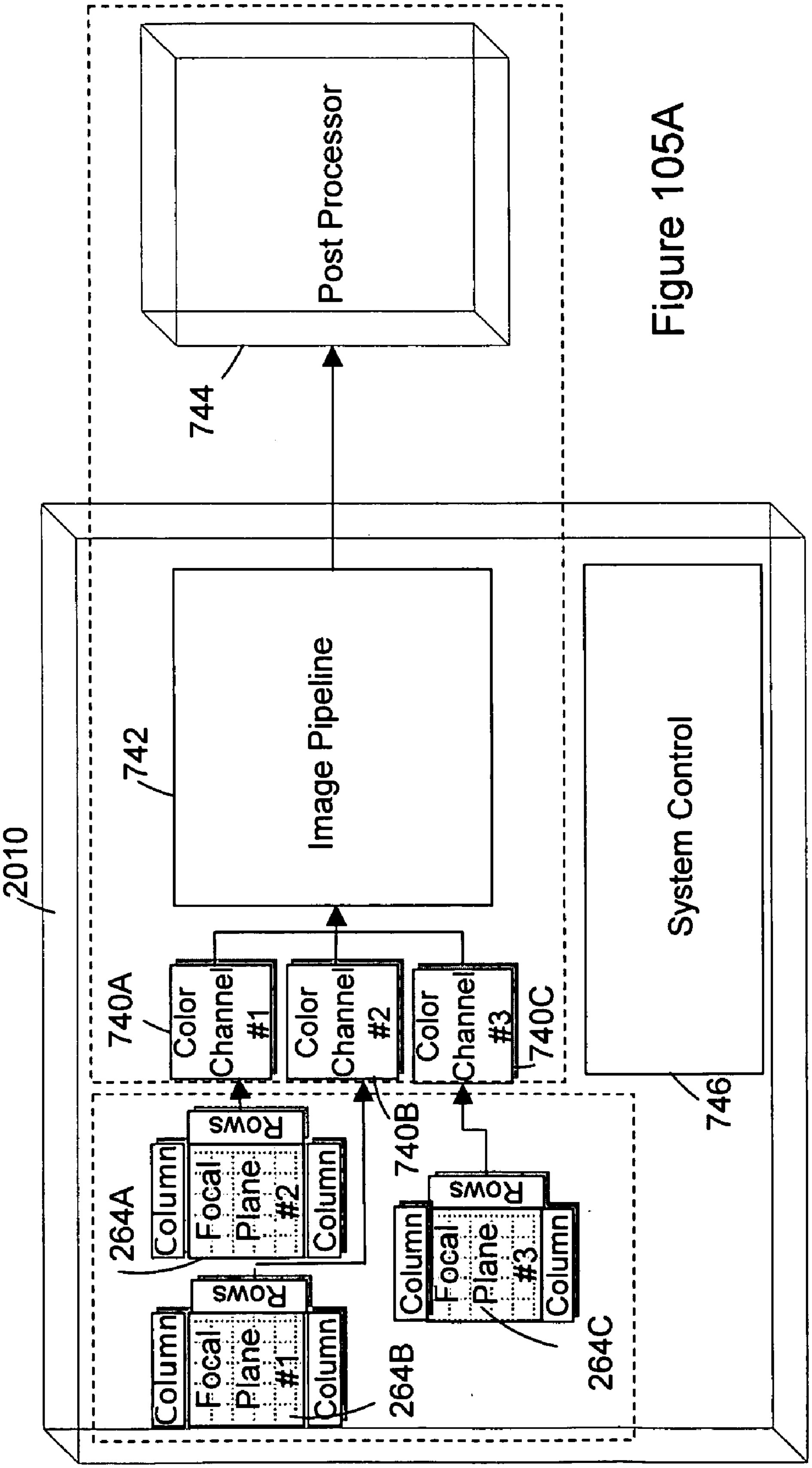
Figure 105C:
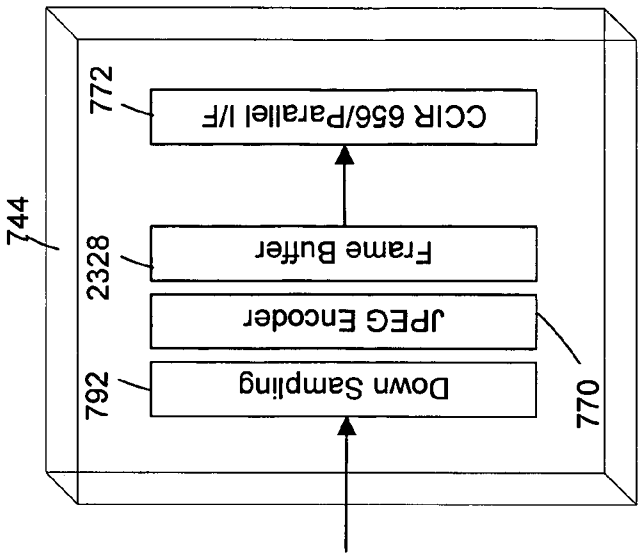
Figure 105B:
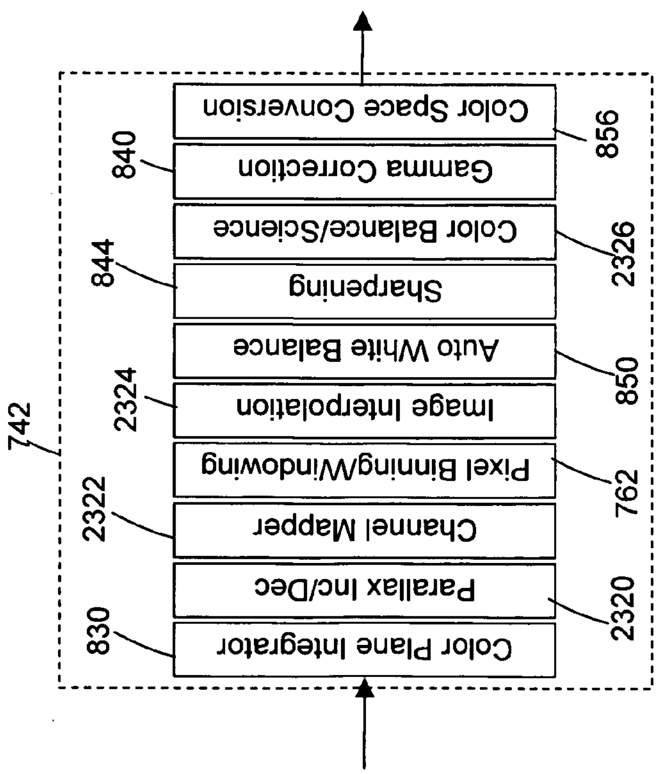
Figure 105D:
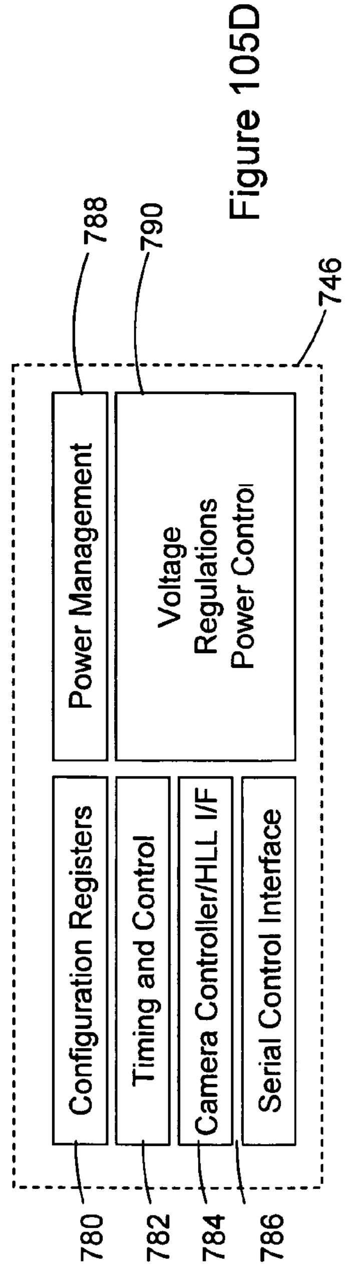
Figure 106:
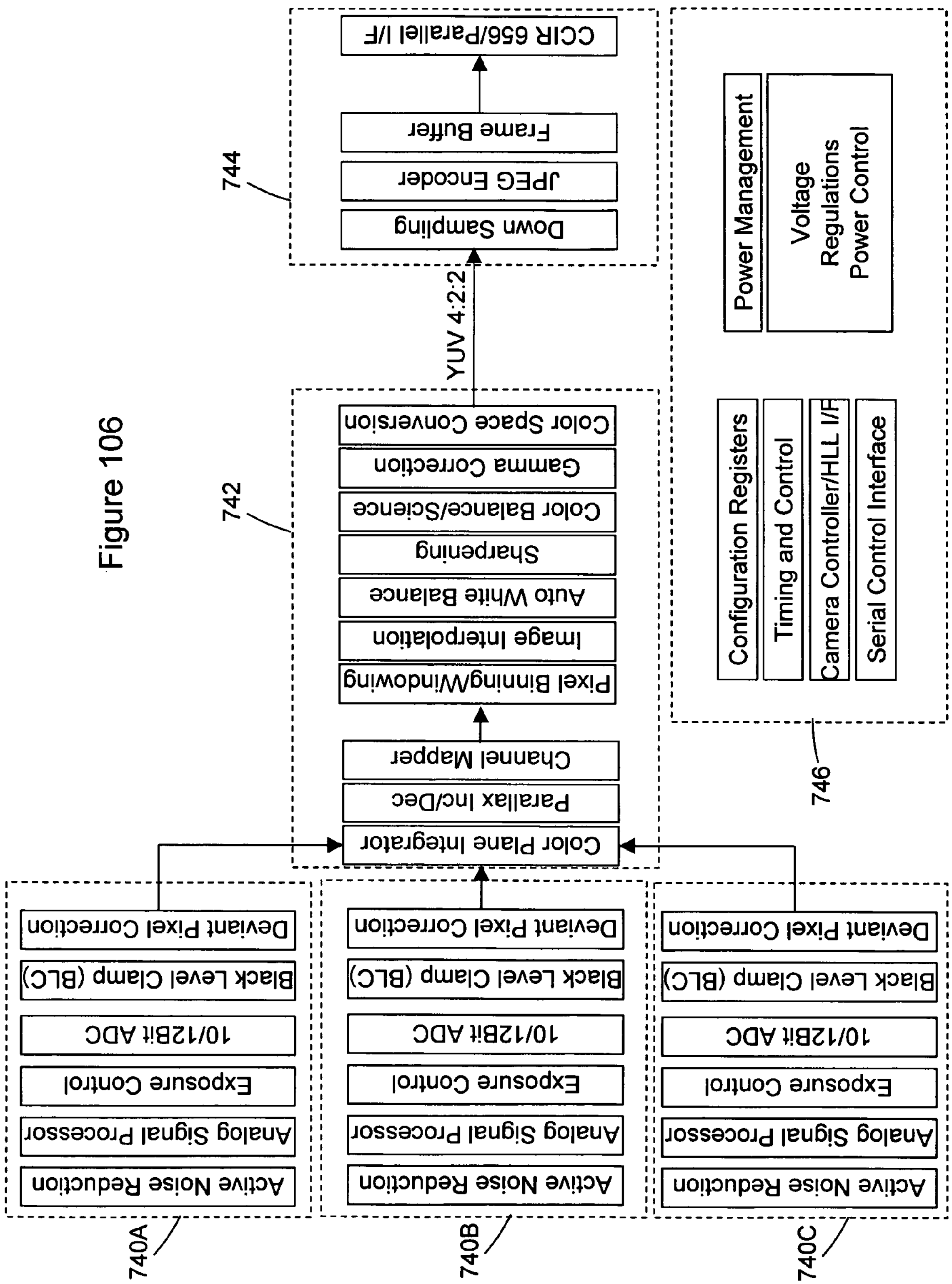
Figure 107A:
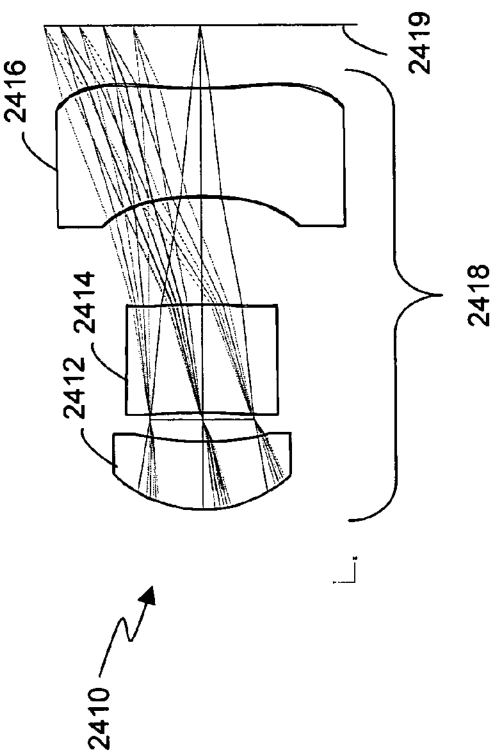
Figure 107B:
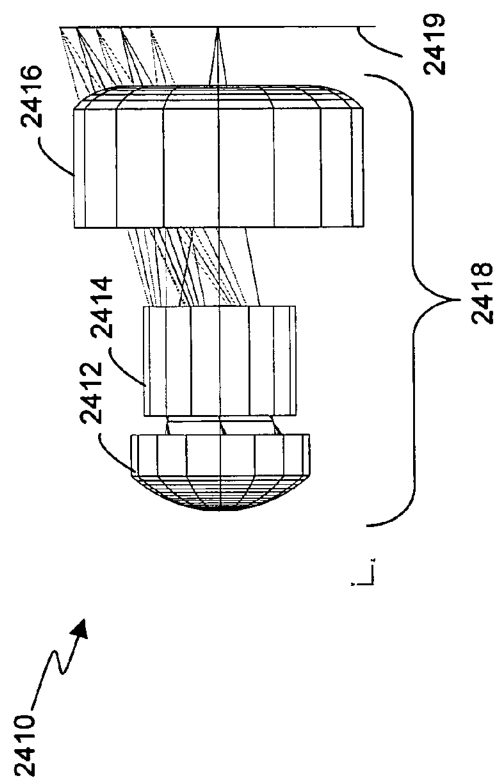
Figure 108A:
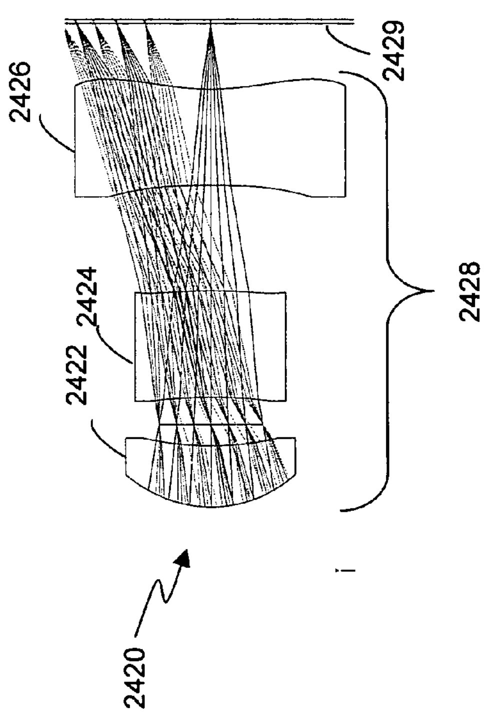
Figure 108B:
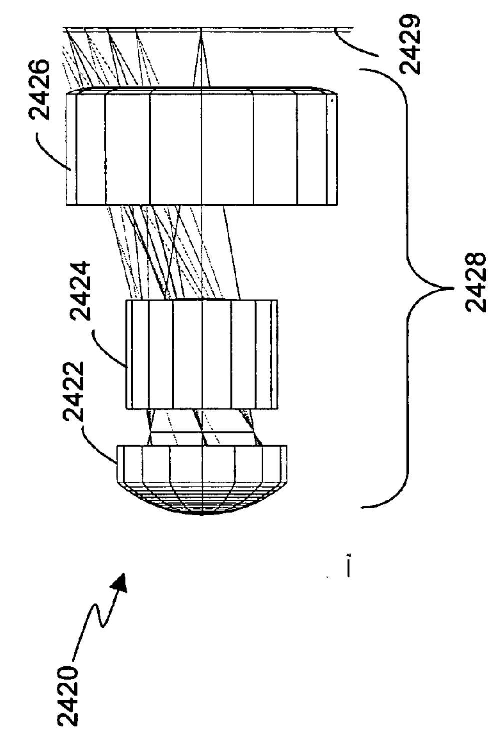
Figure 109A:
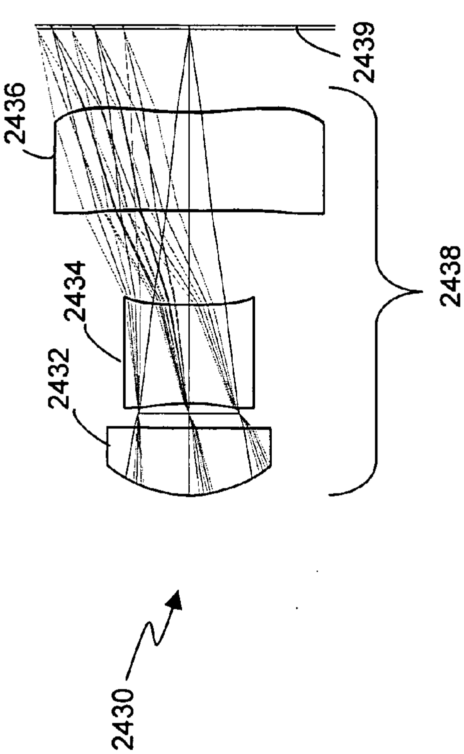
Figure 109B:
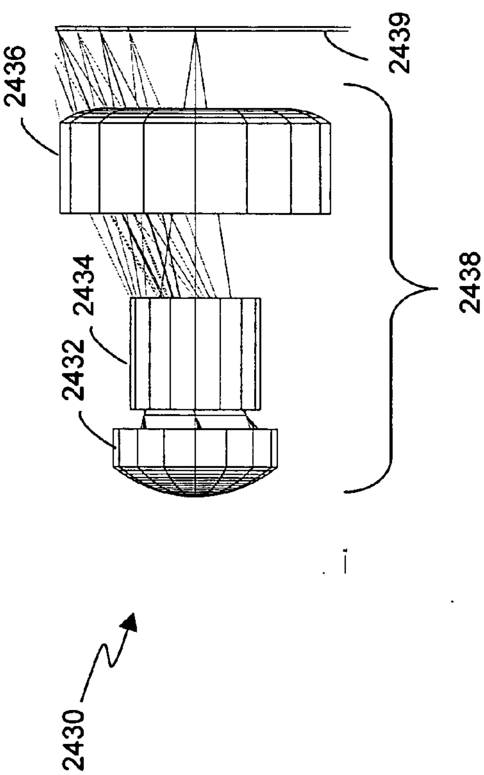

FIG. 83E is a plan view of a side of one embodiment of a first integrated circuit die of the digital camera apparatus of FIG. 83A;

FIG. 83F is a schematic cross section view of one embodiment of a first integrated circuit die of the digital camera apparatus of FIG. 83A;

FIG. 84A is a schematic representation of another embodiment of an optics portion and a portion of another embodiment of a positioner of the digital camera apparatus;

FIG. 84B is a schematic representation view of another embodiment of an optics portion and a portion of another embodiment of a positioner of the digital camera apparatus;

FIG. 84C is a schematic representation view of another embodiment of an optics portion and a portion of another embodiment of a positioner of the digital camera apparatus;

FIG. 85A is a schematic representation of one embodiment of the digital camera apparatus that includes the optics portion and positioner of FIG. 84A;

FIG. 85B is a schematic representation of one embodiment of the digital camera apparatus that includes the optics portion and positioner of FIG. 84B;

FIG. 85C is a schematic representation of one embodiment of the digital camera apparatus that includes the optics portion and positioner of FIG. 84C;

FIGS. 86A-86B are an enlarged schematic representation and an enlarged schematic perspective view, respectively, of one embodiment of a digital camera apparatus having three camera channels;

FIGS. 87A-87B are an enlarged schematic perspective view and an enlarged representation view of another embodiment of a digital camera apparatus having three camera channels;

FIG. 87C is an enlarged schematic perspective view of a portion of the digital camera apparatus of FIGS. 87A-87B;

FIG. 88 is a schematic perspective representation of one embodiment of a digital camera apparatus;

FIG. 89 is a schematic perspective representation of the digital camera apparatus of FIG. 88, in exploded view form;

FIGS. 90A-90H show one embodiment for assembling and mounting one embodiment of the digital camera apparatus of FIG. 4;

FIGS. 90I-90N show one embodiment for assembling and mounting another embodiment of a digital camera apparatus;

FIGS. 90O-90V shows one embodiment for assembling and mounting another embodiment of a digital camera apparatus;

FIG. 91 is a perspective partially exploded representation of another embodiment of a digital camera apparatus;

FIGS. 92A-92D are schematic representations of a portion of another embodiment of a digital camera apparatus;

FIG. 93 is a schematic representation of another embodiment of a positioner and optics portions for a digital camera apparatus;

FIG. 94 a schematic representation of another embodiment of a positioner and optics portions for a digital camera apparatus;

FIG. 95A a schematic representation of another embodiment of a positioner and optics portions for a digital camera apparatus;

FIG. 95B a schematic representation of another embodiment of a positioner and optics portions for a digital camera apparatus;

FIG. 96 is a perspective partially exploded schematic representation of another embodiment a digital camera apparatus;

FIG. 97 is a partially exploded schematic representation of one embodiment of a digital camera apparatus;

FIG. 98 is a schematic representation of a camera system having two digital camera apparatus mounted back to back;

FIG. 99 is a representation of a digital camera apparatus that includes a molded plastic packaging;

FIG. 100 is a representation of a digital camera apparatus that includes a ceramic packaging;

FIGS. 101A-101F and 102A-102D are schematic representations of some other configurations of camera channels that may be employed in the digital camera apparatus of FIG. 4;

FIGS. 103A-103D are schematic representations of some other sensor and processor configurations that may be employed in the digital camera apparatus of FIG. 4;

FIG. 104A is a schematic representation of another configuration of the sensor arrays which may be employed in a digital camera apparatus;

FIG. 104B is a schematic block diagram of one embodiment of the first sensor array, and circuits connected thereto, of FIG. 104A;

FIG. 104C is a schematic representation of a pixel of the sensor array of FIG. 104B;

FIG. 104D is a schematic block diagram of one embodiment of the second sensor array, and circuits connected thereto, of FIG. 104A;

FIG. 104E is a schematic representation of a pixel of the sensor array of FIG. 104D;

FIG. 104F is a schematic block diagram of one embodiment of the third sensor array, and circuits connected thereto, of FIG. 104A;

FIG. 104G is a schematic representation of a pixel of the sensor array of FIG. 104F;

FIGS. 105A-105D are a block diagram representation of one embodiment of an integrated circuit die having three sensor portions and a portion of one embodiment of a processor in conjunction with a post processor portion of the processor coupled thereto;

FIG. 106 is a block diagram of another embodiment of the processor of the digital camera apparatus;

FIGS. 107A-107B are schematic and side elevational views, respectively, of a lens used in an optics portion adapted to transmit red light or a red band of light, e.g., for a red camera channel, in accordance with another embodiment of the present invention;

FIGS. 108A-108B are schematic and side elevational views, respectively, of a lens used in an optics portion adapted to transmit green light or a green band of light, e.g., for a green camera channel, in accordance with another embodiment of the present invention; and FIGS. 109A-109B are schematic and side elevational views, respectively, of a lens used in an optics portion adapted to transmit blue light or a blue band of light, e.g., for a blue camera channel, in accordance with another embodiment of the present invention.

DETAILED DESCRIPTION

Figure 1:
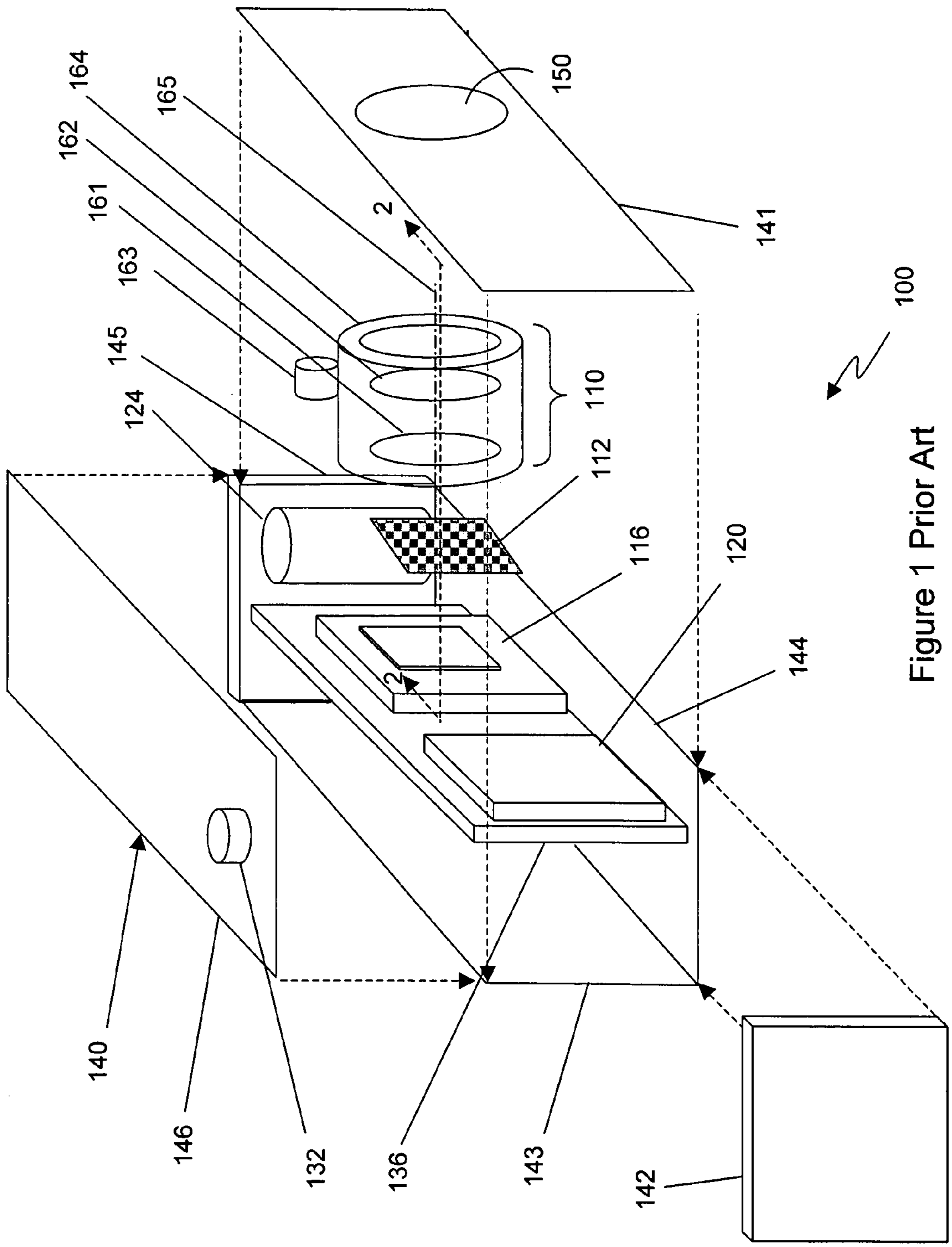
FIG. 1 is a schematic, partially exploded, perspective view of a prior art digital camera.

FIG. 1 shows a prior art digital camera 100 that includes a lens assembly 110, a color filter sheet 112, an image sensor 116, an electronic image storage media 120, a power supply 124, a peripheral user interface (represented as a shutter button) 132, a circuit board 136 (which supports and electrically interconnects the aforementioned components), a housing 140 (including housing portions 141, 142, 143, 144, 145 and 146) and a shutter assembly (not shown), which controls an aperture 150 and passage of light into the digital camera 100. A mechanical frame 164 is used to hold the various parts of the lens assembly 110 together. The lens assembly 110 includes lenses 161, 162 and one or more electro-mechanical devices 163 to move the lenses 161, 162 along a center axis 165. The lenses 161, 162 may be made up of multiple elements bonded together to form an integral optical component. Additional lenses may be employed if necessary. The electro-mechanical device 163 portion of the lens assembly 110 and the mechanical frame 164 portion of the lens assembly 110 may be made up of numerous components and/or complex assemblies.

The color filter 112 sheet has an array of color filters arranged in a Bayer pattern (e.g., a 2×2 matrix of colors with alternating red and green in one row and alternating green and blue in the other row, although other colors may be used). The Bayer pattern is repeated throughout the color filter sheet.

The image sensor 116 contains a plurality of identical photo detectors (sometimes referred to as "picture elements" or "pixels") arranged in a matrix. The number of photo detectors is usually in a range of from hundreds of thousands to millions. The lens assembly 110 spans the diagonal of the array.

Each of the color filters in the color filter sheet 112 is disposed above a respective one of the photo detectors in the image sensor 116, such that each photo detector in the image sensor receives a specific band of visible light (e.g., red, green or blue) and provides a signal indicative of the color intensity thereof. Signal processing circuitry (not shown) receives signals from the photo detectors, processes them, and ultimately outputs a color image.

The lens assembly 110, the color filter sheet 112, the image sensor 116 and the light detection process carried out thereby, of the prior art camera 100, may be the same as the lens assembly 170, the color filter sheet 160, the image sensor 160 and the light detection process carried out thereby, respectively, of the prior art digital camera 1, described and illustrated in FIG. 1A-1D of U.S. Patent Application Publication No. 20060054782 A1 of non-provisional patent application entitled "Apparatus for Multiple Camera Devices and Method of Operating Same", which was filed on Aug. 25, 2005 and assigned Ser. No. 11/212,803 (hereinafter "Apparatus for Multiple Camera Devices and Method of Operating Same" patent application publication). It is expressly noted, that the entire contents of the Apparatus for Multiple Camera Devices and Method of Operating Same patent application publication are incorporated by reference herein.

The peripheral user interface 132, which includes the shutter button, may further include one or more additional input devices (e.g., for settings, controls and/or input of other information), one or more output devices, (e.g., a display for output of images or other information) and associated electronics.

Figure 2B:
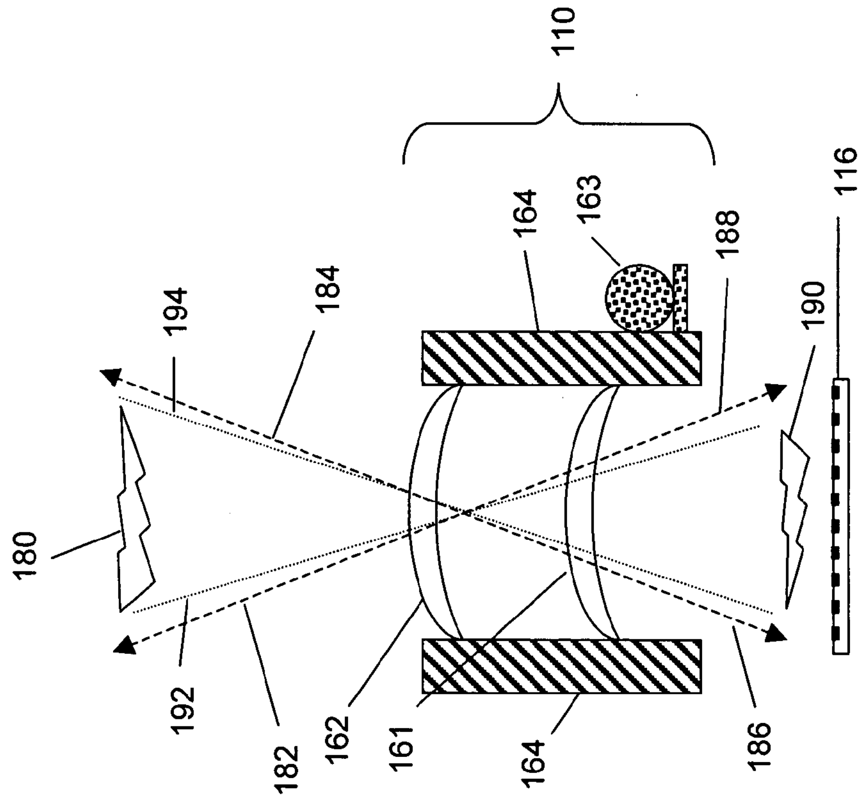
FIG. 2B is a schematic cross sectional view showing the operation of the lens assembly of the prior art camera of FIG. 1, in an optical zoom mode.
Figure 2A:
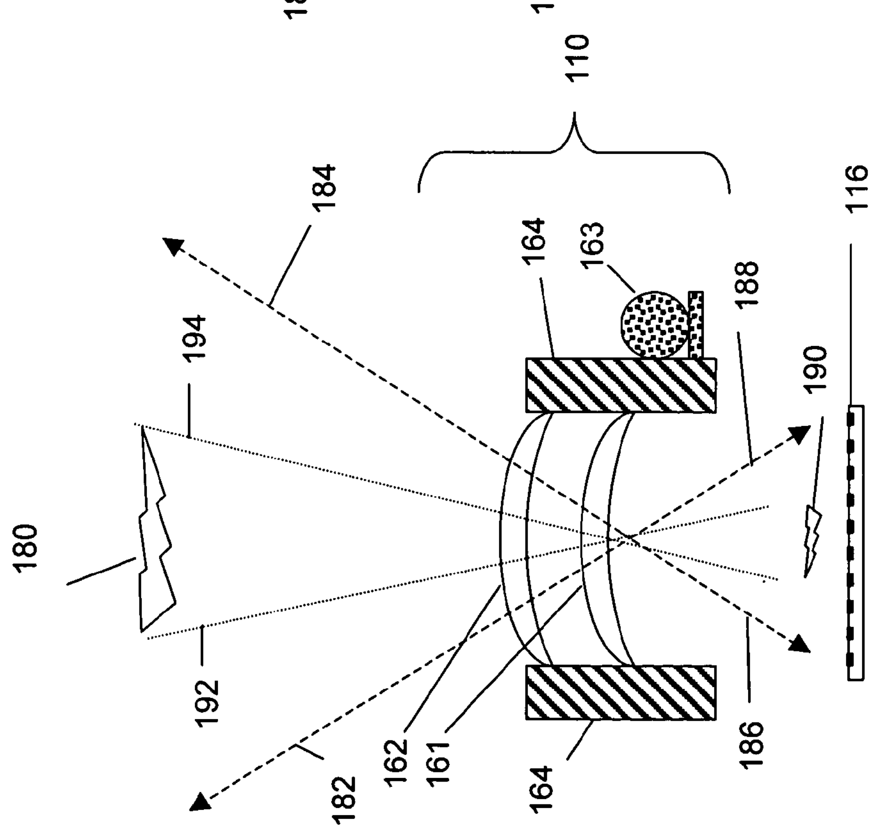
FIG. 2A is a schematic cross sectional view showing the operation of the lens assembly of the prior art camera of FIG. 1, in a retracted mode.

FIG. 2A shows the operation of the lens assembly 110 in a retracted mode (sometimes referred to as normal mode or a near focus setting). The lens assembly 110 is shown focused on a distant object (represented as a lightning bolt) 180. A representation of the image sensor 116 is included for reference purposes. A field of view is defined between reference lines 182, 184. The width of the field of view may be for example, 50 millimeters (mm). To achieve this field of view 182, 184, electro-mechanical devices 163 have positioned lenses 161 and 162 relatively close together. The lens assembly 110 passes the field of view through the lenses 161, 162 and onto the image sensor 116 as indicated by reference lines 186, 188. An image of the object (indicated at 190) is presented onto the image sensor 116 in the same ratio as the width of the actual image 180 relative to the actual field of view 182, 184.

FIG. 2B shows the operation of the lens assembly 110 in a zoom mode (sometimes referred to as a far focus setting). In this mode, the electro-mechanical devices 163 of the lens assembly 110 re-position the lens 161, 162 so as to reduce the field of view 182, 184 over the same image area, thus making the object 180 appear closer (i.e., larger). One benefit of the lens assembly 110 is that the resolution with the lens assembly 110 in zoom mode is typically equal to the resolution with the lens assembly 110 in retracted mode. One drawback, however, is that the lens assembly 110 can be costly and complex. Moreover, providing a lens with zoom capability results in less light sensitivity and thus increases the F-stop of the lens, thereby making the lens less effective in low light conditions.

Further, since the lens must be moved forward and backwards with respect to the image sensor, additional time and power are required. This is another drawback as it creates long delays in capture response time as well as diminished battery capacity.

Some other drawbacks associated with one or more traditional digital cameras are as follows. First, traditional digital cameras, employing one large array on an image sensor, also employ one lens that must span the entire array. That creates two physical size related issues: 1) a lens that spans a large array (e.g. 3 Meg pixels) will be physically larger than a lens that spans a smaller array (e.g., 1 Meg pixels) in both diameter and thickness; and 2) a larger lens/array combination will likely have a longer focal length which will increase the height of the lens.

Also, since the traditional lens must resolve the entire spectrum of visible light wavelengths, they are complex, usually with 3-8 separate elements. This also adds height and cost.

Further, since the traditional lens must pass all bandwidths of color, it must be a clear lens (no color filtering). The needed color filtering previously described is accomplished by depositing a sheet of tiny color filters beneath the lens and on top of the image sensor. For example, an image sensor with one million pixels will require a sheet of one million individual color filters. This technique is costly, presents a limiting factor in shrinking the size of the pixels, plus attenuates the photon stream passing through it (i.e., reduces light sensitivity or dynamic range).

One or more of the above drawbacks associated with traditional digital cameras may be addressed by one or more embodiments of one or more aspects of the present invention.

Figure 3:
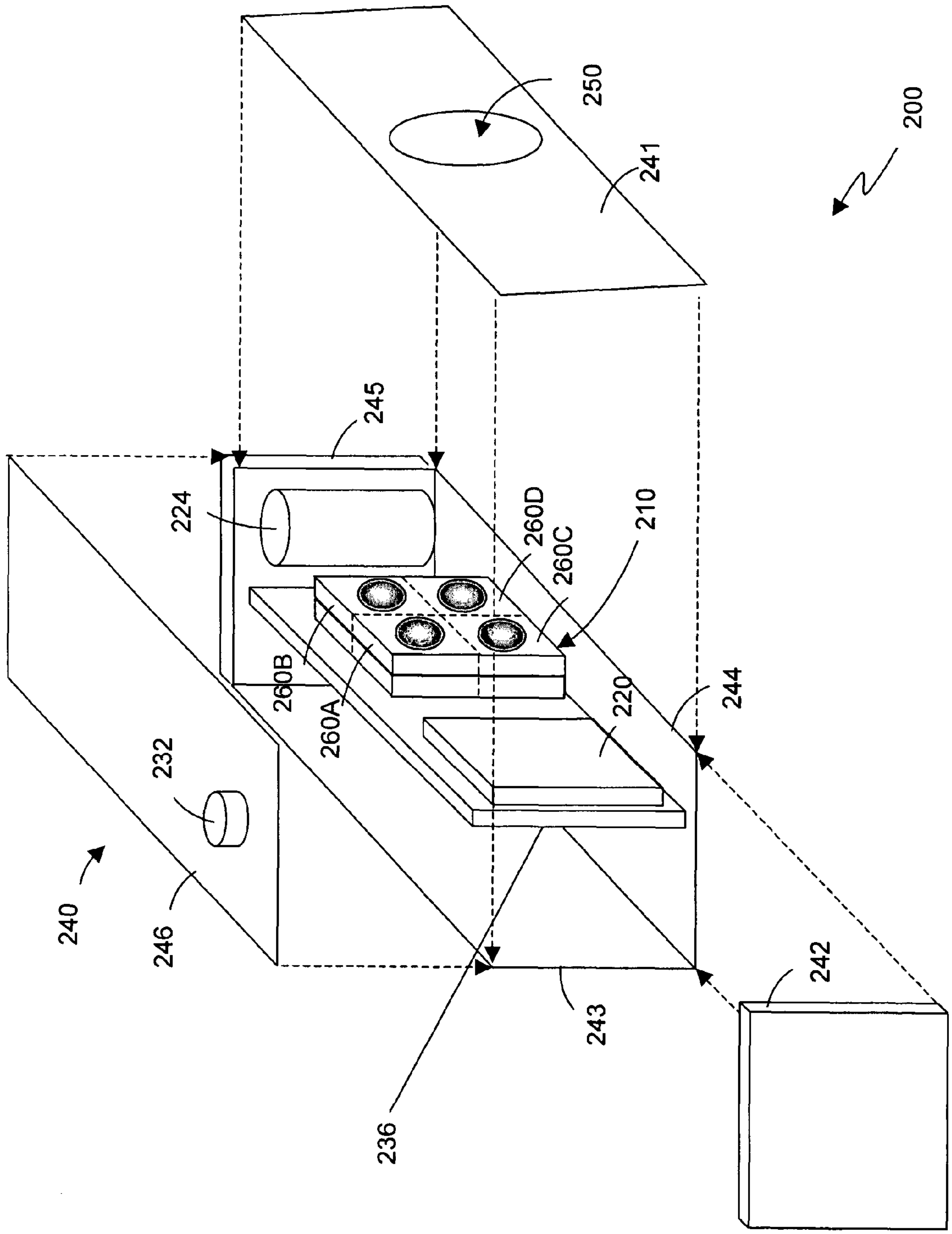
FIG. 3 is a schematic, partially exploded, perspective view of one embodiment of a digital camera, in accordance with certain aspects of the invention.

FIG. 3 shows an example of a digital camera 200 in accordance with one embodiment of certain aspects of the present invention. In this embodiment, the digital camera 200 includes a digital camera apparatus 210, an electronic image storage media 220, a power supply 224, a peripheral user interface (represented as a shutter button) 232, a circuit board 236 (which supports and electrically interconnects the aforementioned components), a housing 240 (including housing portions 241, 242, 243, 244, 245 and 246) and a shutter assembly (not shown), which controls an aperture 250 and passage of light into the digital camera 200.

The digital camera apparatus 210 includes one or more camera channels, e.g., four camera channels 260A-260D, and replaces (and/or fulfills one, some or all of the roles fulfilled by) the lens assembly 110, the color filter 112 and the image sensor 116 of the digital camera 100 described above.

The peripheral user interface 232, which includes the shutter button, may further include one or more additional input devices (e.g., for settings, controls and/or input of other information), one or more output devices, (e.g., a display for output of images or other information) and associated electronics.

The electronic image storage media 220, power supply 224, peripheral user interface 232, circuit board 236, housing 240, shutter assembly (not shown), and aperture 250, may be, for example, similar to the electronic image storage media 120, power supply 124, peripheral user interface 132, circuit board 136, housing 140, shutter assembly (not shown), and aperture 150 of the digital camera 100 described above.

FIG. 4 shows one embodiment of the digital camera apparatus 210, which as stated above, includes one or more camera channels (e.g., four camera channels 260A-260D). Each of the camera channels 260A-260D includes an optics portion (sometimes referred to hereinafter as optics) and a sensor portion (sometimes referred to hereinafter as a sensor). For example, camera channel 260A includes an optics portion 262A and a sensor portion 264A. Camera channel B includes an optics portion 262B and a sensor portion 264B. Camera channel C includes an optics portion 262C and a sensor portion 264C. Camera channel D includes an optics portion 262D and a sensor portion 264D. The optics portions of the one or more camera channels are collectively referred to herein as an optics subsystem. The sensor portions of the one or more camera channels are collectively referred to herein as a sensor subsystem.

If the digital camera apparatus 210 includes more than one camera channel, the channels may or may not be identical to one another. For example, in some embodiments, the camera channels are identical to one another. In some other embodiments, one or more of the camera channels are different, in one or more respects, from one or more of the other camera channels. In some of the latter embodiments, each camera channel may be used to detect a different color (or band of colors) and/or band of light than that detected by the other camera channels. For example, in some embodiments, one of the camera channels, e.g., camera channel 260A, detects red light, one of the camera channels, e.g., camera channel 260B, detects green light, one of the camera channels, e.g., camera channel 260C detects blue light. In some embodiments, another one of the camera channels, e.g., camera channel 260D, detects infrared light.

The digital camera system 210 further includes a processor 265 and a positioning system 280. The processor 265 includes an image processor portion 270 (hereafter image processor 270) and a controller portion 300 (hereafter controller 300). As described below, the controller portion 300 is also part of the positioning system 280.

The image processor 270 is connected to the one or more sensor portions, e.g., sensor portions 264A-264D, via one or more communication links, represented by a signal line 330.

A communication link may be any kind of communication link including but not limited to, for example, wired (e.g., conductors, fiber optic cables) or wireless (e.g., acoustic links, electromagnetic links or any combination thereof including but not limited to microwave links, satellite links, infrared links), and combinations thereof, each of which may be public or private, dedicated and/or shared (e.g., a network). A communication link may employ for example circuit switching or packet switching or combinations thereof. Other examples of communication links include dedicated point-to-point systems, wired networks, and cellular telephone systems. A communication link may employ any protocol or combination of protocols including but not limited to the Internet Protocol. The communication link may transmit any type of information. The information may have any form, including, for example, but not limited to, analog and/or digital (a sequence of binary values, i.e. a bit string). The information may or may not be divided into blocks. If divided into blocks, the amount of information in a block may be predetermined (e.g., specified and/or agreed upon in advance) or determined dynamically, and may be fixed (e.g., uniform) or variable.

The positioning system 280 includes the controller 300 and one or more positioners, e.g., positioners 310, 320. The controller 300 is connected (e.g., electrically connected) to the image processor 270 via one or more communication links, represented by a signal line 332. The controller 300 is connected (e.g., electrically connected) to the one or more positioners, e.g., positioners 310, 320, via one or more communication links (for example, but not limited to, a plurality of signal lines) represented by signal lines 334, 336.

The one or more positioners, e.g., positioners 310, 320, are supports that are adapted to support and/or position each of the one or more optics portions, e.g., optics portions 262A-262D, above and/or in registration with a respective one of the one or more sensor portions, e.g., sensor portions 264A-264D. In this embodiment, for example, the positioner 310 supports and positions the one or more optics portions e.g., optics portions 262A-262D, at least in part. The positioner 320 supports and positions the one or more sensor portions, e.g., sensor portions 264A-264D, at least in part.

One or more of the positioners 310, 320 may also be adapted to provide or help provide relative movement between one or more of the optics portions 262A-262D and one or more of the respective sensor portions 264A-264D. In that regard, and as will be further described below, one or more of the positioners 310, 320 may include one or more actuators to provide or help provide movement of one or more of the optics portions and/or one or more of the sensor portions. In some embodiments, one or more of the positioners 310, 320 include one or more position sensors to be used in providing one or more movements.

The positioner 310 may be affixed, directly or indirectly, to the positioner 320. Thus, for example, the positioner 310 may be affixed directly to the positioner 320 (e.g., using adhesive) or the positioner 310 may be affixed to a support (not shown) that is, in turn, affixed to the positioner 320.

The size of the positioner 310 may be, for example, approximately the same size (in one or more dimensions) as the positioner 320, approximately the same size (in one or more dimensions) as the arrangement of the optics portions 262A-262D and/or approximately the same size (in one or more dimensions) as the arrangement of the sensor portions 264A-264D. One advantage of such dimensioning is that it helps keep the dimensions of the digital camera apparatus as small as possible.

The positioners 310, 320 may comprise any type of material(s) and may have any configuration and/or construction. For example, the positioner 310 may comprise silicon, glass, plastic, or metallic materials and/or any combination thereof. The positioner 320 may comprise, for example, silicon, glass, plastic or metallic materials and/or any combination thereof. Further, each of the positioners 310, 320 may comprise one or more portions that are fabricated separate from one another, integral with one another and/or any combination thereof.

The operation of the digital camera apparatus is as follows. An optics portion of a camera channel receives light from within a field of view and transmits one or more portions of such light. The sensor portion receives one or more portion of the light transmitted by the optics portion and provides an output signal indicative thereof. The output signal from the sensor portion is supplied to the image processor, which as is further described below, may generate an image based thereon, at least in part. If the digital camera system includes more than one camera channels, the image processor may generate a combined image based on the images from two or more of the camera channels, at least in part. For example, in some embodiments, each of the camera channels is dedicated to a different color (or band of colors) or wavelength (or band of wavelengths) than the other camera channels and the image processor combines the images from the two or more camera channels to provide a full color image.

The positioning system may provide movement of the optics portion (or portions thereof) and/or the sensor portion (or portions thereof) to provide a relative positioning desired there between with respect to one or operating modes of the digital camera system. As further described below, relative movement between an optics portion (or one or more portions thereof) and a sensor portion (or one or more portions thereof), including, for example, but not limited to relative movement in the x and/or y direction, z direction, tilting, rotation (e.g., rotation of less than, greater than and/or equal to 360 degrees) and/or combinations thereof, may be used in providing various features and/or in the various applications disclosed herein, including, for example, but not limited to, increasing resolution (e.g., increasing detail), zoom, 3D enhancement, image stabilization, image alignment, lens alignment, masking, image discrimination, auto focus, mechanical shutter, mechanical iris, hyperspectral imaging, a snapshot mode, range finding and/or combinations thereof. As further described herein, such movement may be provided, for example using actuators, e.g., MEMS actuators, and by applying appropriate control signal(s) to one or more of the actuators to cause the one or more actuators to move, expand and/or contract to thereby move the optics portion (or portions thereof) and/or the sensor portion (or portions thereof).

In some embodiments, the x direction and/or the y direction are parallel to a sensor plane and/or an image plane. Thus, in some embodiments, the movement includes movement in a direction parallel to a sensor plane and/or an image plane. In some embodiments, the z direction is perpendicular to a sensor plane and/or an image plane. Thus, in some embodiments, the movement includes movement in a direction perpendicular to a sensor plane and/or an image plane. In some embodiments, the x direction and/or the y direction are parallel to rows and/or columns in a sensor array. Thus, in some embodiments, the movement includes movement in a direction parallel to a row of sensor elements in a sensor array and/or movement in a direction parallel to a column of sensor elements in a sensor array. In some embodiments, neither the x direction nor the y direction are parallel to a sensor plane and/or an image plane. Thus, in some embodiments, the movement includes movement in a direction oblique to a sensor plane and/or an image plane.

Other embodiments of a camera channel, or portions thereof, are disclosed and/or illustrated in the Apparatus for Multiple Camera Devices and Method of Operating Same patent application publication.

Thus, for example, one or more portions of one or more embodiments of the digital camera apparatus disclosed in the Apparatus for Multiple Camera Devices and Methods of Operating Same patent application publication may be employed in a digital camera apparatus 210 having one or more actuators, e.g., e.g., actuator 430A-430D, 434A-434D, 438A-438D, 442A-442D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), for example, to move one or more portions of one or more optics portion and/or to move one or more portions of one or more sensor portions. In addition, in some embodiments, for example, one or more actuators, e.g., e.g., actuator 430A-430D, 434A-434D, 438A-438D, 442A-442D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), may be employed in one or more embodiments of the digital camera apparatus 300 disclosed in the Apparatus for Multiple Camera Devices and Method of Operating Same patent application publication, for example, to move one or more portions of one or more optics portion and/or to move one or more portions of one or more sensor portions.

In some embodiments, one or more of the one or more camera channels, e.g., camera channels 260A-260D, or portions thereof, are the same as or similar to one or more embodiments of one or more of the one or more camera channels, e.g., camera channels 350A-350D, or portions thereof, of the digital camera apparatus 300, described and/or illustrated in the Apparatus for Multiple Camera Devices and Method of Operating Same patent application publication.

In some embodiments, one or more portions of the camera channels 260A-260D are the same as or similar to one or more portions of one or more embodiments of the digital camera apparatus 200 described and/or illustrated in the Apparatus for Multiple Camera Devices and Method of Operating Same patent application publication.

For the sake of brevity, the structures and/or methods described and/or illustrated in the Apparatus for Multiple Camera Devices and Method of Operating Same patent application publication will not be repeated. It is expressly noted, however, that the entire contents of the Apparatus for Multiple Camera Devices and Method of Operating Same patent application publication, including, for example, the features, attributes, alternatives, materials, techniques and advantages of all of the inventions, are incorporated by reference herein, although, unless stated otherwise, the aspects and/or embodiments of the present invention are not limited to such features, attributes alternatives, materials, techniques and advantages.

As stated above, if the digital camera apparatus 210 includes more than one camera channel, the channels may or may not be identical to one another. For example, in some embodiments, the camera channels are identical to one another. In some other embodiments, one or more of the camera channels are different, in one or more respects, from one or more of the other camera channels. In some of the latter embodiments, each camera channel may be used to detect a different color (or band of colors) and/or band of light than that detected by the other camera channels. For example, in some embodiments, one of the camera channels, e.g., camera channel 260A, detects red light, one of the camera channels, e.g., camera channel 260B, detects green light, one of the camera channels, e.g., camera channel 260C, detects blue light and one of the camera channels, e.g., camera channel 260D, detects infrared light.

In some other embodiments, one of the camera channels, e.g., camera channel 260A, detects cyan light, one of the camera channels, e.g., camera channel 260B, detects yellow light, one of the camera channels, e.g., camera channel 260C, detects magenta light and one of the camera channels, e.g., camera channel 260D, detects clear light (black and white). In some other embodiments, one of the camera channels, e.g., camera channel 260A, detects red light, one of the camera channels, e.g., camera channel 260B, detects green light, one of the camera channels, e.g., camera channel 260C, detects blue light and one of the camera channels, e.g., camera channel 260D, detects cyan light. Any other color combinations can also be used.

Thus, if the subsystem includes more than one optics portion, the optics portions may or may not be identical to one another. In some embodiments, the optics portions are identical to one another. In some other embodiments, one or more of the optics portions are different, in one or more respects, from one or more of the other optics portions. For example, in some embodiments, one or more of the characteristics (for example, but not limited to, its type of element(s), size, and/or performance) of one or more of the optics portions is tailored to the respective sensor portion and/or to help achieve a desired result. For example, if a particular camera channel is dedicated to a particular color (or band of colors) or wavelength (or band of wavelengths) then the optics portion for that camera channel may be adapted to transmit only that particular color (or band of colors) or wavelength (or band of wavelengths) to the sensor portion of the particular camera channel and/or to filter out one or more other colors or wavelengths.

Likewise, if the digital camera apparatus 210 includes more than one sensor portion, the sensor portions may or may not be identical to one another. In some embodiments, the sensor portions are identical to one another. In some other embodiments, one or more of the sensor portions are different, in one or more respects, from one or more of the other sensor portions. For example, in some embodiments, one or more of the characteristics (for example, but not limited to, its type of element(s), size, and/or performance) of one or more of the sensor portions is tailored to the respective optics portion and/or to help achieve a desired result. For example, if a particular camera channel is dedicated to a particular color (or band of colors) or wavelength (or band of wavelengths) then the sensor portion for that camera channel may be adapted to have a sensitivity that is higher to that particular color (or band of colors) or wavelength (or band of wavelengths) than other colors or wavelengths and/or to sense only that particular color (or band of colors) or wavelength (or band of wavelengths).

The aspects and/or embodiments of the present invention may be employed in association with any type of digital camera system, now known or later developed.

As stated above, for the sake of brevity, the inventions described and/or illustrated in the Apparatus for Multiple Camera Devices and Method of Operating Same patent application publication will not be repeated but will only be summarized. It is expressly noted, that the entire contents of the Apparatus for Multiple Camera Devices and Method of Operating Same patent application publication, including, for example, the features, attributes, alternatives, materials, techniques and advantages of all of the inventions, are incorporated by reference herein, although, unless stated otherwise, the aspects and/or embodiments of the present invention are not limited to such features, attributes alternatives, materials, techniques and advantages.

Other types of camera channels and/or processors, or portions thereof, now known or later developed, may also be employed.

Figure 5A:
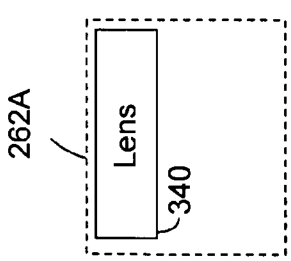
FIGS. 5A-5V are schematic block diagram representations of various embodiments of optics portions that may be employed in the digital camera apparatus of FIG. 4, in accordance with certain aspects of the present invention.
Figure 5B:
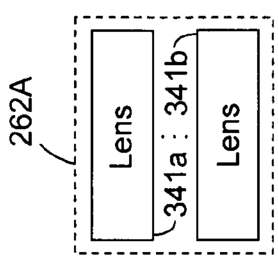
FIG. 5W shows another embodiment of an optics portion that may be employed in the digital camera apparatus of FIG. 4, partially in schematic, partially exploded, perspective view and partially in schematic representation, in accordance with certain aspects of the present invention.
FIG. 5X is a schematic, exploded perspective view of one embodiment of an optics portion that may be employed in the digital camera apparatus of FIG. 4.
Figure 5C:
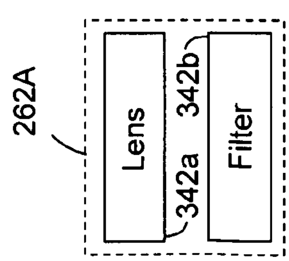
Figure 5D:
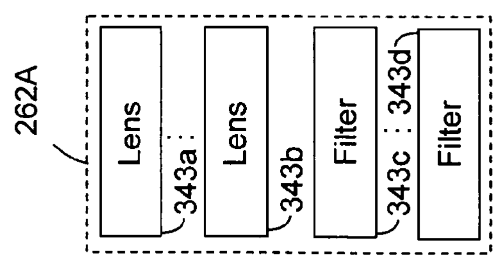
Figure 5E:
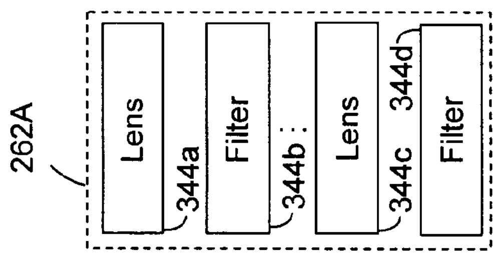
Figure 5F:
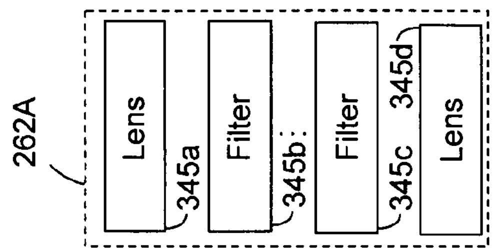
Figure 5G:
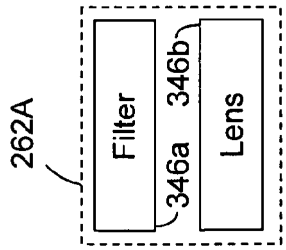
Figure 5H:
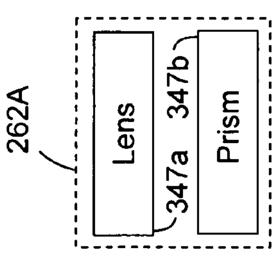
Figure 5I:
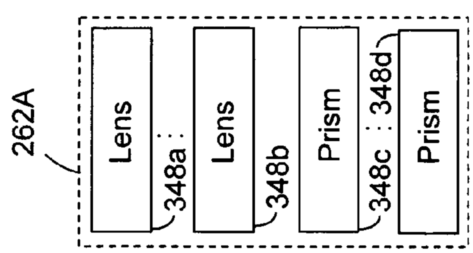
Figure 5J:
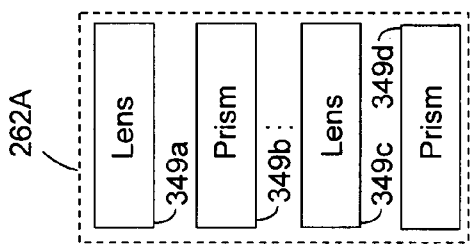
Figure 5K:
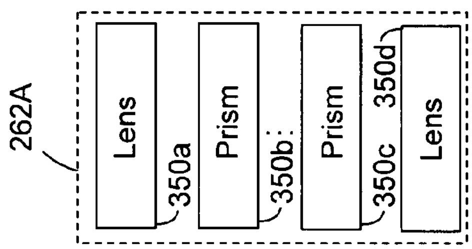
Figure 5L:
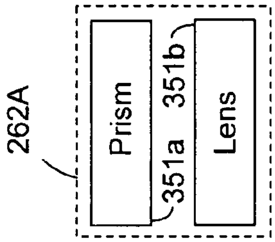
Figure 5M:
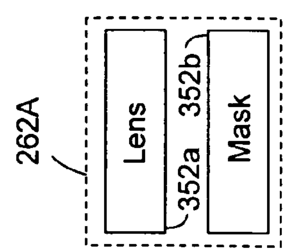
Figure 5N:
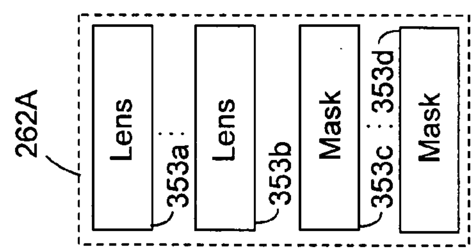
Figure 5O:
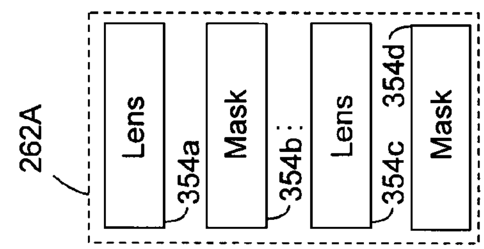
Figure 5P:
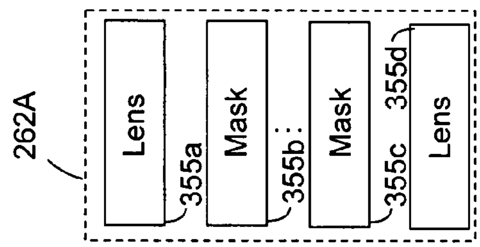
Figure 5Q:
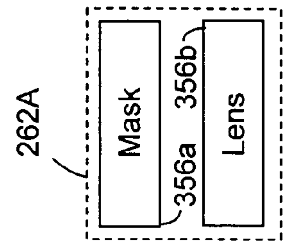
Figure 5R:
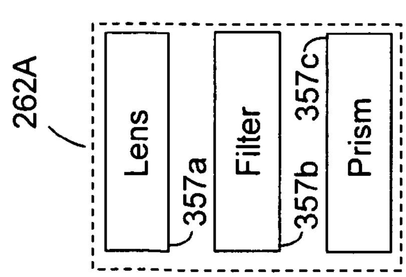
Figure 5S:
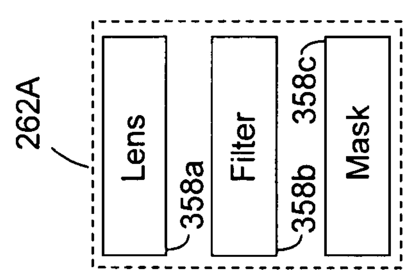
Figure 5T:
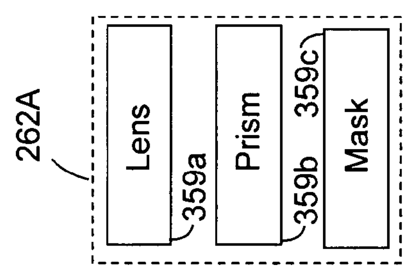
Figure 5U:
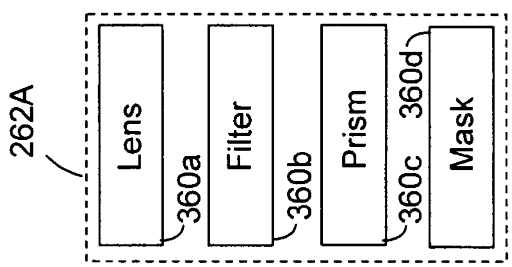
Figure 5V:
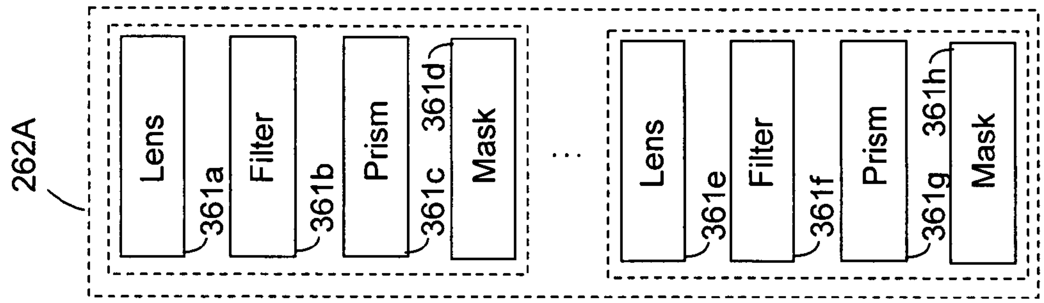
Figure 5X:
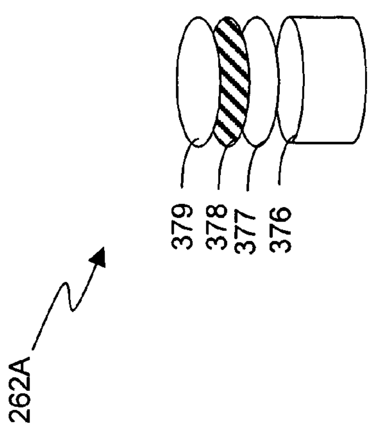
Figure 5W:
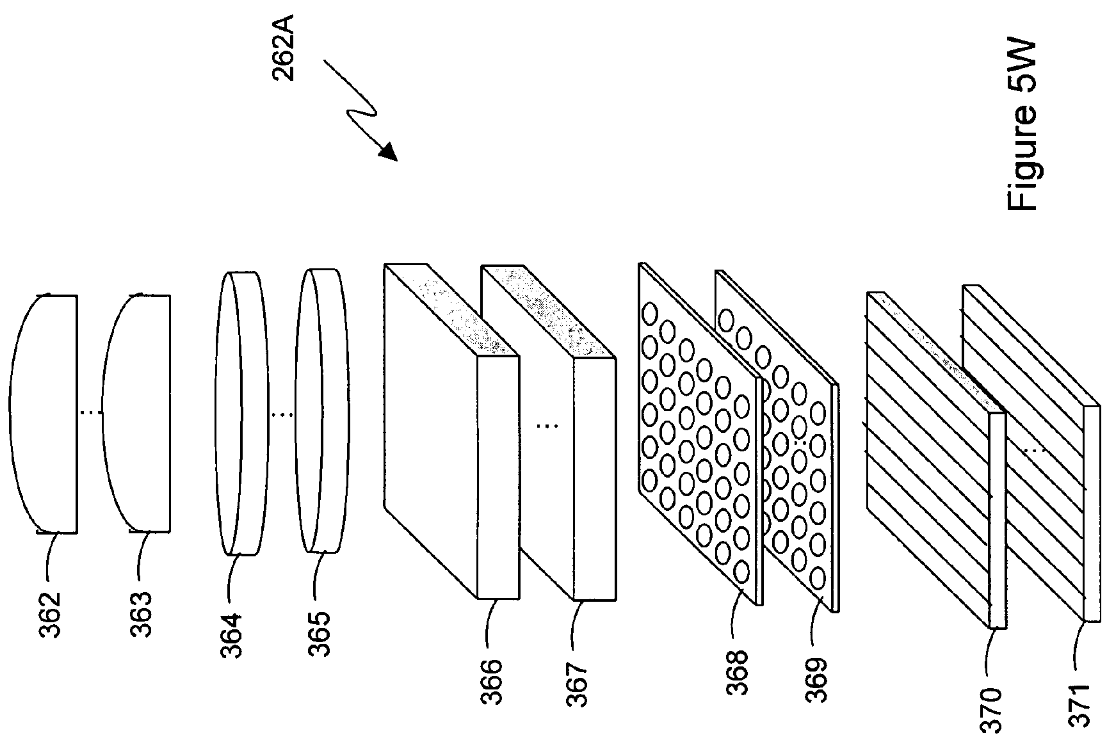

Referring to FIG. 5A-5W, an optics portion, such as for example, one or more of optics portions 262A-262D, may include, for example, any number of lenses, filters, prisms, masks and/or combination thereof. FIG. 5A is a schematic representation of one embodiment of an optics portion, e.g., optics portion 262A, in which the optics portion comprises a single lens 340. FIG. 5B is a schematic representation of another embodiment of the optics portion 262A in which the optics portion 262A includes two or more lenses 341*a*-341*b*. The portions of an optics portion may be separate from one another, integral with one another, and/or any combination thereof. Thus, for example, the two lenses 341*a*-341*b* represented in FIG. 5B may be separate from one another or integral with one another.

FIGS. 5C-5G show schematic representations of example embodiments of optics portion 262A in which the optics portion 262A has one or more lenses and one or more filters. The one or more lenses and one or more filters may be separate from one another, integral with one another, and/or any combination thereof. Moreover, the one or more lenses and one or more filters may be disposed in any configuration and/or sequence, for example, a lens-filter sequence (see for example, lens-filter sequence 342*a*-342*b* (FIG. 5C)), a filter-lens sequence (see for example, filter-lens sequence 346*a*-346*b* (FIG. 5G)), a lens-lens-filter-filter sequence (see for example, lens-lens-filter-filter sequence 343*a*-343*d* (FIG. 5D, which shows two or more lenses and two or more filters)), a lens-filter-lens-filter sequence (see for example, lens-filter-lens-filter sequence 344*a*-344*d* (FIG. 5E)), a lens-filter-filter-lens sequence (see for example, lens-filter-filter-lens sequence 345*a*-345*d* (FIG. 5F)) and combinations and/or variations thereof.

FIGS. 5H-5L show schematic representations of example embodiments of optics portion 262A in which the optics portion 262A has one or more lenses and one or more prisms. The one or more lenses and one or more prisms may be separate from one another, integral with one another, and/or any combination thereof. Moreover, the one or more lenses and one or more prisms may be disposed in any configuration and/or sequence, for example, a lens-prism sequence (see for example, lens-prism sequence 347*a*-347*b* (FIG. 5H)), a prism-lens sequence (see for example, prism-lens sequence 351*a*-351*b* (FIG. 5L)), a lens-lens-prism-prism sequence (see for example, lens-lens-prism-prism sequence 348*a*-348*d* (FIG. 5I, which shows two or more lenses and two or more prisms)), a lens-prism-lens-prism sequence (see for example, lens-prism-lens-prism sequence 349*a*-349*d* (FIG. 5J)), a lens-prism-prism-lens sequence (see for example, lens-prism-prism-lens sequence 350*a*-350*d* (FIG. 5K)) and combinations and/or variations thereof.

FIGS. 5M-5Q show schematic representations of example embodiments of optics portion 262A in which the optics portion 262A has one or more lenses and one or more masks. The one or more lenses and one or more masks may be separate from one another, integral with one another, and/or any combination thereof. Moreover, the one or more lenses and one or more masks may be disposed in any configuration and/or sequence, for example, a lens-mask sequence (see for example, a lens-mask sequence 352*a*-352*b* (FIG. 5M)), a mask-lens sequence (see for example, mask-lens sequence 356*a*-356*b* (FIG. 5Q)), a lens-lens-mask-mask sequence (see for example, lens-lens-mask-mask sequence 353*a*-353*d* (FIG. 5N, which shows two or more lenses and two or more masks)), a lens-mask-lens-mask sequence (see for example, lens-mask-lens-mask sequence 354*a*-354*d* (FIG. 5O)), a lens-mask-mask-lens sequence (see for example, lens-mask-mask-lens sequence 355*a*-355*d* (FIG. 5P)) and combinations and/or variations thereof.

FIGS. 5R-5V show schematic representations of example embodiments of optics portion 262A in which the optics portion 262A has one or more lenses, filters, prisms, and/or masks. The one or more lenses, filters, prisms and/or masks may be separate from one another, integral with one another, and/or any combination thereof. Moreover, the one or more lenses, filters, prisms and/or masks may be disposed in any configuration and/or sequence, for example, a lens-filter-prism sequence (see for example, lens-filter-prism sequence 357*a*-357*c* (FIG. 5R)), a lens-filter-mask sequence (see for example, lens-filter-mask sequence 358*a*-358*c* (FIG. 5S)), a lens-prism-mask sequence (see for example, lens-prism-mask sequence 359*a*-359*c* (FIG. 5T)), a lens-filter-prism-mask sequence (see for example, lens-filter-prism-mask sequence 360*a*-360*d* (FIG. 5U) and lens-filter-prism-mask sequences 361*a*-361*d*, 361*e*-361*h* (FIG. 5V, which shows two or more lenses, two or more filters, two or more prisms and two or more masks)) and combinations and/or variations thereof.

FIG. 5W is a representation of one embodiment of optics portion 262A in which the optics portion 262A includes two or more lenses, e.g., lenses 362-363, two or more filters, e.g., filters 364-365, two or more prisms, e.g., prisms 366-367, and two or more masks, e.g., masks 368-371, two or more of which masks, e.g., masks 370-371, are polarizers.

FIG. 5X is an exploded representation of one embodiment of an optics portion, e.g., optics portion 262A, that may be employed in the digital camera apparatus 210. In this embodiment, the optics portion 262A includes a lens, e.g., a complex aspherical lens 376 (comprising one, two, three or any other number of lenslets or elements) having a color coating 377, an autofocus mask 378 with an interference pattern and an IR coating 379. As stated above, the optics portion 262A and/or camera channel 260A may be adapted to a color (or band of colors) and/or a wavelength (or band of wavelengths).

Lenses, e.g., lens 376, may comprise any suitable material or materials, for example, but not limited to, glass and plastic. Lenses, e.g., lens 376, can be rigid or flexible. In some embodiments, one or more lenses, e.g., lens 376, are doped such as to impart a color filtering, or other property.

The color coating 377 may help optics portion filter 262A (i.e., substantially attenuate) one or more wavelengths or bands of wavelengths. The auto focus mask 378 may define one or more interference patterns that help the digital camera apparatus perform one or more auto focus functions or extend depth of focus. The IR coating 379 helps the optics portion filter a wavelength or band of wavelength in the IR portion of the spectrum. The color coatings, mask, and IR coating, may each have any size, shape and/or configuration.

Other embodiments may also be employed to provide an optics portion and/or camera channel adapted to a color (or band of colors) and/or a wavelength (or band of wavelengths). In some embodiments, the color coating 377 is replaced by a coating on top of the optics (see, for example, FIG. 9B of the Apparatus for Multiple Camera Devices and Method of Operating Same patent application publication). In another embodiment, the color coating 377 is replaced by dye in the lens (see, for example, FIG. 9D of the Apparatus for Multiple Camera Devices and Method of Operating Same patent application publication). In some other embodiments, a filter is employed below the lens (see, for example, FIG. 9C of the Apparatus for Multiple Camera Devices and Method of Operating Same patent application publication) or on the sensor portion.

As stated above, the entire contents of the Apparatus for Multiple Camera Devices and Method of Operating Same patent application publication, including, for example, the features, attributes, alternatives, materials, techniques and advantages of all of the inventions, are incorporated by reference herein, although, unless stated otherwise, the aspects and/or embodiments of the present invention are not limited to such features, attributes alternatives, materials, techniques and advantages.

Other embodiments of optics are disclosed in the Apparatus for Multiple Camera Devices and Method of Operating Same patent application publication. As stated above, the structures and/or methods described and/or illustrated in the Apparatus for Multiple Camera Devices and Method of Operating Same patent application publication may be employed in conjunction with one or more of the aspects and/or embodiments of the present inventions.

Thus, for example, one or more portions of one or more embodiments of the digital camera apparatus disclosed in the Apparatus for Multiple Camera Devices and Methods of Operating Same patent application publication may be employed in a digital camera apparatus 210 having one or more actuators, e.g., e.g., actuator 430A-430D, 434A-434D, 438A-438D, 442A-442D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), for example, to move one or more portions of one or more optics portion and/or to move one or more portions of one or more sensor portions. In addition, in some embodiments, for example, one or more actuators, e.g., e.g., actuator 430A-430D, 434A-434D, 438A-438D, 442A-442D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), may be employed in one or more embodiments of the digital camera apparatus 300 disclosed in the Apparatus for Multiple Camera Devices and Method of Operating Same patent application publication, for example, to move one or more portions of one or more optics portion and/or to move one or more portions of one or more sensor portions.

In some embodiments, one or more of the one or more optics portions, e.g., optics portions 262A-262D, or portions thereof, are the same as or similar to one or more embodiments of one or more of the optics portions 330A-330D, or portions thereof, of the digital camera apparatus 300, described and/or illustrated in the Apparatus for Multiple Camera Devices and Method of Operating Same patent application publication. In some embodiments, one or more of the one or more optics portions, e.g., optics portions 262A-262D, or portions thereof, are the same as or similar to one or more portions of one or more embodiments of the optics (see for example, lenses 230A-230D) employed in the digital camera apparatus 200 described and/or illustrated in the Apparatus for Multiple Camera Devices and Method of Operating Same patent application publication.

As stated above, for the sake of brevity, the inventions described and/or illustrated in the Apparatus for Multiple Camera Devices and Method of Operating Same patent application publication will not be repeated but will only be summarized. It is expressly noted, that the entire contents of the Apparatus for Multiple Camera Devices and Method of Operating Same patent application publication, including, for example, the features, attributes, alternatives, materials, techniques and advantages of all of the inventions, are incorporated by reference herein, although, unless stated otherwise, the aspects and/or embodiments of the present invention are not limited to such features, attributes alternatives, materials, techniques and advantages.

Other configurations of optics, now known or later developed, may also be employed.

Figure 6B:
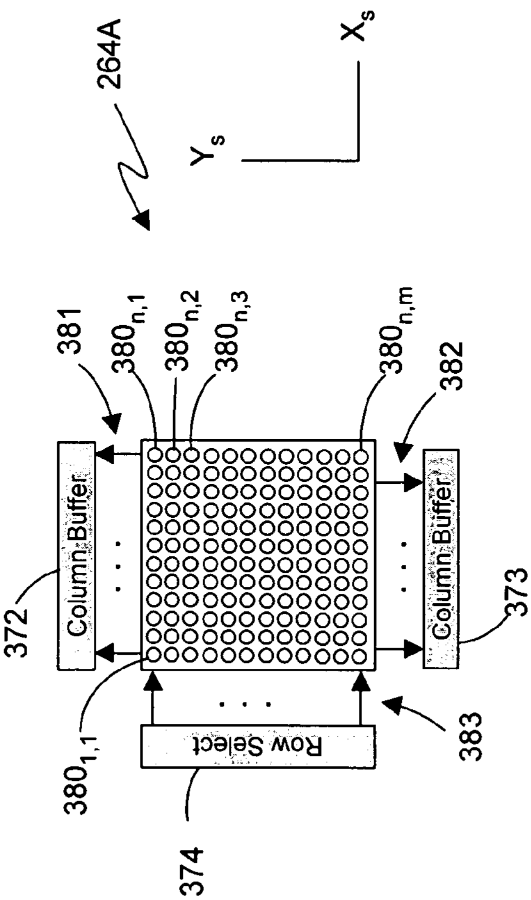
FIG. 6B is a schematic representation of one embodiment of a sensor portion and circuits that may be connected thereto, which may be employed in the digital camera apparatus of FIG. 4, in accordance with certain aspects of the present invention.

FIGS. 6A-6B are a representation of one embodiment of a sensor portion, e.g., sensor portion 264A, the purpose of which is to capture light and convert it into one or more signals (e.g., electrical signals) indicative thereof. As further described below, the one or more signals are supplied to one or more circuits, see for example, circuits 372-374 (FIG. 6B), connected to the sensor portion 264A.

Referring to FIG. 6A, the sensor portion, e.g., sensor portion 264A, includes a plurality of sensor elements such as for example, a plurality of identical photo detectors (sometimes referred to as "picture elements" or "pixels"), e.g., pixels $\mathbf{380}_{1,1}$-$\mathbf{380}_{n,m}$. The photo detectors, e.g., photo detectors $\mathbf{380}_{1,1}$-$\mathbf{380}_{n,m}$, are arranged in an array, for example a matrix type array. The number of pixels in the array may be, for example, in a range from hundreds of thousands to millions. The pixels e.g., pixels $\mathbf{380}_{1,1}$-$\mathbf{380}_{n,m}$, may be arranged for example, in a 2 dimensional array configuration, for example, having a plurality of rows and a plurality of columns, e.g., 640×480, 1280×1024, etc. In this representation, the pixels, e.g., pixels $\mathbf{380}_{1,1}$-$\mathbf{380}_{n,m}$, are represented generally by circles, however in practice, a pixel can have any shape including for example, an irregular shape.

As with each of the embodiments disclosed herein, the above embodiments may be employed alone or in combination with one or more other embodiments disclosed herein, or portions thereof.

In addition, it should also be understood that the embodiments disclosed herein may also be used in combination with one or more other methods and/or apparatus, now known or later developed.

Other embodiments of sensors are disclosed in the Apparatus for Multiple Camera Devices and Method of Operating Same patent application publication. As stated above, the structures and/or methods described and/or illustrated in the Apparatus for Multiple Camera Devices and Method of Operating Same patent application publication may be employed in conjunction with one or more of the aspects and/or embodiments of the present inventions.

Thus, for example, one or more portions of one or more embodiments of the digital camera apparatus disclosed in the Apparatus for Multiple Camera Devices and Methods of Operating Same patent application publication may be employed in a digital camera apparatus 210 having one or more actuators, e.g., e.g., actuator 430A-430D, 434A-434D, 438A-438D, 442A-442D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), for example, to move one or more portions of one or more optics portion and/or to move one or more portions of one or more sensor portions. In addition, in some embodiments, for example, one or more actuators, e.g., e.g., actuator 430A-430D, 434A-434D, 438A-438D, 442A-442D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), may be employed in one or more embodiments of the digital camera apparatus 300 disclosed in the Apparatus for Multiple Camera Devices and Method of Operating Same patent application publication, for example, to move one or more portions of one or more optics portion and/or to move one or more portions of one or more sensor portions.

In that regard, in some embodiments, one or more of the one or more sensor portions, e.g., sensor portions 264A-264D, or portions thereof, are the same as or similar to one or more embodiments of one or more of the sensor portions 310A-310D, or portions thereof, of the digital camera apparatus 300, described and/or illustrated in the Apparatus for Multiple Camera Devices and Method of Operating Same patent application publication. In some embodiments, one or more of the one or more sensor portions, e.g., sensor portions 264A-264D, or portions thereof, are the same as or similar to one or more embodiments of the sensors (see for example, sensors 210A-210D), or portions thereof, employed in the digital camera apparatus 200 described and/or illustrated in the Apparatus for Multiple Camera Devices and Method of Operating Same patent application publication.

As stated above, for the sake of brevity, the inventions described and/or illustrated in the Apparatus for Multiple Camera Devices and Method of Operating Same patent application publication will not be repeated but will only be summarized. It is expressly noted, that the entire contents of the Apparatus for Multiple Camera Devices and Method of Operating Same patent application publication, including, for example, the features, attributes, alternatives, materials, techniques and advantages of all of the inventions, are incorporated by reference herein, although, unless stated otherwise, the aspects and/or embodiments of the present invention are not limited to such features, attributes alternatives, materials, techniques and advantages.

Other configurations of sensors, now known or later developed, may also be employed.

In some embodiments, the sensor elements are disposed in a plane, referred to herein as a sensor plane. The sensor may have orthogonal sensor reference axes, including for example, an x axis, Xs, a y axis, Ys, and a z axis, Zs, and may be configured so as to have the sensor plane parallel to the xy plane XY (e.g., FIGS. 15A, 17A) and directed toward the optics portion of the camera channel. In some embodiments, the sensor axis Xs may be parallel to the x axis of the xy plane XY (e.g., FIGS. 15A, 17A), the sensor axis Ys may be parallel to the y axis of the xy plane XY (e.g., FIGS. 15A, 17A). In some embodiments, row(s) of a sensor array extend in a direction parallel to one of such sensor reference axis, e.g., Xs, and column(s) of a sensor array extend in a direction parallel to the other of such sensor reference axes, e.g., Ys. Each camera channel has a field of view corresponding to an expanse viewable by the sensor portion. Each of the sensor elements may be, for example, associated with a respective portion of the field of view.

The sensor portion, e.g., sensor portion 264A, may employ any type of technology, for example, but not limited to MOS pixel technologies (meaning that one or more portions of the sensor are implemented in "Metal Oxide Semiconductor" technology), charge coupled device (CCD) pixel technologies or combination of both (hybrid).

In operation, the sensor portion, e.g., sensor portion 264, is exposed to light by either sequentially line per line basis (similar to scanner) or globally (similar to conventional film camera exposure). After being exposed to light for certain period of time (exposure time), signals from the pixels, e.g., pixels $\mathbf{380}_{1,1}$-$\mathbf{380}_{n,m}$, are read sequentially line per line and supplied to the image processor(s).

Circuitry sometimes referred to as column logic, e.g., e.g., circuits 372-373, is used to read the signals from the pixels, e.g., pixels $\mathbf{380}_{1,1}$-$\mathbf{380}_{n,m}$. More particularly, the sensor elements may be accessed one row at a time by asserting one of the word lines, e.g., word lines 383, which in this embodiment, are supplied by row select logic 374 and run horizontally through the sensor array 264A. Data may be passed into and out of the sensor elements via signal lines, e.g., signals lines 381, 382, referred to as bit lines, which in this embodiment, run vertically through the sensor array 264A. The sensor elements may be accessed one row at a time by asserting one of the word lines, e.g., word lines 383, which in this embodiment, run horizontally through the sensor array 264A.

In some embodiments, the sensor array and/or associated electronics are implemented using a 0.18 um FET process, i.e., the minimum length of a FET (field effect transistor) in the design is 0.18 um. Of course other embodiments may employ other processes and/or dimensions.

As will be further described below, each sensor array may, for example, focus on a specific band of light (visible and/or invisible), for example, one color or band of colors. If so, each sensor array may be tuned so as to be more efficient in capturing and/or processing an image or images in its particular band of light.

In this embodiment, the well depth of the photo detectors across each individual array is the same, although in some other embodiments, the well depth may vary. For example, the well depth of any given array can readily be manufactured to be different from that of other arrays. Selection of an appropriate well depth could depend on many factors, including most likely the targeted band of visible spectrum. Since each entire array is likely to be targeted at one band of visible spectrum (e.g., red) the well depth can be designed to capture that wavelength and ignore others (e.g., blue, green).

Doping of the semiconductor material in the color specific arrays can further be used to enhance the selectivity of the photon absorption for color specific wavelengths.

Figure 7A:
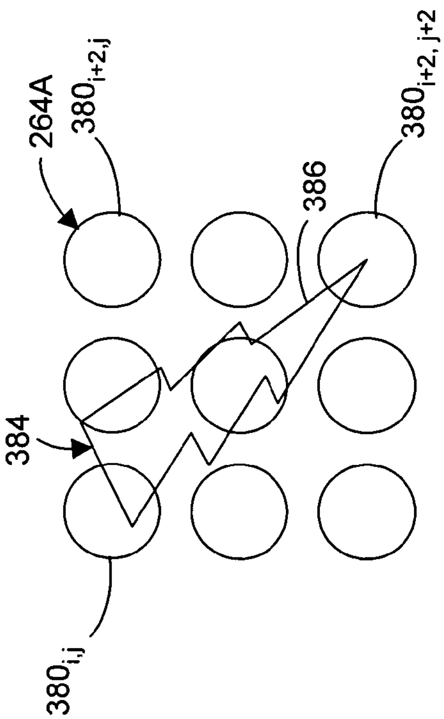
FIG. 7A is an enlarged view of a portion of the sensor portion of FIGS. 6A-6B and a representation of an image of an object striking the portion of the sensor portion.
Figure 7B:
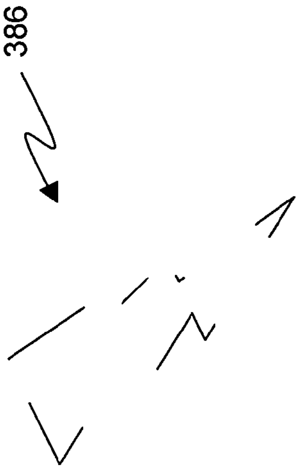
FIG. 7B is a representation of a portion of the image of FIG. 7A captured by the portion of the sensor portion of FIG. 7A.

FIGS. 7A-7B depict an image being captured by a sensor, e.g., sensor 264A, of the type shown in FIGS. 6A-6B. More particularly, FIG. 7A shows an image of an object (a lightning bolt) 384 striking a portion of the sensor. FIG. 7B shows the captured image 386. In FIG. 7A, sensor elements are represented by circles $\mathbf{380}_{i,j}$-$\mathbf{380}_{i+2,j+2}$. Photons that form the image are represented by shading. For purposes of this example, photons that strike the sensor elements (e.g., photons that strike within the circles $\mathbf{380}_{i,j}$-$\mathbf{380}_{i+2,j+2}$) are sensed and/or captured thereby. Photons that do not strike the sensor elements (e.g., photons that strike outside the circles $\mathbf{380}_{i,j}$-$\mathbf{380}_{i+2,j+2}$) are not sensed and/or captured. Notably, some portions of image 384 do not strike the sensor elements. The portions of the image 384 that do not strike the sensor elements, see for example, portion 387 of image 384, do not appear in the captured image 386.

Figure 8B:
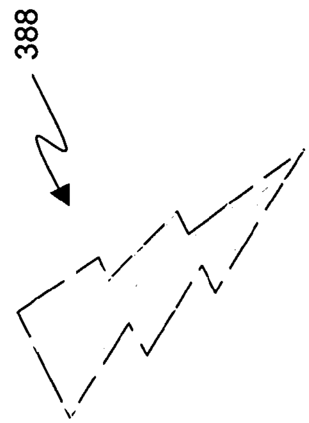
FIG. 8B is a representation of a portion of the image of FIG. 8A captured by the portion of the sensor portion of FIG. 8A.

The configuration of the sensor (e.g., number, shape, size type and arrangement of sensor elements) can have an effect on the characteristics of the sensed images. FIGS. 8A-8B depict an image being captured by a portion of a sensor, e.g., sensor 264A, that has more sensor elements, e.g., pixels $\mathbf{380}_{i,j}$-$\mathbf{380}_{i+11,j+11}$, and closer spacing of the sensor elements than in the portion of the sensor shown in FIGS. 6A-6B and 7A. FIG. 8A shows an image of an object (a lightning bolt) 384 striking a portion of the sensor. FIG. 8B shows the captured image 388. Notably, the image 388 captured by the sensor of FIG. 8A has greater detail than the image 386 captured by the sensor of FIGS. 6 and 7A.

In some embodiments, gaps between pixels are filled with pixel electronics, e.g., electronics employed in accessing and/or resetting the value of each pixel. In some embodiments, the distance between a center or approximate center of one pixel and a center or approximate center of another pixel is 0.25 um. Of course other embodiments may employ other dimensions.

As stated above, the positioning system 280 provides relative movement between the optics portion (or portion(s) thereof) and the sensor portion (or portion(s) thereof). The positioning system 280 may accomplish this by moving the optics portion relative to the sensor portion and/or by moving the sensor portion relative to the optics portion. For example, the optics portion may be moved and the sensor portion may be left stationary, the sensor portion may be moved and the optics portion may be left stationary, or the optics portion and the sensor portions may each be moved to produce a net change in the position of the optics portion relative to the sensor portion.

Figure 9A:
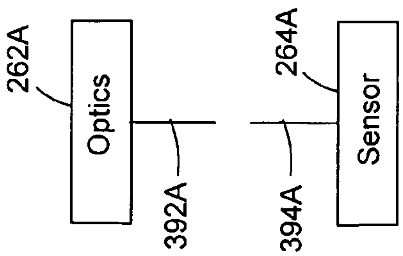
FIG. 9A is a block diagram representation of an optics portion and a sensor portion that may be employed in the digital camera apparatus of FIG. 4, prior to relative movement between the optics portion and the sensor portion therebetween, in accordance with one embodiment of the present invention.
Figure 9B:
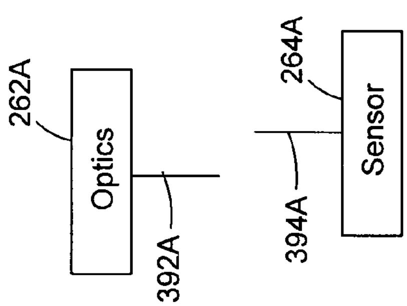
FIGS. 9B-9I are block diagram representations of the optics portion and the sensor portion of FIG. 9A after various types of relative movement therebetween, in accordance with certain aspects of the present invention.
Figure 9C:
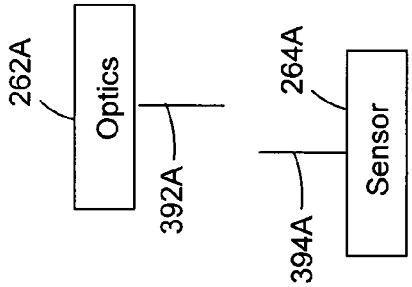
Figure 9D:
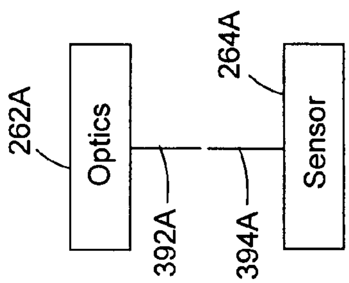
Figure 9E:
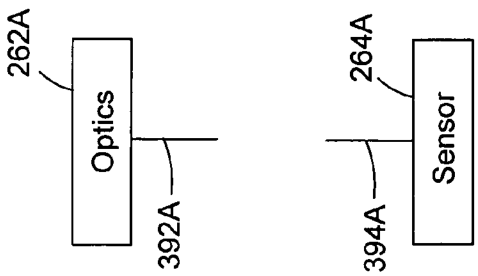
Figure 9F:
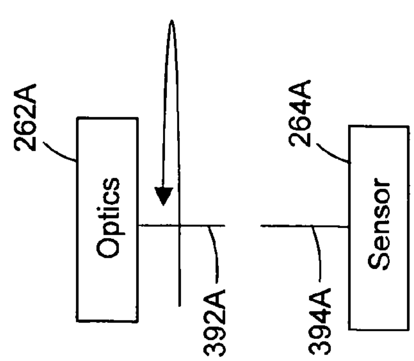
Figure 9G:
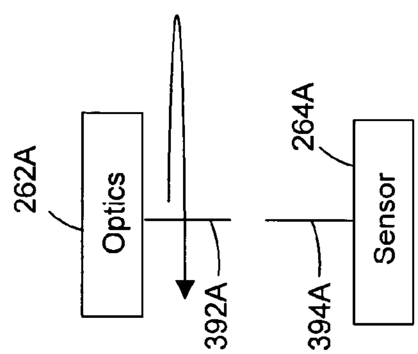
Figure 9H:
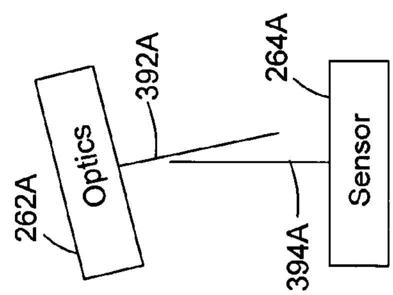
Figure 9I:
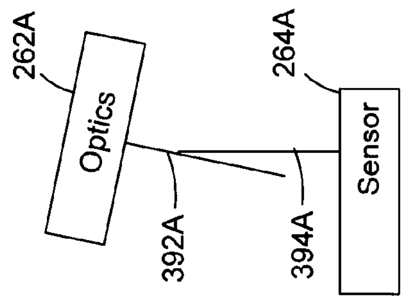
Figure 9K:
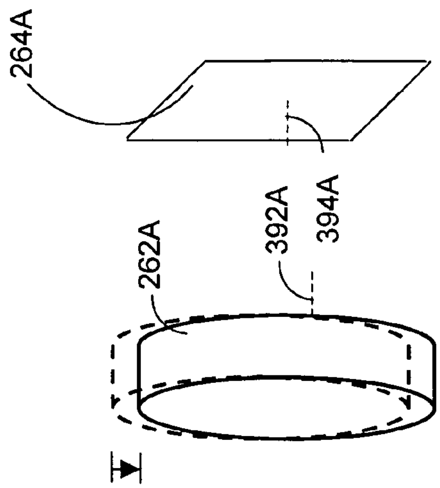
FIGS. 9K-9T are block diagram representations of the optics portion and the sensor portion of FIG. 9J after various types of relative movement therebetween, and dotted lines representing the position of the optics portion prior to relative movement between the optics portion and the sensor portion, in accordance with certain aspects of the present invention.
Figure 9M:
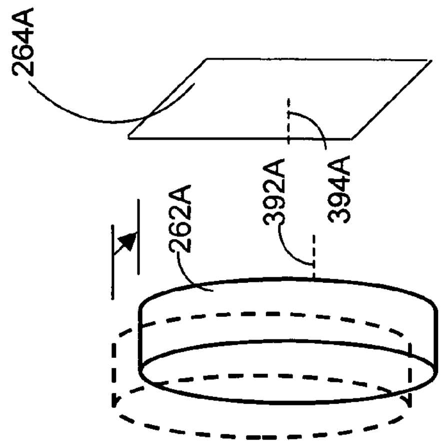

FIGS. 9A-9I, 10A-10Y and 11A-11E are block diagram representations showing examples of various types of relative movement that may be employed between an optics portion, e.g., optics portion 262A, and a sensor portion, e.g., sensor portion 264A. More particularly, FIG. 9A depicts an example of an optics portion and a sensor portion prior to relative movement there between. In that regard, it should be understood that although FIG. 9A shows the optics portion, e.g., optics portion 262A, having an axis, e.g., axis 392A, aligned with an axis, e.g., axis 394A, of the sensor portion, e.g., sensor portion 264A, which may be desirable and/or advantageous, such a configuration is not required. FIGS. 9B-9C depict the optics portion and the sensor portion after relative movement in the x direction (or in a similar manner in the y direction). FIGS. 9D-9E depict the optics portion and the sensor portion after relative movement in the z direction. FIGS. 9F-9G depict the optics portion and the sensor portion during rotation of the optics portion relative to the sensor portion. FIGS. 9H-9I depict the optics portion and the sensor portion after tilting of the optics portion relative to the sensor portion.

Figure 9J:
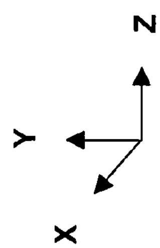
FIG. 9J is a schematic representation of an optics portion and a sensor portion that may be employed in the digital camera apparatus of FIG. 4, prior to relative movement between the optics portion and the sensor portion, in accordance with one embodiment of the present invention.
Figure 9J:
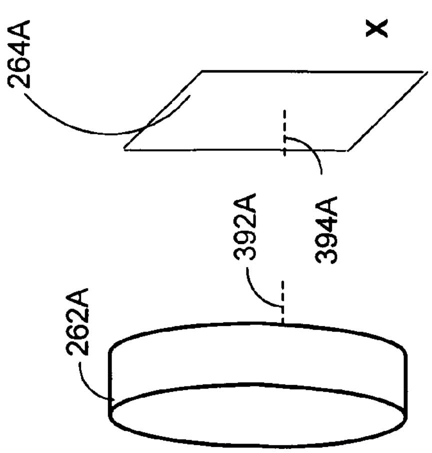
Figure 9L:
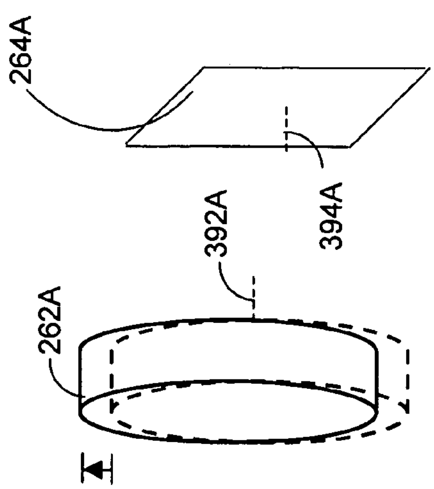
Figure 9O:
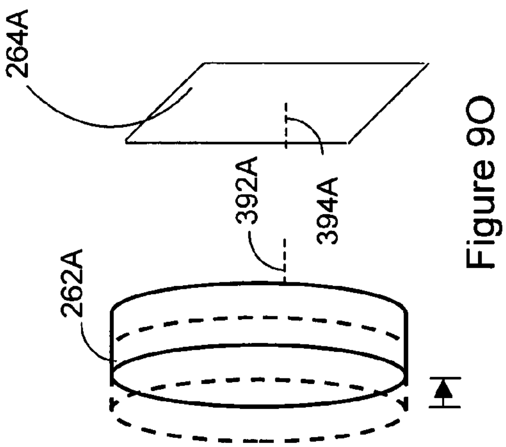
Figure 9Q:
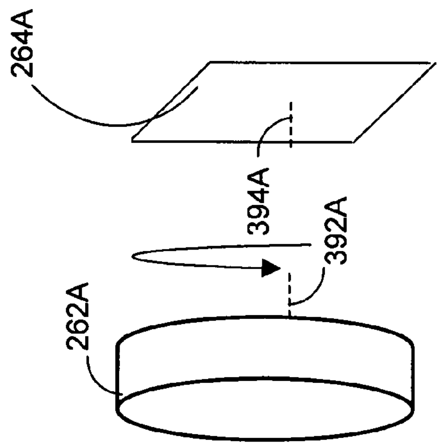
Figure 9N:
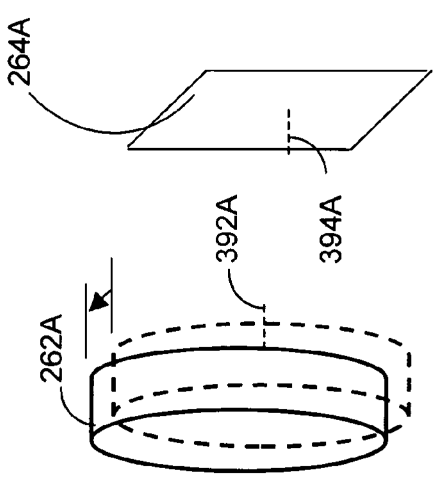
Figure 9P:
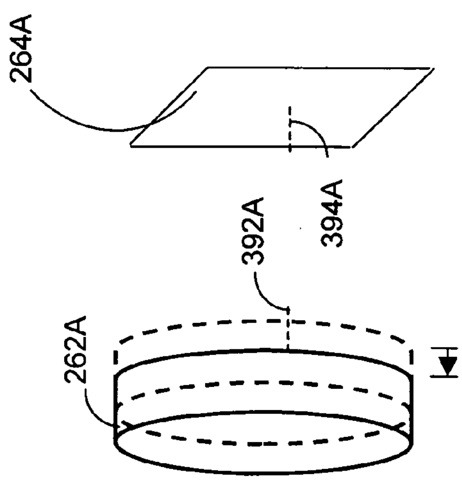
Figure 9S:
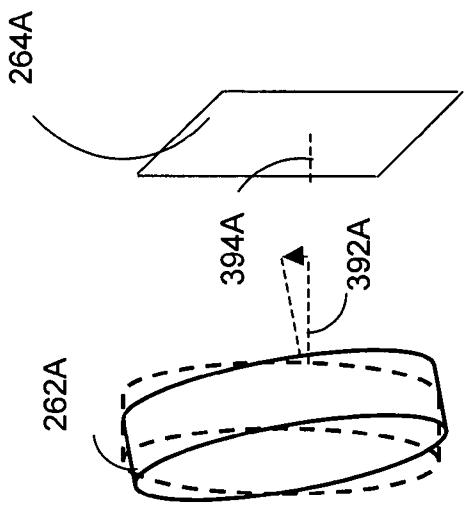
Figure 9R:
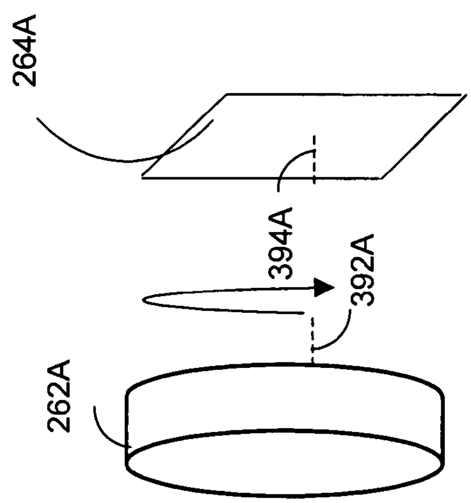
Figure 9T:
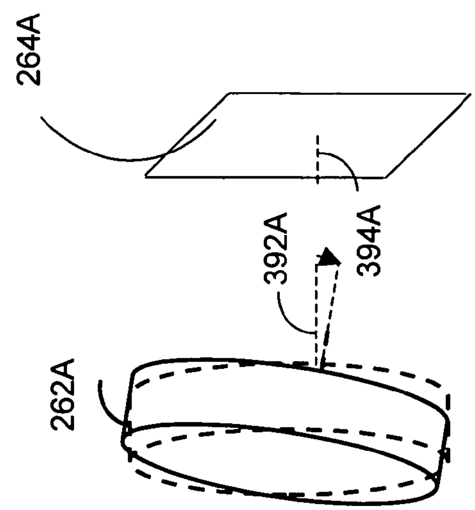

FIGS. 9J-9T are further representations of the various types of relative movement that may be employed between an optics portion and a sensor portion. The relative positioning shown in FIG. 9J is an example of an initial positioning. This initial positioning is shown in FIGS. 9K-9T by dotted lines. Although FIGS. 9J-9T show movement of only the optics portion, some other embodiments may move the sensor portion instead of or in addition to the optics portion. Although the initial positioning shows an axis of the optics portion aligned with an axis of the sensor portion, some embodiments may employ an initial positioning without such alignment and/or optics portions and sensor portions without axes.

If an optics portion comprises more than one portion (e.g., if the optics portion is a combination of one or more lenses, filters, prisms, polarizers and/or masks, see, for example, FIGS. 5A-5W) one, some or all of the portions may be moved by the positioning system 280. For example, in some embodiments all of the portions may be moved. In some other embodiments, one or more of the portions may be moved and the other portions may be left stationary. In some other embodiments, two or more portions may be moved in different ways (e.g., one portion may be moved in a first manner and another portion may be moved in a second manner) such that there is a net change in the position of one portion of the optics portion relative to another portion of the optics portion.

Likewise, if a sensor portion has more than one portion, one, some or all of the portions may be moved by the positioning system. For example, in some embodiments all of the portions may be moved. In some other embodiments, one or more of the portions may be moved and the other portions may be left stationary. In some other embodiments, two or more portions may be moved (such that there is a net change in the position of one portion of the sensor portion relative to another portion of the sensor portion.

Figures 10A, 10B, 10C, 10D, 10E, 10F, 10G, 10H:
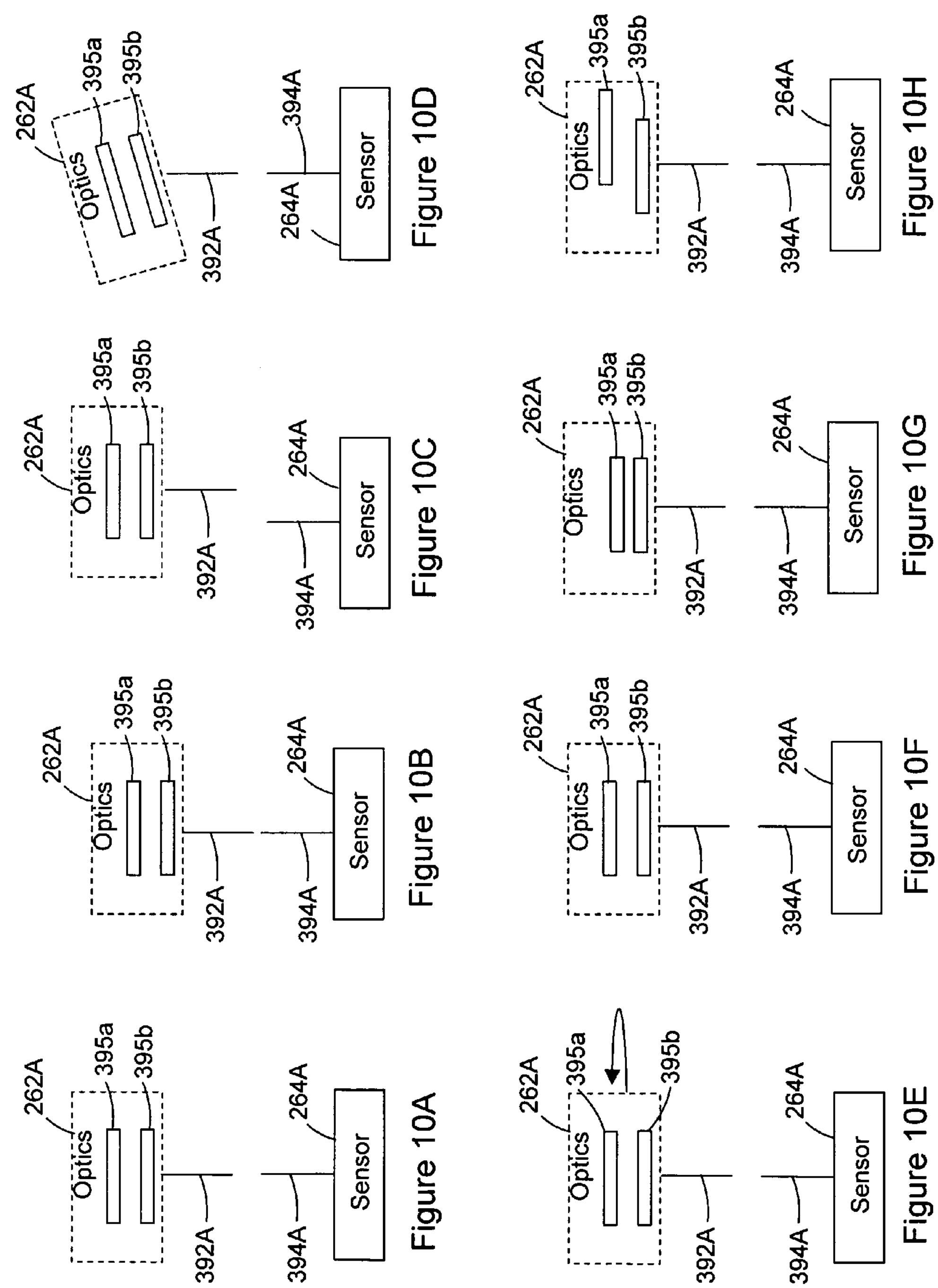
FIG. 10A is schematic representation of an optics portion and a sensor portion that may be employed in the digital camera apparatus of FIG. 4, prior to relative movement between the optics portion and the sensor portion, in accordance with another embodiment of the present invention.
FIGS. 10B-10Y are block diagram representations of the optics portion and the sensor portion of FIG. 10A after various types of relative movement therebetween, in accordance with certain aspects of the present invention.
Figure 10I:
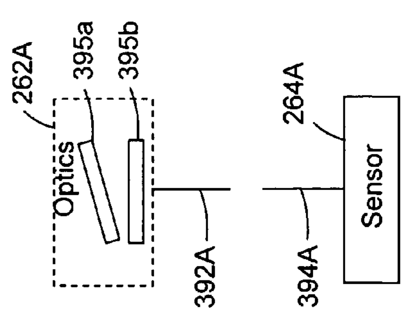
Figure 10J:
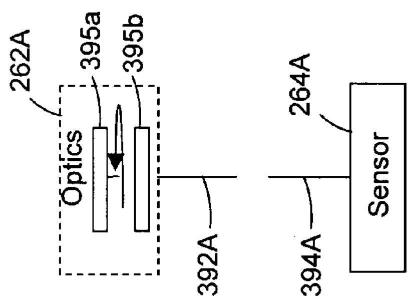
Figure 10K:
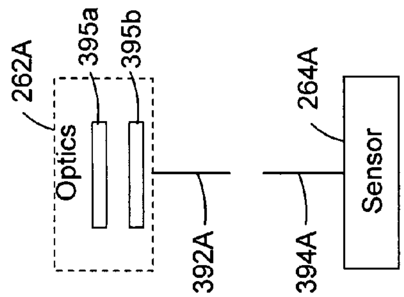
Figure 10L:
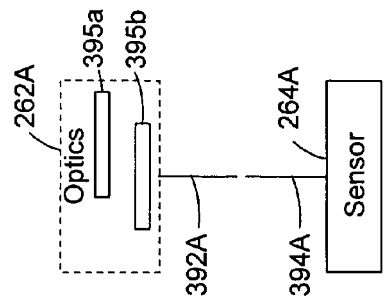
Figure 10M:
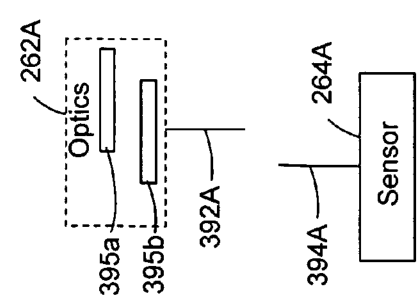
Figure 10N:
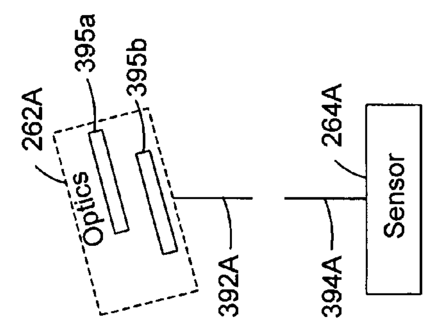
Figure 10O:
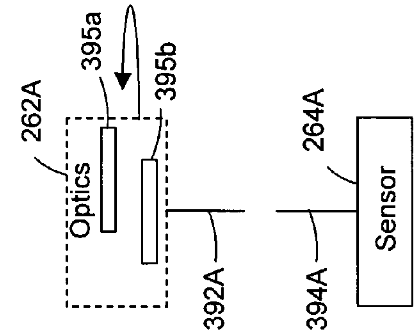
Figure 10P:
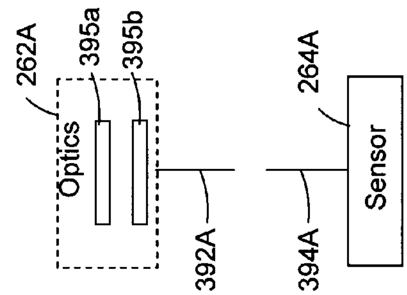
Figures 10Q, 10R, 10S, 10T, 10U, 10V, 10W, 10X:
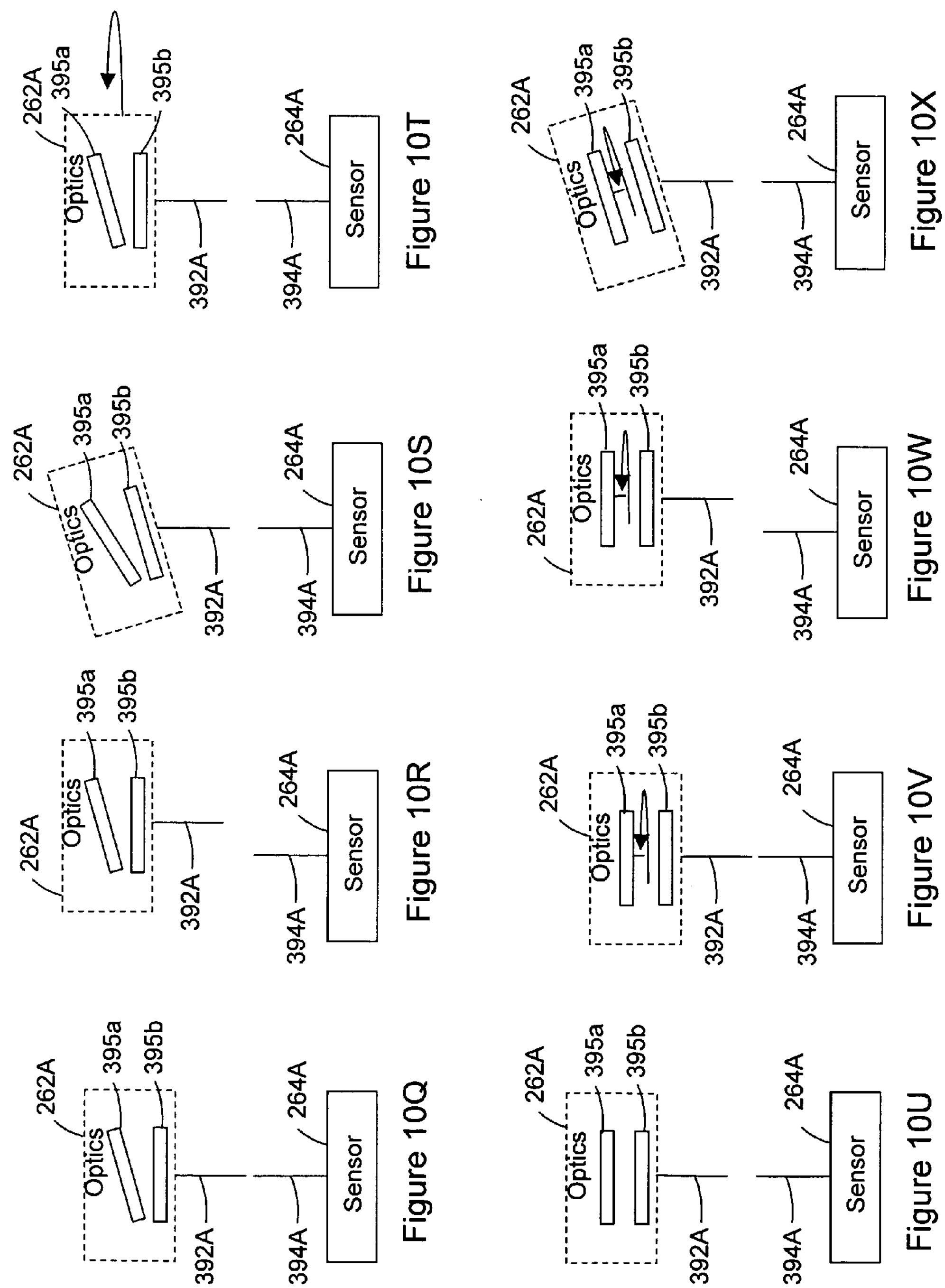
Figure 10Y:
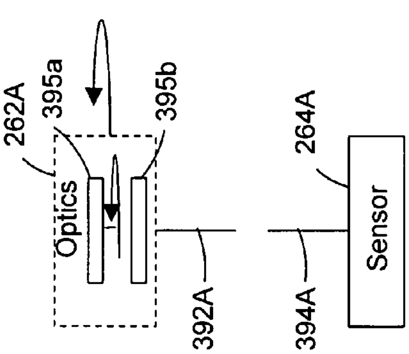
Figure 11A:
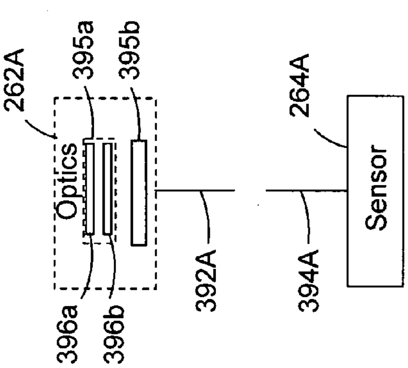
FIG. 11A is schematic representation of an optics portion and a sensor portion that may be employed in the digital camera apparatus of FIG. 4, prior to relative movement between the optics portion and the sensor portion, in accordance with another embodiment of the present invention.
Figure 11B:
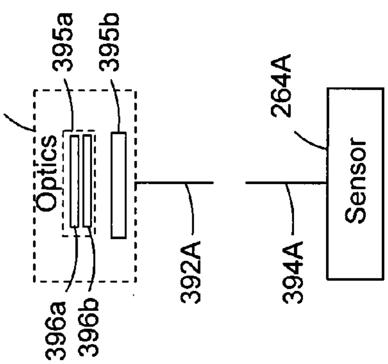
FIGS. 11B-11E are block diagram representations of the optics portion and the sensor portion of FIG. 11A after various types of relative movement therebetween, in accordance with certain aspects of the present invention.
Figure 11C:
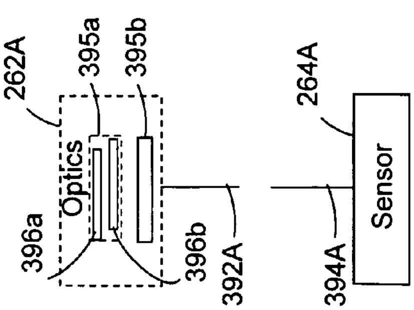
Figure 11D:
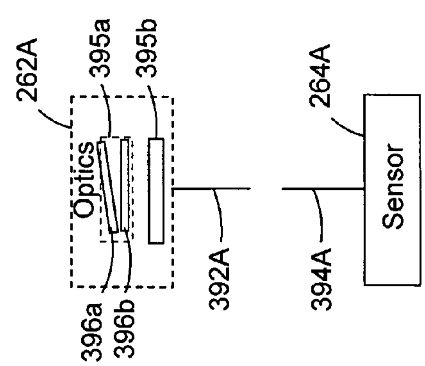
Figure 11E:
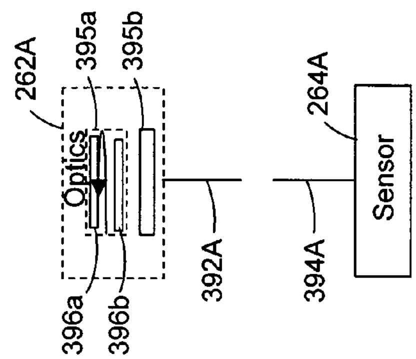

FIGS. 10A-10Y and 11A-11E show examples of various types of relative movement that may be employed between an optics portion, e.g., optics portion 262A, and a sensor portion, e.g., sensor portion 264A, when the optics portion comprises more than one portion, e.g., portions 395*a*-395*b*. More particularly, FIGS. 10A-10E show examples of relative movement between a sensor portion and all portions, e.g., portions 395*a*-395*b*, of the optics portion. FIGS. 10F-10J show examples of relative movement between a sensor portion and one portion, e.g., portion 395*a*, of the optics portion without relative movement between the sensor portion and another portion, e.g., portion 395*b*, of the optics portion. FIGS. 10K-10Y show examples having relative movement between a sensor portion and one portion, e.g., portion 395*a*, of the optics portion and different relative movement between the sensor portion and another portion, e.g., portion 395*b*, of the optics portion. FIGS. 11A-11E show examples having relative movement between a sensor portion and one portion, e.g., portion 396*a*, of the optics portion without relative movement between the sensor portion and two other portions, e.g., portions 395*b*, 396*b*, of the optics portion. It should be understood that although FIGS. 10A-10Y and 11A-11E show the optics portion, e.g., optics portion 262A, having an axis, e.g., axis 392A, aligned with an axis, e.g., axis 394A, of the sensor portion, e.g., sensor portion 264A, which may be desirable and/or advantageous, such a configuration is not required.

It should be understood that there is no requirement that a positioning system employ all types of movement described herein. For example, some positioning systems may employ only one type of movement, some other positioning systems may employ two or more types of movement, and some other positioning systems may employ all types of movement. It should also be understood that the present invention is not limited to the types of movement described herein. Thus, a positioning system may employ other type(s) of movement with or without one or more of the types of movement described herein.

Figure 12A:
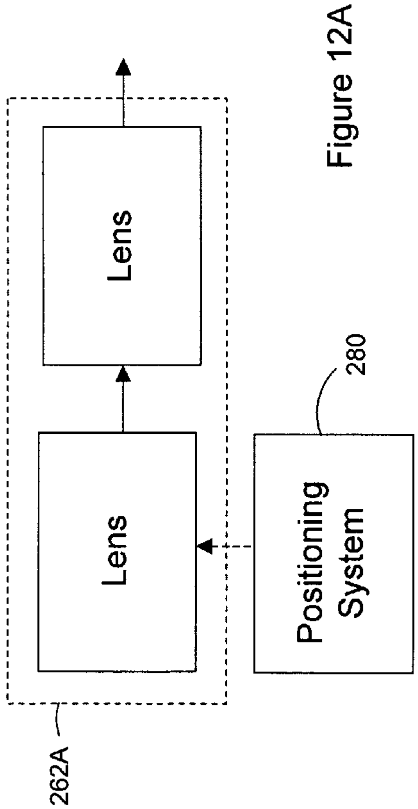
FIGS. 12A-12Q are block diagram representations showings example configurations of optics portions and positioning systems that may be employed in the digital camera apparatus of FIG. 4, in accordance with various embodiments of the present invention.
Figure 12B:
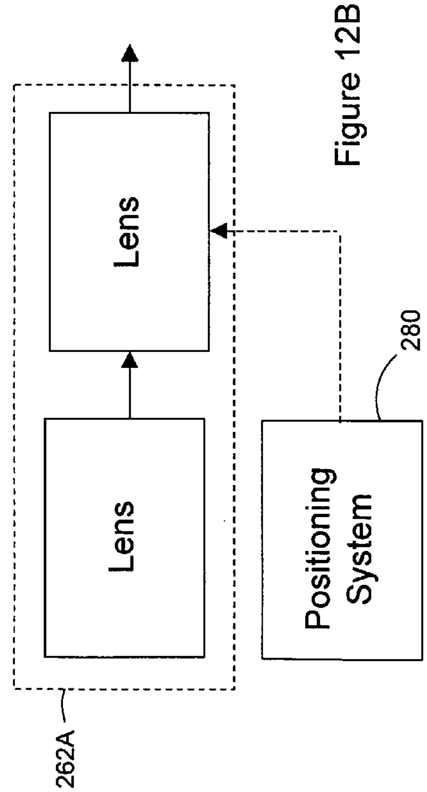
Figure 12C:
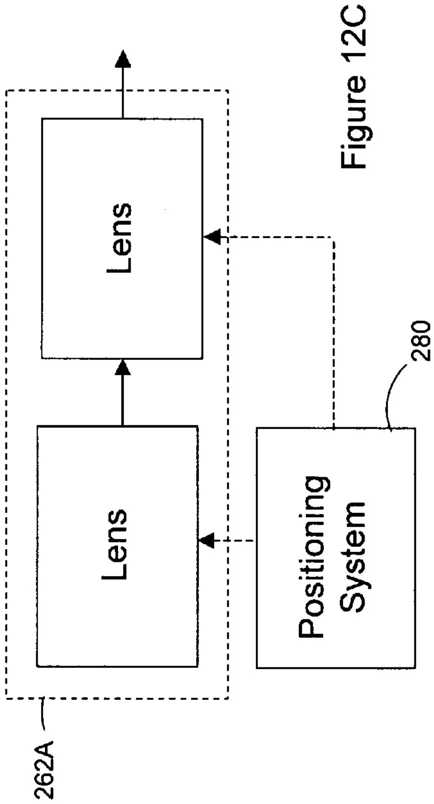
Figure 12D:
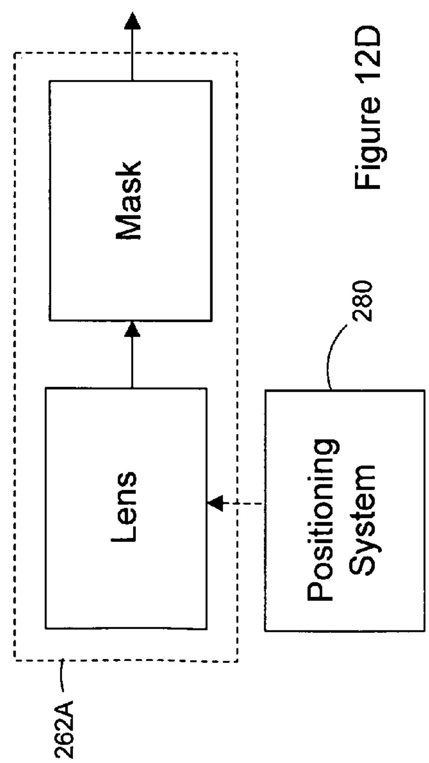
Figure 12E:
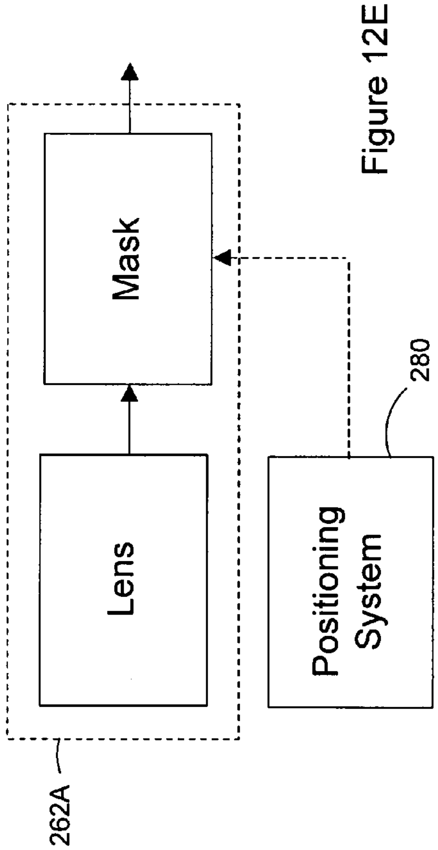
Figure 12F:
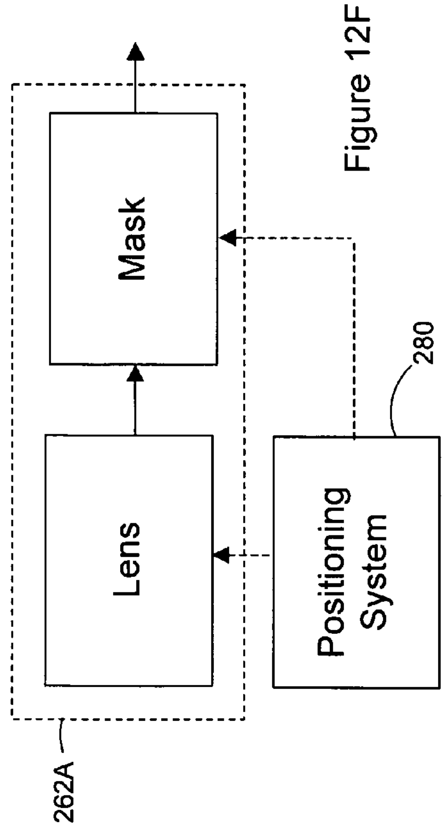
Figure 12G:
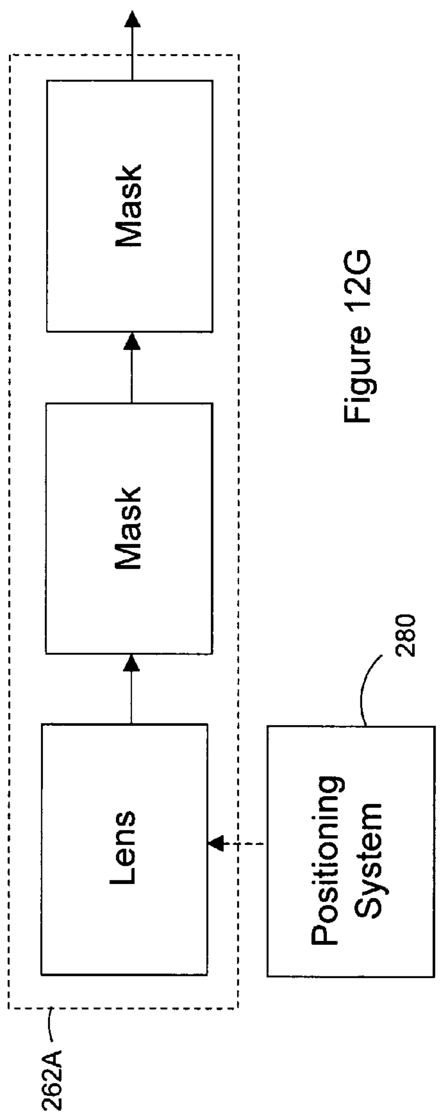
Figure 12H:
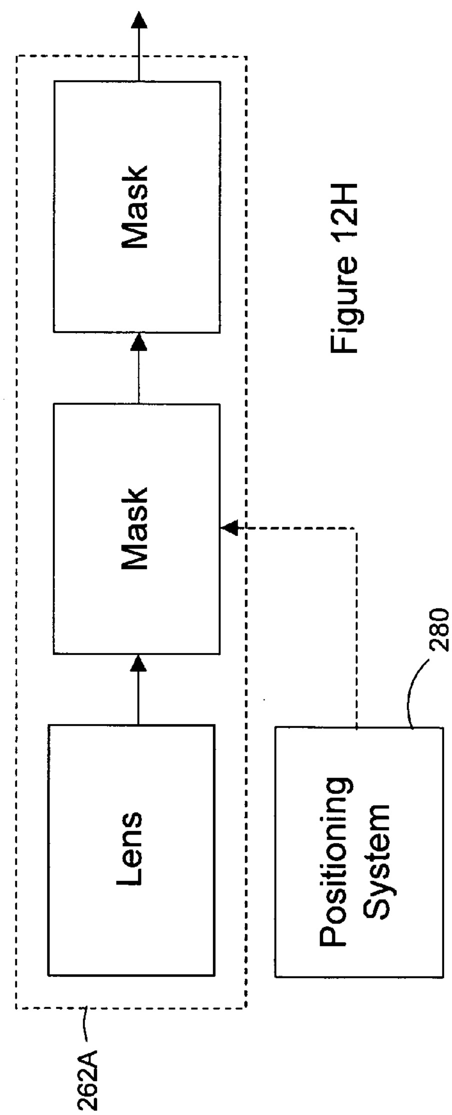
Figure 12I:
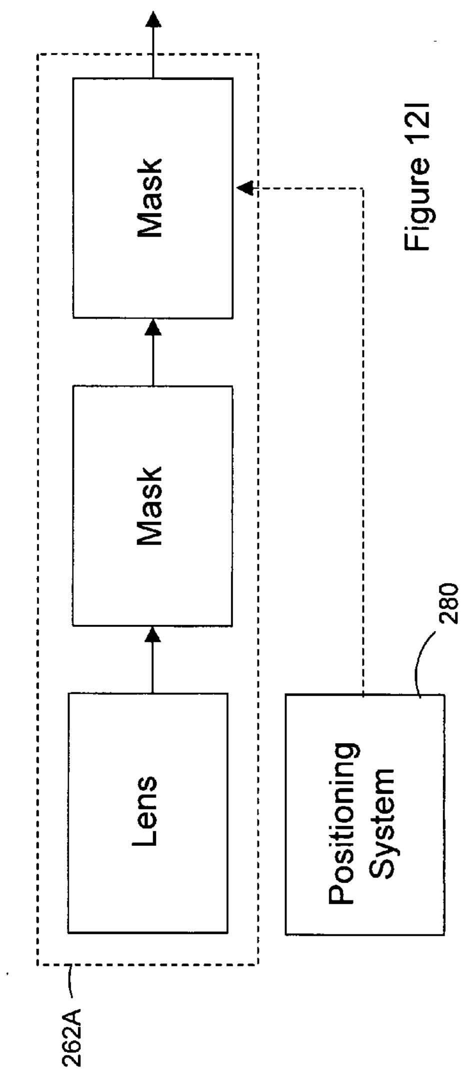
Figure 12J:
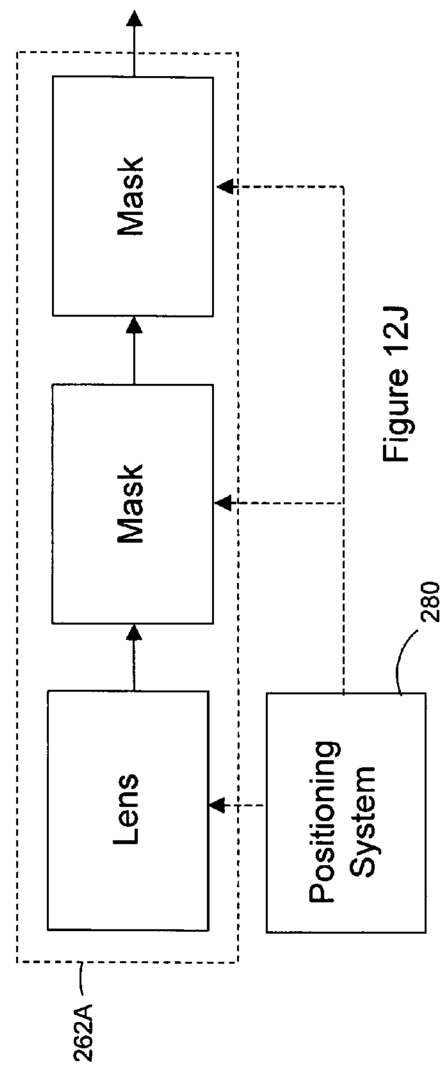
Figure 12K:
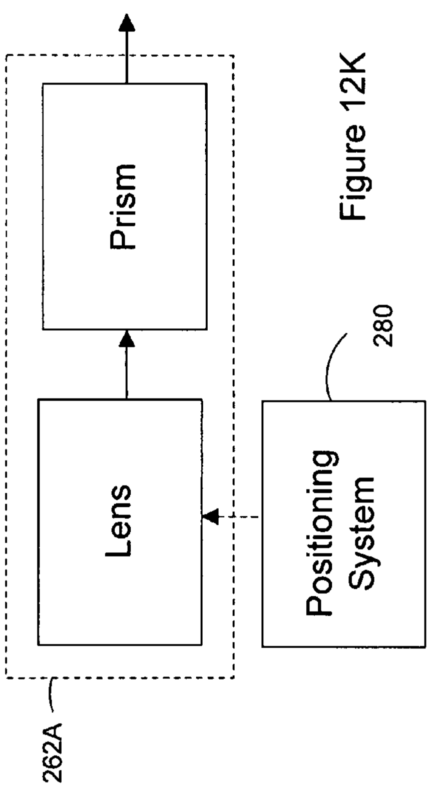
Figure 12L:
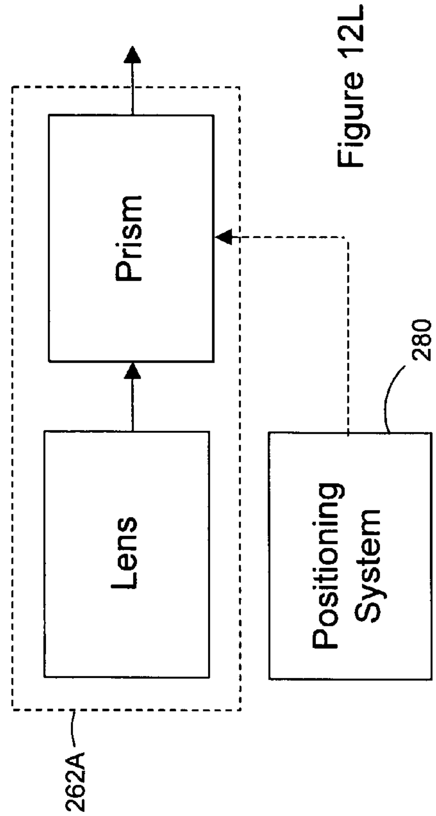
Figure 12M:
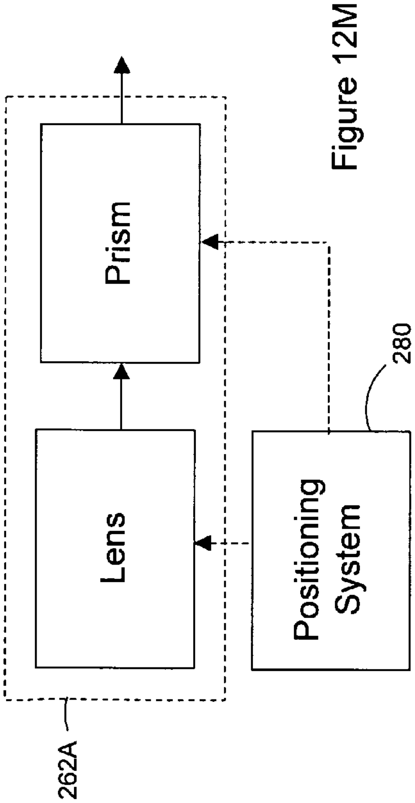
Figure 12N:
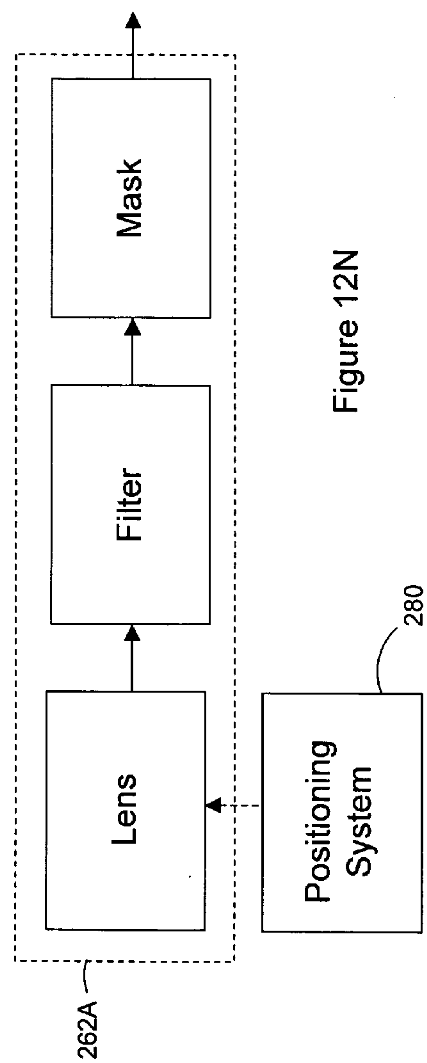
Figure 12O:
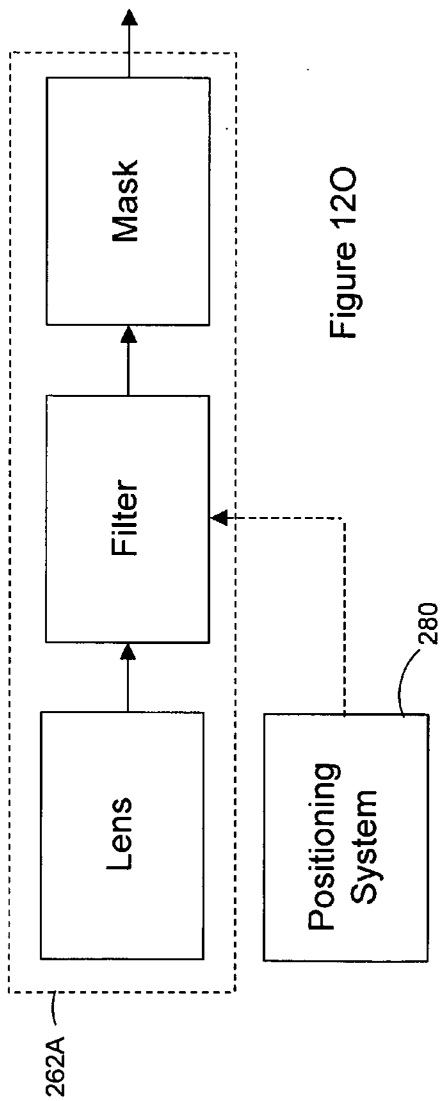
Figure 12P:
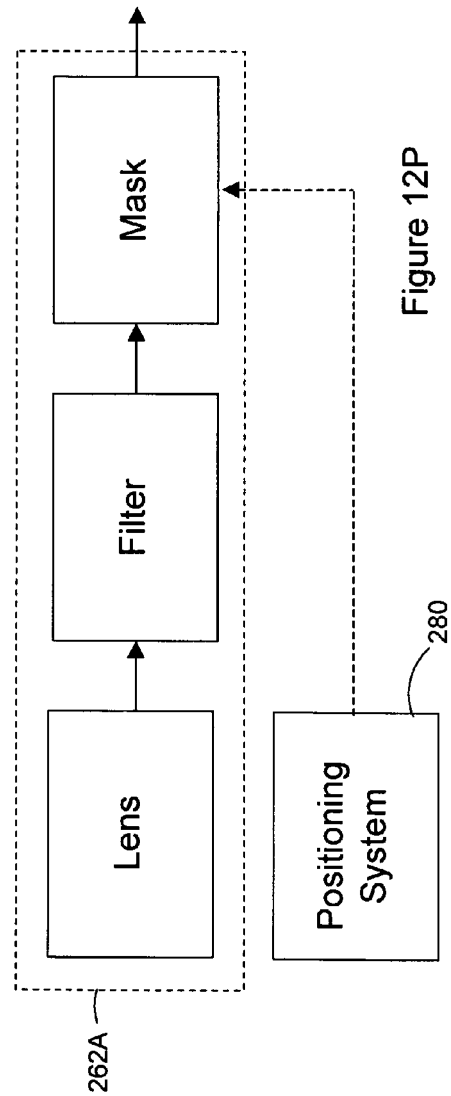
Figure 12Q:
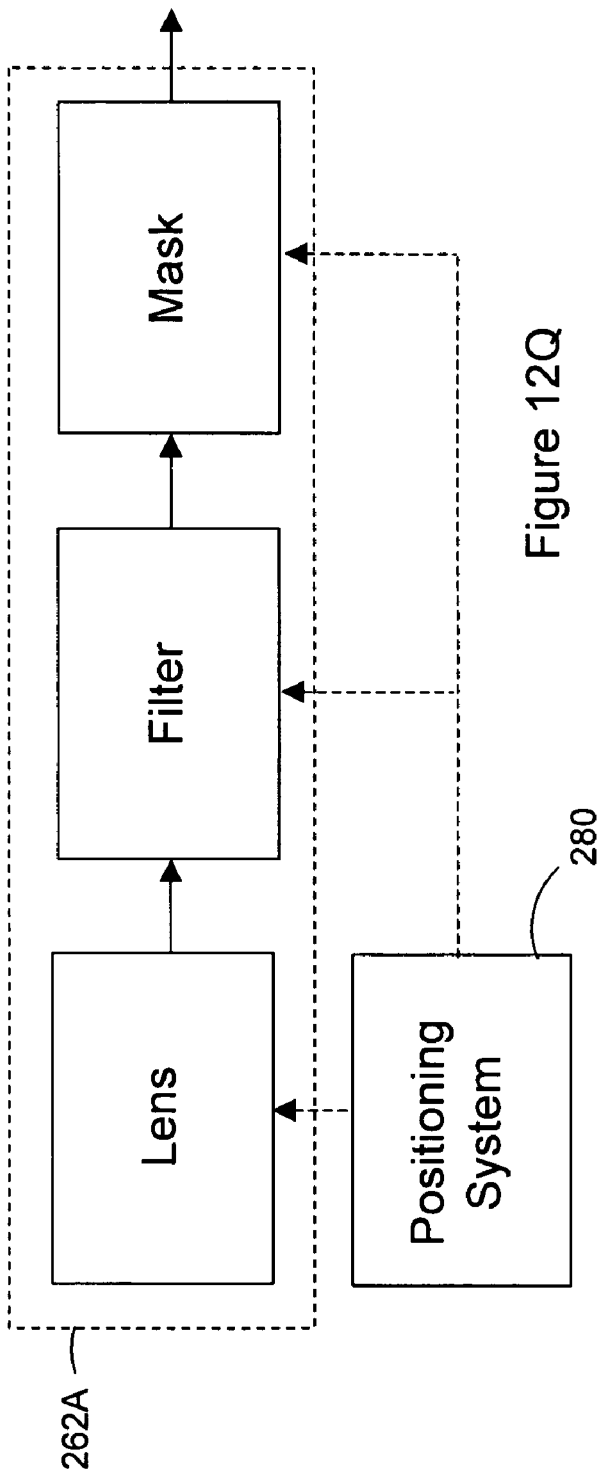

FIGS. 12A-12Q are block diagram representations showings example configurations of an optics portion, e.g., optics portion 262A, and the positioning system 280 in accordance with various embodiments of the present invention. FIGS. 12A-12C each show an optics portion (e.g., optics portion 262A) having two lens (e.g., two lenslets arranged in a stack). Also shown is a portion of a positioning system 280 that moves one or more portions of the optics portion 262A. In FIG. 12A, a first one of the lenses is movable by the positioning system 280. In FIG. 12B, a second one of the lenses is movable by the positioning system. In FIG. 12C, each of the lenses is movable by the positioning system 280.

FIGS. 12D-12F each show an optics portion (e.g., optics portion 262A) having one lens and one mask. Also shown is a portion of a positioning system 280 that moves one or more portions of the optics portion 262A. In FIG. 12D, the lens is movable by the positioning system 280. In FIG. 12E, the mask is movable by the positioning system. In FIG. 12F, the lens and the mask are each movable by the positioning system 280.

FIGS. 12G-12I each show an optics portion (e.g., optics portion 262A) having one lens and two masks. Also shown is a portion of a positioning system 280 that moves one or more portions of the optics portion 262A. In FIG. 12G, the lens is movable by the positioning system 280. In FIG. 12H, the first mask is movable by the positioning system. In FIG. 12I, the second mask is movable by the positioning system. In FIG. 12J, the lens and the two masks are each movable by the positioning system 280.

FIGS. 12K-12M each show an optics portion (e.g., optics portion 262A) having one lens and a prism. Also shown is a portion of a positioning system 280 that moves one or more portions of the optics portion 262A. In FIG. 12K, the lens is movable by the positioning system 280. In FIG. 12L, the prism is movable by the positioning system. In FIG. 12M, the lens and the prism are each movable by the positioning system.

FIG. 12N-12Q each show an optics portion (e.g., optics portion 262A) having one lens, one filter and one mask. Also shown is a portion of a positioning system 280 that moves one or more portions of the optics portion 262A. In FIG. 12N, the lens is movable by the positioning system 280. In FIG. 12O, the filter is movable by the positioning system. In FIG. 12P, the mask is movable by the positioning system. In FIG. 12Q, the lens, the filter and the mask are each movable by the positioning system 280.

As stated above, in this embodiment, the positioning system 280 includes one or more positioners, e.g., positioners 310, 320, one or more of which may include one or more actuators to provide or help provide movement of one or more of the optics portions (or portions thereof) and/or one or more of the sensor portions (or portions thereof).

Figure 12R:
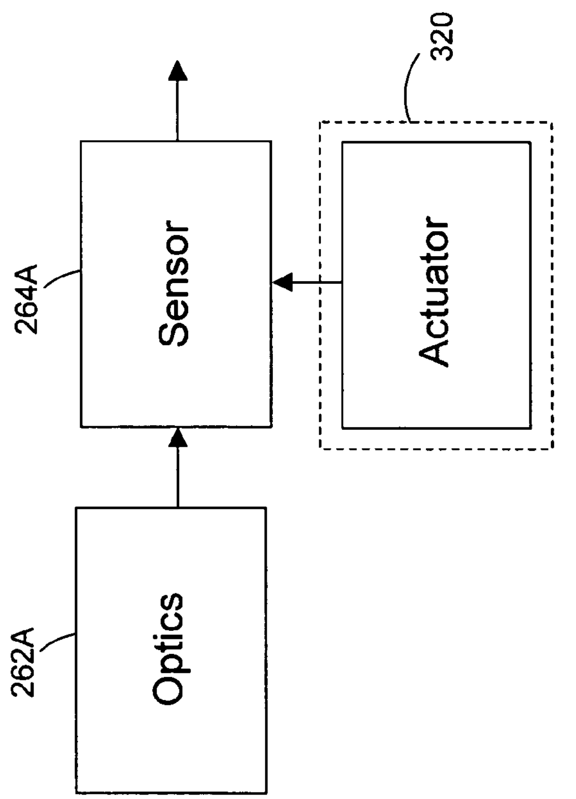
FIGS. 12R-12S are block diagram representations showings example configurations of optics portions, sensor portions and one or more actuators that may be employed in the digital camera apparatus of FIG. 4, in accordance with various embodiments of the present invention.

FIGS. 12R-12AA are block diagram representations showings examples of configurations of a camera channel and that may be employed in the digital camera apparatus 210 in order to move the optics (or portions thereof) and/or the sensor (or portions thereof) of a camera channel, in accordance with various aspects of the present invention. Each of these configurations includes optics, e.g., optics portion 262A, a sensor, e.g., sensor portion 264A, and one or more actuators, e.g., one or more actuators that may be employed in one or more of the positioners 310, 320, of the positioning system 280, in accordance with various aspects of the present invention. The configurations shown in FIGS. 12T-12AA further include a portion of the processor 265.

Figure 12S:
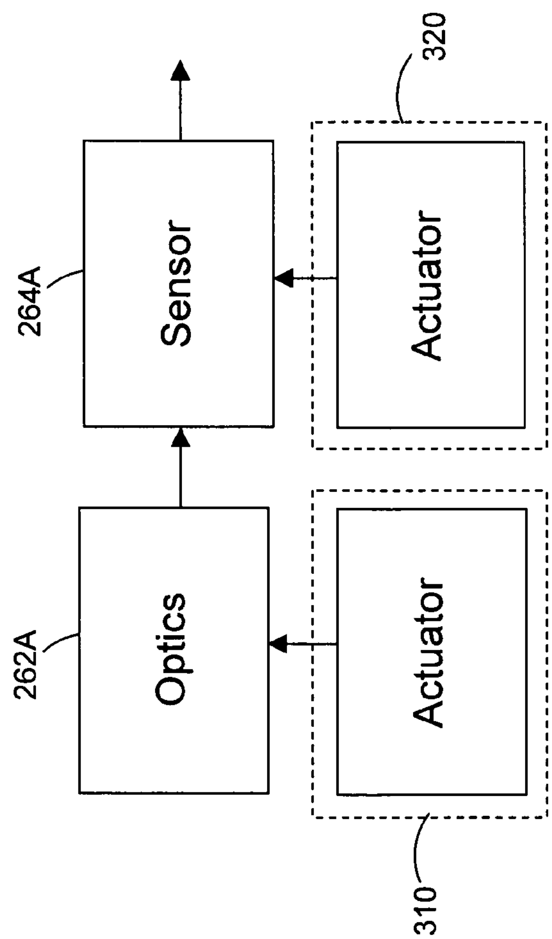

With reference to FIG. 12R, in one configuration, the sensor, e.g., sensor portion 264A, is mechanically coupled to an actuator, e.g., an actuator of positioner 320, adapted to move the sensor portion and thereby change a position of the sensor and/or change a relative positioning between the sensor and the optics. The optics may be stationary and/or may be mechanically coupled to another actuator, e.g., an actuator of positioner 310 (see FIG. 12S), adapted to move the optics and thereby change a position of the optics and/or change a relative positioning between the optics and the sensor. In some embodiments, the optics and the sensor may each be moved to produce a net change in the position of the optics portion relative to the sensor portion. As stated above, the optics portion, e.g., optics portion 262A, of a camera channel receives light from within a field of view and transmits one or more portions of such light. The sensor portion, e.g., sensor portion 264A, of the camera channel receives one or more portion of the light transmitted by the optics portion of the camera channel and provides one or more outputs signals indicative thereof.

Figure 12T:
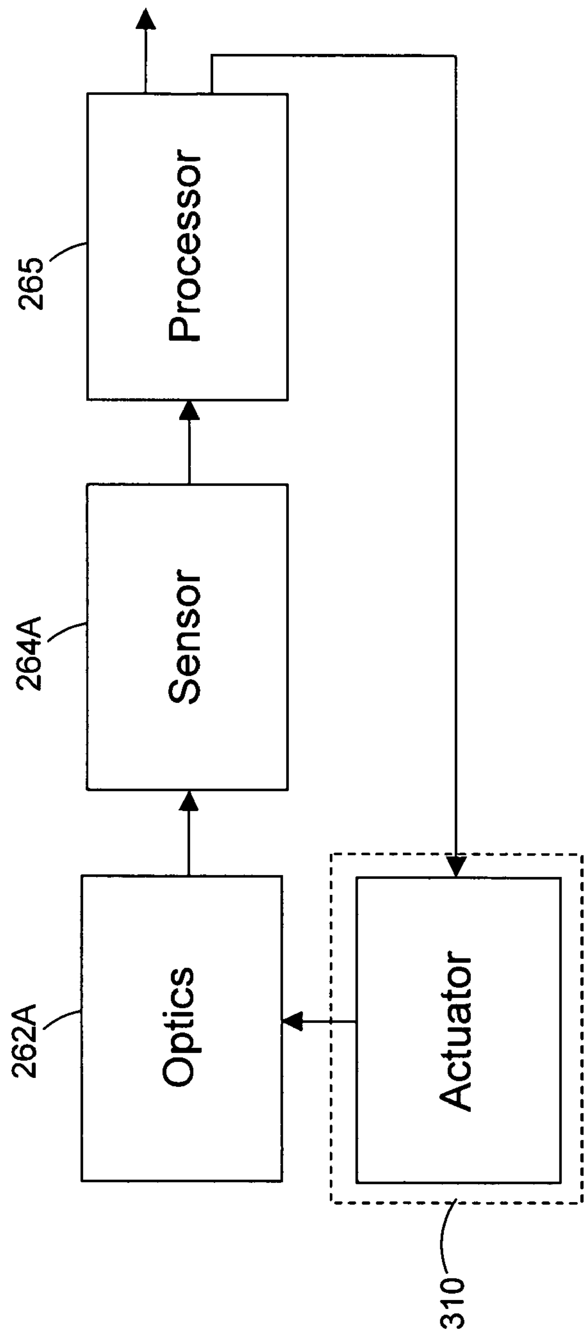
Figure 12U:
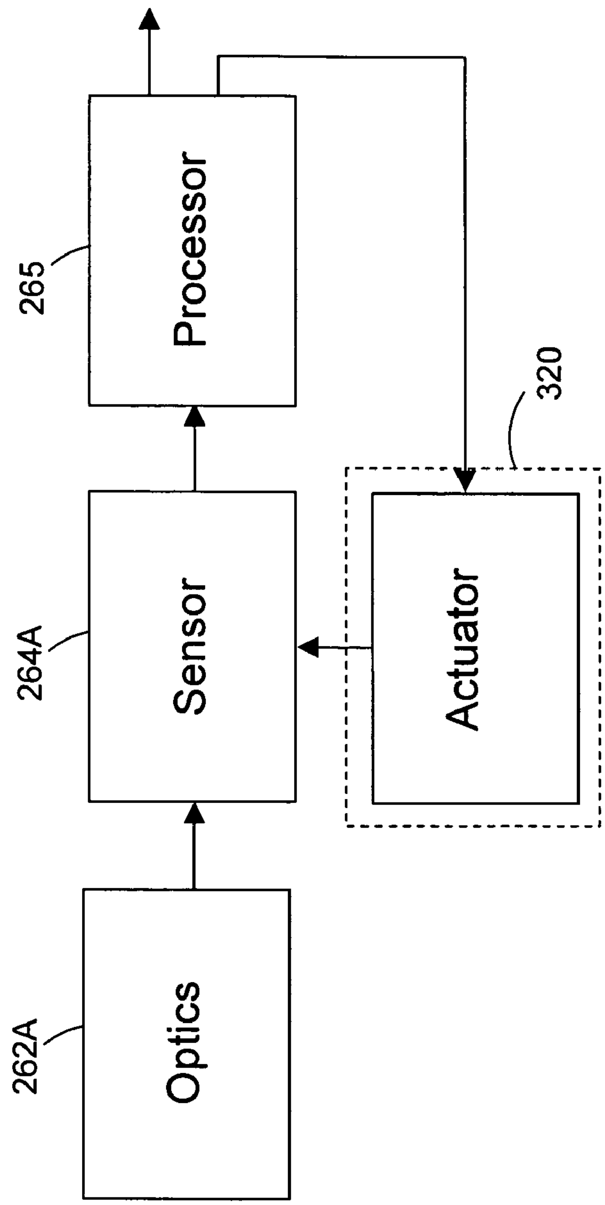
Figure 12V:
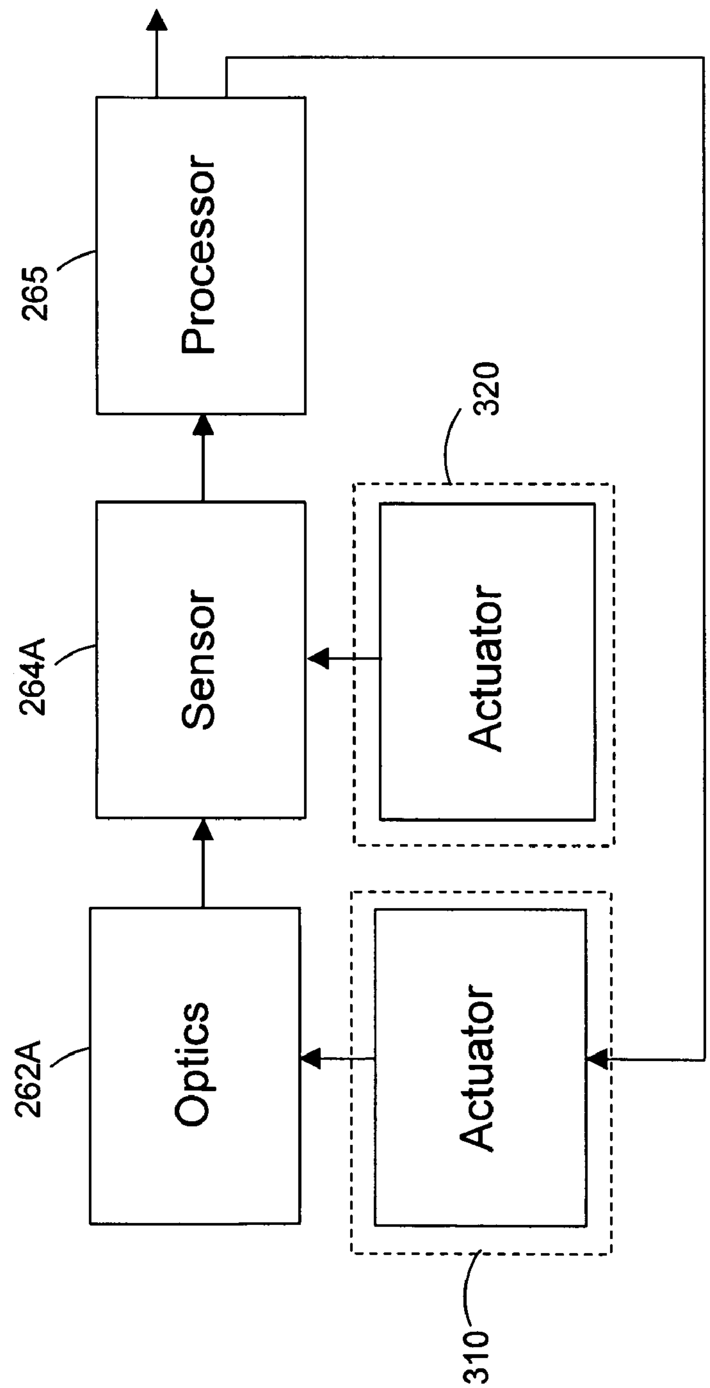
Figure 12W:
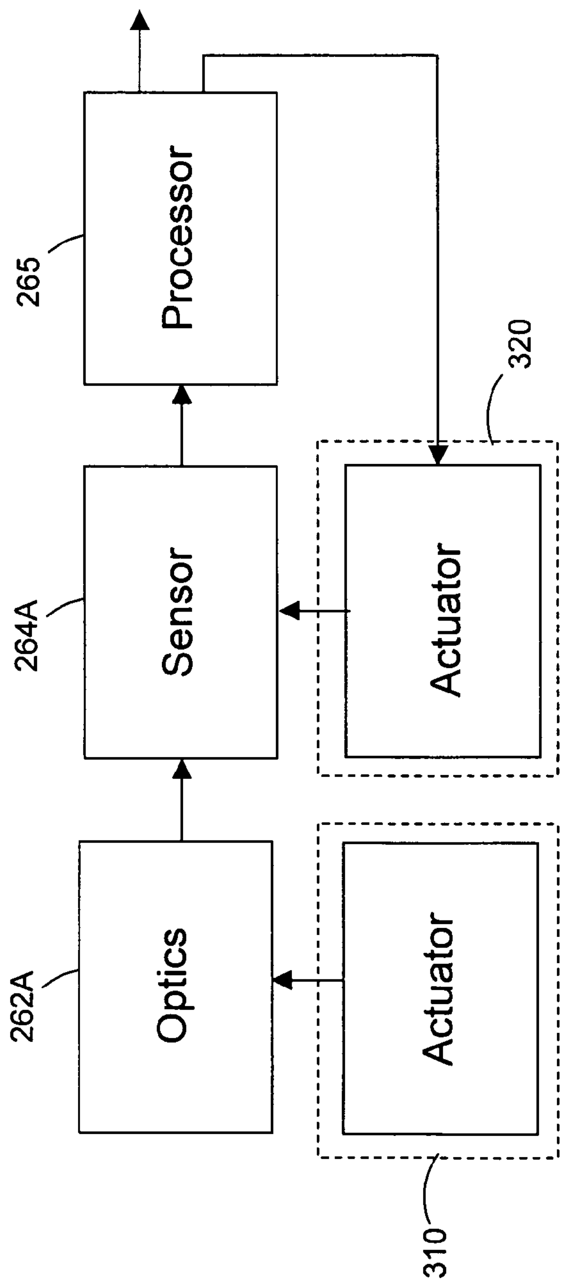
Figure 12X:
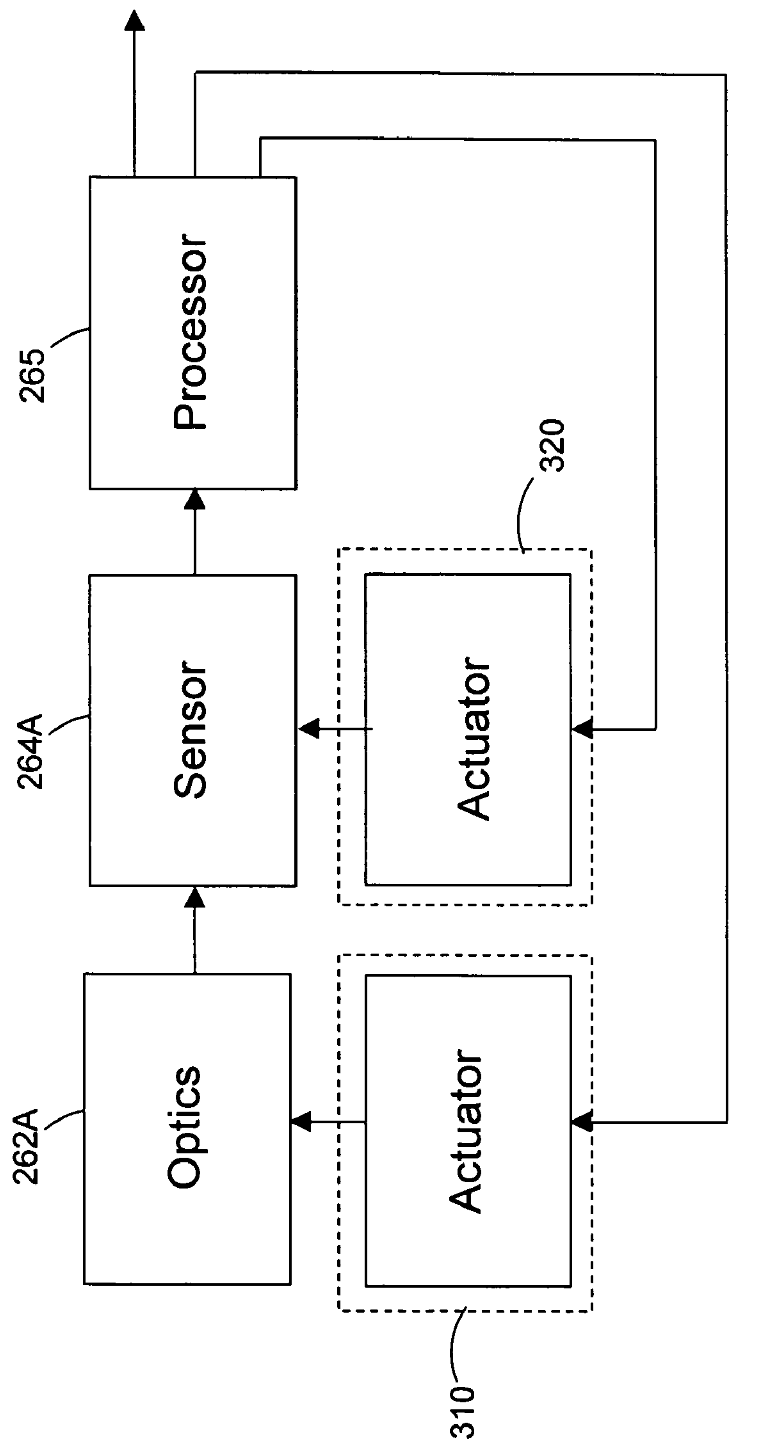

With reference to FIGS. 12T-12X, in some configurations, one or more of the signals provided by the sensor, e.g., sensor portion 264A, are supplied to the processor 265, which generates one or more signals to control one or more actuators coupled to the sensor, e.g., sensor portion 264A, (see for example, FIGS. 12U, 12W, 12X) and/or one or more signals to control one or more actuators coupled to the optics, e.g., optics portion 262A (see for example, FIGS. 12T, 12V, 12X). The control signals may or may not be generated in response to one or more signals from the sensor, e.g., sensor portion 264A. For example, in some embodiments, the processor 265 generates the control signals in response, at least in part, to one or more of the signals from the sensor, e.g., sensor portion 264A. In some other embodiments, the control signals are not generated in response, at least in part, to one or more of the signals from the sensor, e.g., sensor portion 264A.

Figure 12Y:
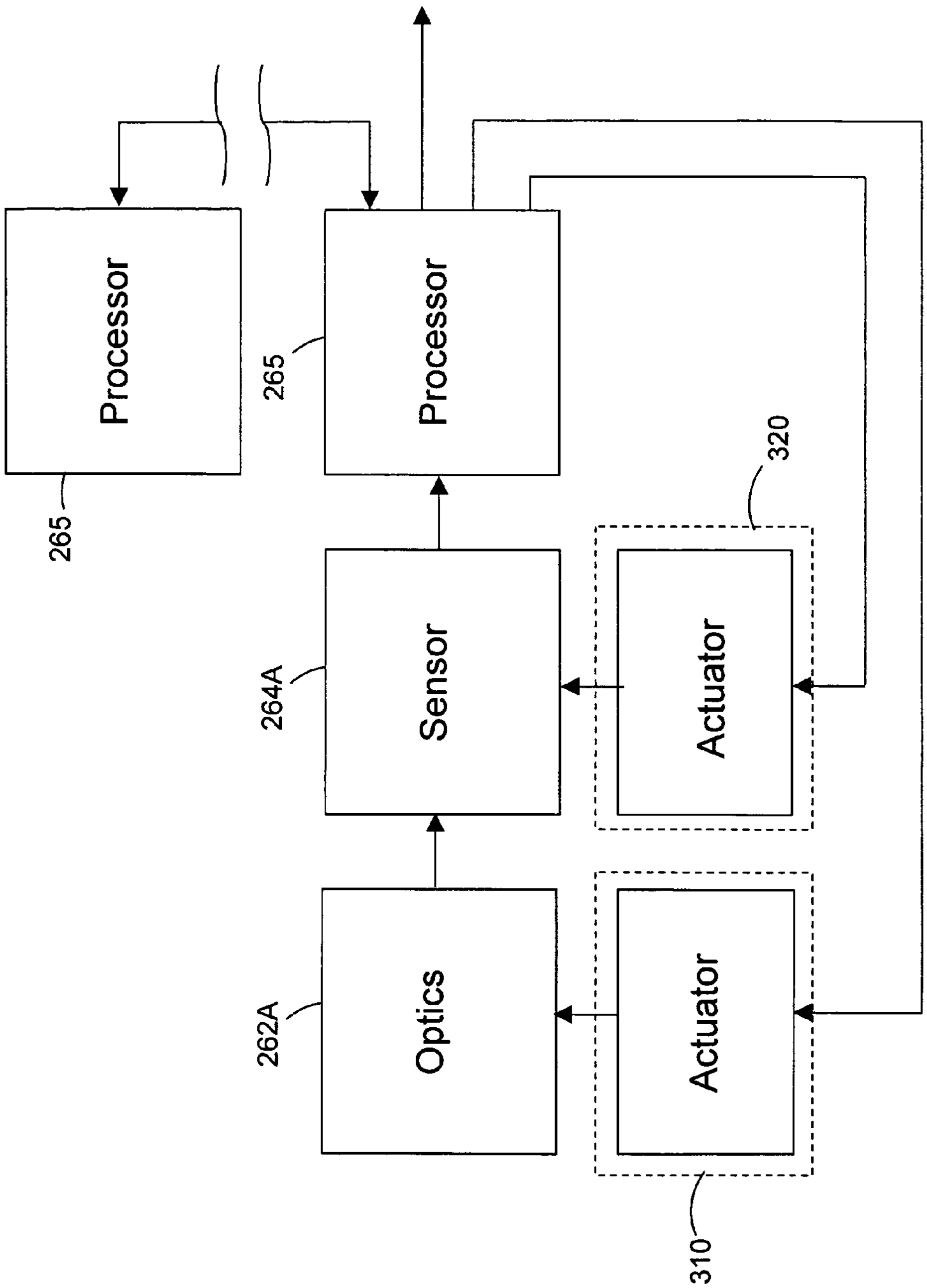
Figure 12Z:
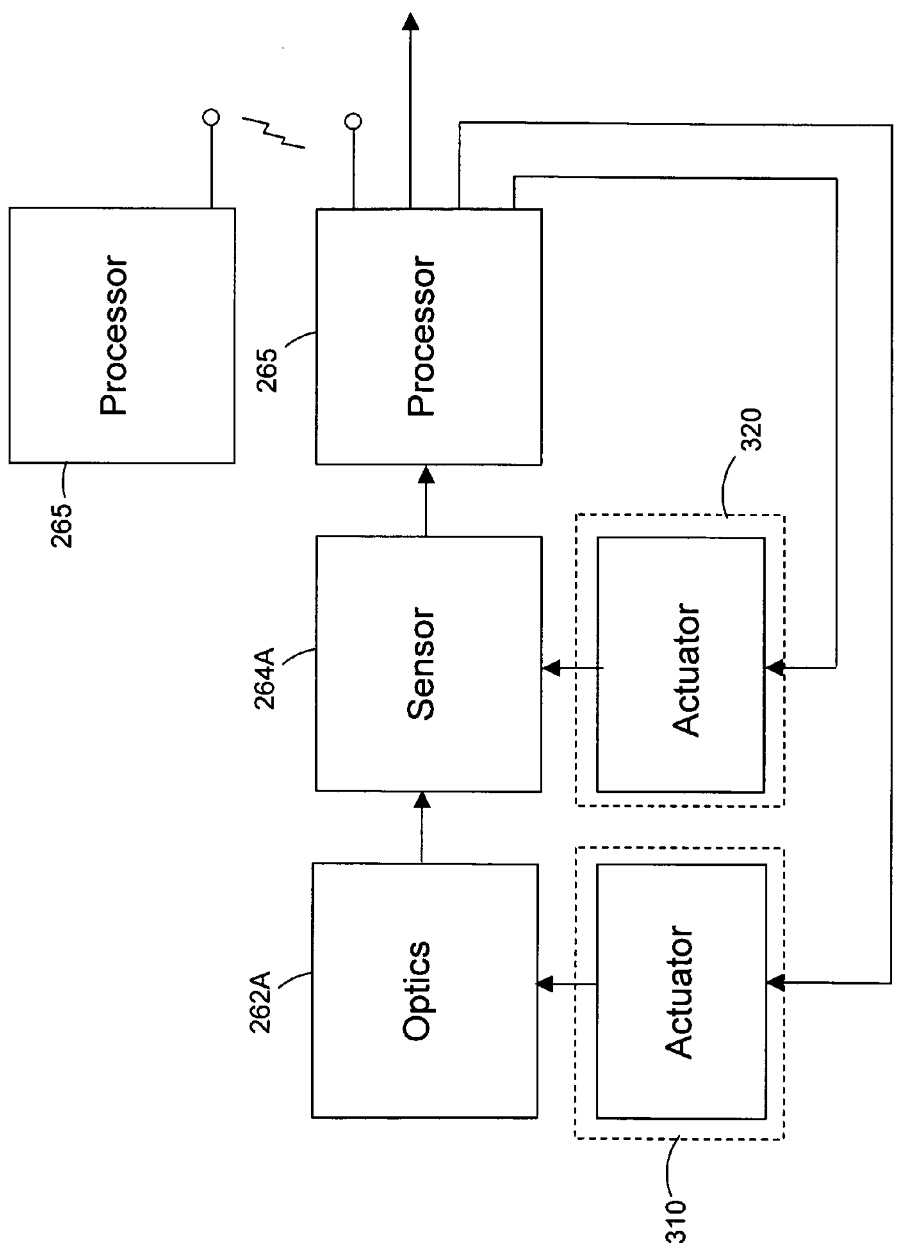
Figure 12A:
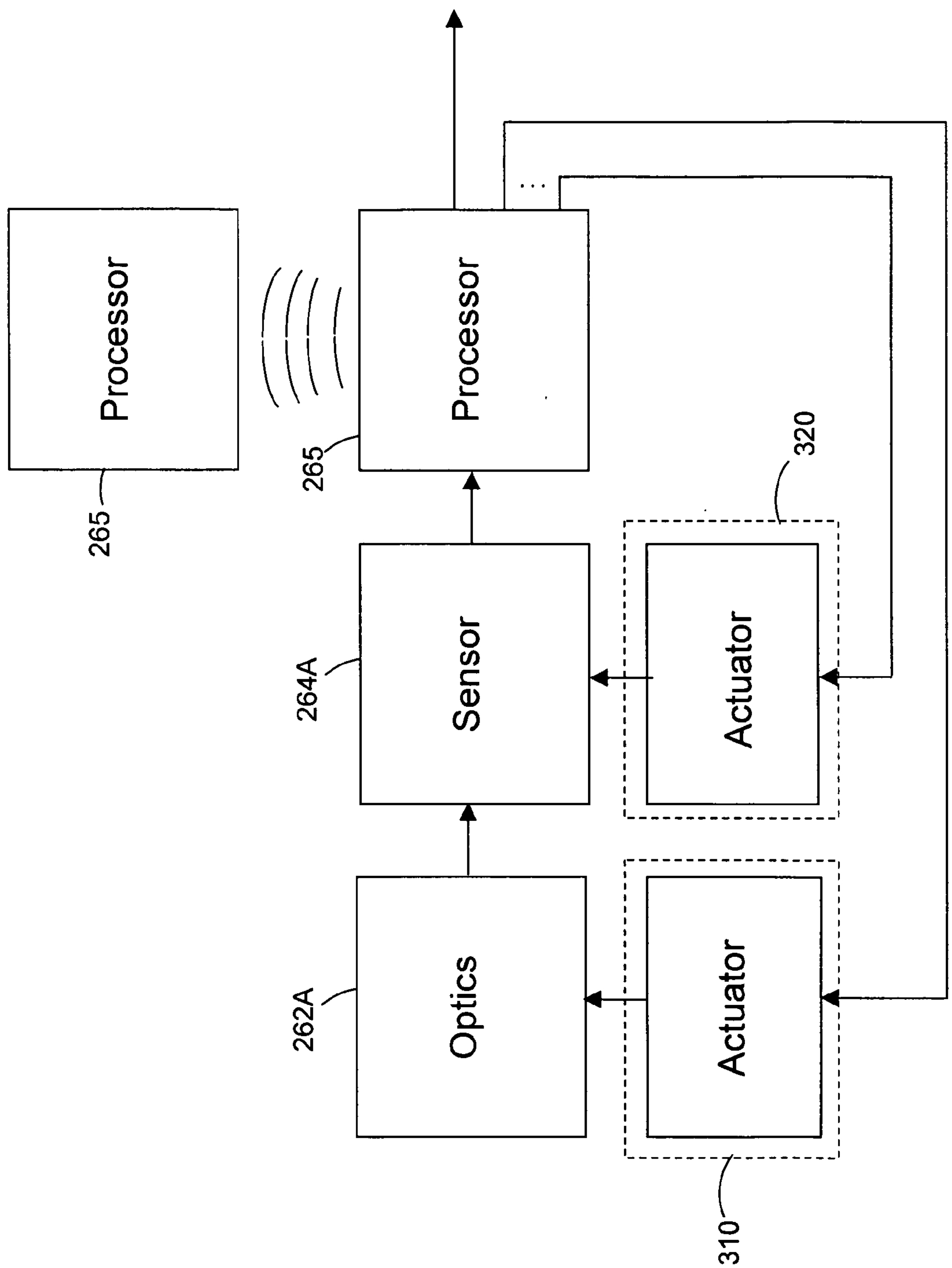

With reference to FIGS. 12Y-12AA, and as further described herein, in some configurations, the processor may include multiple portions that are coupled via one or more communication links, which may be wired and/or wireless.

Figure 13A:
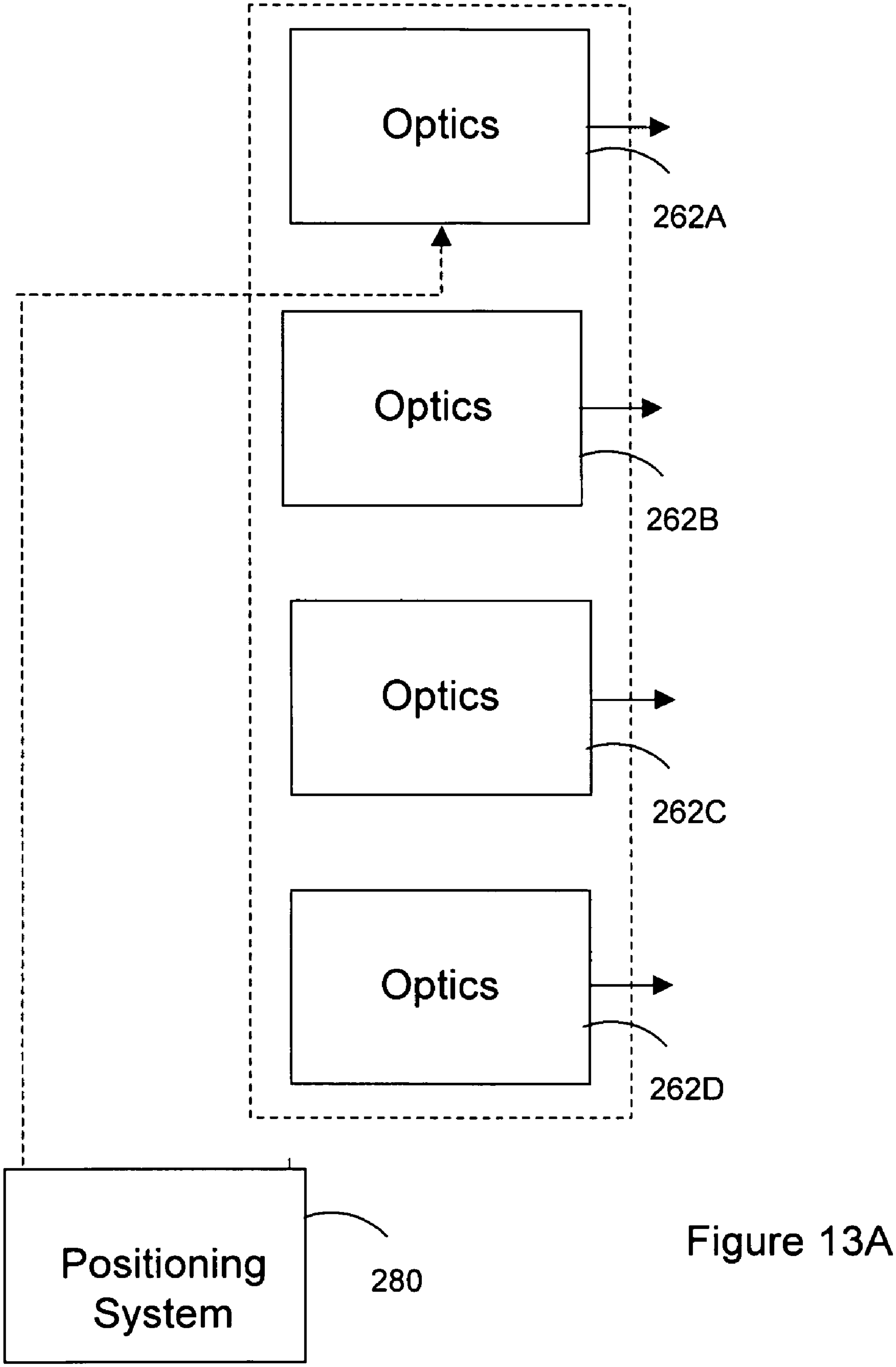
FIGS. 13A-13D are block diagram representations of portions of various embodiments of a digital camera apparatus that includes four optics portions and a positioning system, in accordance with various embodiments of the present invention.
Figure 13B:
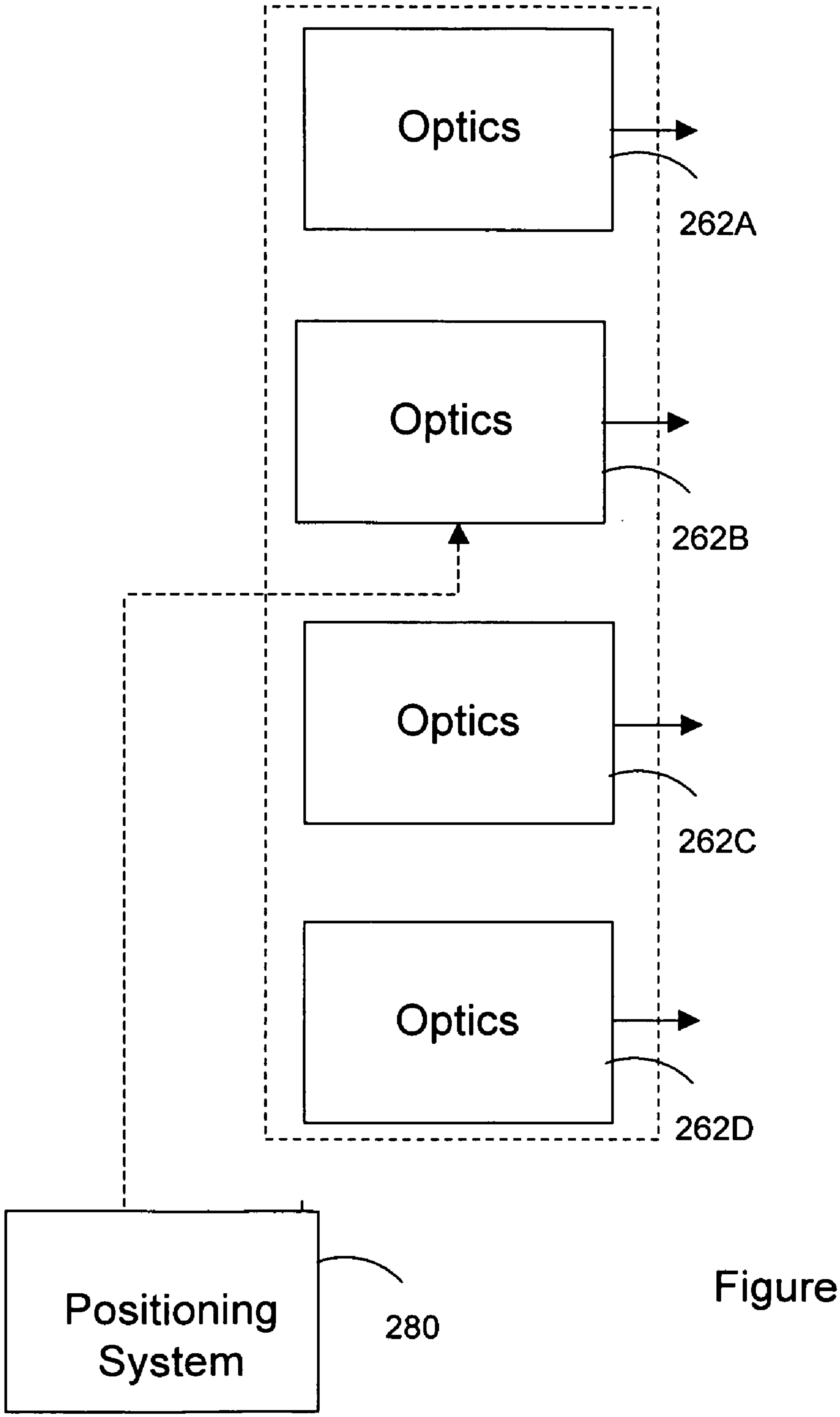
Figure 13C:
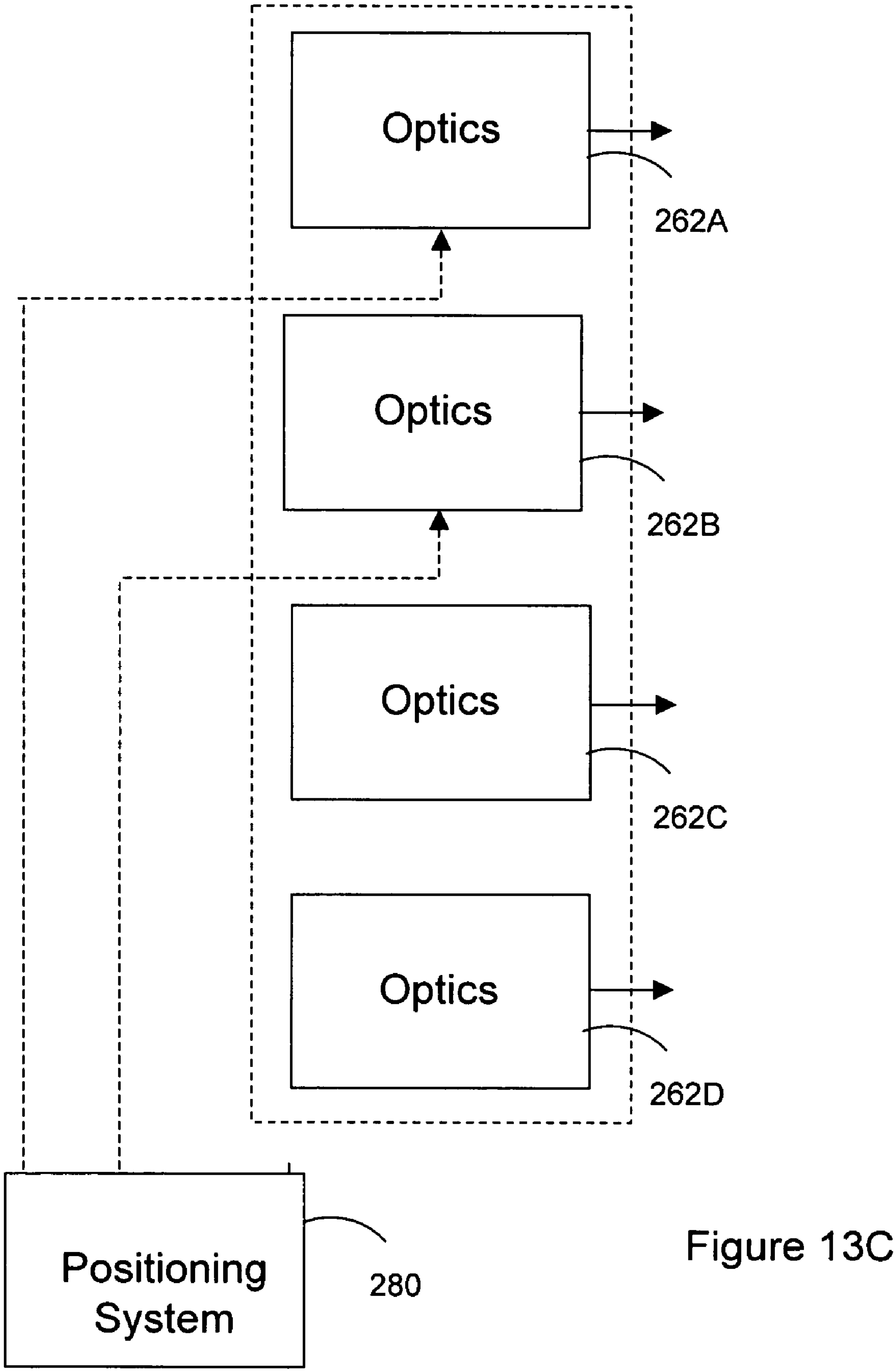
Figure 13D:
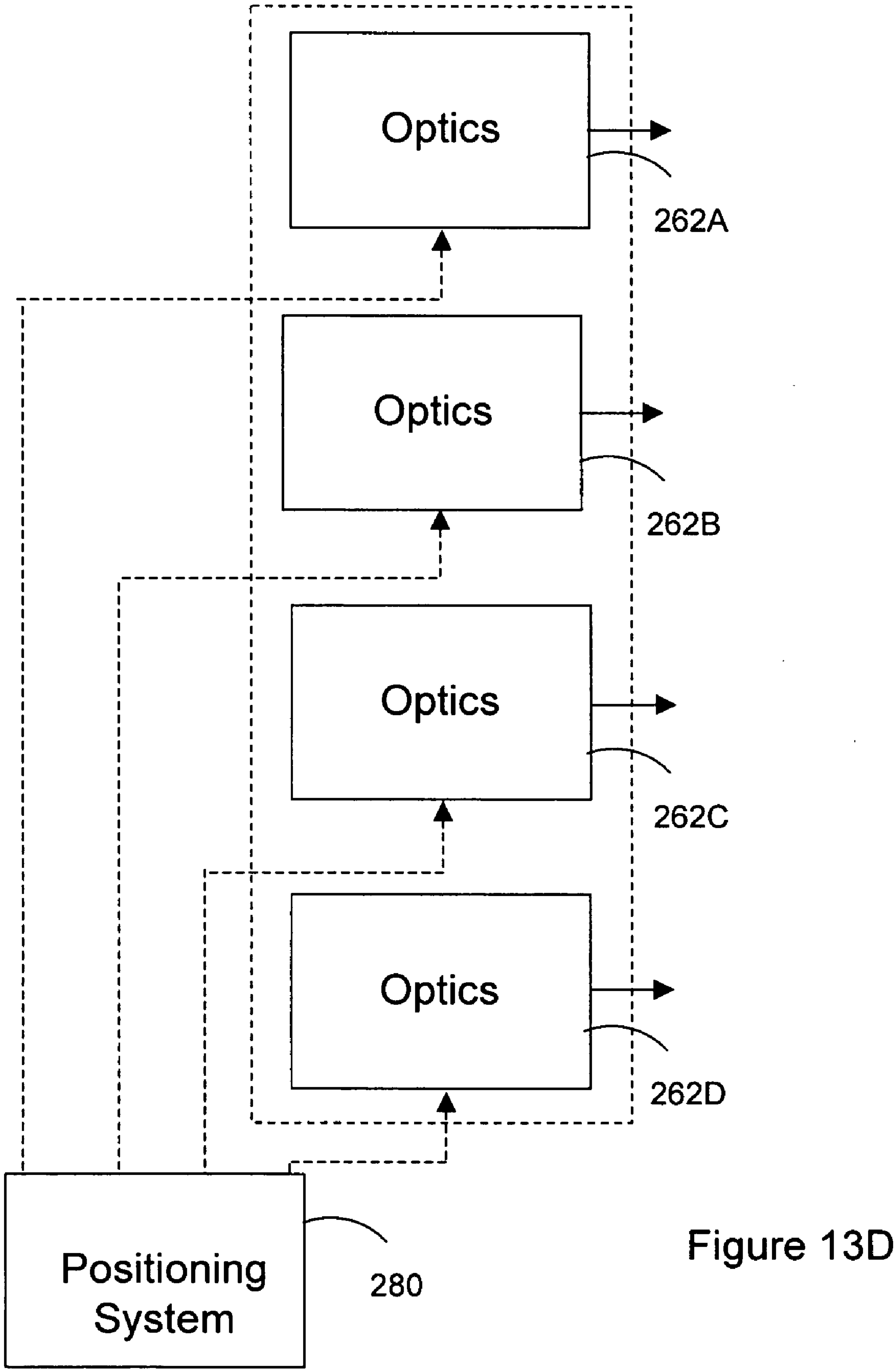

FIGS. 13A-13D are block diagram representations showings example configurations of a system having four optics portions, e.g., optics portions 262A-262D, (each of which may have one or more portions), in accordance with various embodiments of the present invention. In FIG. 13A, the first optics portion, e.g., optics portion 262A, is movable by the positioning system 280. In FIG. 13B, the second optics portion, e.g., optics portion 262B, is movable by the positioning system 280. In FIG. 13C, the first and second optics portions, e.g., optics portion 262A-262B, are movable by the positioning system 280. In FIG. 13D, all of the optics portions, e.g., optics portion 262A-262D, are movable by the positioning system 280.

Figure 13F:
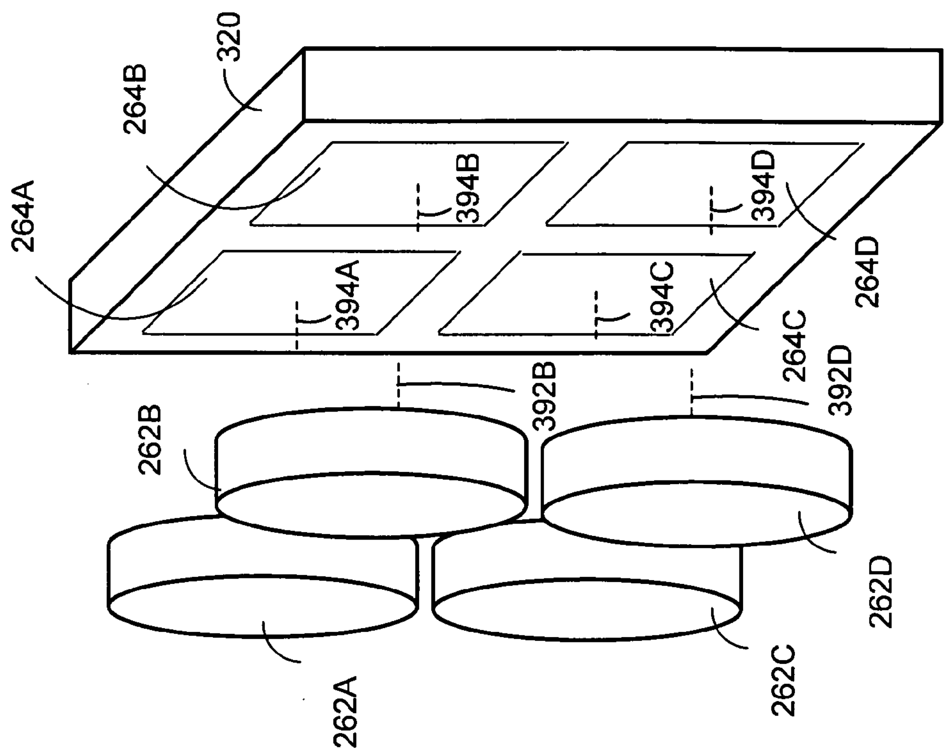
FIGS. 13F-13O are block diagram representations of the portion of the digital camera apparatus of FIG. 13E, with the four optics portions and the four sensor portions in various states of relative positioning, after various types of movement of one or more of the four optics portions, in accordance with various embodiments of the present invention.
Figure 13E:
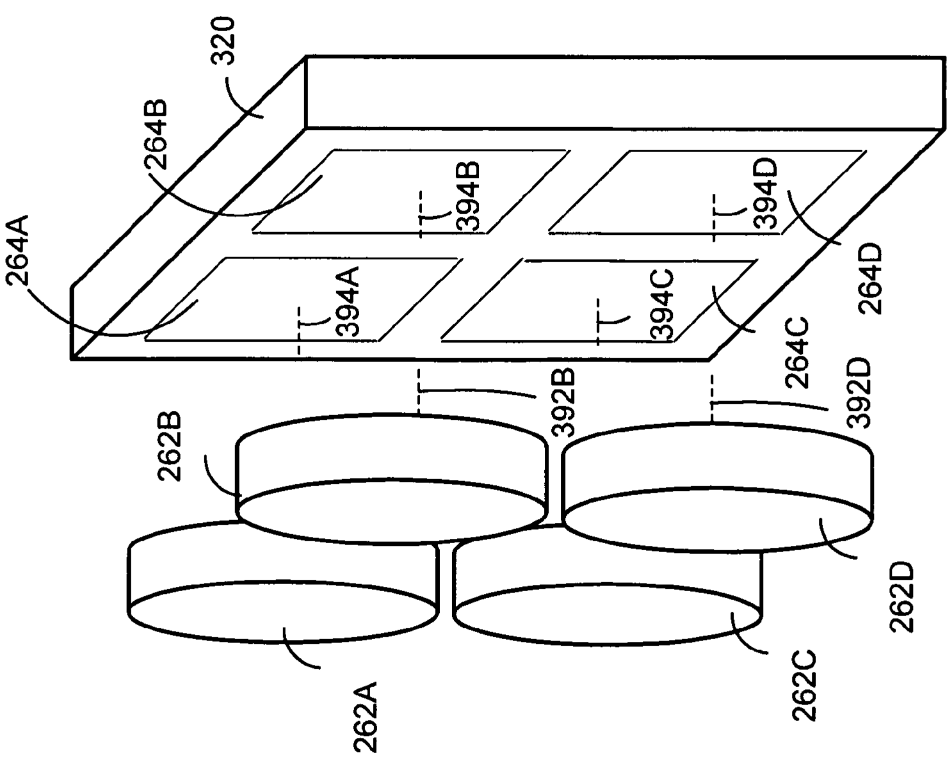
FIG. 13E is a block diagram representation of a portion of a digital camera apparatus that includes four optics portions and four sensor portions, with the four optics portions and the four sensor portions in a first relative positioning, in accordance with one embodiment of the present invention.
Figure 13G:
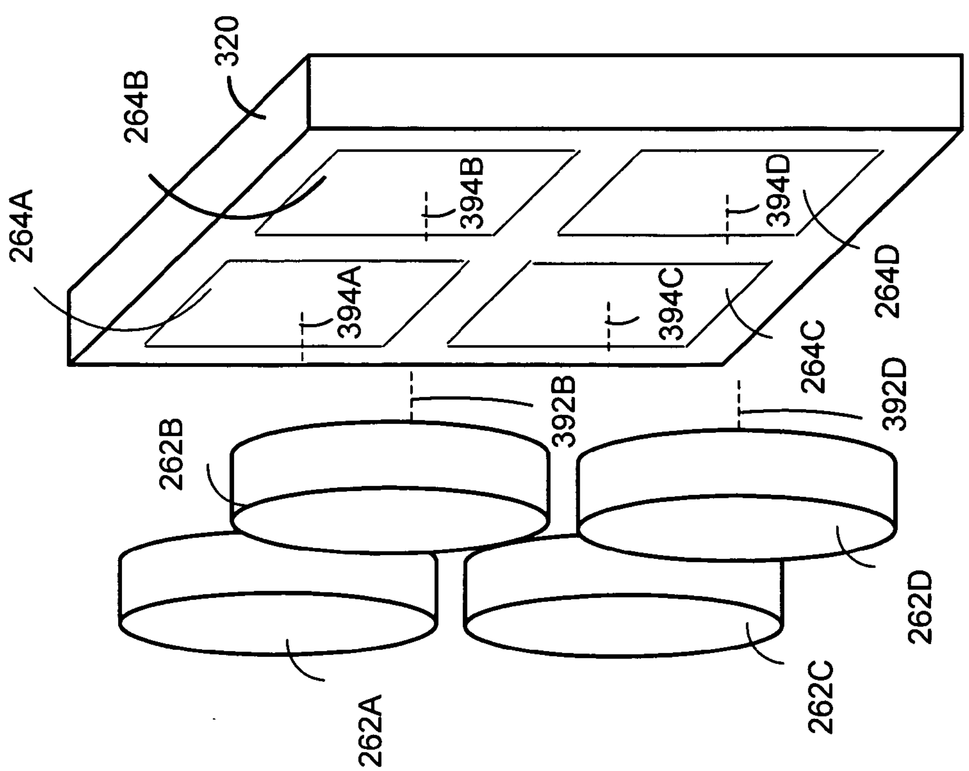
Figure 13H:
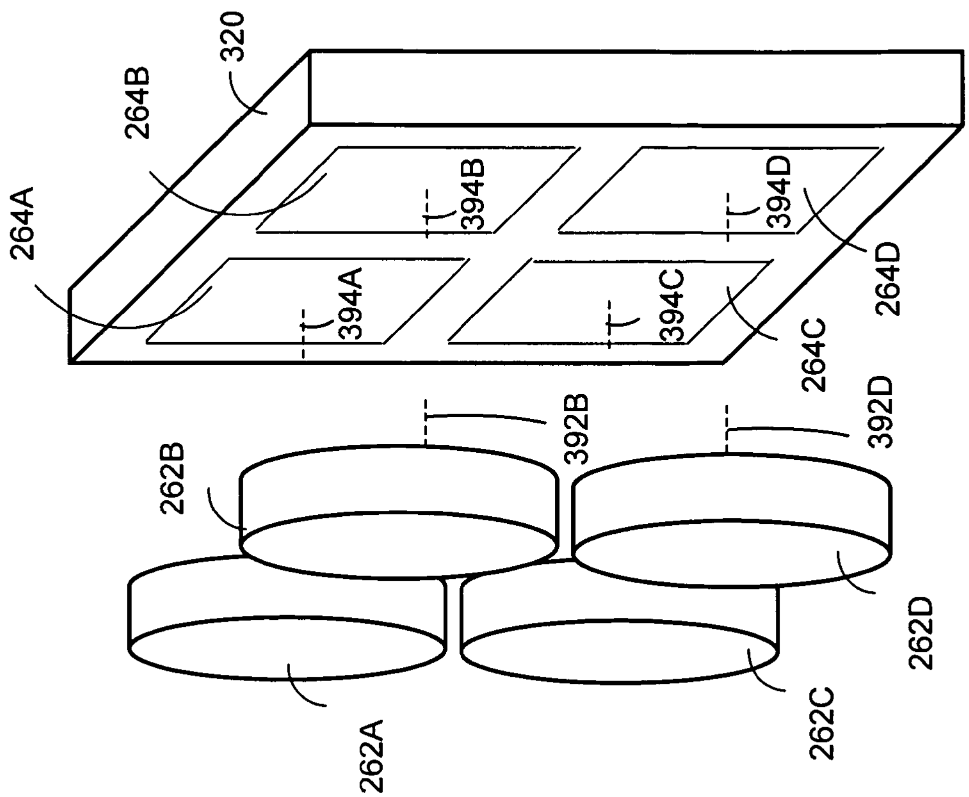
Figure 13J:
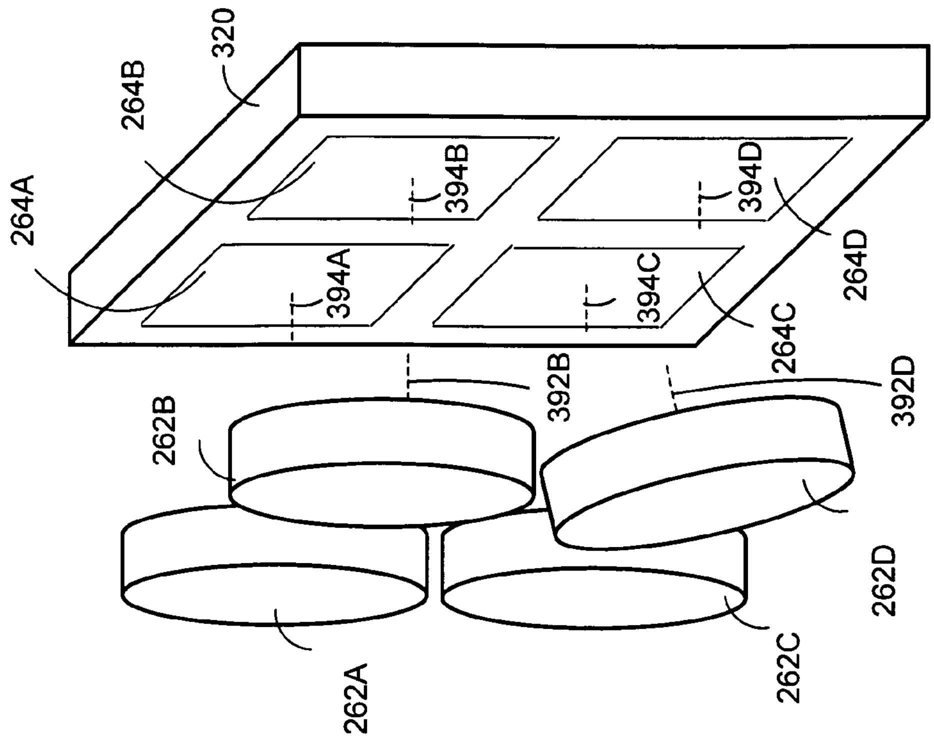
Figure 13I:
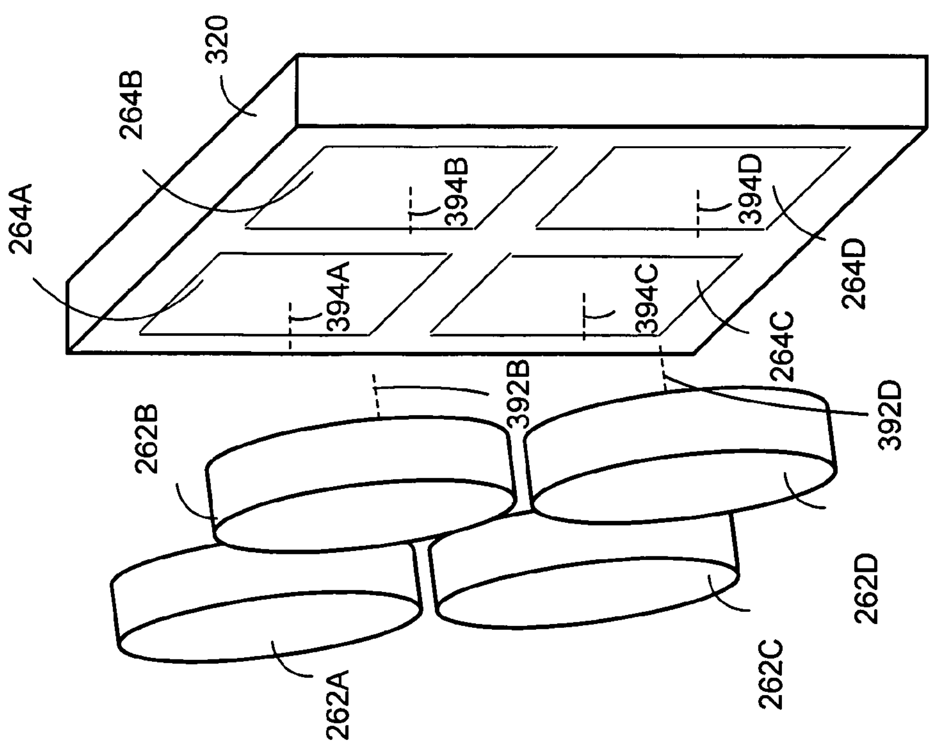
Figure 13L:
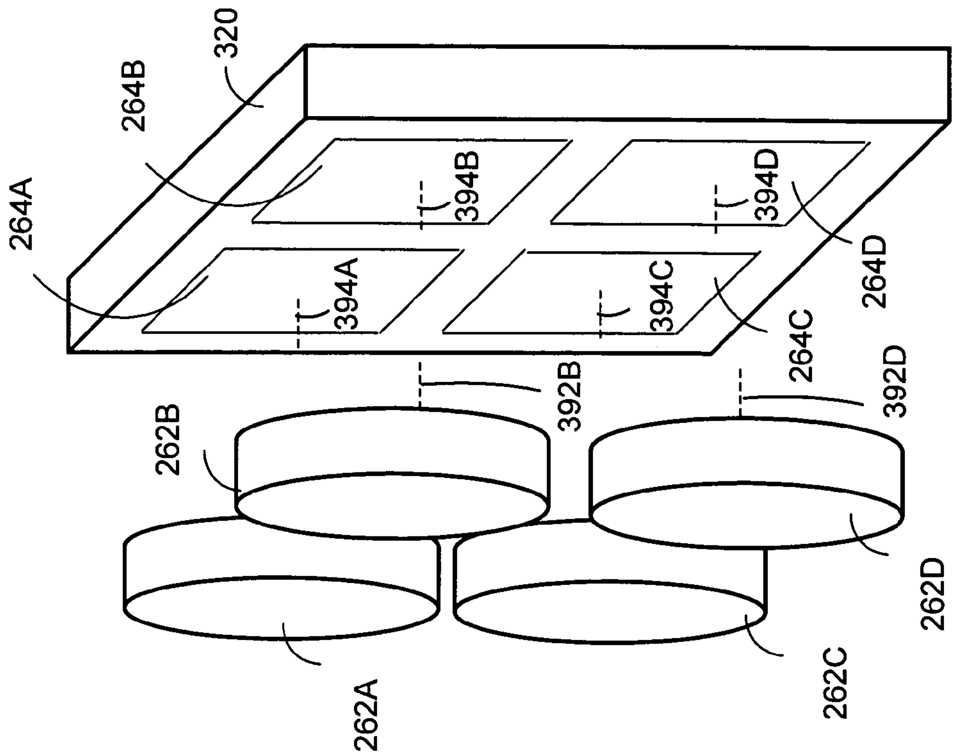
Figure 13K:
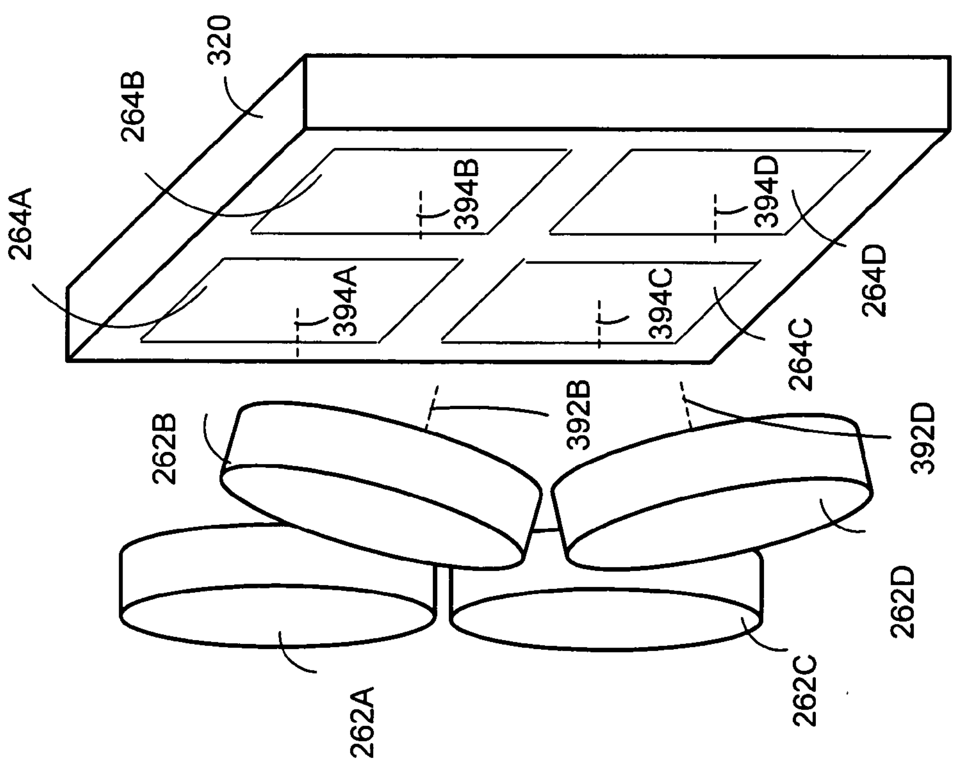
Figure 13M:
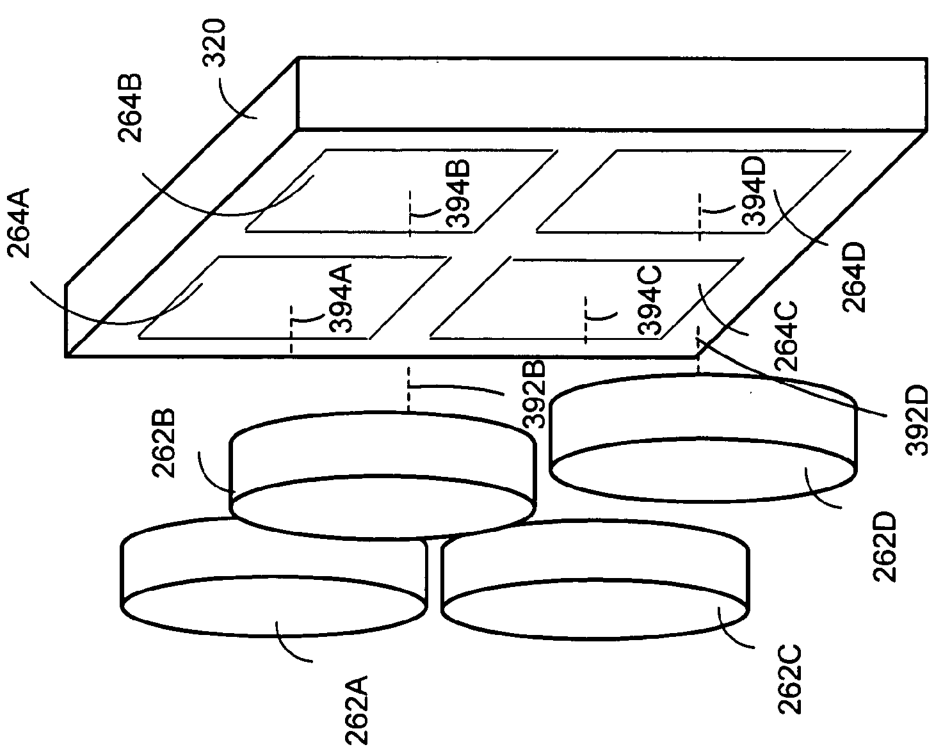
Figure 13N:
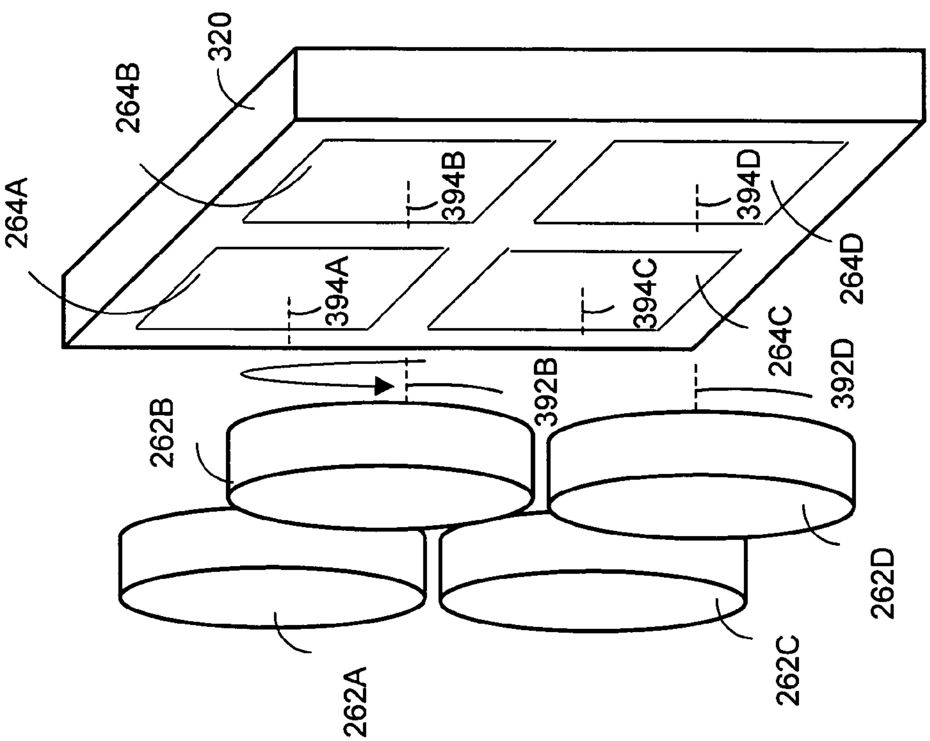
Figure 13O:
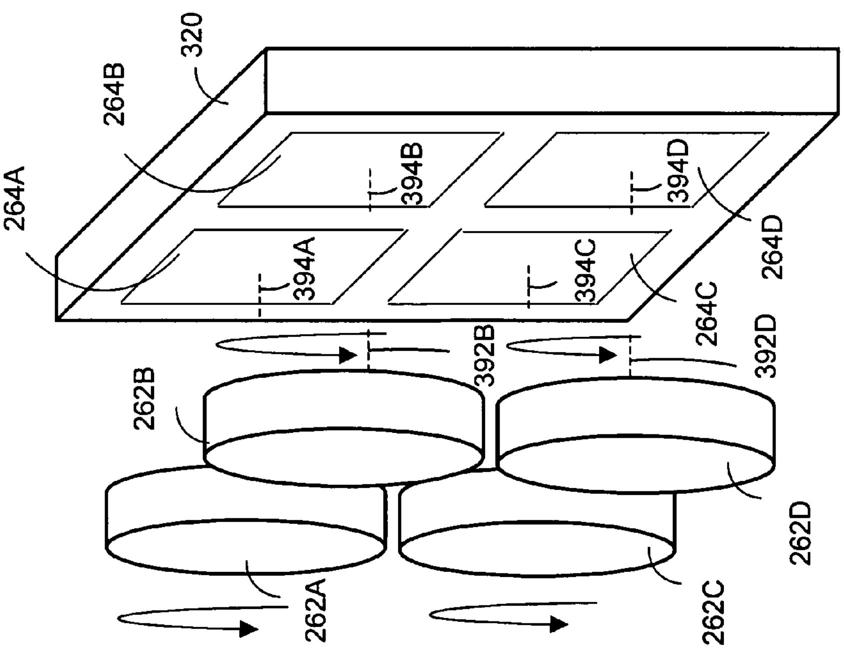

FIGS. 13E-13O depicts four optics portions, e.g., optics portions 262A-262D, in various positions relative to four sensor portions, e.g., sensor portions 264A-264D. More particularly, FIG. 13E shows an example of a first relative positioning of the optic portions 262A-262D and the sensor portions 264A-264D. FIG. 13F shows an example of a relative positioning in which the optics portions 262A-262D have been moved in a direction parallel to the sensor portions (i.e., a direction that is referred to herein as a positive y direction) compared to their positions in the first relative positioning. FIG. 13F shows an example of a relative positioning in which each of the optics portions 262A-262D has been moved in a positive y direction compared to their positions in the first relative positioning. FIG. 13G shows an example of a relative positioning in which optics portions 262A-262B have been moved in a positive y direction compared to their positions in the first relative positioning and optics portions 262C-262D have been moved in a negative y direction compared to their positions in the first relative positioning. FIG. 13H shows an example of a relative positioning in which each of the optics portions 262A-262D have been moved in a z direction compared to their positions in the first relative positioning. FIG. 13I shows an example of a relative positioning in which each of the optics portions 262A-262D have been tilted in a first direction compared to their positions in the first relative positioning. FIG. 13J shows an example of a relative positioning in which one optics portion, optics portion 262D, has been tilted in a first direction compared to its position in the first relative positioning. FIG. 13K shows an example of a relative positioning in which optics portion 262D has been tilted in a first direction compared to its position in the first relative positioning and optics portion 262B has been tilted in a second direction (opposite to the first direction) compared to its position in the first relative positioning. FIG. 13L shows an example of a relative positioning in which one optics portion, optics portion 262D, has been moved in a negative y direction compared to its position in the first relative positioning. FIG. 13M shows an example of a relative positioning in which one optics portion, optics portion 262D, has been moved in a positive x direction compared to its position in the first relative positioning. FIG. 13N shows an example of a relative positioning in which one optics portion, optics portion 262B, has been rotated around an axis compared to their position in the first relative positioning. FIG. 13O shows an example of a relative positioning in which each of the optics portions 262A-262D have been rotated around an axis compared to their positions in the first relative positioning. Other types of movement may also be employed.

Figure 14A:
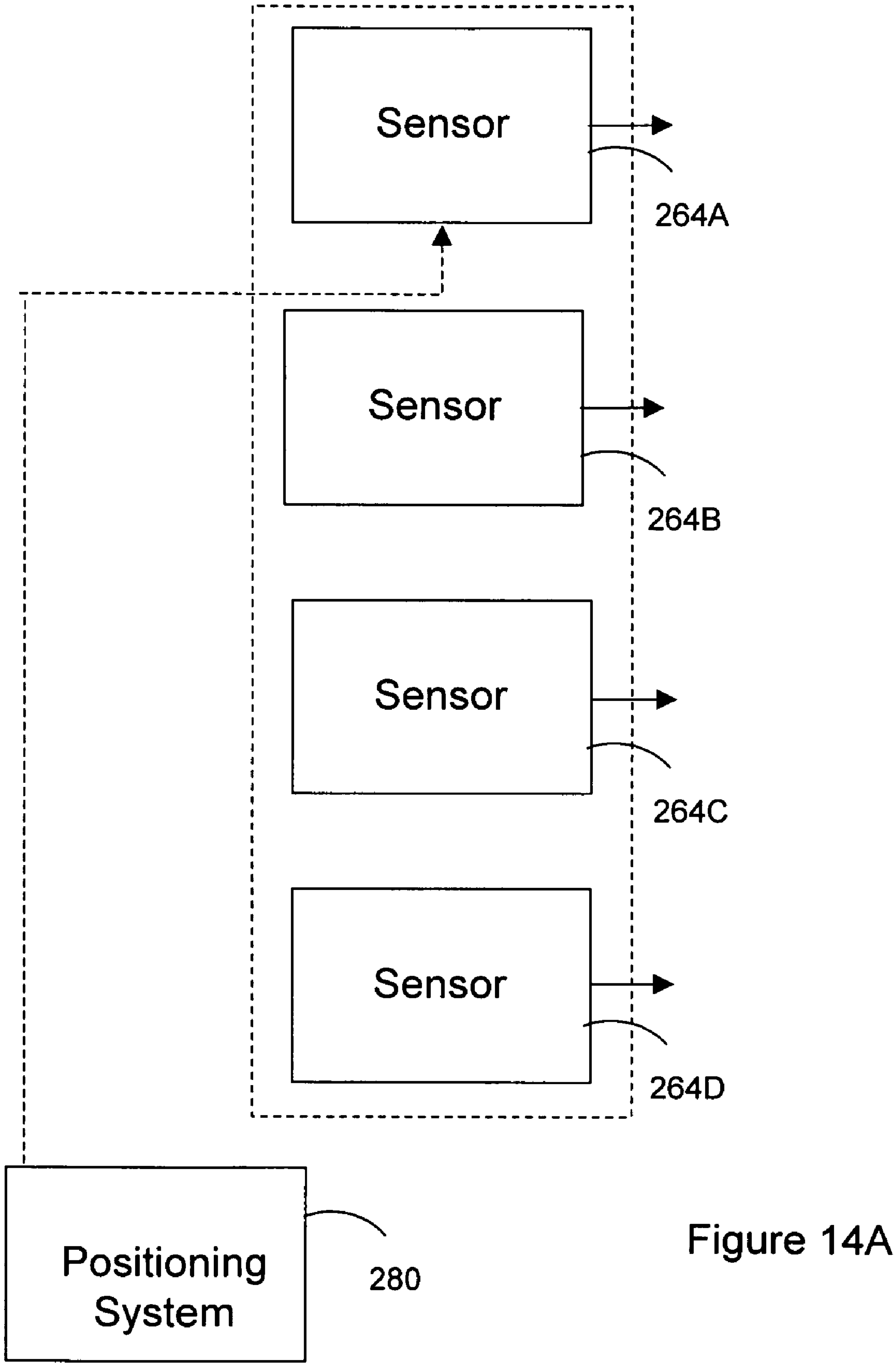
FIGS. 14A-14D are block diagram representations of portions of various embodiments of a digital camera apparatus that includes four sensor portions and a positioning system, in accordance with various embodiments of the present invention.
Figure 14B:
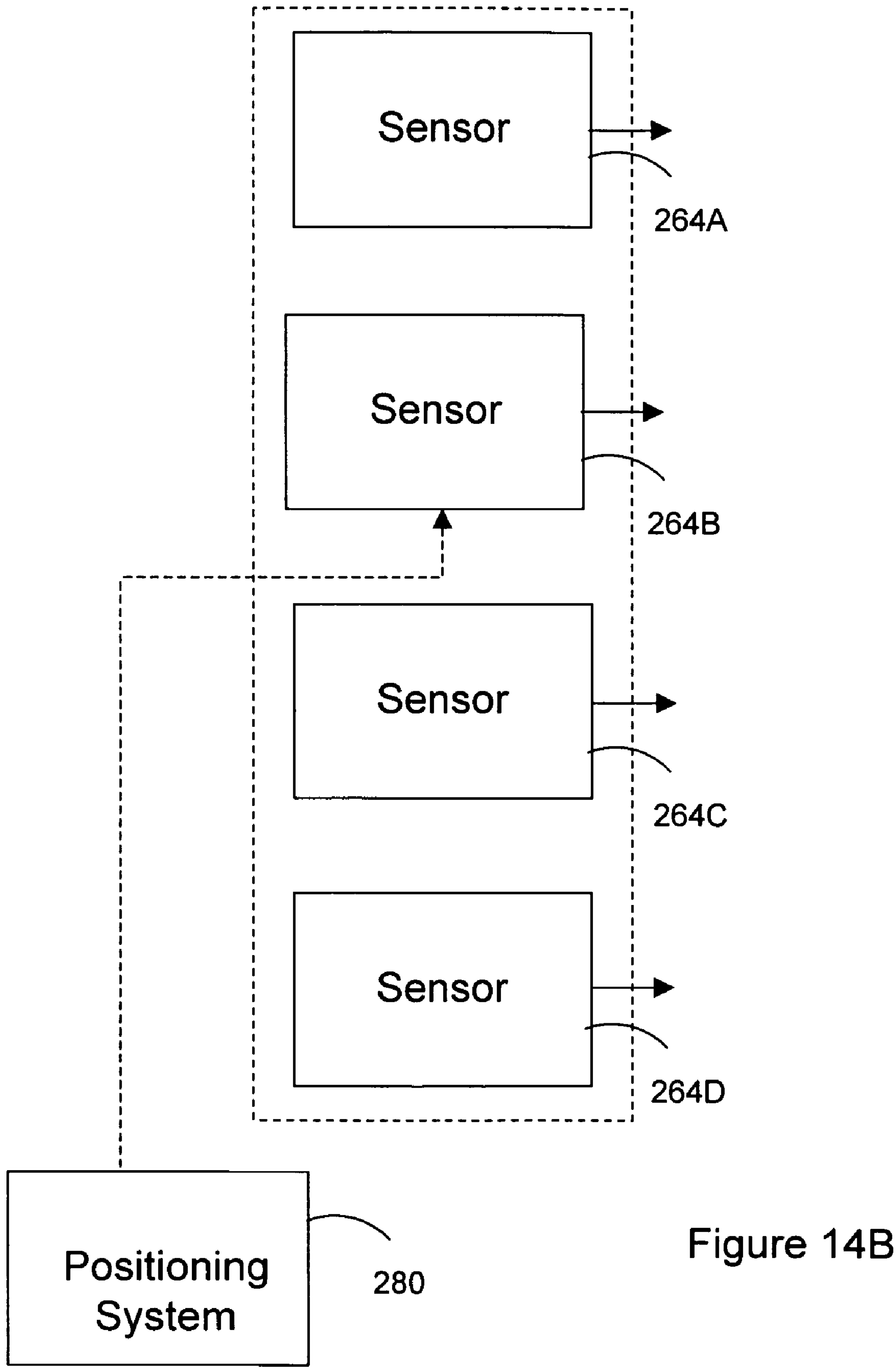
Figure 14C:
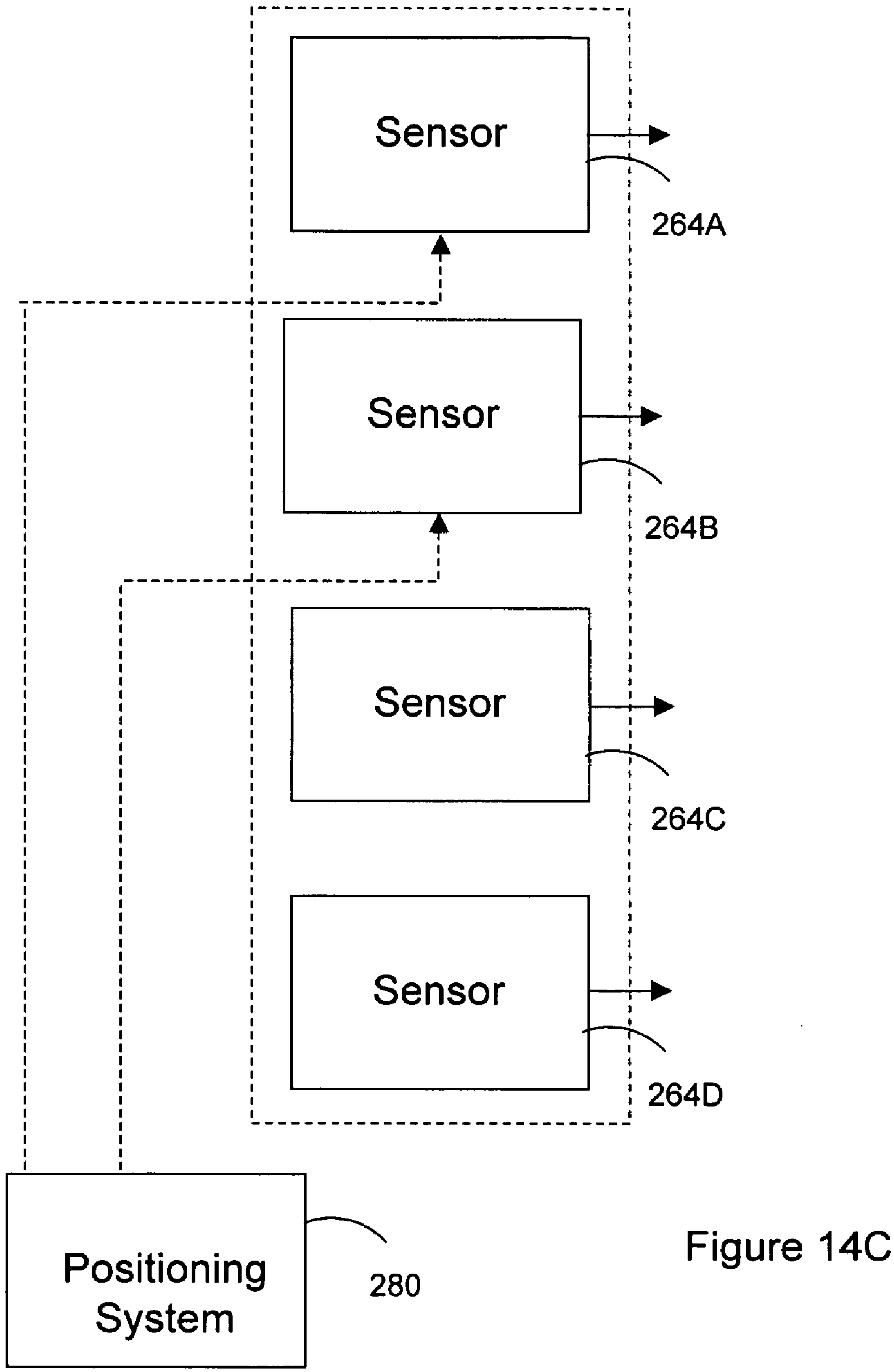
Figure 14D:
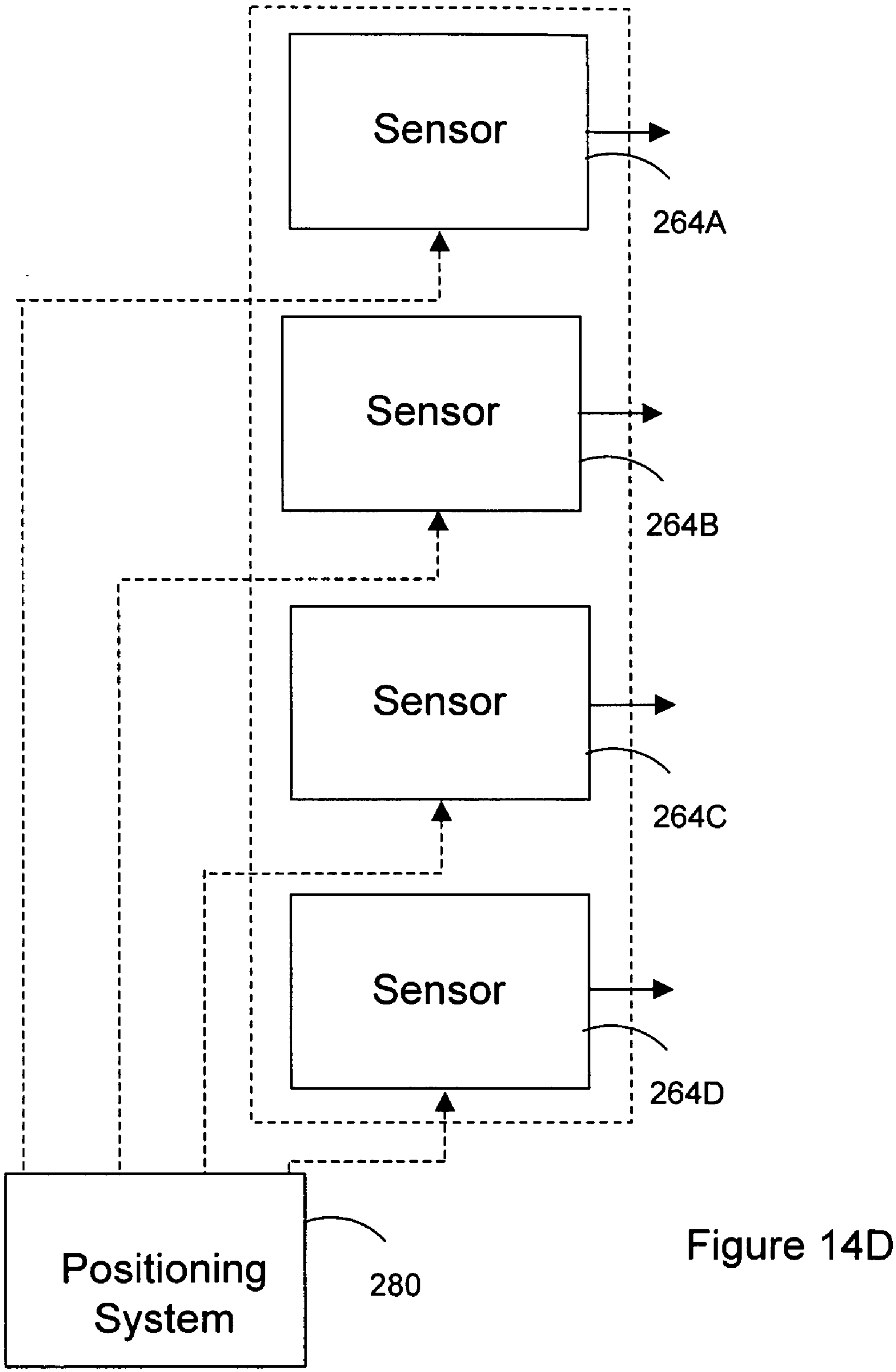

FIGS. 14A-14D are block diagram representations showings example configurations of a system having four sensor portions, e.g., sensor portions 264A-264D, in accordance with various embodiments of the present invention. In FIG. 14A, the first sensor portion, e.g., sensor portion 264A, is movable by the positioning system 280. In FIG. 14B, the second sensor portion, e.g., sensor portion 264B, is movable by the positioning system 280. In FIG. 14C, the first and second sensor portions, e.g., sensor portions 264A-264B, are movable by the positioning system 280. In FIG. 14D, all of the sensor portions, e.g., sensor portions 264A-264D, are movable by the positioning system 280.

As stated above, and as will be further described below, relative movement between an optics portion (or one or more portions thereof) and a sensor portion (or one or more portions thereof), including, for example, but not limited to relative movement in the x and/or y direction, z direction, tilting, rotation (e.g., rotation of less than, greater than and/or equal to 360 degrees) and/or combinations thereof, may be used in providing various features and/or in the various applications disclosed herein, including, for example, but not limited to, increasing resolution (e.g., increasing detail), zoom, 3D enhancement, image stabilization, image alignment, lens alignment, masking, image discrimination, auto focus, mechanical shutter, mechanical iris, hyperspectral imaging, a snapshot mode, range finding and/or combinations thereof.

FIGS. 15A-15I show one embodiment of the digital camera apparatus 210. In this embodiment, the positioner 310 is adapted to support four optics portions, e.g., the optics portions 262A-262D, at least in part, and to move each of the optics portions 262A-262D in the x direction and/or the y direction. Positioner 320 is for example, a stationary positioner that supports the one or more sensor portions 264A-264D, at least in part.

The positioner 310 and positioner 320 may be affixed to one another, directly or indirectly. Thus, for example, the positioner 310 may be affixed directly to the positioner 320 (e.g., using bonding) or the positioner 310 may be affixed to a support (not shown) that is in turn affixed to the positioner 320.

The size of the positioner 310 may be, for example, approximately the same size (in one or more dimensions) as the positioner 320, approximately the same size (in one or more dimensions) as the arrangement of the optics portions 290A-290D and/or approximately the same size (in one or more dimensions) as the arrangement of the sensor portions 292A-292D. One advantage of such dimensioning is that it helps keep the dimensions of the digital camera apparatus as small as possible.

In this embodiment, each of the optics portions 290A-290D comprises a lens or a stack of lenses (or lenslets), although, as stated above, the present invention is not limited to such. For example, in some embodiments, a single lens, multiple lenses and/or compound lenses, with or without one or more filters, prisms and/or masks are employed. Moreover, one or more of the optics portions shown in the digital camera apparatus of FIGS. 15A-15I may be replaced with one or more optics portions having one or more other optics portions having a configuration (see for example, FIGS. 5A-5V) that is/are different than those shown in FIGS. 15A-15I.

Moreover, as stated above, if the digital camera apparatus 210 includes more than one camera channel, the channels may or may not be identical to one another. For example, in some embodiments, the camera channels are identical to one another. In some other embodiments, one or more of the camera channels are different from one or more of the other camera channels in one or more respects. For example, in some embodiments, each camera channel may detect a different color and/or band of light. For example, one of the camera channels may detect red light, one of the camera channels may detect green light, one of the camera channels may detect blue light and camera channel D detects infrared light.

Thus, if the subsystem includes more than one optics portion, the optics portions may or may not be identical to one another. For example, in some embodiments, the optics portions are identical to one another. In some other embodiments, one or more of the optics portions are different from one or more of the other optics portions in one or more respects. Moreover, in some embodiments, one or more of the characteristics of each of the optics portions (including but not limited to its type of element(s), size, and/or performance) is tailored (e.g., specifically adapted) to the respective sensor portion and/or to help achieve a desired result.

Referring to FIGS. 15B-15E, in this embodiment, the positioner 310 defines one or more inner frame portions (e.g., four inner frame portions 400A-400D) and one or more outer frame portions (e.g., outer frame portions 404, 406, 408, 410, 412, 414). The one or more inner frames portions 400A-400D are supports that support and/or assist in positioning the one or more optics portions 262A-262D.

The one or more outer frame portions (e.g., outer frame portions 404, 406, 408, 410, 412, 414), may include, for example, one or more portions (e.g., outer frame portions 404, 406, 408, 410) that collectively define a frame around the one or more inner frame portions and/or may include one or more portions (e.g., outer frame portions 412, 414) that separate the one or more inner frame portions (e.g., 400A-400D). In this embodiment, for example, outer frame portions 404, 406, 408, 410, collectively define a frame around the one or more inner frame members 400A-400D and outer frame portions 412, 414 separate the one or more inner frame portions 400A-400D from one another.

Figure 15D:
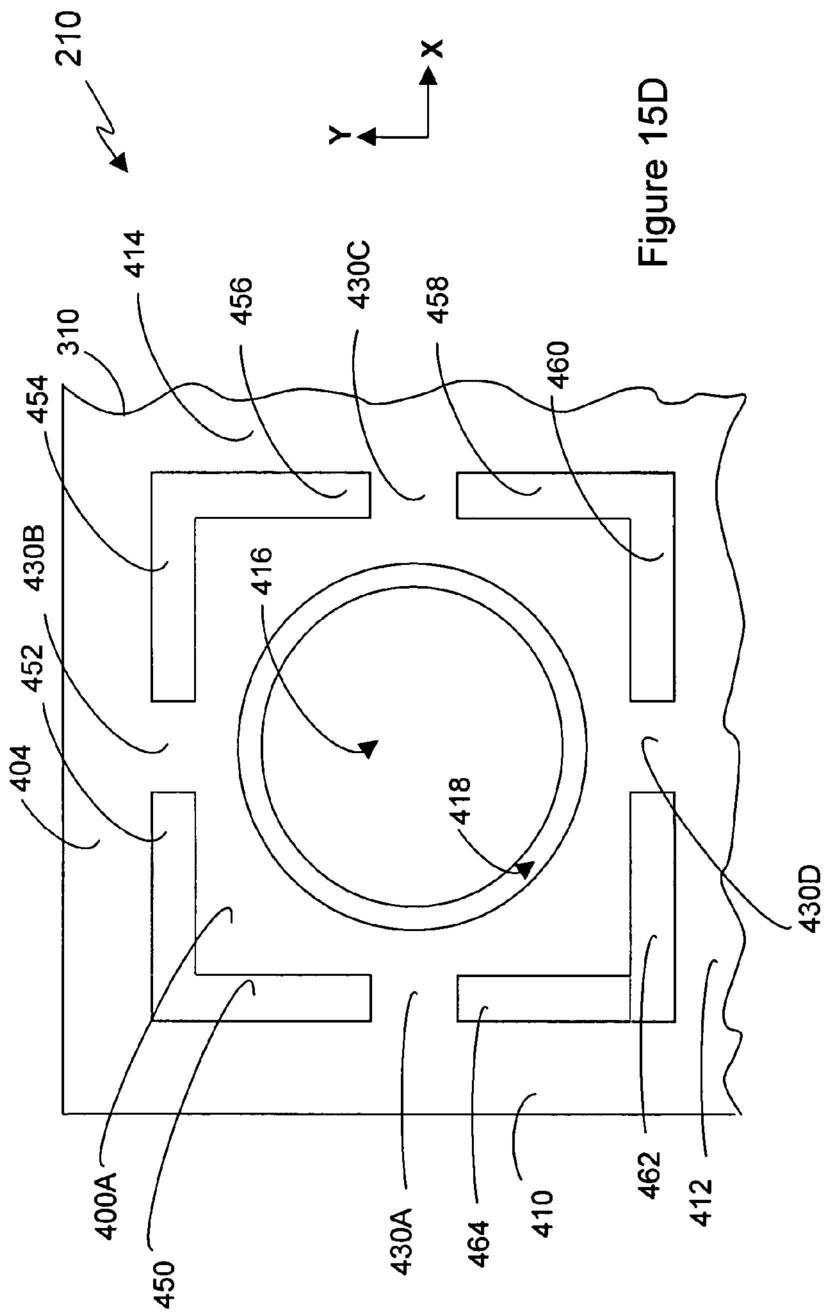
FIGS. 15D-15E are an enlarged schematic plan view and an enlarged schematic representation of a portion of the positioner of FIGS. 15A-15C.
Figure 15E:
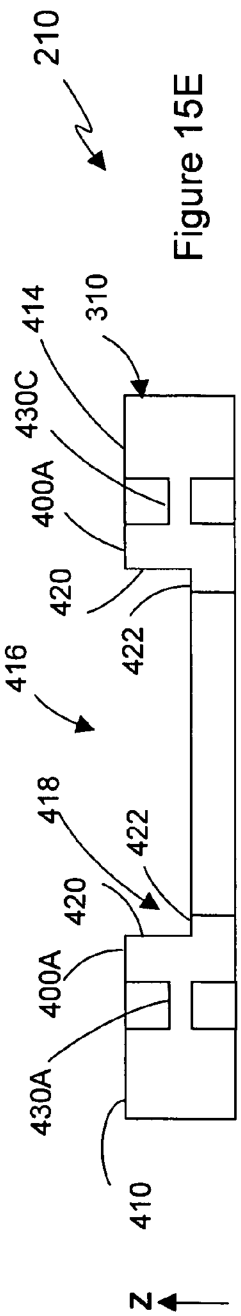

Referring to FIGS. 15D-15E, in this embodiment, each inner frame portion defines an aperture 416 and a seat 418. The aperture 416 provides an optical path for the transmission of light. The seat 418 is adapted to receive a respective one of the one or more optical portions 262A-262D. In this regard, the seat 418 may include one or more surfaces (e.g., surfaces 420, 422) adapted to abut one or more surfaces of the optics portion to support and/or assist in positioning the optics portion relative to the inner frame portion 400A of the positioner 310, the positioner 320 and/or one or more of the sensor portions 264A-264D. In this embodiment, surface 420 is disposed about the perimeter of the optics portion to support and help position the optics portion in the x direction and the y direction). Surface 422 (sometimes referred to herein as "stop" surface) positions helps position the optics portion in the z direction.

The seat 418 may have dimensions adapted to provide a press fit for the respective optics portions. The position and/or orientation of the stop surface 422 may be adapted to position the optics portion at a specific distance (or range of distance) and/or orientation with respect to the respective sensor portion.

Each inner frame portion (e.g., 400A-400D) is coupled to one or more other portions of the positioner 310 by one or more MEMS actuator and/or position sensor portions. For example, actuator portions 430A-430D couple the inner frame 400A to the outer frame of the positioner 310. Actuator portions 434A-434D couple the inner frame 430B to the outer frame of the positioner 310. Actuator portions 438A-438D couple the inner frame 430C to the outer frame of the positioner 310. Actuator portions 442A-444D couple the inner frame 430D to the outer frame of the positioner 310.

The positioner 310 may further define clearances or spaces that isolate the one or more inner frame portions, in part, from the rest of the positioner 310. For example, the positioner 310 defines clearances 450, 452, 454, 456, 458, 460, 462, 464 that isolate the inner frame portion 400A, in part, in one or more directions, from the rest of the positioner 310.

In some embodiments, less than four actuator portions (e.g., one, two or three actuator portions) are used to couple an inner frame A to one or more other portions of the positioner 310. In some other embodiments more than four actuator portions are used to couple an inner frame to one or more other portions of the positioner 310.

Although the actuator portions, 430A-430D, 434A-434D, 438A-438D and 442A-442D are shown as being identical to one another, this is not required. Moreover, although the actuator portions 430A-430D, 434A-434D, 438A-438D and 442A-442D are shown having a dimension in the z direction that is smaller that the z dimension of other portions of the positioner 310, some other embodiments may employ one or more actuator portions that have a z dimension that is equal to or greater than the z dimension of other portions of the positioner 310.

The positioner 310 and/or actuator portions may comprise any type of material(s) including, for example, but not limited to, silicon, semiconductor, glass, ceramic, metal, plastic and combinations thereof. If the positioner 310 is a single integral component, each portion of the positioner 310 (e.g., the inner frame portions, the outer frame portions, the actuator portions), may comprise one or more regions of such integral component.

In some embodiments, the actuator portions and the support portions of a positioner, e.g., positioner 310, are manufactured separately and thereafter assembled and/or attached together. In some other embodiments, the support portions and the actuator portions of a positioner are fabricated together as a single piece.

As will be further described below, in the illustrated embodiment, applying appropriate control signal(s) to one or more of the MEMS actuator portions cause the one or more MEMS actuator portions to expand and/or contract to thereby move the associated optics portion. It may be advantageous to make the amount of movement equal to a small distance, e.g., 2 microns (2 um), which may be sufficient for many applications. In some embodiments, for example, the amount of movement may be as small as about ½ of the width of one sensor element (e.g., ½ of the width of one pixel) on one of the sensor portions. In some embodiments, for example, the magnitude of movement may be equal to the magnitude of the width of one sensor element or two times the magnitude of the width of one sensor element.

Figure 15G:
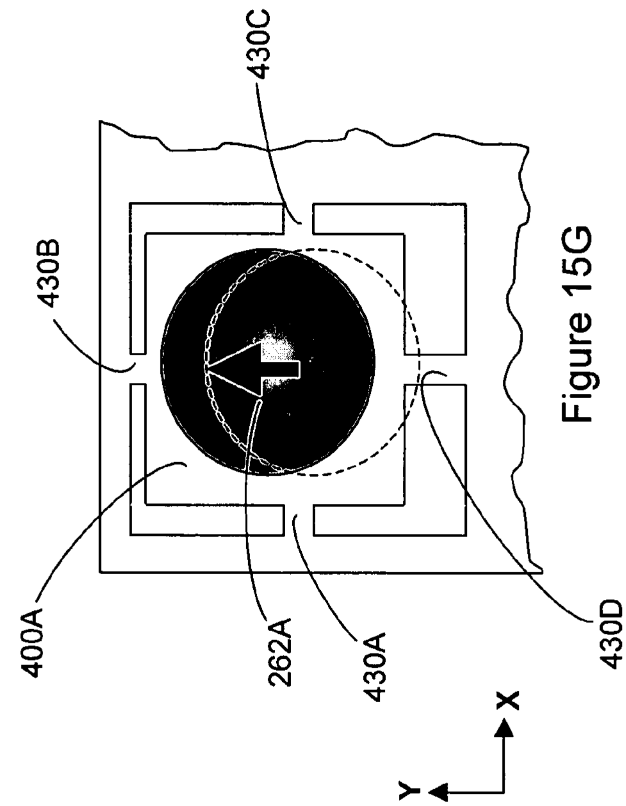
FIGS. 15G-15I are enlarged schematic plan views of the optics portion and the portion of the positioner of FIG. 15F, with the portion of the positioner in various states.
Figure 15F:
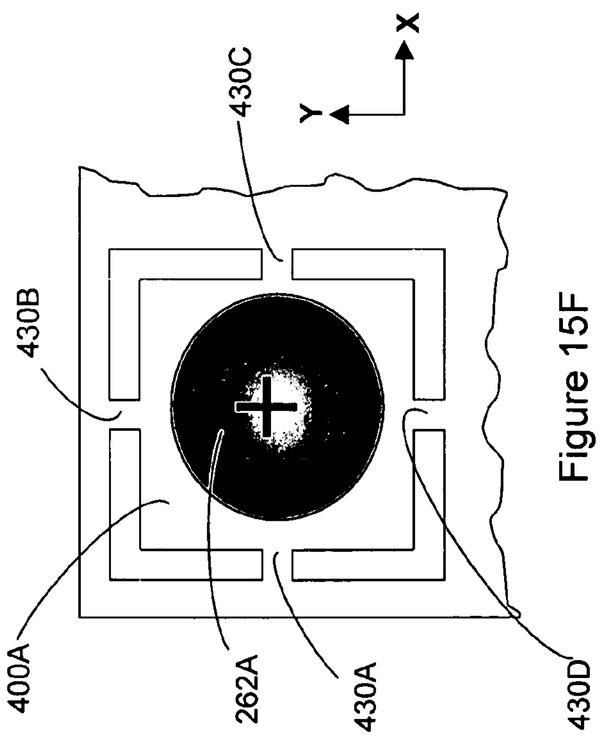
FIG. 15F is an enlarged schematic plan view of an optics portion and a portion of the positioner of the digital camera apparatus of FIGS. 15A-15E, with the portion of the positioner shown in a first state.
Figure 15I:
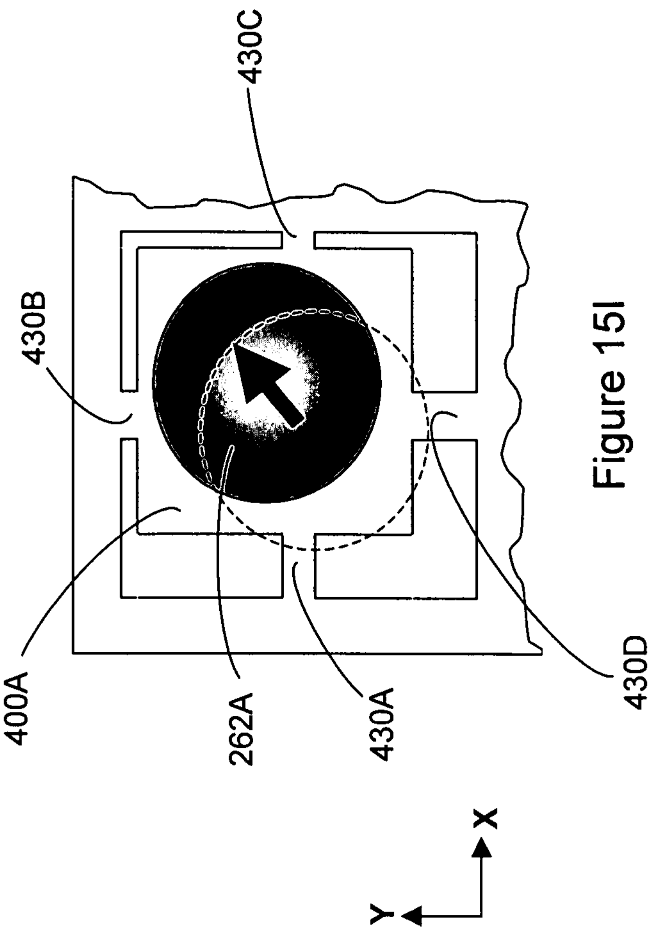
Figure 15H:
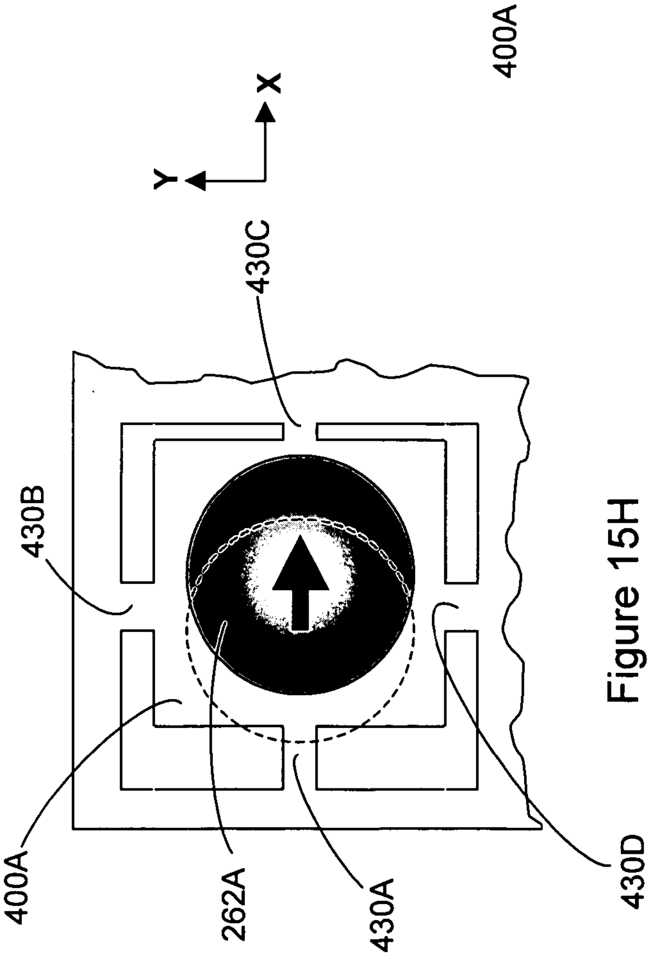

FIGS. 15F-15I show examples of the operation of the positioner 310. More particularly FIG. 15F shows an example of the inner frame portion at a first (e.g., rest) position. Referring to FIG. 15G, the controller may provide one or more control signals to cause one or more of the actuator portions to expand (see, for example, actuator portion 430D) and cause one or more of the actuator portions to contract (see, for example, actuator portion 430B) and thereby cause the associated inner frame portion and the associated optics portion to move in the positive y direction (see, for example, inner frame portion 400A and optics portion 262A). The control signals may be, for example, in the form of electrical stimuli that are applied to the actuators (e.g., actuators 430B, 430D) themselves. Referring to FIG. 15H, the controller may provide one or more control signals to cause one or more of the actuator portions to expand (see, for example, actuator portion 430A) and cause one or more of the actuator portions to contract (see, for example, actuator portion 430C) and thereby cause the associated inner frame portion and the associated optics portion to move in the positive x direction (see, for example, inner frame portion 400A and optics portion 262A). The control signals may be, for example, in the form of electrical stimuli that are applied to the actuators (e.g., actuators 430A, 430C) themselves. Referring to FIG. 15I, the controller may provide one or more control signals to cause two or more of the actuator portions to expand (see, for example, actuator portions 430A, 430D) and cause two of the actuator portions to contract (see, for example, actuator portions 430B, 430C) and thereby cause the associated inner frame portion and the associated optics portion to move in the positive y direction and positive x direction (i.e., in a direction that includes a positive y direction component and a positive x direction component)(see, for example, inner frame portion 400A and optics portion 262A). The control signals may be, for example, in the form of electrical stimuli that are applied to the all of the actuators (e.g., actuators 430A-430D) themselves.

In some embodiments, more than one actuator is able to provide movement in a particular direction. In some such embodiments, more than one of such actuators may be employed at a time. For example, in some embodiments, one of the actuators may provide a pushing force while the other actuator may provide a pulling force. In some embodiments both actuators may pull at the same time, but in unequal amounts. For example, one actuator may provide a pulling force greater than the pulling force of the other actuator. In some embodiments, both actuators may push at the same time, but in unequal amounts. For example, one actuator may provide a pushing force greater than the pushing force of the other actuator. In some embodiments, only one of such actuators is employed at a time. In some such embodiments, one actuator may be actuated, for example, to provide either a pushing force or a pulling force.

Figure 15J:
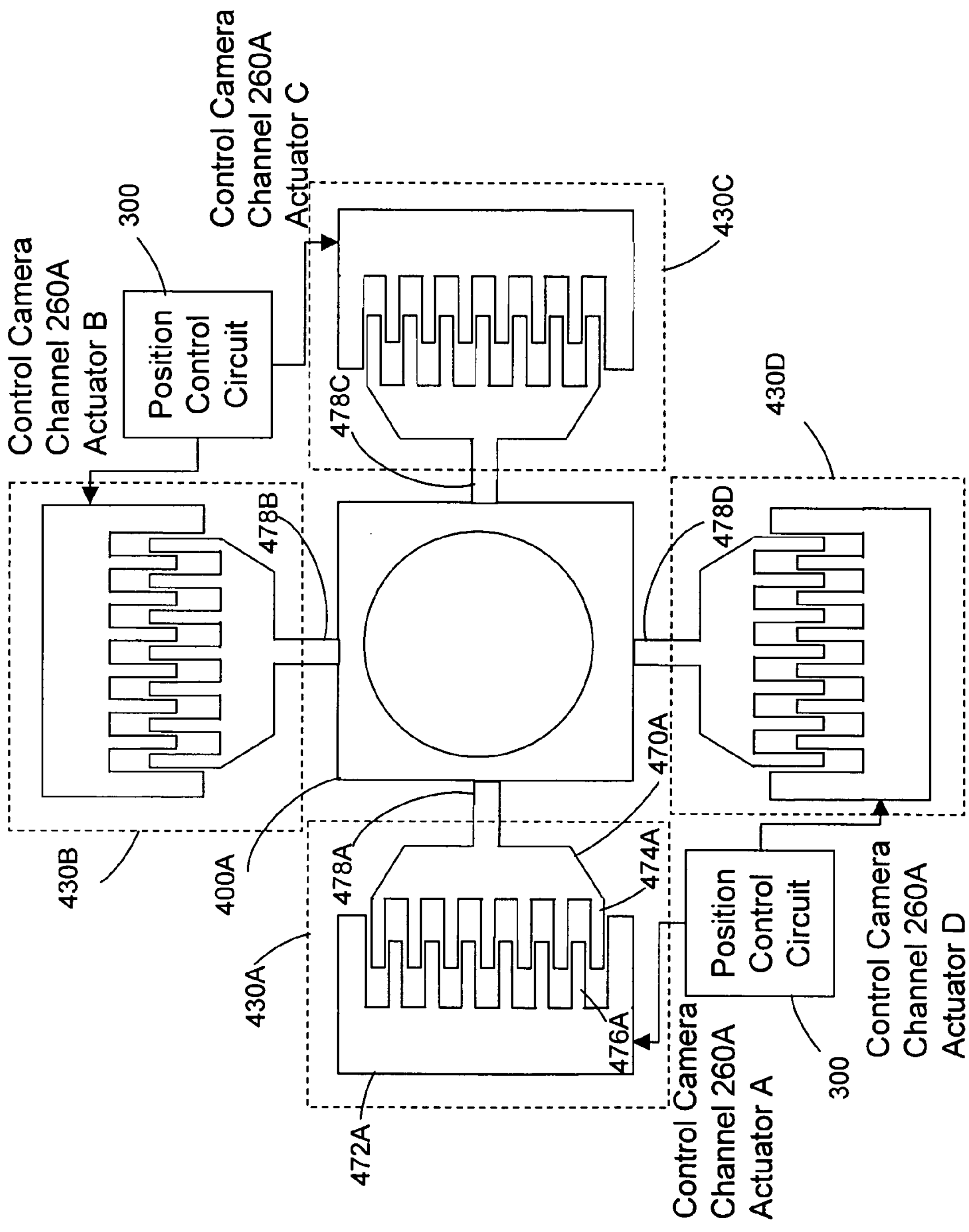
FIG. 15J shows one embodiment, partially in schematic plan view and partially in block diagram, of a portion of a positioner and a portion of a controller that may be employed in the digital camera apparatus illustrated in FIGS. 15A-15I.

FIG. 15J is a schematic diagram of one embodiment of the inner frame portion (e.g., 400A), the associated actuator portions 430A-430D and portions of one embodiment of the controller 300 (e.g., two position control circuits) employed in some embodiments of the digital camera apparatus 210 of FIGS. 15A-15I. In this embodiment, each of the MEMS actuators portions 430A-430D comprises a comb type MEMS actuator.

In the illustrated embodiment, each of the comb type MEMS actuators includes a first comb and a second comb. For example, MEMS actuator portion 430A includes a first comb 470A and a second comb 472A. The first comb and the second comb each includes a plurality of teeth spaced apart from one another by gaps. For example, the first comb 470A of actuator portion 430A includes a plurality of teeth 474A. The second comb 472A of actuator portion 430A includes a plurality of teeth 476A. In this embodiment, the first and second combs, e.g., first and second combs 470A, 472A, are arranged such that the teeth, e.g, teeth 474A, of the first comb are in register with the gaps between the teeth of the second comb and such that the teeth, e.g., teeth 476A, of the second comb are in register with the gaps between the teeth of the first comb.

In some embodiments, the first comb of each actuator portion is coupled to an associated inner frame portion and/or integral with the associated inner frame portion. In the illustrated embodiment, for example, the first comb of actuator portions 430A-430D is coupled to the associated inner frame portion 400A via coupler portions 478A-478D, respectively. In some embodiments, the second comb of each actuator portion is coupled to an associated outer frame portion and/or integral with the associated outer frame portion. In the illustrated embodiment, for example, the second comb 472A of actuator portion 430A is coupled to outer frame portion 410 and/or integral with outer frame portion 410.

The one or more signals result in an electrostatic force that causes the first comb to move in a direction toward the second comb and/or causes the second comb to move in a direction toward the first comb. In some embodiments, the amount of movement depends on the magnitude of the electrostatic force, which for example, may depend on the one or more voltages, the number of teeth on the first comb and the number of teeth on the second comb, the size and/or shape of the teeth and the distance between the first comb and the second comb. As one or both of the combs move, the teeth of the first comb are received into the gaps between the teeth of the second comb. The teeth of the second comb are received into the gaps between the teeth of the first comb.

One or more springs may be provided to provide one or more spring forces. FIG. 15M shows one embodiment of springs 480 that may be employed to provide a spring force. In such embodiment, a spring 480 is provided for each actuator, e.g., 430A-430D. Two springs 480 are shown. One of the illustrated springs 480 is associated with actuator 430B. The other illustrated spring 480 is associated with actuator 430C. Each spring 480 is coupled between an inner frame portion, e.g., inner frame portion 400A, and an associated spring anchor 482 connected to the MEMS structure. If the electrostatic force is reduced and/or halted, the one or more spring forces cause the comb actuator to return its initial position. Some embodiments may employ springs having rounded corners instead of sharp corners.

In the illustrated embodiment, each of the other actuator portions, e.g., actuator portions 430B-430D, also receives an associated control signal. For example, a signal, control camera channel 260A actuator B, is supplied to the second comb of actuator portion 430B. A signal, control camera channel 260A actuator C, is supplied to the second comb of actuator portion 430C. A signal, control camera channel 260A actuator D, is supplied to the second comb of actuator portion 430D.

In some embodiments, each of the control signals, e.g., control camera channel 260A actuator A, control camera channel 260A actuator B, control camera channel 260A actuator C and control camera channel 260A actuator D, comprises a differential signal (e.g., a first signal and a second signal) rather than a single ended signal.

In the illustrated embodiment, each of the combs actuators has the same or similar configuration. In some other embodiments, however, one or more of the comb actuators may have a different configuration than one or more of the other comb actuators. In some embodiments, springs, levers and/or crankshafts may be employed to convert the linear motion of one or more of the comb actuator(s) to rotational motion and/or another type of motion or motions.

Figure 15K:
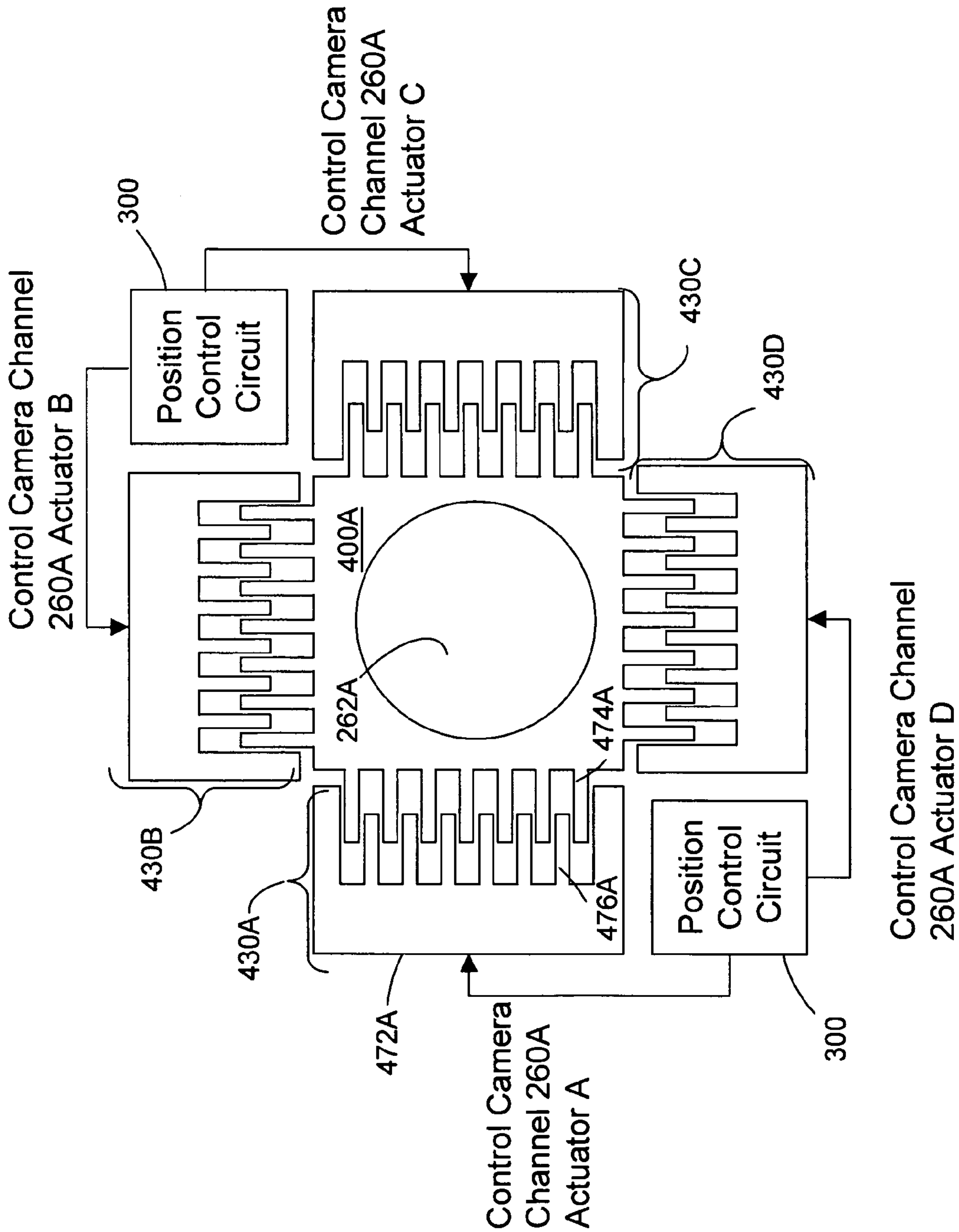
FIG. 15K shows another embodiment, partially in schematic plan view and partially in block diagram, of a portion of a positioner and a portion of a controller that may be employed in the digital camera apparatus illustrated in FIGS. 15A-15I.

FIG. 15K is a schematic diagram of another embodiment of the inner frame portion (e.g., 400A), the associated actuator portions 430A-430D and portions of one embodiment of the controller 300 (e.g., two position control circuits) employed in some embodiments of the digital camera apparatus of FIGS. 15A-15I. In this embodiment, each of the MEMS actuators portions 430A-430D comprises a comb type MEMS actuator. In some embodiments, each of the MEMS actuator portions, e.g., actuator portions 430A-430D, includes two combs. One of the combs is integral with the associated inner frame portion, e.g., inner frame portion 400A.

Figure 15L:
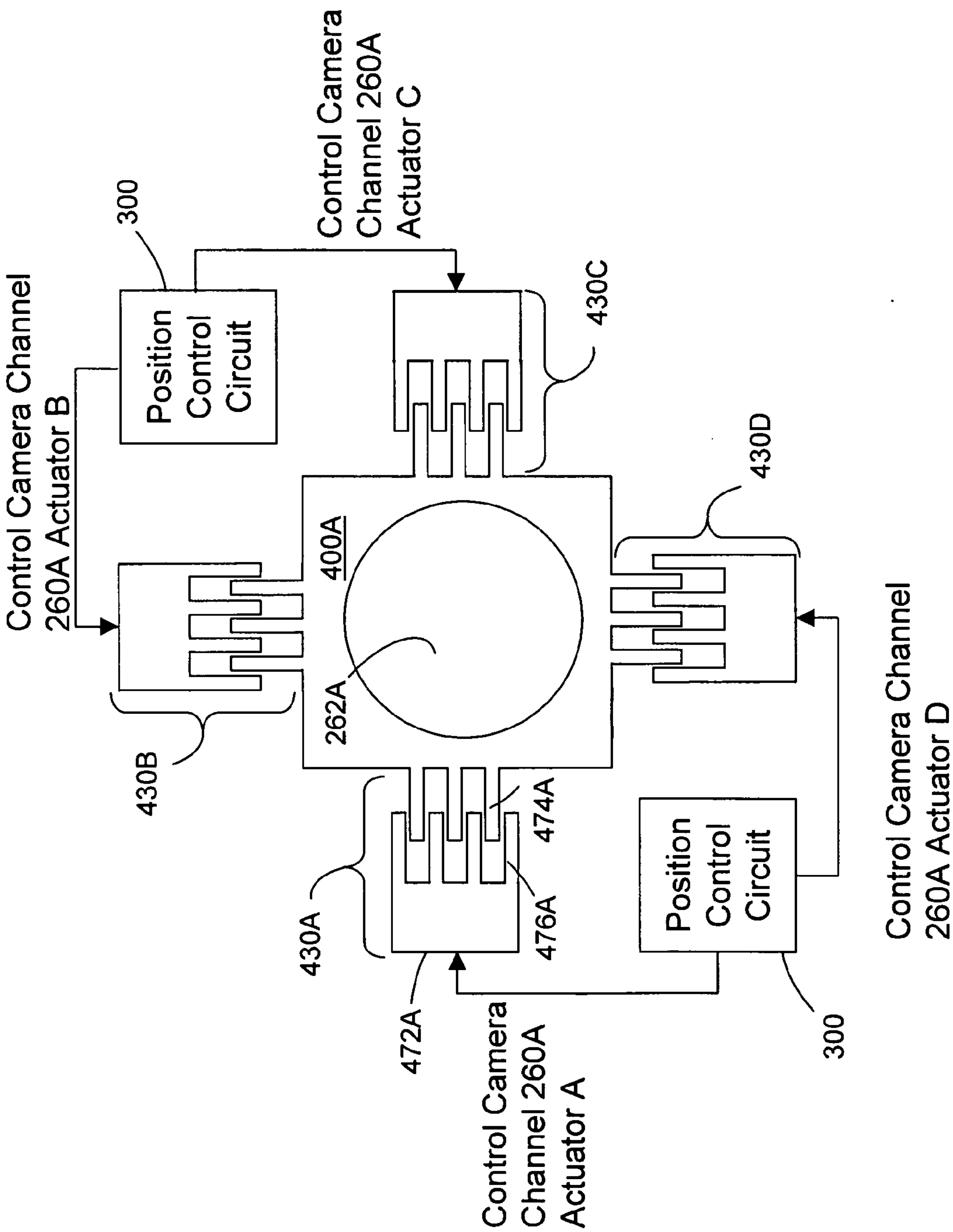
FIG. 15L shows another embodiment, partially in schematic plan view and partially in block diagram, of a portion of a positioner and a portion of a controller that may be employed in the digital camera apparatus illustrated in FIGS. 15A-15I.
Figure 15M:
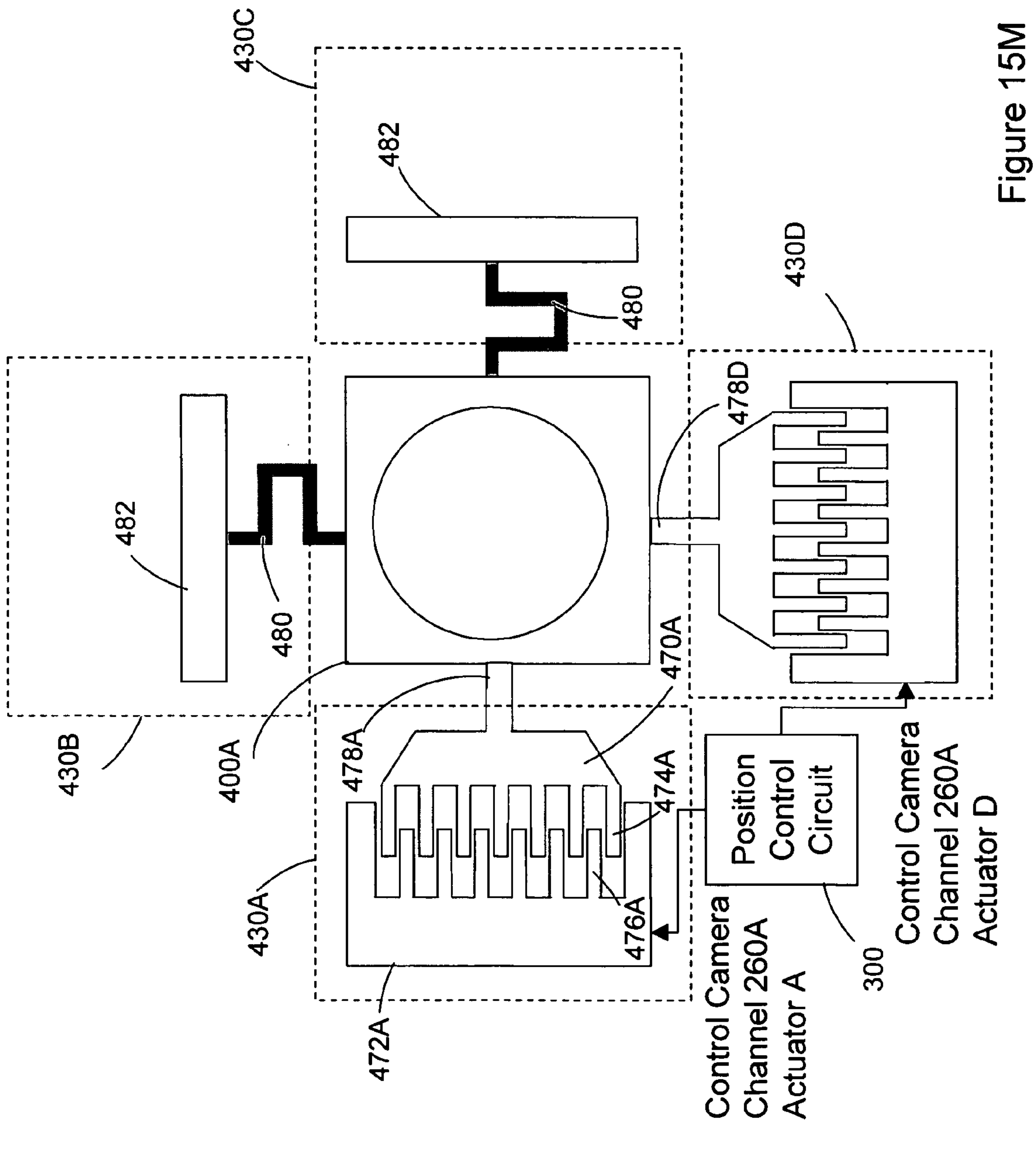
FIG. 15M shows the portion of the positioner and the portion of the controller illustrated in FIG. 15J, without two of the actuators and a portion of the controller, in conjunction with a schematic representation of one embodiment of springs and spring anchors that may be employed in association with one or more actuators of the positioner.

FIG. 15L is a schematic diagram of another embodiment of the inner frame portion (e.g., 400A), the associated actuator portions 430A-430D and portions of one embodiment of the controller 300 (e.g., two position control circuits) employed in some embodiments of the digital camera apparatus of FIGS. 15A-15I. In this embodiment, each of the MEMS actuators portions 430A-430D comprises a comb type MEMS actuator. In this embodiment, each MEMS actuator portion, e.g., actuator portions 430A-430D, has fewer teeth than the comb type MEMS actuators illustrated in FIGS. 15J-15K.

Figure 16A:
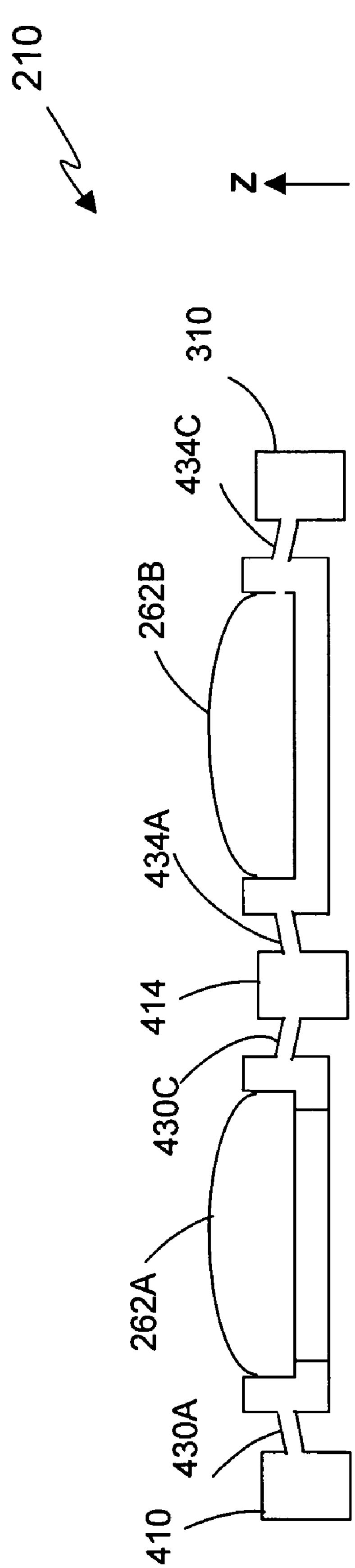
FIGS. 16A-16E are enlarged schematic representations of another embodiment of optics portions and a positioner that may be employed in the digital camera apparatus of FIG. 4, with the positioner in various states to provide various positioning of the optics portions.
Figure 16B:
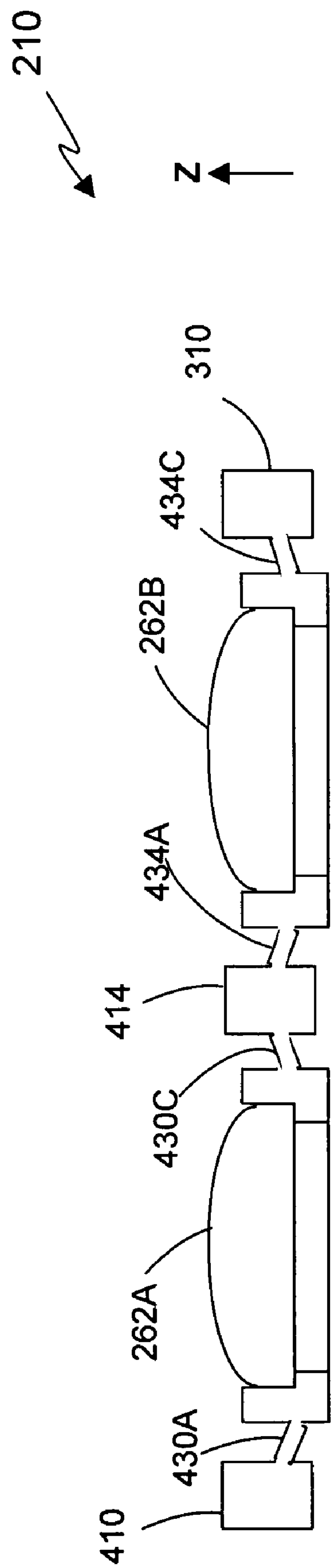
Figures 16C, 16D, 16E:
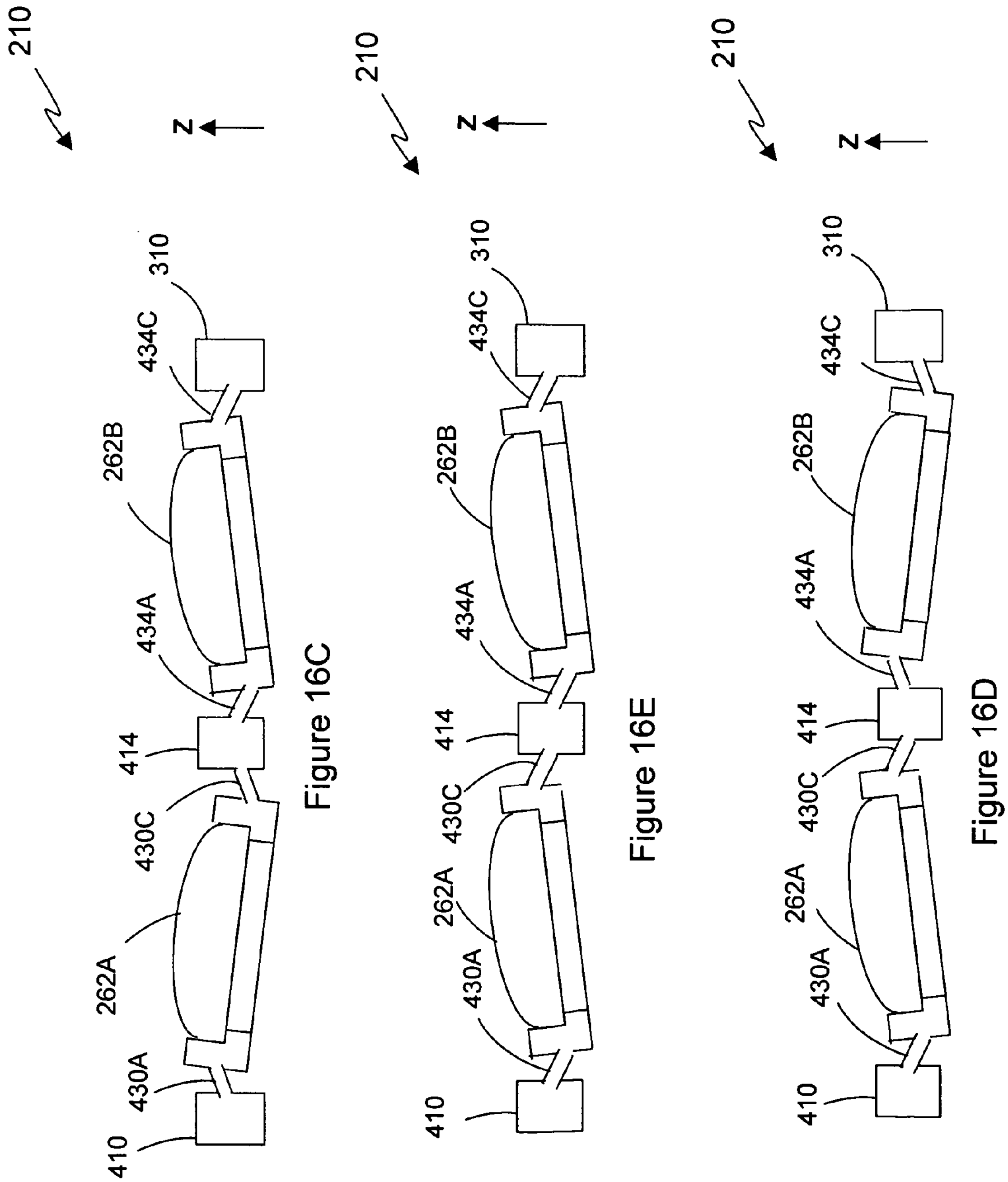

FIGS. 16A-16E depict another embodiment of the positioner 310 of the digital camera apparatus 210. In this embodiment, MEMS actuator portions 430A-430D are adapted to move and/or tilt in the z direction. For example, one or more of the MEMS actuator portions (e.g., 430A-430D, 434A-434D, 438A-438D, 442A-442D) may be provided with torsional characteristics that cause the actuators to move and/or tilt upward (or move and/or tilt downward) in response to appropriate control signals (e.g., stimuli from the controller). In such embodiments one or more of the inner frame portions (e.g., 400A-400D) may be raised, lowered and/or tilted. Referring to FIG. 16A, in one embodiment, for example, the controller provides a first control signal (e.g., stimuli) to all of the MEMS actuator portions (e.g., 430A-430D, 434A-434D, 438A-438D, 442A-442D) to cause all of the inner frame portions 400A-400D, to be moved upward. Referring to FIG. 16B, a second control signal (e.g., stimuli) may be provided to all of the actuators (e.g., 430A-430D, 434A-434D, 438A-438D, 442A-442D) to cause all of the inner frame portions 400A-400D, to be moved downward. Referring to FIG. 16C, in some embodiments, the controller 300 may provide one or more control signals to cause all of the inner frame portions 400A-400D, to be tilted inward (toward the center of the positioner). Referring to FIG. 16D in some embodiments, the controller 300 may provide one or more control signals to cause all of the inner frame portions 400A-400D to be tilted outward (away from the center of the positioner). Referring to FIG. 16E in some embodiments, the controller 300 may provide one or more control signals to cause one or more of the inner frame portions, e.g., frame portion 400A, to be tilted outward and one or more of the inner frame portions, e.g., frame portion 400B, to be tilted inward.

Referring to FIGS. 17A-17I and 18A-18E in another aspect of the present invention, the actuator portions 430A-430D, 434A-434D, 438A-438D, 442A-442D are not limited to MEMS actuators. Rather, the positioner 310 and/or actuator portions 430A-430D, 434A-434D, 438A-438D, 442A-442D comprise any type or types of actuators and/or actuator technology or technologies and employ any type of motion including, for example, but not limited to, linear and/or rotary, analog and/or discrete, and any type of actuator technology, including, for example, but not limited to, microelectromechanical systems (MEMS) actuators, electro-static actuators, diaphragm actuators, magnetic actuators, bi-metal actuators, thermal actuators, ferroelectric actuators, piezo-electric actuators, motors (e.g., linear or rotary), solenoids (e.g., micro-solenoids) and/or combinations thereof (see, for example, FIGS. 19A-19J).

Figure 18A:
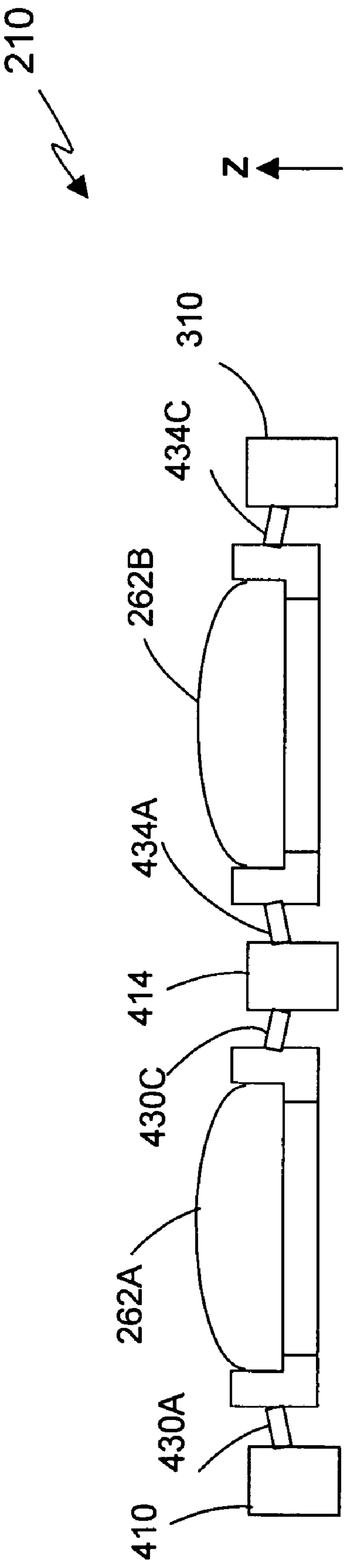
FIGS. 18A-18E are enlarged schematic representations of one embodiment of optics portions and a positioner that may be employed in the digital camera apparatus of FIG. 4, with the positioner in various states to provide various positioning of the optics portions.
Figure 18B:
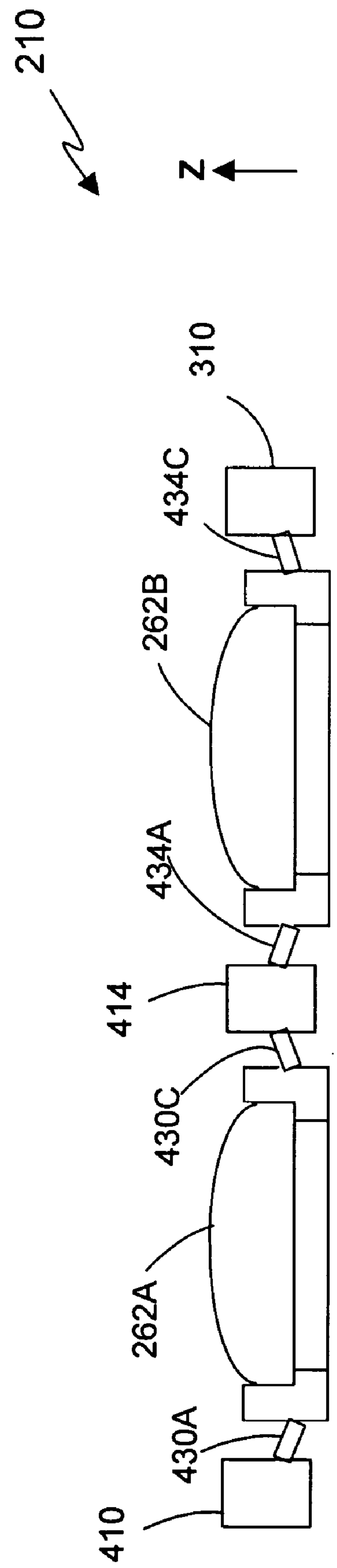
Figures 18C, 18D, 18E:
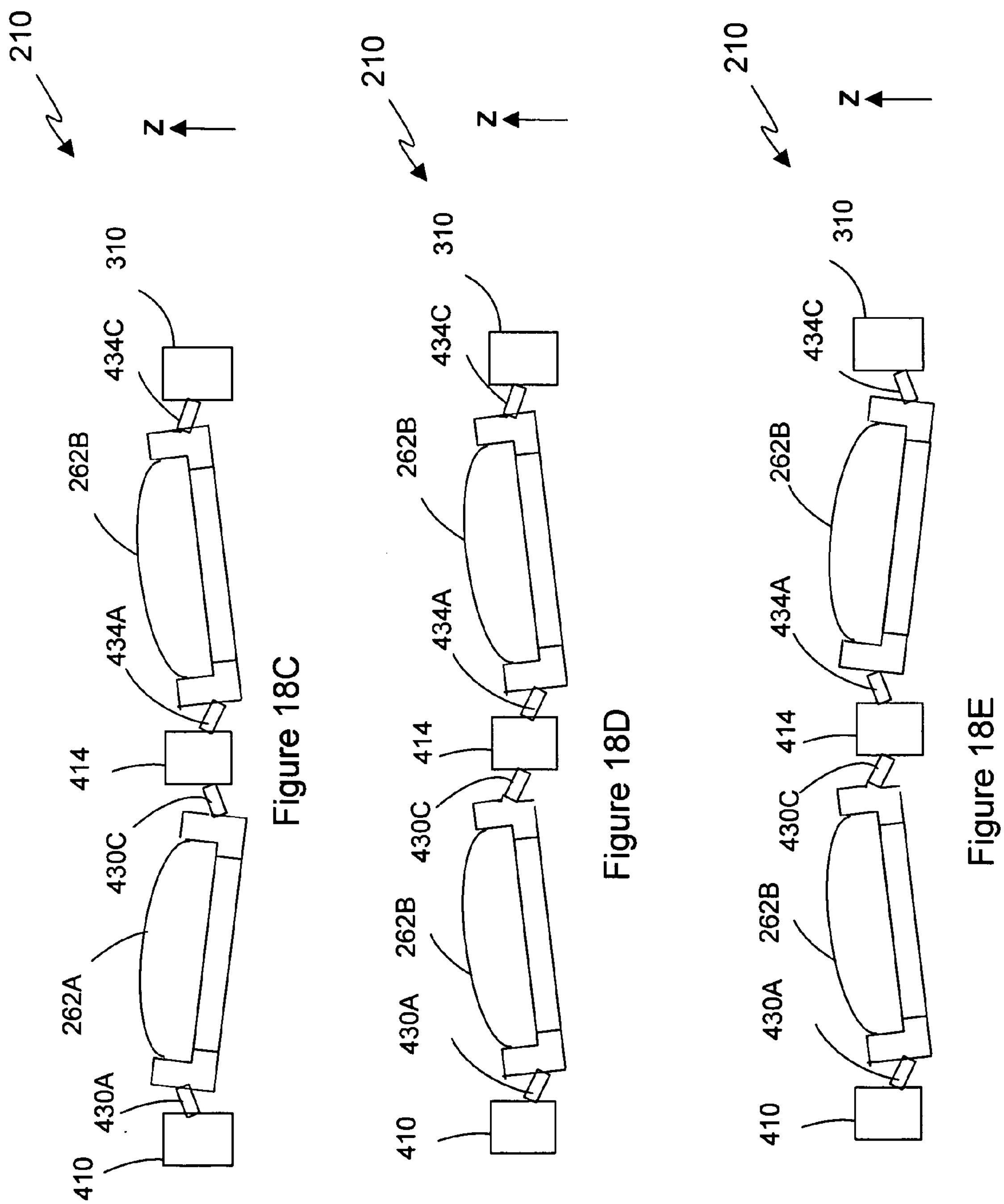

Referring to FIG. 18A-18C in some embodiments, actuator portions 430A-430D are adapted to move and/or tilt in the z direction. In such embodiments one or more of the inner frame portions (e.g., 400A-400D) may be raised, lowered and/or tilted.

Figures 17D, 17E:
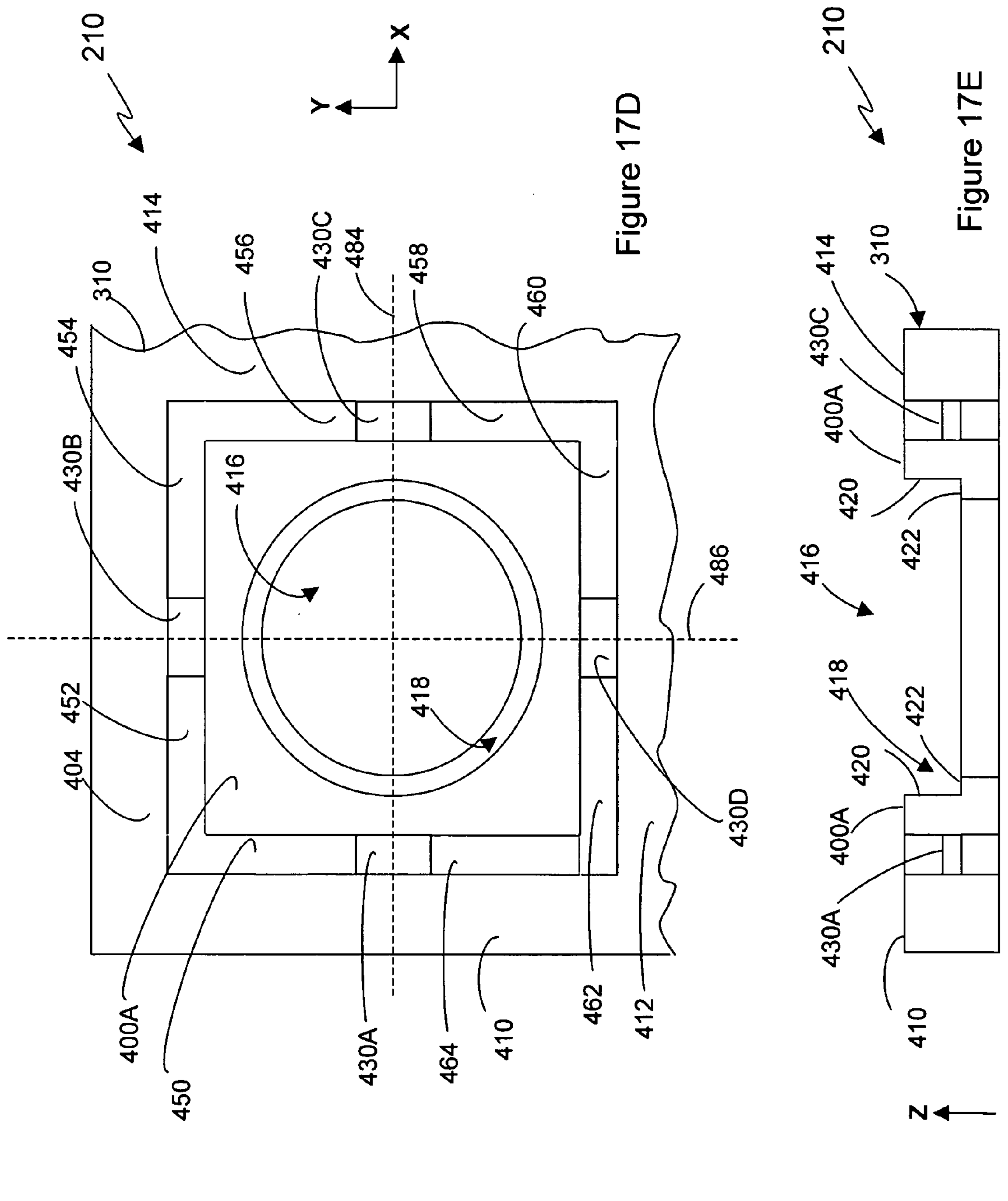
FIGS. 17D-17E are an enlarged schematic plan view and an enlarged schematic representation of a portion of the positioner of FIGS. 17A-17C.

Referring to FIG. 17D, in some embodiments, one or more of the actuator portions are disposed on, and/or provide movement along, one or more actuator axes. For example, in some embodiments, one or more actuator portions, e.g., actuator portions 430A, 430C may be disposed on, and/or may provide movement along, a first axis 484. One or more actuator portions, e.g., actuator portions 430B, 430D, may be disposed on, and/or may provide movement along, a second axis 486 (which may be perpendicular to first axis 484). One or more actuators, e.g., actuator 430B, may be spaced from the first axis 484 by a distance in a first direction (e.g., a y direction). One or more actuators, e.g., actuator 430D, may be spaced from the first axis 484 by a distance in a second direction (e.g., a negative y direction). One or more actuators, e.g., actuator 430A, may be spaced from the second axis 486 by a distance in a third direction (e.g., a negative x direction). One or more actuators, e.g., actuator 430D, may be spaced from the second axis 486 by a distance in a fourth direction (e.g., an x direction). One or more of the actuator portions, e.g., actuator portions 430A, 430C, may move an optics portion, e.g., optics portion 260A (or one or more portions thereof), along the first axis 484 and/or in a direction parallel to the first axis 484. One or more of the actuator portions, e.g., actuator portions 430B, 430D, may move an optics portion, e.g., optics portion 260A (or one or more portions thereof), along the second axis 486 and/or in a direction parallel to the second axis 486.

In some embodiments an actuator axis is parallel to the x axis of the xy plane XY or the y axis of the xy plane XY. In some embodiments, a first actuator axis is parallel to the x axis of the xy plane XY and a second actuator axis is parallel to the y axis of the xy plane XY.

In some embodiments, an actuator axis may be parallel to a sensor axis. For example, in some embodiments, an actuator axis is parallel to the Xs sensor axis (FIG. 6A) or the Ys sensor axis (FIG. 6A). In some embodiments, a first actuator axis is parallel to the Xs sensor axis (FIG. 6A) and a second actuator axis is parallel to the Ys sensor axis (FIG. 6A). In some embodiments, movement in the direction of an actuator axis may include movement in a direction parallel to a sensor plane and/or an image plane.

In some embodiments, an actuator axis may be parallel to row(s) or column(s) of a sensor array. In some embodiments, a first actuator axis is parallel to row(s) in a sensor array and a second actuator axis is parallel to column(s) in a sensor array. In some embodiments, movement in a direction of an actuator axis may be parallel to rows or columns in a sensor array.

It should be understood however, that such axes are not required. In that regard, some embodiments may not have one or more actuators disposed on one or more actuator axes, may not provide movement along and/or parallel to one or more actuator axes, and/or may not have one or more actuator axes. Thus, for example, actuator portions, e.g., actuator portions 430A-430D, need not be disposed on one or more axes and need not have the illustrated alignment.

Figure 17G:
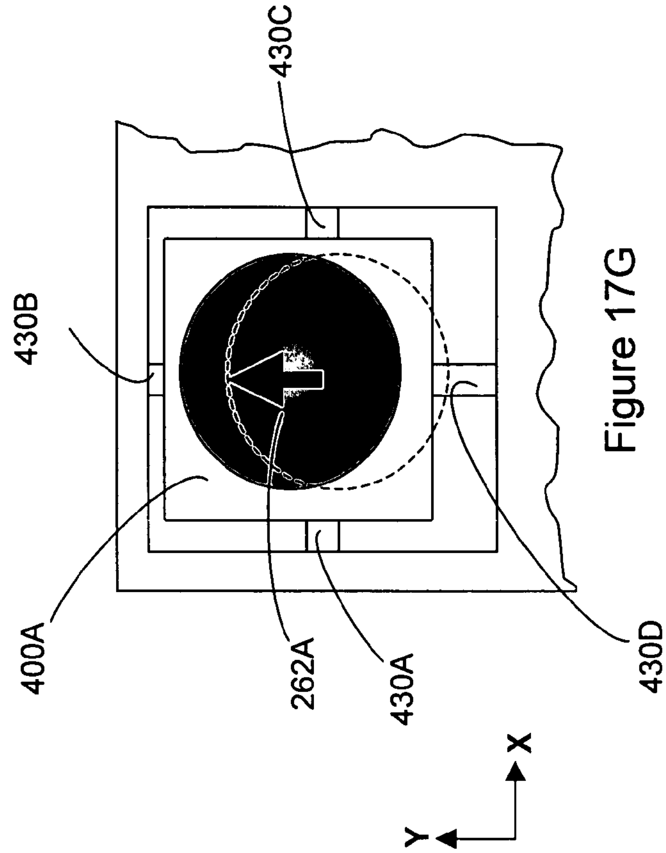
FIGS. 17G-17I are enlarged schematic plan views of the optics portion and the portion of the positioner of FIG. 17F, with the portion of the positioner in various states.
Figure 17F:
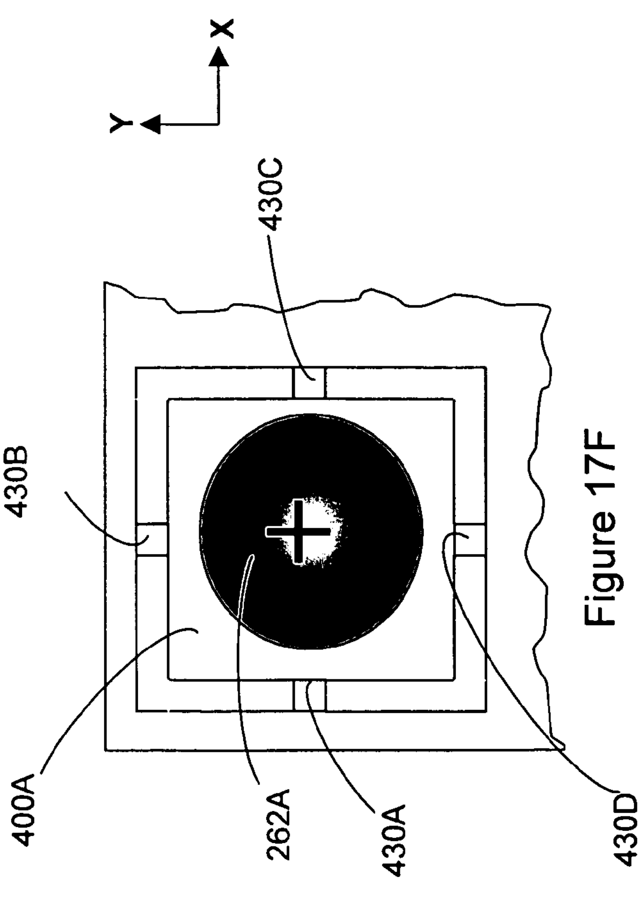
FIG. 17F is an enlarged schematic plan view of an optics portion and a portion of the positioner of the digital camera apparatus of FIGS. 17A-17E, with the portion of the positioner shown in a first state.
Figure 17I:
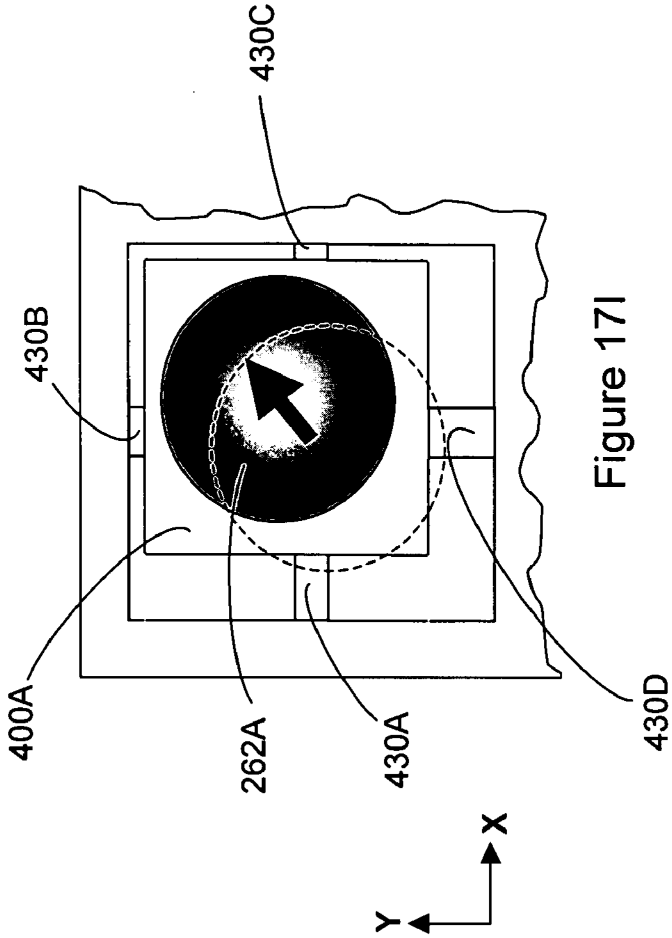
Figure 17H:
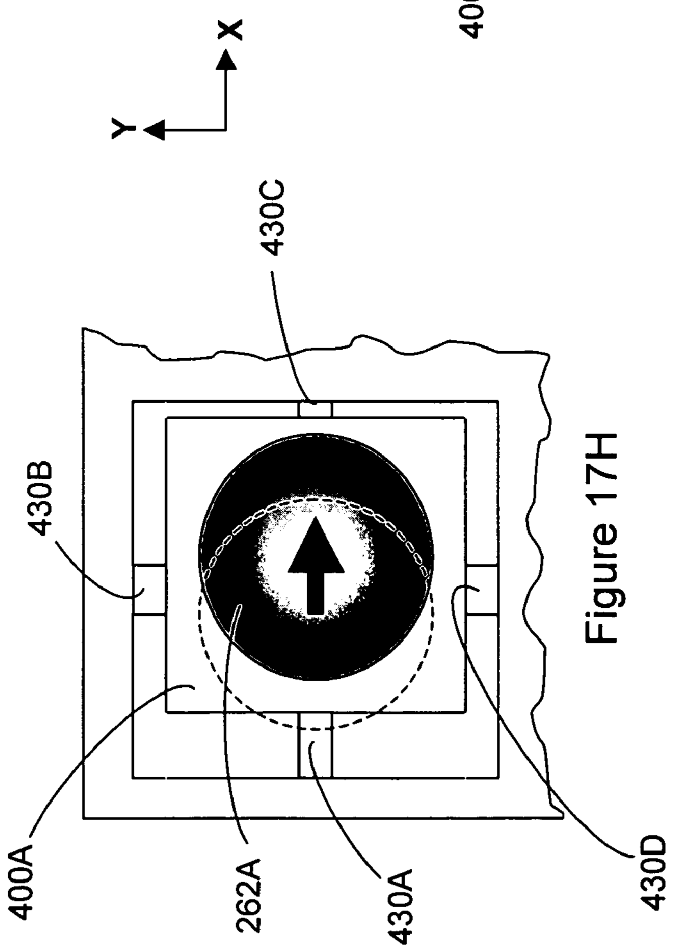

FIGS. 17F-17I show examples of the operation of the positioner 310. More particularly FIG. 17F shows an example of the inner frame portion at a first (e.g., rest) position. Referring to FIG. 17G, the controller may provide one or more control signals to cause one or more of the actuator portions (see, for example, actuator portions 430B, 430D) to move the inner frame portion and the associated optics portion in the positive y direction. In some embodiments, for example, the control signals cause one of the actuator portions to expand and one of the actuator portions to contract, although this is not required. Referring to FIG. 17H, the controller may provide one or more control signals to cause one or more of the actuator portions (see, for example, actuator portions 430A, 430C) to move the inner frame portion and the associated optics portion in the positive x direction. In some embodiments, for example, the control signals cause one of the actuator portions to expand and one of the actuator portions to contract, although this is not required. Referring to FIG. 17I, the controller may provide one or more control signals to cause one or more of the actuator portions (see for example, actuator portions 430A-430D) to move the inner frame portion and the associated optics portion in the positive y and positive x directions (i.e., in a direction that includes a positive y direction component and a positive x direction component. In some embodiments, for example, the control signals cause two of the actuator portions to expand and two of the actuator portions to contract, although this is not required.

As stated above, in some embodiments, more than one actuator is able to provide movement in a particular direction. In some such embodiments, more than one of such actuators may be employed at a time. For example, in some embodiments, one of the actuators may provide a pushing force while the other actuator may provide a pulling force. In some embodiments both actuators may pull at the same time, but in unequal amounts. For example, one actuator may provide a pulling force greater than the pulling force of the other actuator. In some embodiments, both actuators may push at the same time, but in unequal amounts. For example, one actuator may provide a pushing force greater than the pushing force of the other actuator. In some embodiments, only one of such actuators is employed at a time. In some such embodiments, one actuator may be actuated, for example, to provide either a pushing force or a pulling force.

Referring to FIGS. 18A-18E, in some embodiments, actuator portions 430A-430D are adapted to move and/or tilt in the z direction. For example, one or more of the actuator portions (e.g., 430A-430D, 434A-434D, 438A-438D, 442A-442D) may be provided with torsional characteristics that cause the actuators to move and/or tilt upward (or move and/or tilt downward) in response to appropriate control signals (e.g., stimuli from the controller). In such embodiments one or more of the inner frame portions (e.g., 400A-400D) may be raised, lowered and/or tilted. Referring to FIG. 18A, in one embodiment, for example, the controller provides a first control signal (e.g., stimuli) to all of the actuator portions (e.g., 430A-430D, 434A-434D, 438A-438D, 442A-442D) to cause all of the inner frame portions 400A-400D, to be moved upward. Referring to FIG. 18B, a second control signal (e.g., stimuli) may be provided to all of the actuators (e.g., 430A-430D, 434A-434D, 438A-438D, 442A-442D) to cause all of the inner frame portions 400A-400D, to be moved downward. Referring to FIG. 18C, in some embodiments, the controller 300 may provide one or more control signals to cause all of the inner frame portions 400A-400D, to be tilted inward (toward the center of the positioner). Referring to FIG. 18D in some embodiments, the controller 300 may provide one or more control signals to cause all of the inner frame portions 400A-400D to be tilted outward (away from the center of the positioner). Referring to FIG. 18E in some embodiments, the controller 300 may provide one or more control signals to cause one or more of the inner frame portions, e.g., frame portion 400A, to be tilted outward and one or more of the inner frame portions, e.g., frame portion 400B, to be tilted inward.

Figure 19A:
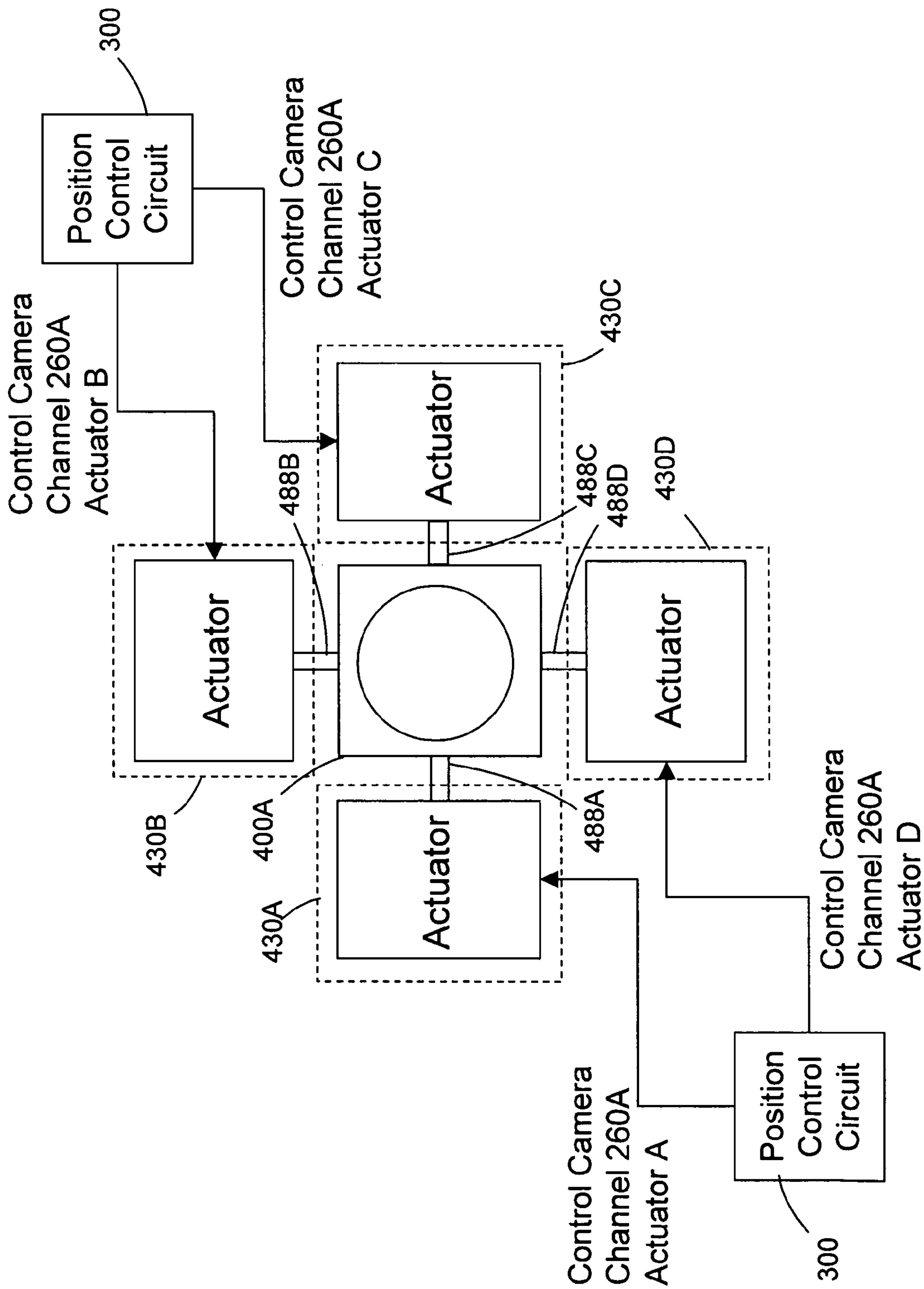
FIG. 19A shows another embodiment, partially in schematic plan view and partially in block diagram, of a portion of a positioner and a portion of a controller that may be employed in the digital camera apparatus illustrated in FIGS. 17A-17I.
Figure 19B:
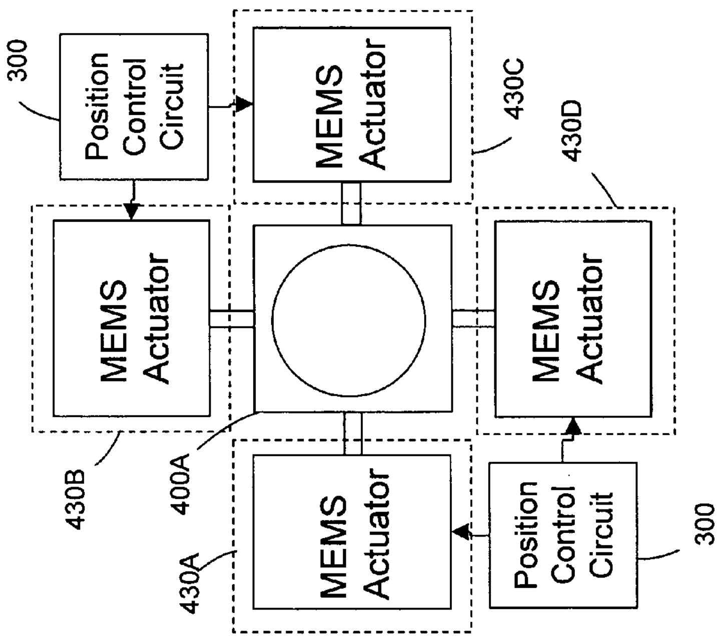
FIG. 19B shows another embodiment, partially in schematic plan view and partially in block diagram, of a portion of a positioner and a portion of a controller that may be employed in the digital camera apparatus illustrated in FIGS. 17A-17I.
Figure 19D:
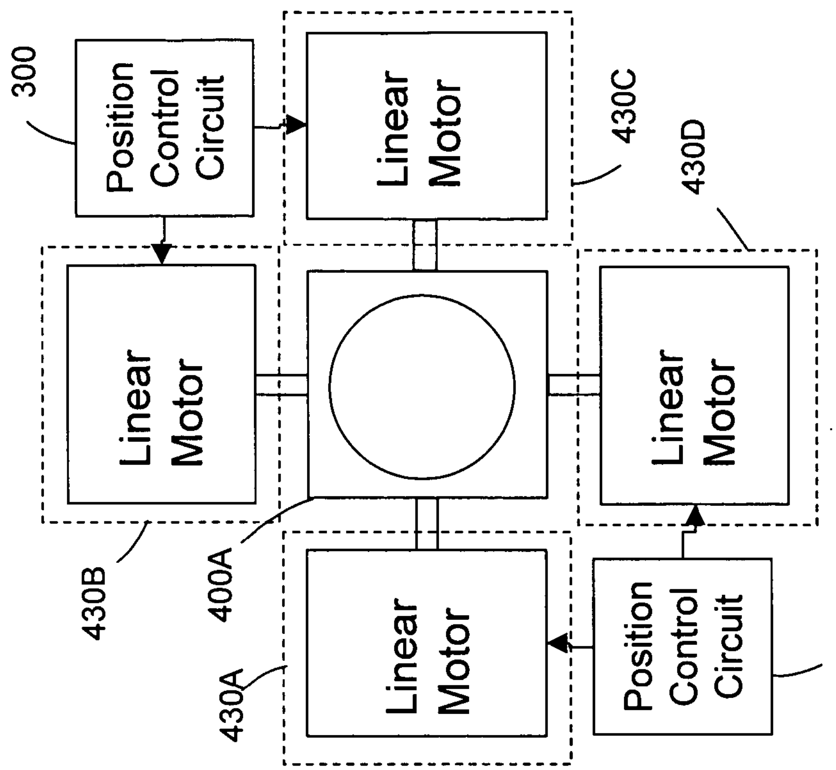
FIG. 19D shows another embodiment, partially in schematic plan view and partially in block diagram, of a portion of a positioner and a portion of a controller that may be employed in the digital camera apparatus illustrated in FIGS. 17A-17I.
Figure 19C:
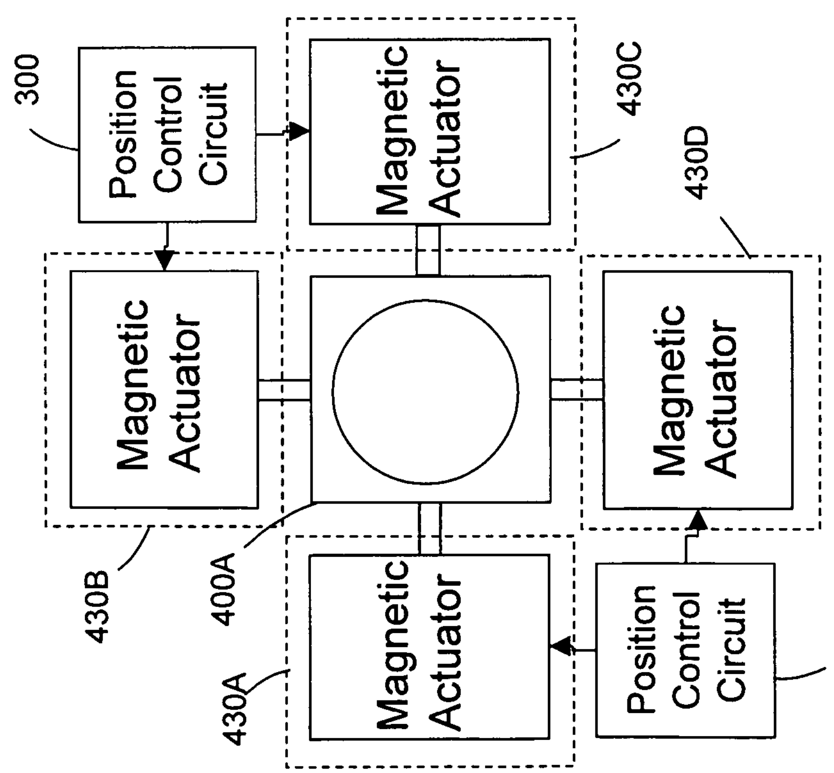
FIG. 19C shows another embodiment, partially in schematic plan view and partially in block diagram, of a portion of a positioner and a portion of a controller that may be employed in the digital camera apparatus illustrated in FIGS. 17A-17I.
Figure 19F:
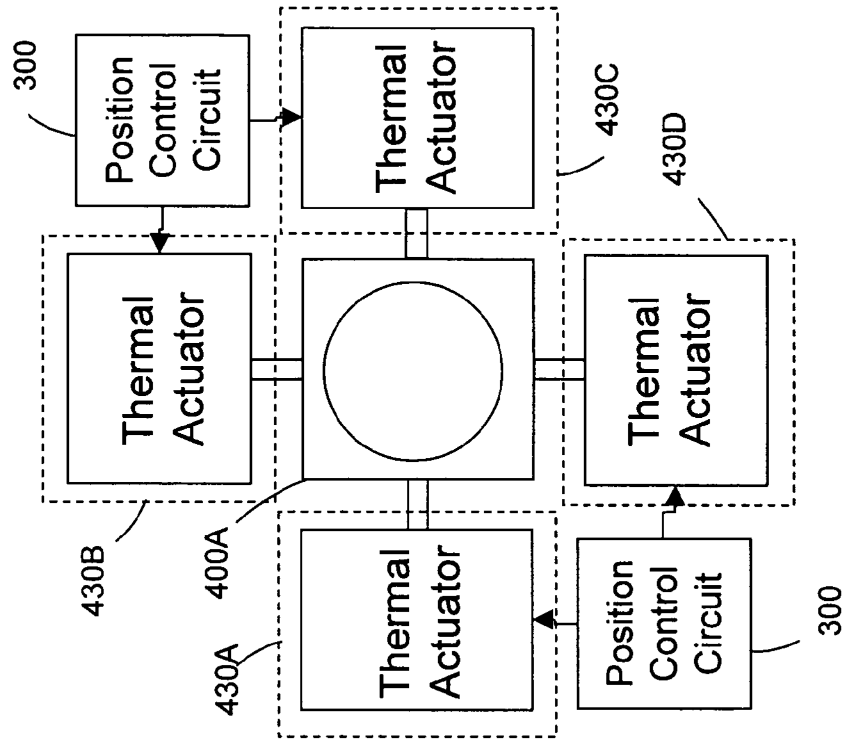
FIG. 19F shows another embodiment, partially in schematic plan view and partially in block diagram, of a portion of a positioner and a portion of a controller that may be employed in the digital camera apparatus illustrated in FIGS. 17A-17I.
Figure 19E:
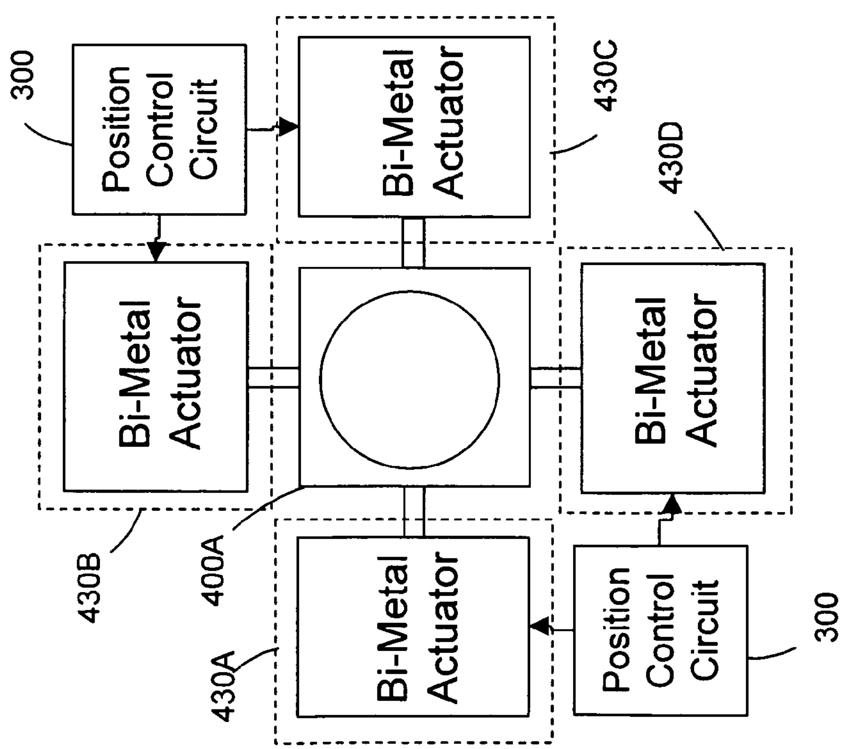
FIG. 19E shows another embodiment, partially in schematic plan view and partially in block diagram, of a portion of a positioner and a portion of a controller that may be employed in the digital camera apparatus illustrated in FIGS. 17A-17I.
Figure 19H:
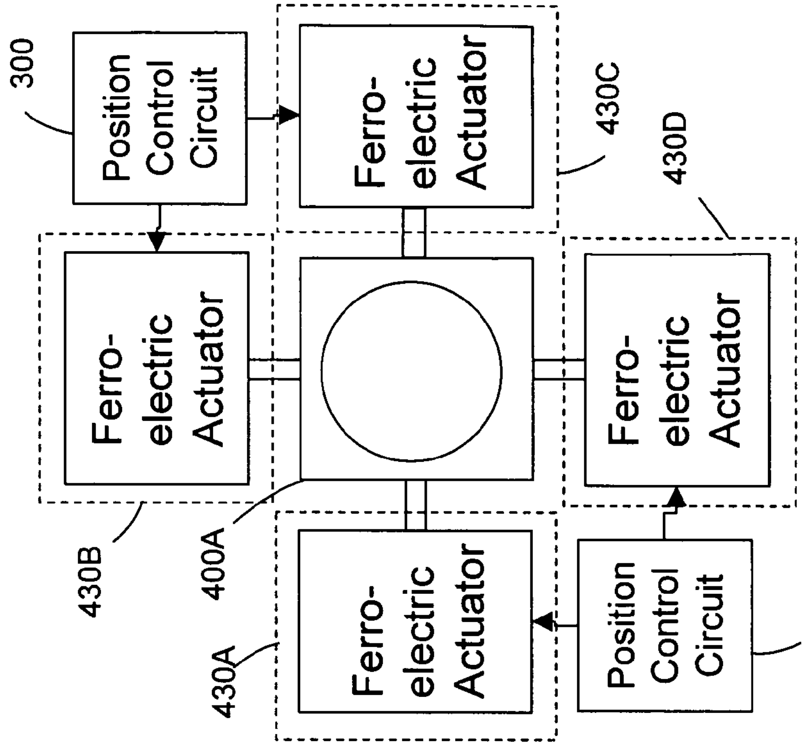
FIG. 19H shows another embodiment, partially in schematic plan view and partially in block diagram, of a portion of a positioner and a portion of a controller that may be employed in the digital camera apparatus illustrated in FIGS. 17A-17I.
Figure 19G:
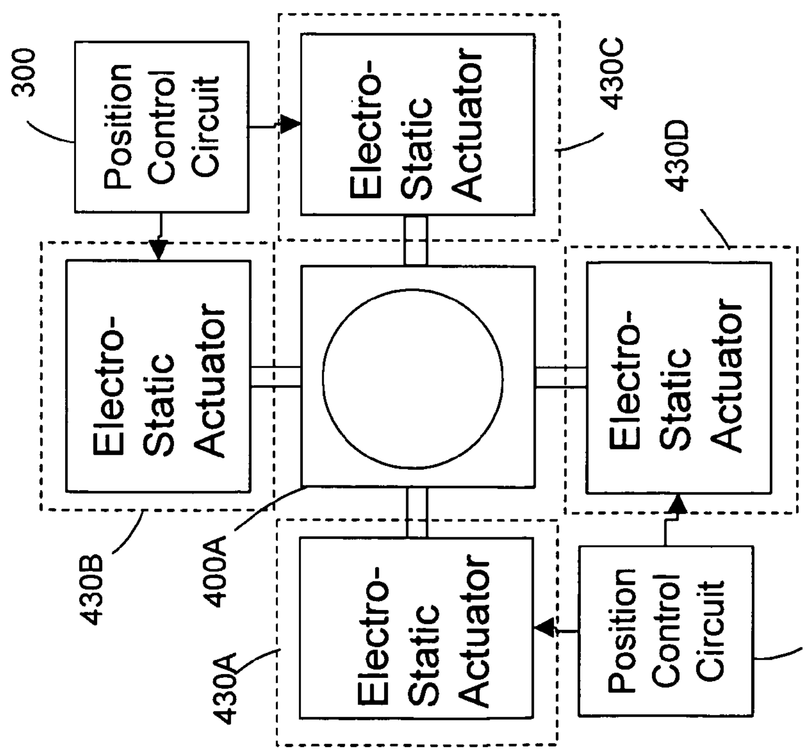
FIG. 19G shows another embodiment, partially in schematic plan view and partially in block diagram, of a portion of a positioner and a portion of a controller that may be employed in the digital camera apparatus illustrated in FIGS. 17A-17I.
Figure 19I:
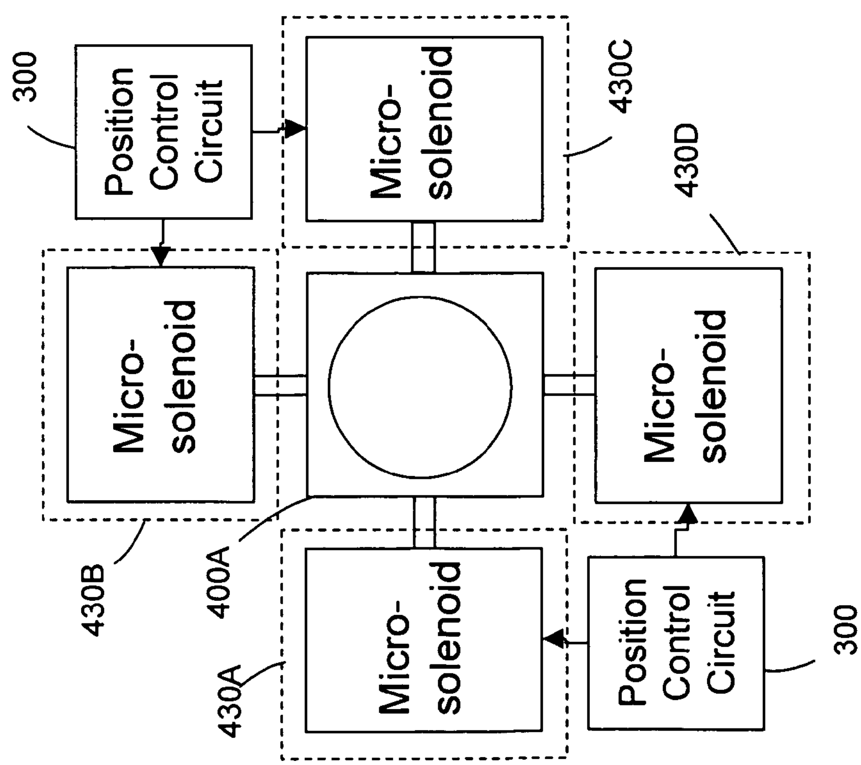
FIG. 19I shows another embodiment, partially in schematic plan view and partially in block diagram, of a portion of a positioner and a portion of a controller that may be employed in the digital camera apparatus illustrated in FIGS. 17A-17I.
Figure 19J:
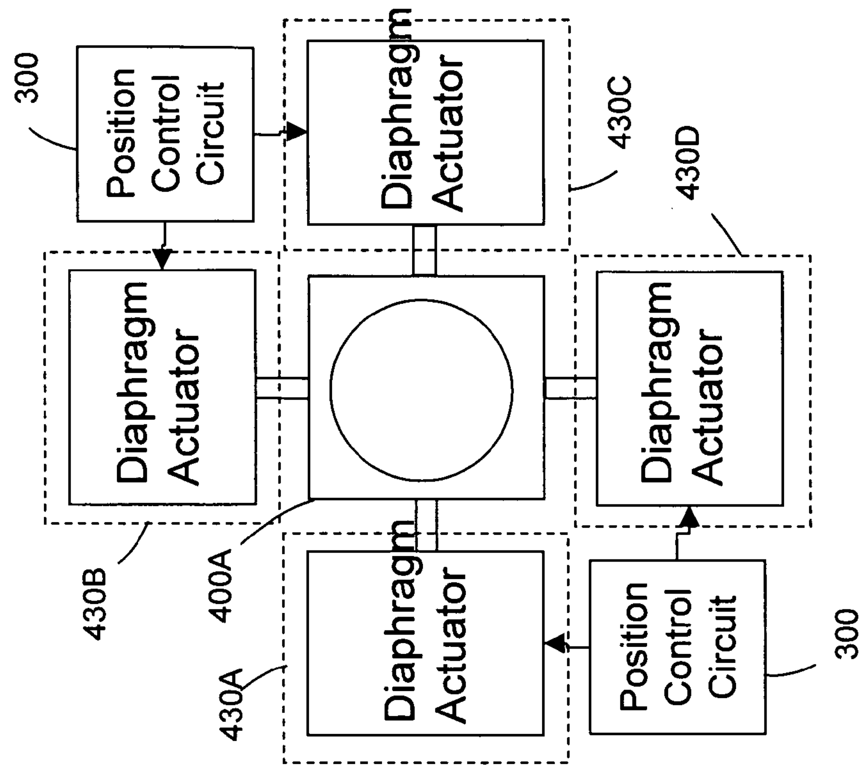
FIG. 19J shows another embodiment, partially in schematic plan view and partially in block diagram, of a portion of a positioner and a portion of a controller that may be employed in the digital camera apparatus illustrated in FIGS. 17A-17I.

FIG. 19A is a schematic diagram of one of an inner frame portion (e.g., 400A), the associated actuator portions 430A-430D and portions of one embodiment of the controller 300 (e.g., a position control circuit) employed in some embodiments of the digital camera apparatus of FIGS. 17A-17I. In this embodiment, the positioner 310 and/or actuator portions 430A-430D comprise any type or types of actuators and/or actuator technology or technologies and employ any type of motion including, for example, but not limited to, linear and/or rotary, analog and/or discrete, and any type of actuator technology, including, for example, but not limited to, microelectromechanical systems (MEMS) actuators, magnetic actuators, motors (e.g., linear or rotary), bi-metal actuators, thermal actuators, electro-static actuators, ferroelectric actuators, solenoids (e.g., micro-solenoids), diaphragm actuators, piezo-electric actuators and/or combinations thereof (see, for example, FIGS. 19B-19J).

In some embodiments, actuator portions, e.g., actuator portions 430A-430D, are coupled to an associated inner frame portion, e.g., inner frame portion 400A, via coupling portions, e.g., coupling portions 488A-488D, respectively. In some embodiments, each of the actuator portions, e.g., actuator portions 430A-430D, is coupled to an associated outer frame portion and/or integral with the associated outer frame portion. For example, actuator portion 430A may be coupled to and/or integral with outer frame portion 410 of positioner 310.

In some embodiments, one or more signals are provided to each actuator. In the illustrated embodiment, for example, a signal is supplied to each of the actuators. For example, actuator 430A of camera channel 260A receives a signal, control camera channel 260A actuator A. Actuator 430B of camera channel 260A receives a signal, control camera channel 260A actuator B. Actuator 430C of camera channel 260A receives a signal, control camera channel 260A actuator C. Actuator 430D of camera channel 260A receives a signal, control camera channel 260A actuator D.

In some embodiments, the control signals cause the actuators to provide desired motion(s). It should be understood that although the control signals are shown supplied on a single signal line, the input signals may have any form including for example but not limited to, a single ended signal and/or a differential signal.

In the illustrated embodiment, each of the actuators has the same or similar configuration. In some other embodiments, however, one or more of the actuators may have a different configuration than one or more of the other actuators.

It should be understood that the one or more actuators, e.g., actuators 430A-430D, 434A-434D, 438A-438D, 442A-442D, may be disposed in any suitable location or locations. Other configurations may also be employed. In some embodiments, one or more of the actuators is disposed on and/or integral with one or more portions of the positioner 310, although in some other embodiments, one or more of the actuators are not disposed on and/or integral with one or more portions of the positioner 310.

The one or more actuators, e.g., actuators 430A-430D, 434A-434D, 438A-438D, 442A-442D, may have any size and shape and may or may not have the same configuration as one another (e.g., type, size, shape). In some embodiments, one or more of the one or more actuators has a length and a width that are less than or equal to the length and width, respectively of an optical portion of one of the camera channel(s). In some embodiments, one or more of the one or more actuators has a length or a width that is greater than the length or width, respectively of an optical portion of one of the camera channel(s).

Figure 20A:
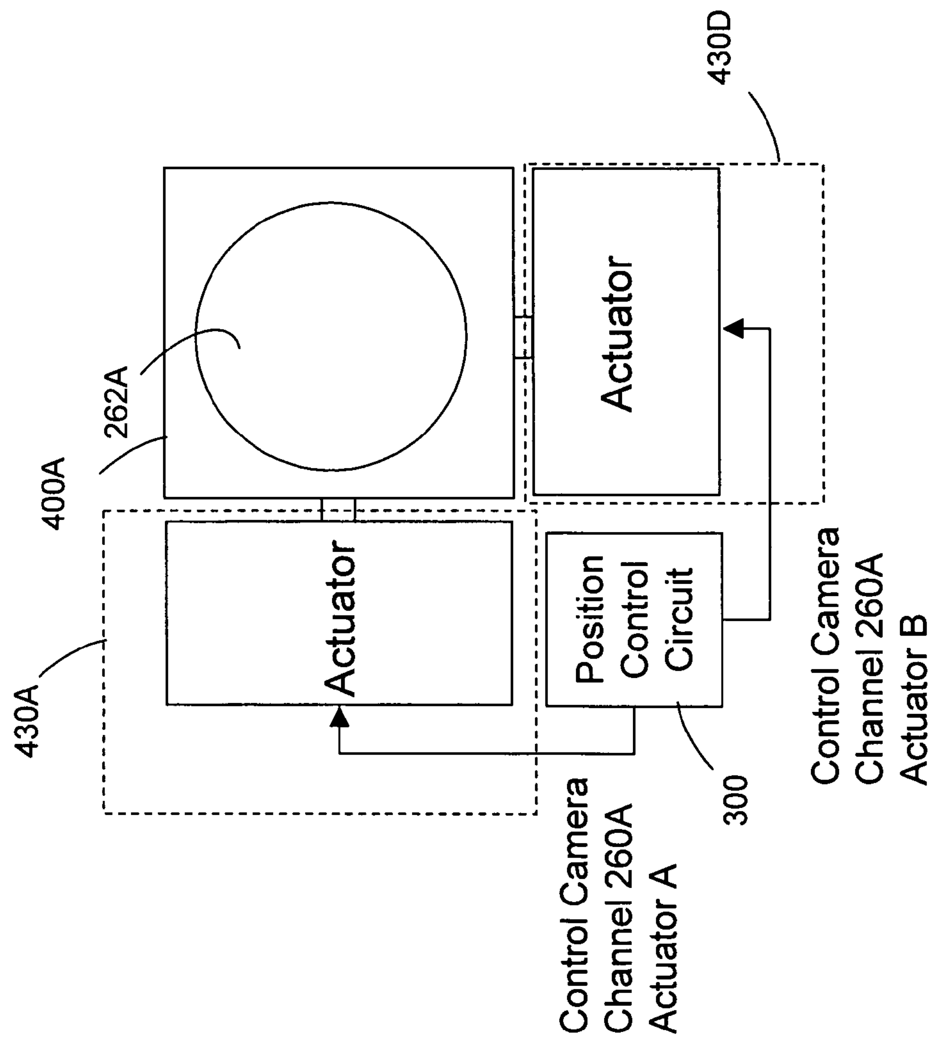
FIG. 20A shows another embodiment, partially in schematic plan view and partially in block diagram, of a portion of a positioner and a portion of a controller that may be employed in the digital camera apparatus illustrated in FIGS. 17A-17I, in accordance with another aspect of the present invention.

In another aspect of the present invention, two actuator portions (e.g., 430A-430B), rather than four actuator portions, are associated with each inner frame portion (e.g., 400A) and/or optics portion (e.g., optics portion 262A). FIG. 20A is a schematic diagram of such one embodiment of the inner frame portion (e.g., 400A), the associated actuator portions 430A-430D and portions of one embodiment of the controller 300 (e.g., two position control circuits). The actuator portions may comprise any type of actuator(s), for example, but not limited to, MEMS actuators, such as for example, similar to those described above with respect to FIGS. 15A-15H and 16A-16E. If MEMS actuators are employed, the MEMS actuators may be of the comb type, such as for example, as shown in FIGS. 20B-20D.

Other types of actuators may also be employed, for example, electro-static actuators, diaphragm actuators, magnetic actuators, bi-metal actuators, thermal actuators, ferroelectric actuators, piezo-electric actuators, motors (e.g., linear or rotary), solenoids (e.g., micro-solenoids) and/or combinations, such as for example, similar to those described above with respect to FIGS. 17A-17H and 18A-18E. The actuators may be of a comb type (see for example, FIGS. 20B-20D), a linear type and/or combinations thereof, but are not limited to such.

Figure 20B:
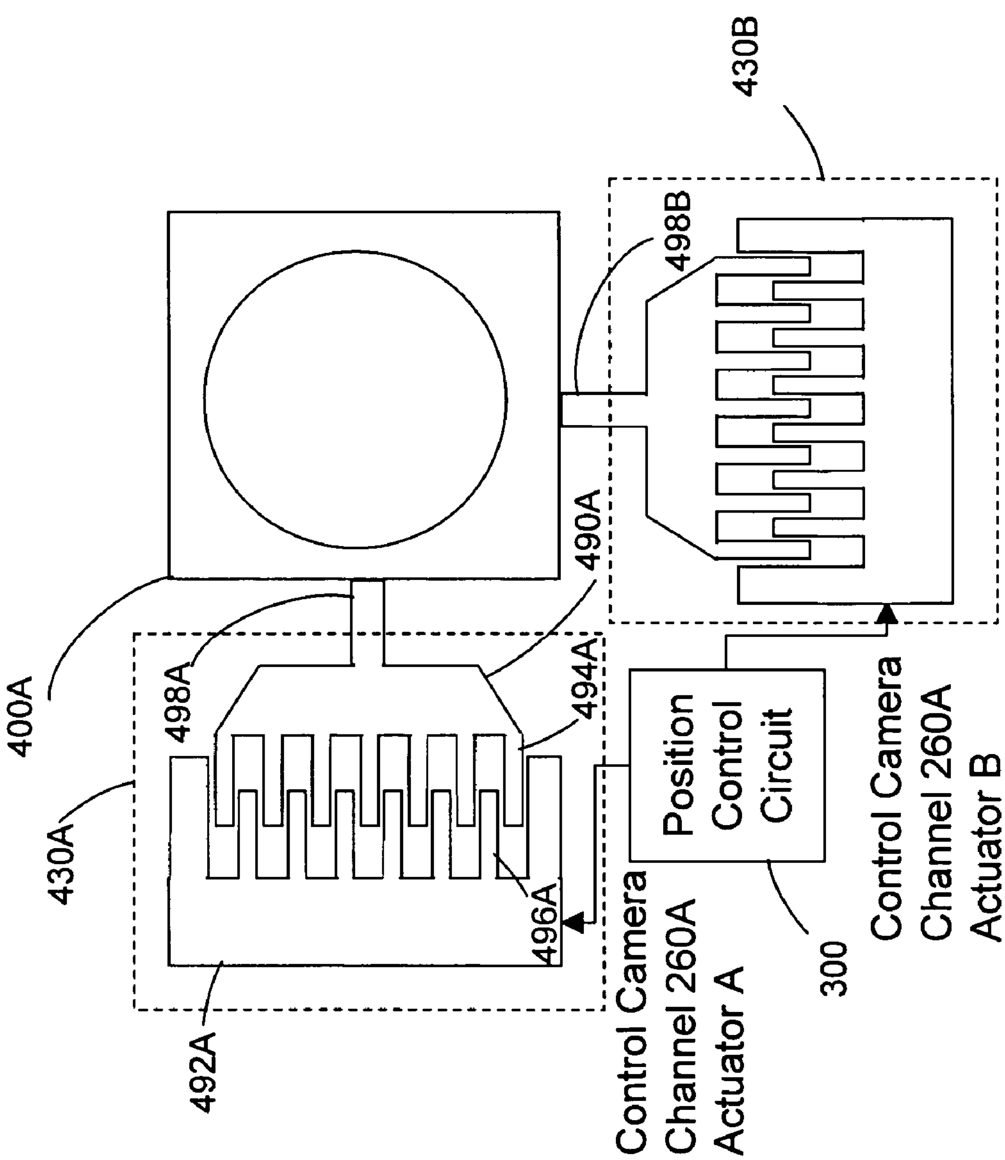
FIG. 20B shows another embodiment, partially in schematic plan view and partially in block diagram, of a portion of a positioner and a portion of a controller that may be employed in the digital camera apparatus illustrated in FIGS. 17A-17I, in accordance with another aspect of the present invention.
Figure 20C:
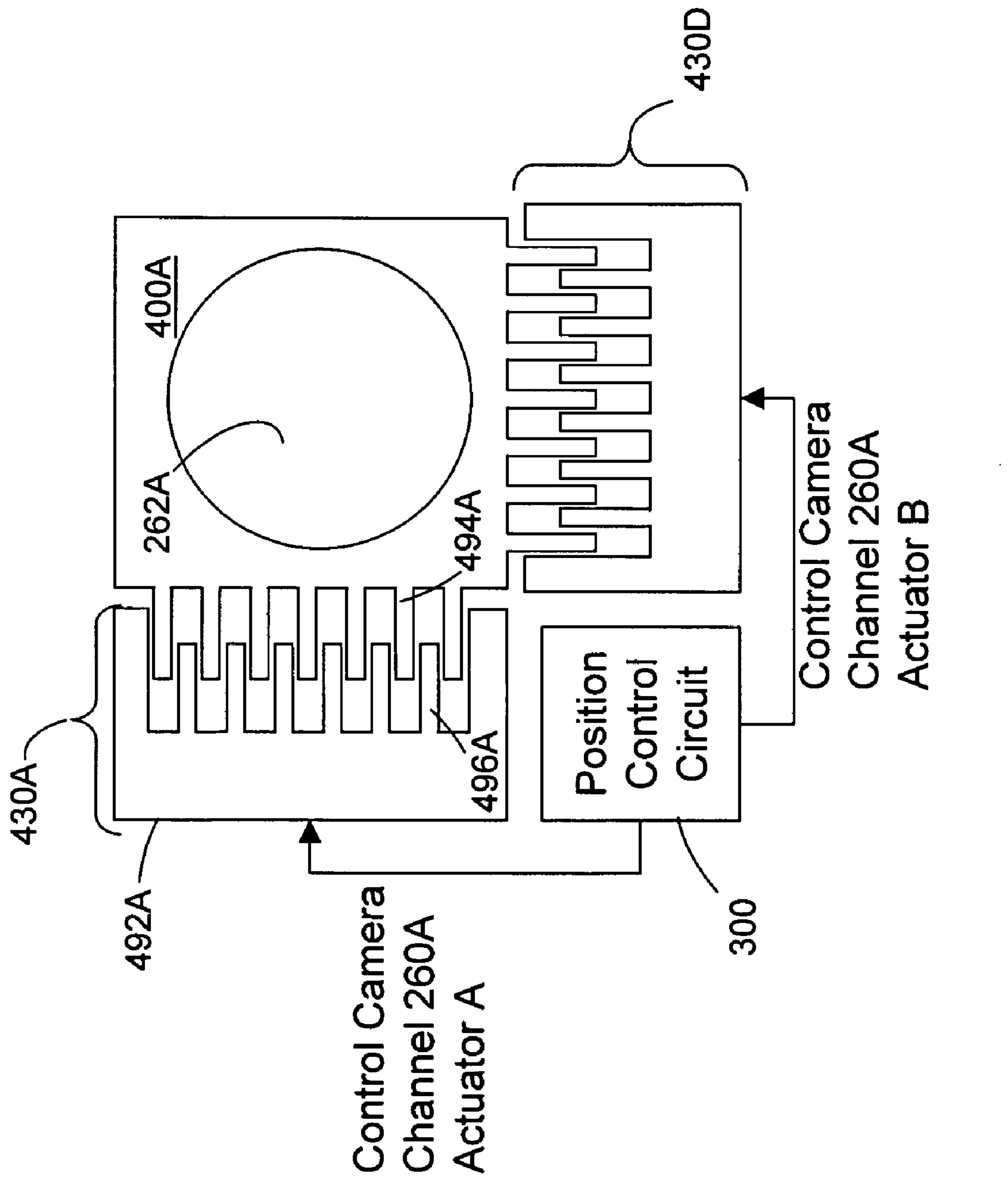
FIG. 20C shows another embodiment, partially in schematic plan view and partially in block diagram, of a portion of a positioner and a portion of a controller that may be employed in the digital camera apparatus illustrated in FIGS. 17A-17I, in accordance with another aspect of the present invention.
Figure 20D:
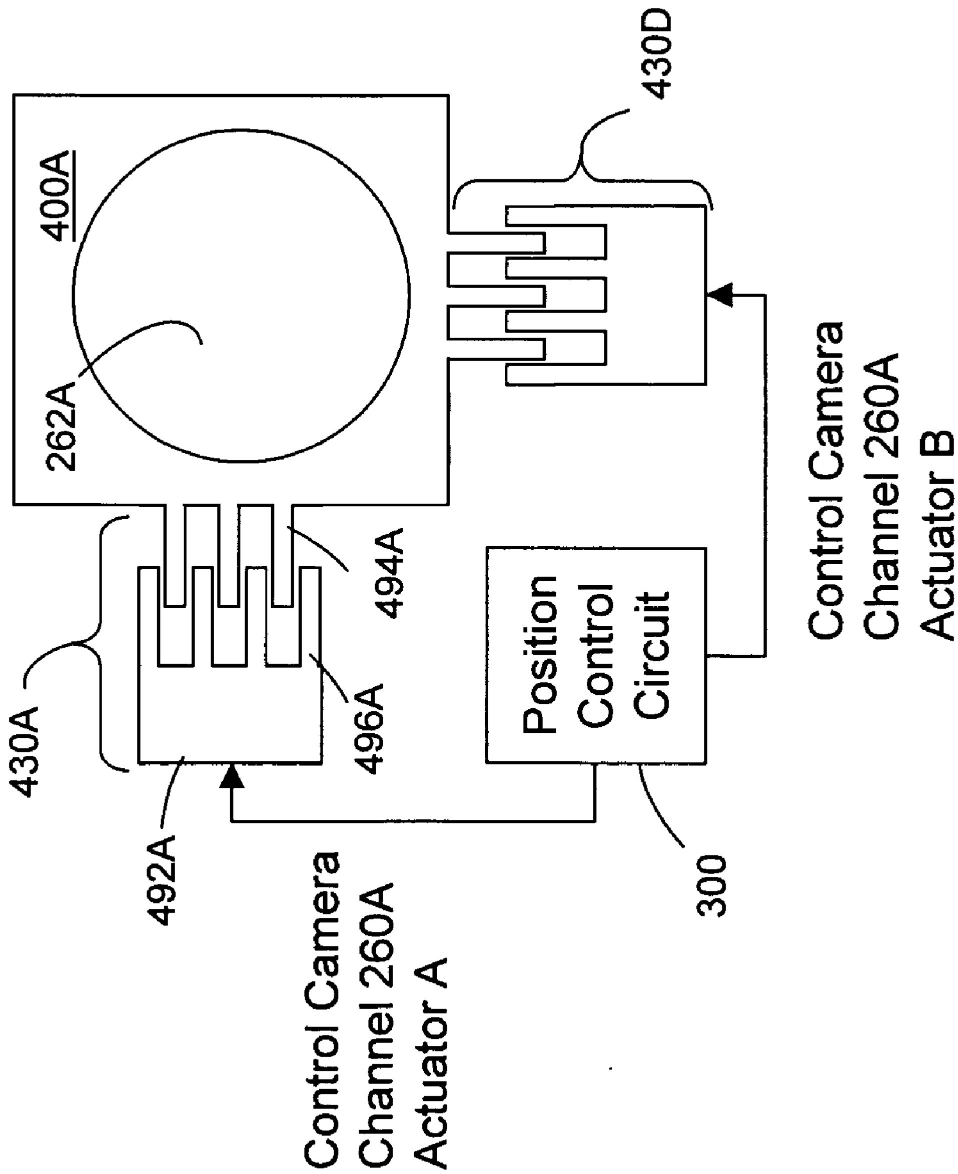
FIG. 20D shows another embodiment, partially in schematic plan view and partially in block diagram, of a portion of a positioner and a portion of a controller that may be employed in the digital camera apparatus illustrated in FIGS. 17A-17I, in accordance with another aspect of the present invention.

FIG. 20B is a schematic diagram of one embodiment of an inner frame portion (e.g., 400A), associated actuator portions, e.g., actuator portions 430A-430B, and a portion of one embodiment of the controller 300 employed in some embodiments of the digital camera apparatus 210 of FIGS. 17A-17H, 18A-18E and 19A-19J. In this embodiment, each of the actuators 430A-430B comprises a comb type actuator.

In the illustrated embodiment, each of the comb type actuators includes a first comb and a second comb. For example, actuator portion 430A includes a first comb 490A and a second comb 492A. In this embodiment, the first and second combs, e.g., first and second combs 490A, 492A, are arranged such that the teeth, e.g, teeth 494A, of the first comb are in register with the gaps between the teeth of the second comb and such that the teeth, e.g., teeth 496A, of the second comb are in register with the gaps between the teeth of the first comb.

In some embodiments, the first comb of each actuator portion is coupled to an associated inner frame portion and/or integral with the associated inner frame portion. In the illustrated embodiment, for example, the first comb of actuator portions 430A-430B is coupled to the associated inner frame portion 400A via coupler portions 498A-498B, respectively. In some embodiments, the second comb of each actuator portion is coupled to an associated outer frame portion and/or integral with the associated outer frame portion. In the illustrated embodiment, for example, the second comb 492A of actuator portion 430A is coupled to outer frame portion 410 and/or integral with outer frame portion 410.

The one or more signals result in an electrostatic force that causes the first comb to move in a direction toward the second comb and/or causes the second comb to move in a direction toward the first comb. In some embodiments, the amount of movement depends on the magnitude of the electrostatic force, which for example, may depend on the one or more voltages, the number of teeth on the first comb and the number of teeth on the second comb, the size and/or shape of the teeth and the distance between the first comb and the second comb. As one or both of the combs move, the teeth of the first comb are received into the gaps between the teeth of the second comb. The teeth of the second comb are received into the gaps between the teeth of the first comb.

One or more springs may be provided to provide one or more spring forces. FIG. 15M shows one embodiment of springs 480 that may be employed to provide a spring force. In such embodiment, a spring 480 is provided for each actuator, e.g., 430A-430D. Two such springs 480 are shown. One of the illustrated springs 480 is associated with actuator 430B. The other illustrated spring 480 is associated with actuator 430C. Each spring 480 is coupled between an inner frame portion, e.g., inner frame portion 400A, and an associated spring anchor 482 connected to the MEMS structure. If the electrostatic force is reduced and/or halted, the one or more spring forces cause the comb actuator to return its initial position. Some embodiments may employ springs having rounded corners instead of sharp corners.

In the illustrated embodiment, each of the combs actuators has the same or similar configuration. In some other embodiments, however, one or more of the comb actuators may have a different configuration than one or more of the other comb actuators. In some embodiments, springs, levers and/or crankshafts may be employed to convert the linear motion of one or more of the comb actuator(s) to rotational motion and/or another type of motion or motions.

FIG. 20C is a schematic diagram of another embodiment of the inner frame portion (e.g., 400A), the associated actuator portions, e.g., actuator portions 430A-430B, and a portion of one embodiment of the controller 300 employed in some embodiments of the digital camera apparatus of FIGS. 17A-17H, 18A-18E and 19A-19J. In this embodiment, each of the actuators portions 430A-430B comprises a comb type actuator. In some embodiments, each of the MEMS actuator portions, e.g., actuator portions 430A-430D, includes two combs. One of the combs is integral with the associated inner frame portion, e.g., inner frame portion 400A.

FIG. 20D is a schematic diagram of another embodiment of the inner frame portion (e.g., 400A), the associated actuator portions, e.g., actuator portions 430A-430B, and a portion of one embodiment of the controller 300 employed in some embodiments of the digital camera apparatus of FIGS. 17A-17H, 18A-18E and 19A-19J. In this embodiment, each of the actuators portions 430A-430B comprises a comb type actuator. In this embodiment, each MEMS actuator portion, e.g., actuator portions 430A-430D, has fewer teeth than the comb type MEMS actuators illustrated in FIGS. 15J-15K.

Figure 21A:
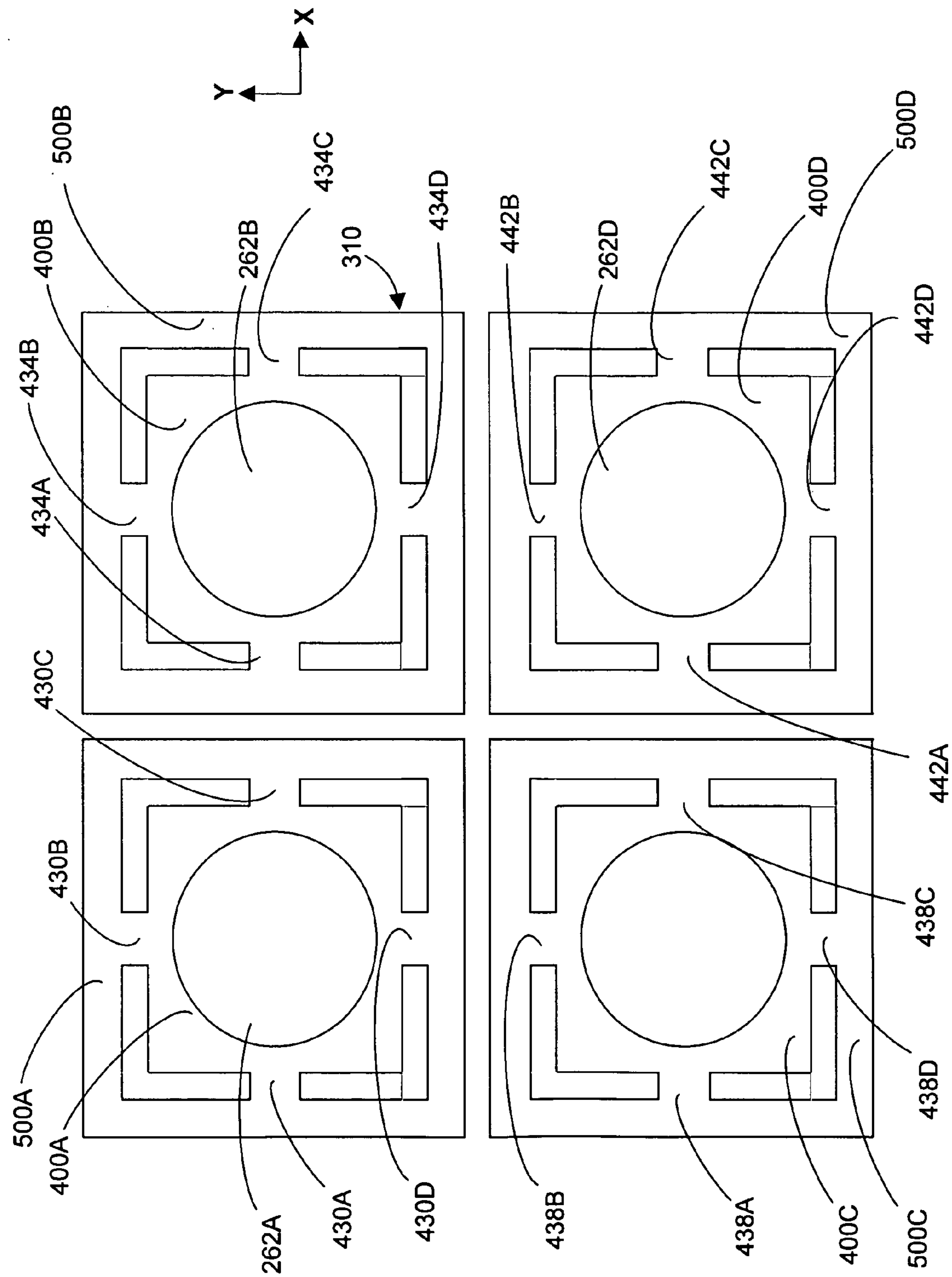
FIGS. 21A-21B are an enlarged schematic plan view and an enlarged schematic representation, respectively, of another embodiment of optics portions and a positioner that may be employed in the digital camera apparatus of FIG. 4, in accordance with another aspect of the present invention.
Figure 21B:
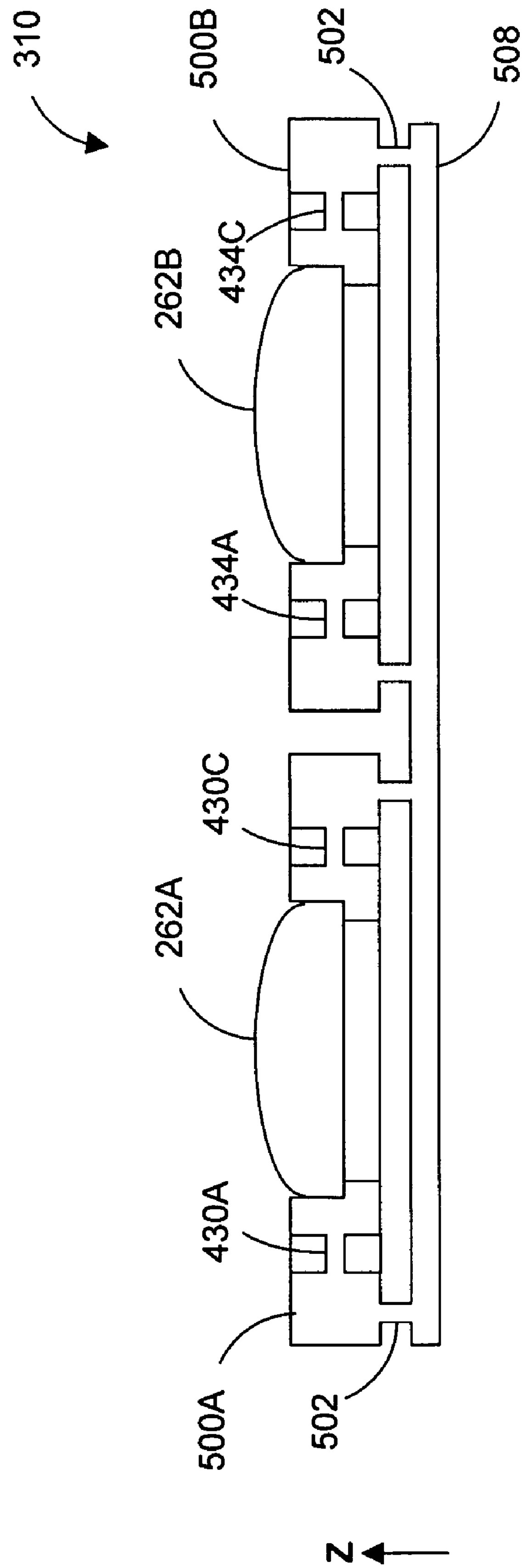

Referring to FIGS. 21A-21B, in another aspect of the present invention, one or more outer frame portions are provided for each of the one or more of the inner frame portions (e.g., inner frames 400A-400D) such that the one or more inner frame portions and/or the one or more optics portions 262A-262D are isolated from one another. In this aspect, two or more optics portions may be more easily moved independently of one another. In this embodiment, outer frame portion 500A is associated with inner frame portion 400A, outer frame portion 500B is associated with inner frame portion 400B, outer frame portion 500C is associated with inner frame portion 400C, outer frame portion 500D is associated with inner frame portion 400D. Clearances or spaces isolate the outer frame portions, e.g., outer frame portions 500A-500D, from one another. In some embodiments, two or more of the outer frame portions, e.g., outer frame portions 500A-500D, may be coupled to another frame portion. In this embodiment, for example, outer frame portions 500A-500D are mechanically coupled, by one or more supports 502, to a lower frame portion 508. The actuators may be MEMS actuators, for example, similar to those described hereinabove with respect to FIGS. 15A-15H, 16A-16E and/or 20A-20D.

Figure 21C:
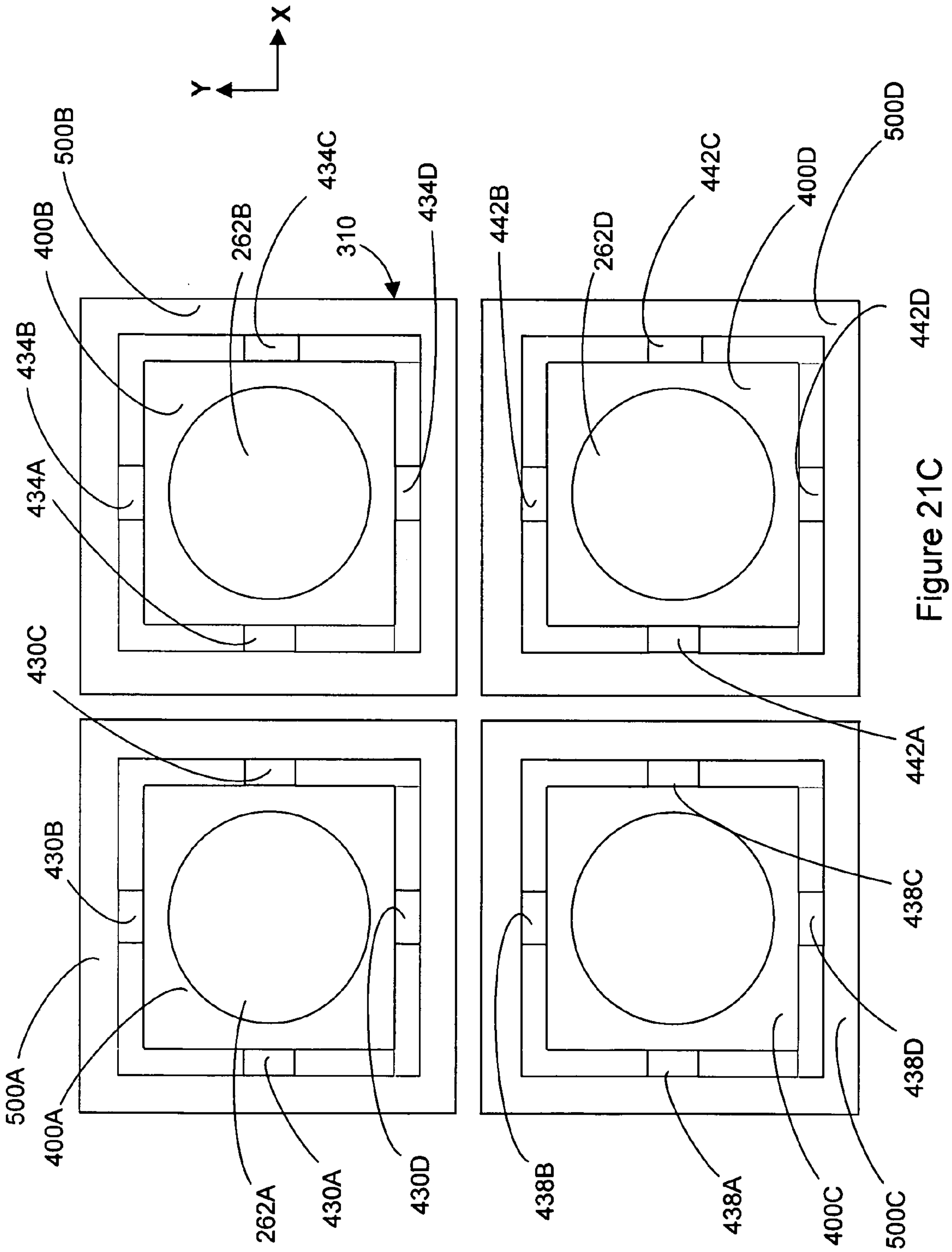
FIGS. 21C-21D are an enlarged schematic plan view and an enlarged schematic representation, respectively, of another embodiment of optics portions and a positioner that may be employed in the digital camera apparatus of FIG. 4, in accordance with another aspect of the present invention.
Figure 21D:
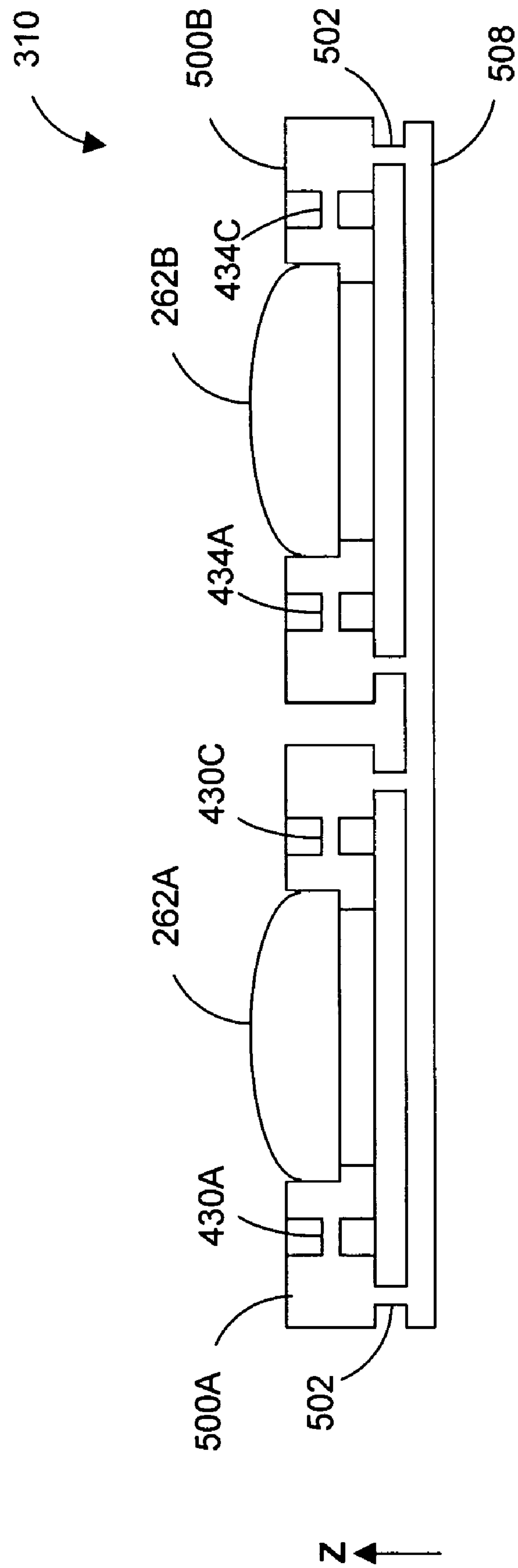

Referring to FIGS. 21C-21D, in another aspect of the present invention, one or more outer frame portions are provided for each of the one or more of the inner frame portions (e.g., inner frames 400A-400D) such that the one or more inner frame portions and/or the one or more optics portions 262A-262D are isolated from one another. In this aspect, two or more optics portions may be more easily moved independently of one another. In this embodiment, outer frame portion 500A is associated with inner frame portion 400A, outer frame portion 500B is associated with inner frame portion 400B, outer frame portion 500C is associated with inner frame portion 400C, outer frame portion 500D is associated with inner frame portion 400D. Clearances or spaces isolate the outer frame portions, e.g., outer frame portions 500A-500D, from one another. In some embodiments, two or more of the outer frame portions, e.g., outer frame portions 500A-500D, may be coupled to another frame portion. In this embodiment, for example, outer frame portions 500A-500D are mechanically coupled, by one or more supports 502, to a lower frame portion 508. The actuators may be any type of actuators, for example, similar to those described hereinabove with respect to FIGS. 17A-17H, 18A-18E and/or 20A-20D.

Figure 22:
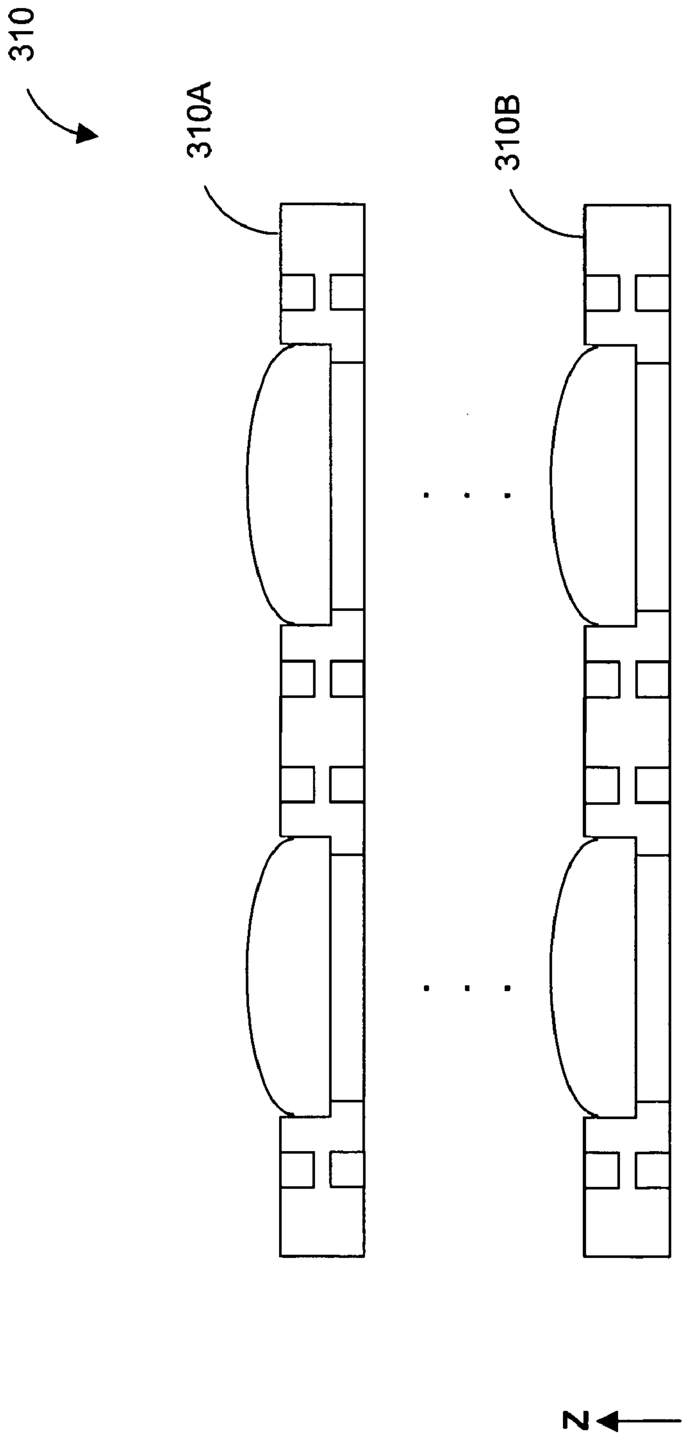
FIG. 22 is an enlarged schematic representation, respectively, of another embodiment of optics portions and a positioner that may be employed in the digital camera apparatus of FIG. 4, in accordance with another aspect of the present invention.
Figure 23A:
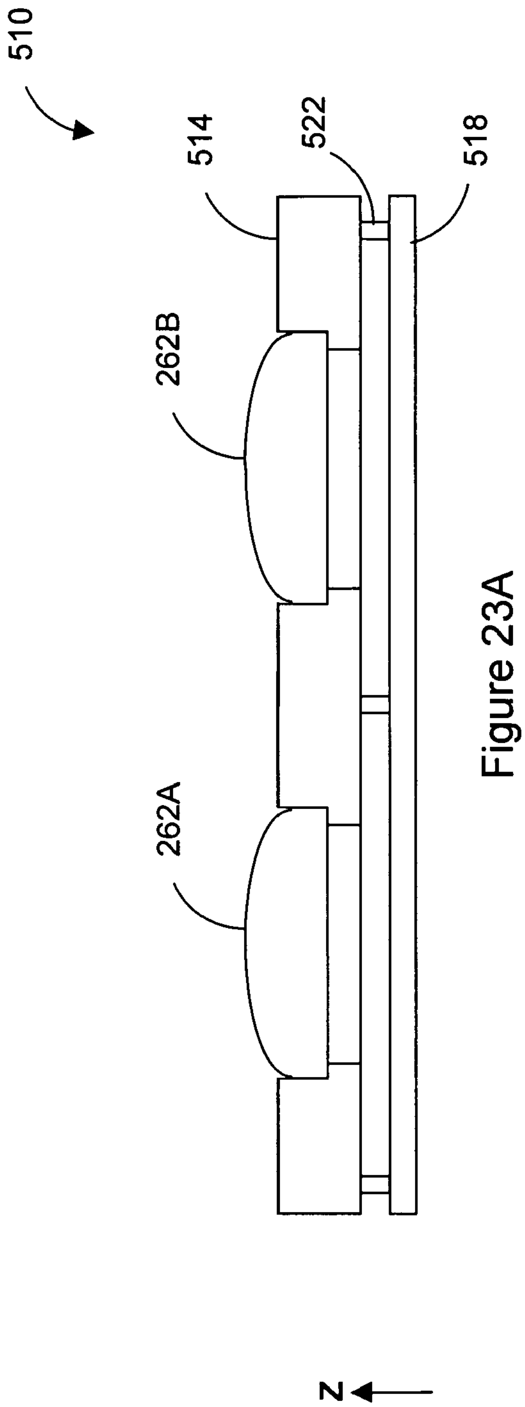
FIG. 23A-23D are enlarged schematic representations of another embodiment of optics portions and a positioner that may be employed in the digital camera apparatus of FIG. 4, with the positioner in various states to provide various positioning of the optics portions, in accordance with another aspect of the present invention.
Figure 23B:
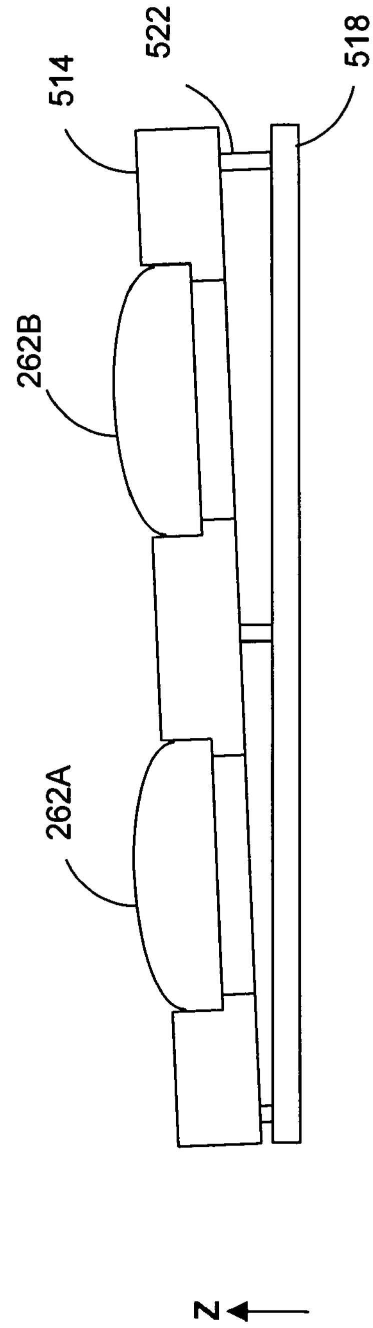
Figure 23C:
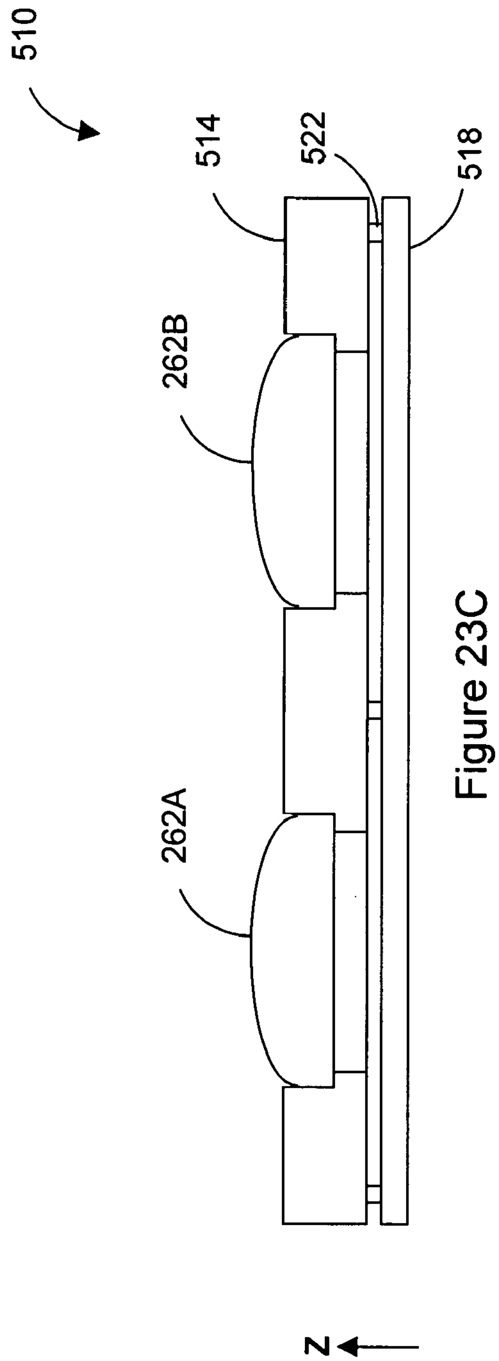
Figure 23D:
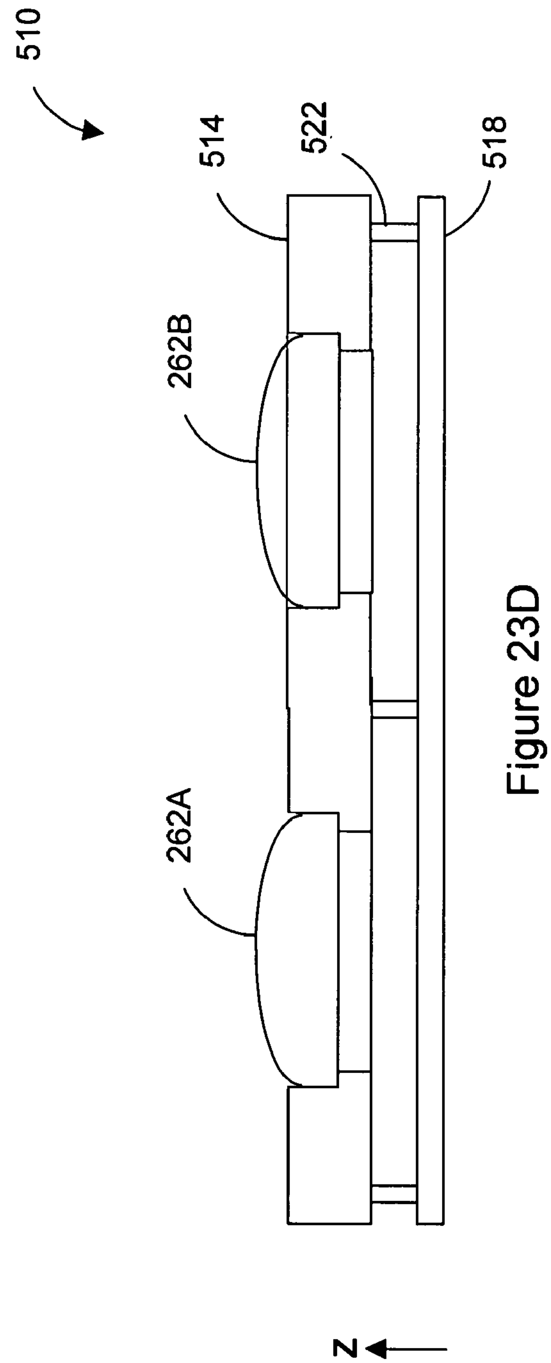
Figure 24A:
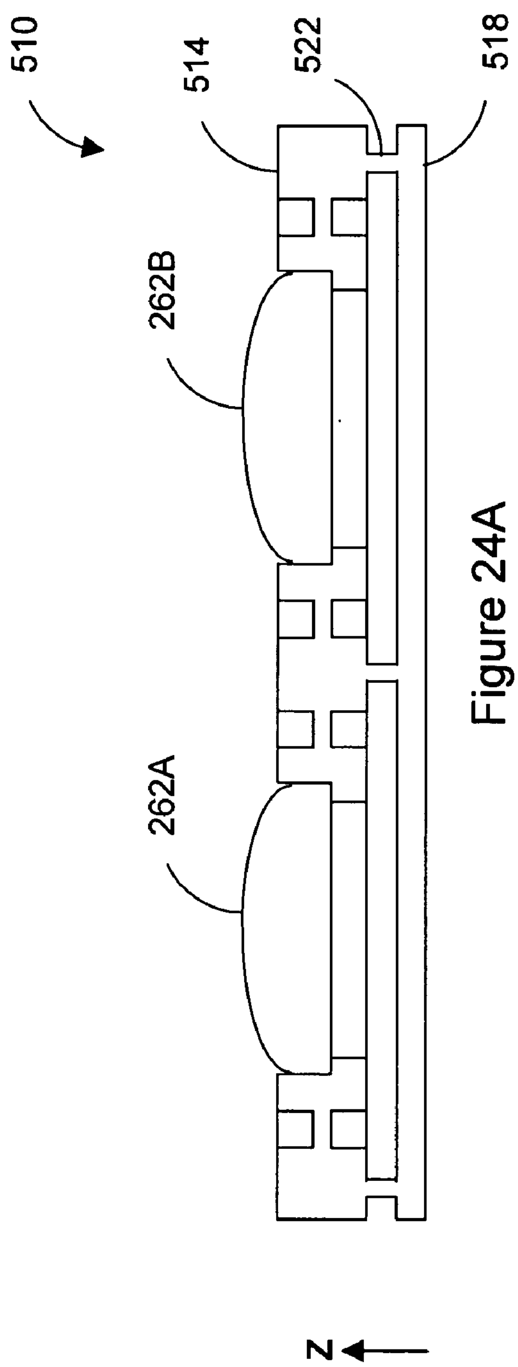
FIG. 24A-24D are enlarged schematic representations of another embodiment of optics portions and a positioner that may be employed in the digital camera apparatus of FIG. 4, with the positioner in various states to provide various positioning of the optics portions, in accordance with another aspect of the present invention.
Figure 24B:
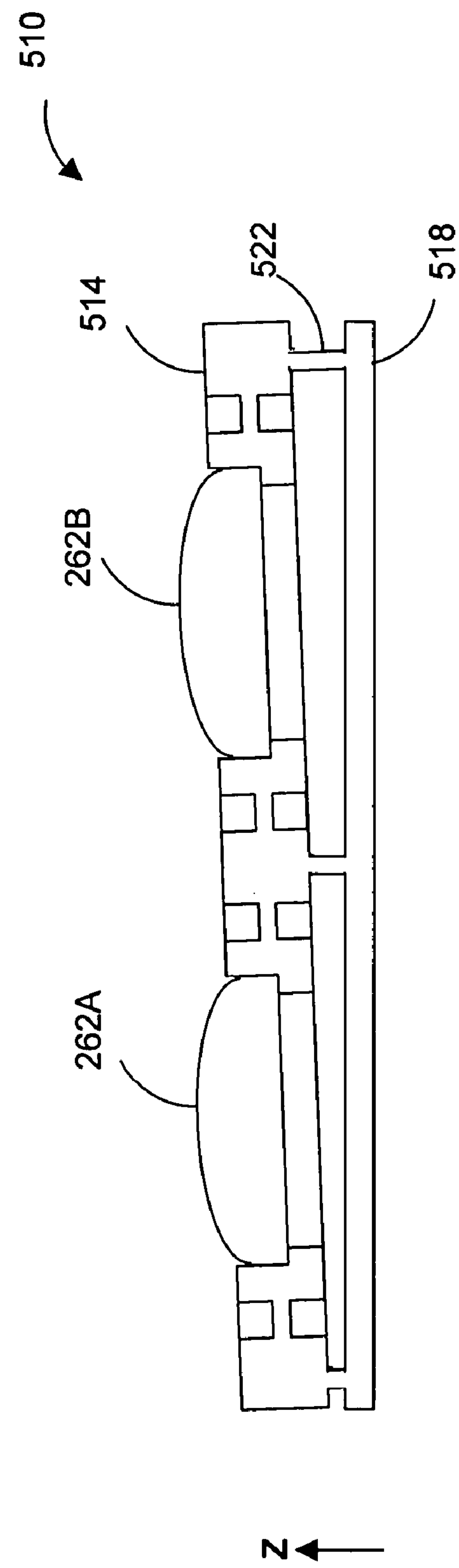
Figure 24C:
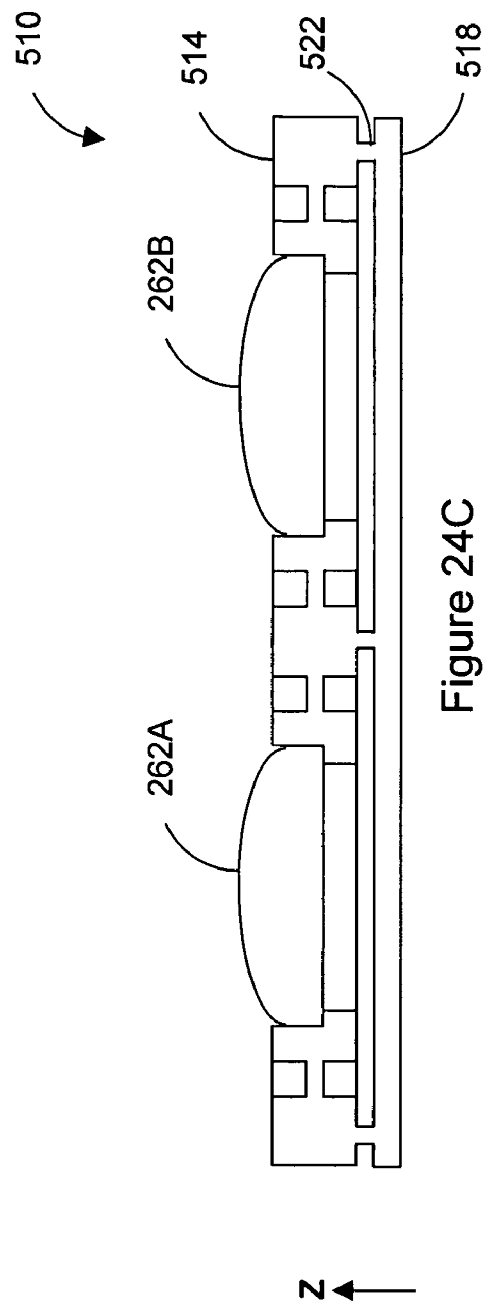
Figure 24D:
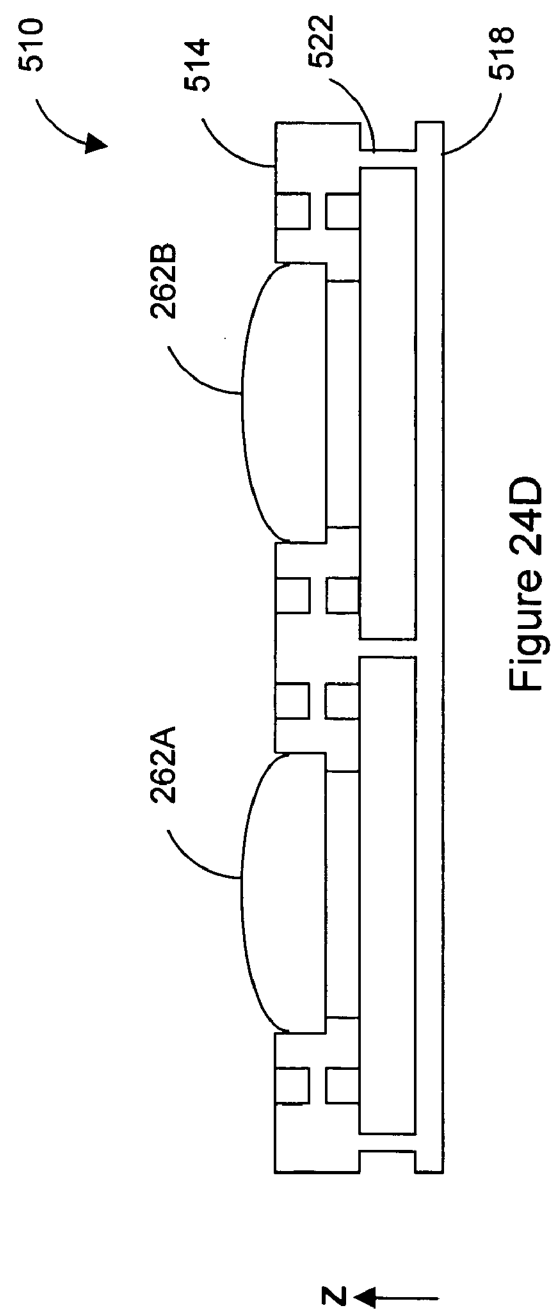
Figure 25A:
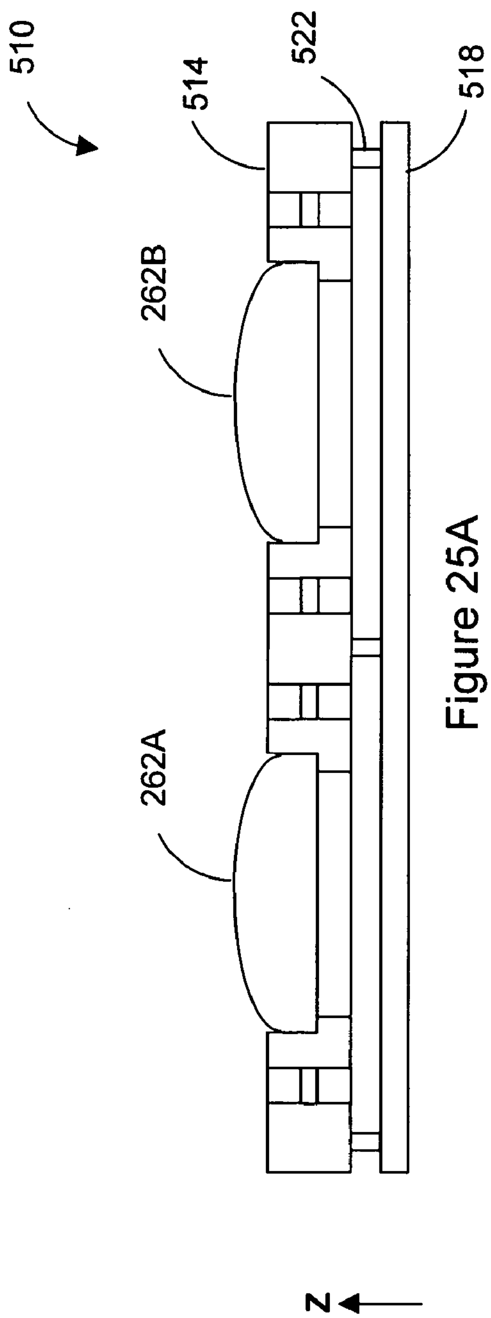
FIG. 25A-25D are enlarged schematic representations of another embodiment of optics portions and a positioner that may be employed in the digital camera apparatus of FIG. 4, with the positioner in various states to provide various positioning of the optics portions, in accordance with another aspect of the present invention.
Figure 25B:
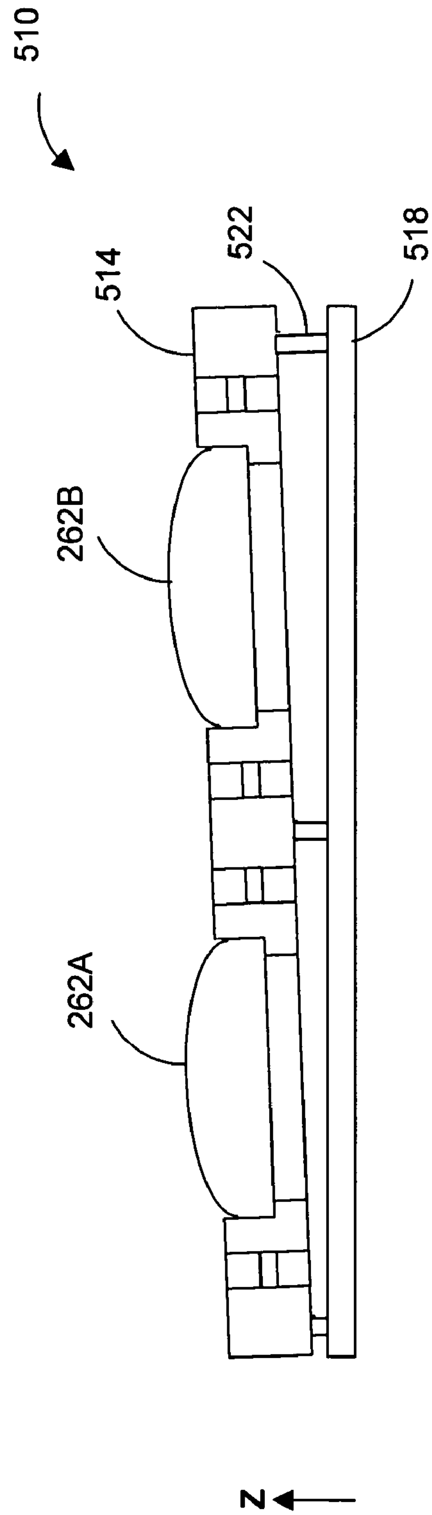
Figure 25C:
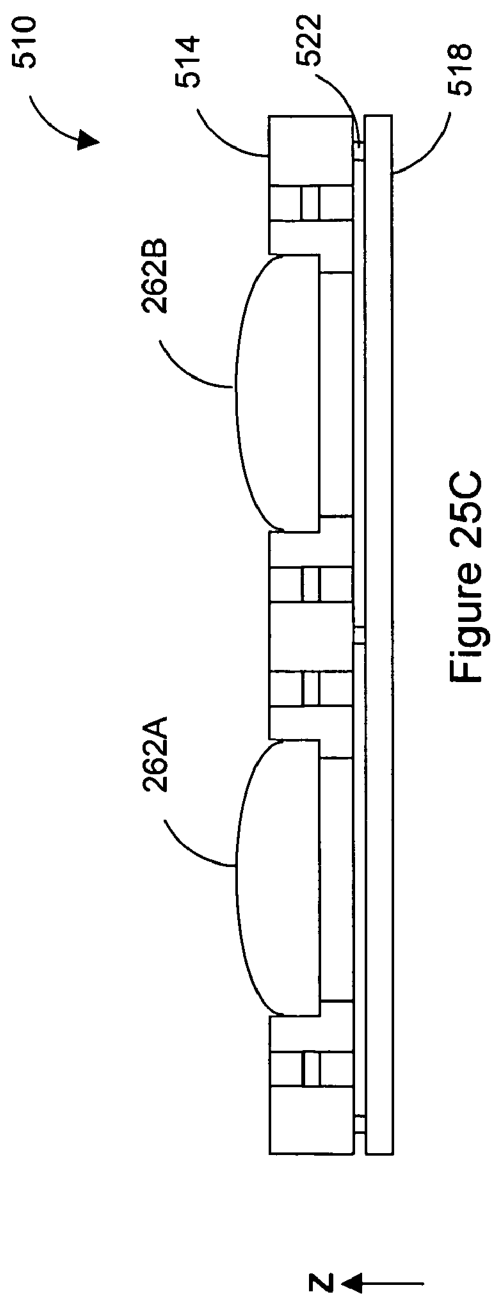
Figure 25D:
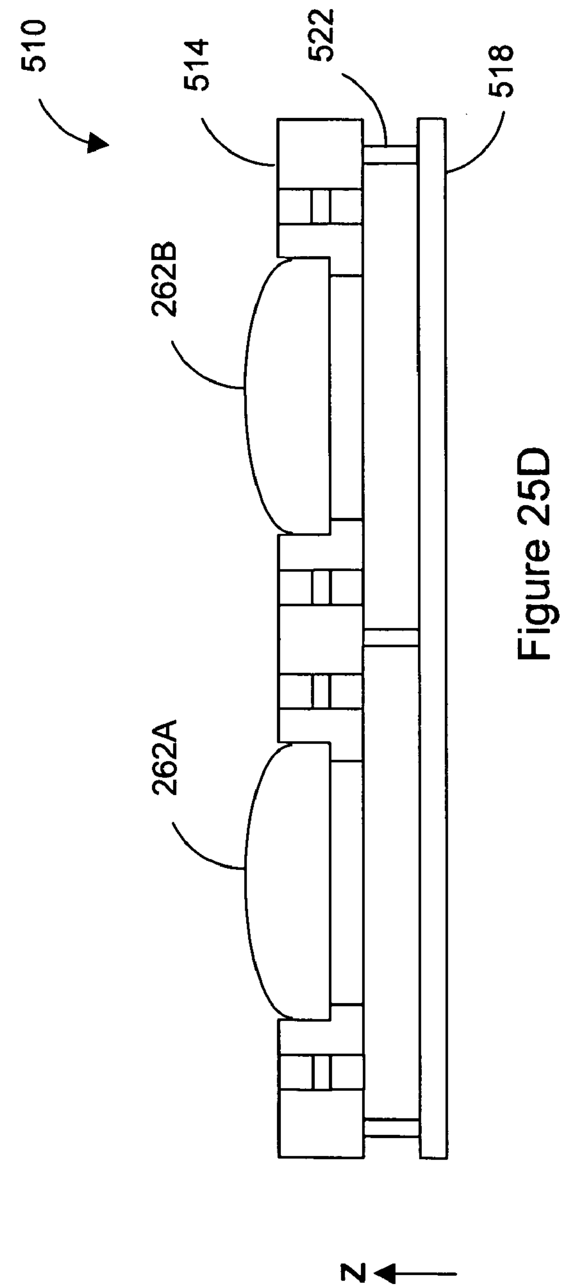
Figure 26A:
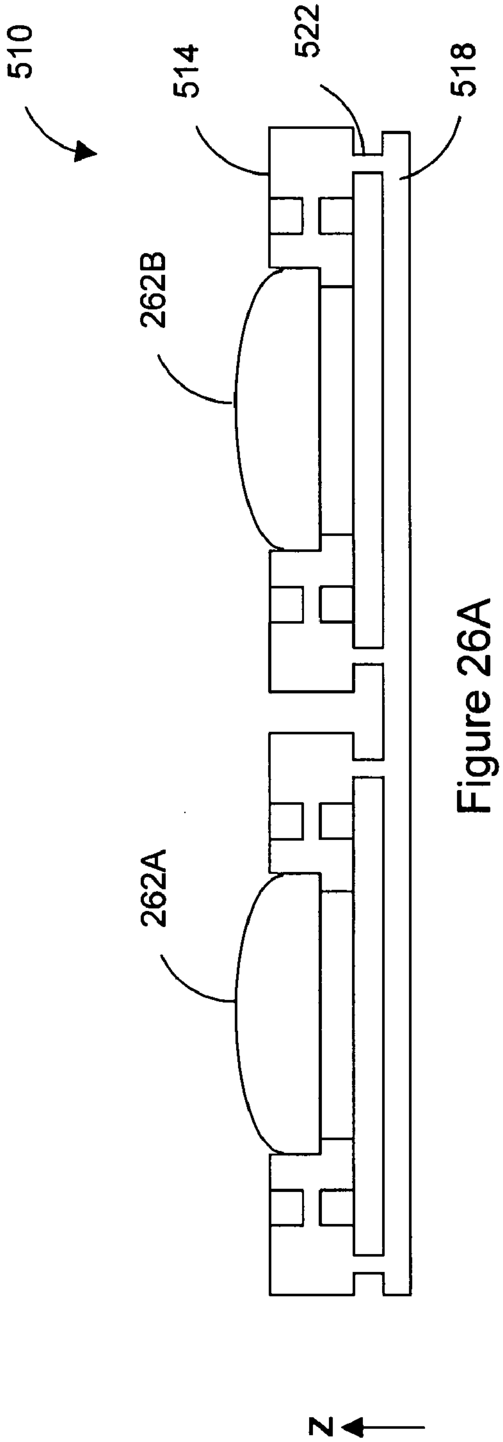
FIG. 26A-26D are enlarged schematic representations of another embodiment of optics portions and a positioner that may be employed in the digital camera apparatus of FIG. 4, with the positioner in various states to provide various positioning of the optics portions, in accordance with another aspect of the present invention.
Figure 26B:
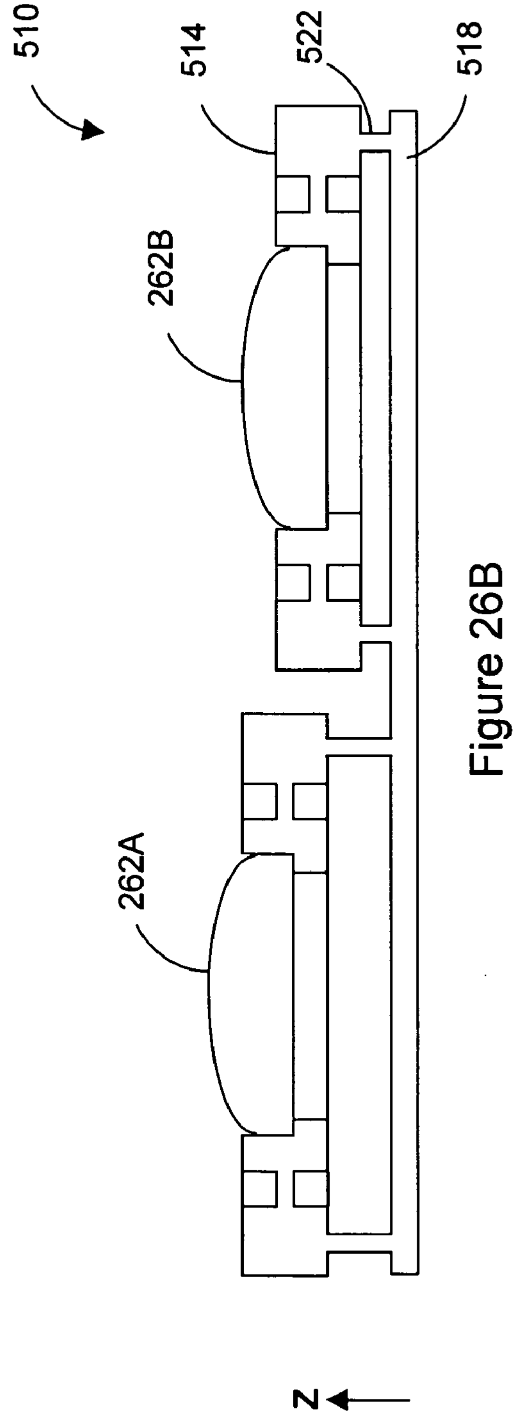
Figure 26C:
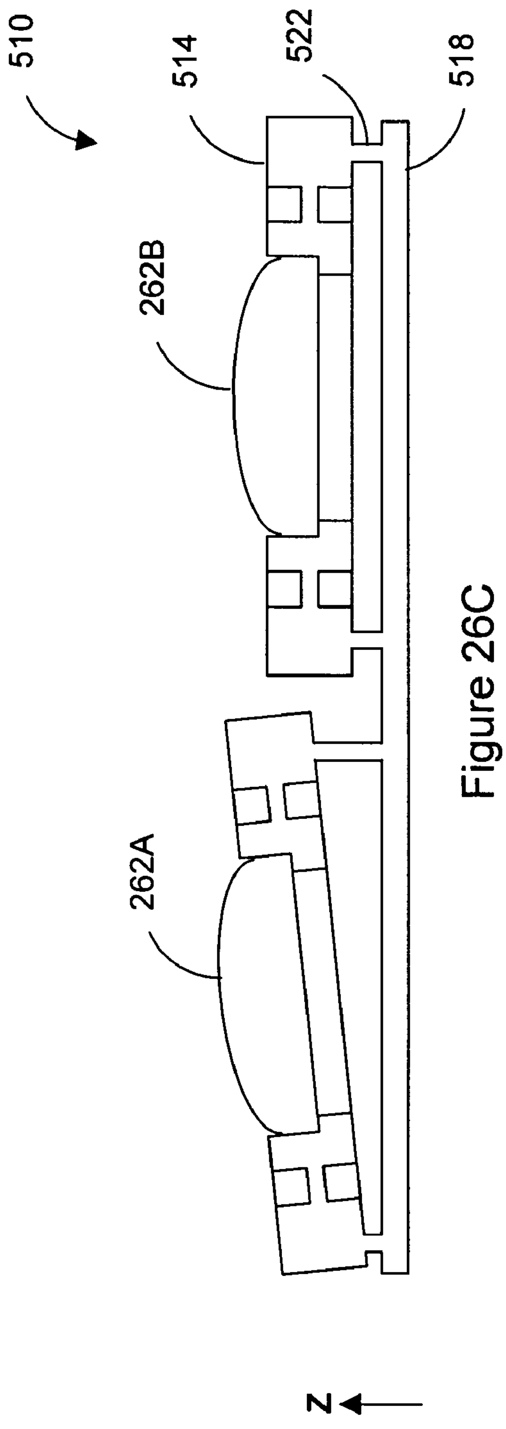
Figure 26D:
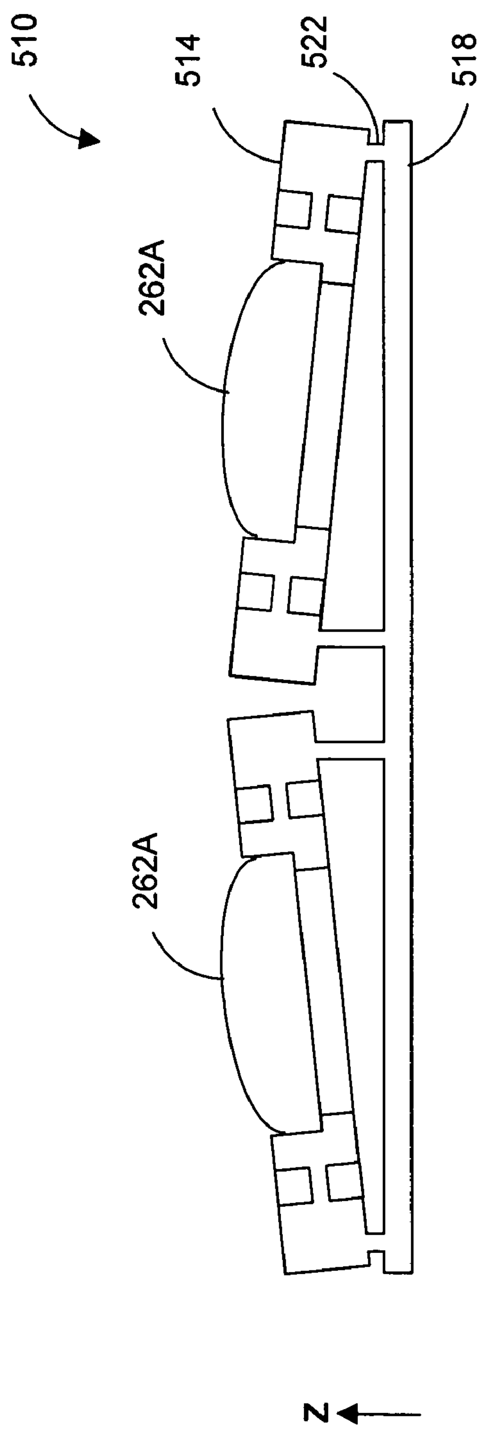
Figure 27A:
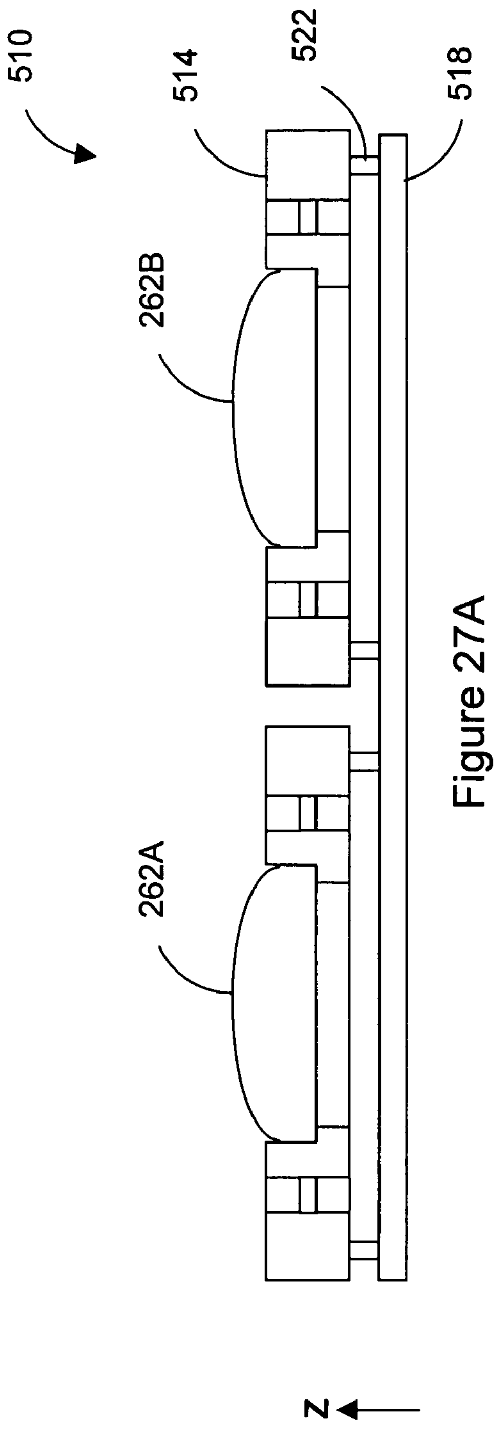
FIG. 27A-27D are enlarged schematic representations of another embodiment of optics portions and a positioner that may be employed in the digital camera apparatus of FIG. 4, with the positioner in various states to provide various positioning of the optics portions, in accordance with another aspect of the present invention.
Figure 27B:
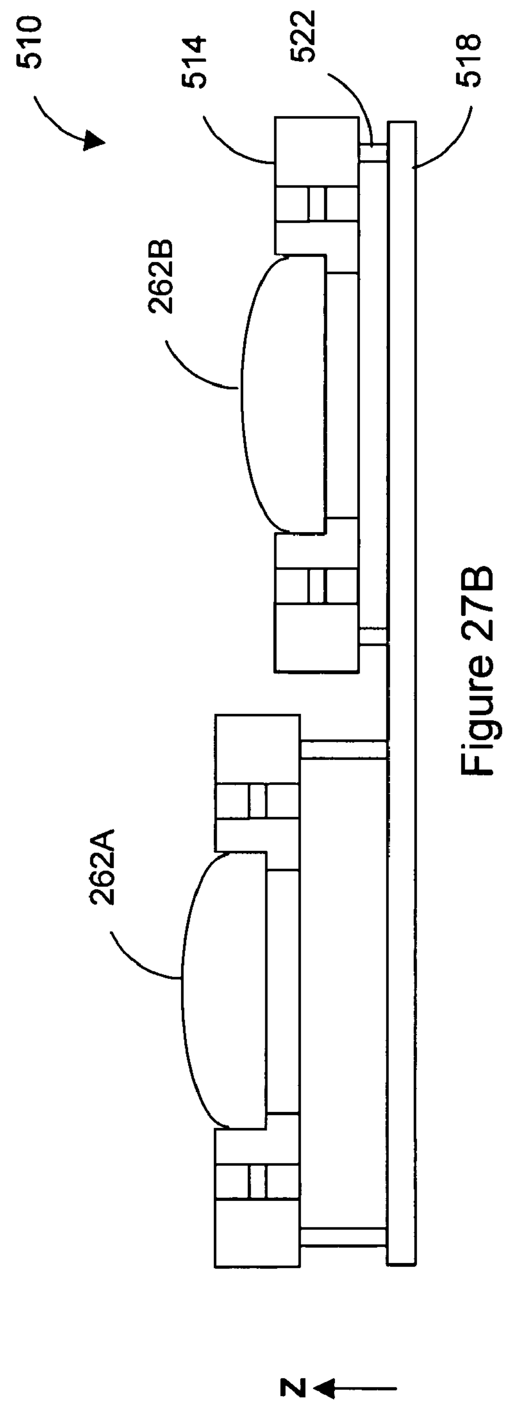
Figure 27C:
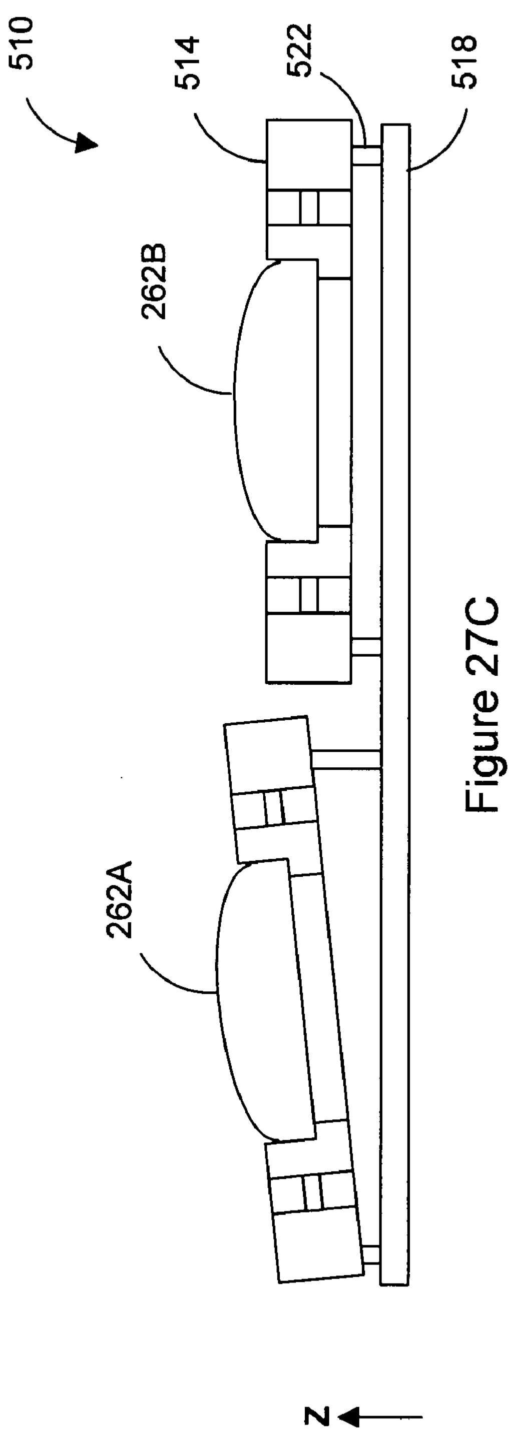
Figure 27D:
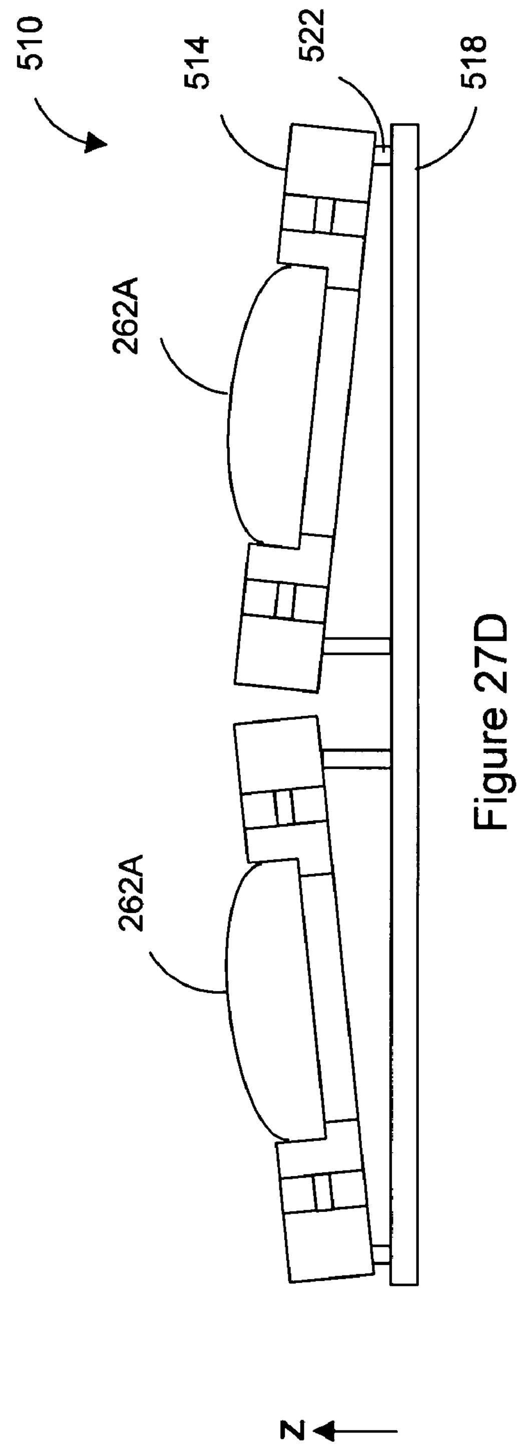

Referring to FIG. 22, in another aspect of the present invention, the optics portion 262A has two or more portions and the positioner 310 comprises two or more positioners, e.g., 310A-310B, adapted to be moved independently of one another, e.g., one for each of the two or more portions of the optics portion. In this aspect, the two or more portions of the optics portion may be moved independently of one another. The positioners 310A, 310B may each be, for example, similar or identical to the positioner of FIGS. 15A-15I and/or, for example, similar or identical to the positioner of FIGS. 17A-17I Referring to FIGS. 23A-23D, in another aspect of the present invention, a positioner 510 includes one or more upper frame portions 514, one or more lower frame portions 518, and one or more actuator portions 522. The lower frame portion may be, for example, affixed to a positioner such as for example, positioner 320 (see for example FIG. 15A), which supports the one or more sensor portions 264A-264D. The upper frame portions support the one or more optics portions e.g., 262A-262D. The actuator portions are adapted to move the one or more upper frame portions in the z direction and/or tilt the upper frame portions. One or more of the actuator portions 522 may comprise for example a diaphragm type of actuator (e.g., an actuator similar to a small woofer type audio speaker), but is not limited to such. Rather the actuator portions 522 may comprise any type or types of actuators and/or actuator technology or technologies and may employ any type of motion including, for example, but not limited to, linear and/or rotary, analog and/or discrete, and any type of actuator technology, including, for example, but not limited to, microelectromechanical systems (MEMS) actuators, electro-static actuators, diaphragm actuators, magnetic actuators, bi-metal actuators, thermal actuators, ferroelectric actuators, piezo-electric actuators, motors (e.g., linear or rotary), solenoids (e.g., micro-solenoids) and/or combinations thereof.

Referring to FIGS. 24A-24D, in another aspect of the present invention, the upper frame portion of the positioner 510 of FIGS. 23A-23D is similar or identical to the positioner 310 of FIGS. 15A-15I so that the positioner is also able to move the one or more optics portions in the x direction and/or the y direction.

Referring to FIGS. 25A-25D, in another aspect of the present invention, the upper frame portion of the positioner 510 of FIGS. 23A-23D is similar or identical to the positioner 310 of FIGS. 17A-17I so that the positioner is also able to move the one or more optics portions in the x direction and/or the y direction.

Referring to FIGS. 26A-26D, in another aspect of the present invention, the upper frame portion of the positioner 510 of FIGS. 24A-24D is similar or identical to the upper frame portion of the positioner 510 of FIGS. 21A-21B such that the one or more inner frame portions and/or the one or more optics portions 262A-262D are isolated from one another, which may further enhance the ability to move two or more optics portions independently of one another.

Referring to FIGS. 27A-27D, in another aspect of the present invention, the upper frame portion of the positioner 510 of FIGS. 25A-25D is similar or identical to the upper frame portion of the positioner 510 of FIG. 21C-21D such that the one or more inner frame portions and/or the one or more optics portions 262A-262D are isolated from one another, which may further enhance the ability to move two or more optics portions independently of one another.

Figure 28A:
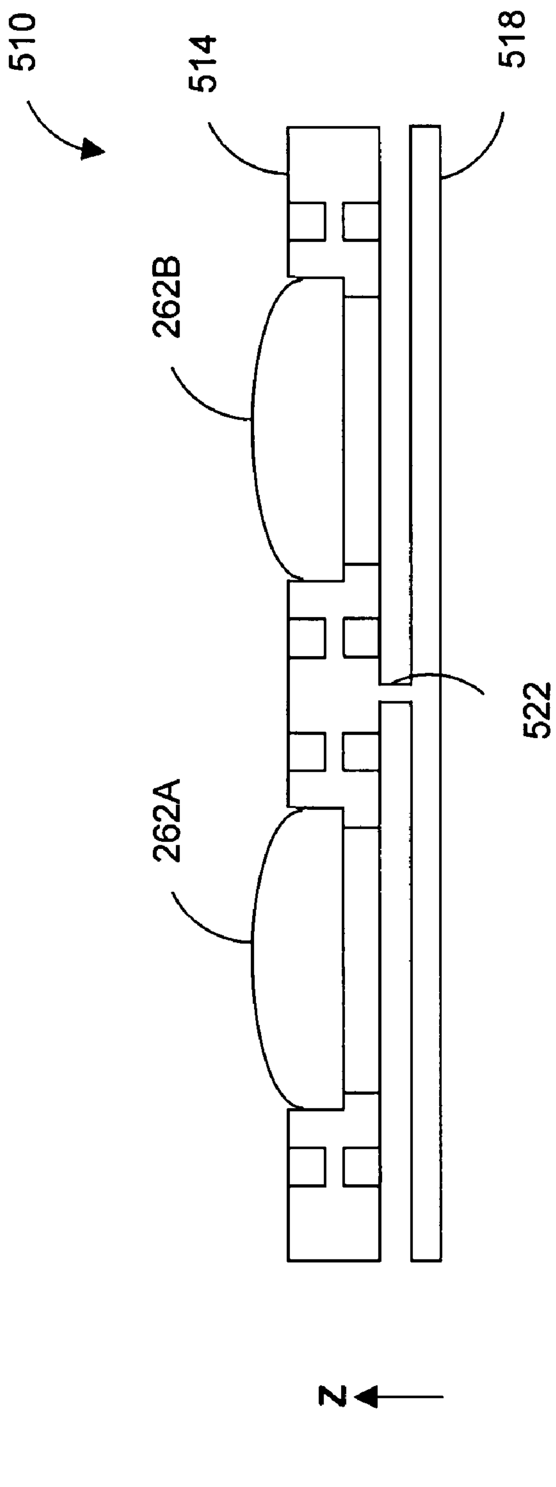
FIG. 28A is an enlarged schematic representation of another embodiment of optics portions and a positioner that may be employed in the digital camera apparatus of FIG. 4, with the positioner shown in a first state to provide a first positioning of the optics portions, in accordance with another aspect of the present invention.
Figure 28B:
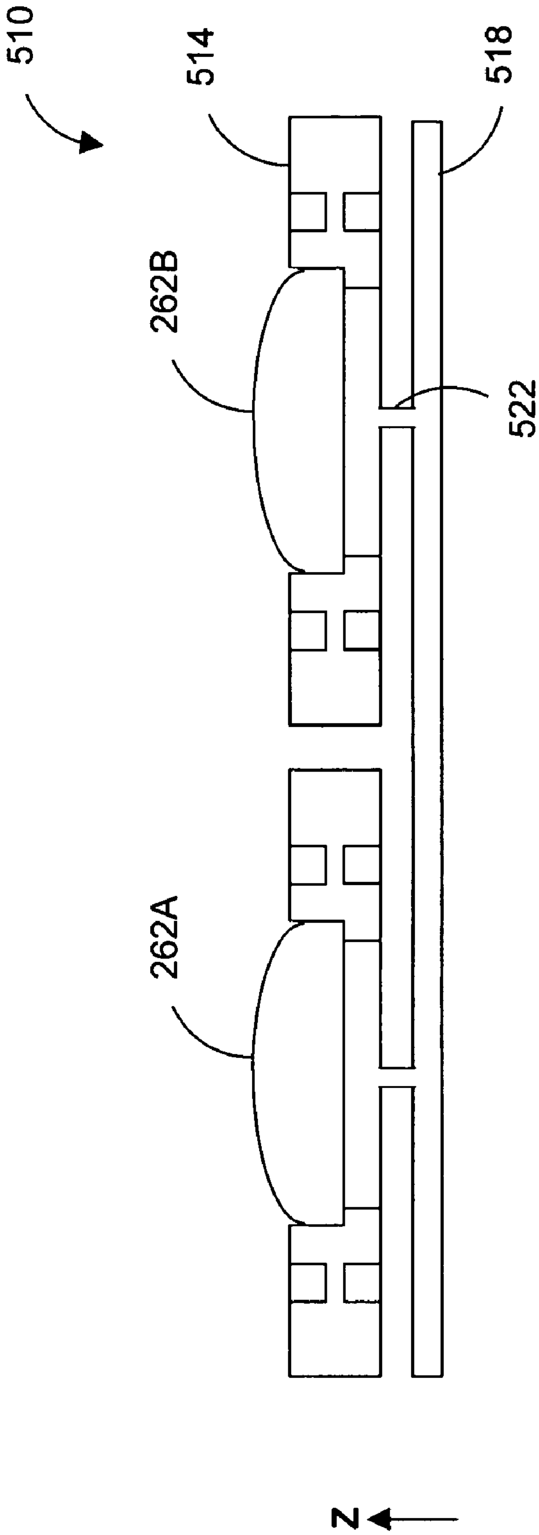
FIG. 28B is an enlarged schematic representation of another embodiment of optics portions and a positioner that may be employed in the digital camera apparatus of FIG. 4, with the positioner shown in a first state to provide a first positioning of the optics portions, in accordance with another aspect of the present invention.

Referring to FIG. 28A, in another aspect of the present invention, the one or more actuators of the positioner 510 of FIGS. 24A-24D comprises a single actuator 522 disposed between the one or more upper frame portions 514 and the one or more lower frame portions 518, thereby enhancing the ability to rotate the one or more upper frame portions 514.

Figure 28C:
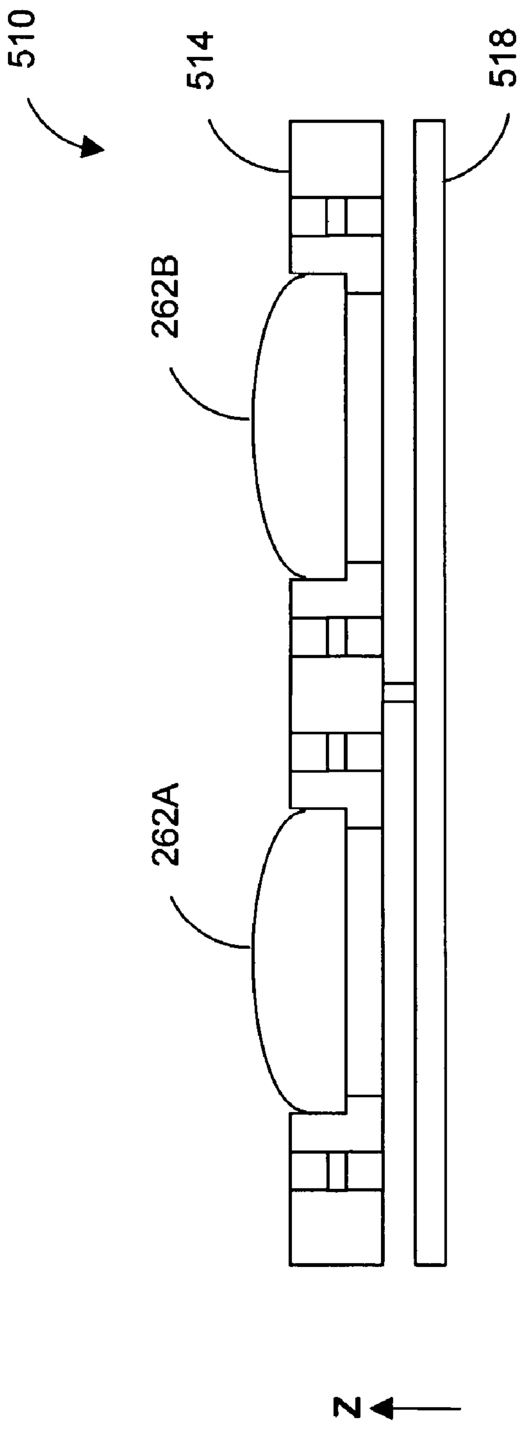
FIG. 28C is an enlarged schematic representation of another embodiment of optics portions and a positioner that may be employed in the digital camera apparatus of FIG. 4, with the positioner shown in a first state to provide a first positioning of the optics portions, in accordance with another aspect of the present invention.
Figure 28D:
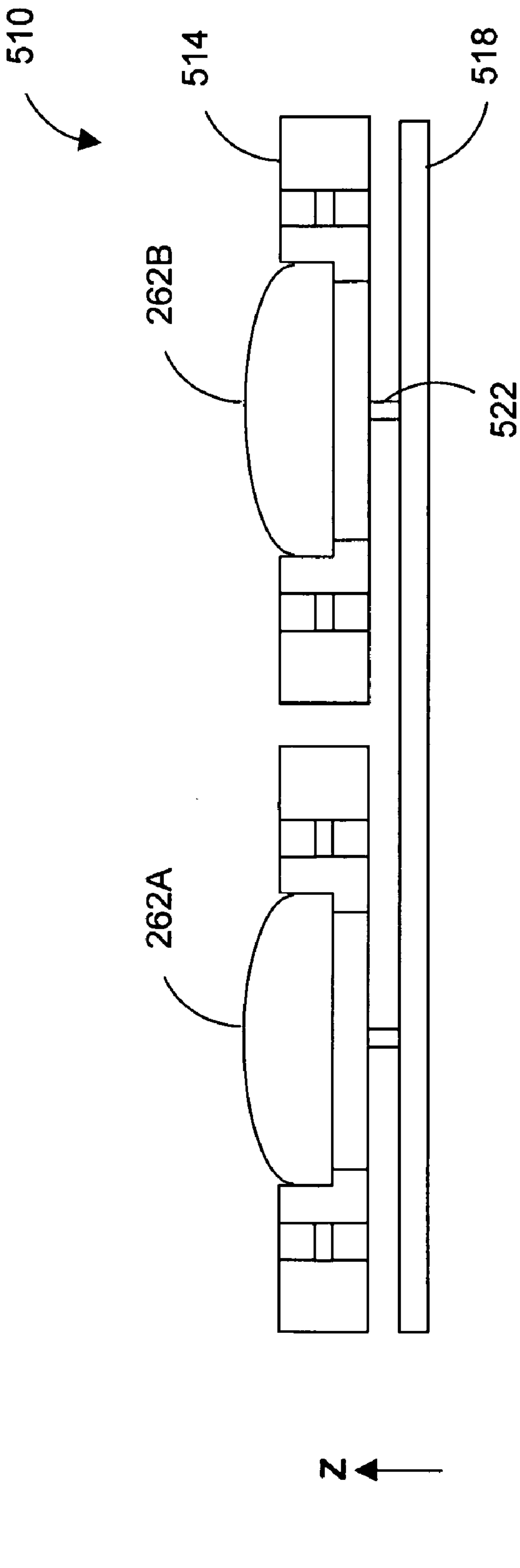
FIG. 28D is an enlarged schematic representation of another embodiment of optics portions and a positioner that may be employed in the digital camera apparatus of FIG. 4, with the positioner shown in a first state to provide a first positioning of the optics portions, in accordance with another aspect of the present invention.

Referring to FIG. 28D, in another aspect of the present invention, the positioner 510 of FIGS. 24A-24D comprises a single actuator 522 between each of the one or more upper frame portions 514 and the one or more lower frame portions 518, thereby enhancing the ability to independently rotate each of the one or more upper frame portions 514.

Referring to FIG. 28C, in another aspect of the present invention, the one or more actuators of the positioner 510 of FIGS. 25A-25D comprises a single actuator 522 disposed between the one or more upper frame portions 514 and the one or more lower frame portions 518, thereby enhancing the ability to rotate the one or more upper frame portions 514.

Referring to FIG. 28D, in another aspect of the present invention, the positioner 510 of FIGS. 25A-25D comprises a single actuator 522 between each of the one or more upper frame portions 514 and the one or more lower frame portions 518, thereby enhancing the ability to independently rotate each of the one or more upper frame portions 514.

Figure 29:
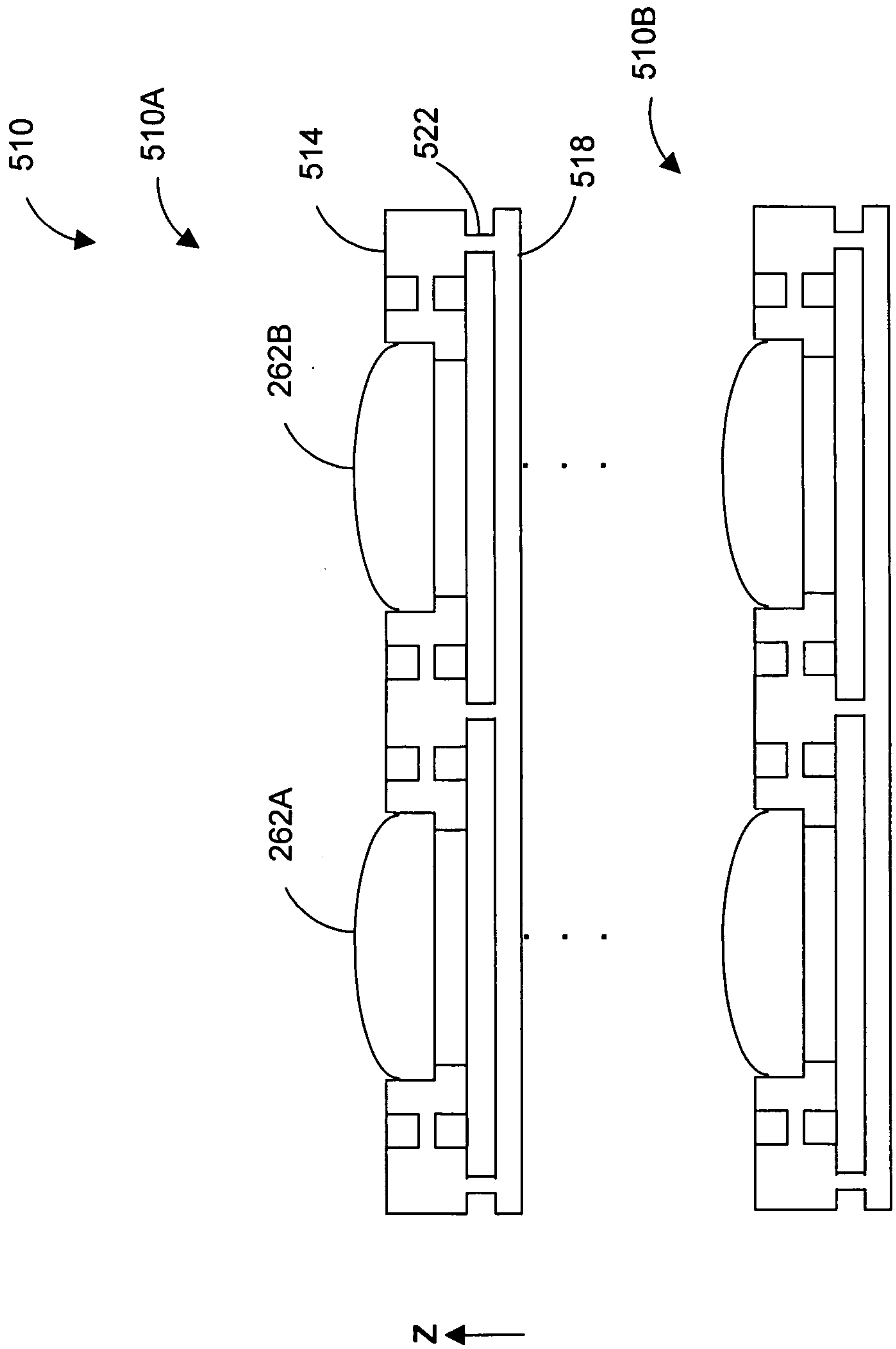
FIG. 29 is an enlarged schematic representation of another embodiment of optics portions and a positioner that may be employed in the digital camera apparatus of FIG. 4, with the positioner shown in a first state to provide a first positioning of the optics portions, in accordance with another aspect of the present invention.

Referring to FIG. 29, in another aspect of the present invention, the optics portion 262A has two or more portions and the positioner 510 comprises two or more positioners, e.g., 510A-510B, adapted to be moved independently of one another, e.g., one for each of the two or more portions of the optics portion. In this aspect, the two or more portions of the optics portion may be moved independently of one another. The positioners 510A, 510B may each be, for example, similar or identical to the positioner of FIGS. 24A-24D.

Figure 30:
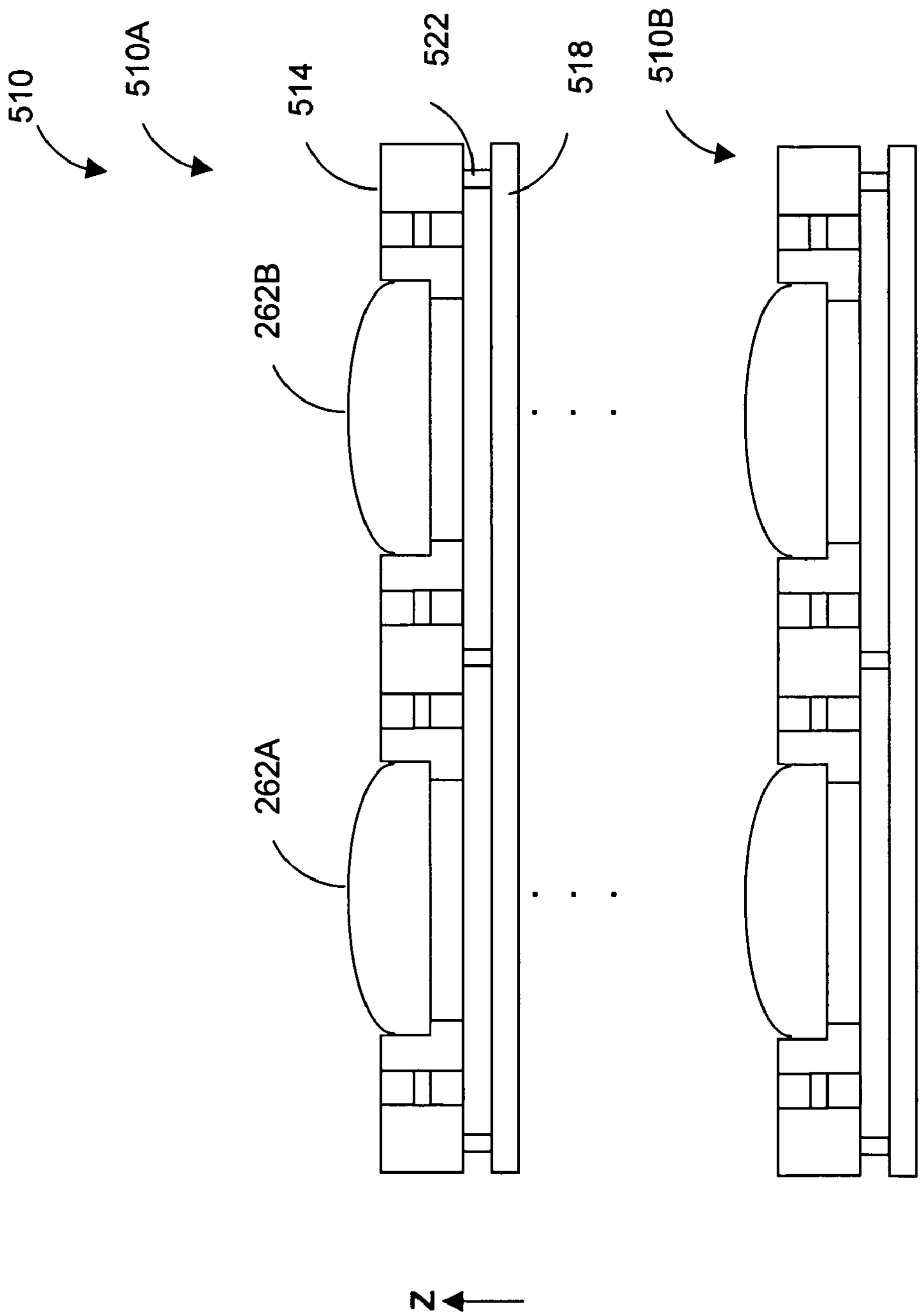
FIG. 30 is an enlarged schematic representation of another embodiment of optics portions and a positioner that may be employed in the digital camera apparatus of FIG. 4, with the positioner shown in a first state to provide a first positioning of the optics portions, in accordance with another aspect of the present invention.

Referring to FIG. 30, in another aspect of the present invention, the optics portion 262A has two or more portions and the positioner 510 comprises two or more positioners, e.g., 510A-510B, adapted to be moved independently of one another, e.g., one for each of the two or more portions of the optics portion. In this aspect, the two or more portions of the optics portion may be moved independently of one another. The positioners 510A, 510B may each be, for example, similar or identical to the positioner of FIGS. 25A-25D.

Referring to FIGS. 31A-31D, in another aspect, the positioner 310 of any of FIGS. 15A-15L, 16A-16E, 17A-17I, 18A-18E, 19A-19J, 20A-20D, 21A-21D, 22 and/or the positioner 510 of any of FIGS. 23A-23D, 24A-24D, 25A-25D, 26A-26D, 27A-27D, 28A-28D, 29, 30 has a first frame and/or and actuator configuration for one or more of the optics portions and a different frame and/or actuator configuration for one or more of the other optics portions.

Referring to FIGS. 31E-31H, in another aspect, the positioner 310 of any of FIGS. 15A-15L, 16A-16E, 17A-17I, 18A-18E, 19A-19J, 20A-20D, 21A-21D, 22 and/or the positioner 510 of any of FIGS. 23A-23D, 24A-24D, 25A-25D, 26A-26D, 27A-27D, 28A-28D, 29, 30 defines a first seat at a first height or first depth (e.g., positioning in z direction) for one or more of the optics portions and further defines a second seat at a second height or second depth that is different than the first height or first depth for one or more of the other optics portions. As stated above, the depth may be different for each lens and is based, at least in part, on the focal length of the lens. Thus, if a camera channel is dedicated to a specific color (or band of colors), the lens or lenses for that camera channel may have focal length that is adapted to the color (or band of colors) to which the camera channel is dedicated and different than the focal length of one or more of the other optics portions for the other camera channels.

Figure 31A:
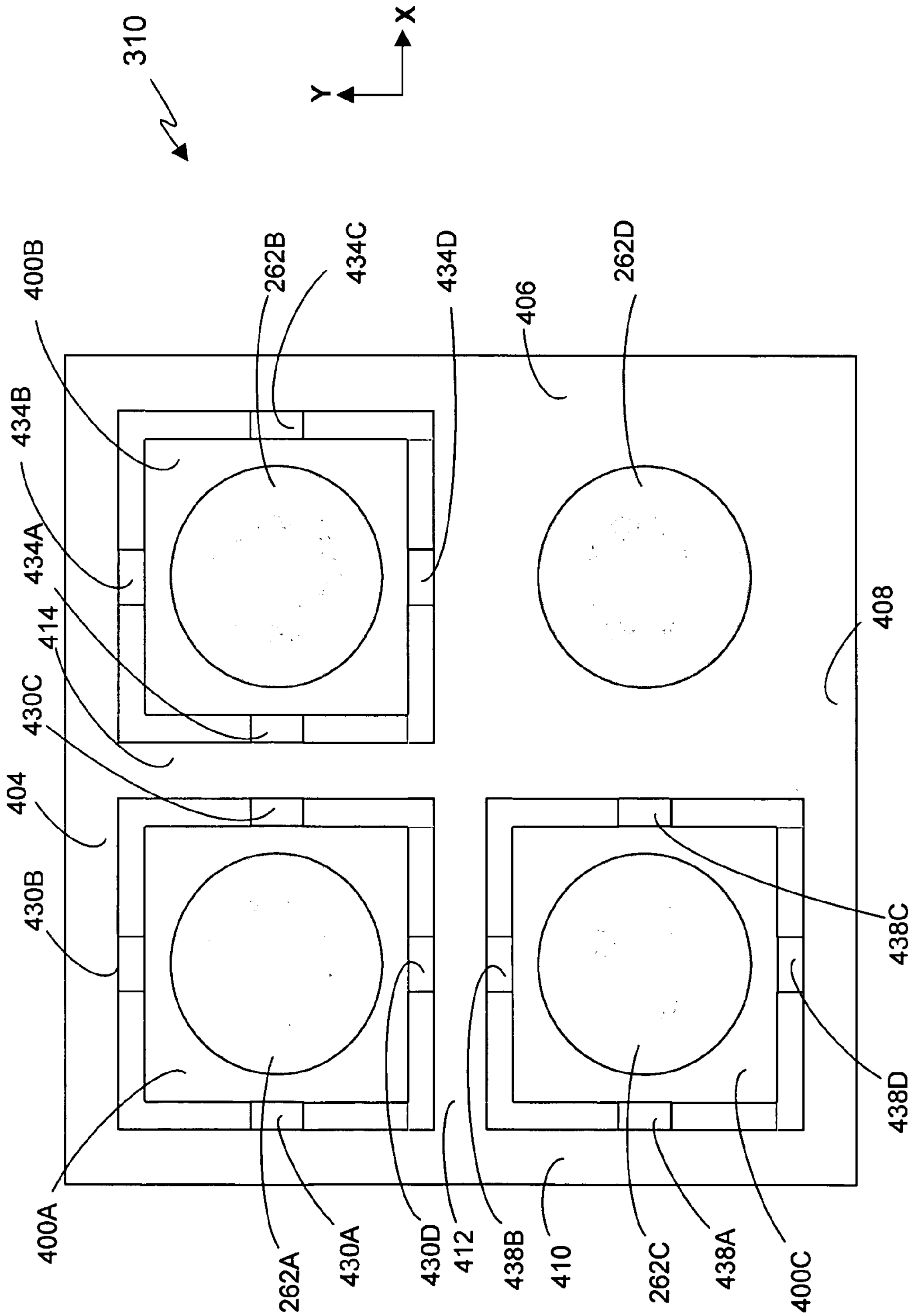
FIGS. 31A-31B are an enlarged schematic plan view and an enlarged schematic representation, respectively, of optics portions and a positioner that may be employed in the digital camera apparatus of FIG. 4, with the positioner shown in a first state to provide a first positioning of the optics portions, in accordance with another aspect of the present invention.
Figure 31B:
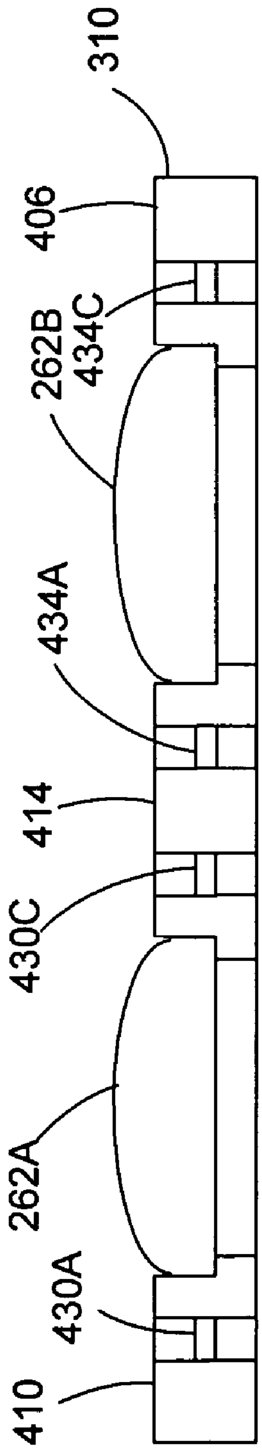
Figure 31C:
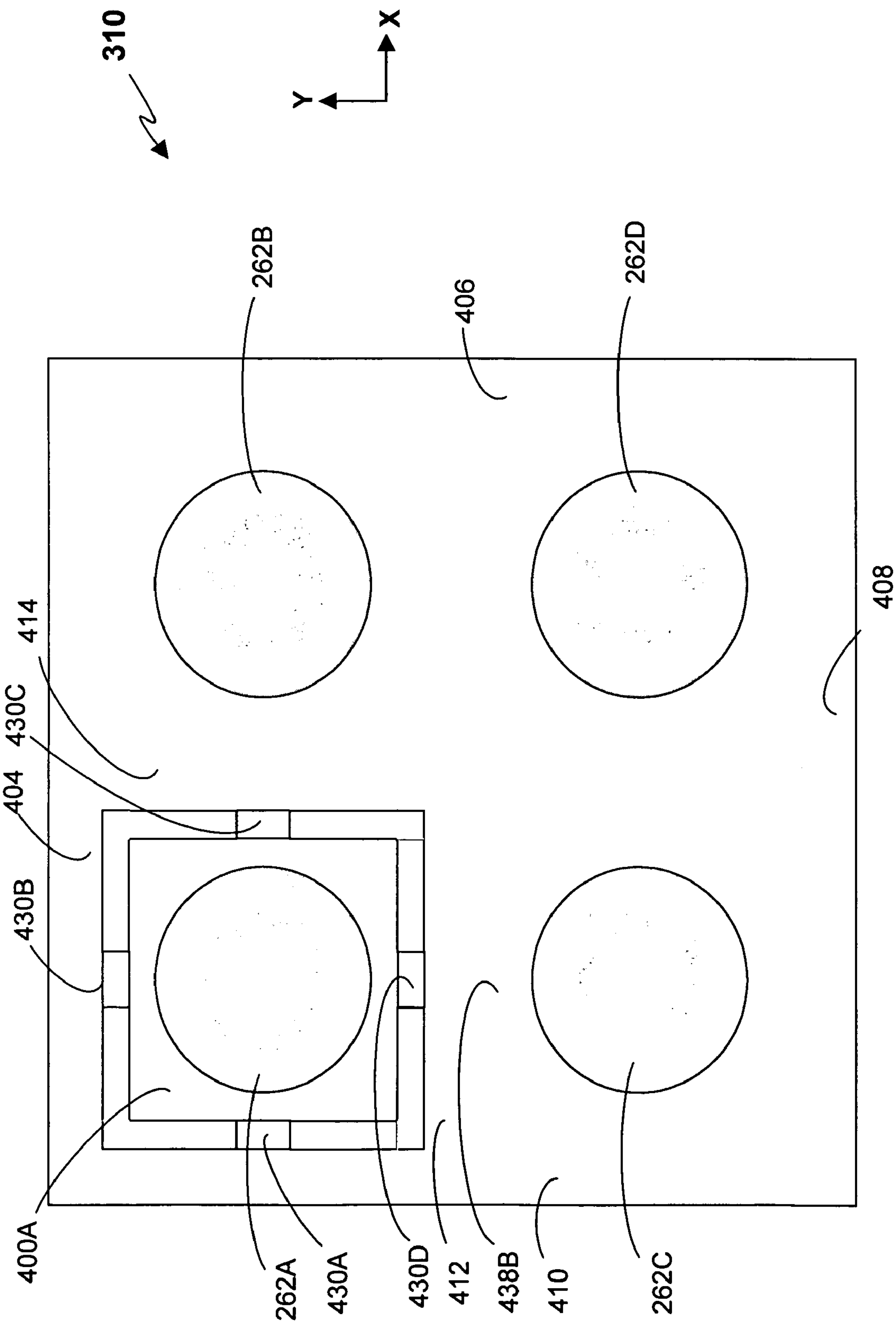
FIGS. 31C-31D are an enlarged schematic plan view and an enlarged schematic representation, respectively, of optics portions and a positioner that may be employed in the digital camera apparatus of FIG. 4, with the positioner shown in a first state to provide a first positioning of the optics portions, in accordance with another aspect of the present invention.
Figure 31D:
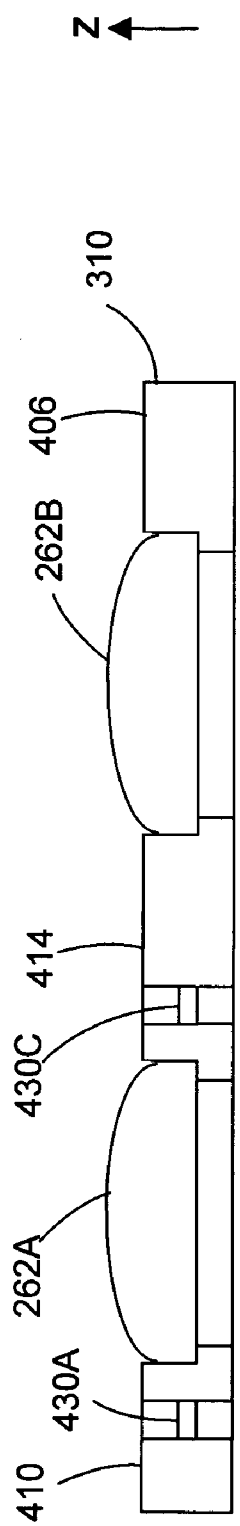
Figure 31E:
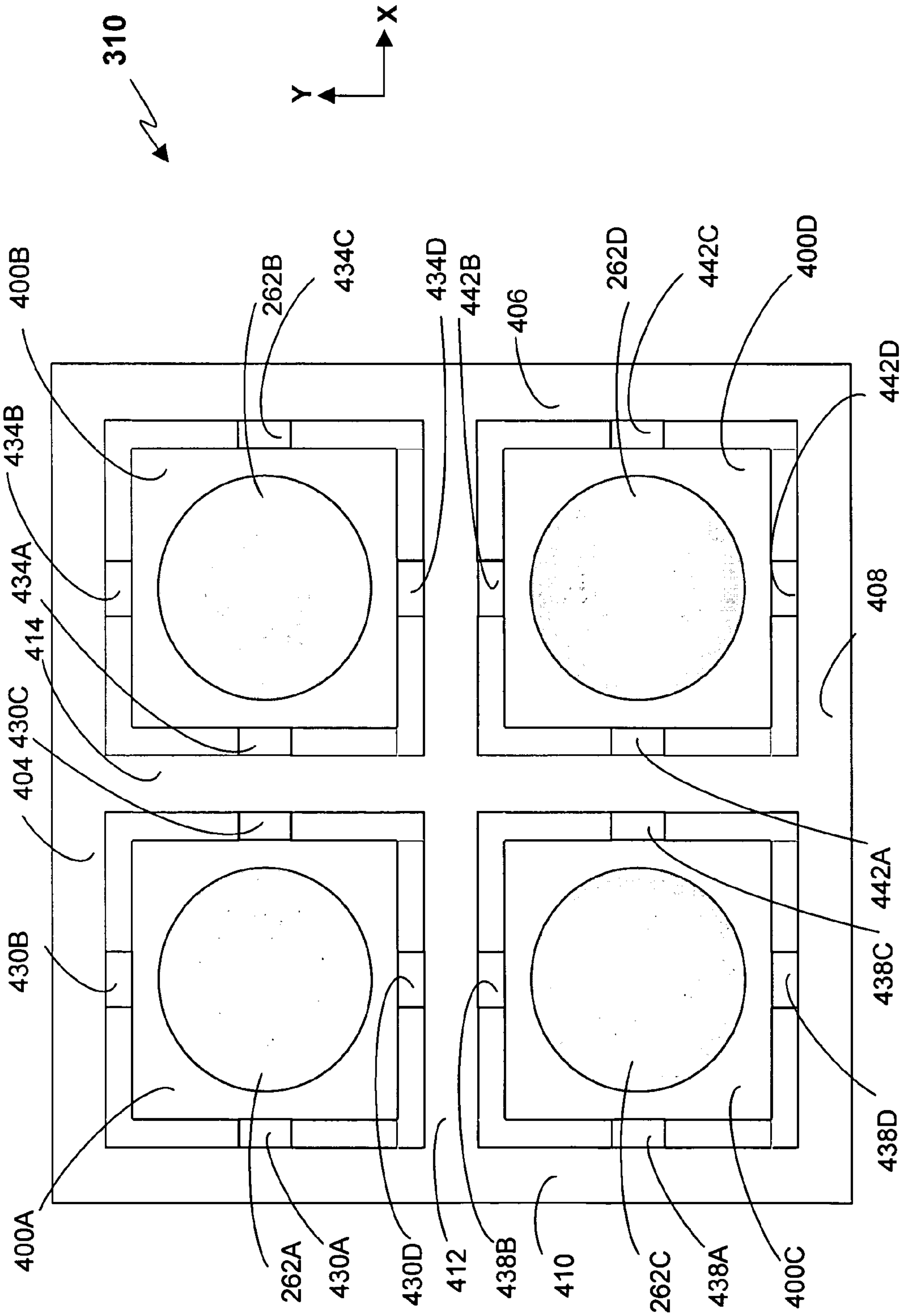
FIGS. 31E-31F are an enlarged schematic plan view and an enlarged schematic representation, respectively, of optics portions and a positioner that may be employed in the digital camera apparatus of FIG. 4, with the positioner shown in a first state to provide a first positioning of the optics portions, in accordance with another aspect of the present invention.
Figure 31F:
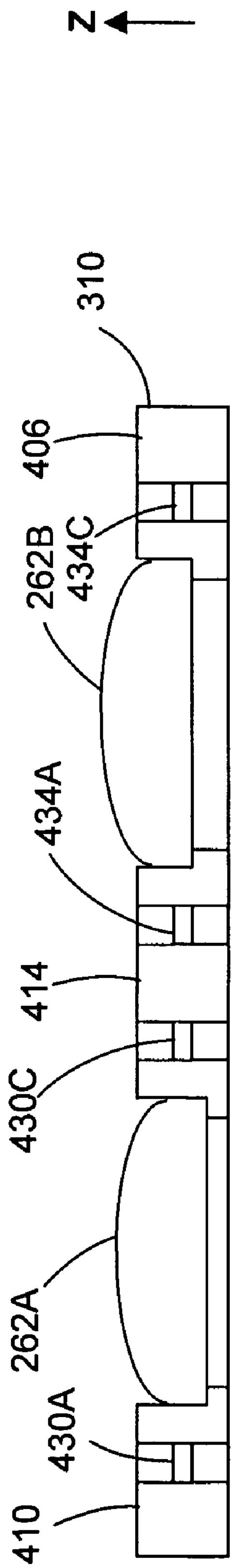
Figure 31G:
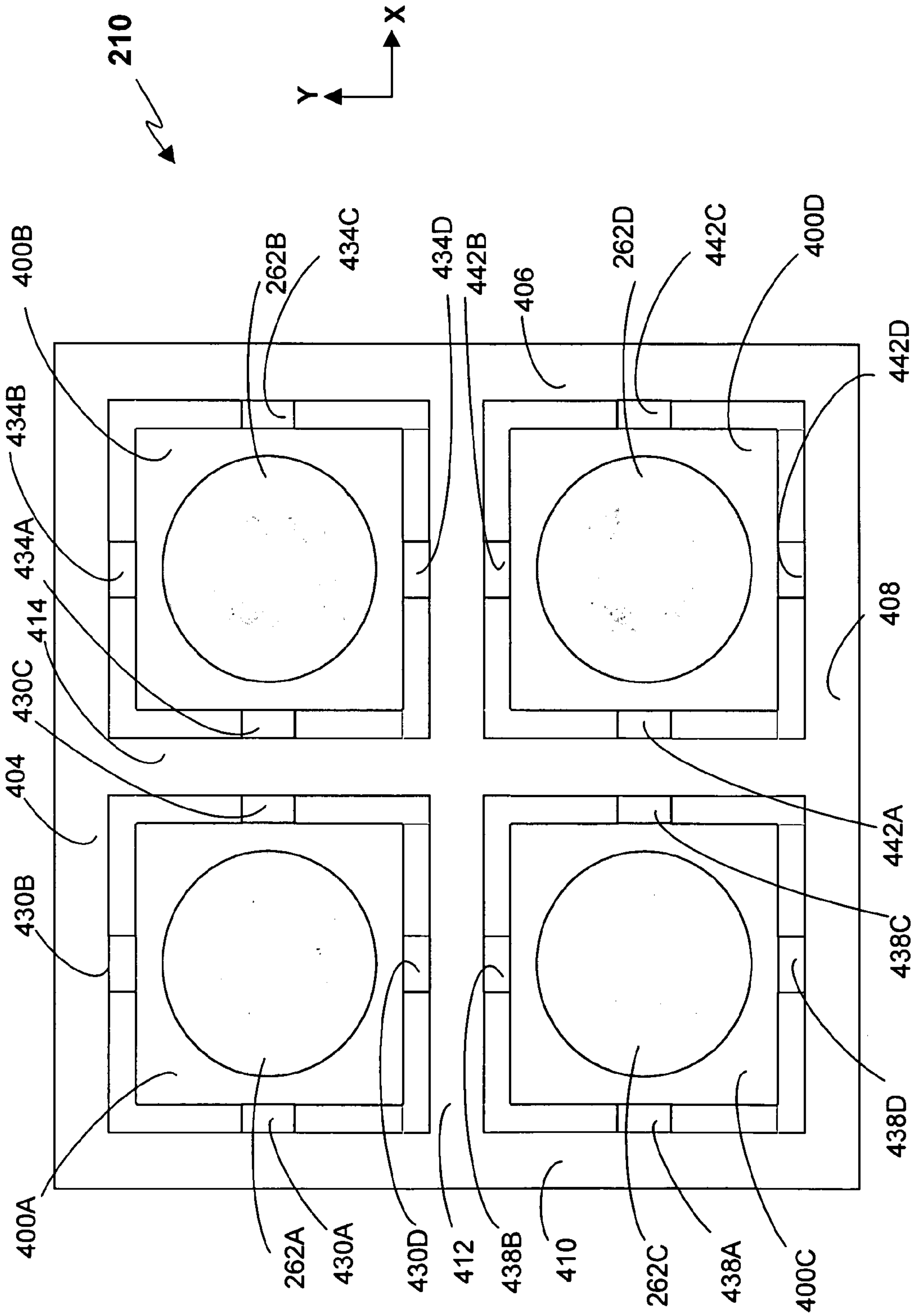
FIGS. 31G-31H are an enlarged schematic plan view and an enlarged schematic representation, respectively, of optics portions and a positioner that may be employed in the digital camera apparatus of FIG. 4, with the positioner shown in a first state to provide a first positioning of the optics portions, in accordance with another aspect of the present invention.
Figure 31H:
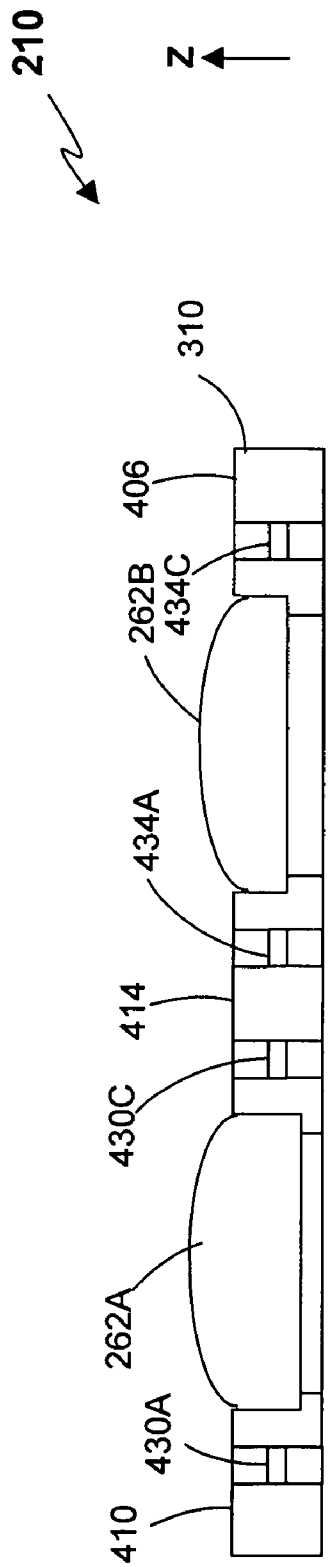
Figure 31I:
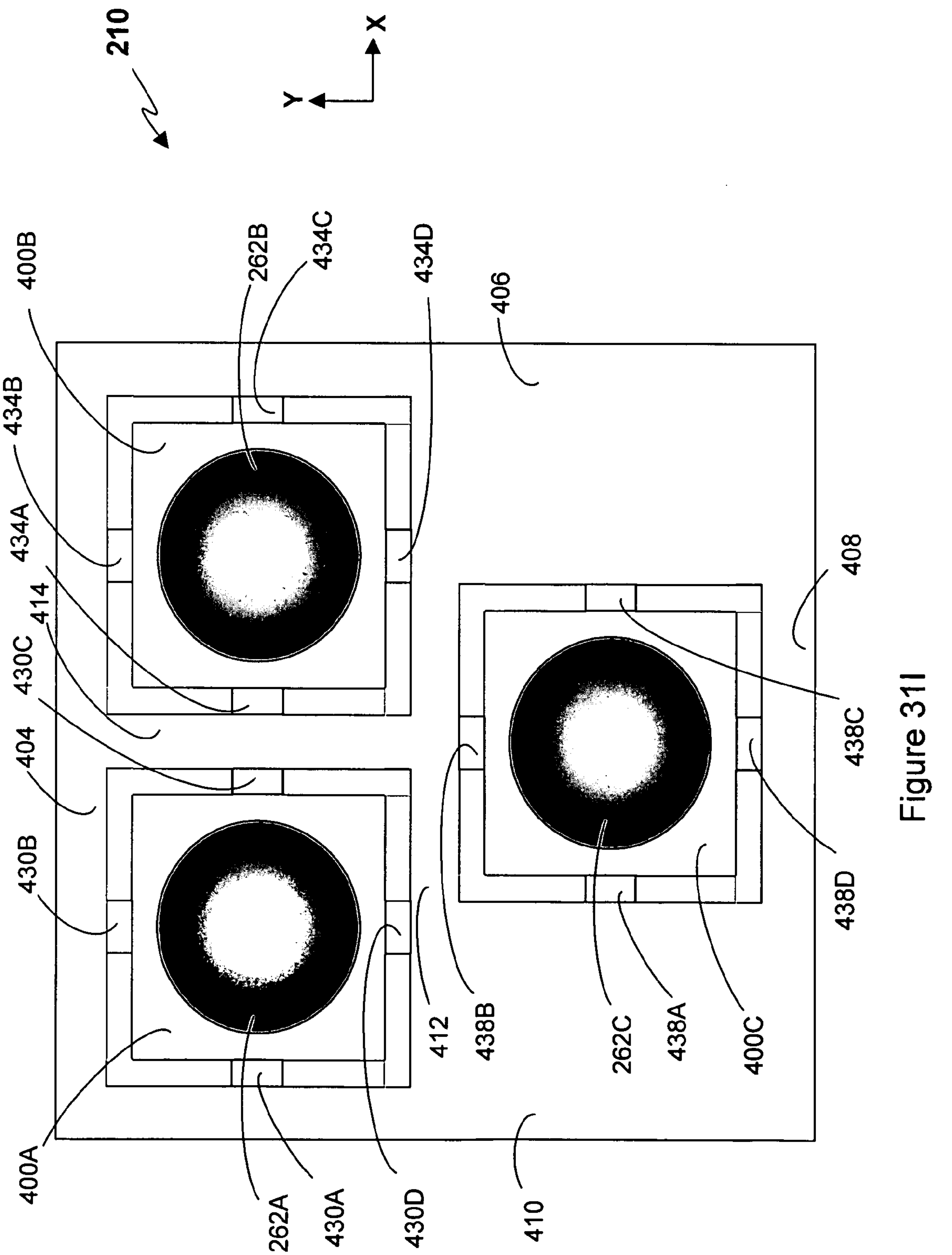
FIGS. 31I-31J are an enlarged schematic plan view and an enlarged schematic representation, respectively, of optics portions and a positioner that may be employed in the digital camera apparatus of FIG. 4, with the positioner shown in a first state to provide a first positioning of the optics portions, in accordance with another aspect of the present invention.
Figure 31J:
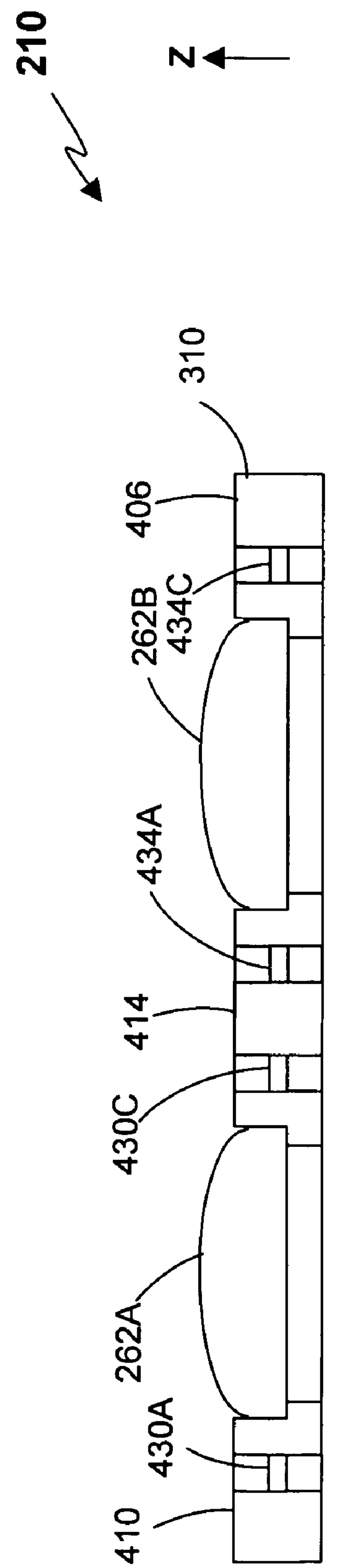

Referring to FIGS. 31I-31J, in another aspect, the positioner 310 of any of FIGS. 15A-15L 16A-16E, 17A-17I, 18A-18E, 19A-19J, 20A-20D, 21A-21D, 22 and/or the positioner 510 of any of FIGS. 23A-23D, 24A-24D, 25A-25D, 26A-26D, 27A-27D, 28A-28D, 29, 30 is adapted to receive only three optics portions (e.g., corresponding to only three camera channels). For example, in some embodiments, there are only three camera channels in the digital camera apparatus, e.g., one camera channel for red, one camera channel for green, and one camera channel for blue. It should be understood that in some other embodiments, there are more than four camera channels in the digital camera apparatus.

Figure 31K:
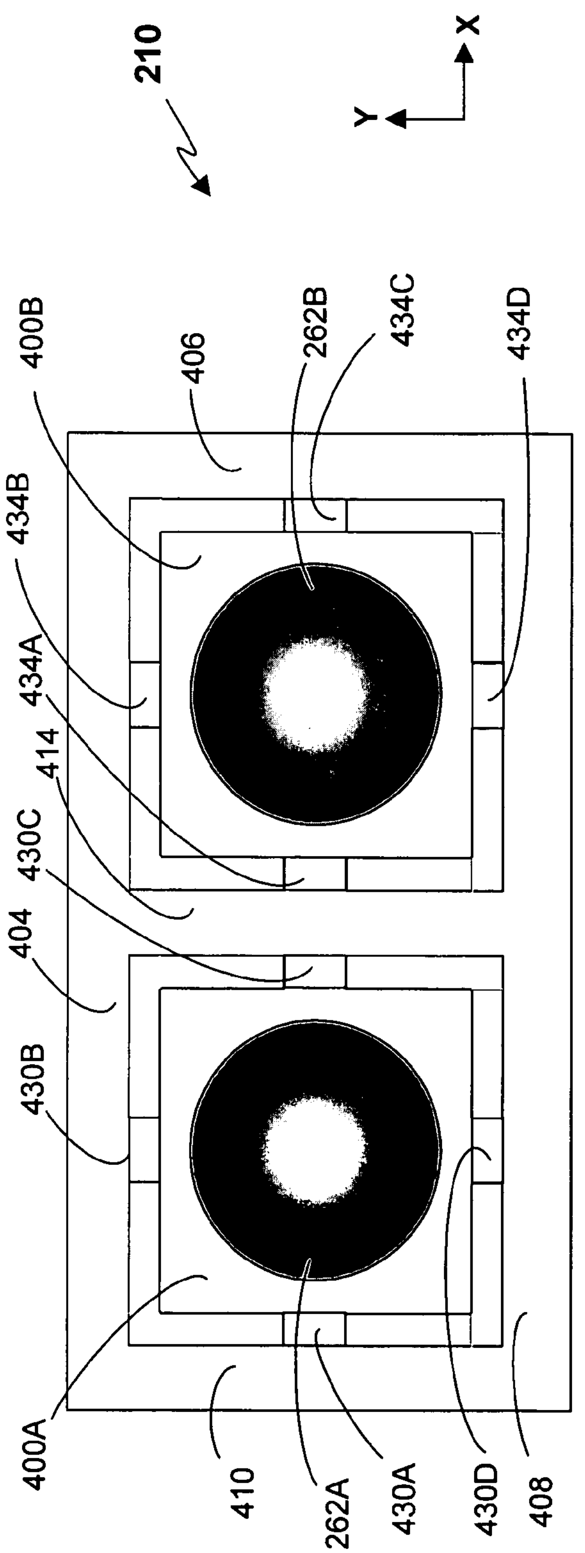
FIGS. 31K-31L are an enlarged schematic plan view and an enlarged schematic representation, respectively, of optics portions and a positioner that may be employed in the digital camera apparatus of FIG. 4, with the positioner shown in a first state to provide a first positioning of the optics portions, in accordance with another aspect of the present invention.
Figure 31L:
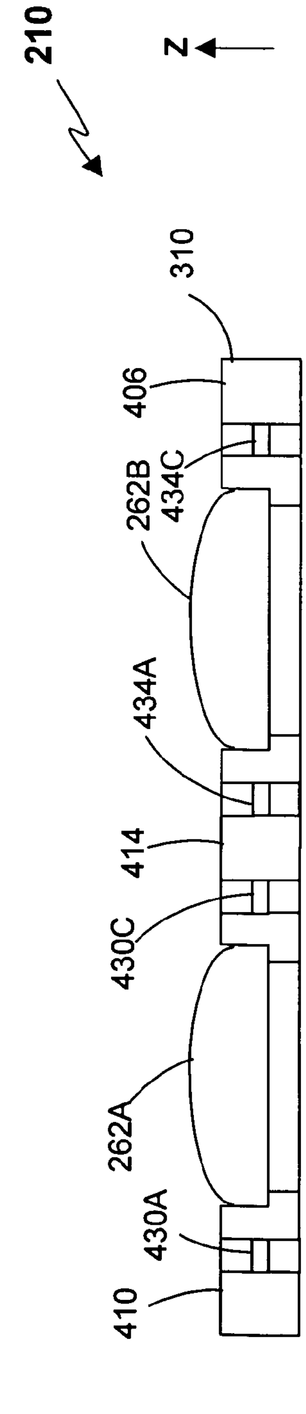

Referring to FIGS. 31K-31L, in another aspect, the positioner 310 of any of FIGS. 15A-15L, 16A-16E, 17A-17I, 18A-18E, 19A-19J, 20A-20D, 21A-21D, 22 and/or the positioner 510 of any of FIGS. 23A-23D, 24A-24D, 25A-25D, 26A-26D, 27A-27D, 28A-28D, 29, 30 is adapted to receive only two optics portions (e.g., corresponding to only two camera channels). For example, in some embodiments, there are only two camera channels in the digital camera apparatus, e.g., one camera channel for red/blue and one camera channel for green or one camera channel for red/green and one camera channel green/blue.

Figure 31M:
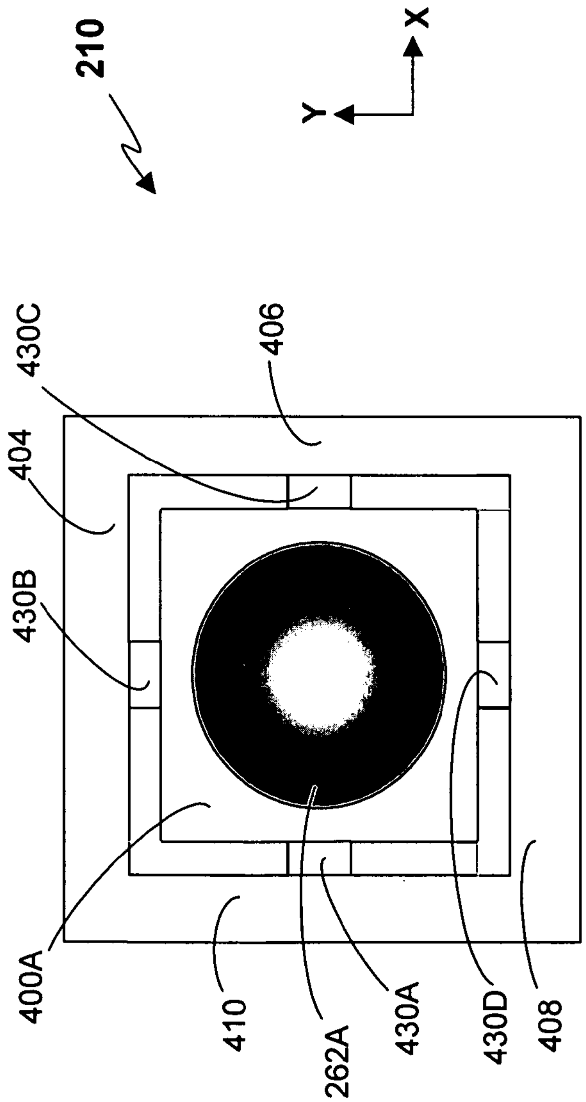
FIGS. 31M-31N are an enlarged schematic plan view and an enlarged schematic representation, respectively, of an optics portion and a positioner that may be employed in the digital camera apparatus of FIG. 4, with the positioner shown in a first state to provide a first positioning of the optics portions, in accordance with another aspect of the present invention.
Figure 31N:
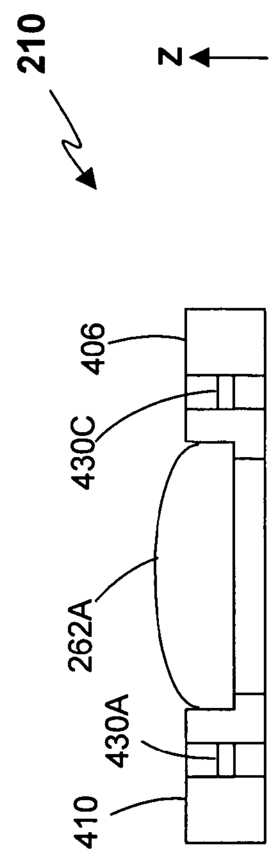
Figure 31O:
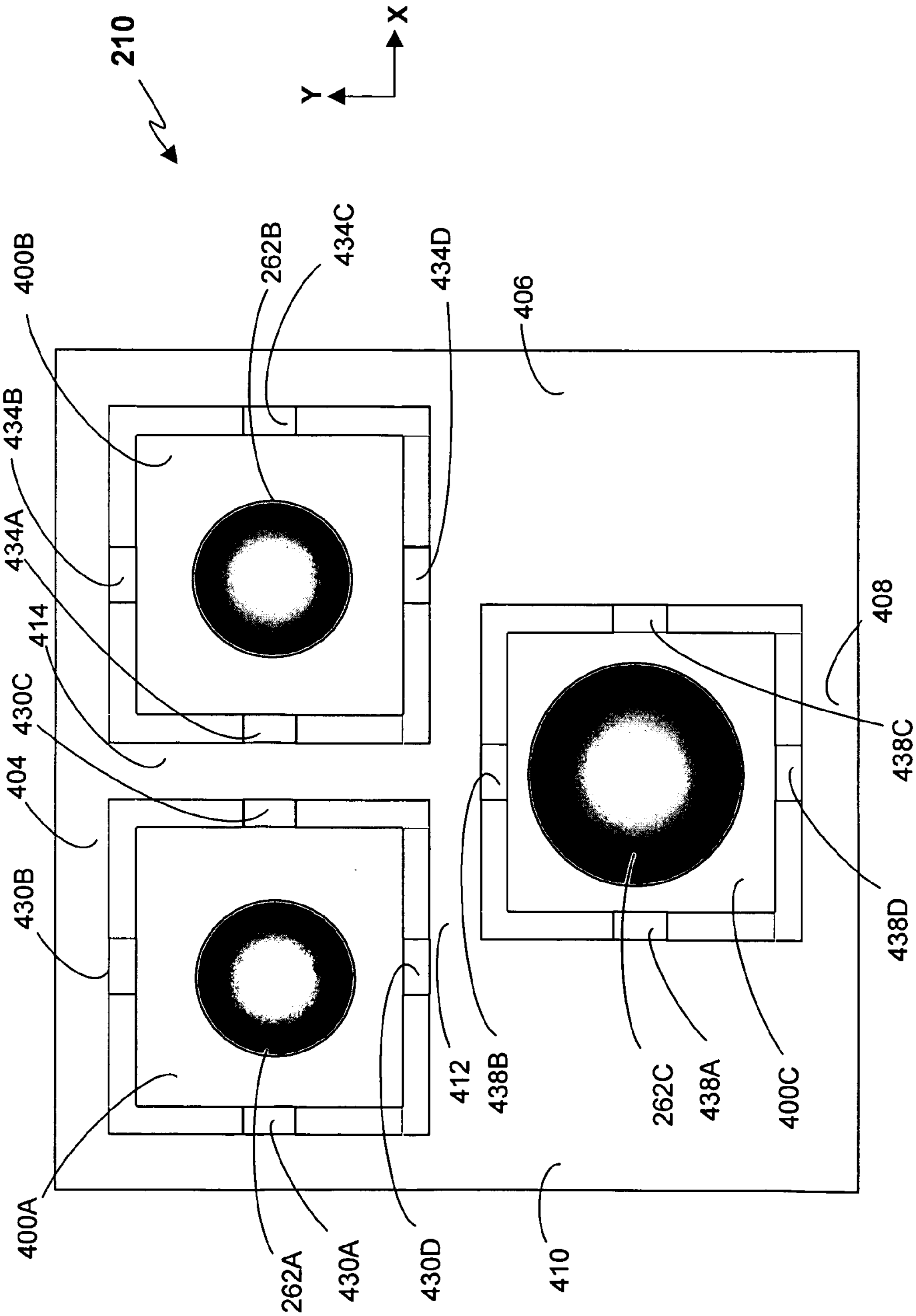
FIGS. 31O-31P are an enlarged schematic plan view and an enlarged schematic representation, respectively, of optics portions and a positioner that may be employed in the digital camera apparatus of FIG. 4, with the positioner shown in a first state to provide a first positioning of the optics portions, in accordance with another aspect of the present invention.
Figure 31P:
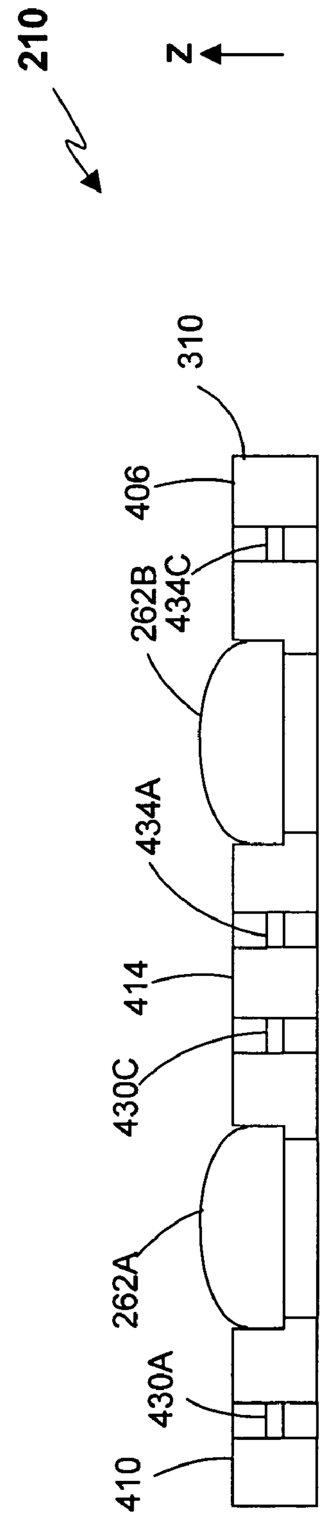
Figure 31Q:
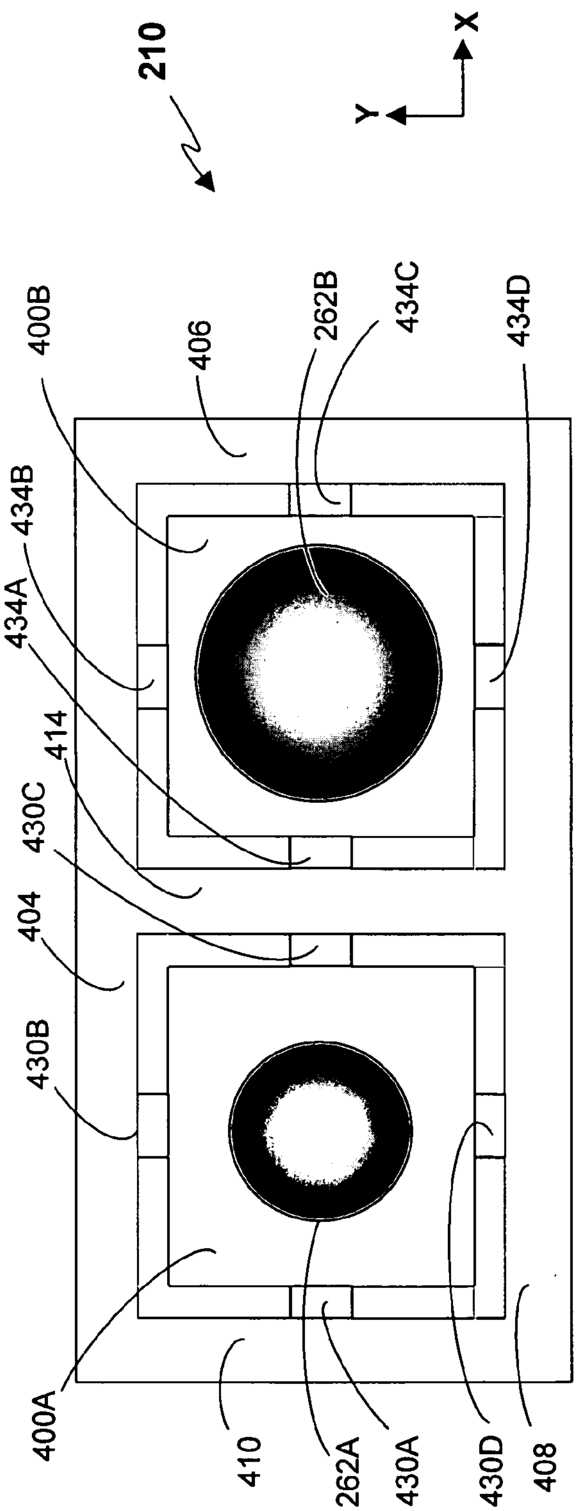
FIGS. 31Q-31R are an enlarged schematic plan view and an enlarged schematic representation, respectively, of optics portions and a positioner that may be employed in the digital camera apparatus of FIG. 4, with the positioner shown in a first state to provide a first positioning of the optics portions, in accordance with another aspect of the present invention.
Figure 31R:
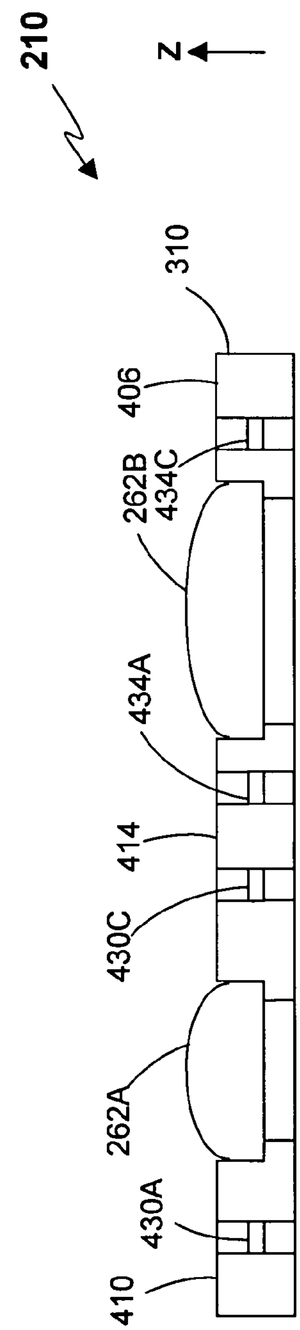
Figure 31S:
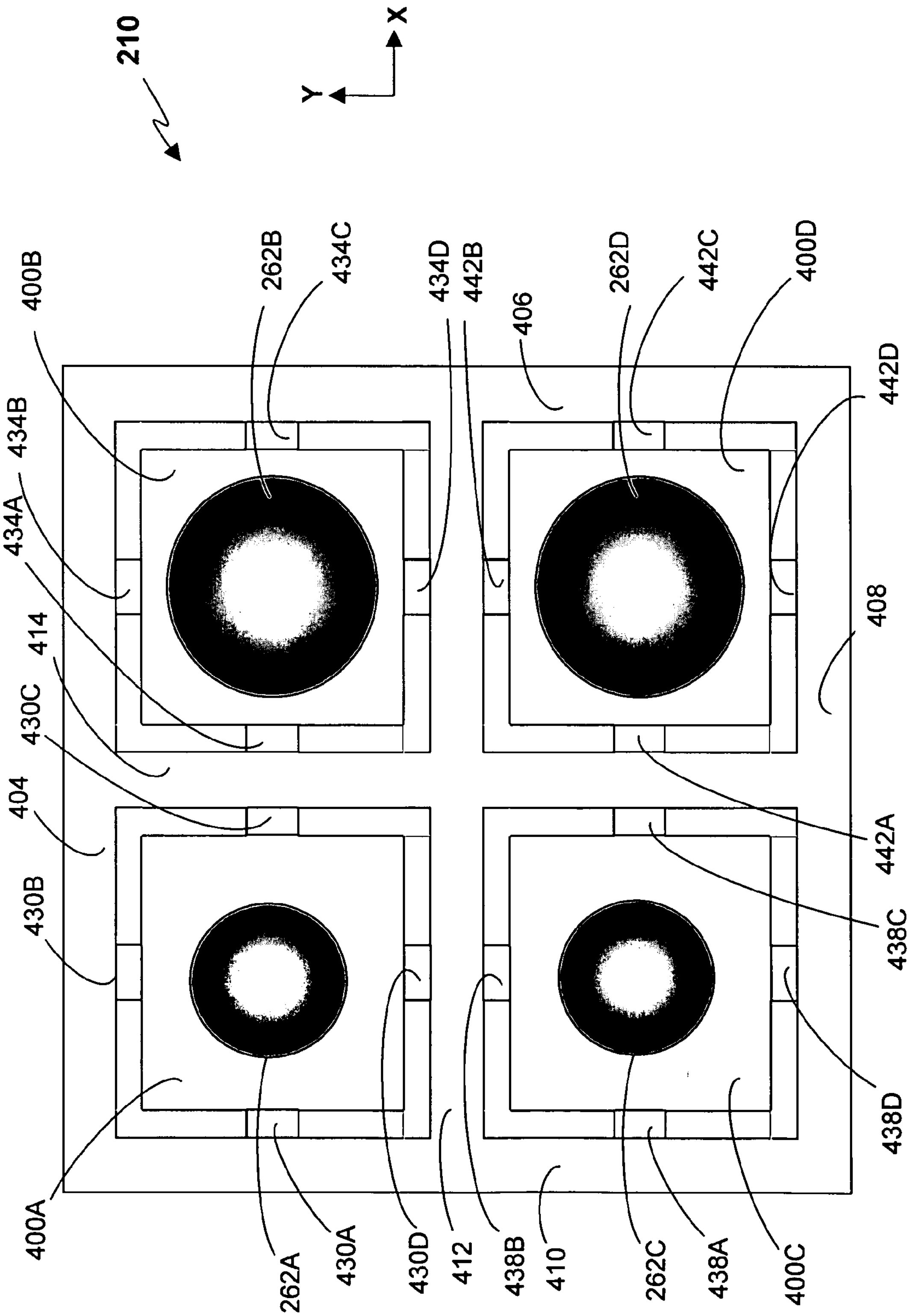
FIGS. 31S-31T are an enlarged schematic plan view and an enlarged schematic representation, respectively, of optics portions and a positioner that may be employed in the digital camera apparatus of FIG. 4, with the positioner shown in a first state to provide a first positioning of the optics portions, in accordance with another aspect of the present invention.
Figure 31T:
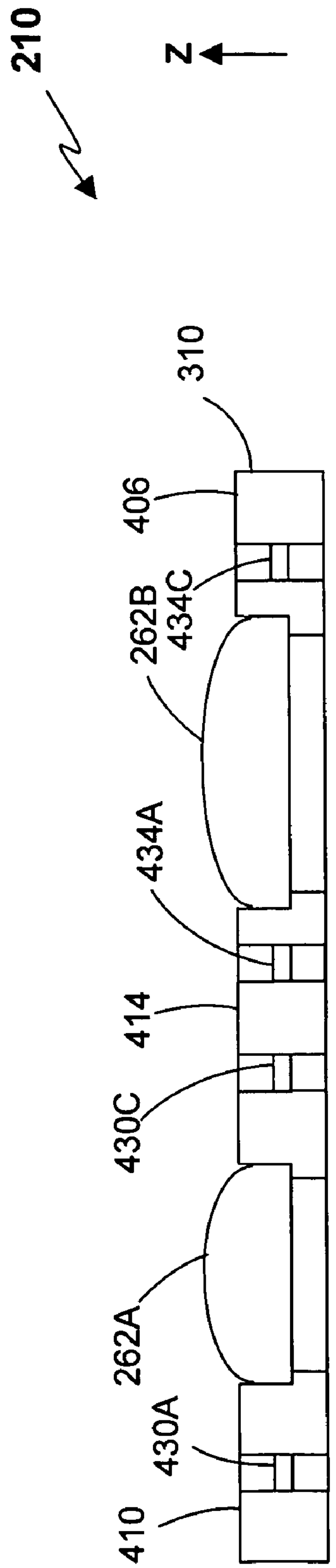

Referring to FIGS. 31M-31N, in another aspect, the positioner 310 of any of FIGS. 15A-15L, 16A-16E, 17A-17I, 18A-18E, 19A-19J, 20A-20D, 21A-21D, 22 and/or the positioner 510 of any of FIGS. 23A-23D, 24A-24D, 25A-25D, 26A-26D, 27A-27D, 28A-28D, 29, 30 is adapted to receive only one optics portion (e.g., corresponding to only one camera channels). For example, in some embodiments, there is only one camera channel in the digital camera apparatus, e.g., dedicated to a single color (or band of colors) or wavelength (or band of wavelengths), infrared light, black and white imaging, or full color using a traditional Bayer pattern configuration.

Referring to FIG. 31O-31T, in another aspect, the positioner 310 of any of FIGS. 15A-15L, 16A-16E, 17A-17I, 18A-18E, 19A-19J, 20A-20D, 21A-21D, 22 and/or the positioner 510 of any of FIGS. 23A-23D, 24A-24D, 25A-25D, 26A-26D, 27A-27D, 28A-28D, 29, 30 is adapted to receive one or more optics portions of a first size and one or more optics portions of a second size that is different than the first size. For example, in some embodiments, the digital camera apparatus comprises three camera channels, e.g., one camera channel for red, one camera channel for blue, and one camera channel for green, wherein the sensor portion of one of the camera channels, e.g., the green camera channel, has a sensor portion that is larger than the sensor portions of one or more of the other camera channels, e.g., the red and blue camera channels. The camera channel with the larger sensor portion may also employ an optics portion (e.g., lens) that is adapted to the larger sensor and wider than the other optics portions, to thereby help the camera channel with the larger sensor to collect more light. In some embodiments, optics portions of further sizes may also be received, e.g., a third size, a fourth size, a fifth size.

Figure 32A:
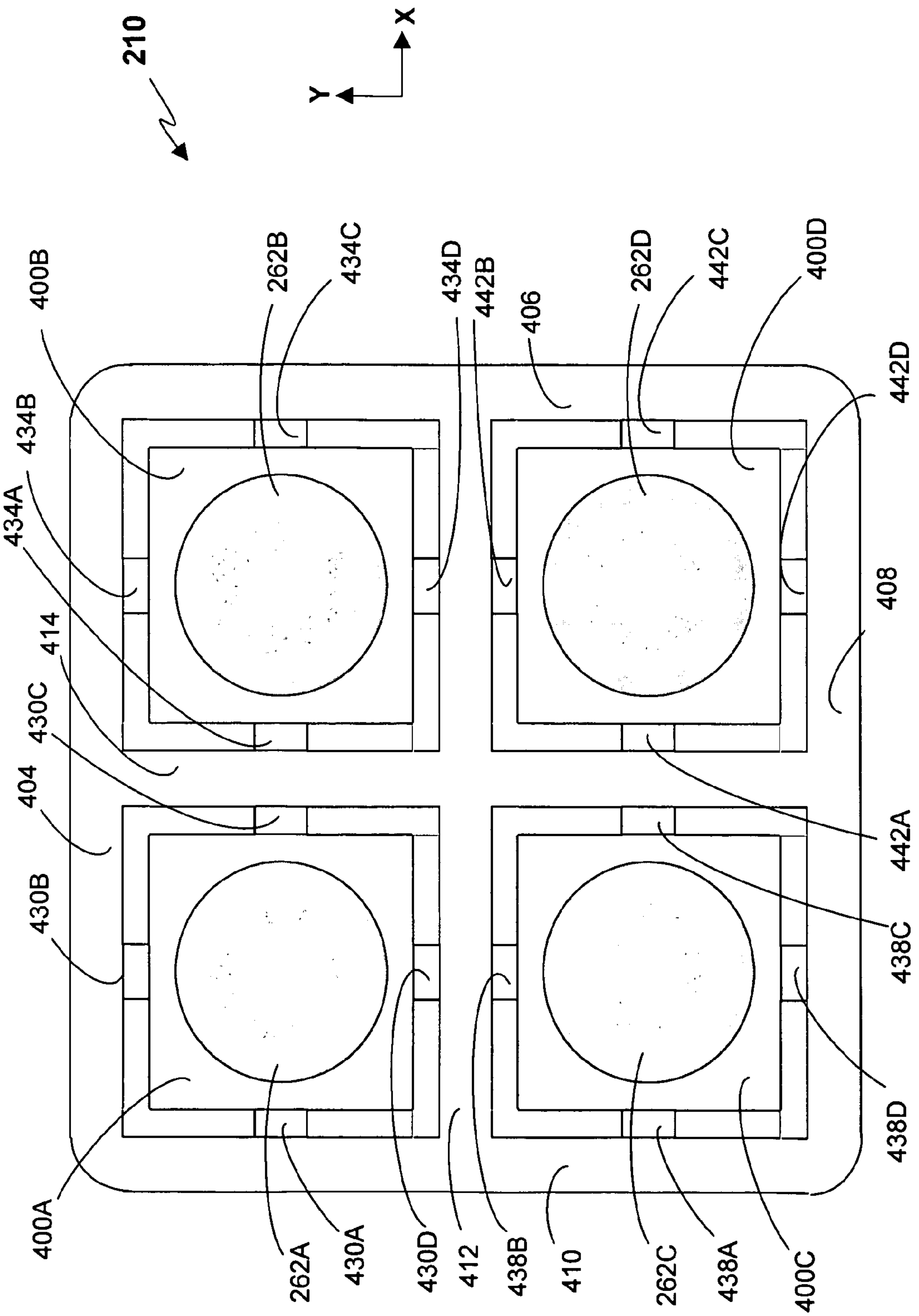
FIGS. 32A-32B are an enlarged schematic plan view and an enlarged schematic representation, respectively, of optics portions and a positioner that may be employed in the digital camera apparatus of FIG. 4, with the positioner shown in a first state to provide a first positioning of the optics portions, in accordance with another aspect of the present invention.
Figure 32B:
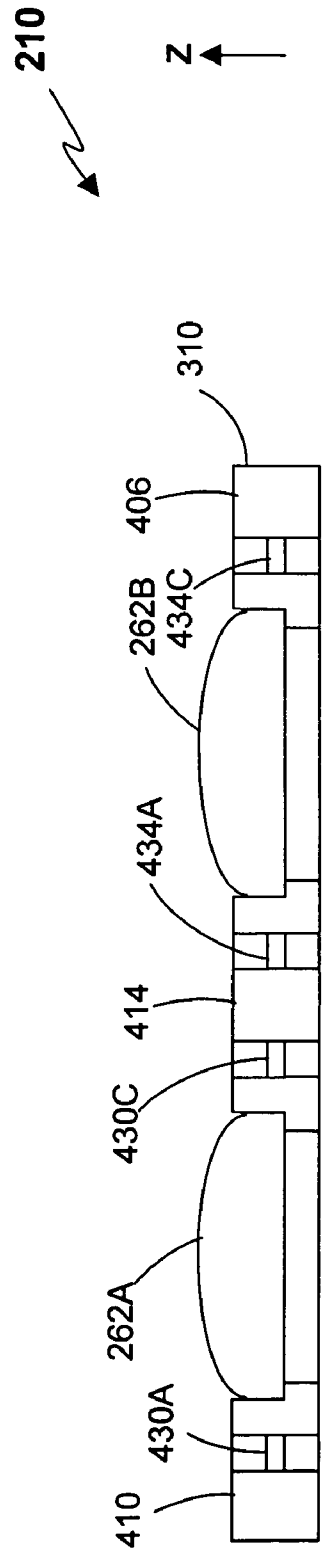
Figure 32C:
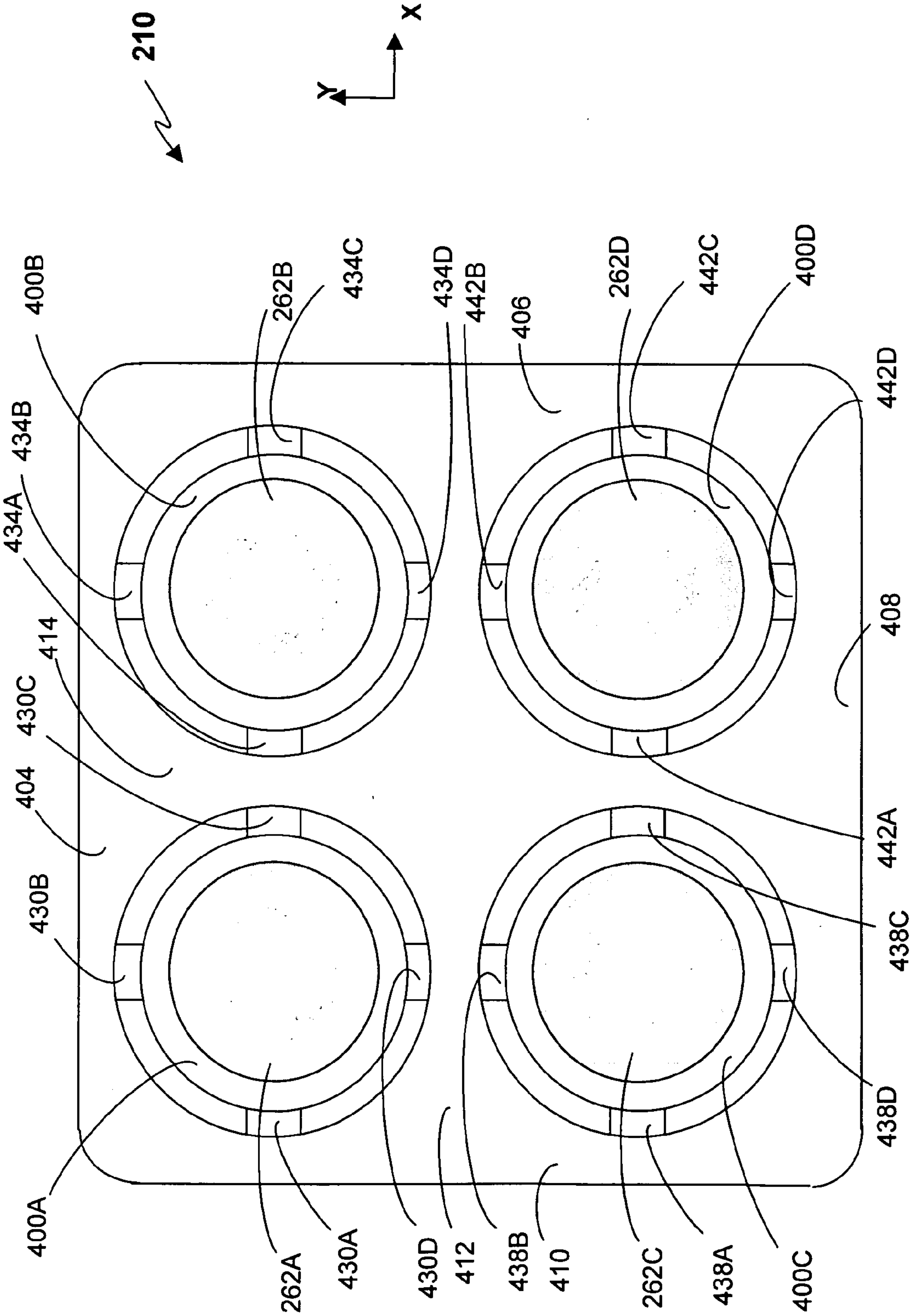
FIGS. 32C-32D are an enlarged schematic plan view and an enlarged schematic representation, respectively, of optics portions and a positioner that may be employed in the digital camera apparatus of FIG. 4, with the positioner shown in a first state to provide a first positioning of the optics portions, in accordance with another aspect of the present invention.
Figure 32D:
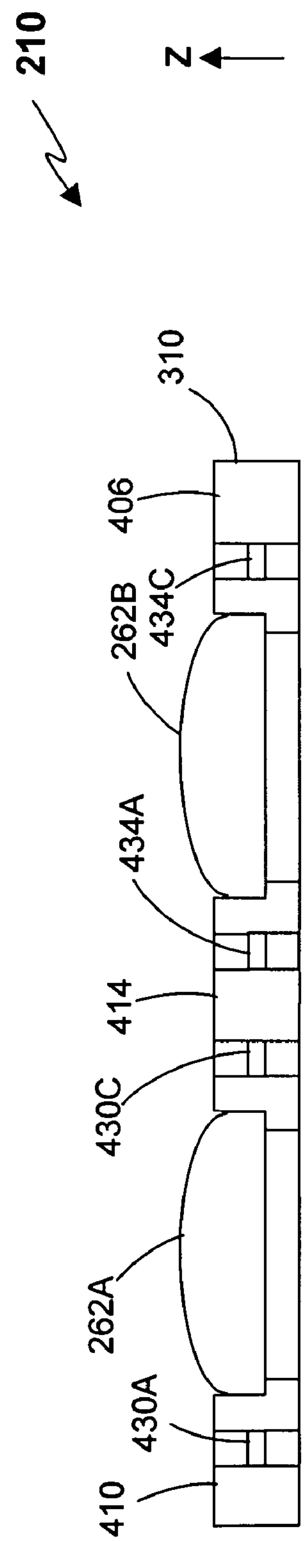
Figure 32E:
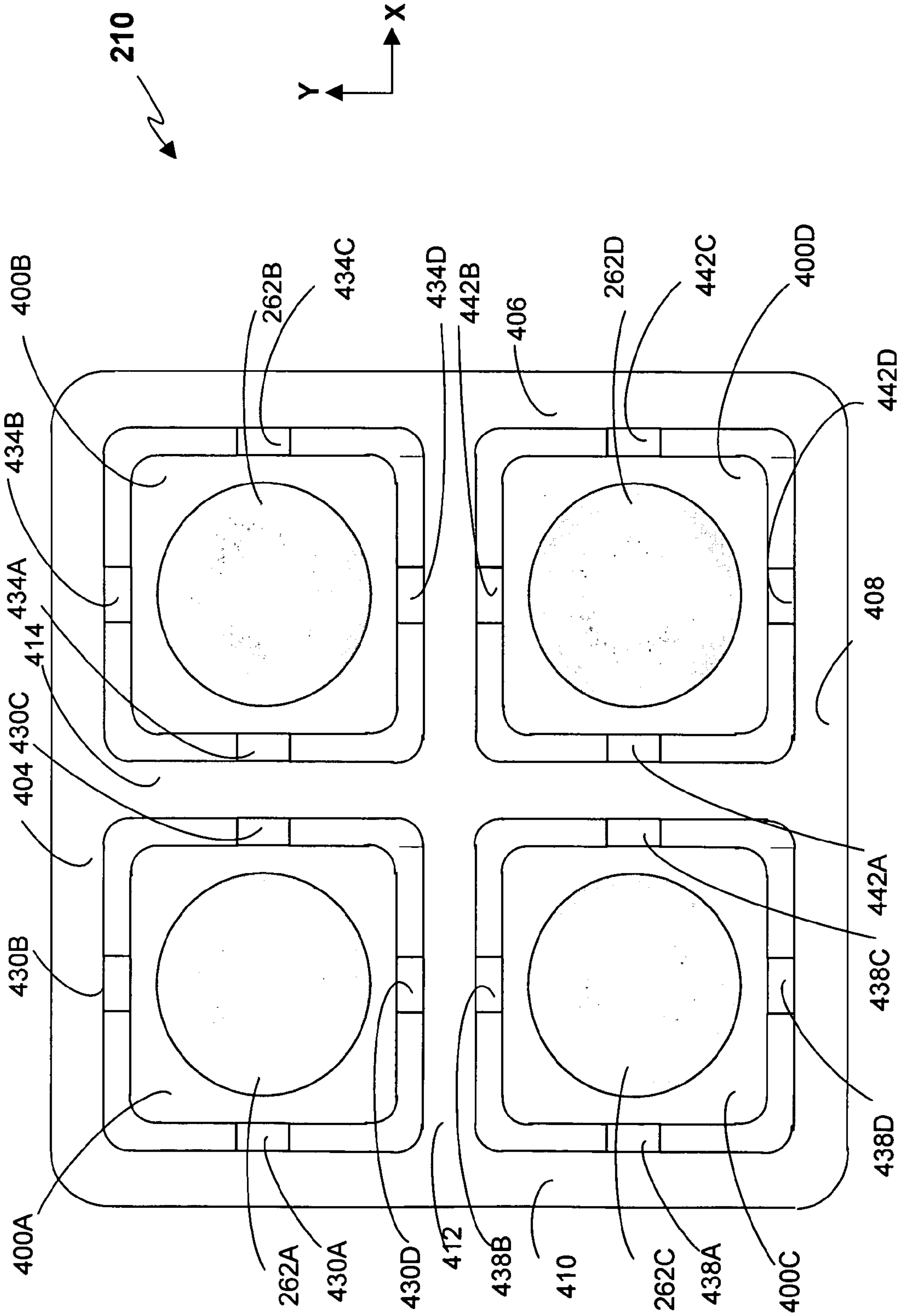
FIGS. 32E-32F are an enlarged schematic plan view and an enlarged schematic representation, respectively, of optics portions and a positioner that may be employed in the digital camera apparatus of FIG. 4, with the positioner shown in a first state to provide a first positioning of the optics portions, in accordance with another aspect of the present invention.
Figure 32F:
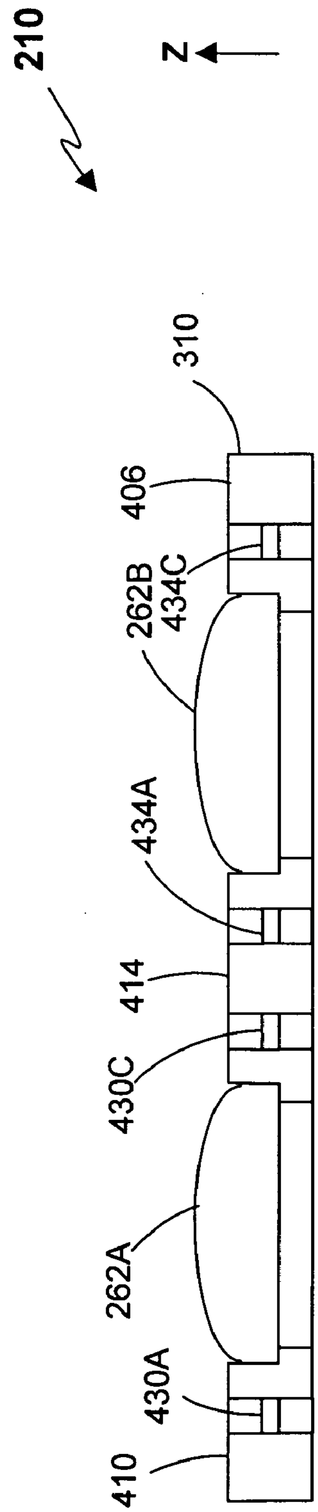
Figure 32G:
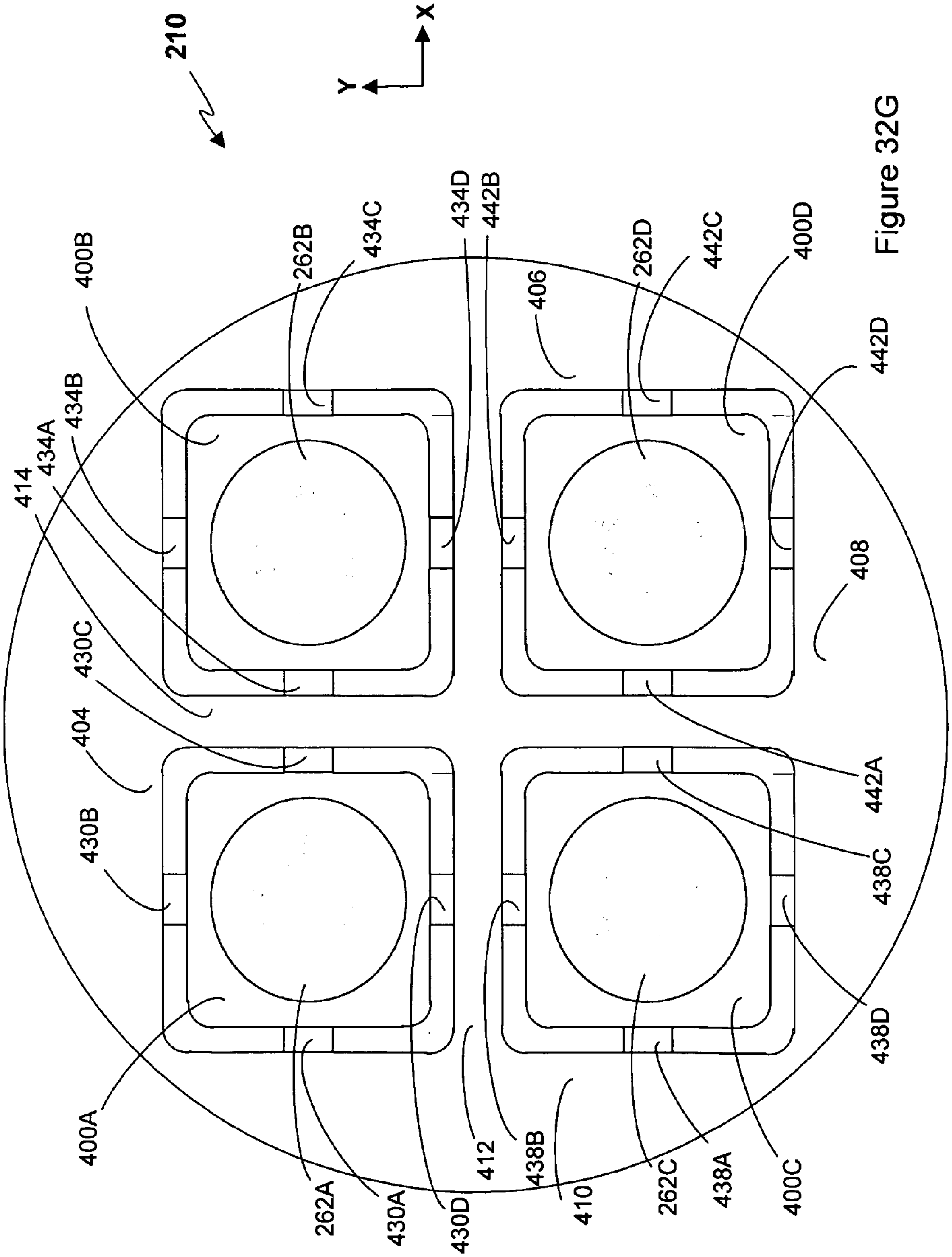
FIGS. 32G-32H are an enlarged schematic plan view and an enlarged schematic representation, respectively, of optics portions and a positioner that may be employed in the digital camera apparatus of FIG. 4, with the positioner shown in a first state to provide a first positioning of the optics portions, in accordance with another aspect of the present invention.
Figure 32H:
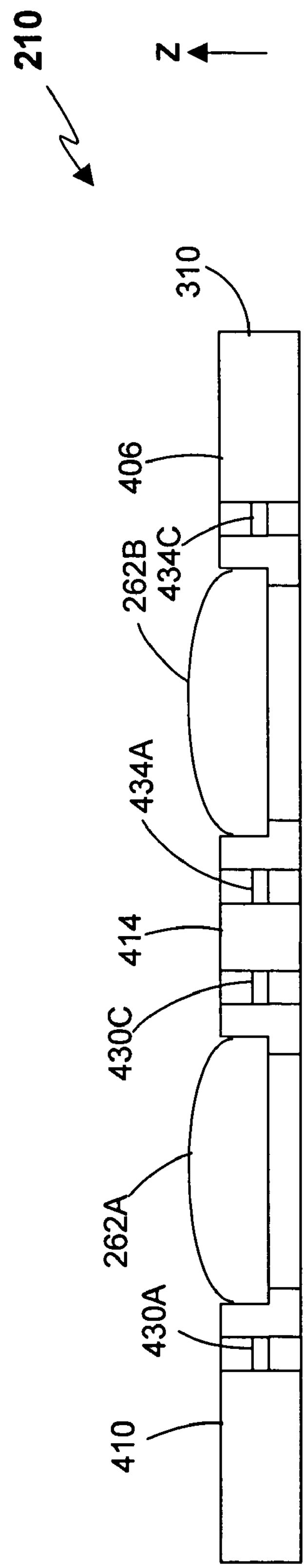
Figure 32I:
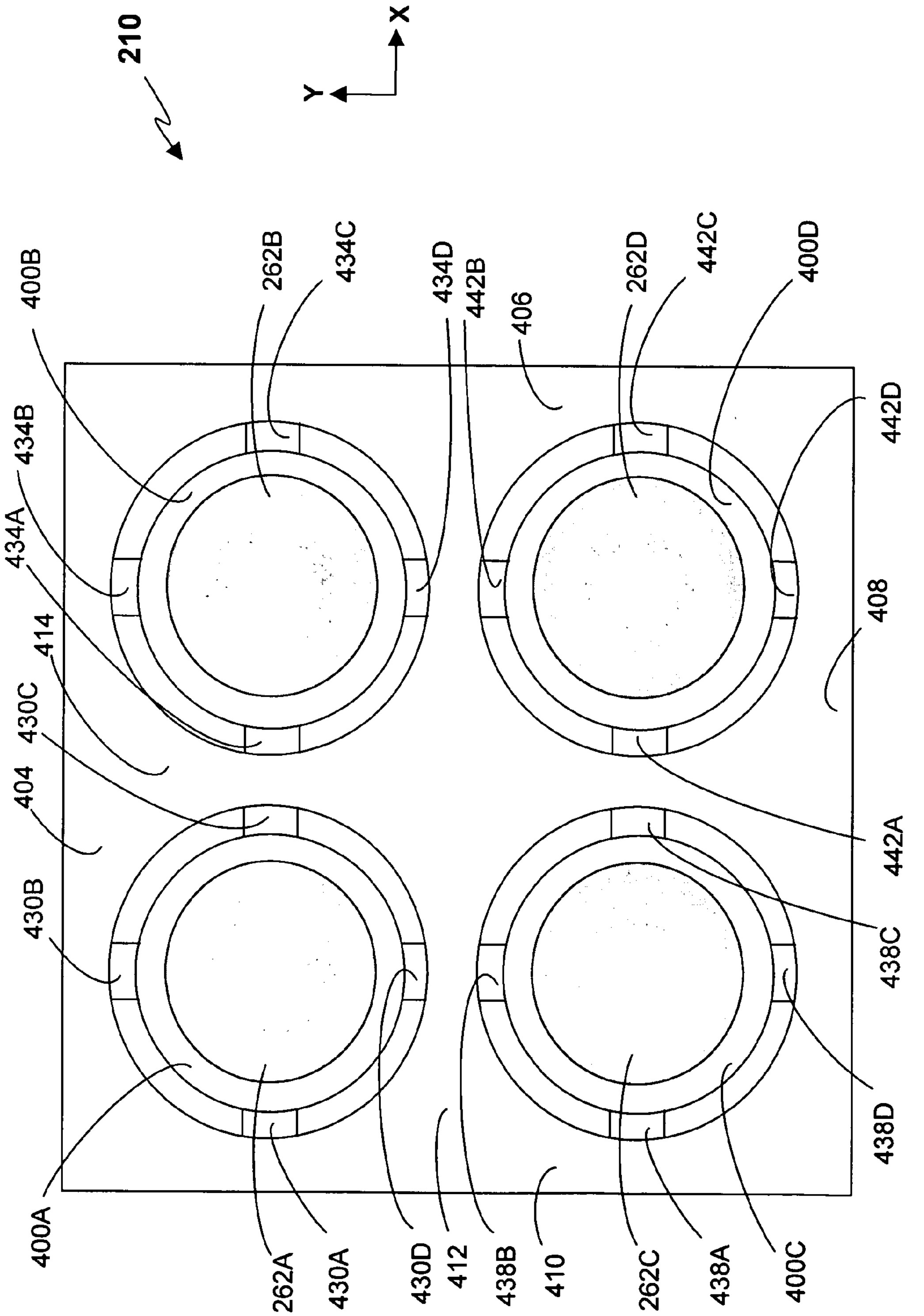
FIGS. 32I-32J are an enlarged schematic plan view and an enlarged schematic representation, respectively, of optics portions and a positioner that may be employed in the digital camera apparatus of FIG. 4, with the positioner shown in a first state to provide a first positioning of the optics portions, in accordance with another aspect of the present invention.
Figure 32J:
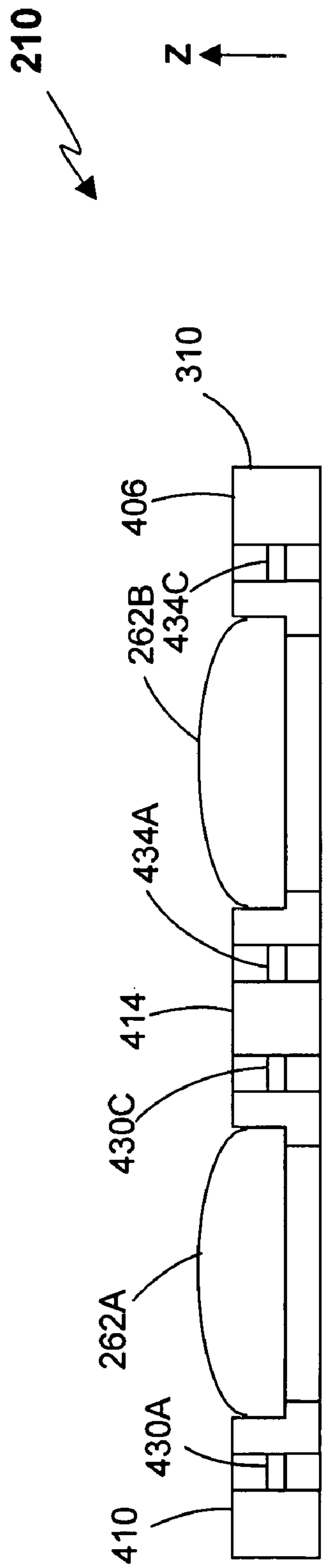
Figure 32K:
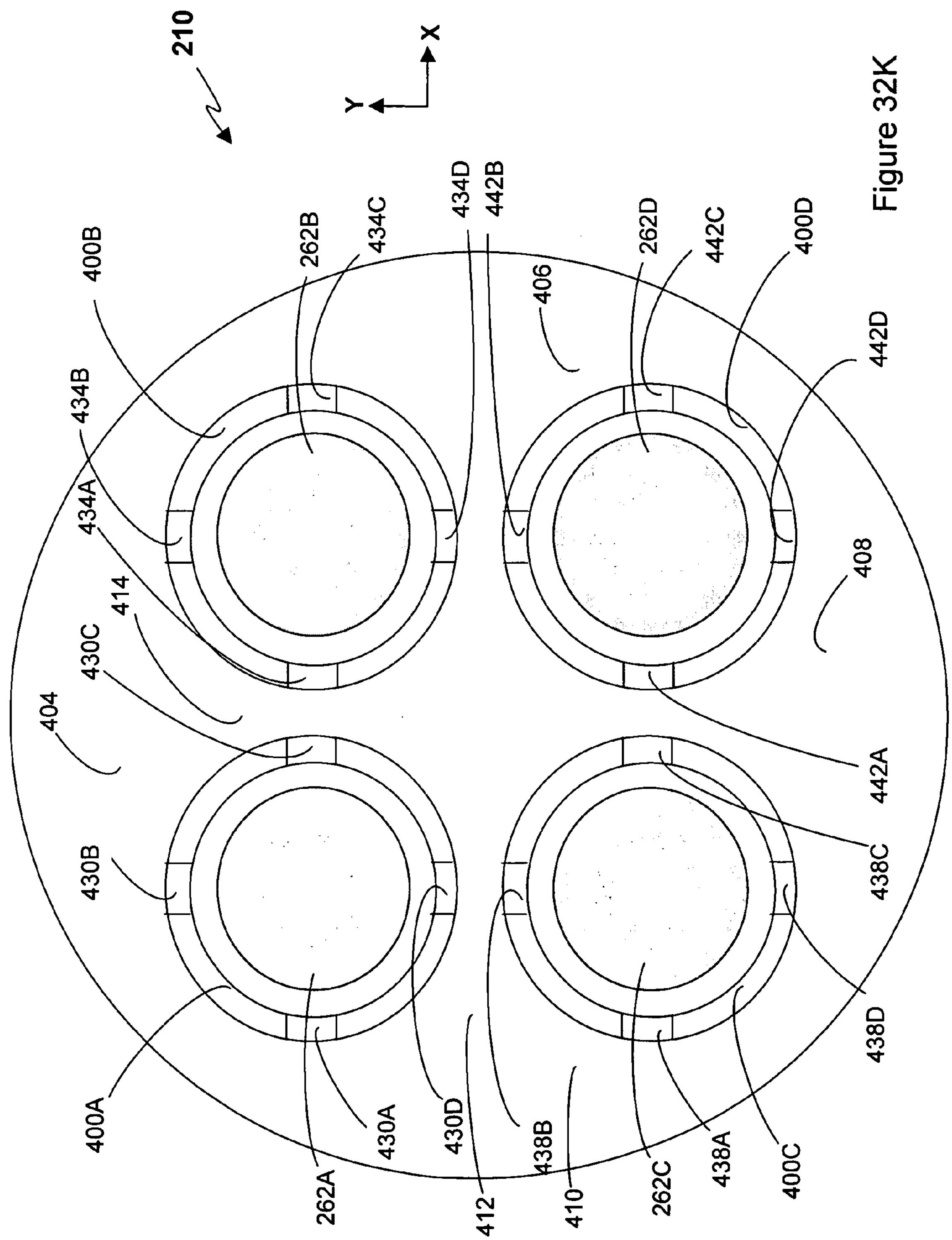
FIGS. 32K-32L are an enlarged schematic plan view and an enlarged schematic representation, respectively, of optics portions and a positioner that may be employed in the digital camera apparatus of FIG. 4, with the positioner shown in a first state to provide a first positioning of the optics portions, in accordance with another aspect of the present invention.
Figure 32L:
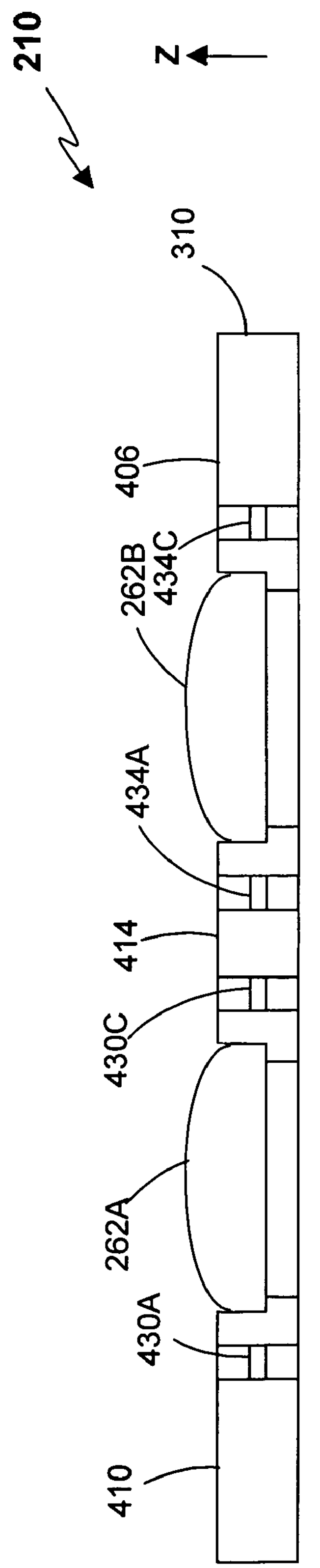
Figure 32M:
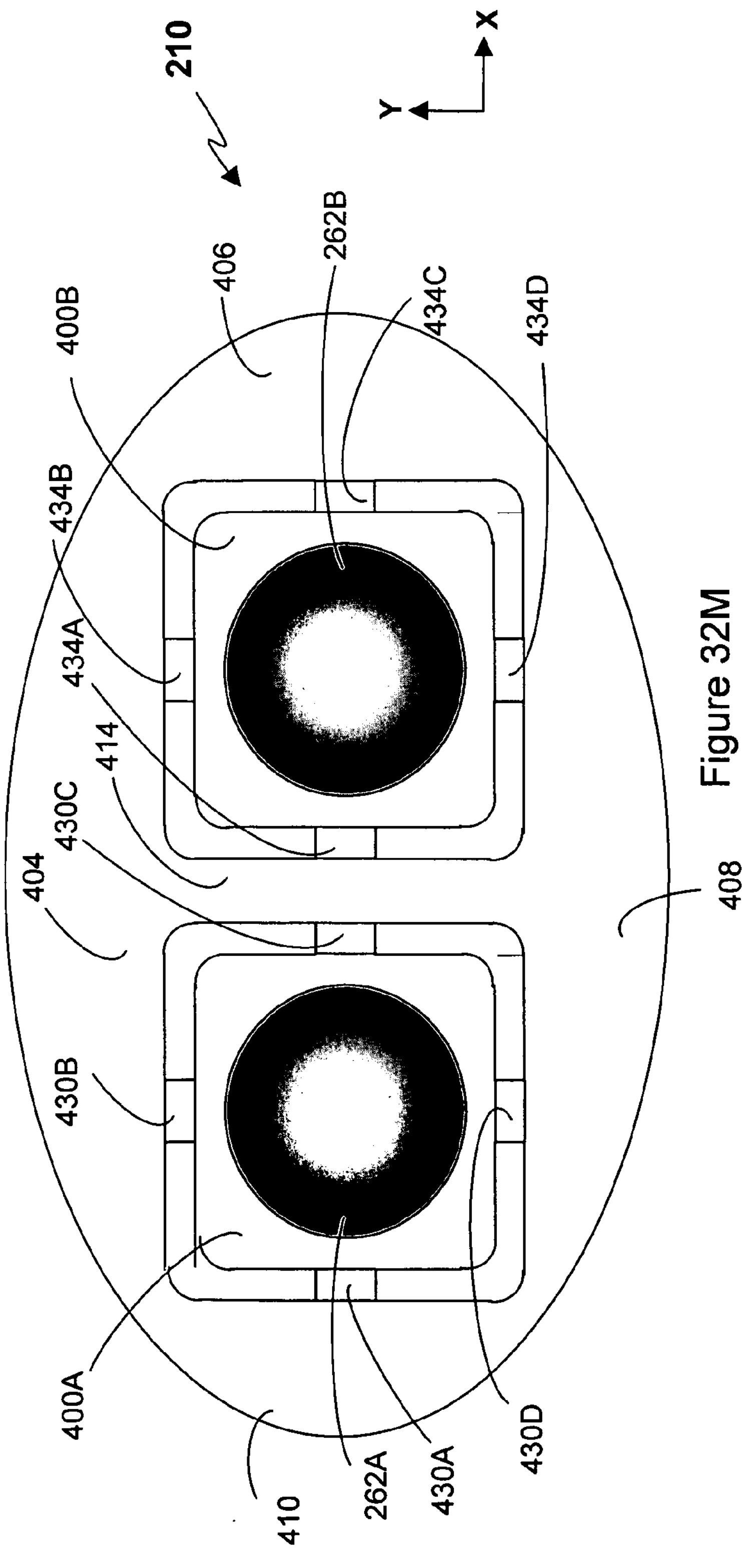
FIGS. 32M-32N are an enlarged schematic plan view and an enlarged schematic representation, respectively, of optics portions and a positioner that may be employed in the digital camera apparatus of FIG. 4, with the positioner shown in a first state to provide a first positioning of the optics portions, in accordance with another aspect of the present invention.
Figure 32N:
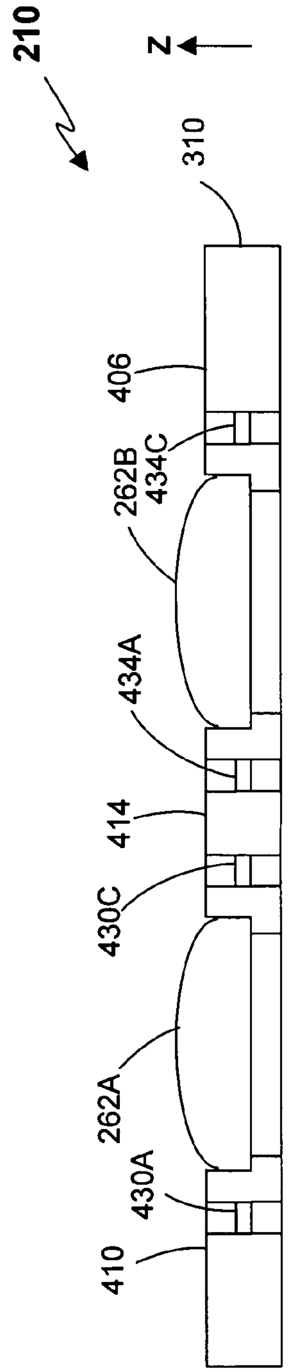
Figure 32O:
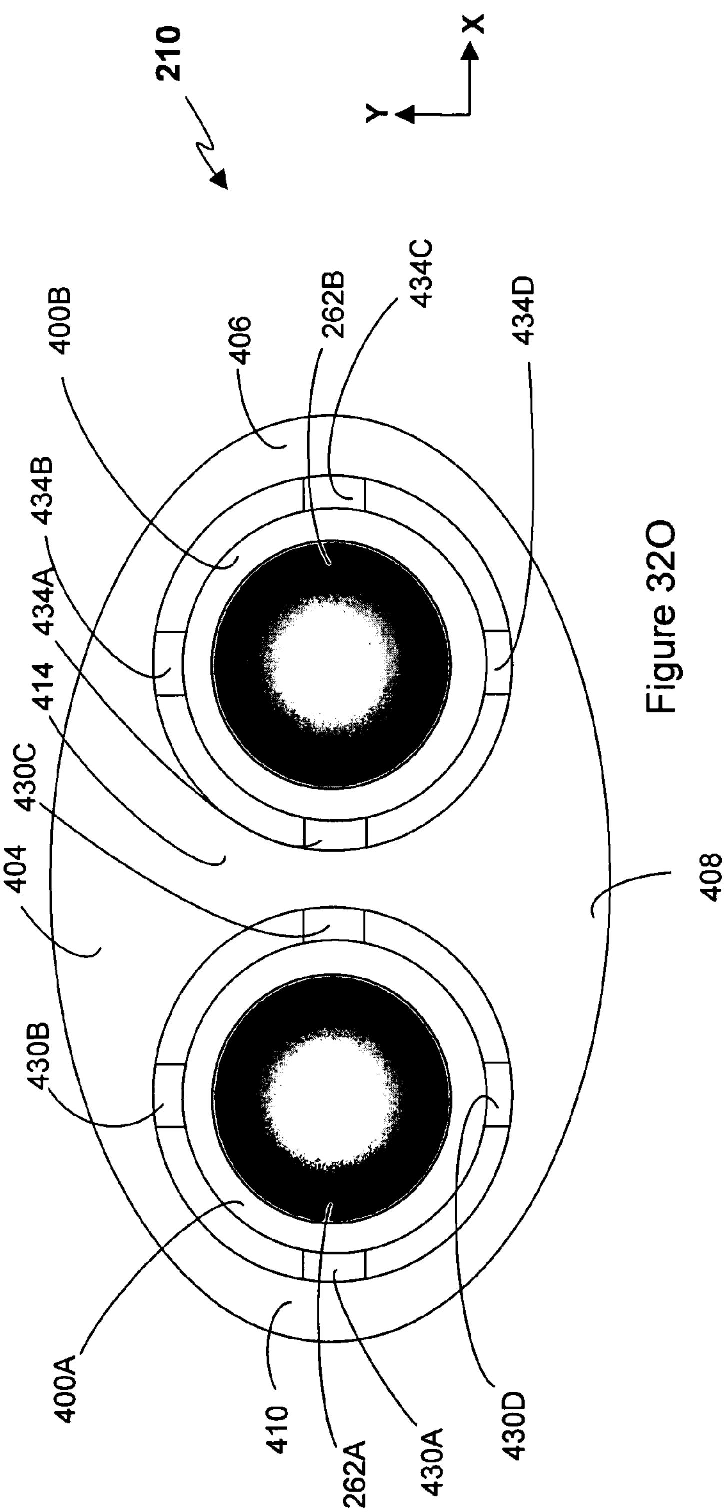
FIGS. 32O-32P are an enlarged schematic plan view and an enlarged schematic representation, respectively, of optics portions and a positioner that may be employed in the digital camera apparatus of FIG. 4, with the positioner shown in a first state to provide a first positioning of the optics portions, in accordance with another aspect of the present invention.
Figure 32P:
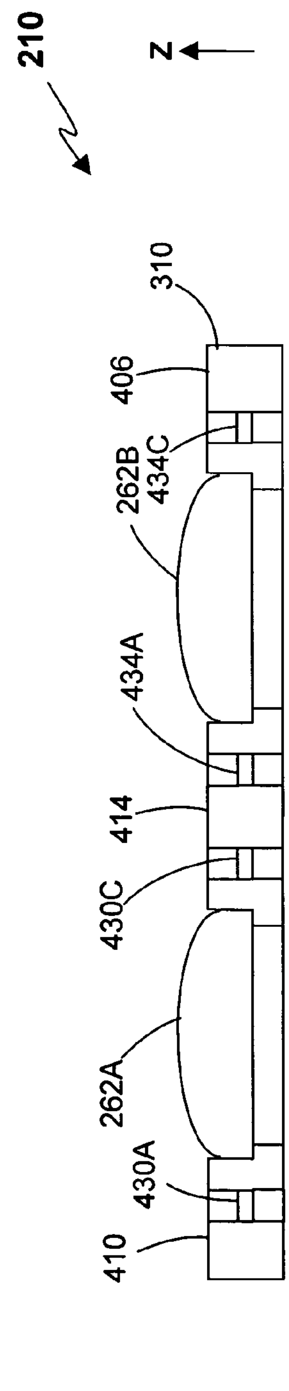

Referring to FIG. 32A-32P in another aspect, the positioner 310 of any of FIGS. 15A-15L, 16A-16E, 17A-17I, 18A-18E, 19A-19J, 20A-20D, 21A-21D, 22 and/or the positioner 510 of any of FIGS. 23A-23D, 24A-24D, 25A-25D, 26A-26D, 27A-27D, 28A-28D, 29, 30 is adapted to have one or more curved portions. Such aspect may be advantageous, for example, in some embodiments in which it is desired to reduce or minimize the dimensions of the digital camera apparatus and/or to accommodate certain form factors.

As stated above, in some embodiments, the positioning system 280 is adapted to move one or more portions of an optics portion separately from one or more other portions of the optics portion.

Referring to FIGS. 33A-33H and FIGS. 34A-34H, in another aspect, the positioner 310 is adapted to move one or more portions, e.g., one or more filter(s), prism(s) and/or mask(s) of any configuration, of one or more optics portions, e.g., optics portions 260A-260D, separately from one or more other portions of the one or more optics portions. In some embodiments of such aspect, the positioner 310 has a configuration similar to the positioner 310 of any of FIGS. 15A-15L, 16A-16E, 17A-17I, 18A-18E, 19A-19J, 20A-20D, 21A-21D, 22 and/or the positioner 510 of any of FIGS. 23A-23D, 24A-24D, 25A-25D, 26A-26D, 27A-27D, 28A-28D, 29, 30, 31A-31N, 32A-32P. For example, with reference to FIGS. 33A-33B and FIGS. 34A-34B, in some embodiments, the optics portions, e.g., optics portions 262A-262D, include one or more filters and the positioner 310 is adapted to receive one or more of such filters and to move one or more of such filters separately from one or more other portions of the optics portion. As shown, the positioner 310 may have a configuration similar to the configuration of the positioner 310 of FIG. 28B and/or the positioner 310 of FIG. 28D, however, the positioner 310 is not limited to such.

With reference to FIGS. 33C-33D and FIGS. 34C-34D, in some embodiments, the optics portions, e.g., optics portions 262A-262D, include one or more masks and the positioner 310 is adapted to receive one or more of such masks and to move one or more of such masks separately from one or more other portions of the optics portions. As shown, the positioner 310 may have a configuration similar to the configuration of the positioner 310 of FIGS. 21A-21D, the positioner 310 of FIGS. 26A-26D and/or the positioner 310 of FIG. 27A-27D, however, the positioner 310 is not limited to such.

With reference to FIGS. 33E-33F and FIGS. 34E-34F, in some embodiments, the optics portions, e.g., optics portions 262A-262D, include one or more prisms and the positioner 310 is adapted to receive one or more of such prisms and to move one or more of such prisms separately from one or more other portions of the optics portions. As shown, in some such embodiments, the positioner 310 may have some features that are similar to the configuration of the positioner 310 of FIGS. 21A-21D, the positioner 310 of FIGS. 26A-26D and/or the positioner 310 of FIG. 27A-27D, however, the positioner 310 is not limited to such.

Figure 33A:
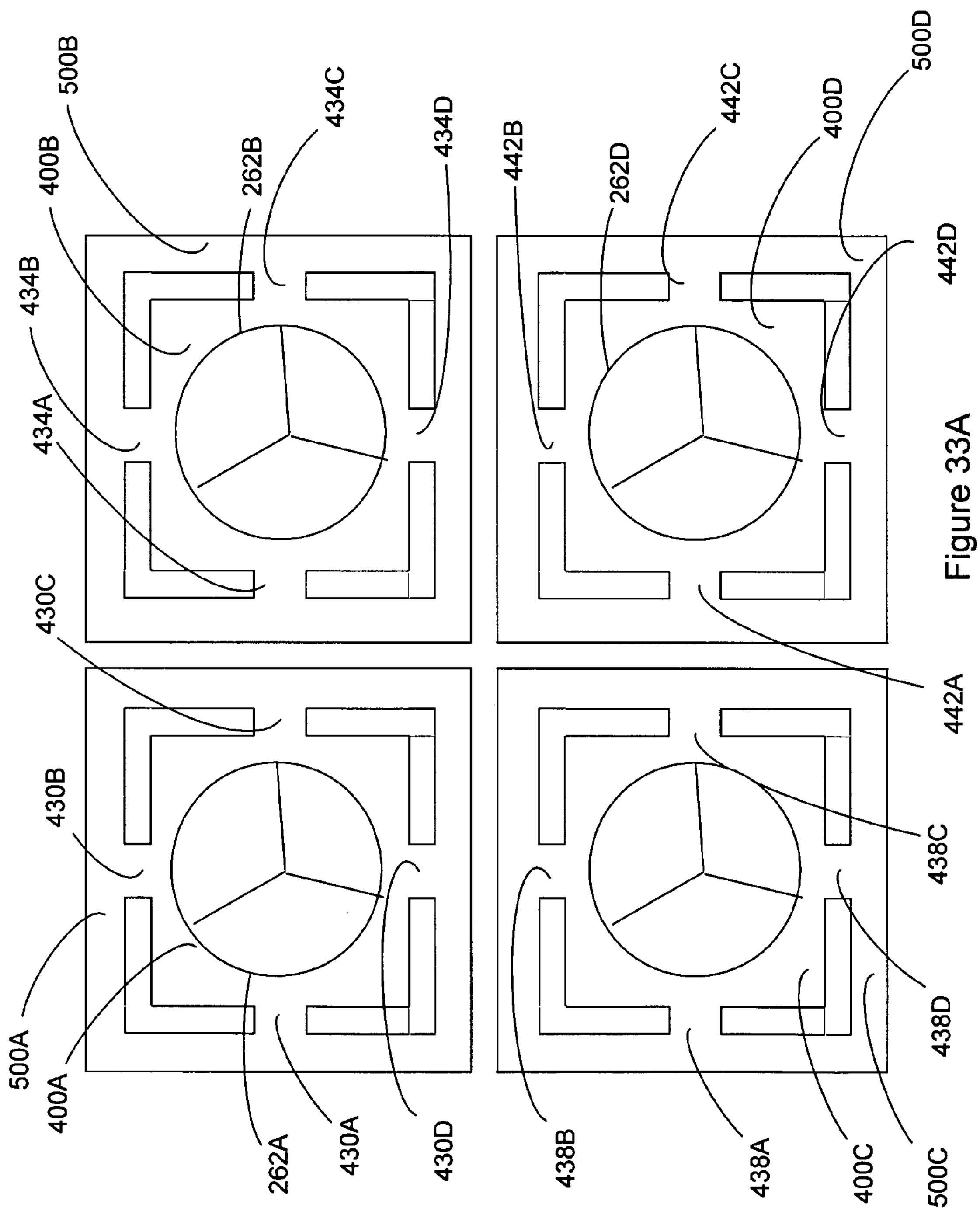
FIGS. 33A-33B are an enlarged schematic plan view and an enlarged schematic representation, respectively, of portions of optics portions and a positioner that may be employed in the digital camera apparatus of FIG. 4, with the positioner shown in a first state to provide a first positioning of the portions of optics portions, in accordance with another aspect of the present invention.
Figure 33B:
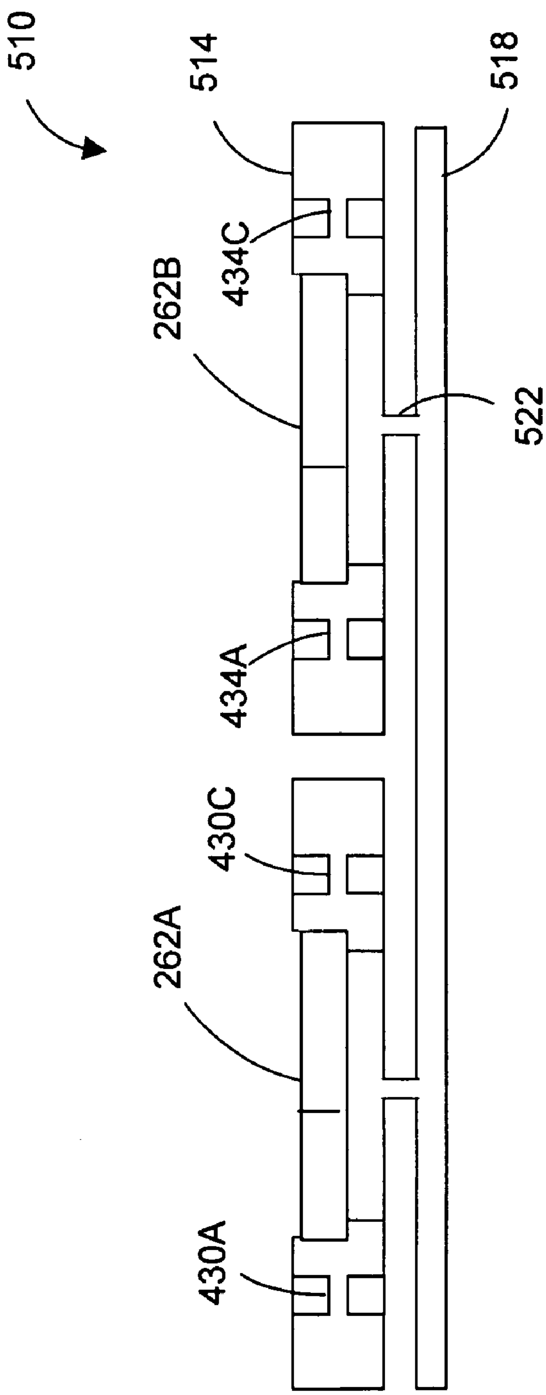
Figure 33C:
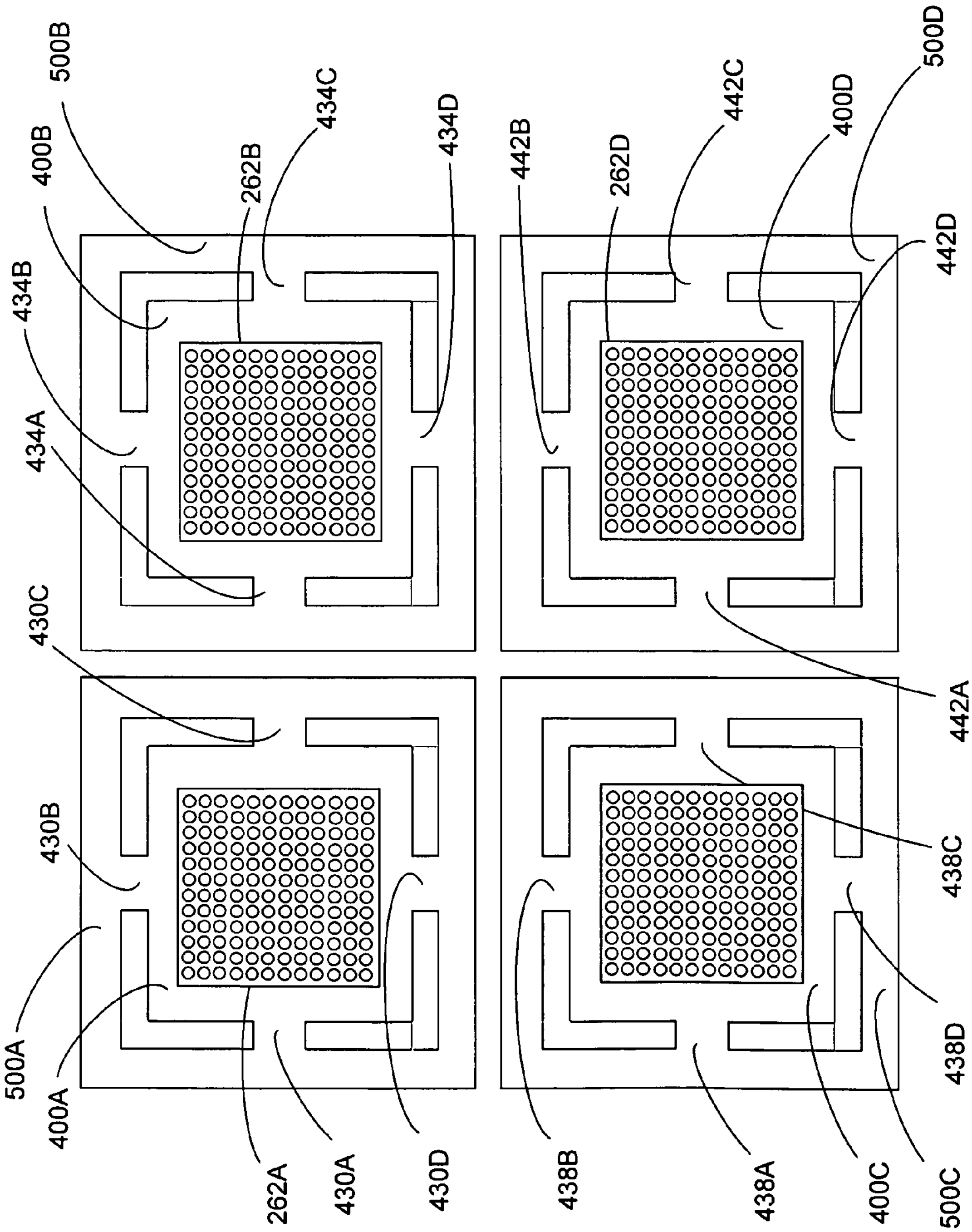
FIGS. 33C-33D are an enlarged schematic plan view and an enlarged schematic representation, respectively, of portions of optics portions and a positioner that may be employed in the digital camera apparatus of FIG. 4, with the positioner shown in a first state to provide a first positioning of the portions of optics portions, in accordance with another aspect of the present invention.
Figure 33D:
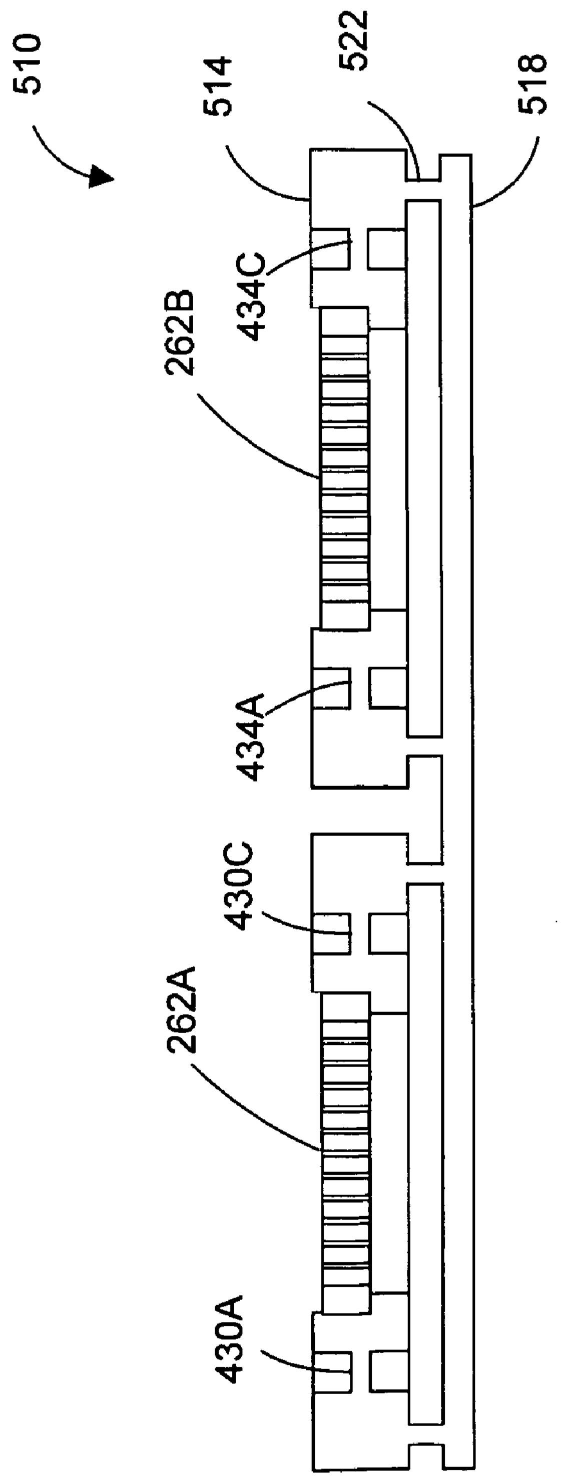
Figure 33E:
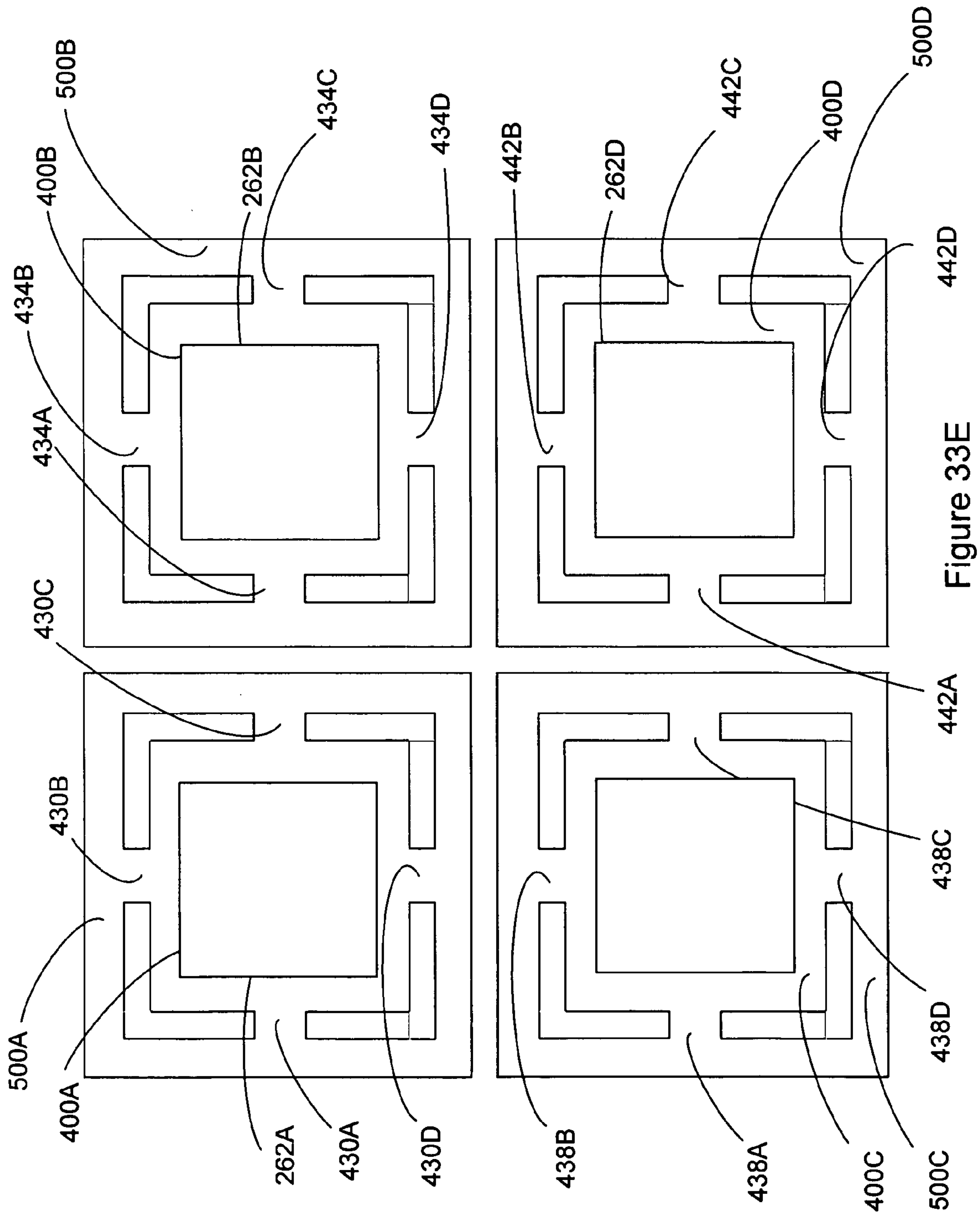
FIGS. 33E-33F are an enlarged schematic plan view and an enlarged schematic representation, respectively, of portions of optics portions and a positioner that may be employed in the digital camera apparatus of FIG. 4, with the positioner shown in a first state to provide a first positioning of the portions of optics portions, in accordance with another aspect of the present invention.
Figure 33F:
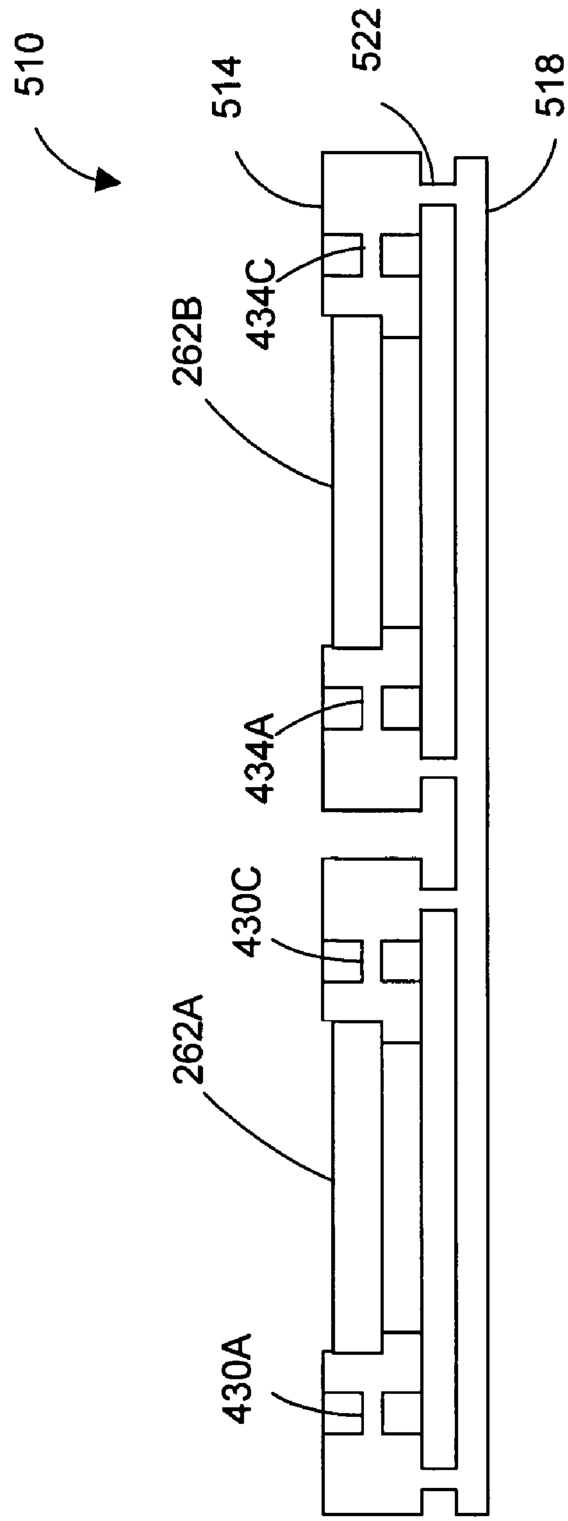
Figure 33G:
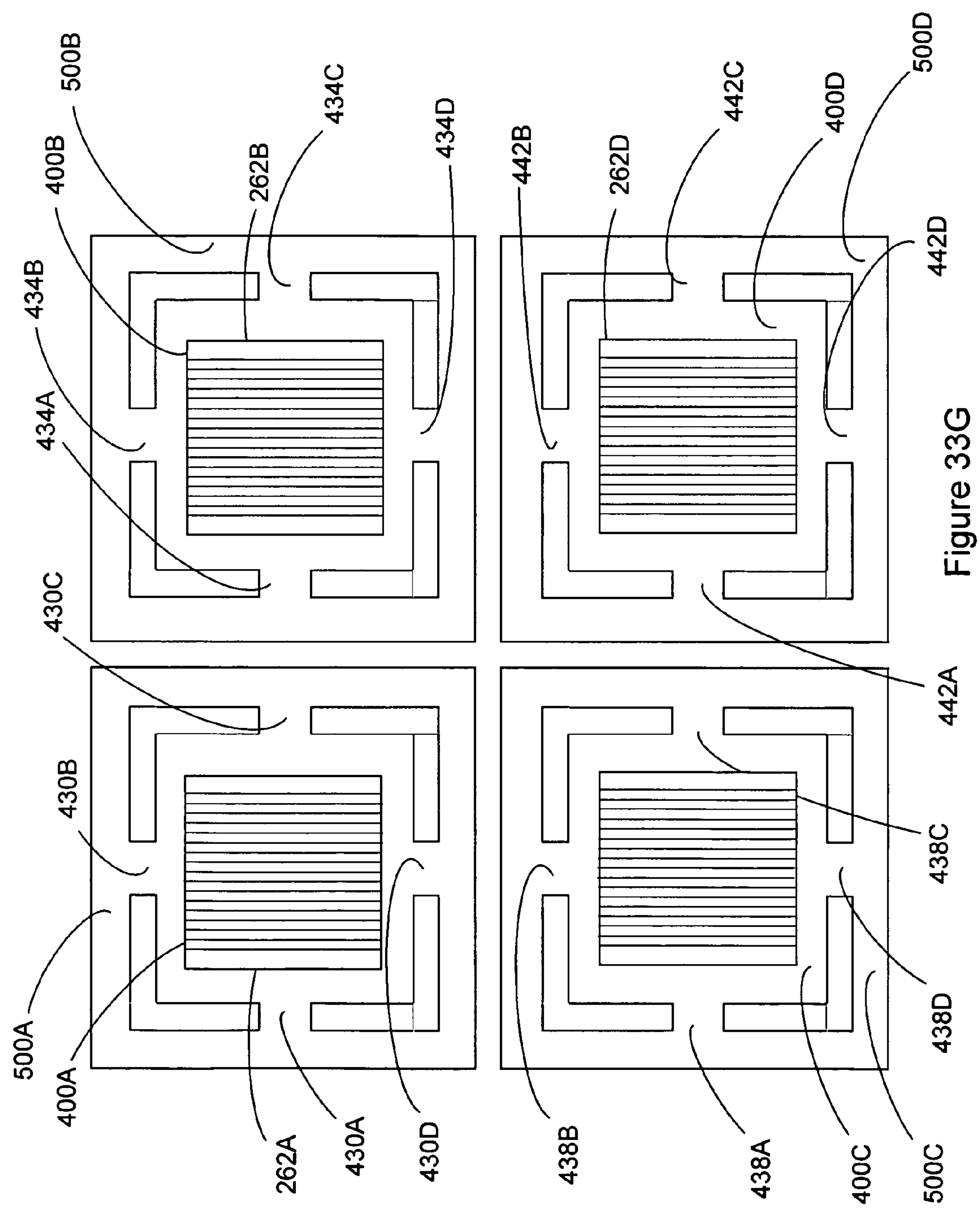
FIGS. 33G-33H are an enlarged schematic plan view and an enlarged schematic representation, respectively, of portions of optics portions and a positioner that may be employed in the digital camera apparatus of FIG. 4, with the positioner shown in a first state to provide a first positioning of the portions of optics portions, in accordance with another aspect of the present invention.
Figure 33H:
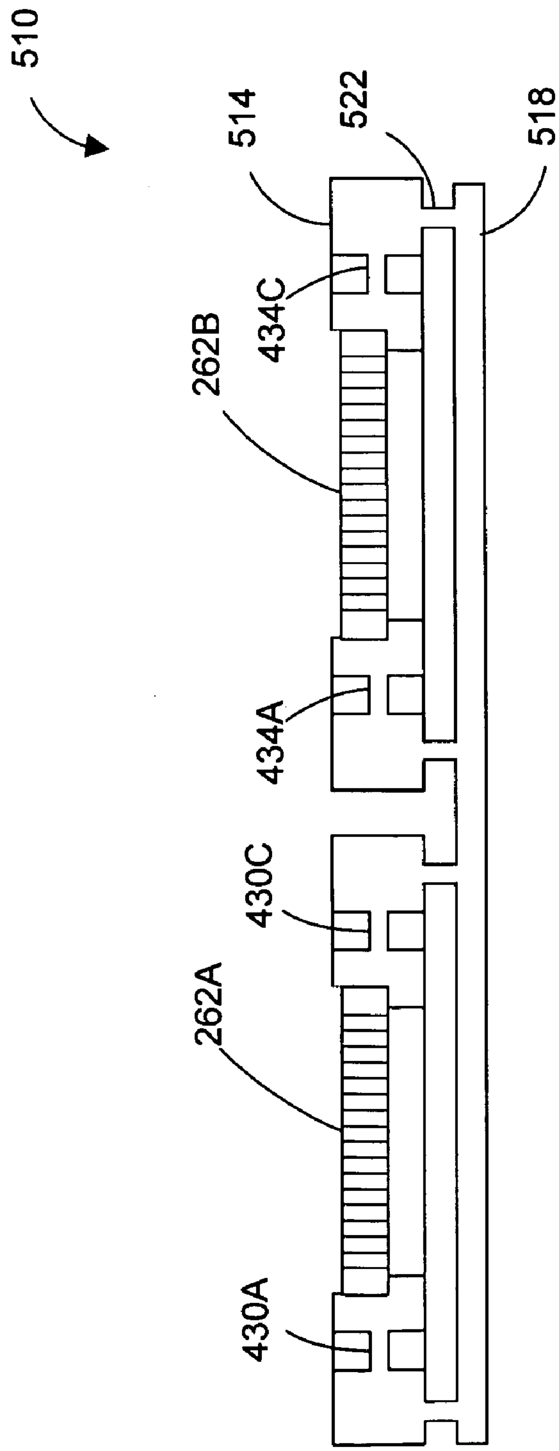
Figure 33I:
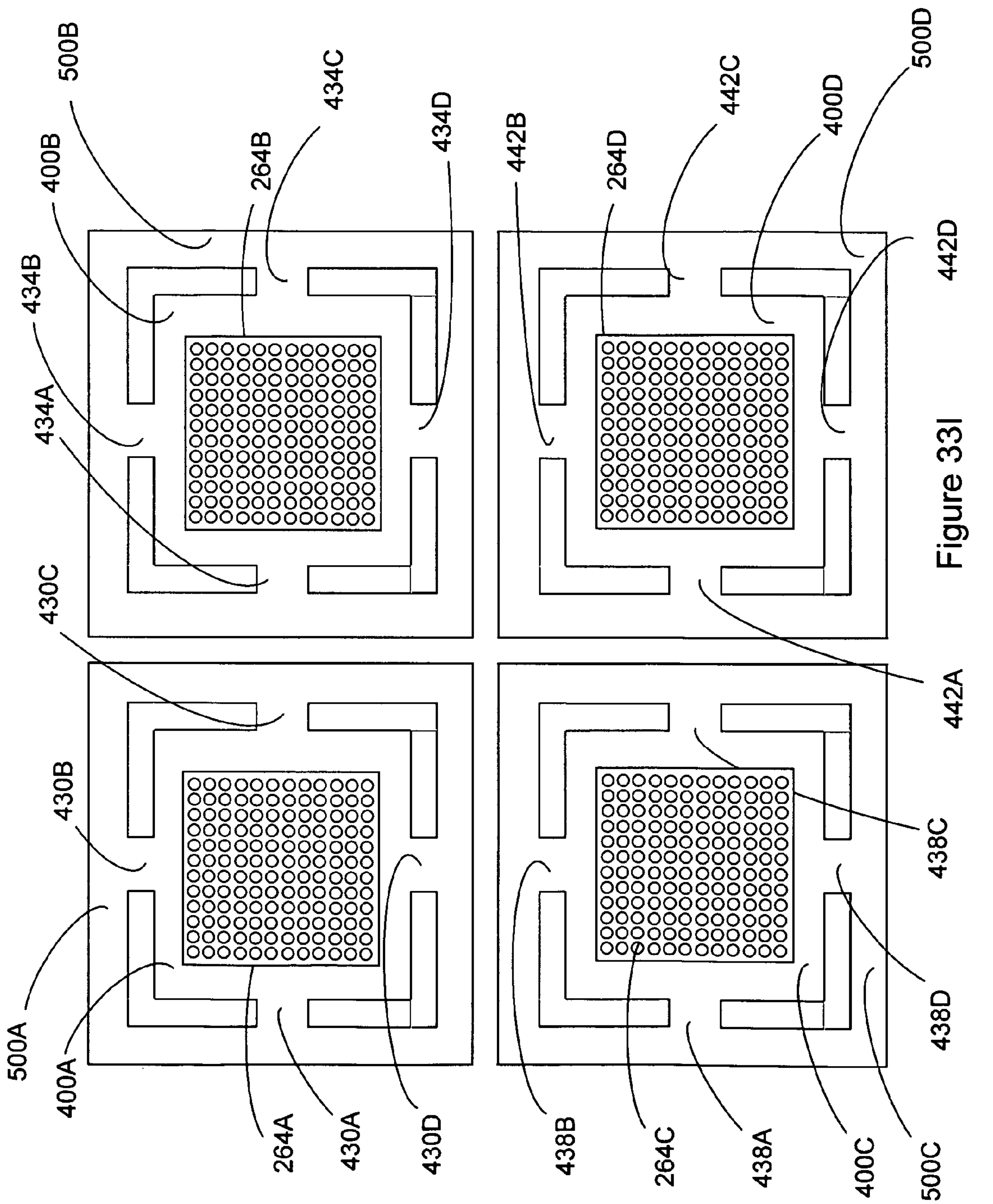
FIGS. 33I-33J are an enlarged schematic plan view and an enlarged schematic representation, respectively, of sensor portions and a positioner that may be employed in the digital camera apparatus of FIG. 4, with the positioner shown in a first state to provide a first positioning of the sensor portions, in accordance with another aspect of the present invention.
Figure 33J:
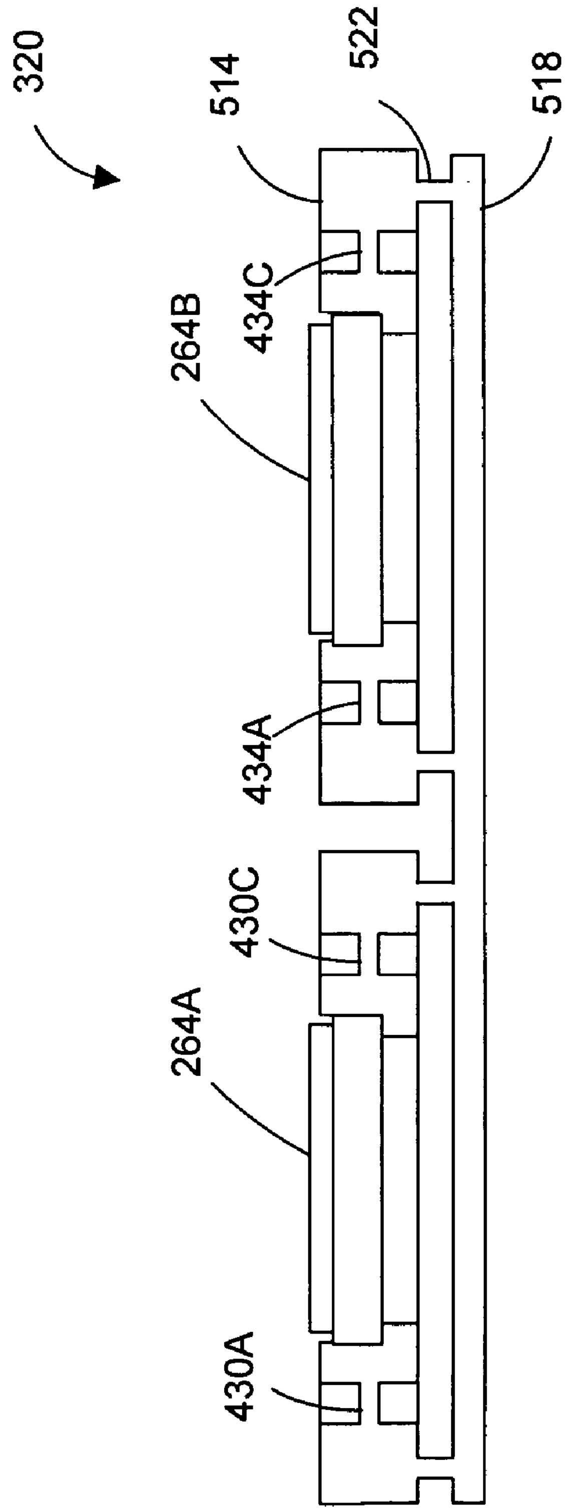
Figure 33K:
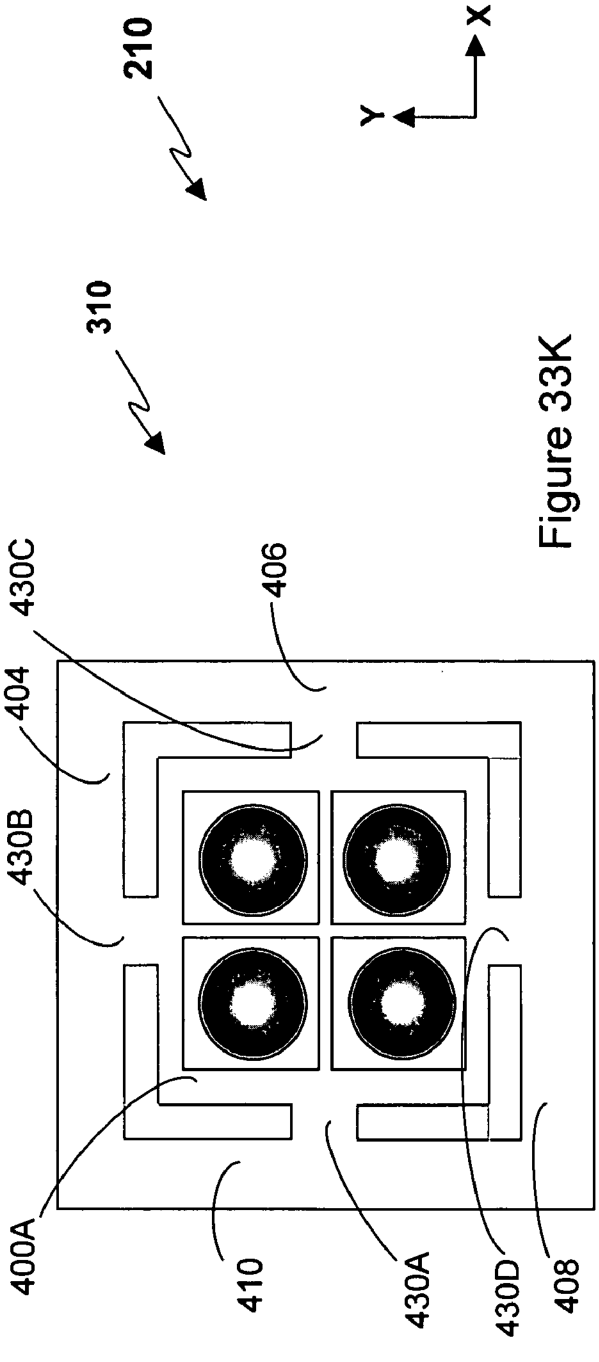
FIGS. 33K-33L are a schematic plan view and a schematic representation, respectively, of optics portions and a positioner that may be employed in the digital camera apparatus of FIG. 4, with the positioner shown in a first state to provide a first positioning of the sensor portions, in accordance with another aspect of the present invention.
Figure 33L:
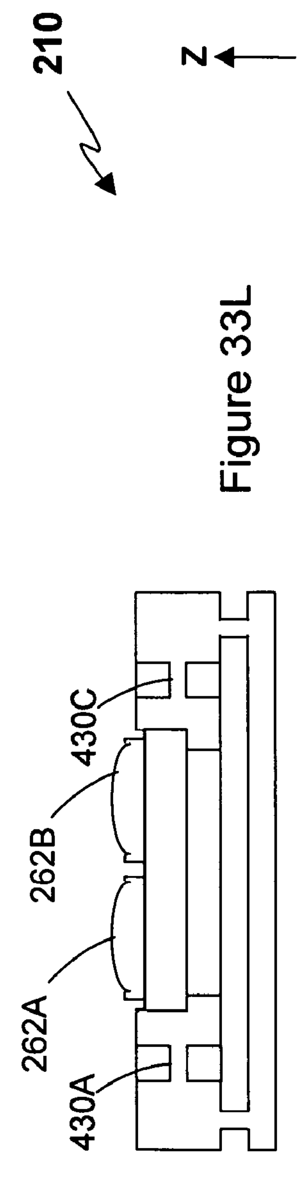
Figure 33M:
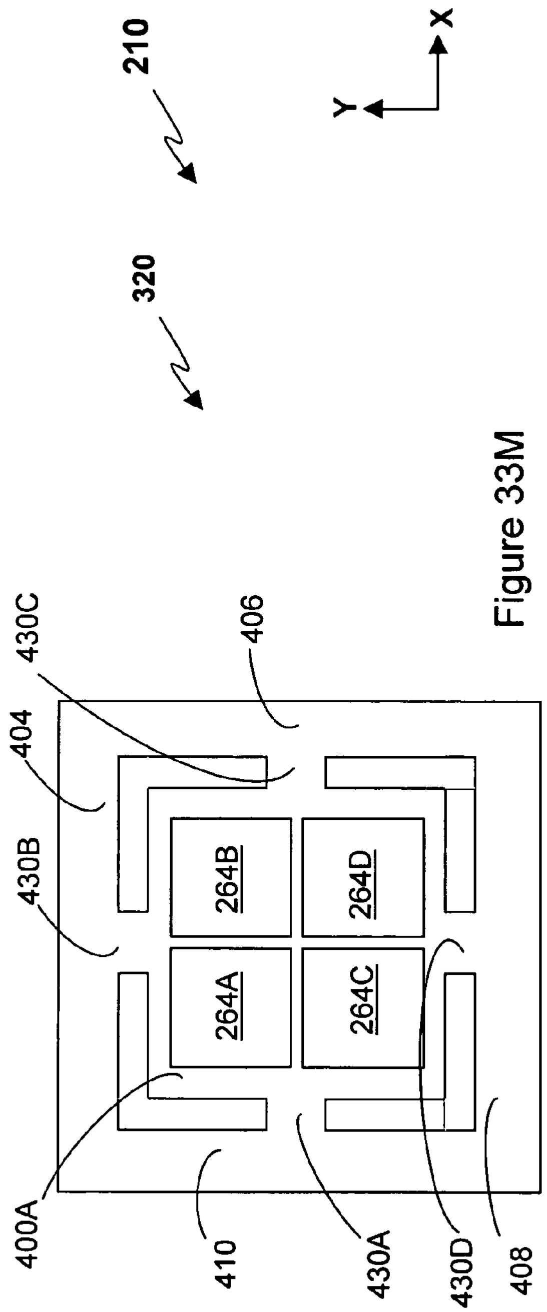
FIGS. 33M-33N are a schematic plan view and a schematic representation, respectively, of sensor portions and a positioner that may be employed in the digital camera apparatus of FIG. 4, with the positioner shown in a first state to provide a first positioning of the sensor portions, in accordance with another aspect of the present invention.
Figure 33N:
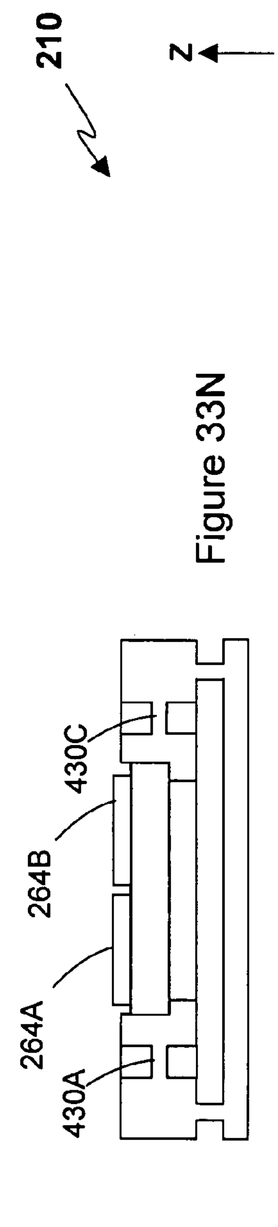
Figure 34A:
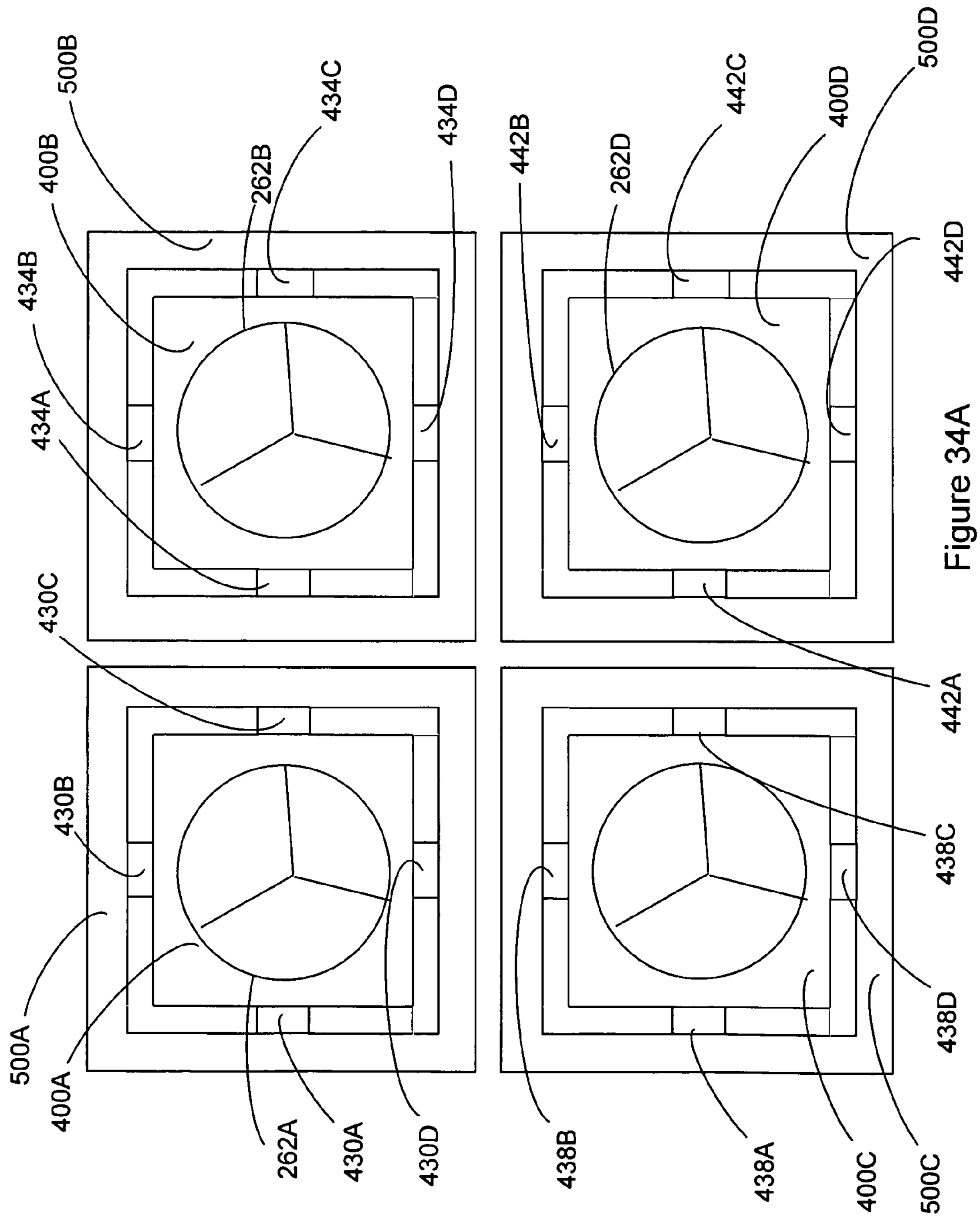
FIGS. 34A-34B are an enlarged schematic plan view and an enlarged schematic representation, respectively, of portions of optics portions and a positioner that may be employed in the digital camera apparatus of FIG. 4, with the positioner shown in a first state to provide a first positioning of the portions of optics portions, in accordance with another aspect of the present invention.
Figure 34B:
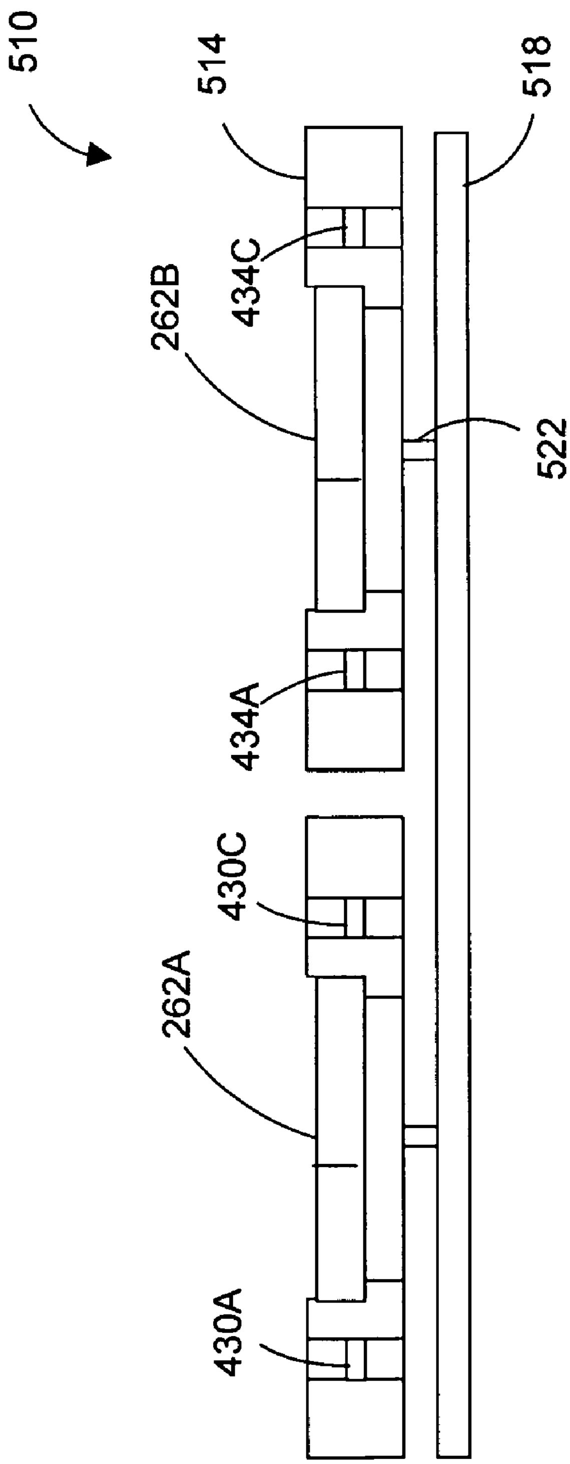
Figure 34C:
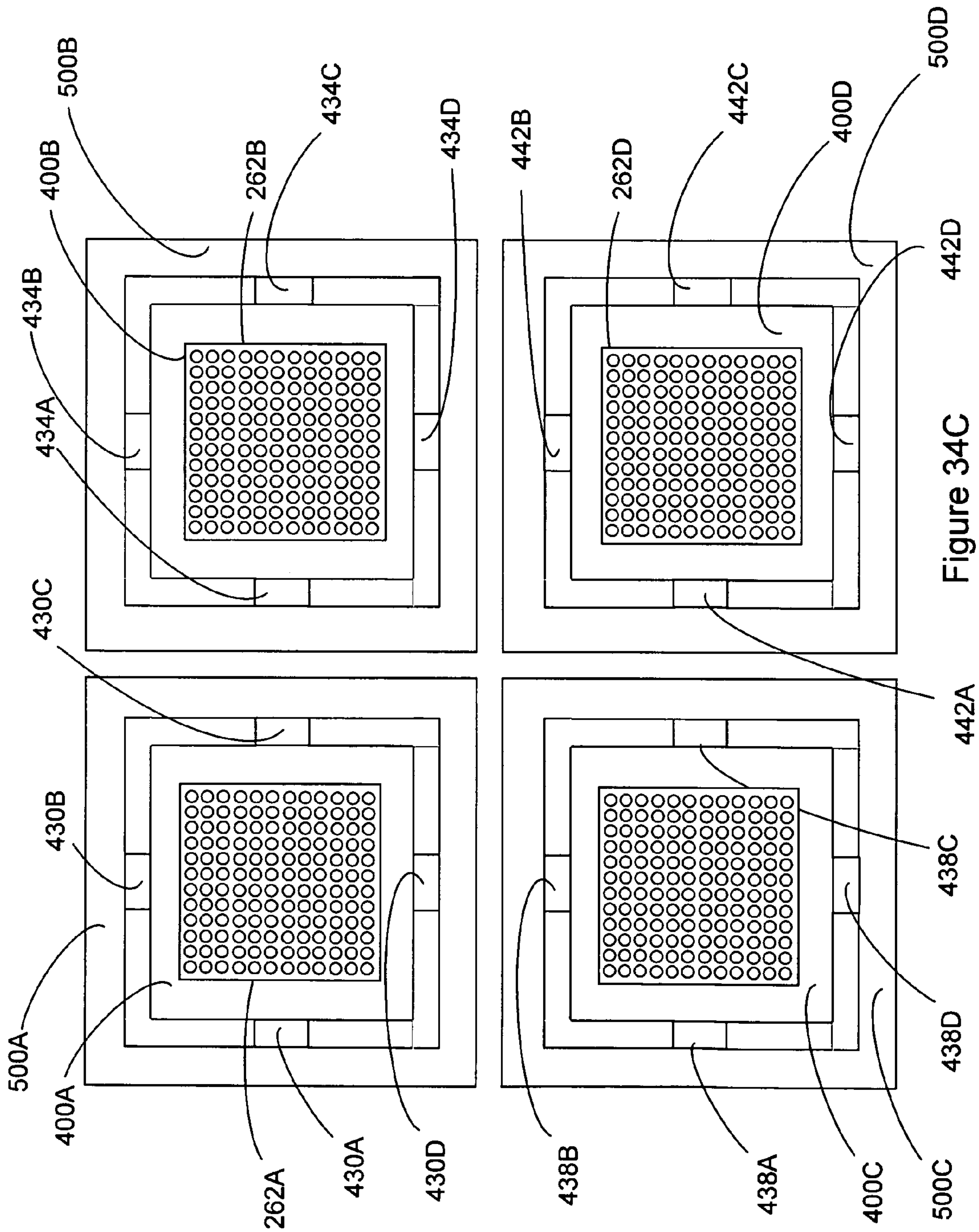
FIGS. 34C-34D are an enlarged schematic plan view and an enlarged schematic representation, respectively, of portions of optics portions and a positioner that may be employed in the digital camera apparatus of FIG. 4, with the positioner shown in a first state to provide a first positioning of the portions of optics portions, in accordance with another aspect of the present invention.
Figure 34D:
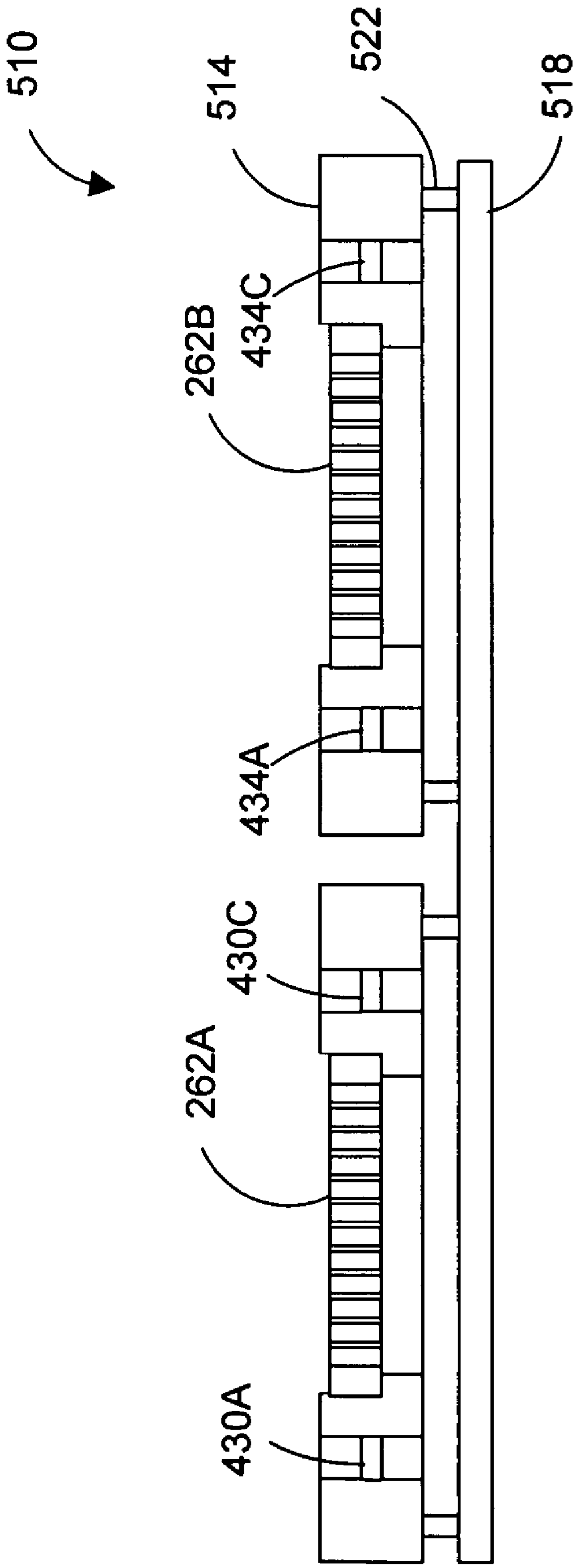
Figure 34E:
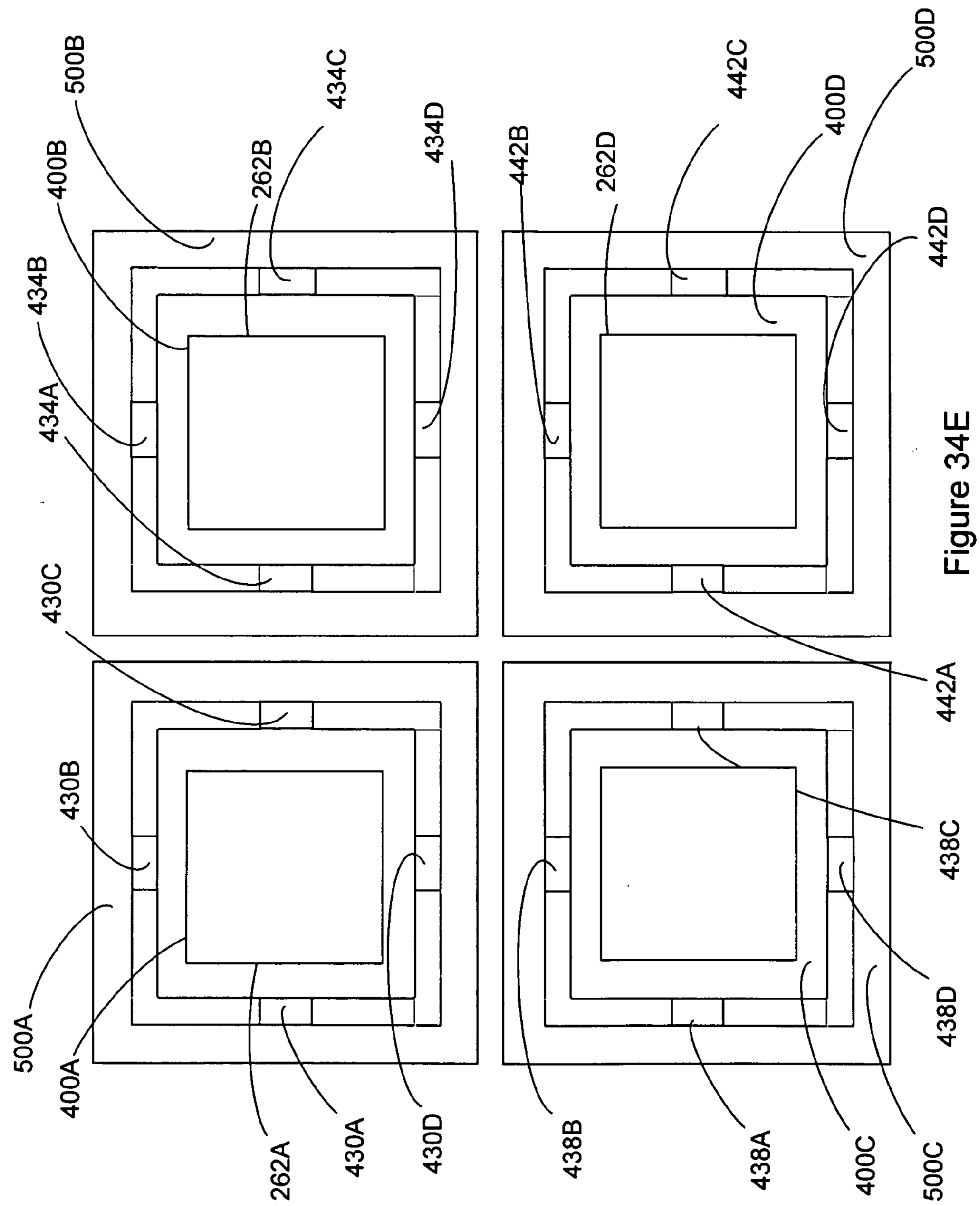
FIGS. 34E-34F are an enlarged schematic plan view and an enlarged schematic representation, respectively, of portions of optics portions and a positioner that may be employed in the digital camera apparatus of FIG. 4, with the positioner shown in a first state to provide a first positioning of the portions of optics portions, in accordance with another aspect of the present invention.
Figure 34F:
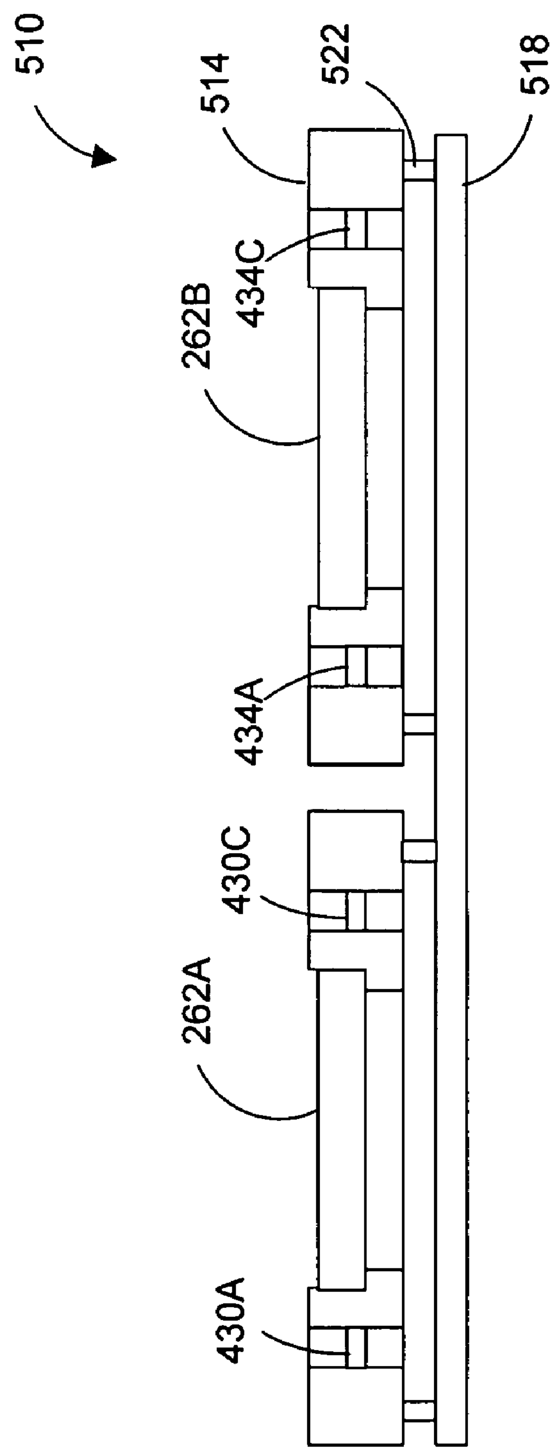
Figure 34G:
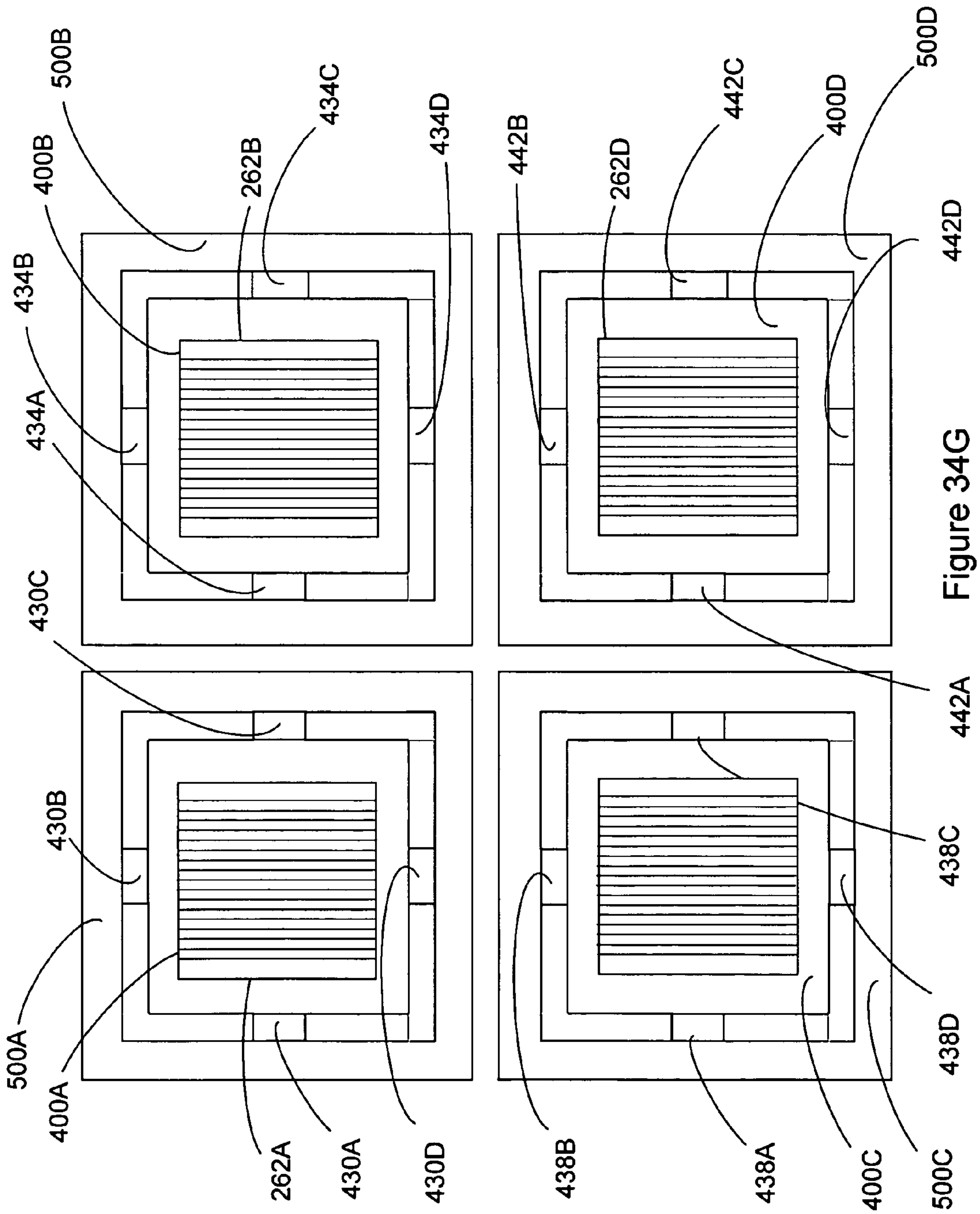
FIGS. 34G-34H are an enlarged schematic plan view and an enlarged schematic representation, respectively, of portions of optics portions and a positioner that may be employed in the digital camera apparatus of FIG. 4, with the positioner shown in a first state to provide a first positioning of the portions of optics portions, in accordance with another aspect of the present invention.
Figure 34H:
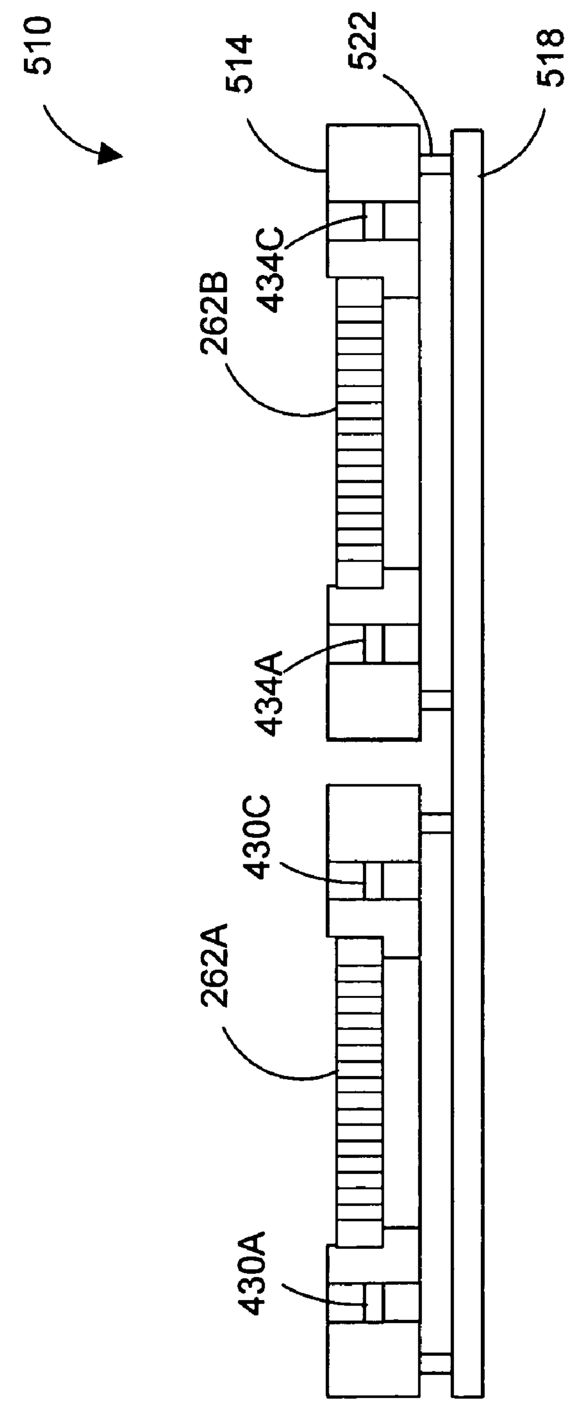
Figure 34I:
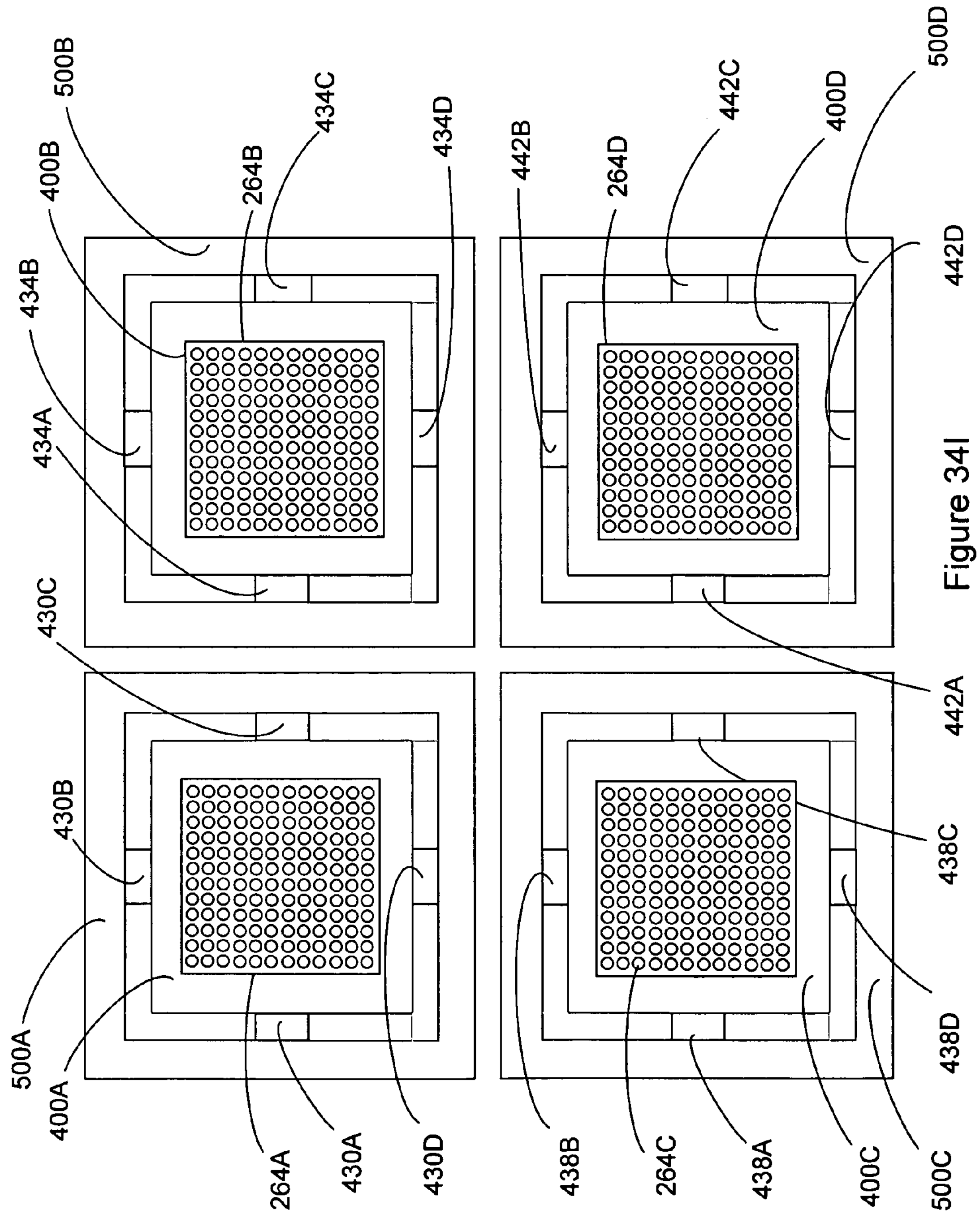
FIGS. 34I-34J are an enlarged schematic plan view and an enlarged schematic representation, respectively, of sensor portions and a positioner that may be employed in the digital camera apparatus of FIG. 4, with the positioner shown in a first state to provide a first positioning of the sensor portions, in accordance with another aspect of the present invention.
Figure 34J:
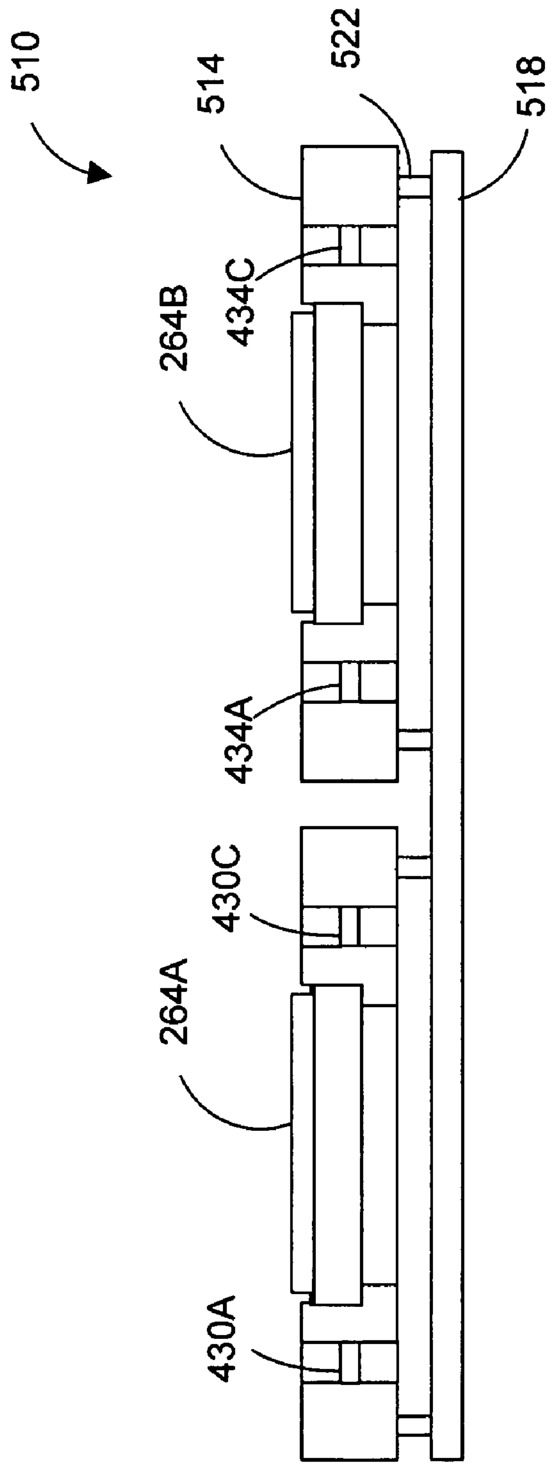
Figure 34K:
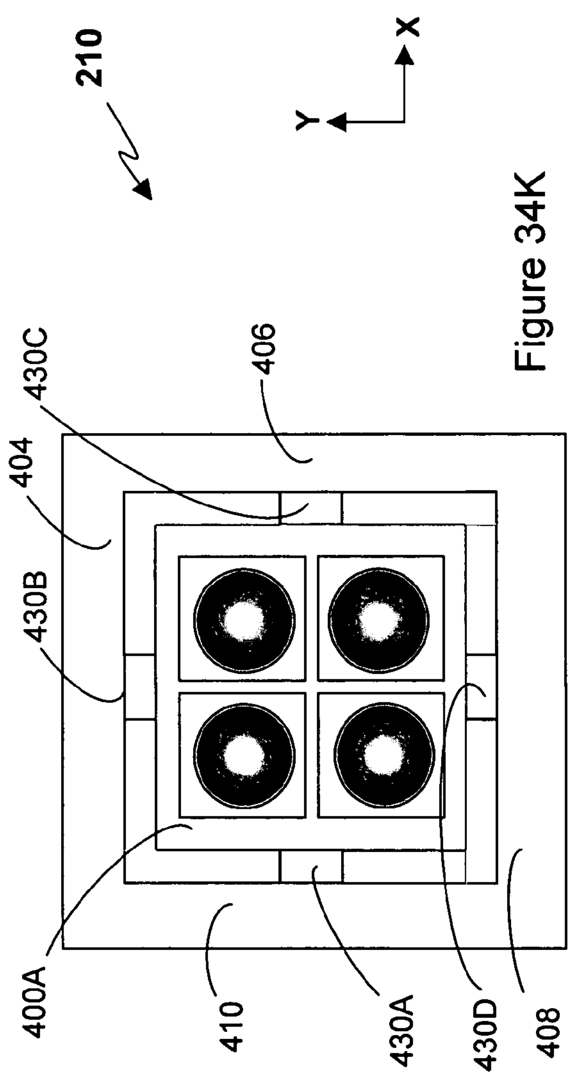
FIGS. 34K-34L are a schematic plan view and a schematic representation, respectively, of optics portions and a positioner that may be employed in the digital camera apparatus of FIG. 4, with the positioner shown in a first state to provide a first positioning of the sensor portions, in accordance with another aspect of the present invention.
Figure 34L:
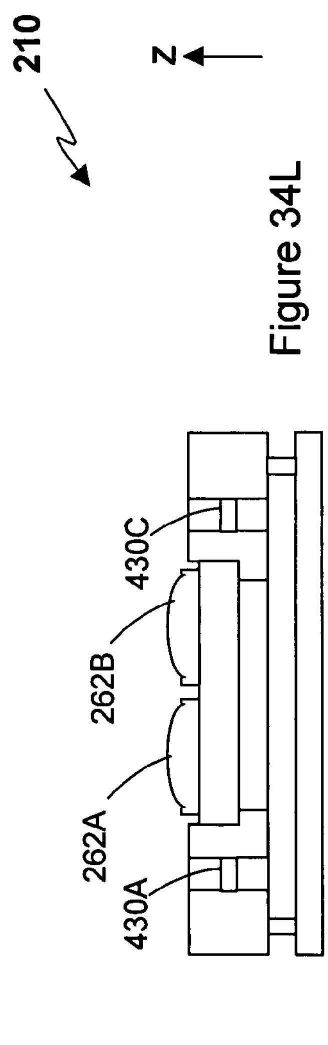
Figure 34M:
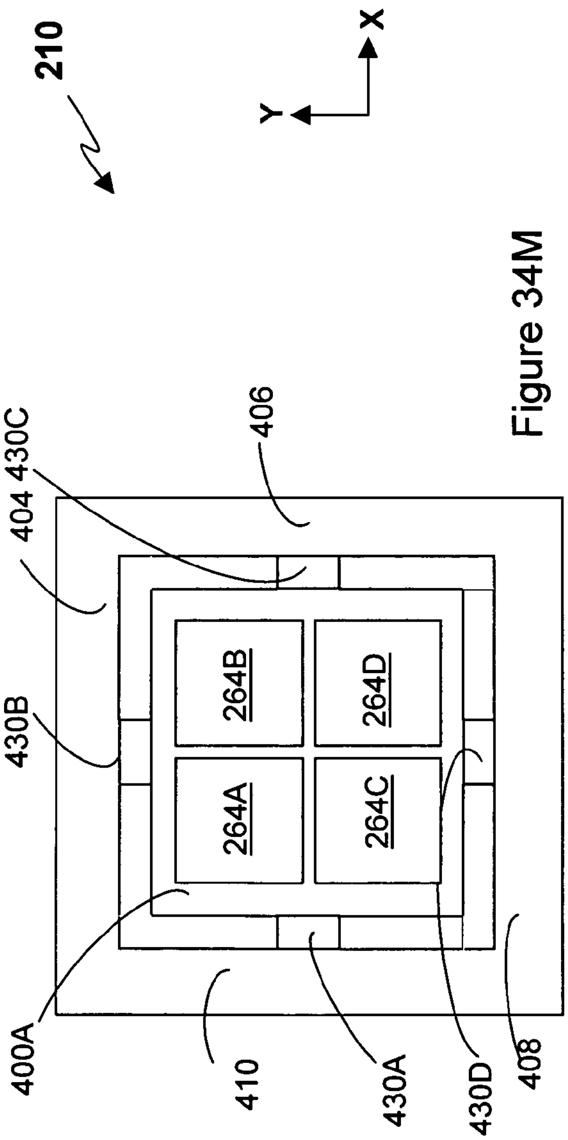
FIGS. 34M-34N are a schematic plan view and a schematic representation, respectively, of sensor portions and a positioner that may be employed in the digital camera apparatus of FIG. 4, with the positioner shown in a first state to provide a first positioning of the sensor portions, in accordance with another aspect of the present invention.
Figure 34N:
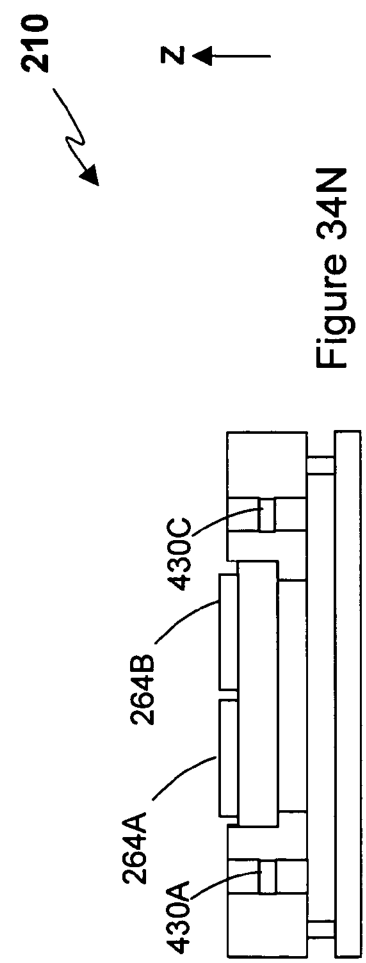

With reference to FIGS. 33G-33H and FIGS. 34G-34H, in some embodiments, one or more of the optics portions, e.g., optics portions 262A-262D, includes one or more masks that are different than the masks shown in FIGS. 33C-33D and the positioner 310 is adapted to receive one or more of such masks and to move one or more of such masks separately from one or more other portions of the optics portions. As shown, the positioner 310 may have a configuration similar to the configuration of the positioner 310 of FIGS. 21A-21D, the positioner 310 of FIGS. 26A-26D and/or the positioner 310 of FIG. 27A-27D, however, the positioner 310 is not limited to such.

Referring to FIGS. 33I-33J and FIGS. 34I-34J, in another aspect, the positioner 320 is adapted to move one or more of the sensor portions, e.g., 264A-264D. In some embodiments of such aspect, the positioner 320 may be adapted to receive one or more of the sensor portions, e.g., sensor portions 264A-264D, and may have, for example, a configuration similar to the positioner 310 of any of FIGS. 15A-15L, 16A-16E, 17A-17I, 18A-18E, 19A-19J, 20A-20D, 21A-21D, 22 and/or the positioner 510 of any of FIGS. 23A-23D, 24A-24D, 25A-25D, 26A-26D, 27A-27D, 28A-28D, 29, 30, 31A-31N, 32A-32P. As shown, the positioner 320 may have a configuration similar to the configuration of the positioner 310 of FIGS. 21A-21D, the positioner 310 of FIGS. 26A-26D and/or the positioner 310 of FIG. 27A-27D, however, the positioner 320 is not limited to such.

Referring to FIGS. 33K-33L and FIGS. 34K-34L, in another aspect, the positioner 310 is adapted to move one or more of the optics, e.g., 262A-262D, as a single group. In this aspect, the positioner 310 may have, for example, one or more features similar to the positioner 310 of any of FIGS. 15A-15L, 16A-16E, 17A-17I, 18A-18E, 19A-19J, 20A-20D, 21A-21D, 22 and/or the positioner 510 of any of FIGS. 23A-23D, 24A-24D, 25A-25D, 26A-26D, 27A-27D, 28A-28D, 29, 30, 31A-31N, 32A-32P. As shown, the positioner 310 may one or more features similar to one or more features of the positioner 310 of FIGS. 21A-21D, the positioner 310 of FIGS. 26A-26D and/or the positioner 310 of FIG. 27A-27D, however, the positioner 310 is not limited to such.

Referring to FIGS. 33M-33N and FIGS. 34M-34N, in another aspect, the positioner 320 is adapted to move one or more of the sensor portions, e.g., 264A-264D, as a single group. In this aspect, the positioner 320 may have, for example, one or more features similar to the positioner 310 of any of FIGS. 15A-15L, 16A-16E, 17A-17I, 18A-18E, 19A-19J, 20A-20D, 21A-21D, 22 and/or the positioner 510 of any of FIGS. 23A-23D, 24A-24D, 25A-25D, 26A-26D, 27A-27D, 28A-28D, 29, 30, 31A-31N, 32A-32P. As shown, the positioner 320 may have one or more features similar to one or more features of the positioner 310 of FIGS. 21A-21D, the positioner 310 of FIGS. 26A-26D and/or the positioner 310 of FIG. 27A-27D, however, the positioner 310 is not limited to such.

Figure 35A:
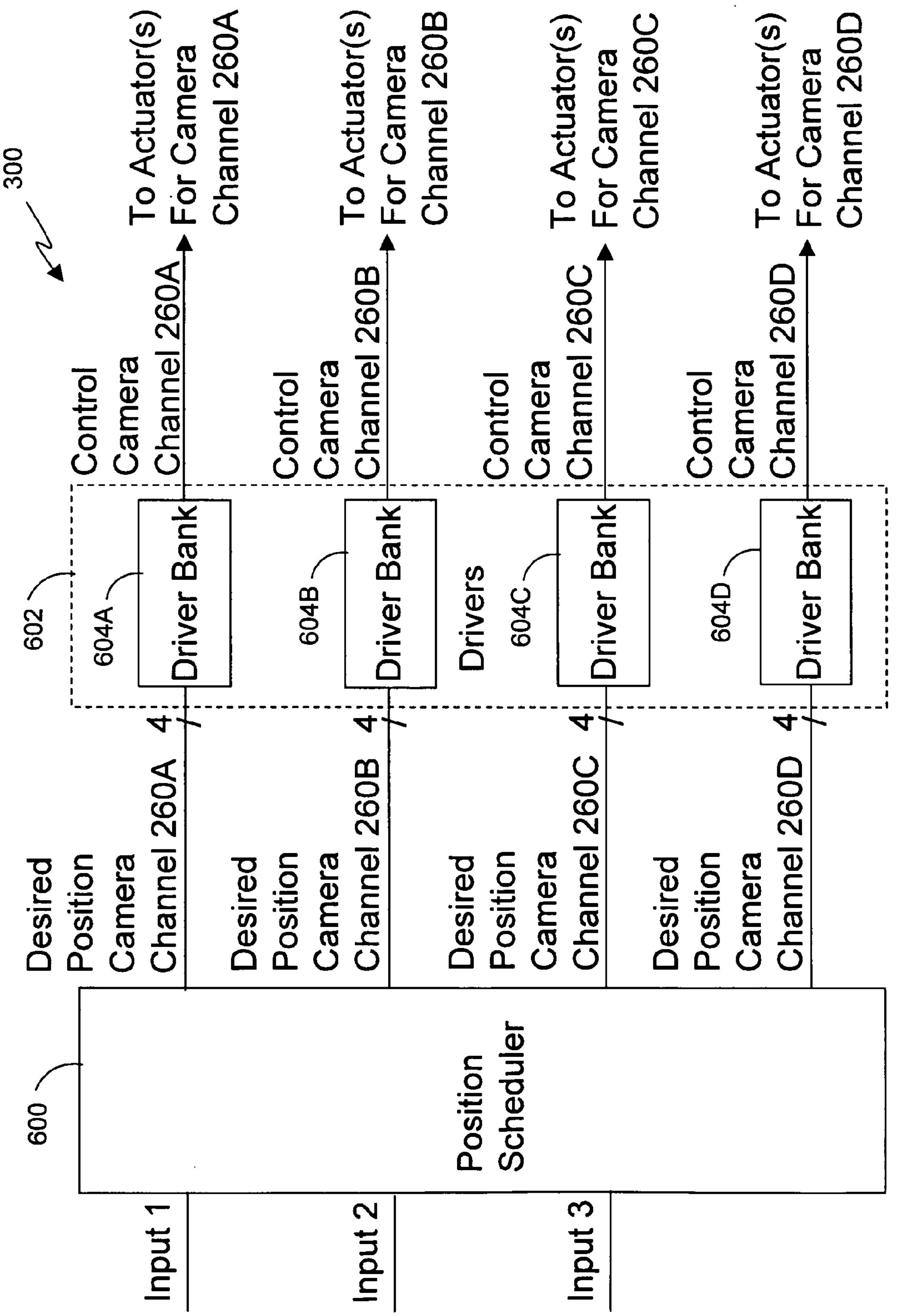
FIG. 35A is a block diagram of one embodiment of a controller that may be employed in the digital camera apparatus of FIG. 4.

FIG. 35A is a block diagram of one embodiment of the controller 300. In this embodiment, the controller 300 includes a position scheduler 600 and one or more drivers 602 to control one or more actuators, e.g., actuators 430A-430D, 434A-434D, 438A-438D, 442A-442D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), that control the positioning and/or relative positioning of one or more of the one or more camera channels, e.g., camera channels 260A-260D, or portions thereof.

The position scheduler 600 receives one or more input signals, e.g., input1, input2, input3, indicative of one or more operating modes desired for one or more of the camera channels, e.g., camera channels 260A-260D, or portions thereof. The position scheduler generates one or more output signals, e.g., desired position camera channel 260A, desired position camera channel 260B, desired position camera channel 260C, desired position camera channel 260D, indicative of the desired positioning and/or relative positioning for the one or more camera channels, e.g., camera channels 260A-260D, or portions thereof. The output signal, desired position camera channel 260A, is indicative of the desired positioning and/or relative positioning for camera channel 260A, or portions thereof. The output signal, desired position camera channel 260B, is indicative of the desired positioning and/or relative positioning for camera channel 260B, or portions thereof. The output signal, desired position camera channel 260C, is indicative of the desired positioning and/or relative positioning for camera channel 260C, or portions thereof. The output signal, desired position camera channel 260D, is indicative of the desired positioning and/or relative positioning for camera channel 260D, or portions thereof.

As described herein, in some embodiments, positioning system 280 provides four actuators for each camera channel, e.g., camera channels 260A-260D. For example, four actuators, e.g., actuators 430A-430D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), may be provided to control the positioning and/or relative positioning of one or more portions of camera channel 260A. Four actuators, e.g., actuators 434A-434D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), may be provided to control the positioning and/or relative positioning of one or more portions of camera channel 260B. Four actuators, e.g., actuators 438A-438D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), may be provided to control the positioning and/or relative positioning of one or more portions of camera channel 260C. Four actuators, e.g., actuators 442A-442D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), may be provided to control the positioning and/or relative positioning of one or more portions of camera channel 260D.

In that regard, in this embodiment, the output signals described above, e.g., desired position camera channel 260A, desired position camera channel 260B, desired position camera channel 260C, desired position camera channel 260D, are each made up of four separate signals, e.g., one for each of the four actuators provided for each camera channel. For example, with reference to FIG. 35 the output signal, desired position camera channel 260A, includes four signals, desired position camera channel 260A actuator A, desired position camera channel 260A actuator B, desired position camera channel 260A actuator C and desired position camera channel 260A actuator D (see for example, FIG. 35I). The output signal, desired position camera channel 260B, includes four signals, e.g., desired position camera channel 260B actuator A, desired position camera channel 260B actuator B, desired position camera channel 260B actuator C and desired position camera channel 260B actuator D (see for example, FIG. 35I). The output signal, desired position camera channel 260C, includes four signals, e.g., desired position camera channel 260C actuator A, desired position camera channel 260C actuator B, desired position camera channel 260C actuator C and desired position camera channel 260C actuator D (see for example, FIG. 35J). The output signal, desired position camera channel 260D, includes four signals, e.g., desired position camera channel 260D actuator A, desired position camera channel 260D actuator B, desired position camera channel 260D actuator C and desired position camera channel 260D actuator D (see for example, FIG. 35J).

The one or more output signals generated by the position scheduler 600 are based at least in part on one or more of the one or more input signals, e.g., input1, input2, input3, and on a position schedule, which includes data indicative of the relationship between the one or more operating modes and the desired positioning and/or relative positioning of the one or more camera channels, e.g., camera channels 260A-260D, or portions thereof. As used herein, an operating mode can be anything having to do with the operation of the digital camera apparatus 210 and/or information (e.g., images) generated thereby, for example, but not limited to, a condition (e.g., lighting), a performance characteristic or setting (e.g., resolution, zoom window, type of image, exposure time of one or more camera channels, relative positioning of one or more channels or portions thereof) and/or a combination thereof. Moreover, an operating mode may have a relationship (or relationships), which may be direct and/or indirect, to a desired positioning or positionings of one or more of the camera channels (or portions thereof) of the digital camera apparatus 210.

The one or more input signals, e.g., input1, input2, input3, may have any form and may be supplied from any source, for example, but not limited to, one or more sources within the processor 265, the user peripheral interface 232 and/or the controller 300 itself. In some embodiments, the peripheral user interface may generate one or more of the input signals, e.g., input1, input2, input3, as an indication of one or more desired operating modes. For example, in some embodiments, the peripheral user interface 232 includes one or more input devices that allow a user to indicate one or more preferences in regard to one or more desired operating modes (e.g., resolution, manual exposure control). In such embodiments, the peripheral user interface 232 may generate one or more signals indicative of such preference(s), which may it turn be supplied to the position scheduler 600 of the controller 300.

In some embodiments, one or more portions of the processor 265 generates one or more of the one or more signals, e.g., input1, input2, input3, as an indication of one or more desired operating modes (e.g., resolution, auto exposure control, parallax, absolute positioning of one or more camera channels or portions thereof, relative positioning of one or more channels or portions thereof, change in absolute or relative positioning of one or more camera channels or portions thereof). In some embodiments, the one or more portions of the processor generates one or more of such signals in response to one or more inputs from the peripheral user interface 232. For example, in some embodiments, one or more signals from the peripheral user interface 232 are supplied to one or more portions of the processor 265, which in turn processes such signals and generates one or more signals to be supplied to the controller 300 to carry out the user's preference or preferences. In some embodiments, the one or more portions of the processor generates one or more of the signals in response to one or more outputs generated within the processor. For example, in some embodiments, one or more portions of the processor 265 generate one or more of the signals in response to one or more images captured by the image processor 265. In some embodiments, the image processor 270 captures one or more images and processes such images to determine one or more operating modes and/or whether a change is needed with respect to one or more operating modes (e.g., whether a desired amount of light is being transmitted to the sensor, and if not, whether the amount of light should be increased or decreased, whether one or more camera channels are providing a desired positioning, and if not, a change desired in the positioning of one or more of the camera channels or portions thereof). The image processor 270 may thereafter generate one or more signals to indicate whether a change is needed with respect to one or more operating modes (e.g., to indicate a desired exposure time and/or a desired positioning and/or a change desired in the positioning of one or more of the camera channels or portions thereof), which may in turn be supplied to the position scheduler 600 of the controller 300.

The one or more drivers 602 may include one or more driver banks, e.g., driver bank 604A, driver bank 604B, driver bank 604C and driver bank 604D. Each of the driver banks, e.g., driver banks 604A-604D, receives one or more of the output signals generated by the position scheduler 600 and generates one or more actuator control signals to control one or more actuators, e.g., actuators 430A-430D, 434A-434D, 438A-438D, 442A-442D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), that control the positioning and/or relative positioning of a respective one of the camera channels, e.g., camera channels 260A-260D, or portions thereof.

In this embodiment, for example, driver bank 604A receives one or more signals that are indicative of a desired positioning and/or relative positioning for camera channel 260A and generates one or more actuator control signals to control one or more actuators, e.g., actuators 430A-430D (FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P) that control the positioning and/or relative positioning of one or more portions of optics portion 262A and/or one or more portions of sensor portion 264A, of camera channel 260 A, or portions thereof.

Driver bank 604B receives one or more signals that are indicative of a desired positioning and/or relative positioning for camera channel 260B and generates one or more actuator control signals to control one or more actuators, e.g., actuators 434A-434D (FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), that control the positioning and/or relative positioning of one or more portions of optics portion 262B, and/or one or more portions of sensor portion 264B, of a camera channel B, e.g., camera channel 260B.

Driver bank 604C receives one or more signals that are indicative of a desired positioning and/or relative positioning for camera channel 260C and generates one or more actuator control signals to control one or more actuators, e.g., actuators 438A-438D (FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), that control the relative positioning of one or more portions of optics portion 262C and/or one or more portions of sensor portion 264C of camera channel 260C, or portions thereof.

Driver bank 604D receives one or more signals that are indicative of a desired positioning and/or relative positioning for camera channel 260D and generates one or more actuator control signals to control one or more actuators, e.g., actuators 442A-442D (FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), that control the relative positioning of one or more portions of optics portion 262D and/or one or more portions of sensor portion 264D of camera channel 260D, or portions thereof.

As stated above, in this embodiment, the position scheduler 600 employs a position schedule that comprises a mapping of a relationship between the one or more operating modes and the desired positioning and/or relative positioning of the one or more camera channels, e.g., camera channels 260A-260D, or portions thereof. The mapping may be predetermined or adaptively determined. The mapping may have any of various forms known to those skilled in the art, for example, but not limited to, a look-up table, a "curve read", a formula, hard-wired logic, fuzzy logic, neural networks, and/or any combination thereof. The mapping may be embodied in any form, for example, software, hardware, firmware or any combination thereof.

FIG. 35B shows a representation of one embodiment of the position schedule 606 of the position scheduler 600. In this embodiment, the position schedule 606 of the position scheduler 600 is in the form of a look-up table. The look up table includes data indicative of the relationship between one or more operating modes desired for one or more camera channels, e.g., camera channels 260A-260D, and a positioning or positionings desired for the one or more camera channels, or portions thereof, to provide or help provide such operating mode. The look-up table comprises a plurality of entries, e.g., entries 608*a*-608*h*. Each entry indicates the logic states to be generated for the one or more output signals if a particular operating mode is desired. For example, the first entry 608*a* in the look-up table specifies that if one or more of the input signals indicate that a normal operating mode is desired, then each of the outputs signals will have a value corresponding to a 0 logic state, which in this embodiment, causes a positioning desired for the normal operating mode. The second entry 608*b* in the look-up table specifies that if one or more of the input signals indicate that a 2× resolution operating mode is desired, then each of the actuator A output signals, i.e., desired position camera channel 260A actuator A, desired position camera channel 260B actuator A, desired position camera channel 260C actuator A, desired position camera channel 260D actuator A, will have a value corresponding to a 1 logic state, and all of the other outputs will have a value corresponding to a 0 logic state, which in this embodiment, causes a positioning desired for the 2× resolution operating mode.

It should also be recognized that the makeup of the look-up table may depend on the configuration of the rest of the positioning system 280, for example, the drivers and the actuators. It should also be recognized that a look-up table may have many forms including but not limited to a programmable read only memory (PROM).

It should also be understood that the look-up table could be replaced by a programmable logic array (PLA) and/or hard-wired logic.

Figure 35C:
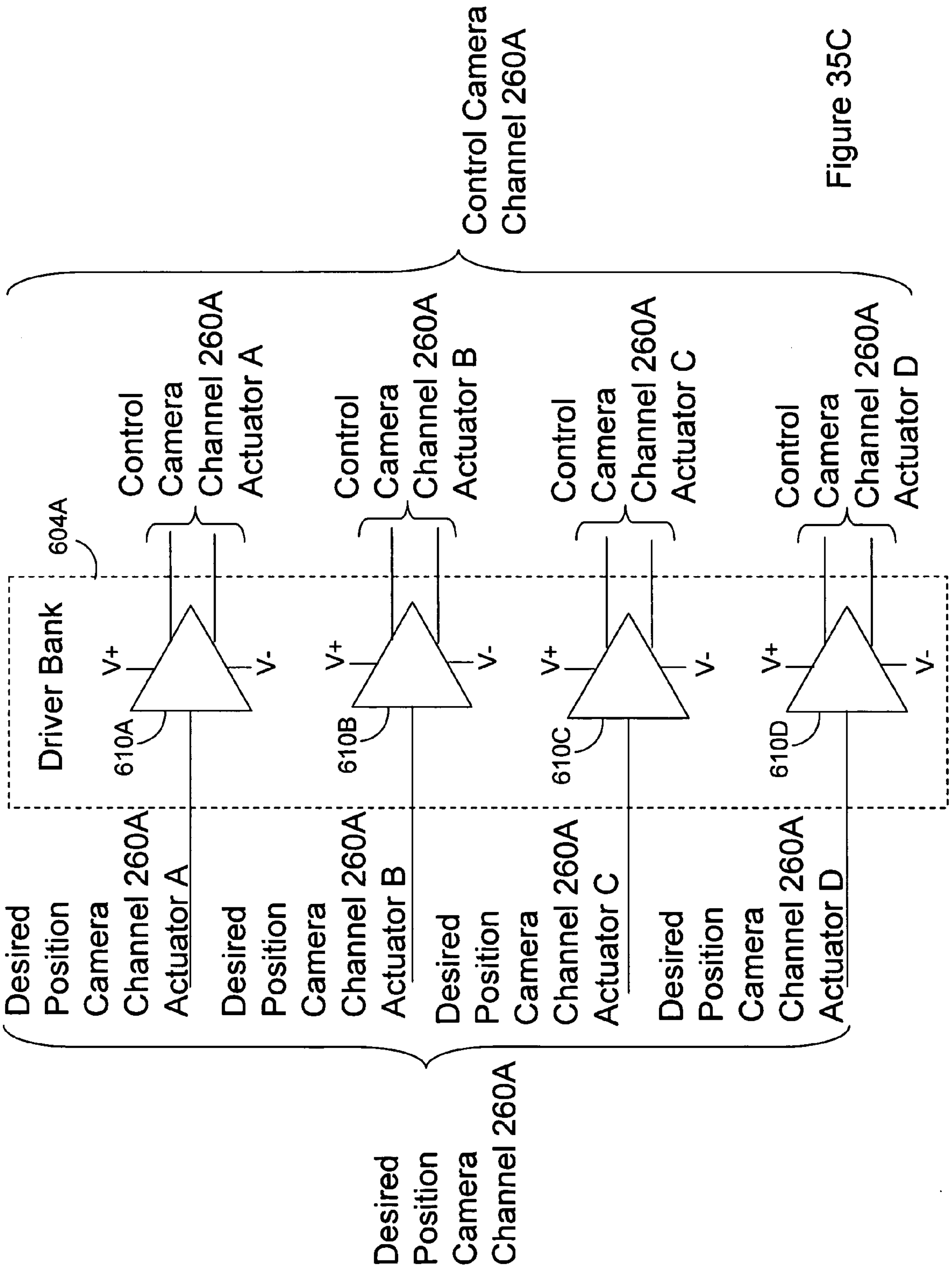
FIG. 35C is a schematic diagram of one embodiment of a driver bank that may be employed by the controller of FIG. 35A.

FIG. 35C shows one embodiment of one of the driver banks, e.g., driver bank 604A. In this embodiment, the driver bank, e.g., driver bank 604A, comprises a plurality of drivers, e.g., drivers 610A-610D, that receive output signals generated by the position scheduler 600 and generate actuator control signals to control actuators, e.g., actuators 430A-430D, 434A-434D, 438A-438D, 442A-442D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), that control the positioning and/or relative positioning of camera channel 260A-260D, or portions thereof. For example, the first driver 610A has an input that receives the input signal, desired position camera channel 260A actuator A, and an output that provides an output signal, control camera channel 260A actuator A. The second driver 610B has an input that receives the input signal, desired position camera channel 260A actuator B, and an output that provides an output signal, control camera channel 260A actuator B. The third driver 610C has an input that receives the input signal, desired position camera channel 260A actuator C, and an output that provides an output signal, control camera channel 260A actuator C. The fourth driver 610D has an input that receives the input signal, desired position camera channel 260A actuator D, and an output that provides an output signal, control camera channel 260A actuator D.

It should be understood that although each of the input signals are shown supplied on a single signal line, each of the input signals may have any form including for example but not limited to, a single ended digital signal, a differential digital signal, a single ended analog signal and/or a differential analog signal. In addition, it should be understood that although each of the output signals are shown as a differential signal, the output signals may have any form including for example but not limited to, a single ended digital signal, a differential digital signal, a single ended analog signal and/or a differential analog signal.

First and second supply voltage, e.g., V+, V−, are supplied to first and second power supply inputs, respectively, of each of the drivers 610A-610D.

In this embodiment, the output signal control channel A actuator A is supplied to one of the contacts of actuator 430A. The output signal control channel A actuator B is supplied to one of the contacts of actuator 430B. The output signal control channel A actuator C is supplied to one of the contacts of actuator 430C. The output signal control channel A actuator D is supplied to one of the contacts of actuator 430D.

The operation of this embodiment of the driver bank 604A is now described. If the input signal, desired position camera channel 260A actuator A, supplied to driver 610A has a first logic state (e.g., a logic low state or "0"), then the output signal, control camera channel 260A actuator A, generated by driver 610A has a first magnitude (e.g., approximately equal to V−), which results in a first state (e.g., not actuated) for actuator A of camera channel 260A, e.g., actuator 430A (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P). If the input signal, desired position camera channel 260A actuator A, supplied to driver 610A has a second logic state (e.g., a logic high state or "1"), then the output signal control camera channel 260A actuator A, generated by driver 610A has a magnitude (e.g., approximately equal to V+) adapted to drive actuator A, for camera channel 260A, e.g., actuator 430A (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), into a second state (e.g., fully actuated).

In this embodiment, the other drivers 610B-610D operate in a manner that is similar or identical to driver 610A. For example, if the input signal, desired position camera channel 260A actuator B, supplied to driver 610B has a first logic state (e.g., a logic low state or "0"), then the output signal, control camera channel 260A actuator B, generated by driver 610B has a first magnitude (e.g., approximately equal to V−), which results in a first state (e.g., not actuated) for actuator B of camera channel 260A, e.g., actuator 430B (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P). If the input signal, desired position camera channel 260A actuator B, supplied to driver 610B has a second logic state (e.g., a logic high state or "1"), then the output signal control camera channel 260A actuator B, generated by driver 610B has a magnitude (e.g., approximately equal to V+) adapted to drive actuator B, for camera channel 260A, e.g., actuator 430B (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), into a second state (e.g., fully actuated).

Similarly, if the input signal, desired position camera channel 260A actuator C, supplied to driver 610C has a first logic state (e.g., a logic low state or "0"), then the output signal, control camera channel 260A actuator C, generated by driver 610C has a first magnitude (e.g., approximately equal to V−), which results in a first state (e.g., not actuated) for actuator C of camera channel 260A, e.g., actuator 430C (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P). If the input signal, desired position camera channel 260A actuator C, supplied to driver 610C has a second logic state (e.g., a logic high state or "1"), then the output signal control camera channel 260A actuator C, generated by driver 610C has a magnitude (e.g., approximately equal to V+) adapted to drive actuator C, for camera channel 260A, e.g., actuator 430C (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), into a second state (e.g., fully actuated).

Likewise, if the input signal, desired position camera channel 260A actuator D, supplied to driver 610D has a first logic state (e.g., a logic low state or "0"), then the output signal, control camera channel 260A actuator D, generated by driver 610D has a first magnitude (e.g., approximately equal to V−), which results in a first state (e.g., not actuated) for actuator D of camera channel 260A, e.g., actuator 430D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P). If the input signal, desired position camera channel 260A actuator D, supplied to driver 610D has a second logic state (e.g., a logic high state or "1"), then the output signal control camera channel 260A actuator D, generated by driver 610D has a magnitude (e.g., approximately equal to V+) adapted to drive actuator D, for camera channel 260A, e.g., actuator 430D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), into a second state (e.g., fully actuated).

In this embodiment, the other driver banks, i.e., driver bank 604B, driver bank 604C and driver bank 604D are configured similar or identical to driver bank 604A and operate in a manner that is similar or identical to driver bank 604A.

Because the drive described above is either "on" or "off" such drive can be characterized as a binary drive (i.e., the drive is one of two magnitudes). In a binary drive system, it may be advantageous to provide a power supply voltage V+ having a magnitude that provides the desired amount of movement when the V+ signal (minus any voltage drops) is supplied to the actuators.

Notwithstanding the above, it should be understood that the present invention is not limited to such type of drive (i.e., binary drive) and/or drive voltages of such magnitudes. For example, in some other embodiments, more than two discrete levels of drive and/or an analog type of drive may be employed.

Moreover, although an embodiment has been shown in which the asserted logic state is a high logic state (e.g., "1"), it should be understood that in some embodiments, the asserted logic state for one or more signals may be the low logic state (e.g., "0"). In addition, although an embodiment has been shown in which the drivers 610A-610D provide a magnitude of approximately V+ in order to drive an actuator into a second state (e.g., fully actuated), in some embodiments, the drivers 610A-610D may provide another magnitude, e.g., 0 volts or approximately V−, in order to drive an actuator into the second state (e.g., fully actuated).

Figure 35D:
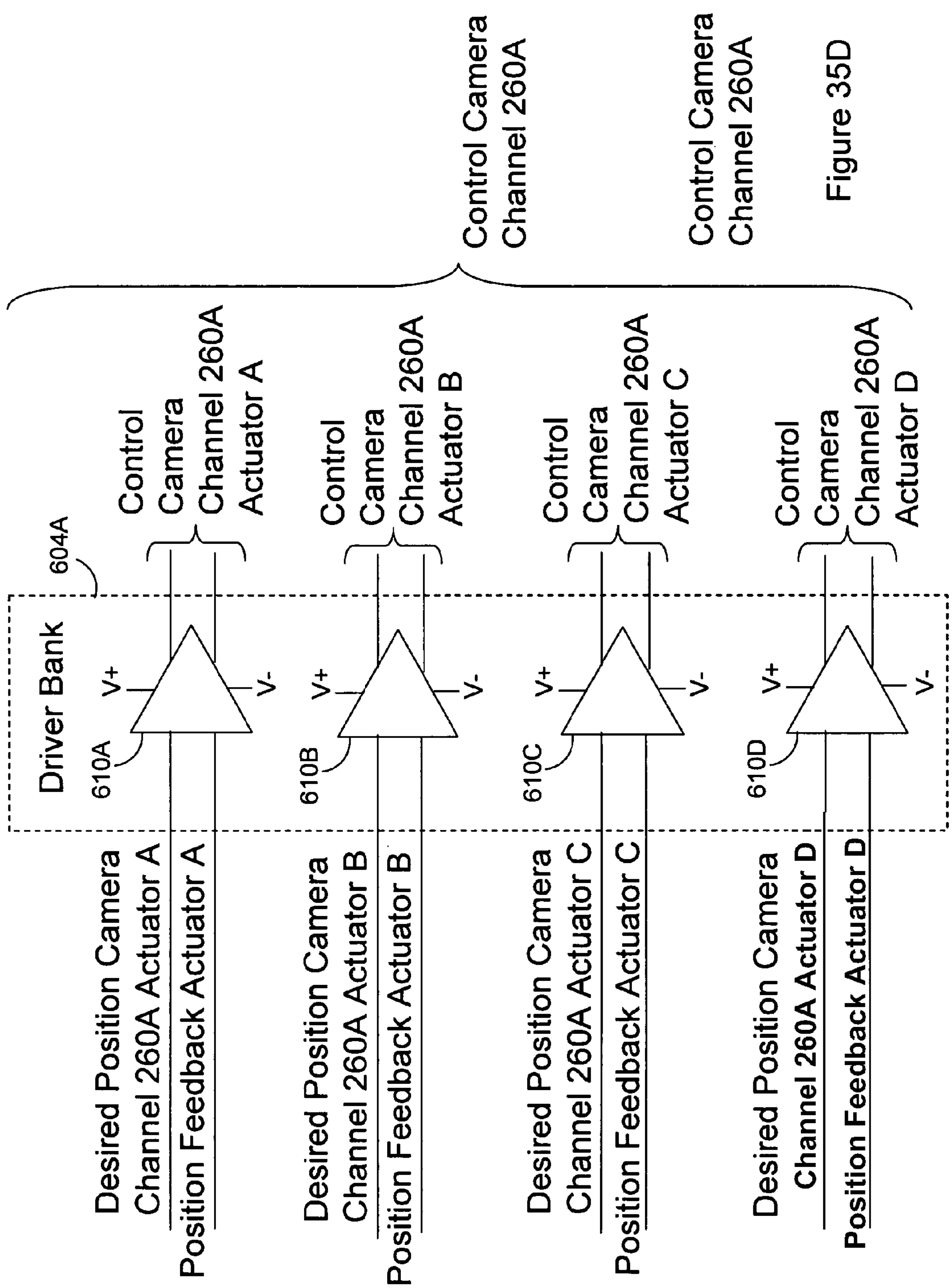
FIG. 35D is a block diagram of another embodiment of a driver bank that may be employed by the controller of FIG. 35A.

FIG. 35D shows another embodiment of a driver bank, e.g., driver bank 604A. In this embodiment, the driver bank, e.g., driver bank 604A is supplied with one or more position feedback signals, e.g., position feedback actuator A, position feedback actuator B, position feedback actuator C, position feedback actuator D, indicative of the positioning and/or relative positioning of one or more portions of an associated camera channel, e.g., camera channel 260A. In such embodiment, the driver bank, e.g., driver bank 604A, may adjust the magnitude of its output signals so as to cause the sensed positioning and/or relative positioning to correspond to the desired positioning and/or relative positioning.

Figure 35E:
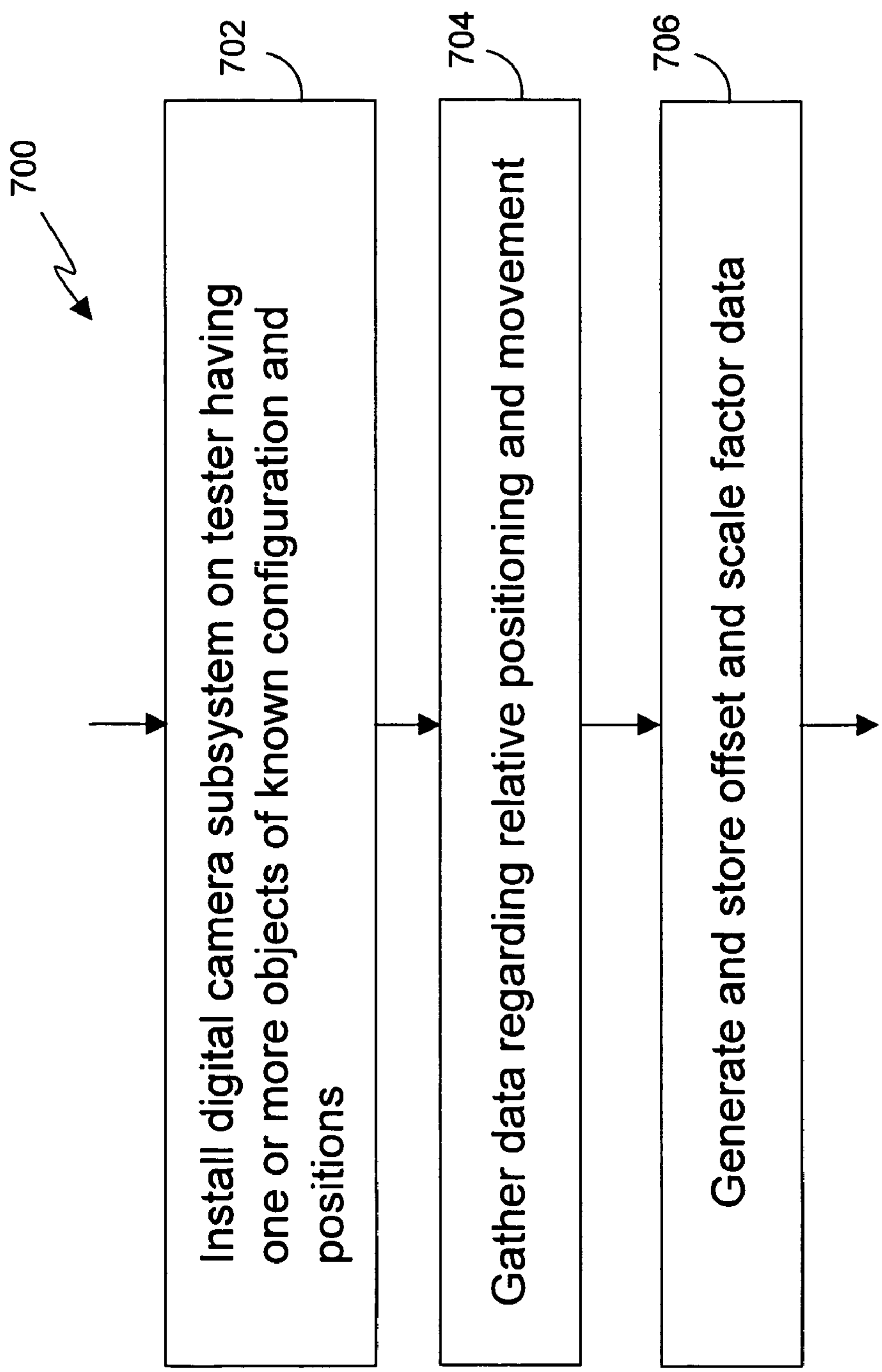
FIG. 35E is a flowchart of steps employed in one embodiment in generating a mapping for the position scheduler of FIG. 35A and/or to calibrate the positioning system of the digital camera apparatus of FIG. 4.

FIG. 35E shows a flowchart 700 of steps that may be employed in generating a mapping for the position scheduler 600 and/or in calibrating the positioning system 280. In this embodiment, the mapping or calibration is performed prior to use of the digital camera apparatus 210. At a step 702, the digital camera apparatus 210 is installed on a tester that provides one or more objects of known configuration and positioning. In some embodiments, the one or more objects includes an object defining one or more interference patterns.

At a step 704, an image of the interference pattern is captured from one or more of the camera channels, without stimulation of any of the actuators in the positioning system. Thereafter, each of the actuators in the positioning system 280 is provided with a stimulus, e.g., a stimulus having a magnitude selected to result in maximum (or near maximum) movement of the actuators. Another image of the interference pattern is then captured from the one or more camera channels.

At a step 706, an offset and a scale factor are determined based on the data gathered on the tester. In some embodiments, the offset and scale factor are used to select one or more of the power supply voltages V+, V− that are supplied to the driver banks. If desired, the offset and scale factor may be stored in one or more memory locations within the digital camera apparatus 210 for subsequent retrieval. As stated above, if the drive is a binary drive, then it may be advantageous to provide a power supply voltage V+ having a magnitude that provides the desired amount of movement when the V+ signal (minus any voltage drops) is supplied to the actuators, although this is not required.

If the drive employs more than two discrete levels of drive and/or an analog drive, it may be advantageous to gather data for various levels of drive (i.e., stimulus) within a range of interest, and to thereafter generate a mapping that characterizes the relationship (e.g., scale factor) between drive and actuation (e.g., movement) at various points within the range of interest. If the relationship is not linear, it may be advantageous to employ a piecewise linear mapping.

In some embodiments, one piecewise linear mapping is employed for an entire production run. In such embodiments, the piecewise linear mapping is stored in the memory of each digital camera apparatus. A particular digital camera apparatus may thereafter be calibrated by performing a single point calibration and generating a correction factor which in combination with the piecewise linear mapping, sufficiently characterizes the relationship between drive (e.g., stimulus) and movement (or positioning) provided the actuators.

Figure 35F:
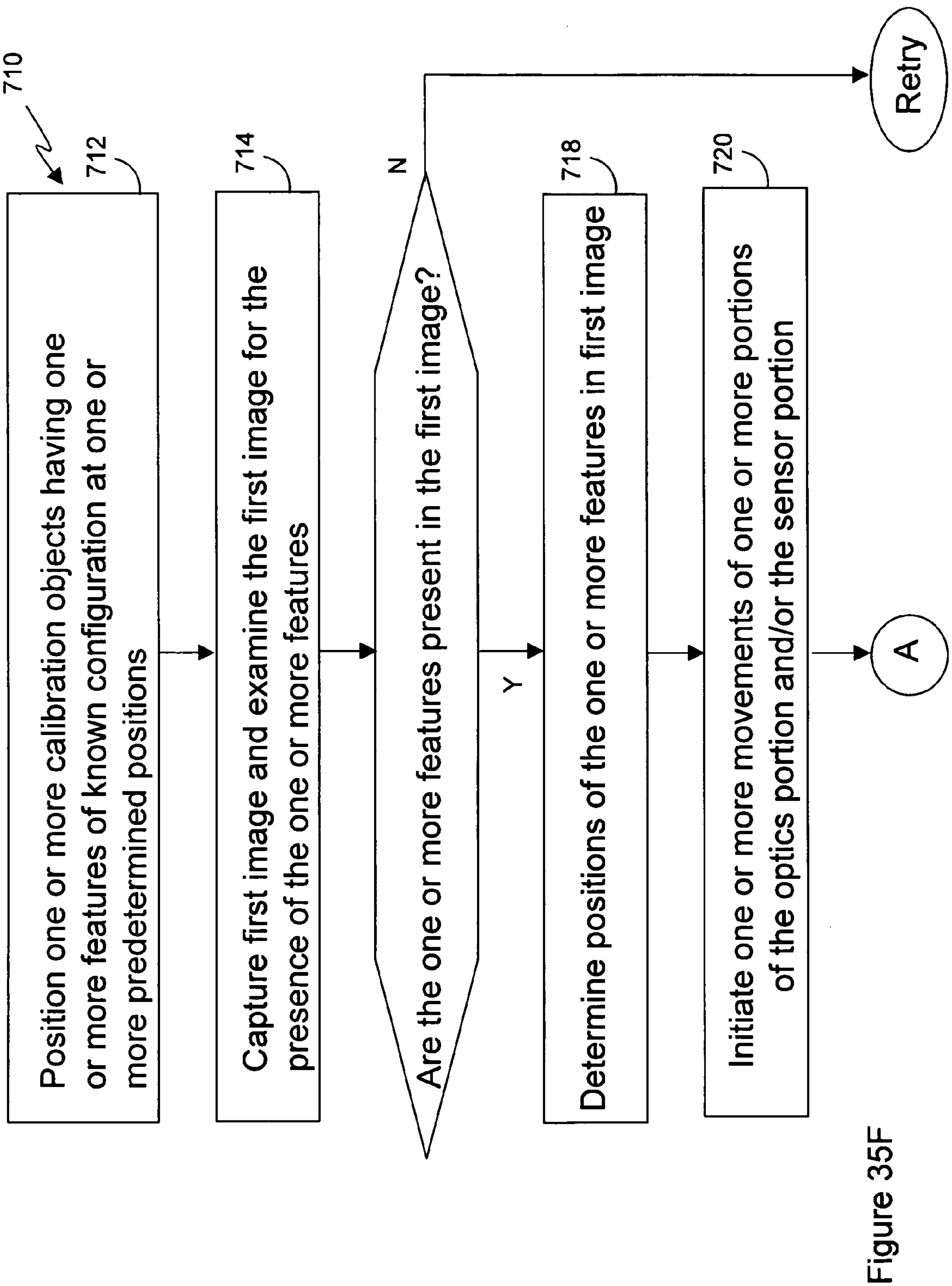
FIGS. 35F-35H is a flowchart of steps employed in one embodiment in generating a mapping for the position scheduler of FIG. 35A and/or to calibrate the positioning system of the digital camera apparatus of FIG. 4.
Figure 35G:
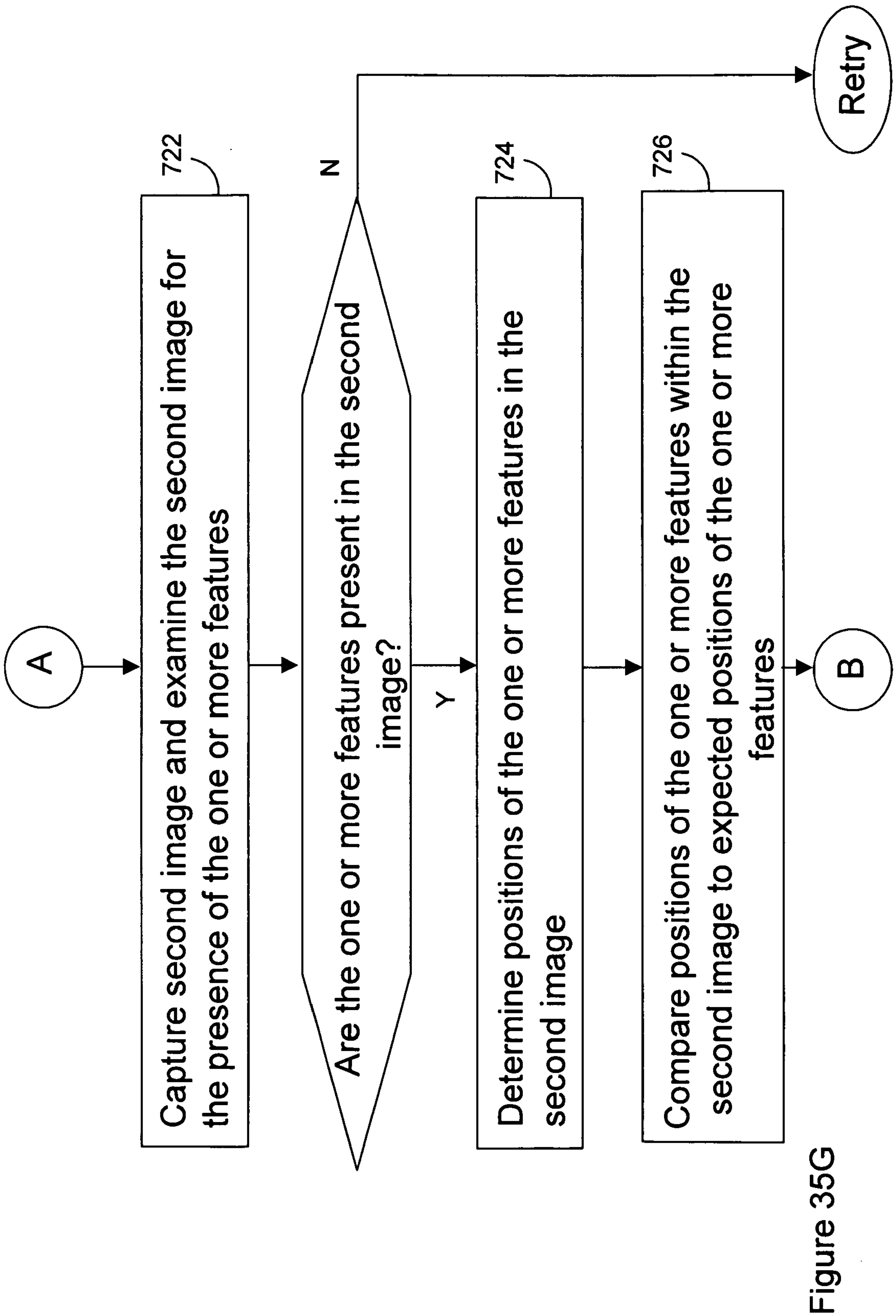
Figure 35H:
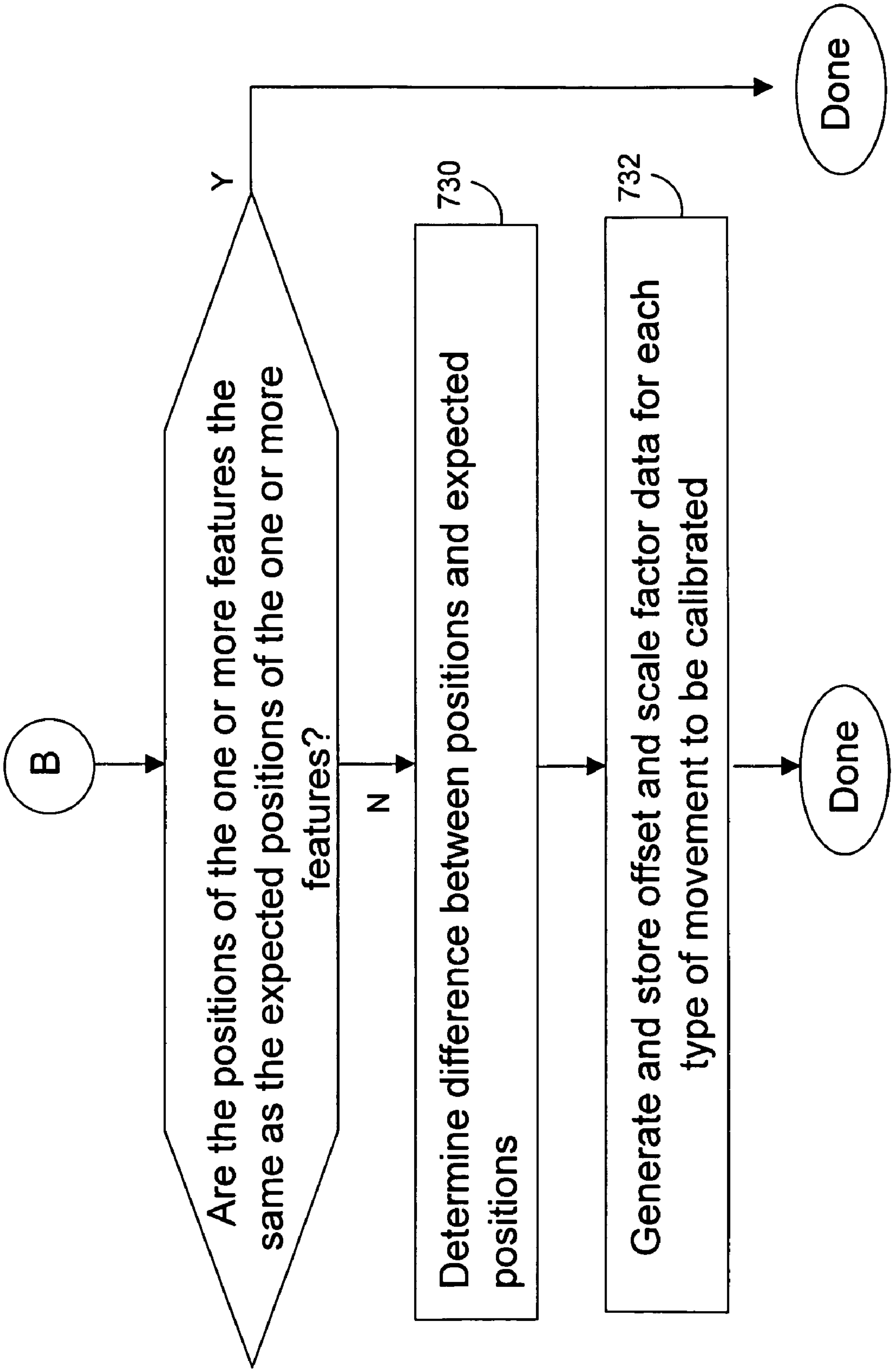
Figure 35I:
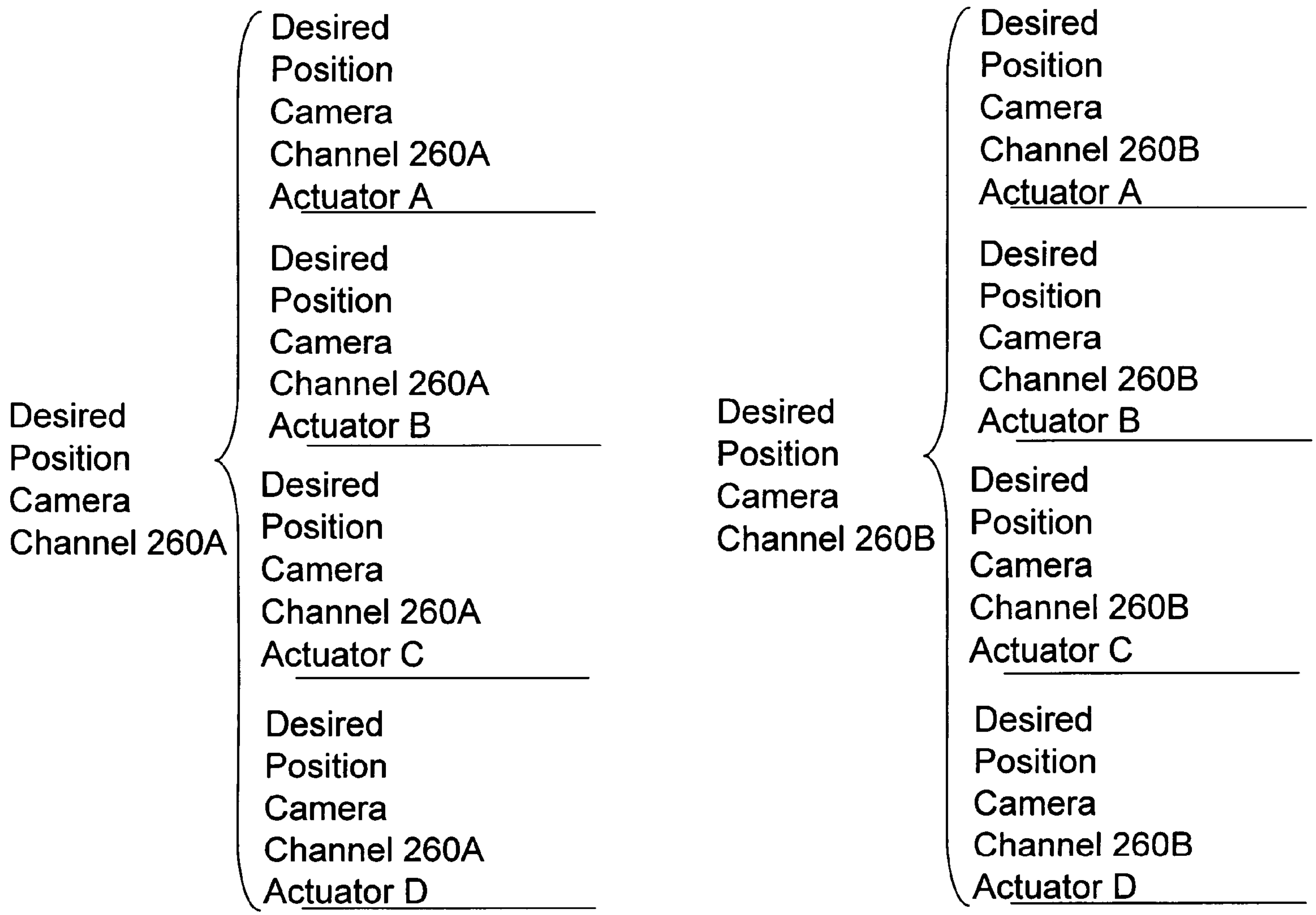
FIGS. 35I-35J is a schematic of signals employed in one embodiment of the controller of FIG. 35A.
Figure 35J:
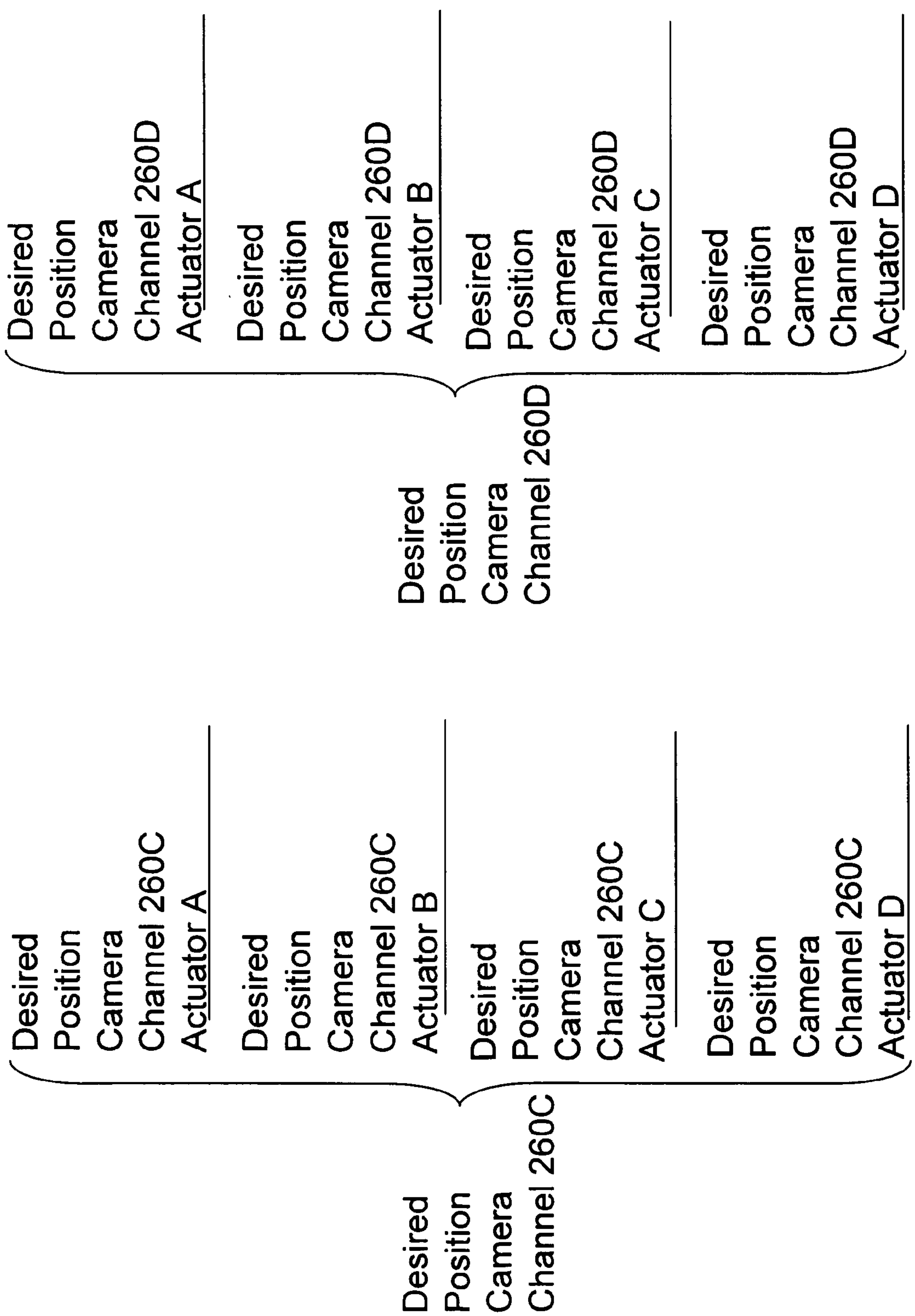

FIGS. 35F-35H show a flowchart 710 of steps that may be employed in some embodiments in calibrating the positioning system to help the positioning system provide the desired movements with a desired degree of accuracy. At a step 712, one or more calibration objects having one or more features of known size(s), shape(s), and/or color(s) are positioned at one or more predetermined positions within the field of view of the digital camera apparatus.

At a step 714, an image is captured and examined for the presence of the one or more features. If the features are present, the position(s) of such features within the first image are determined at a step 718. At a step 720, one or more movements of one or more portions of the optics portion and/or sensor portion are initiated. The one or more movements may be, for example, movement(s) in the x direction, y direction, z direction, tilting, rotation and/or any combination thereof.

At a step 722, a second image is captured and examined for the presence of the one or more features. If the features are present, the position(s) of such features within the second image are determined at a step 724.

At a step 726, the positions of the features within the second image are compared to one or more expected positions, i.e., the position(s), within the second image, at which the features would be expected to appear based on the positioning of the one or more calibration objects within the field of view and/or the first image and the expected effect of the one or more movements initiated by the position system.

If the position(s) within the second image are not the same as the expected position(s), the system determines the difference in position at a step 730. The difference in position may be, for example, a vector, represented, for example, as multiple components (e.g., an x direction component and a y direction component) and/or as a magnitude component and a direction component.

The above steps may be performed twice for each type of movement to be calibrated to help generate gain and offset data for each such type of movement.

At a step 732, the system stores data indicative of the gain and offset or each type of movement to be calibrated.

The steps set forth above may be performed, for example, during manufacture and/or test of digital camera apparatus and/or the digital camera. Thereafter, the stored data may be used in initiating any calibrated movements.

The controller 300 may be any kind of controller. For example, the controller may be programmable or non programmable, general purpose or special purpose, dedicated or non dedicated, distributed or non distributed, shared or not shared, and/or any combination thereof. A controller may include, for example, but is not limited to, hardware, software, firmware, hardwired circuits and/or any combination thereof. The controller 300 may or may not execute one or more computer programs that have one or more subroutines, or modules, each of which may include a plurality of instructions, and may or may not perform tasks in addition to those described herein. In some embodiments, the controller 300 comprises at least one processing unit connected to a memory system via an interconnection mechanism (e.g., a data bus). If the controller 300 executes one or more computer programs, the one or more computer programs may be implemented as a computer program product tangibly embodied in a machine-readable storage medium or device for execution by a computer. Further, if the controller is a computer, such computer is not limited to a particular computer platform, particular processor, or programming language.

Example output devices include, but are not limited to, displays (e.g., cathode ray tube (CRT) devices, liquid crystal displays (LCD), plasma displays and other video output devices), printers, communication devices for example modems, storage devices such as a disk or tape and audio output, and devices that produce output on light transmitting films or similar substrates.

Example input devices include but are not limited to buttons, knobs, switches, keyboards, keypads, track ball, mouse, pen and tablet, light pen, touch screens, and data input devices such as audio and video capture devices.

In addition, as stated above, it should be understood that the features disclosed herein can be used in any combination. Notably, In some embodiments, the image processor and controller are combined into a single unit.

FIG. 36A shows a block diagram representation of the image processor 270 in accordance with one embodiment of aspects of the present invention. In this embodiment, the image processor 270 includes one or more channel processors, e.g., four channel processors 740A-740D, one or more image pipelines, e.g., an image pipeline 742, and/or one or more image post processors, e.g., an image post processor 744. The image processor may further include a system control portion 746.

Each of the channel processors 740A-740D is coupled to a sensor of a respective one of the camera channels and generates an image based at least in part on the signal(s) received from the sensor respective camera channel. For example, the channel processor 740A is coupled to sensor portion 264A of camera channel 260A. The channel processor 740B is coupled to sensor portion 264B of camera channel 260B. The channel processor 740C is coupled to sensor portion 264C of camera channel 260C. The channel processor 740D is coupled to sensor portion 264D of camera channel 260D.

In some embodiments, one or more of the channel processors 740A-740D are tailored to its respective camera channel. For example, as further described below, if one of the camera channels is dedicated to a specific wavelength or color (or band of wavelengths or colors), the respective channel processor may also be adapted to such wavelength or color (or band of wavelengths or colors). Tailoring the channel processing to the respective camera channel may help to make it possible to generate an image of a quality that is higher than the quality of images resulting from traditional image sensors of like pixel count. In such embodiments, providing each camera channel with a dedicated channel processor may help to reduce or simplify the amount of logic in the channel processors as the channel processor may not need to accommodate extreme shifts in color or wavelength, e.g., from a color (or band of colors) or wavelength (or band of wavelengths) at one extreme to a color (or band of colors) or wavelength (or band of wavelengths) at another extreme.

The images generated by the channel processors 740A-740D are supplied to the image pipeline 742, which may combine the images to form a full color or black/white image. The output of the image pipeline 742 is supplied to the post processor 744, which generates output data in accordance with one or more output formats.

Figure 36B:
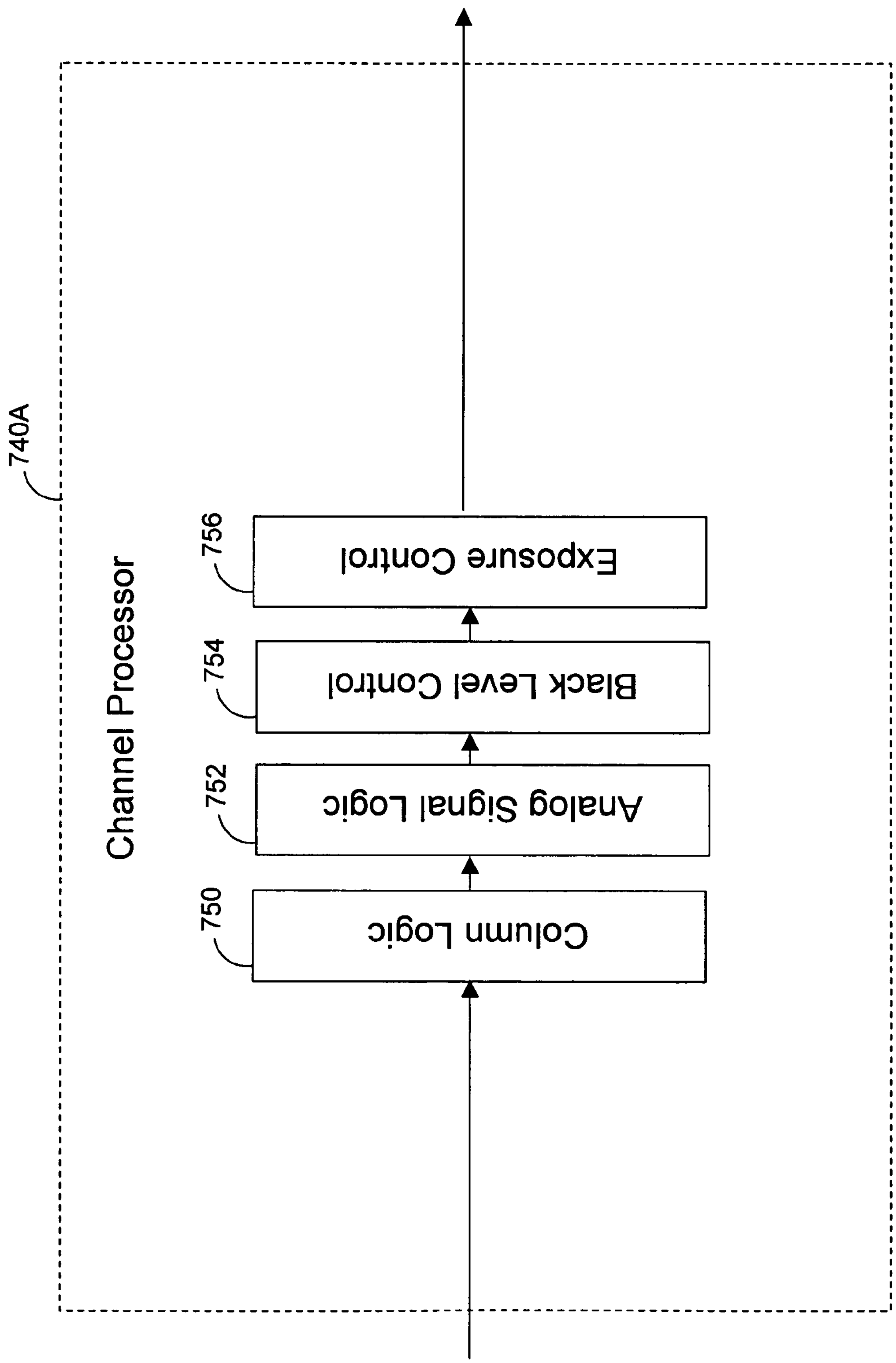
FIG. 36B is a block diagram of one embodiment of a channel processor that may be employed in the image processor of FIG. 36A, in accordance with one embodiment of the present invention.

FIG. 36B shows one embodiment of a channel processor, e.g., channel processor 740A. In this embodiment, the channel processor 740A includes column logic 750, analog signal logic 752, black level control 754 and exposure control 756. The column logic 750 is coupled to the sensor of the associated camera channel and reads the signals from the pixels (see for example, column buffers 372-373 (FIG. 6B). If the channel processor is coupled to a camera channel that is dedicated to a specific wavelength (or band of wavelengths), it may be advantageous for the column logic 750 to be adapted to such wavelength (or band of wavelengths). For example, the column logic 750 may employ an integration time or integration times adapted to provide a particular dynamic range in response to the wavelength (or band of wavelengths) to which the color channel is dedicated. Thus, it may be advantageous for the column logic 750 in one of the channel processors to employ an integration time or times that is different than the integration time or times employed by the column logic 750 in one or more of the other channel processors.

The analog signal logic 752 receives the output from the column logic 750. If the channel processor 740A is coupled to a camera channel dedicated to a specific wavelength or color (or band of wavelengths or colors), it may be advantageous for the analog signal logic to be specifically adapted to such wavelength or color (or band of wavelengths or colors). As such, the analog signal logic can be optimized, if desired, for gain, noise, dynamic range and/or linearity, etc. For example, if the camera channel is dedicated to a specific wavelength or color (or band of wavelengths or colors), dramatic shifts in the logic and settling time may not be required as each of the sensor elements in the camera channel are dedicated to the same wavelength or color (or band of wavelengths or colors). By contrast, such optimization may not be possible if the camera channel must handle all wavelength and colors and employs a Bayer arrangement in which adjacent sensor elements are dedicated to different colors, e.g., red-blue, red-green or blue-green.

The output of the analog signal logic 752 is supplied to the black level logic 754, which determines the level of noise within the signal, and filters out some or all of such noise. If the sensor coupled to the channel processor is focused upon a narrower band of visible spectrum than traditional image sensors, the black level logic 754 can be more finely tuned to eliminate noise. If the channel processor is coupled to a camera channel that is dedicated to a specific wavelength or color (or band of wavelengths or colors), it may be advantageous for the analog signal logic 752 to be specifically adapted to such wavelength or color (or band of wavelengths or colors).

The output of the black level logic 754 is supplied to the exposure control 756, which measures the overall volume of light being captured by the array and adjusts the capture time for image quality. Traditional cameras must make this determination on a global basis (for all colors). If the sensor coupled to the channel processor is dedicated to a specific color (or band of colors, the exposure control can be specifically adapted to the wavelength (or band of wavelengths) to which the sensor is targeted. Each channel processor, e.g., channel processors 740A-740D, is thus able to provide a capture time that is specifically adapted to the sensor and/or specific color (or band of colors) targeted thereby and different than the capture time provided by one or more of the other channel processors for one or more of the other camera channels.

Figure 36C:
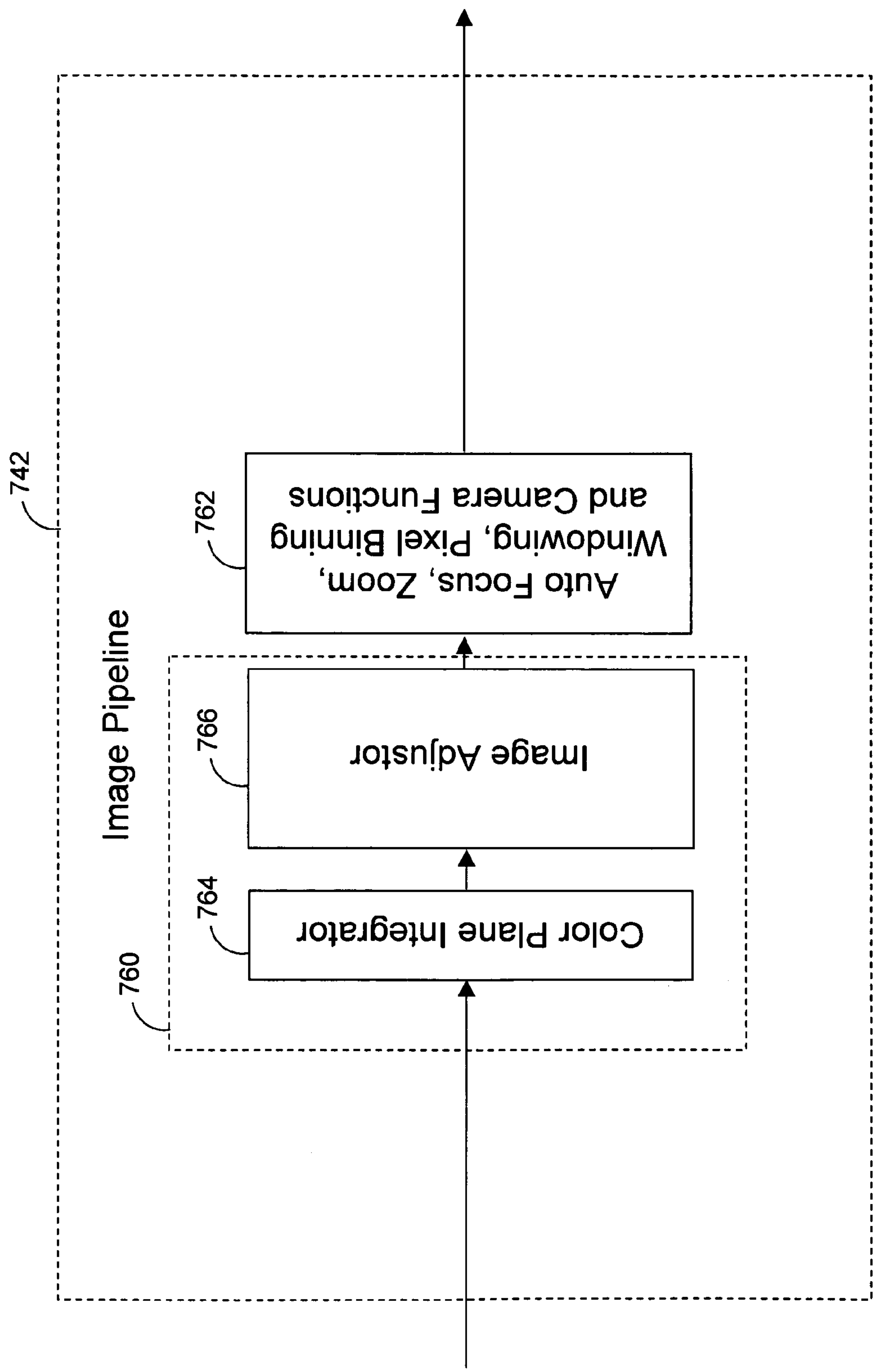
FIG. 36C is a block diagram of an one embodiment of an image pipeline that may be employed in the image processor of FIG. 36A.

FIG. 36C shows one embodiment of the image pipeline 742. In this embodiment, the image pipeline 742 includes two portions 760, 762. The first portion 760 includes a color plane integrator 764 and an image adjustor 766. The color plane integrator 764 receives an output from each of the channel processors, e.g., channel processors 740A-740D, and integrates the multiple color planes into a single color image. The output of the color plane integrator 764, which is indicative of the single color image, is supplied to the image adjustor 766, which adjusts the single color image for saturation, sharpness, intensity and hue. The adjustor 766 also adjusts the image to remove artifacts and any undesired effects related to bad pixels in the one or more color channels. The output of the image adjustor 766 is supplied to the second portion 762 of the image pipeline 742, which provides auto focus, zoom, windowing, pixel binning and camera functions.

Figure 36D:
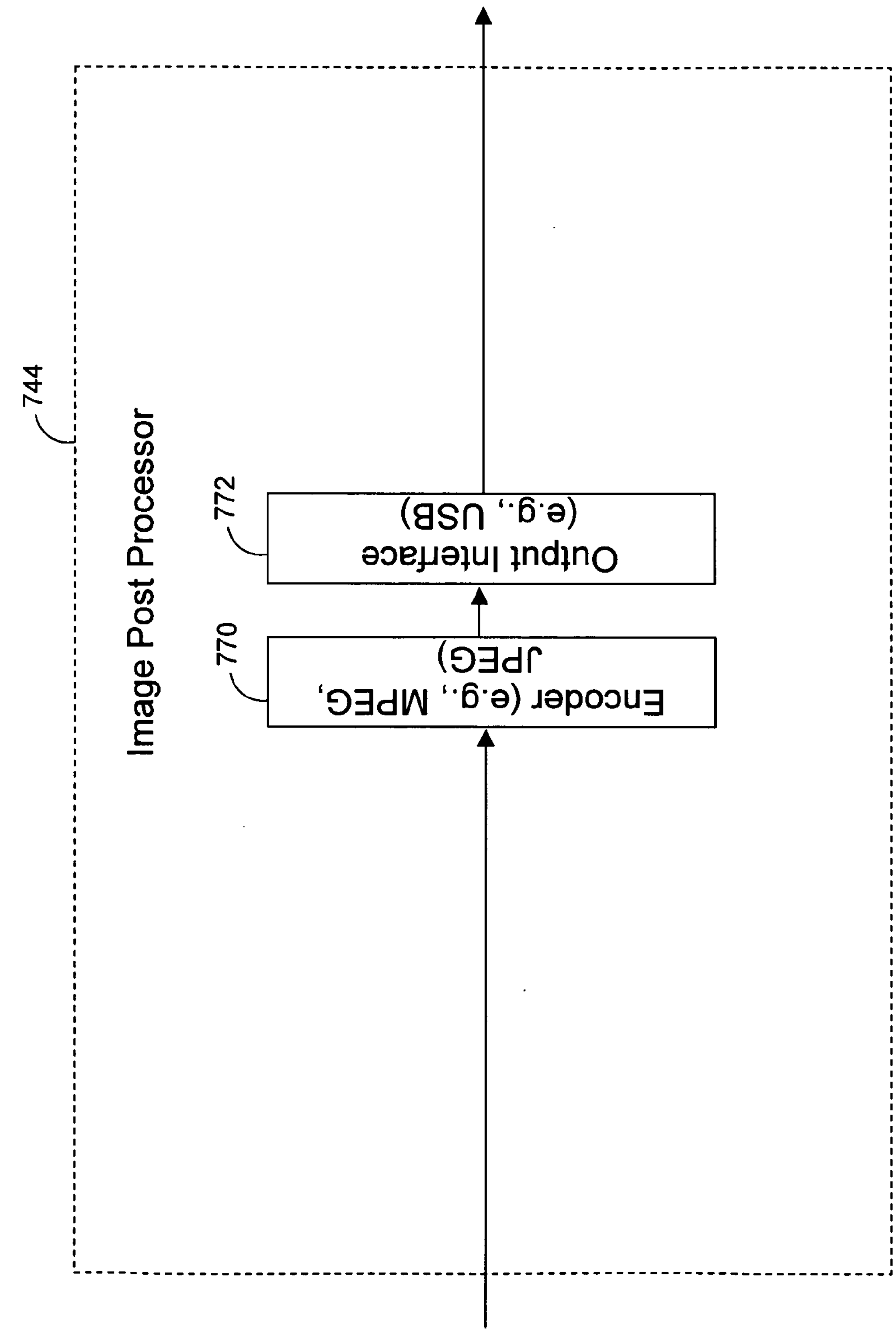
FIG. 36D is a block diagram of one embodiment of an image post processor that may be employed in the image processor of FIG. 36A.

FIG. 36D shows one embodiment of the image post processor 744. In this embodiment, the image post processor 744 includes an encoder 770 and an output interface 772. The encoder 770 receives the output signal from the image pipeline 742 and provides encoding to supply an output signal in accordance with one or more standard protocols (e.g., MPEG and/or JPEG). The output of the encoder 770 is supplied to the output interface 772, which provides encoding to supply an output signal in accordance with a standard output interface, e.g., universal serial bus (USB) interface.

Figure 36E:
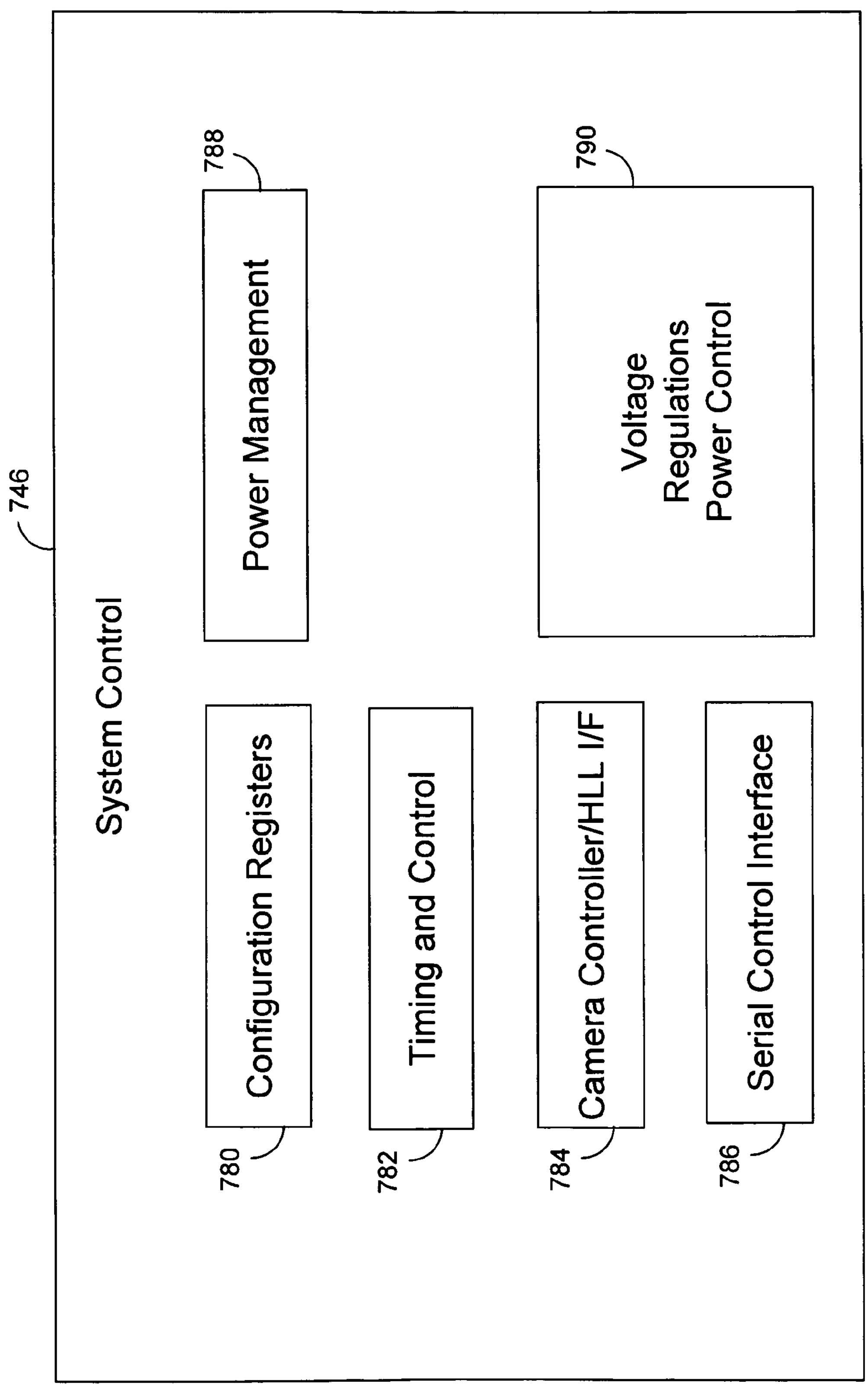
FIG. 36E is a block diagram of one embodiment of a system control portion that may be employed in the image processor of FIG. 36A.

FIG. 36E shows one embodiment of the system control portion 746. In this embodiment, the system control portion 746 includes configuration registers 780, timing and control 782, a camera controller high level language interface 784, a serial control interface 786, a power management portion 788 and a voltage regulation and power control portion 790.

It should be understood that the processor 265 is not limited to the stages and/or steps set forth above. For example, the processor 265 may comprise any type of stages and/or may carry out any steps. It should also be understood that the processor 265 may be implemented in any manner. For example, the processor 265 may be programmable or non programmable, general purpose or special purpose, dedicated or non dedicated, distributed or non distributed, shared or not shared, and/or any combination thereof. If the processor 265 has two or more distributed portions, the two or more portions may communicate via one or more communication links. A processor may include, for example, but is not limited to, hardware, software, firmware, hardwired circuits and/or any combination thereof. The processor 265 may or may not execute one or more computer programs that have one or more subroutines, or modules, each of which may include a plurality of instructions, and may or may not perform tasks in addition to those described herein. If a computer program includes more than one module, the modules may be parts of one computer program, or may be parts of separate computer programs. As used herein, the term module is not limited to a subroutine but rather may include, for example, hardware, software, firmware, hardwired circuits and/or any combination thereof.

In some embodiments, the processor 265 comprises at least one processing unit connected to a memory system via an interconnection mechanism (e.g., a data bus). A memory system may include a computer-readable and writeable recording medium. The medium may or may not be non-volatile. Examples of non-volatile medium include, but are not limited to, magnetic disk, magnetic tape, non-volatile optical media and non-volatile integrated circuits (e.g., read only memory and flash memory). A disk may be removable, e.g., known as a floppy disk, or permanent, e.g., known as a hard drive. Examples of volatile memory include but are not limited to random access memory, e.g., dynamic random access memory (DRAM) or static random access memory (SRAM), which may or may not be of a type that uses one or more integrated circuits to store information.

If the processor 265 executes one or more computer programs, the one or more computer programs may be implemented as a computer program product tangibly embodied in a machine-readable storage medium or device for execution by a computer. Further, if the processor 265 is a computer, such computer is not limited to a particular computer platform, particular processor, or programming language. Computer programming languages may include but are not limited to procedural programming languages, object oriented programming languages, and combinations thereof.

A computer may or may not execute a program called an operating system, which may or may not control the execution of other computer programs and provides scheduling, debugging, input/output control, accounting, compilation, storage assignment, data management, communication control, and/or related services. A computer may for example be programmable using a computer language such as C, C++, Java or other language, such as a scripting language or even assembly language. The computer system may also be specially programmed, special purpose hardware, or an application specific integrated circuit (ASIC).

Other embodiments of a processor, or portions thereof, are disclosed and/or illustrated in the Apparatus for Multiple Camera Devices and Method of Operating Same patent application publication. As stated above, the structures and/or methods described and/or illustrated in the Apparatus for Multiple Camera Devices and Method of Operating Same patent application publication may be employed in conjunction with one or more of the aspects and/or embodiments of the present inventions.

Thus, for example, one or more portions of one or more embodiments of the digital camera apparatus disclosed in the Apparatus for Multiple Camera Devices and Methods of Operating Same patent application publication may be employed in a digital camera apparatus 210 having one or more actuators, e.g., e.g., actuator 430A-430D, 434A-434D, 438A-438D, 442A-442D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), for example, to move one or more portions of one or more optics portion and/or to move one or more portions of one or more sensor portions. In addition, in some embodiments, for example, one or more actuators, e.g., e.g., actuator 430A-430D, 434A-434D, 438A-438D, 442A-442D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), may be employed in one or more embodiments of the digital camera apparatus 300 disclosed in the Apparatus for Multiple Camera Devices and Method of Operating Same patent application publication, for example, to move one or more portions of one or more optics portion and/or to move one or more portions of one or more sensor portions.

For example, in some embodiments, the processor 265, or portions thereof, is the same as or similar to one or more embodiments of the processor 340, or portions thereof, of the digital camera apparatus 300 described and/or illustrated in the Apparatus for Multiple Camera Devices and Method of Operating Same patent application publication.

In some embodiments, the processor 265, or portions thereof, is the same as or similar to one or more embodiments of the processing circuitry 212, 214, or portions thereof, of the digital camera apparatus 200 described and/or illustrated in the Apparatus for Multiple Camera Devices and Method of Operating Same patent application publication.

For the sake of brevity, the structures and/or methods described and/or illustrated in the Apparatus for Multiple Camera Devices and Method of Operating Same patent application publication will not be repeated. It is expressly noted, however, that the entire contents of the Apparatus for Multiple Camera Devices and Method of Operating Same patent application publication, including, for example, the features, attributes, alternatives, materials, techniques and advantages of all of the inventions, are incorporated by reference herein, although, unless stated otherwise, the aspects and/or embodiments of the present invention are not limited to such features, attributes alternatives, materials, techniques and advantages.

As with each of the embodiments disclosed herein, the above embodiments may be employed alone or in combination with one or more other embodiments disclosed herein, or portions thereof.

In addition, it should also be understood that the embodiments disclosed herein may also be used in combination with one or more other methods and/or apparatus, now known or later developed.

Figure 37A:
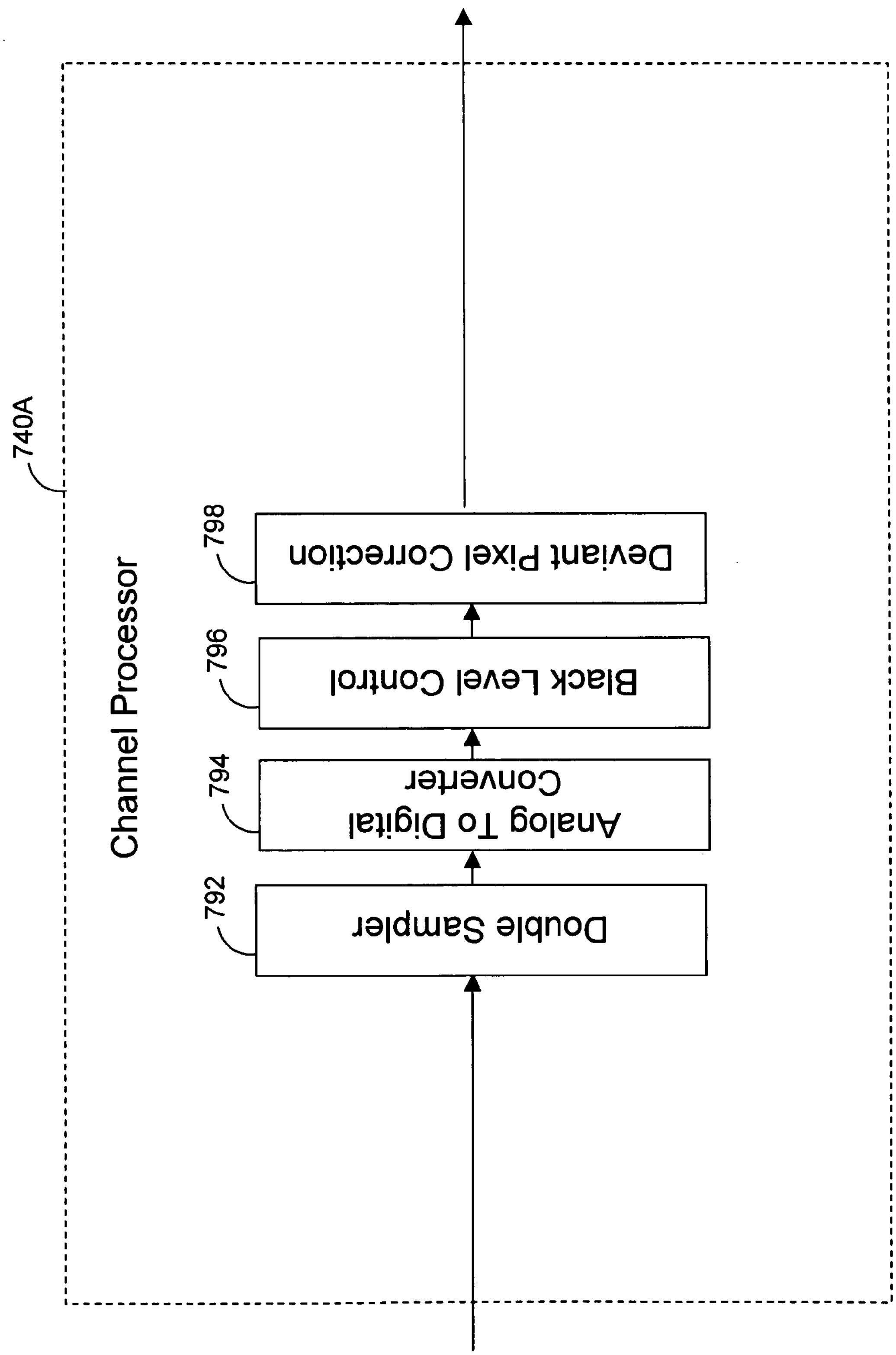
FIG. 37A is a block diagram of another embodiment of a channel processor that may be employed in the image processor of FIG. 36A.

FIG. 37A shows another embodiment of the channel processor, e.g., channel processor 740A. In this embodiment, the channel processor, e.g., channel processor 740A includes a double sampler 792, an analog to digital converter 794, a black level clamp 796 and a deviant pixel correction 798.

The double sampler 792 provides an estimate of the amount of light received by each pixel during an exposure period. As is known, an image may be represented as a plurality of picture element (pixel) magnitudes, where each pixel magnitude indicates the picture intensity (relative darkness or relative lightness) at an associated location of the image. In some embodiments, a relatively low pixel magnitude indicates a relatively low picture intensity (i.e., relatively dark location). In such embodiments, a relatively high pixel magnitude indicates a relatively high picture intensity (i.e., relatively light location). The pixel magnitudes are selected from a range that depends on the resolution of the sensor.

The double sampler 792 determines the amount by which the value of each pixel changes during the exposure period. For example, a pixel may have a first value, Vstart, prior to an exposure period. The first value, Vstart, may or may not be equal to zero. The same pixel may have a second value, Vend, after the exposure period. The difference between the first and second values, i.e., Vend-Vstart, is indicative of the amount of light received by the pixel.

Figure 37B:
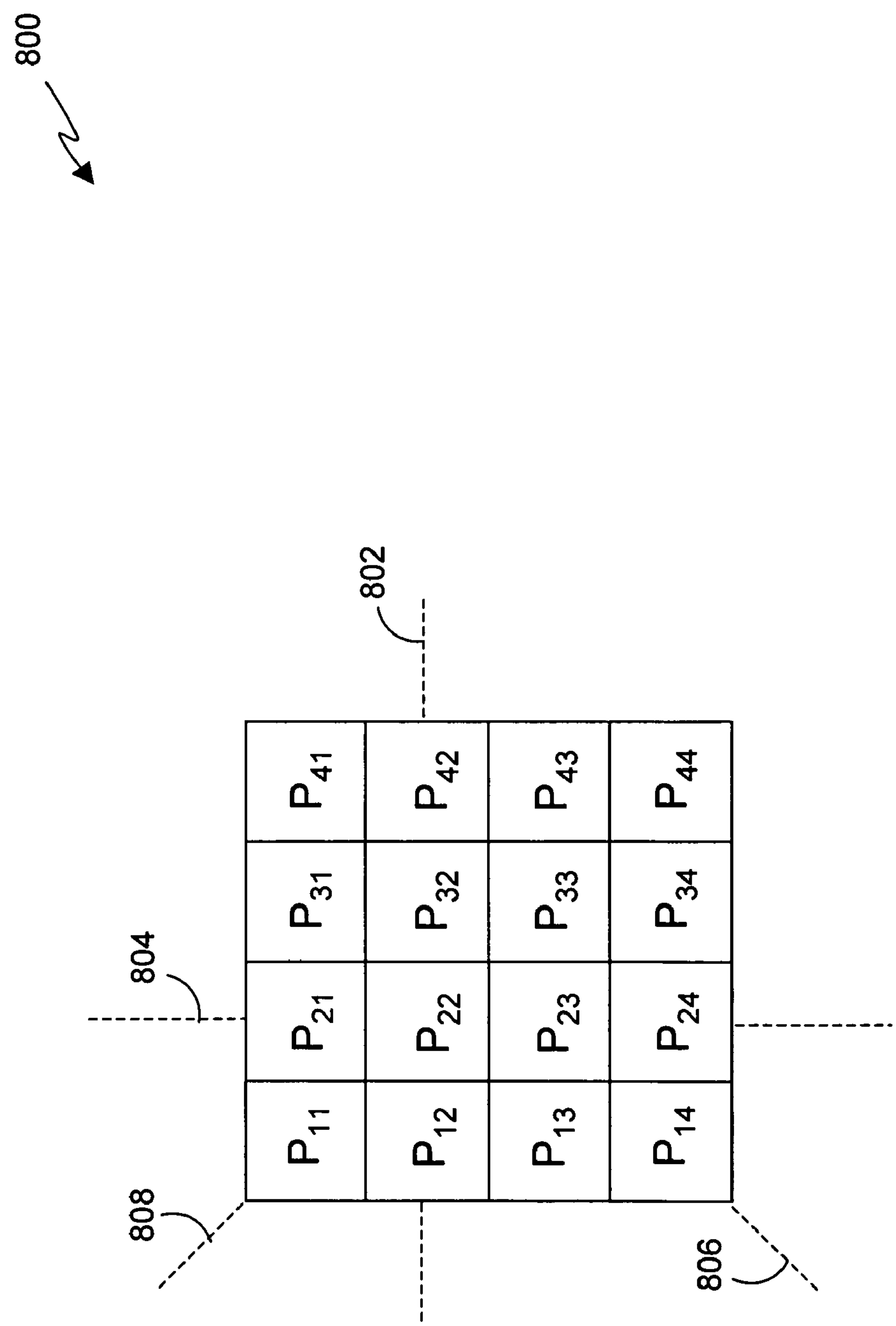

FIG. 37B is a graphical representation 800 of a neighborhood of pixels P11-P44 and a plurality of prescribed spatial directions, namely, a first prescribed spatial direction 802 (e.g., the horizontal direction), a second prescribed spatial direction 804 (e.g., the vertical direction), a third prescribed spatial direction 806 (e.g., a first diagonal direction), and a fourth prescribed spatial direction 808 (e.g., a second diagonal direction). The pixel P22 is adjacent to pixels P12, P21, P32 and P23. The pixel P22 is offset in the horizontal direction from the pixel P32. The pixel P22 is offset in the vertical direction from the pixel P23. The pixel P22 is offset in the first diagonal direction from the pixel P11. The pixel P22 is offset in the second diagonal direction from the pixel P31.

Figure 37C:
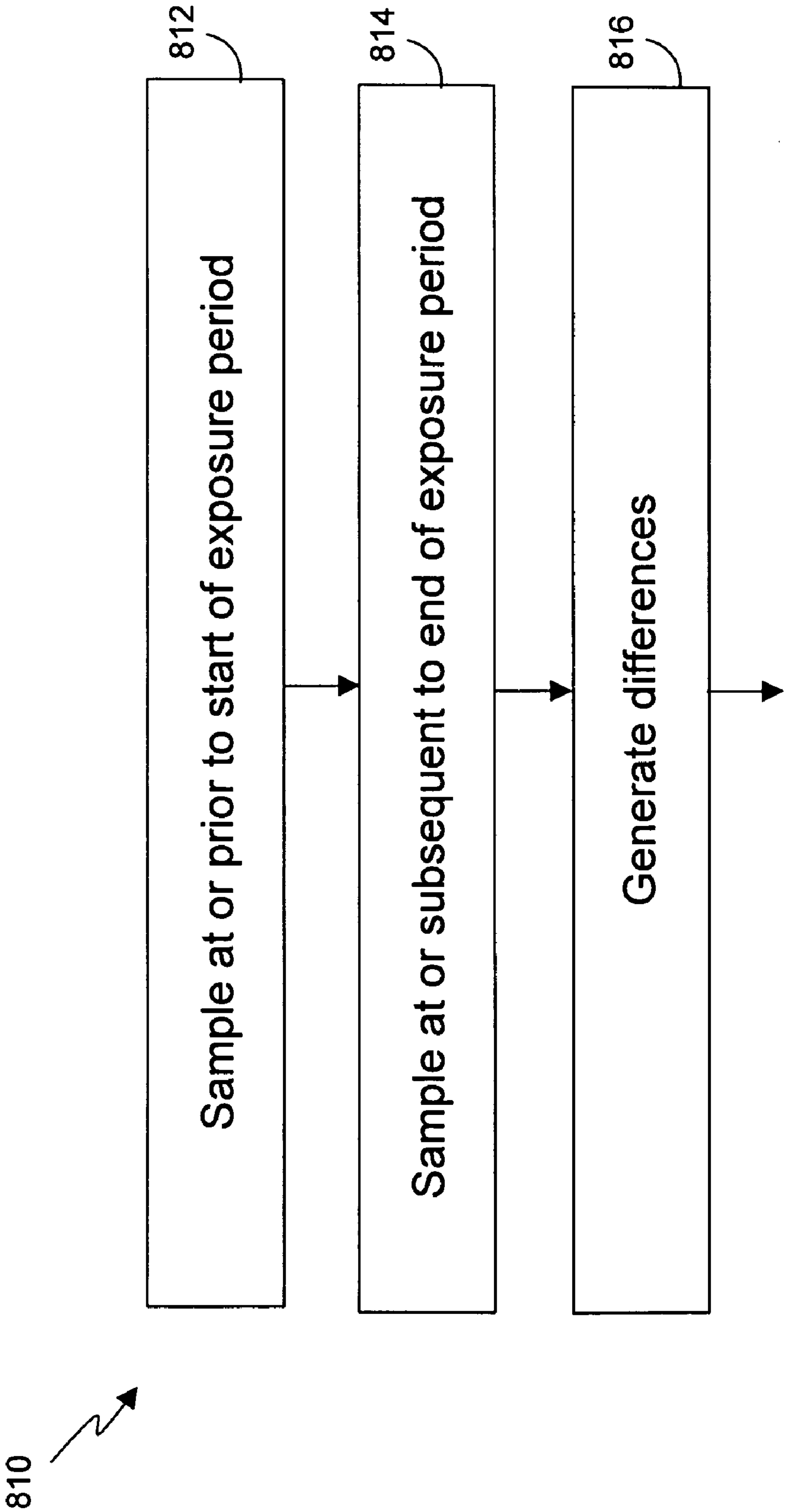

FIG. 37C shows a flowchart 810 of steps employed in this embodiment of the double sampler 792. As indicated at a step 812, the value of each pixel is sampled at the time of, or prior to, the start of an exposure period and signals indicative thereof are supplied to the double sampler. Referring to step 814, the value of each pixel is sampled at the time of, or subsequent to, the end of the exposure period and signals indicative thereof are supplied to the double sampler. At a step 816, the double sampler 792 generates a signal for each pixel, indicative of the difference between the start and end values for such pixel.

As stated above, the magnitude of each difference signal is indicative of the amount of light received at a respective location of the sensor portion. A difference signal with a relatively low magnitude indicates that a relatively low amount of light is received at the respective location of the sensor portion. A difference signal with a relatively high magnitude indicates that a relatively high amount of light is received at the respective location of the sensor portion.

Referring again to FIG. 37A, the difference signals generated by the double sampler 792 are supplied to the analog to digital converter 794 (FIG. 37A), which samples each of such signals and generates a sequence of multi-bit digital signals in response thereto, each multi-bit digital signal being indicative of a respective one of the difference signals.

The multi-bit digital signals are supplied to the black level clamp 796 (FIG. 37A), which compensates for drift in the sensor portion of the camera channel. The difference signals should have a magnitude equal to zero unless the pixels are exposed to light. However, due to imperfection in the sensor (e.g., leakage currents) the value of the pixels may change (e.g., increase) even without exposure to light. For example, a pixel may have a first value, Vstart, prior to an exposure period. The same pixel may have a second value, Vend, after the exposure period. If drift is present, the second value may not be equal to the first value, even if the pixel was not exposed to light. The black level clamp 796 compensates for such drift.

To accomplish this, in some embodiments, a permanent cover is applied over one or more portions (e.g., one or more rows) of the sensor portion to prevent light from reaching such portions. The cover is applied, for example, during manufacture of the sensor portion. The difference signals for the pixels in the covered portion(s) can be used in estimating the magnitude (and direction) of the drift in the sensor portion.

In this embodiment, the black level clamp 796 generates a reference value (which represents an estimate of the drift within the sensor portion) having a magnitude equal to the average of the difference signals for the pixels in the covered portion(s). The black level clamp 796 thereafter compensates for the estimated drift by generating a compensated difference signal for each of the pixels in the uncovered portions, each compensated difference signal having a magnitude equal to the magnitude of the respective uncompensated difference signal reduced by the magnitude of the reference value (which as stated above, represents an estimate of the drift).

The output of the black level clamp 796 is supplied to the deviant pixel identifier 798 (FIG. 37A), which seeks to identify defective pixels and help reduce the effects thereof. In this embodiment, a defective pixel is defined as pixel for which one or more values, difference signal and/or compensated difference signal fails to meet one or more criteria, in which case one or more actions are then taken to help reduce the effects of such pixel. In this embodiment, for example, a pixel is defective if the magnitude of the compensated difference signal for the pixel is outside of a range of reference values (i.e., less than a first reference value or greater than a second reference value). The range of reference values may be a predetermined, adaptively determined and/or any combination thereof.

If the magnitude of the compensated difference signal is outside such range, then the magnitude of the compensated difference signal is set equal to a value that is based, at least in part, on the compensated difference signals for one or more pixels adjacent to the defective pixel, for example, an average of the pixel offset in the positive x direction and the pixel offset in the negative x direction.

Figure 37D:
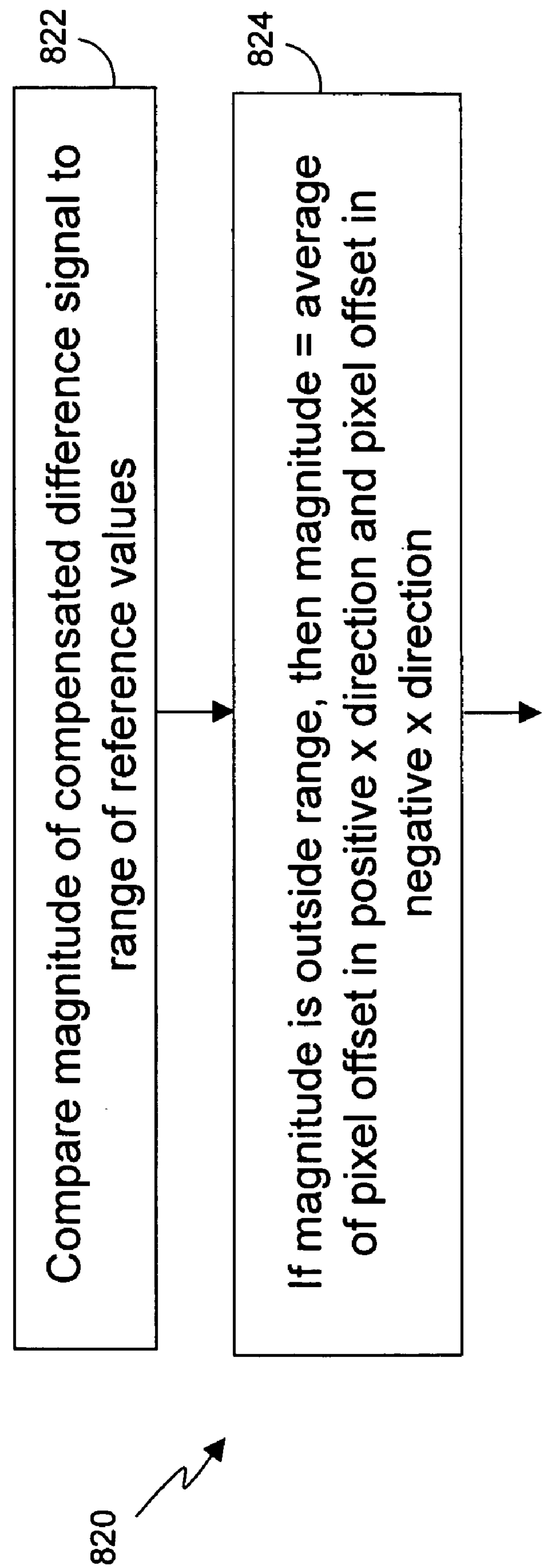

FIG. 37D shows a flowchart 820 of steps employed in this embodiment of the defective pixel identifier 798. As indicated at a step 822, the magnitude of each compensated difference signal is compared to a range of reference values. If a magnitude of a compensated difference signal is outside of the range of reference values, then the pixel is defective and at a step 824, the magnitude of difference signal is set to a value in accordance with the methodology set forth above.

Figure 37E:
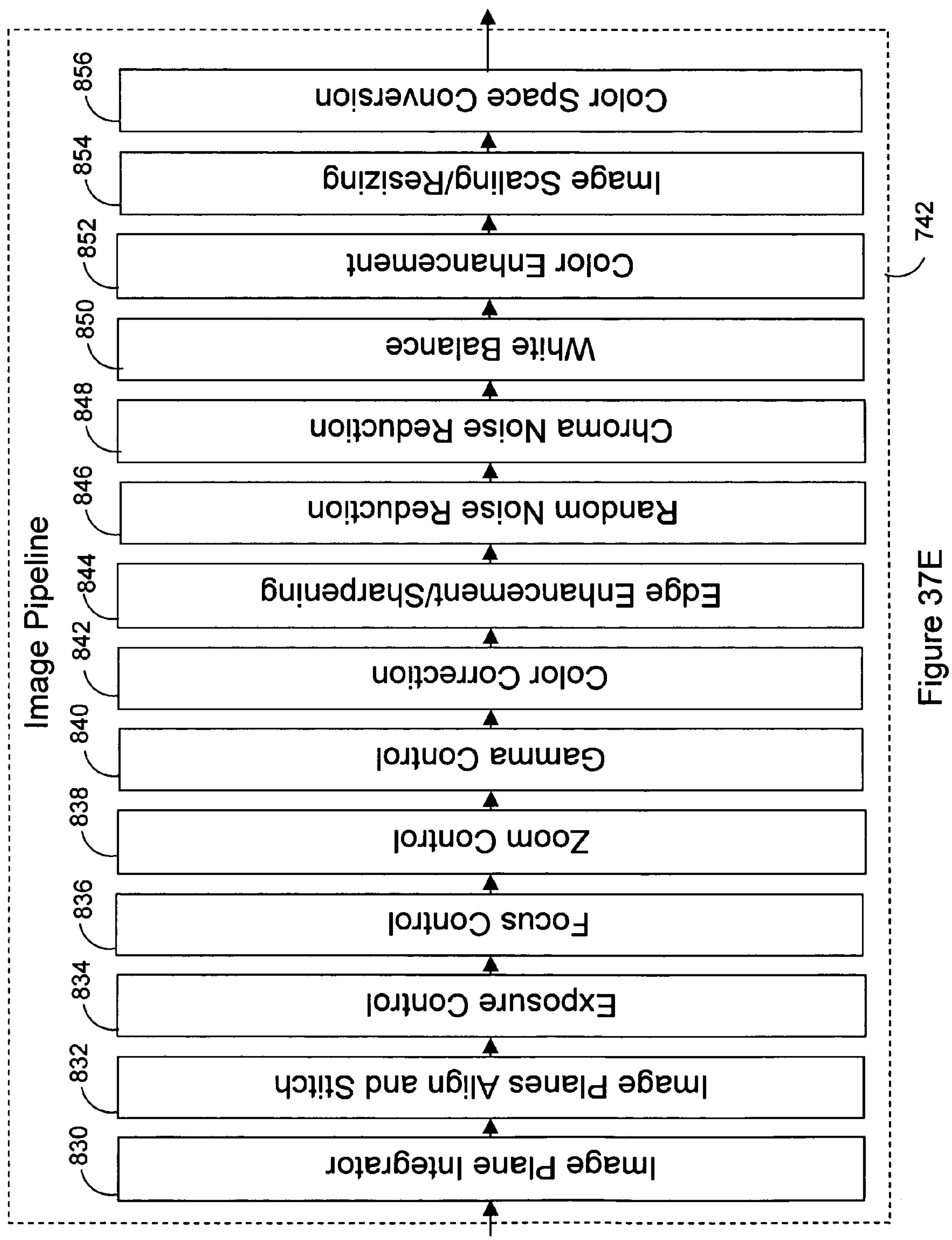

FIG. 37E shows another embodiment of the image pipeline 742 (FIG. 36A). In this embodiment, the image pipeline 742 includes an image plane integrator 830, image plane alignment and stitching 832, exposure control 834, focus control 836, zoom control 838, gamma correction 840, color correction 842, edge enhancement 844, random noise reduction 846, chroma noise reduction 848, white balance 850, color enhancement 852, image scaling 854 and color space conversion 856.

The image plane integrator 830 receives the data from each of the two or more channel processors, e.g., channel processors 740A-740D. In this embodiment, the output of a channel processor is a data set that represents a compensated version of the image captured by the associated camera channel. The data set may be output as a data stream. For example, the output from the channel processor for camera channel A represents a compensated version of the image captured by camera channel A and may be in the form of a data stream $P_{A1}$, $P_{A2}$, . . . $P_{An}$. The output from the channel processor for camera channel B represents a compensated version of the image captured by camera channel B and may be in the form of a data stream $P_{B1}$, $P_{B2}$, . . . $P_{Bn}$. The output from the channel processor for camera channel C represents a compensated version of the image captured by camera channel C and is in the form of a data stream $P_{C1}$, $P_{C2}$, . . . $P_{Cn}$. The output from the channel processor for camera channel D represents a compensated version of the image captured by camera channel D and is in the form of a data stream $P_{D1}$, $P_{D2}$, . . . $P_{Dn}$.

The image plane integrator 830 receives the data from each of the two or more channel processors, e.g., channel processors 740A-740D, and combines such data into a single data set, e.g., $P_{A1}$, $P_{B1}$, $P_{C1}$, $P_{D1}$, $P_{A2}$, $P_{B2}$, $P_{C2}$, $P_{D2}$, $P_{A3}$, $P_{B3}$, $P_{C3}$, $P_{D3}$, $P_{An}$, $P_{Bn}$, $P_{Cn}$, $P_{Dn}$.

Figure 37F:
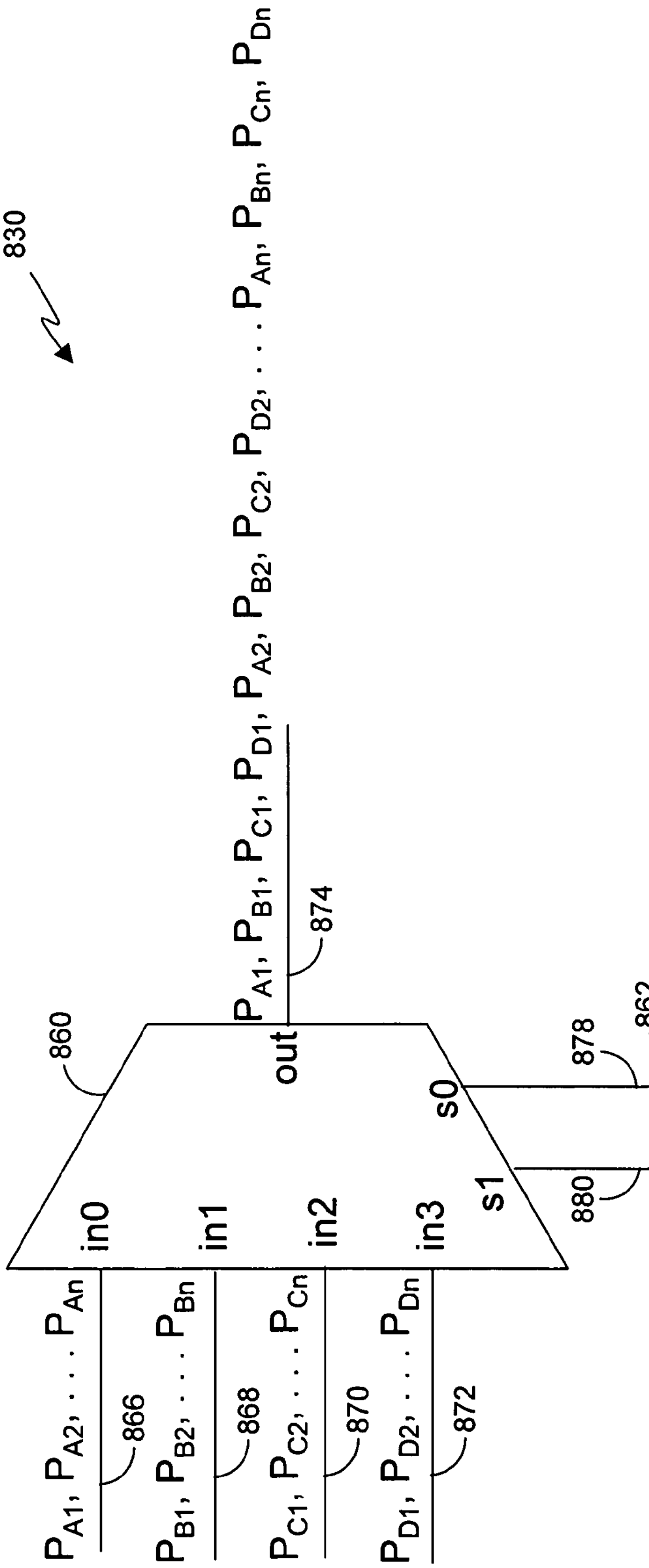

FIG. 37F shows one embodiment of the image plane integrator 830. In this embodiment, the image plane integrator 830 includes a multiplexer 860 and a multi-phase phase clock 862.

The multiplexer 860 has a plurality of inputs in0, in1, in2, in3, each of which is adapted to receive a stream (or sequence) of multi-bit digital signals. The data stream of multi-bit signals, $P_{A1}$, $P_{A2}$, . . . $P_{An}$, from the channel processor for camera channel A is supplied to input in0 via signal lines 866. The data stream $P_{B1}$, $P_{B2}$, . . . $P_{Bn}$ from the channel processor for camera channel B is supplied to input in1 via signal lines 868. The data stream $P_{C1}$, $P_{C2}$, . . . $P_{Cn}$ from the channel processor for camera channel C is supplied to input in2 via signal lines 870. The data stream $P_{D1}$, $P_{D2}$, . . . $P_{Dn}$ from the channel processor for camera channel D is supplied to the input in3 on signal lines 872. The multiplexer 860 has an output, out, that supplies a multi-bit output signal on signal lines 874. Note that in some embodiments, the multiplexer comprises of a plurality of four input multiplexers each of which is one bit wide.

Figure 37G:
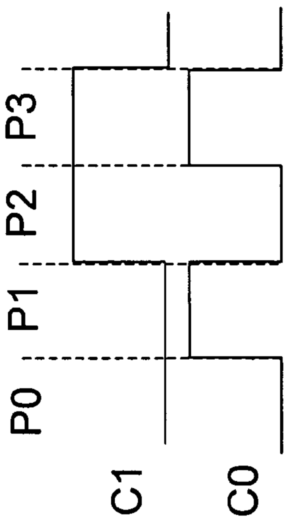

The multi-phase clock has an input, enable, that receives a signal via signal line 876. The multi-phase clock has outputs, c0, c1, which are supplied to the inputs s0, s1 of the multiplexer via signal lines 878, 880. In this embodiment, the multi-phase clock has four phases, shown in FIG. 37G.

The operation of the image plane integrator 830 is as follows. The integrator 830 has two states. One state is a wait state. The other state is a multiplexing state. Selection of the operating state is controlled by the logic state of the enable signal supplied on signal line 876 to the multi-phase clock 862. The multiplexing state has four phases, which correspond to the four phases of the multi-phase clock 862. In phase 0, neither of the clock signals, i.e., c1, co, are asserted causing the multiplexer 860 to output one of the multi-bit signals from the A camera channel, e.g., $P_{A1}$. In phase 1, clock signal c0, is asserted causing the multiplexer 860 to output one of the multi-bit signals from the B camera channel, e.g., $P_{B1}$. In phase 2, clock signal c1, is asserted causing the multiplexer 860 to output one of the multi-bit signals from the C camera channel, e.g., $P_{C1}$. In phase 3, both of the clock signals c1, c0 are asserted causing the multiplexer 860 to output one of the multi-bit signals from the D camera channel, e.g., $P_{D1}$.

Thereafter, the clock returns to phase 0, causing the multiplexer 860 to output another one of the multi-bit signals from the A camera channel, e.g., $P_{A2}$. Thereafter, in phase 1, the multiplexer outputs another one of the multi-bit signals from the B camera channel, e.g., $P_{B2}$. In phase 2, the multiplexer 860 outputs another one of the multi-bit signals from the C camera channel, e.g., $P_{C2}$. In phase 3, the multiplexer 860 outputs another one of the multi-bit signals from the D camera channel, e.g., $P_{D2}$.

This operation is repeated until the multiplexer 860 has output the last multi-bit signal from each of the camera channels, e.g., $P_{An}$, $P_{Bn}$, $P_{Cn}$, and $P_{Dn}$.

The output of the image plane integrator 830 is supplied to the image planes alignment and stitching stage 832. The purpose of the image planes alignment and stitching stage 832 is to make sure that a target captured by different camera channels, e.g., camera channels 260A-260D, is aligned at the same position within the respective images e.g., to make sure that a target captured by different camera channels appears at the same place within each of the camera channel images. This purpose of the image planes alignment and stitching stage can be conceptualized with reference to the human vision system. In that regard, the human vision system may be viewed as a two channel image plane system. If a person holds a pencil about one foot in front of his/her face, closes his/her left eye, and uses his/her right eye to see the pencil, the pencil is perceived at a location that is different than if the person closes his/her right eye and uses the left eye to see the pencil. This is because the person's brain is only receiving one image at a time and thus does not have an opportunity to correlate it with the other image from the other eye, because the images are received at different times. If the person opens, and uses, both eyes to see the pencil, the person's brain receives two images of the pencil at the same time. In this case, the person's brain automatically attempts to align the two images of the pencil and the person perceives a single, stereo image of the pencil. The automatic image planes alignment and stitching stage 832 performs a similar function, although in some embodiments, the automatic image planes alignment and stitching stage 832 has the ability to perform image alignment on three, four, five or more image channels instead just two image channels.

As with each of the aspects and/or embodiments disclosed herein, the above embodiments may be employed alone or in combination with one or more other embodiments disclosed herein, or portions thereof.

In addition, it should also be understood that the aspects and/or embodiments disclosed herein may also be used in combination with one or more other methods and/or apparatus, now known or later developed.

The output of the image planes alignment and stitching stage 832 is supplied to the exposure control 834. The purpose of the exposure control 834 is to help make sure that the captured images are not over exposed or under exposed. An over exposed image is too bright. An under exposed image is too dark. In this embodiment, it is expected that a user will supply a number that represent the brightness of a picture that user feel comfortable (not too bright or not too dark). The automatic exposure control 834, uses this brightness number and automatically adjusts the exposure time of the image pickup or sensor array during preview mode accordingly. When the user presses the capture button (capture mode), the exposure time that will result in the brightness level supplied by the user. The user may also manually adjust the exposure time of the image pick up or sensor array directly, similar to adjusting the iris of a conventional film camera.

Figure 37H:
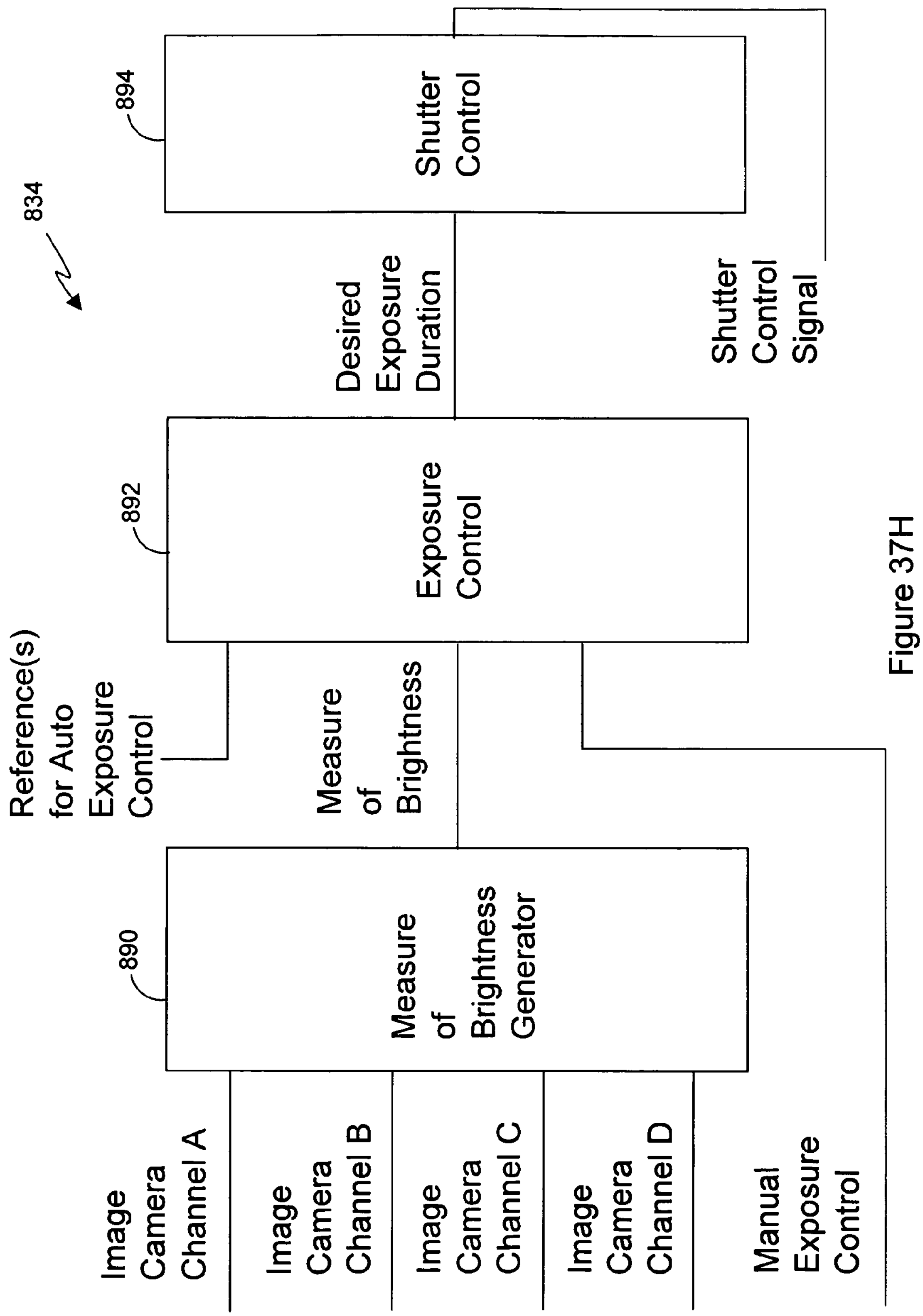

FIG. 37H shows one embodiment of the automatic exposure control 834. In this embodiment, a measure of brightness generator 890 generates a brightness value indicative of the brightness of an image, e.g., image camera channel A, image camera channel B, image camera channel C, image camera channel D, supplied thereto. An exposure control 892 compares the generated brightness value against one or more reference values, e.g., two values where the first value is indicative of a minimum desired brightness and the second value is indicative of a maximum desired brightness. The minimum and/or maximum brightness may be predetermined, processor controlled and/or user controlled. In some embodiments, for example, the minimum desired brightness and maximum desired brightness values are supplied by the user so that images provided by the digital camera apparatus 210 will not be too bright or too dark, in the opinion of the user.

If the brightness value is within the minimum desired brightness and maximum desired brightness (i.e., greater than or equal to the minimum and less than or equal to the maximum), then the exposure control 892 does not change the exposure time. If the brightness value is less than the minimum desired brightness value, the exposure control 892 supplies control signals to a shutter control 894 that causes the exposure time to increase until the brightness is greater than or equal to the minimum desired brightness. If the brightness value is greater than the maximum brightness value, then the auto exposure control 892 supplies control signals to the shutter control 894 that causes the exposure time to decrease until the brightness is less than or equal to the maximum brightness value. After the brightness value is within the minimum and maximum brightness values (i.e., greater than or equal to the minimum and less than or equal to the maximum), the auto exposure control 892 supplies a signal that enables a capture mode, wherein the user is able to press the capture button to initiate capture of an image and the setting for the exposure time causes an exposure time that results in a brightness level (for the captured image) that is within the user preferred range. As stated above, in some embodiments, the digital camera apparatus 210 provides the user with the ability to manually adjust the exposure time directly, similar to adjusting an iris on a conventional film camera.

As further described herein, in some embodiments, the digital camera apparatus 210 employs relative movement between an optics portion (or one or more portions thereof) and a sensor array (or one or more portions thereof), to provide a mechanical iris for use in automatic exposure control and/or manual exposure control. As stated above, such movement may be provided, for example, by using actuators, e.g., MEMS actuators, and by applying appropriate control signal(s) to one or more of the actuators to cause the one or more actuators to move, expand and/or contract to thereby move the associated optics portion.

As with each of the embodiments disclosed herein, the above embodiments may be employed alone or in combination with one or more other embodiments disclosed herein, or portions thereof.

In addition, it should also be understood that the embodiments disclosed herein may also be used in combination with one or more other methods and/or apparatus, now known or later developed.

Other embodiments for are disclosed in the Apparatus for Multiple Camera Devices and Method of Operating Same patent application publication. As stated above, the structures and/or methods described and/or illustrated in the Apparatus for Multiple Camera Devices and Method of Operating Same patent application publication may be employed in conjunction with one or more of the aspects and/or embodiments of the present inventions.

Thus, for example, one or more portions of one or more embodiments of the digital camera apparatus disclosed in the Apparatus for Multiple Camera Devices and Methods of Operating Same patent application publication may be employed in a digital camera apparatus 210 having one or more actuators, e.g., e.g., actuator 430A-430D, 434A-434D, 438A-438D, 442A-442D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), for example, to move one or more portions of one or more optics portion and/or to move one or more portions of one or more sensor portions. In addition, in some embodiments, for example, one or more actuators, e.g., e.g., actuator 430A-430D, 434A-434D, 438A-438D, 442A-442D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), may be employed in one or more embodiments of the digital camera apparatus 300 disclosed in the Apparatus for Multiple Camera Devices and Method of Operating Same patent application publication, for example, to move one or more portions of one or more optics portion and/or to move one or more portions of one or more sensor portions.

For the sake of brevity, the structures and/or methods described and/or illustrated in the Apparatus for Multiple Camera Devices and Method of Operating Same patent application publication will not be repeated. It is expressly noted, however, that the entire contents of the Apparatus for Multiple Camera Devices and Method of Operating Same patent application publication, including, for example, the features, attributes, alternatives, materials, techniques and advantages of all of the inventions, are incorporated by reference herein, although, unless stated otherwise, the aspects and/or embodiments of the present invention are not limited to such features, attributes alternatives, materials, techniques and advantages.

The output of the exposure control 834 is supplied to the Auto/Manual focus control 836, the purpose of which is to ensure that targets in an image are in focus. For example, when an image is over or under focus, the objects in the image are blurred. The image has peak sharpness when the lens is at a focus point. In one embodiment, the auto focus control 836 detects the amount of blurriness of an image, in a preview mode, and moves the lens back and forth accordingly to find the focus point, in a manner similar to that employed in traditional digital still cameras.

However, other embodiments may also be employed. For example, consider a situation where it is desired to take a picture of a person. The lens may be moved back and forth to find the focus point, in a manner similar to that employed in traditional digital still cameras, so that the person is in focus. However, if the person moves forward or backward, the image may become out of focus. This phenomenon is due to the Depth of Focus of the lens. In layman terms, Depth of Focus is a measure of how much the person can move forward or backward in front of the lens before the person becomes out of focus. In that regard, some embodiments employ an advance auto focus mechanism that, in effect, increases the Depth of Focus number by 10, 20 or more times, so that the camera focus is insensitive (or at least less sensitive) of target location. As a result, the target is in focus most of the time. As is known, Depth of Focus may be increased by using an off the shelf optical filter with an appropriate pattern, on the top of the lens, in conjunction with a public domain wave front encoding algorithm.

The output of the focus control 836 is supplied to the zoom controller 838. The purpose of the zoom controller 838 is similar to that of a zoom feature found in traditional digital cameras. For example, if a person appears in a television broadcast wearing a tie with a striped pattern, colorful lines sometimes appear within the television image of the tie. This phenomenon, which is called aliasing, is due to the fact that the television camera capturing the image does not have enough resolution to capture the striped pattern of the tie.

As stated above, the positioning system may provide movement of the optics portion (or portions thereof) and/or the sensor portion (or portions thereof) to provide a relative positioning desired there between with respect to one or operating modes of the digital camera system. As further described below, relative movement between an optics portion (or one or more portions thereof) and a sensor portion (or one or more portions thereof), including, for example, but not limited to relative movement in the x and/or y direction, z direction, tilting, rotation (e.g., rotation of less than, greater than and/or equal to 360 degrees) and/or combinations thereof, may be used in providing various features and/or in the various applications disclosed herein, including, for example, but not limited to, increasing resolution (e.g., increasing detail), zoom, 3D enhancement, image stabilization, image alignment, lens alignment, masking, image discrimination, auto focus, mechanical shutter, mechanical iris, hyperspectral imaging, a snapshot mode, range finding and/or combinations thereof.

In some embodiments, for example, aliasing is removed or substantially reduced by moving the lens by a distance of 0.5 pixel in the x direction and the y direction, capturing images for each of the directions and combining the captured images. If aliasing is removed or reduced, resolution is increased beyond the original resolution of the camera. In some embodiments, the resolution can be enhanced by 2 times. With double resolution, it is possible to zoom closer by a factor of 2. The lens movement of 0.5 pixel distance can be implemented using one or more MEMS actuators sitting underneath the lens structure.

The output of the zoom controller 838 is supplied to the gamma correction stage 840, which helps to map the values received from the camera channels, e.g., camera channels 260A-260D, into values that more closely match the dynamic range characteristics of a display device (e.g., a liquid crystal display or cathode ray tube device). The values from the camera channels are based, at least in part, on the dynamic range characteristics of the sensor, which often does not match the dynamic range characteristics of the display device. The mapping provided by gamma correction stage 840 helps to compensate for the mismatch between the dynamic ranges.

Figure 37I:
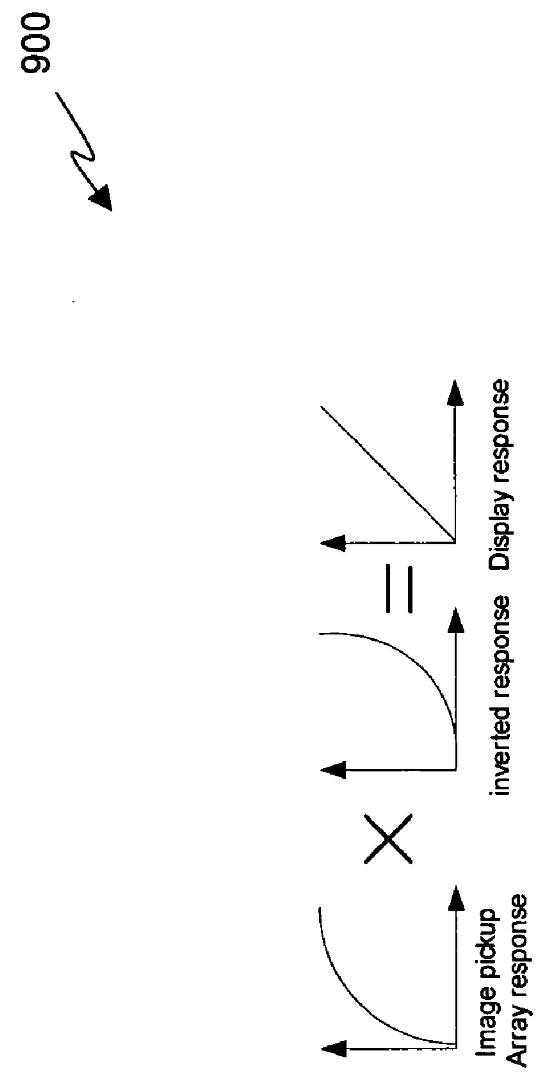

FIG. 37I is a graphical representation 900 showing an example of the operation of the gamma correction stage 840.

Figure 37J:
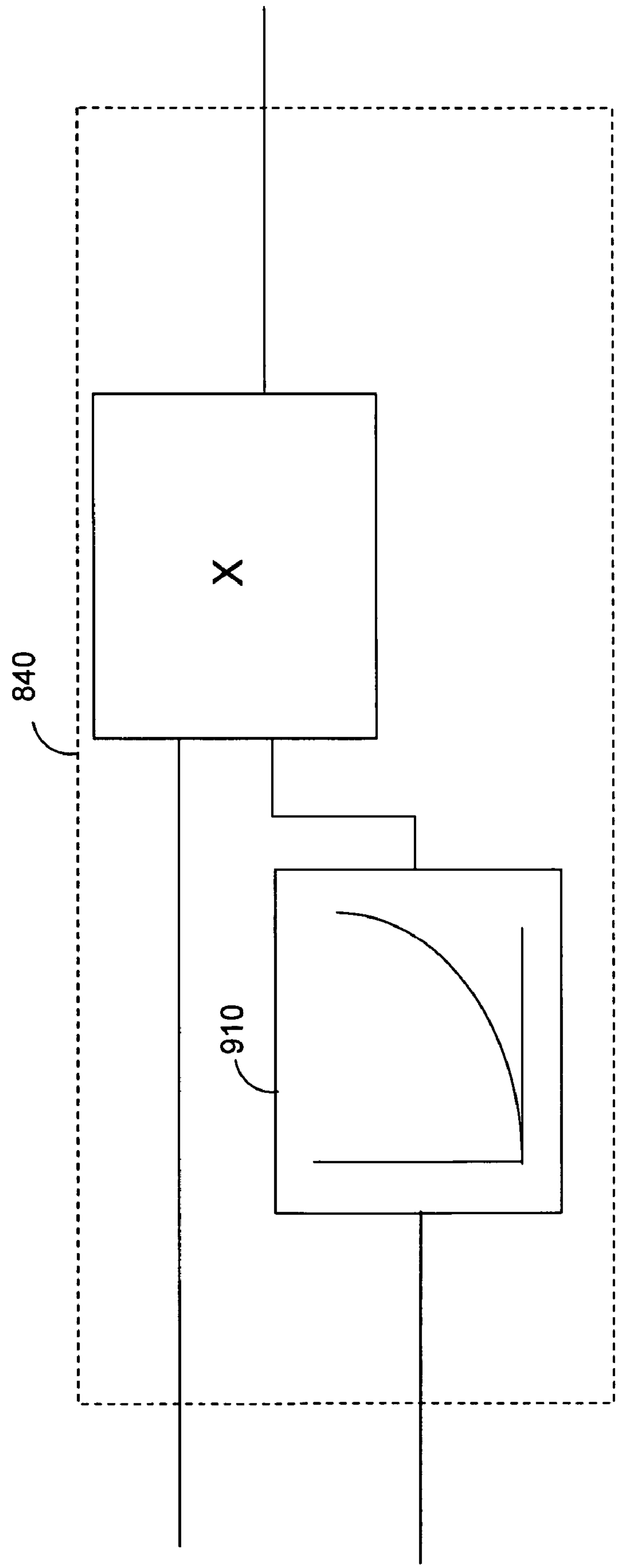

FIG. 37J shows one embodiment of the gamma correction stage 840. In this embodiment, the gamma correction stage 840 employs a conventional transfer function 910 to provide gamma correction. The transfer function 910 may be any type of transfer function including a linear transfer function, a non-linear transfer function and/or combinations thereof. The transfer function 910 may have any suitable form including but not limited to one or more equations, lookup tables and/or combinations thereof. The transfer function 910 may be predetermined, adaptively determined and/or combinations thereof.

The output of the gamma correction stage 840 is supplied to the color correction stage 842, which helps to map the output of the camera into a form that matches the color preferences of a user. In this embodiment, the color correction stage generates corrected color values using a correction matrix that contains a plurality of reference values to implement color preferences as follows (the correction matrix contains sets of parameters that are defined, for example, by the user and/or the manufacturer of the digital camera):

$$\begin{pmatrix} Rc \\ Gc \\ Bc \end{pmatrix} = \begin{pmatrix} Rr & Gr & Br \\ Rg & Gg & Bg \\ Rb & Gb & Bb \end{pmatrix} \times \begin{pmatrix} R \\ G \\ B \end{pmatrix} \quad (1)$$

such that $R$ corrected=$(Rr \times R$ un-corrected)+$(Gr \times G$ un-corrected)+$(Br \times B$ un-corrected), $G$ corrected=$(Rg \times R$ un-corrected)+$(Gg \times G$ un-corrected)+$(Bg \times B$ un-corrected)

and $B$ corrected=$(Rb \times R$ un-corrected)+$(Gb \times G$ un-corrected)+$(Bb \times B$ un-corrected)

where

Figure 37K:
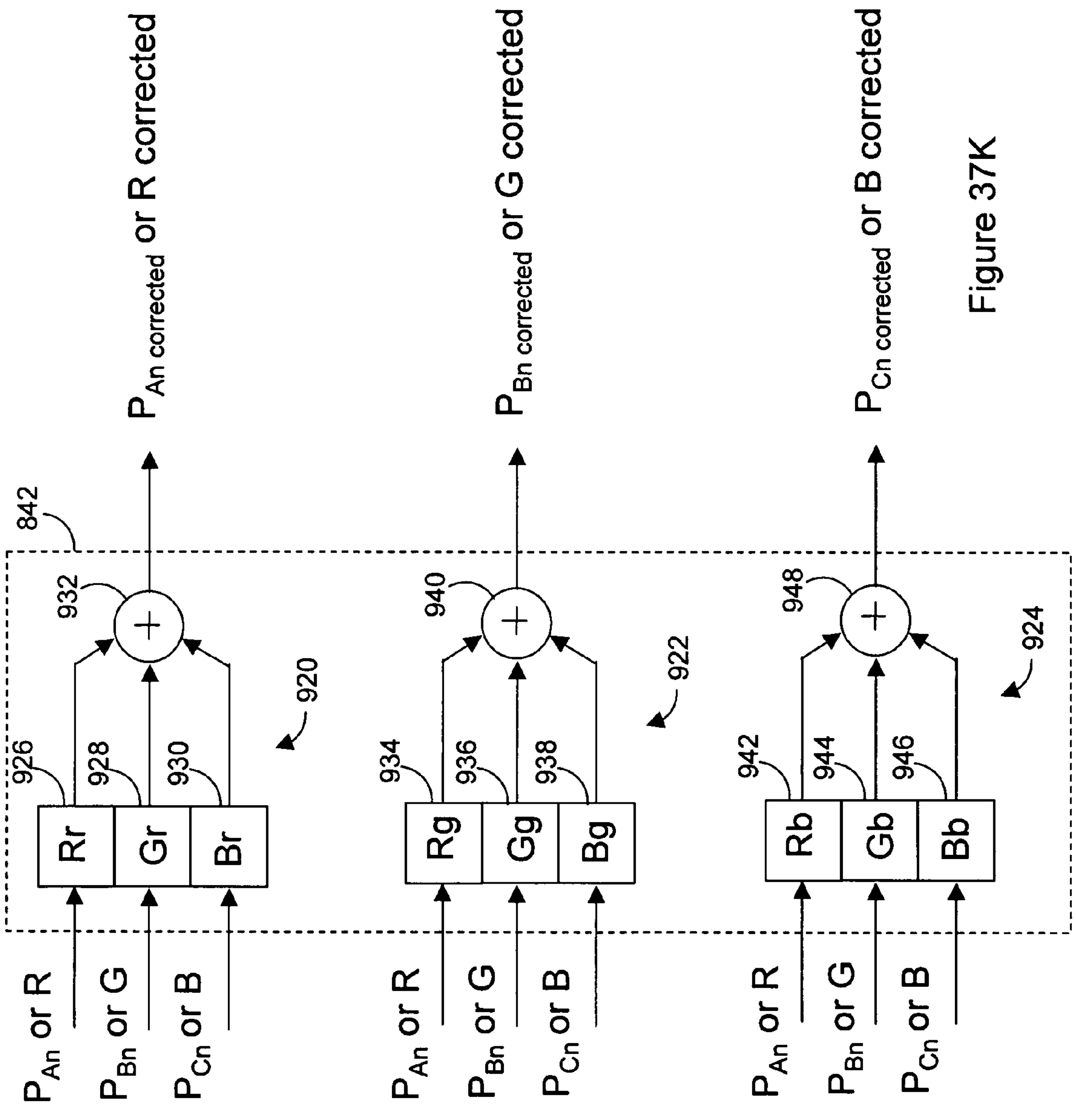

Rr is a value indicating the relationship between the output values from the red camera channel and the amount of red light desired from the display device in response thereto, Gr is a value indicating the relationship between the output values from the green camera channel and the amount of red light desired from the display device in response thereto, Br is a value indicating the relationship between the output values from the blue camera channel and the amount of red light desired from the display device in response thereto, Rg is a value indicating the relationship between the output values from the red camera channel and the amount of green light desired from the display device in response thereto, Gg is a value indicating the relationship between the output values from the green camera channel and the amount of green light desired from the display device in response thereto, Bg is a value indicating the relationship between the output values from the blue camera channel and the amount of green light desired from the display device in response thereto, Rb is a value indicating the relationship between the output values from the red camera channel and the amount of blue light desired from the display device in response thereto, Gb is a value indicating the relationship between the output values from the green camera channel and the amount of blue light desired from the display device in response thereto, and Bb is a value indicating the relationship between the output values from the blue camera channel and the amount of blue light desired from the display device in response thereto, FIG. 37K shows one embodiment of the color correction stage 842. In this embodiment, the color correction stage 842 includes a red color correction circuit 920, a green color correction circuit 922 and a blue color correction circuit 924.

The red color correction circuit 920 includes three multipliers 926, 928, 930. The first multiplier 926 receives the red value (e.g., $P_{An}$) and the transfer characteristic Rr and generates a first signal indicative of the product thereof. The second multiplier 928 receives the green value (e.g., $P_{Bn}$) and the transfer characteristic Gr and generates a second signal indicative of the product thereof. The third multiplier 930 receives the green value (e.g., $P_{Cn}$) and the transfer characteristic Br and generates a third signal indicative of the product thereof. The first, second and third signals are supplied to an adder 932 which produces a sum that is indicative of a corrected red value (e.g., $P_{An\ corrected}$).

The green color correction circuit 922 includes three multipliers 934, 936, 938. The first multiplier 934 receives the red value (e.g., $P_{An}$) and the transfer characteristic Rg and generates a first signal indicative of the product thereof. The second multiplier 936 receives the green value (e.g., $P_{Bn}$) and the transfer characteristic Gg and generates a second signal indicative of the product thereof. The third multiplier 938 receives the green value (e.g., $P_{Cn}$) and the transfer characteristic Bg and generates a third signal indicative of the product thereof. The first, second and third signals are supplied to an adder 940 which produces a sum indicative of a corrected green value (e.g., $P_{Bn\ corrected}$).

The blue color correction circuit 924 includes three multipliers 942, 944, 946. The first multiplier 942 receives the red value (e.g., $P_{An}$) and the transfer characteristic Rb and generates a first signal indicative of the product thereof. The second multiplier 944 receives the green value (e.g., $P_{Bn}$) and the transfer characteristic Gb and generates a second signal indicative of the product thereof. The third multiplier 946 receives the green value (e.g., $P_{Cn}$) and the transfer characteristic Bb and generates a third signal indicative of the product thereof. The first, second and third signals are supplied to an adder 948 which produces a sum indicative of a corrected blue value (e.g., $P_{Cn\ corrected}$).

Figure 37L:
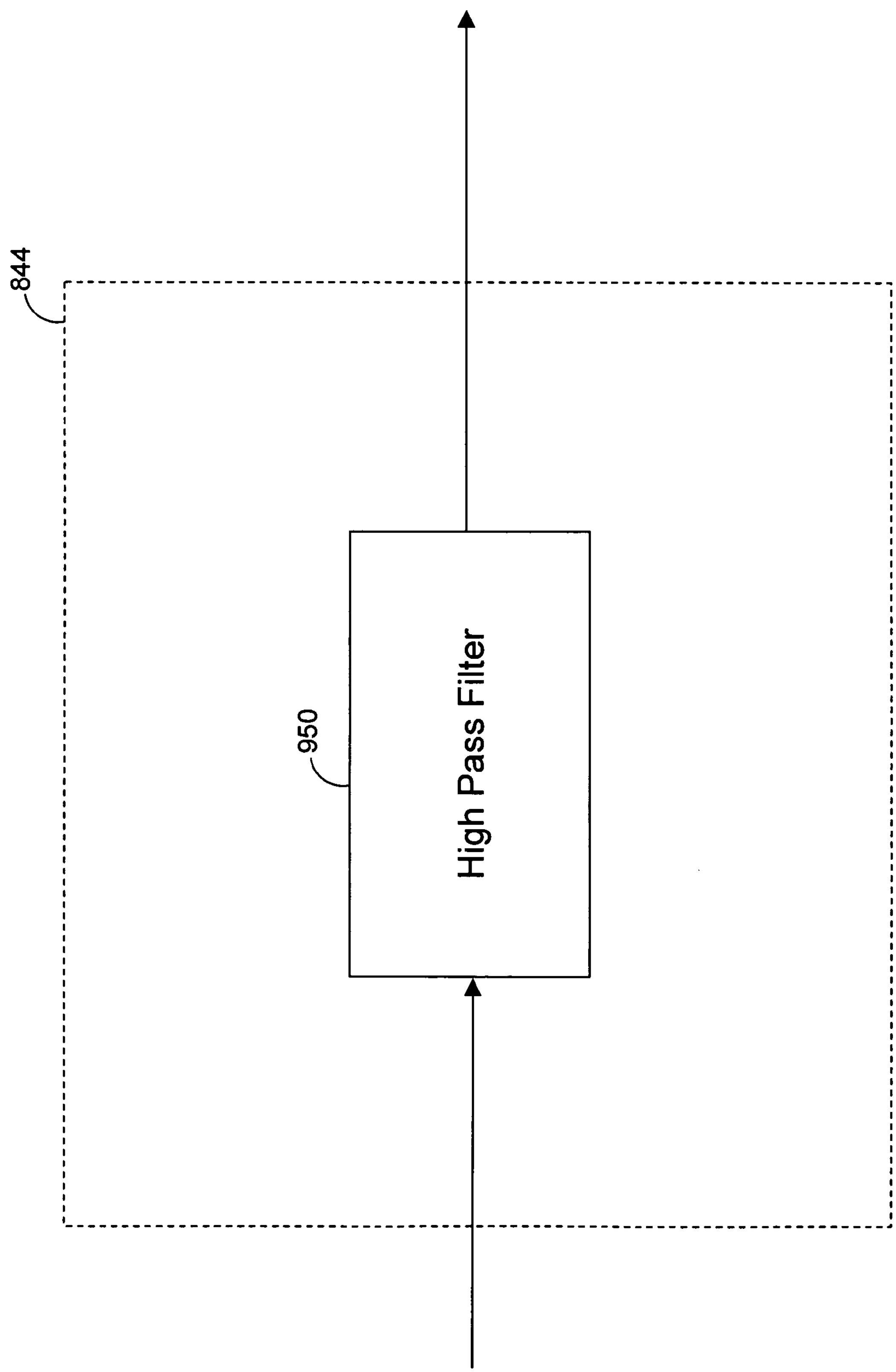

The output of the color corrector 842 is supplied to the edge enhancer/sharpener 844, the purpose of which is to help enhance features that may appear in an image. FIG. 37L shows one embodiment of the edge enhancer/sharpener 844. In this embodiment, the edge enhancer/sharpener 844 comprises a high pass filter 950 that is applied to extract the details and edges and apply the extraction information back to the original image.

The output of the edge enhancer/sharpener 844 is supplied to the random noise reduction stage 846. Random noise reduction may include, for example, a linear or non-linear low pass filter with adaptive and edge preserving features. Such noise reduction may look at the local neighborhood of the pixel in consideration. In the vicinity of edges, the low pass filtering may be carried out in the direction of the edge so as to prevent blurring of such edge. Some embodiments may apply an adaptive scheme. For example, a low pass filter (linear and/or non linear) with a neighborhood of relatively large size may be employed for smooth regions. In the vicinity of edges, a low pass filter (linear and/or non-linear) and a neighborhood of smaller size may be employed, for example, so as not to blur such edges.

Other random noise reduction may also be employed, if desired, alone or in combination with one or more embodiments disclosed herein. In some embodiments, random noise reduction is carried out in the channel processor, for example, after deviant pixel correction. Such noise reduction may be in lieu of, or in addition to, any random noise reduction that may be carried out in the image pipeline.

The output of the random noise reduction stage 846 is supplied to the chroma noise reduction stage 848. The purpose of the chroma noise reduction stage 848 is to reduce the appearance of aliasing. The mechanism may be similar to that employed in the zoom controller 838. For example, if the details in a scene are beyond the enhanced resolution of the camera, aliasing occurs again. Such aliasing manifests itself in the form of false color (chroma noise) in a pixel per pixel basis in an image. By filtering high frequency components of the color information in an image, such aliasing effect can be reduced.

The output of the chroma noise reduction portion 848 is supplied to the Auto/Manual white balance portion 850, the purpose of which is to make sure that a white colored target is captured as a white colored target, not slightly reddish/greenish/bluish colored target. In this embodiment, the auto white balance stage 850 performs a statistical calculation on an image to detect the presence of white objects. If a white object is found, the algorithm will measure the color of this white object. If the color is not pure white, then the algorithm will apply color correction to make the white object white. Auto white balance can have manual override to let a user manually enter the correction values.

The output of the white balance portion 850 is supplied to the Auto/Manual color enhancement portion 852, the purpose of which is to further enhance the color appearance in an image in term of contrast, saturation, brightness and hue. This is similar in some respects to adjusting color settings in a TV or computer monitor. In some embodiments, auto/manual color enhancement is carried out by allowing a user to specify, e.g., manually enter, a settings level and an algorithm is carried out to automatically adjust the settings based on the user supplied settings level.

The output of the Auto/Manual color enhancement portion 852 is supplied to the image scaling portion 854, the purpose of which is to reduce or enlarge the image. This is carried out by removing or adding pixels to adjust the size of an image.

The output of the image scaling portion 852 is supplied to the color space conversion portion 856, the purpose of which is to convert the color format from RGB to YCrCB or YUV for compression. In some embodiments, the conversion is accomplished using the following equations:

$$Y=(0.257*R)+(0.504*G)+(0.098*B)+16$$

$$Cr=V=(0.439*R)-(0.368*G)-(0.071*B)+128$$

$$Cb=U=-(0.148*R)-(0.291*G)+(0.439*B)+128$$

The output of the color space conversion portion 856 is supplied to the image compression portion of the post processor. The purpose of the image compression portion is to reduce the size of image file. This may be accomplished using an off the shelf JPEG, MPEG or WMV compression algorithm.

The output of the image compression portion is supplied to the image transmission formatter, the purpose of which is to format the image data stream to comply with YUV422, RGB565, etc format both in bi-directional parallel or serial 8-16 bit interface.

Figure 38:
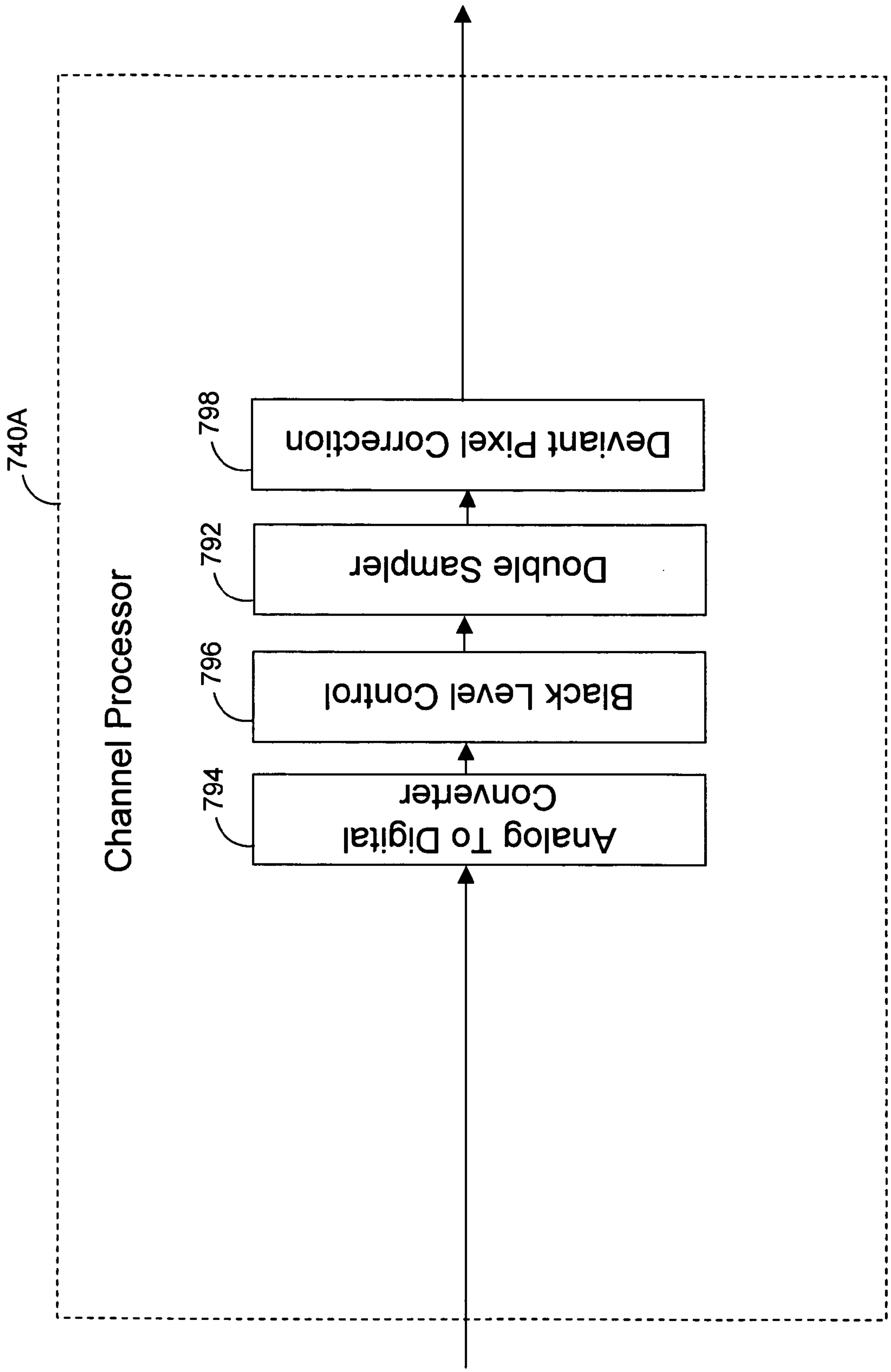

FIG. 38 shows another embodiment of the channel processor. In this embodiment, the double sampler 792 receives the output of the analog to digital converter 794 instead of the output of the sensor portion, e.g., sensor portion 264A.

FIGS. 39-40 show another embodiment of the channel processor, e.g., channel processor 740A, and image pipeline 742, respectively. In this embodiment, the deviant pixel corrector 798 is disposed in the image pipeline 742 rather than the channel processor, e.g., channel processor 740A. In this embodiment, the deviant pixel corrector 748 receives the output of the image plane alignment and stitching 832 or the exposure control 834 rather than the output of the black level clamp 796.

In some embodiments, each of the channel processors are identical, e.g., channel processors 740B-740D (FIG. 36A) are identical to the channel processor 740A. In some other embodiments, one or more of the channel processors is different than one or more other channel processor in on or more ways, e.g., one or more of channel processors 740B-740D are different than channel processor 740A in one or more ways. For example, as stated above, in some embodiments, one or more of the channel processors 740A-740D are tailored to its respective camera channel.

It should be understood that the channel processor, e.g., channel processors 740A-740D, the image pipeline 742 and/or the post processor 744 may have any configuration. For example, in some other embodiments, the image pipeline 742 employs fewer than all of the blocks shown in FIGS. 36C, 37E and/or FIG. 40, with or without other blocks and in any suitable order. In some embodiments for example a post processor 744 (FIG. 36A) may not be employed.

As stated above, relative movement between one or more optics portions (or portions thereof) and one or more sensor portions (or portions thereof) may be used in providing various features and/or in various applications, including for example, but not limited to, increasing resolution (e.g., increasing detail), zoom, 3D enhancement, image stabilization, image alignment, lens alignment, masking, image discrimination, auto focus, mechanical shutter, mechanical iris, multispectral and hyperspectral imaging, snapshot mode, range finding and/or combinations thereof.

Increasing Resolution

FIGS. 41A-41J show an example of how movement in the x direction and/or y direction may be used to increase the resolution (e.g., detail) of images provided by the digital camera apparatus 210.

In this example, a first image is captured with the optics and sensor in a first relative positioning (e.g., an image captured with the positioning system 280 in a rest position). In that regard, FIG. 41A shows an image of an object (a lightning bolt) 1000 striking a sensor or a portion of a sensor, for example, the portion of the sensor 264A illustrated in FIGS. 6A-6B, 7A-7B, with the optics, e.g., optics portion 262A, and the sensor, e.g., sensor portion 264A, of a camera channel, e.g., camera channel 260A, in a first relative positioning. The first captured image 1002 is shown in FIG. 41B. This is the image that could be displayed based upon the information in the first captured image. In FIG. 41A, sensor elements are represented by circles $\mathbf{380}_{i,j}$-$\mathbf{380}_{i+2,j+2}$ and photons that form the image of the object are represented by shading. In this example, photons that strike the sensor elements (e.g., photons that strike within the circles $\mathbf{380}_{i,j}$-$\mathbf{380}_{i+2,j+2}$) are sensed and/or captured by the sensor elements $\mathbf{380}_{i,j}$-$\mathbf{380}_{i+2,j+2}$. Photons that do not strike the sensor elements (e.g., photons that strike outside the circles $\mathbf{380}_{i,j}$-$\mathbf{380}_{i+2,j+2}$) are not sensed and/or captured by the sensor elements. Notably, portions of the image of the object 1000 that do not strike the sensor elements do not appear in the captured image 1002.

The optics and/or the sensor are thereafter moved (e.g., shifted) in the x direction and/or y direction to provide a second relative positioning of the optics and the sensor, and a second image is captured with the optics and the sensor in such positioning. The movement may be provided, for example, using any of the structure(s) and/or method(s) disclosed herein, for example, by providing an electronic stimuli to one or more actuators of the positioning system 280, which may, in turn, shift the lenses (in this example, eastward) by a small distance.

FIG. 41C shows an image of the object 1000 striking the portion of the sensor, e.g., sensor 264A, with the optics, e.g., optics 262A, and the sensor, e.g., sensor 264A, in a second relative positioning. FIG. 41D shows the second captured image 1004. This second image 1004 represents a second set of data that, in effect, doubles the number of pixel signals.

FIG. 41E shows the relationship between the first relative positioning and the second relative positioning. In FIG. 41E, dashed circles indicate the positioning of the sensor elements relative to the image of the object 1000 with the optics, e.g., optics 262A, and the sensor, e.g., sensor 264A, in the first relative positioning. Solid circles indicate the positioning of the sensor elements relative to the image of the object 1000 with the optics, e.g., optics 262A, and the sensor, e.g., sensor 264A, in the second relative positioning.

As can be seen, the position of the image of the object 1000 relative to the sensor, e.g., sensor 264A, with the optics, e.g., optics 262A, and the sensor, e.g., sensor 264A, in the first relative positioning, is different than the positioning of the image of the object 1000 relative to sensor, e.g., sensor 264A, with the optics, e.g., optics 262A, and the sensor, e.g., sensor 264A, in the second relative positioning. The difference between the first positioning of the image of the object 1000 relative to the sensor, e.g., sensor 264A, and the second positioning of the image of the object 1000 relative to the sensor, e.g., sensor 264, may be represented by a vector 1010.

As with the first relative positioning, some photons do not strike the sensor elements and are therefore not sensed and/or captured. Portions of the image of the object that do not strike the sensor elements do not appear in the second captured image 1004. Notably, however, in the second relative positioning, the sensor elements sense and/or capture some of the photons that were not sensed and/or captured by the first relative positioning. Consequently, the first and second images 1002, 1004 may be "combined" to produce an image that has greater detail than either the first or second captured images, taken individually, and thereby increase the effective resolution of the digital camera apparatus. FIG. 41F shows an example of an image 1008 that is a combination of the first and second captured images 1002, 1004. A comparison of the image 1008 of FIG. 41F to the image 1002 of FIG. 41B reveals the enhanced detail that may be displayed as a result thereof.

If desired, the optics and/or the sensor may thereafter be moved (e.g., shifted) in the x direction and/or y direction to provide a third relative positioning of the optics and the sensor, and a third image may be captured with the optics and the sensor in such positioning.

The movement may be provided, for example, using any of the structure(s) and/or method(s) disclosed herein, for example, by providing an electronic stimuli to actuators of the positioning system 280, which may shift the lenses (in this example, southward) by a small distance.

FIG. 41G shows an image of the object 1000 striking the portion of the sensor, e.g., sensor 264A, with the optics, e.g., optics 262A, and the sensor, e.g., sensor 264A, in a third relative positioning. FIG. 41H shows a third captured image 1012. This third image 1012 represents a third set of data that, in effect, triples the number of pixel signals.

FIG. 41I shows the relationship between the first, second and third relative positioning. In FIG. 41I, dashed circles indicate the positioning of the sensor elements relative to the image of the object 1000 with the optics, e.g., optics 262A, and the sensor, e.g., sensor 264A, in the first and second relative positioning. Solid circles indicate the positioning of the sensor elements relative to the image of the object 1000 with the optics, e.g., optics 262A, and the sensor, e.g., sensor 264A, in the third relative positioning.

As can be seen, the position of the image of the object 1000 relative to the sensor, e.g., sensor 264A, with the optics, e.g., optics 262A, and the sensor, e.g., sensor 264A, in the third relative positioning, is different than the positioning of the image of the object 1000 relative to sensor, e.g., sensor 264A, with the optics, e.g., optics 262A, and the sensor, e.g., sensor 264A, in the first and second relative positioning. The difference between the first positioning of the image of the object 1000 relative to the sensor, e.g., sensor 264A, and the third positioning of the image of the object 1000 relative to the sensor, e.g., sensor 264, may be represented by a vector 1014.

In the third relative positioning, as with the first and second relative positioning, some photons do not strike the sensor elements and are therefore not sensed and/or captured. Portions of the image of the object that do not strike the sensor elements do not appear in the third captured image 1012. However, in the third relative positioning, the sensor elements sense and/or capture some of the photons that were not sensed and/or captured by the first or second relative positioning. Consequently, if the first, second and third images 1002, 1004, 1012 are "combined", the resulting image has greater detail than either of the first, second or third captured images, taken individually, which can be viewed as an increase in the effective resolution of the digital camera apparatus. FIG. 41J shows an example of an image 1016 that is a combination of the first, second and third captured images 1002, 1004, 1012. A comparison of the image 1016 of FIG. 41J to the images 1002, 1008 of FIGS. 41B and 41F reveals the enhanced detail that may be displayed as a result thereof.

In some embodiments, one or more additional image(s) are captured and combined to create an image having higher resolution than the captured images. For example, after the third image is captured, the optics and/or the sensor may thereafter be moved (e.g., shifted) in the x direction and/or y direction to provide a fourth relative positioning of the optics and the sensor, and a fourth image may be captured with the optics and the sensor in such positioning.

It should be understood that the movement employed in the x direction and/or y direction) may be carried out in any way.

It should be understood that the movement employed in the x direction and/or y direction may be divided into any number of steps so as to provide any number of different relative positionings (between the optics and the sensor for a camera channel) in which images may be captured. In some embodiments, the movements are divided into two or more steps in the x direction and two or more steps in the y direction. The steps may or may not be equal to one another in size. In some embodiments, nine steps are employed. The amount of movement from one relative positioning to another relative positioning may be ⅓ of a pixel. In some embodiment, the relative movement is in the form of a ⅓ pixel×⅓ pixel pitch shift in a 3×3 format.

In some embodiments, the amount of movement used to transition from one relative positioning (between the optics and the sensor of a camera channel) to another relative positioning, is at least, or at least about, one half (½) the width of one sensor element (e.g., a dimension, in the x direction and/or y direction, of one pixel) of the sensor array and/or at least, or at least about, one half (½) of the width of one unit cell (e.g., a dimension, in the x direction and/or y direction, of a unit cell), if any, of the sensor array. In some embodiments, the amount of movement used to transition from one relative positioning (between the optics and the sensor of a camera channel) to another relative positioning is equal to, or about equal to, one half (½) the width of one sensor element (e.g., a dimension, in the x direction and/or y direction, of one pixel) of the sensor array and/or, equal to, or about equal to, one half (½) of the width of one unit cell (e.g., a dimension, in the x direction and/or y direction, of a unit cell), if any, of the sensor array.

In some embodiments, the amount of movement used to transition from one relative positioning (between the optics and the sensor of a camera channel) to another relative positioning is equal to, or about equal to, the width of one sensor element (e.g., a dimension, in the x direction and/or y direction, of one pixel) of the sensor array and/or equal to, or about equal to, the width of one unit cell (e.g., a dimension, in the x direction and/or y direction, of a unit cell), if any, of the sensor array. In some embodiments, the amount of movement used to transition from one relative positioning (between the optics and the sensor of a camera channel) to another relative positioning is equal to, or about equal to, two times the width of one sensor element (e.g., a dimension, in the x direction and/or y direction, of one pixel) of the sensor array and/or equal to, or about equal to, two times the width of one unit cell (e.g., a dimension, in the x direction and/or y direction, of a unit cell), if any, of the sensor array.

In some embodiments, for example, the magnitude of movement may be equal to the magnitude of the width of one sensor element or two times the magnitude of the width of one sensor element. In some embodiments (for example imagers with CFAs (e.g., color filter arrays)), for example, the magnitude of movement may be equal to the magnitude of the width of one sensor element to fill in missing colors In some embodiments, the amount of movement used to transition from one relative positioning (between the optics and the sensor of a camera channel) to another relative positioning changes the relative positioning between the sensor and the image of the object by an amount that is at least, or at least about, one half (½) the width of one sensor element (e.g., a dimension, in the x direction and/or y direction, of one pixel) of the sensor array and/or at least, or at least about, one half (½) of the width of a unit cell (e.g., a dimension of a unit cell in the x direction and/or y direction), if any, of the sensor array. In some embodiments, the amount of movement used to transition from one relative positioning (between the optics and the sensor of a camera channel) to another relative positioning changes the relative positioning between the sensor and the image of the object by an amount that is equal to or about equal to one half (½) the width of one sensor element (e.g., a dimension, in the x direction and/or y direction, of one pixel) of the sensor array and/or one half (½) of the width of a unit cell (e.g., a dimension of a unit cell in the x direction and/or y direction), if any, of the sensor array.

In some embodiments, it may be advantageous to make the amount of movement equal to a small distance, e.g., 2 microns (2 um), which may be sufficient for many applications. In some embodiments, movements are divided into one half (½) pixel increments.

In some embodiments, there is no advantage in moving a full pixel or more. For example, in some embodiment, the objective is to capture photons that fall between photon capturing portions of the pixels. Moving one full pixel may not capture such photons, but rather may provide the exact same image one pixel over. Images captured by moving more than a pixel could also be captured by moving less than a pixel. For example, an image captured by moving 1.5 pixels could conceivably be captured by moving 0.5 pixels. Some embodiments, move a ½ pixel so as to capture information most directly over area in between the photon capturing portions of the pixels.

In some embodiments, the movement is in the form of dithering, e.g., varying amounts of movement. In some dithered systems, it may be desirable to employ a reduced optical fill factor. In some embodiments, snap-shot integration is employed. Some embodiments provide the capability to read out a signal while integrating, however, in at least some such embodiments, additional circuitry may be required within each pixel to provide such capability.

Thus, it is possible to increase the resolution of the digital camera apparatus without increasing number of sensor elements (e.g., the number of pixels). It should be understood that although FIGS. 41A-41J show only nine pixels a digital camera may have, for example, hundreds of thousands to millions of pixels. The methods disclosed herein to increase resolution may be employed in association with sensors and/or a digital camera apparatus having any number of sensor elements (e.g., pixels).

In view of the above, it should be understood that an increase in resolution can be achieved using relative movement in the x direction, relative movement in the y direction and/or any combination thereof. Thus, for example, relative movement in the x direction may be used without relative movement in the y direction and relative movement in the y direction may be used without relative movement in the x direction. In addition, it should also be understood that a shift of the optics and/or sensor portions need not be purely in the x direction or purely in the y direction. Thus, for example, a shift may have a component in the x direction, a component in the y direction and/or one or more components in one or more other directions.

It should also be understood that similar results may be obtain using other types of relative movement, including, for example, but not limited to relative movement in the z direction, tilting, and/or rotation. For example, each of these types of relative movement can be used to cause an image of an object to strike different sensor elements on a sensor portion.

In some embodiments an image of increase resolution from one camera channel may be combined, at least in part, directly or indirectly, with an image of increase resolution from one or more other camera channels, for example, to provide a full color image.

For example, if the digital camera apparatus 210 is to provide an image with increased resolution, it may be desirable to employ the methods described herein in association with each camera channel that is to contribute to such image. As stated above, if the digital camera system includes more than one camera channels, the image processor may generate a combined image based on the images from two or more of the camera channels, at least in part.

In that regard, in one example below, the method for increasing resolution is applied to each camera channel that is to contribute to an image.

To that effect, in one example, a first image is captured from each camera channel that is to contribute to an image (i.e., an image of increased resolution) to be generated by the digital camera apparatus. The first image captured from each such camera channel is captured with the optics and the sensor of such camera channel in a first relative positioning (e.g., an image is captured with the positioning system 280 in a rest position). In some embodiments, the first positioning provided for one camera channel is the same or similar to the first positioning provided for each of the other channels, if any. Notably, however, the first positioning provided for one camera channel may or may not be the same as or similar to the first positioning provided for another camera channel.

The optics and/or the sensor of each camera channel that is to contribute to the image, are thereafter moved (e.g., shifted) in the x direction and/or y direction to provide a second relative positioning of the optics and the sensor for each such camera channel, and a second image is captured from each such camera channel with the optics and the sensor of each such camera channel in such positioning. In this embodiment, the first image captured from each such camera channel is captured with the optics and the sensor of such camera channel in a first relative positioning. In some embodiments, the second positioning provided for one camera channel is the same or similar to the second positioning provided for each of the other channels, if any. However, as with the first positioning (and any additional positioning) the second positioning provided for one camera channel may or may not be the same as or similar to the second positioning provided for another camera channel.

The movement may be provided, for example, using any of the structure(s) and/or method(s) disclosed herein, for example, by providing an electronic stimuli to one or more actuators of the positioning system 280, which may, in turn, shift the lenses (in this example, eastward) by a small distance.

If desired, the optics and/or the sensor of each camera channel that is to contribute to the image may thereafter be moved (e.g., shifted) in the x direction and/or y direction to provide a third relative positioning of the optics and the sensor for each such camera channel, and a third image may be captured from each such camera channel with the optics and the sensor of each such camera channel in such positioning. As with the first and second positioning (and any additional positioning) the third positioning provided for one camera channel may or may not be the same as or similar to the third positioning provided for another camera channel.

In some embodiments, one or more additional image(s) are captured and combined to create an image having higher resolution than the captured images. For example, after the third image(s) are captured, the optics and/or the sensor of each camera channel that is to contribute to the image may thereafter be moved (e.g., shifted) in the x direction and/or y direction to provide a fourth relative positioning of the optics and the sensor for each such camera channel, and a fourth image may be captured from each such camera channel with the optics and the sensor of each such camera channel in such positioning. As with the first positioning (and any additional positioning) the fourth positioning provided for one camera channel may or may not be the same as or similar to the fourth positioning provided for another camera channel.

It should be understood that there is no requirement to employ the methods described herein in association with each camera channel that is to contribute to an image. Nor is increasing resolution limited to camera channels that contribute to an image to be displayed. Indeed, the methods described and/or illustrated in this example may be employed in any type of application and/or in association with any number of camera channels, e.g., camera channels 260A-260D, of the digital camera apparatus 210. Thus, if the digital camera apparatus 210 includes four camera channels, e.g., camera channels 260A-260D, the methods described and illustrated by this example may be employed in association with one, two, three or four of such camera channels.

FIG. 42A shows a flowchart 1018 of steps that may be employed in increasing resolution, in accordance with one embodiment of the present invention. In this embodiment, at a step 1020, a first image is captured from one or more camera channels of the digital camera apparatus 210. In that regard, in some embodiments a first image is captured from at least two of the camera channels of the digital camera apparatus 210. In some embodiments, a first image is captured from at least three camera channels. In some embodiments, a first image is captured from each camera channel that is to contribute to an image of increased resolution. As stated above, if the digital camera system includes more than one camera channels, the image processor may generate a combined image based on the images from two or more of the camera channels, at least in part. For example, in some embodiments, each of the camera channels is dedicated to a different color (or band of colors) or wavelength (or band of wavelengths) than the other camera channels and the image processor combines the images from the two or more camera channels to provide a full color image.

In this embodiment, the first image captured from each such camera channel is captured with the optics and the sensor of such camera channel in a first relative positioning. As stated above, the first positioning provided for one camera channel may or may not be the same as or similar to the first positioning provided for another camera channel.

At a step 1022, the optics and/or the sensor of each camera channel are thereafter moved to provide a second relative positioning of the optics and the sensor for each such camera channel. The movement may be provided, for example, by providing one or more control signals to one or more actuators of the positioning system 280.

At a step 1024, a second image is captured from each camera channel, with the optics and the sensor of each such camera channel in the second relative positioning. As with the first (and any additional) positioning the second positioning provided for one camera channel may or may not be the same as or similar to the second positioning provided for another camera channel.

At a step 1026, two or more of the captured images are, combined, at least in part, directly or indirectly, to produce, for example, an image, or portion thereof, that has greater resolution than either of the two or more images taken individually.

In that regard, in some embodiments, a first image from a first camera channel and a second image from the first camera channel are combined, at least in part, directly or indirectly, to produce, for example, an image, or portion thereof, that has greater resolution than either of the two images taken individually. In some embodiments, first and second images from a first camera channel are combined with first and second images from a second camera channel. In some embodiments, first and second images from each of three camera channels are combined. In some embodiments, first and second images from each of four camera channels are combined.

In some embodiments, first and second images from a camera channel are combined with first and second images from all other camera channels that are to contribute to an image of increased resolution. In some embodiments, first and second images from two or more camera channels are combined to provide a full color image.

In some embodiments, one or more additional image(s) are captured and combined to create an image having even higher resolution. For example, in some embodiments, a third image is captured from each of the camera channels. In some embodiments, a third and a fourth image is captured from each of the camera channels.

FIGS. 42B-42F are a diagrammatic representation showing one embodiment for combining four images captured from a camera channel to produce, for example, an image, or portion thereof, that has greater resolution than any of the four images taken individually.

For example, FIG. 42B is a diagrammatic representation 1030 of pixel values, e.g., pixel values $\mathbf{P1}_{11}$-$\mathbf{P1}_{mn}$, corresponding to a first image captured from a first camera channel with a first relative positioning of the optics and sensor. FIG. 42C is a diagrammatic representation 1032 of pixel values, e.g., pixel values $\mathbf{P2}_{11}$-$\mathbf{P2}_{mn}$, corresponding to a second image captured with a second relative positioning of the optics and sensor. FIG. 42D is a diagrammatic representation 1034 of pixel values, e.g., pixel values $\mathbf{P3}_{11}$-$\mathbf{P3}_{mn}$, corresponding to a third image captured from the first camera channel with a third relative positioning of the optics and sensor. FIG. 42E is a diagrammatic representation 1036 of pixel values, e.g., pixel values $\mathbf{P4}_{11}$-$\mathbf{P4}_{mn}$, corresponding to a fourth image captured from the first camera channel with a fourth relative positioning of the optics and sensor.

FIG. 42F is a diagrammatic representation 1038 of a manner in which images may be combined in one embodiment. In this embodiment, the combined image includes pixel values from four images captured from a camera channel, e.g., the first, second, third and fourth images represented in FIGS. 42B-42E. In the combined image, the pixel values of the second, third and fourth images are shifted compared to the pixel values of the first image. A different shift is employed for each of the second, third and fourth images, and depends on the difference between the relative positioning for such image and the relative positioning for the first image.

For purposes of this example, it is assumed that the relative positioning for the first image is similar to the relative positioning represented by FIGS. 41A-41B. The relative positioning for the second image is assumed to be similar to that represented by FIGS. 41C-41D. Thus, in relation to the first relative positioning, the second relative positioning causes the image of the object to be shifted to the left in relation to the sensor, such that the sensor appears shifted to the right in relation to the image of the object. In response thereto, in the combined image, the pixel values of the second image are shifted to the right compared to the pixel values of the first image. That is, in the combined image, each pixel value from the second image is shifted to the right of the corresponding pixel value from the first image. For example, in the combined image, the pixel value $\mathbf{P2}_{11}$ is disposed to the right of the pixel value $\mathbf{P1}_{11}$.

The relative positioning for the third image is assumed to be similar to that represented by FIGS. 41G-41H. Thus, in relation to the first relative positioning, the third relative positioning causes the image of the object to be shifted upward in relation to the sensor, such that the sensor appears shifted downward in relation to the image of the object. In response thereto, in the combined image, the pixel values of the third image are shifted downward compared to the pixel values of the first image. For example, in the combined image, the pixel value $\mathbf{P3}_{11}$ is disposed below the pixel value $\mathbf{P1}_{11}$.

The relative positioning for the fourth image is assumed to be a combination of the movement provided for the second relative positioning and the movement provided for the third relative positioning. Thus, in relation to the first relative positioning, the fourth relative positioning causes the image of the object to be shifted to the left and upward in relation to the sensor, such that sensor appears shifted to the right and downward in relation to the image of the object. In response thereto, in the combined image, the pixel values of the fourth image are shifted to the right and downward compared to the pixel values of the first image. For example, in the combined image, the pixel value $\mathbf{P4}_{11}$ is disposed to the right and below the pixel value $\mathbf{P1}_{11}$.

Viewed another way, in this embodiment, the pixel values in a row of pixel values from the second captured image are interspersed with the pixel values in a corresponding row of pixel values from the first captured image. The pixel values in a column of pixel values from the third captured image are interspersed with the pixel values in a corresponding column of pixel values from the first captured image. The pixel values in a row of pixel values from the fourth captured image are interspersed with the pixel values in a corresponding row of pixel values from the third captured image FIGS. 42G-42I show one embodiment of an image combiner 1050 that may be employed to combine two or more images, e.g., four images, captured for a camera channel. In this embodiment, the image combiner 1050 includes a multiplexer 1060 and a multi-phase phase clock 1062. The multiplexer 1060 has a plurality of inputs in0, in1, in2, in3, each of which is adapted to receive a stream (or sequence) of multi-bit digital signals. The data stream of multi-bit signals, $\mathbf{P1}_{11}$, $\mathbf{P1}_{12}$, . . . $\mathbf{P1}_{m,n}$, of the first image for the camera channel is supplied to input in0 via signal lines 1066. The data stream $\mathbf{P2}_{11}$, $\mathbf{P2}_{12}$, . . . $\mathbf{P2}_{m,n}$, of the second image for the camera channel is supplied to input in1 via signal lines 1068. The data stream $\mathbf{P3}_{11}$, $\mathbf{P3}_{12}$, . . . $\mathbf{P3}_{m,n}$, of the third image for the camera channel is supplied to input in2 via signal lines 1070. The data stream $\mathbf{P4}_{11}$, $\mathbf{P4}_{12}$, . . . $\mathbf{P4}_{m,n}$, of the fourth image for the camera channel is supplied to input in3 on signal lines 1072. The multiplexer 1060 has an output, out, that supplies a multi-bit output signal on signal lines 1074. Note that in some embodiments, the multiplexer comprises of a plurality of four input multiplexers each of which is one bit wide.

The multi-phase clock has an input, enable, that receives a signal via signal line 1076. The multi-phase clock has outputs, c0, c1, which are supplied to the inputs s0, s1 of the multiplexer via signal lines 1078, 1080. In this embodiment, the multi-phase clock has four phases, shown in FIG. 42I.

The image combiner 1050 may also be provided with one or more signals (information) indicative of the relative positioning used in capturing each of the images and/or information indicative of the differences between such relative positionings. The combiner generates a combined image based on the multi-bit input signals $\mathbf{P1}_{11}$, $\mathbf{P1}_{12}$, . . . $\mathbf{P1}_{m,n}$, $\mathbf{P2}_{11}$, $\mathbf{P2}_{12}$, . . . $\mathbf{P2}_{m,n}$, $\mathbf{P3}_{11}$, $\mathbf{P3}_{12}$, . . . $\mathbf{P3}_{m,n}$, $\mathbf{P4}_{11}$, $\mathbf{P4}_{12}$, . . . $\mathbf{P4}_{m,n}$, and the relative positioning for each image and/or the differences between such relative positionings.

The combiner generates a combined image, such as, for example, as represented in FIG. 42F. As described above with respect to FIG. 42F, in the combined image, the pixel values of the second, third and fourth images are shifted compared to the pixel values of the first image. A different shift is employed for each of the second, third and fourth images, and depends on the difference between the relative positioning for such image and the relative positioning for the first image.

As stated above, in FIG. 42F, it is assumed that the relative positioning for the first image is similar to the relative positioning represented by FIGS. 41A-41B. The relative positioning for the second image is assumed to be similar to that represented by FIGS. 41C-41D. Thus, in relation to the first relative positioning, the second relative positioning causes the second image to be shifted to the left in relation to the sensor, such that the sensor appears shifted to the right in relation to the image. In response thereto, in the combined image, the pixel values of the second image are shifted to the right compared to the pixel values of the first image.

The relative positioning for the third image is assumed to be similar to that represented by FIGS. 41G-41H. Thus, in relation to the first relative positioning, the third relative positioning causes the third image to be shifted upward in relation to the sensor, such that the sensor appears shifted downward in relation to the image. In response thereto, in the combined image, the pixel values of the third image are shifted downward compared to the pixel values of the first image.

The relative positioning for the fourth image is assumed to be a combination of the movement provided for the second relative positioning and the movement provided for the third relative positioning. Thus, in relation to the first relative positioning, the fourth relative positioning causes the image to be shifted to the left and upward in relation to the sensor, such that sensor appears shifted to the right and downward in relation to the image. In response thereto, in the combined image, the pixel values of the fourth image are shifted to the right and downward compared to the pixel values of the first image.

In one embodiment, the operation of the combiner 1050 is as follows. The combiner 1050 has two states. One state is a wait state. The other state is a multiplexing state. Selection of the operating state is controlled by the logic state of the enable signal supplied on signal line 1076 to the multi-phase clock 1062. The multiplexing state has four phases, which correspond to the four phases of the multi-phase clock 1062. In phase 0, neither of the clock signals, i.e., c1, co, are asserted causing the multiplexer 1060 to output one of the multi-bit signals from the first image for the camera channel, e.g., $P\mathbf{1}_{11}$. In phase 1, clock signal c0, is asserted causing the multiplexer 1060 to output one of the multi-bit signals from the second image of the camera channel, e.g., $P\mathbf{2}_{11}$. In phase 2, clock signal c1, is asserted causing the multiplexer 1060 to output one of the multi-bit signals from the third image of the camera channel, e.g., $P\mathbf{3}_{11}$. In phase 3, both of the clock signals c1, c0 are asserted causing the multiplexer 1060 to output one of the multi-bit signals from fourth image of the camera channel, e.g., $P\mathbf{4}_{11}$.

Thereafter, the clock returns to phase 0, causing the multiplexer 1060 to output another one of the multi-bit signals from the first image of the camera channel, e.g., $P\mathbf{1}_{21}$. Thereafter, in phase 1, the multiplexer outputs another one of the multi-bit signals from the second image of the camera channel, e.g., $P\mathbf{2}_{21}$. In phase 2, the multiplexer 1060 outputs another one of the multi-bit signals from the third camera channel, e.g., $P\mathbf{3}_{21}$. In phase 3, the multiplexer 1060 outputs another one of the multi-bit signals from the fourth camera channel, e.g., $P\mathbf{4}_{21}$.

This operation is repeated until the multiplexer 1060 has output the last multi-bit signal from each of the camera channels, e.g., $P\mathbf{1}_{m,n}$, $P\mathbf{2}_{m,n}$, $P\mathbf{3}_{m,n}$, and $P\mathbf{4}_{m,n}$.

FIG. 43 shows a flowchart 1088 of steps that may be employed in increasing resolution, in accordance with one embodiment of the present invention. In such embodiment, more than two images may be captured from a camera channel.

At a step 1090, a first image is captured from one or more camera channels of the digital camera apparatus 210. In that regard, in some embodiments, a first image is captured from at least two of the camera channels of the digital camera apparatus 210. In some embodiments, a first image is captured from at least three camera channels. In some embodiments, a first image is captured from each camera channel that is to contribute to an image of increased resolution. As stated above, if the digital camera system includes more than one camera channels, the image processor may generate a combined image based on the images from two or more of the camera channels, at least in part. For example, in some embodiments, each of the camera channels is dedicated to a different color (or band of colors) or wavelength (or band of wavelengths) than the other camera channels and the image processor combines the images from the two or more camera channels to provide a full color image.

In this embodiment, the first image captured from each such camera channel is captured with the optics and the sensor of such camera channel in a first relative positioning. As stated above, the first positioning provided for one camera channel may or may not be the same as or similar to the first positioning for another camera channel.

At a step 1092, the optics and/or the sensor of each camera channel are thereafter moved to provide a second relative positioning of the optics and the sensor for each such camera channel. The movement may be provided, for example, by providing one or more control signals to one or more actuators of the positioning system 280. As with the first (and any additional) positioning, and as stated above, the second positioning provided for one camera channel may or may not be the same as or similar to the second positioning provided for another camera channel.

At a step 1094, a second image is captured from each camera channel, with the optics and the sensor of each such camera channel in the second relative positioning.

At a step 1096, a determination is made as to whether all of the desired images have been captured. If all of the desired images have not been captured, then execution returns to step 1092. If all of the desired images have been captured, then at a step 1098, two or more of the captured images are, combined, at least in part, directly or indirectly, to produce, for example, an image, or portion thereof, that has greater resolution than either of the two or more images taken individually. In some embodiments, three or more images from a first camera channel are combined, at least in part, directly or indirectly, to produce, for example, an image, or portion thereof, that has greater resolution than any of such images taken individually. In some embodiments, three or more images from a first camera channel are combined, at least in part, directly or indirectly, with three or more images from a second camera channel to produce, for example, an image, or portion thereof, that has greater resolution than any of such images, taken individually.

In some embodiments, three or more images from a camera channel are combined with three or more images from all other camera channels that are to contribute to an image of increased resolution. In some embodiments, three or more images from each of two or more camera channels are combined to provide a full color image.

In some embodiments, one or more additional image(s) are captured and combined to create an image having even higher resolution. For example, in some embodiments, a third image is captured from each of the camera channels. In some embodiments, a third and a fourth image is captured from each of the camera channels.

Zoom

FIGS. 44A-44G show two ways that a traditional digital camera provides zooming. More particularly, FIG. 44A shows an image of an object 1100 (a lightning bolt) striking a sensor 1102 having 144 sensor elements, e.g., pixels $\mathbf{1104}_{i,j}$-$\mathbf{1104}_{i+11,j+11}$, arranged in a 12×12 array. The captured image 1106, without zooming, is shown in FIG. 44B. In this example, with the lens in its normal (un-zoomed) setting approximately 9 pixels capture photons from the object. As in the examples above, photons that strike the sensor elements, e.g., pixels $\mathbf{1104}_{i,j}$-$\mathbf{1104}_{i+1,j+11}$, (e.g., photons that strike within the circles) are sensed and/or captured thereby. Photons that do not strike the sensor elements, e.g., pixels $\mathbf{1104}_{i,j}$-$\mathbf{1104}_{i+11,j+11}$, (e.g., photons that strike outside the circles) are not sensed and/or captured. Note that although FIG. 44A shows a sensor 1102 having 144 pixels, a sensor may have any number of pixels. In that regard, some sensors have millions of pixels.

FIGS. 44C-44E show an example of traditional digital or electronic zooming (enlarging the target object by electronic processing techniques). With digital zooming, a portion of a captured image is enlarged to thereby produce a new image. FIG. 44C shows a window 1110 around the portion of the image that is to be enlarged. FIG. 44D is an enlarged representation of the sensor elements, e.g., pixels $\mathbf{1104}_{i+3,j+4}$-$\mathbf{1104}_{i+7,j+8}$, and the portion of the image within the window. FIG. 44E shows an image 1112 produced by enlarging the portion of the image within the window 1110. Notably, digital zooming does not improve resolution. To make the object appear larger relative to the overall field of view, the outer portions of the image are cropped out (e.g., the signals from pixels outside the window 1110 are discarded). The remaining image is then enlarged (magnified) to refill the total frame, as shown in FIG. 44E. However, the image 1112 of the object in FIG. 44E still has only 9 pixels worth of data. That is, photons that do not strike the 9 sensor elements (e.g., photons that strike outside the circles) are not sensed and/or captured. As such, electronic zoom yields an image that is the same size as optical zoom, but does so at a sacrifice in resolution. Thus while the object appears larger, imperfections found in the original captured image 1106 also appear larger.

FIGS. 44F-44G show an example of optical zooming (i.e., enlarging the image of the object through the use of optics). With optical zooming, one or more optical components are moved along a z axis so as to increase the size of the image striking the sensor. FIG. 44F shows an image of the object 100 striking the sensor 1102 after optical zooming. With the lens in the zoom position, the field of view is narrowed and the object fills a greater portion of the pixel array. In this example, the image of the object now strikes approximately thirty four of the sensor elements rather than only nine of the sensor elements as in FIG. 44A. This improves the resolution of the captured image. FIG. 44G shows the image 1116 produced by the optical zooming. Notably, while the object appears larger, the size of the imperfections in the original captured image are not correspondingly enlarged.

As illustrated in FIG. 44F-44G, a traditional zoom camera makes an object appear closer by reducing the field of view. Its advantage is that it maintains the same resolution. Its disadvantages are that the lens system is costly and complex. Further, the nature of zoom lenses are that they reduce the light sensitivity and thus increase the F-stop of the lens. This means that the lens is less effective in low light conditions.

FIGS. 45A-45L show an example of how movement in the x direction and/or y direction may be used in zooming.

In this example, a first image is captured with the optics and sensor in a first relative positioning. In that regard, FIG. 45A shows an image of an object (a lightning bolt) 1100 striking a sensor or portion of a sensor, for example, the portion of the sensor 264A illustrated in FIGS. 8A-8B, with the optics, e.g., optics portion 262A, and the sensor, e.g., sensor portion 264A, of a camera channel, e.g., camera channel 260A, in a first relative positioning. A window 1120 is shown around the portion of the image 1100 that is to be enlarged (sometimes referred to herein as the window portion of the image). FIG. 45B shows the captured image 1122 without zooming. FIG. 45C is an enlarged representation of the sensor elements, e.g., pixels $\mathbf{380}_{i+3,j+4}$-$\mathbf{380}_{i+7,j+8}$, and the window portion of the image. FIG. 45D shows the first image 1124 captured for the window portion. Notably, portions of the image that do not strike the sensor elements, $\mathbf{380}_{i,j}$-$\mathbf{380}_{i+11,j+11}$ do not appear in the first captured image. Moreover, although the object 1124 in FIG. 45D appears larger than the object 1122 in FIG. 45B, imperfections also appear larger. In some embodiments, the processor 265 only captures and/or processes data corresponding to the portion of the image within the window.

The optics and/or the sensor are thereafter moved (e.g., shifted) for example, in the x direction and/or y direction to provide a second relative positioning of the optics and the sensor, and a second image is captured with the optics and the sensor in such positioning. The movement may be provided, for example, using any of the structure(s) and/or method(s) disclosed herein.

FIG. 45E is an enlarged representation of the sensor elements, e.g., pixels $\mathbf{380}_{i+3,j+4}$-$\mathbf{380}_{i+7,j+8}$, and the window portion of the image showing the object 1100 striking the sensor elements of sensor, e.g., sensor 264A, with the optics, e.g., optics 262A, and the sensor, e.g., sensor 264A, in a second relative positioning. FIG. 45F shows the second captured image 1128 for the window portion. FIG. 45G shows the relationship between the first relative positioning and the second relative positioning. In FIG. 45G, dashed circles indicate the positioning of the sensor elements relative to the image of the object 1100 with the optics, e.g., optics 262A, and the sensor, e.g., sensor 264A, in the first relative positioning. Solid circles indicate the positioning of the sensor elements relative to the image of the object 1100 with the optics, e.g., optics 262A, and the sensor, e.g., sensor 264A, in the second relative positioning.

As can be seen, the position of the image of the object 1100 relative to the sensor, e.g., sensor 264A, with the optics, e.g., optics 262A, and the sensor, e.g., sensor 264A, in the first relative positioning, is different than the positioning of the image of the object 1100 relative to sensor, e.g., sensor 264A, with the optics, e.g., optics 262A, and the sensor, e.g., sensor 264A, in the second relative positioning. The difference between the first positioning of the image of the object 1100 relative to the sensor, e.g., sensor 264A, and the second positioning of the image of the object 1100 relative to the sensor, e.g., sensor 264, may be represented by a vector 1130.

As with the first relative positioning, some photons do not strike the sensor elements and are therefore not sensed and/or captured. Portions of the image that do not strike the sensor elements do not appear in the second captured image 1128. Notably, however, in the second relative positioning, the sensor elements sense and/or capture some of the photons that were not sensed and/or captured by the first relative positioning. Consequently, the first and second captured images may be "combined" to produce a zoom image that has greater detail than either the first or second captured images, 1124, 1128, taken individually. FIG. 45H shows an example of a zoom image 1132 created by combining the first and second captured images.

If desired, the optics and/or the sensor may thereafter be moved (e.g., shifted) in the x direction and/or y direction to provide a third relative positioning of the optics and the sensor, and a third image may be captured with the optics and the sensor in such positioning. The movement may be provided, for example, using any of the structure(s) and/or method(s) disclosed herein.

FIG. 45I is an enlarged representation of the sensor elements, e.g., pixels $\mathbf{380}_{i+3,j+4}$-$\mathbf{380}_{i+7,j+8}$, and the window portion of the image showing the object 1100 striking the sensor elements of sensor, e.g., sensor 264A, with the optics, e.g., optics 262A, and the sensor, e.g., sensor 264A, in the third relative positioning. FIG. 45J shows the third captured image 1134 for the window portion.

FIG. 45K shows the relationship between the first relative positioning and the second relative positioning. In FIG. 45K, dashed circles indicate the positioning of the sensor elements relative to the image of the object 1100 with the optics, e.g., optics 262A, and the sensor, e.g., sensor 264A, in the first and second relative positioning. Solid circles indicate the positioning of the sensor elements relative to the image of the object 1100 with the optics, e.g., optics 262A, and the sensor, e.g., sensor 264A, in the third relative positioning.

As can be seen, the position of the image of the object 1100 relative to the sensor, e.g., sensor 264A, with the optics, e.g., optics 262A, and the sensor, e.g., sensor 264A, in the third relative positioning, is different than the positioning of the image of the object 1100 relative to sensor, e.g., sensor 264A, with the optics, e.g., optics 262A, and the sensor, e.g., sensor 264A, in the first and second relative positioning. The difference between the first positioning of the image of the object 1100 relative to the sensor, e.g., sensor 264A, and the third positioning of the image of the object 1100 relative to the sensor, e.g., sensor 264, may be represented by a vector 1138.

In the third relative positioning, as with the first and second relative positioning, some photons do not strike the sensor elements and are therefore not sensed and/or captured. Portions of the image that do not strike the sensor elements do not appear in the third captured image. However, in the third relative positioning, the sensor elements sense and/or capture some of the photons that were not sensed and/or captured by the first or second relative positioning. Consequently, the first, second and third captured images 1124, 1128, 1134 may be "combined" to produce a zoom image that has greater detail than either the first, second, or third captured images 1124, 1128, 1134, taken individually. The image may be cropped however, in this case, the cropping results in an image with approximately the same resolution as the optical zoom.

FIG. 45L shows an example of a zoom image 1140 created by combining the first, second and third captured images 1124, 1128, 1134.

In some embodiments, one or more additional image(s) are captured and combined to create an image having a higher resolution. For example, after the third image(s) are captured, the optics and/or the sensor may thereafter be moved (e.g., shifted) in the x direction and/or y direction to provide a fourth relative positioning of the optics and the sensor, and a fourth image may be captured with the optics and the sensor in such positioning.

It should be understood that the movement employed in the x direction and/or y direction may be divided into any number of steps so as to provide any number of different relative positionings (between the optics and the sensor for a camera channel) in which images may be captured. In some embodiments, movements are divided into ½ pixel increments. In some embodiments, the movements are divided into two or more steps in the x direction and two or more steps in the y direction.

In some embodiments, the number of steps and/or the amount of movement in a step is the same as or similar to the number of steps and/or the amount of movement in one or more embodiments described above in regard to increasing resolution of an image.

In some embodiments, the digital camera apparatus 210 may have the ability to take "optically equivalent" zoom pictures without the need of a zoom lens, however, except as stated otherwise, the aspects and/or embodiments of the present invention are not limited to systems that provide optically equivalent zoom.

In view of the above, it should be understood that zooming may be improved using relative movement in the x direction, relative movement in the y direction and/or any combination thereof. Thus, for example, relative movement in the x direction may be used without relative movement in the y direction and relative movement in the y direction may be used without relative movement in the x direction. In addition, it should also be understood that a shift of the optics and/or sensor portions need not be purely in the x direction or purely in the y direction. Thus, for example, a shift may have a component in the x direction, a component in the y direction and/or one or more components in one or more other directions.

In addition, it should also be understood that similar results may also be obtain using other types of relative movement, including, for example, but not limited to relative movement in the z direction, tilting, and/or rotation. For example, each of these types of relative movement can be used to cause an image of an object to strike different sensor elements on a sensor portion.

It should also be recognized that the examples set forth herein are illustrative. For example, exact pixel counts in each case will depend, at least in part, on the optics, the sensor, the amount of cropping (e.g., the ration of the size of the window relative to the size of the field of view), and the number/magnitude of shifts employed by the positioning system. Nonetheless, in at least some embodiments, results at least equivalent to optical zoom can be achieved if desired, given appropriate settings and sizes of each type of lens.

In some embodiments an image of increase resolution from one camera channel may be combined, at least in part, directly or indirectly, with an image of increase resolution from one or more other camera channels, for example, to provide a full color zoom image.

In that regard, if the digital camera apparatus 210 is to provide a zoom image, it may be desirable to employ the method described herein in association with each camera channel that is to contribute to such image. As stated above, if the digital camera system includes more than one camera channels, the image processor may generate a combined image based on the images from two or more of the camera channels, at least in part.

In that regard, in one example below, the method disclosed herein for zooming, i.e., providing a zoom image, is employed in association with each camera channel that is to contribute to such image.

To that effect, in one example, a first image is captured from each camera channel that is to contribute to an image (i.e., an image of increased resolution) to be generated by the digital camera apparatus. The first image captured from each such camera channel is captured with the optics and the sensor of such camera channel in a first relative positioning (e.g., an image is captured with the positioning system 280 in a rest position). In some embodiments, the first positioning provided for one camera channel is the same or similar to the first positioning provided for each of the other channels. Notably, however, the first positioning provided for one camera channel may or may not be the same as or similar to the first positioning provided for another camera channel.

The optics and/or the sensor of each camera channel that is to contribute to the image are thereafter moved (e.g., shifted) for example, in the x direction and/or y direction to provide a second relative positioning of the optics and the sensor for each such camera channel, and a second image is captured from each such camera channel with the optics and the sensor in of each such camera channel in such positioning. The movement may be provided, for example, using any of the structure(s) and/or method(s) disclosed herein. In some embodiments, the second positioning provided for one camera channel is the same or similar to the second positioning provided for each of the other channels. However, as with the first (and any additional) positioning, the second positioning provided for one camera channel may or may not be the same as or similar to the second positioning provided for another camera channel.

If desired, the optics and/or the sensor of each camera channel that is to contribute to the image may thereafter be moved (e.g., shifted) in the x direction and/or y direction to provide a third relative positioning of the optics and the sensor for each such camera channel, and a third image may be captured from each such camera channel with the optics and the sensor of each such camera channel in such positioning. The movement may be provided, for example, using any of the structure(s) and/or method(s) disclosed herein.

In the third relative positioning, as with the first and second relative positioning, some photons do not strike the sensor elements and are therefore not sensed and/or captured. Portions of the image that do not strike the sensor elements do not appear in the third captured image. However, in the third relative positioning, the sensor elements sense and/or capture some of the photons that were not sensed and/or captured by the first or second relative positioning. Consequently, the first, second and third captured images 1124, 1128, 1134 may be "combined" to produce a zoom image that has greater detail than either the first, second, or third captured images 1124, 1128, 1134, taken individually. The image may be cropped however, in this case, the cropping results in an image with approximately the same resolution as the optical zoom.

In some embodiments, one or more additional image(s) are captured and combined to create an image having a higher resolution. For example, after the third image(s) are captured, the optics and/or the sensor of each camera channel that is to contribute to the image may thereafter be moved (e.g., shifted) in the x direction and/or y direction to provide a fourth relative positioning of the optics and the sensor for each such camera channel, and a fourth image may be captured from each such camera channel with the optics and the sensor of each such camera channel in such positioning.

It should be understood that there is no requirement to employ zooming in association with every channel that is to contribute to a zoom image. Nor is zooming limited to camera channels that contribute to an image to be displayed. For example, the method described and/or illustrated in this example may be employed in association with in any type of application and/or any number of camera channels, e.g., camera channels 260A-260D, of the digital camera apparatus 210. For example, if the digital camera apparatus 210 includes four camera channels, e.g., camera channels 260A-260D, the methods described and/or illustrated in this example may be employed in association with one, two, three or four of such camera channels.

FIG. 46A shows a flowchart 1150 of steps that may be employed in providing zoom, according to one embodiment of the present invention. In this embodiment, at a step 1152, a first image is captured from one or more camera channels of the digital camera apparatus 210. In that regard, in some embodiments an first image is captured from at least two of the camera channels of the digital camera apparatus 210. In some embodiments, a first image is captured from at least three camera channels. In some embodiments, a first image is captured from each camera channel that is to contribute to a zoom image. As stated above, if the digital camera system includes more than one camera channels, the image processor may generate a combined image based on the images from two or more of the camera channels, at least in part. For example, in some embodiments, each of the camera channels is dedicated to a different color (or band of colors) or wavelength (or band of wavelengths) than the other camera channels and the image processor combines the images from the two or more camera channels to provide a full color image.

The first image captured from each such camera channel is captured with the optics and the sensor of such camera channel in a first relative positioning. As stated above, the first positioning provided for one camera channel may or may not be the same as or similar to the first positioning provided for another camera channel.

At a step 1154, a zoom is performed on each of the first images to produce a first zoom image for each camera channel. The zoom may be based at least in part on one or more windows that define, directly or indirectly, the portion of each image to be enlarged. Some embodiments apply the same window to each of the first images, however, the window used for one of the first images may or may not be the same as the window used for another of the first images image. The one or more windows may have any form and may be supplied from any source, for example, but not limited to, one or more sources within the processor 265, the user peripheral interface 232, a communication link to the digital camera apparatus 210 and/or any combination thereof. A window may or may not be predetermined. Moreover, a window may be defined in any way and may be embodied in any form, for example, software, hardware, firmware or any combination thereof.

At a step 1156, the optics and/or the sensor of each camera channel are thereafter moved to provide a second relative positioning of the optics and the sensor for each such camera channel. As with the first (and any additional) positioning and as stated above, the second positioning provided for one camera channel may or may not be the same as or similar to the second positioning provided for another camera channel. The movement may be provided, for example, by providing one or more control signals to one or more actuators of the positioning system 280.

At a step 1158, a second image is captured from each camera channel, with the optics and the sensor of each such camera channel in the second relative positioning. At a step 1160, a second zoom is performed on each of the second images to produce a second zoom image for each camera channel. The zoom may be based at least in part on one or more windows that define, directly or indirectly, the portion of each image to be enlarged. Some embodiments apply the same window to each of the second (and any additional) images, however, the window used for one of the second images may or may not be the same as the window used for another of the second image. In some embodiments, the same window is used for all of the images captured from the camera channels (i.e., the first images, the second images and any subsequent captured images). However, the one or more windows used for the second images may or may not be the same as the one or more windows used for the first images.

At a step 1062, two or more of the zoom images are, combined, at least in part, directly or indirectly, to produce, for example, an image, or portion thereof, that has greater resolution than either of the two or more images taken individually.

In some embodiments, a first zoom image from a first camera channel and a second zoom image from the first camera channel are combined, at least in part, directly or indirectly, to produce, for example, a zoom image, or portion thereof, that has greater resolution than either of the two zoom images taken individually. In some embodiments, first and second zoom images from a first camera channel are combined with first and second zoom images from a second camera channel. In some embodiments, first and second zoom images from each of three camera channels are combined. In some embodiments, first and second zoom images from each of four camera channels are combined.

In some embodiments, first and second zoom images from a camera channel are combined with first and second zoom images from all other camera channels that are to contribute to a zoom image. In some embodiments, first and second zoom images from two or more camera channels are combined to provide a full color zoom image.

In some embodiments, one or more additional image(s) are captured, zoomed and combined to create a zoom image having even higher resolution. For example, in some embodiments, a third image is captured from each of the camera channels. In some embodiments, a third and a fourth image is captured from each of the camera channels.

FIG. 46B shows one embodiment 1170 that may be used to generate the zoomed image. This embodiment includes a portion selector 1702 and a combiner 1704. The portion selector 1702 has one or more inputs to receive images captured from one or more camera channels of the digital camera apparatus 210. In this embodiment for example, a first input receives a first image captured from each of one or more of the camera channels. A second input receives a second image captured from each of one or more of the camera channels. A third input receives a second image captured from each of one or more of the camera channels. A fourth input receives a fourth image captured from one or more of the camera channels.

The portion selector 1702 further includes an input to receive one or more signals indicative of one or more desired windows. The portion selector 1702 generates one or more output signals, e.g., first windowed images, second windowed images, third windowed images and fourth windowed images. The outputs are generated in response to the captured images and the one or more desired windows to be applied to the captured images. In this embodiment, the output signal, first windowed images, is indicative of a first windowed image for each of the one or more first captured images. The output signal, second windowed images, is indicative of a second windowed image for each of the one or more second captured images. The output signal, third windowed images, is indicative of a third windowed image for each of the one or more third captured images. The output signal, fourth windowed images, is indicative of a fourth windowed image for each of the one or more fourth captured images.

The combiner 1704 receives the one or more output signals from the portion selector 1702 and generates a combined zoomed. In one embodiment, the combiner 1704 is the same as or similar to the combiner 1050 (FIGS. 42G-42I) described above.

FIG. 47A shows a flowchart 1180 of steps that may be employed in providing zoom, according to another embodiment of the present invention. In this embodiment, at a step 1182, a first image is captured from one or more camera channels of the digital camera apparatus 210. In that regard, in some embodiments a first image is captured from at least two of the camera channels of the digital camera apparatus 210. In some embodiments, a first image is captured from at least three camera channels. In some embodiments, a first image is captured from each camera channel that is to contribute to a zoom image. As stated above, if the digital camera system includes more than one camera channels, the image processor may generate a combined image based on the images from two or more of the camera channels, at least in part. For example, in some embodiments, each of the camera channels is dedicated to a different color (or band of colors) or wavelength (or band of wavelengths) than the other camera channels and the image processor combines the images from the two or more camera channels to provide a full color image.

In this embodiment, the first image captured from each such camera channel is captured with the optics and the sensor of such camera channel in a first relative positioning. As stated above, the first positioning provided for one camera channel may or may not be the same as or similar to the first positioning provided for another camera channel.

At a step 1184, the optics and/or the sensor of each camera channel are thereafter moved to provide a second relative positioning of the optics and the sensor for each such camera channel. The movement may be provided, for example, by providing one or more control signals to one or more actuators of the positioning system 280.

At a step 1186, a second image is captured from each camera channel, with the optics and the sensor of each such camera channel in the second relative positioning. As with the first (and any additional) positioning the second positioning provided for one camera channel may or may not be the same as or similar to the second positioning provided for another camera channel.

At a step 1188, two or more of the captured images are, combined, at least in part, directly or indirectly, to produce, for example, an image, or portion thereof, that has greater resolution than either of the two or more images taken individually.

In that regard, in some embodiments, a first image from a first camera channel and a second image from the first camera channel are combined, at least in part, directly or indirectly, to produce, for example, an image, or portion thereof, that has greater resolution than either of the two images taken individually. In some embodiments, first and second images from a first camera channel are combined with first and second images from a second camera channel. In some embodiments, first and second images from each of three camera channels are combined. In some embodiments, first and second images from each of four camera channels are combined.

In some embodiments, first and second images from a camera channel are combined with first and second images from all other camera channels that are to contribute to a zoom image. In some embodiments, first and second images from two or more camera channels are combined to provide a full color image.

In some embodiments, one or more additional image(s) are captured and combined to create an image having even higher resolution. For example, in some embodiments, a third image is captured from each of the camera channels. In some embodiments, a third and a fourth image is captured from each of the camera channels.

At a step 1190, a zoom is performed on the combined image to produce a zoom image. The zoom may be based at least in part on one or more windows that define, directly or indirectly, the portion of the image to be enlarged. The window may have any form and may be supplied from any source, for example, but not limited to, one or more sources within the processor 265, the user peripheral interface 232, a communication link to the digital camera apparatus 210 and/or any combination thereof. As stated above, a window may or may not be predetermined. Moreover, a window may be defined in any way and may be embodied in any form, for example, software, hardware, firmware or any combination thereof.

FIG. 47B shows a flowchart of steps that may be employed in providing zoom, according to another embodiment of the present invention. In such embodiment, more than two images may be captured from a camera channel. At a step 1202, a first image is captured from one or more camera channels of the digital camera apparatus 210. In that regard, in some embodiments, a first image is captured from at least two of the camera channels of the digital camera apparatus 210. In some embodiments, a first image is captured from at least three camera channels. In some embodiments, a first image is captured from each camera channel that is to contribute to a zoom image. As stated above, if the digital camera system includes more than one camera channels, the image processor may generate a combined image based on the images from two or more of the camera channels, at least in part. For example, in some embodiments, each of the camera channels is dedicated to a different color (or band of colors) or wavelength (or band of wavelengths) than the other camera channels and the image processor combines the images from the two or more camera channels to provide a full color image.

In this embodiment, the first image captured from each such camera channel is captured with the optics and the sensor of such camera channel in a first relative positioning. As stated above, the first positioning provided for one camera channel may or may not be the same as or similar to the first positioning for another camera channel.

At a step 1204, the optics and/or the sensor of each camera channel are thereafter moved to provide a second relative positioning of the optics and the sensor for each such camera channel. The movement may be provided, for example, by providing one or more control signals to one or more actuators of the positioning system 280. As with the first (and any additional) positioning, and as stated above, the second positioning provided for one camera channel may or may not be the same as or similar to the second positioning provided for another camera channel.

At a step 1206, a second image is captured from each camera channel, with the optics and the sensor of each such camera channel in the second relative positioning. At a step 1208, a determination is made as to whether all of the desired images have been captured. If all of the desired images have not been captured, then execution returns to step 1204. If all of the desired images have been captured, then at a step 1098, two or more of the captured images are, combined, at least in part, directly or indirectly, to produce, for example, an image, or portion thereof, that has greater resolution than either of the two or more images taken individually. In some embodiments, three or more images from a first camera channel are combined, at least in part, directly or indirectly, to produce, for example, an image, or portion thereof, that has greater resolution than any of such images taken individually. In some embodiments, three or more images from a first camera channel are combined, at least in part, directly or indirectly, with three or more images from a second camera channel to produce, for example, an image, or portion thereof, that has greater resolution than any of such images, taken individually.

In some embodiments, three or more images from a camera channel are combined with three or more images from all other camera channels that are to contribute to a zoom image. In some embodiments, three or more images from each of two or more camera channels are combined to provide a full color image.

In some embodiments, one or more additional image(s) are captured and combined to create an image having even higher resolution. For example, in some embodiments, a third image is captured from each of the camera channels. In some embodiments, a third and a fourth image is captured from each of the camera channels.

At a step 1212, a zoom is performed on the combined image to produce a zoom image. The zoom may be based at least in part on one or more windows that define, directly or indirectly, the portion of the image to be enlarged. The window may have any form and may be supplied from any source, for example, but not limited to, one or more sources within the processor 265, the user peripheral interface 232, a communication link to the digital camera apparatus 210 and/or any combination thereof. As stated above, a window may or may not be predetermined. Moreover, a window may be defined in any way and may be embodied in any form, for example, software, hardware, firmware or any combination thereof.

Image Stabilization

Users of digital cameras (e.g., still or video) often have difficulty holding a camera perfectly still, thereby resulting in inadvertent and undesired movements (e.g., jitter) that can in turn result in "blurriness" in a still image and/or undesired "shaking" or "bouncing" in a video image.

In some embodiments, it is desirable to have the ability to introduce relative movement between an optics portion (e.g., one or more portions thereof) and a sensor portion (e.g., one or more portions thereof) (for example by moving one or more portions of the optics portion and/or one or more portions of the sensor portion) to compensate for some or all of such inadvertent and undesired movements on the part of the user and/or to reduce the effects of such inadvertent and undesired movements.

The positioning system 280 of the digital camera apparatus 210 may be used to introduce such movement.

FIGS. 48A-48G show steps used in providing image stabilization according to one embodiment of aspects of the present invention. The steps shown in FIGS. 48A-48G are described hereinafter in conjunction with FIG. 49.

Figure 48A:
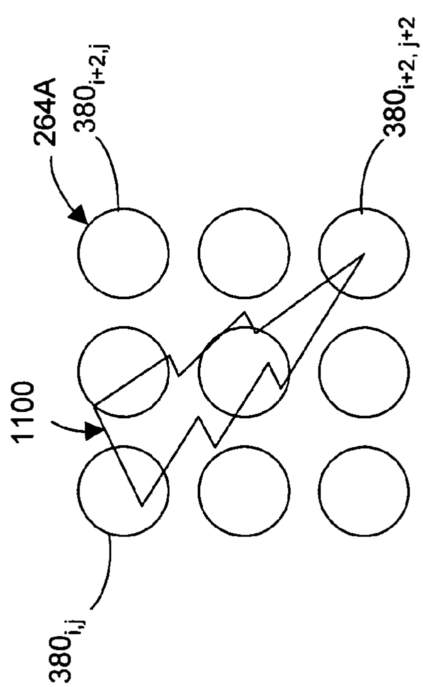

FIGS. 49A-49B show a flowchart 1220 of the steps used in providing image stabilization in one embodiment. With reference to FIG. 49, in this embodiment, a first image is captured at a step 1222. In that regard, FIG. 48A shows an image of an object (a lightning bolt) 1100 striking a sensor or portion of a sensor, for example, the portion of the sensor 264A illustrated in FIGS. 6A-6B, 7A-7B, at a first point in time, with the optics, e.g., optics portion 262A, and the sensor, e.g., sensor portion 264A, of a camera channel, e.g., camera channel 260A, in a first relative positioning.

Figure 48B:
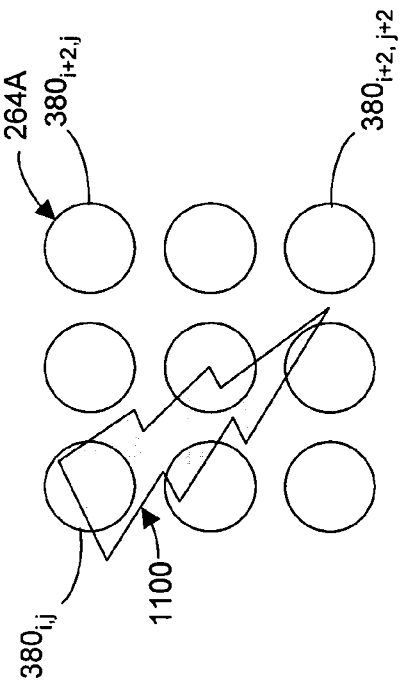

Referring again to FIG. 49, at a step 1224, one or more features are identified in the first image and their position(s), within the first image, are determined. A second image is captured at a step 1226. FIG. 48B shows an image of the object 1100 striking the portion of the sensor, e.g., sensor 264A, at a second point in time, with the optics, e.g., optics portion 262A, and the sensor, e.g., sensor portion 264A, of a camera channel, e.g., camera channel 260A, in the first relative positioning.

Referring again to FIG. 49, at a step 1228, the second image is examined for the presence of the one or more features, and if the one or more features are present in the second image, their position(s) within the second image are determined.

At a step 1230, the digital camera apparatus 210 determines whether the position(s) of the one or more features in the second image are the same as their position(s) in the first image. If the position(s) are not the same, the digital camera apparatus 210 computes a difference in position(s). The difference in position may be, for example, a vector, represented, for example, as multiple components (e.g., an x direction component and a y direction component) and/or as a magnitude component and a direction component.

Figure 48C:
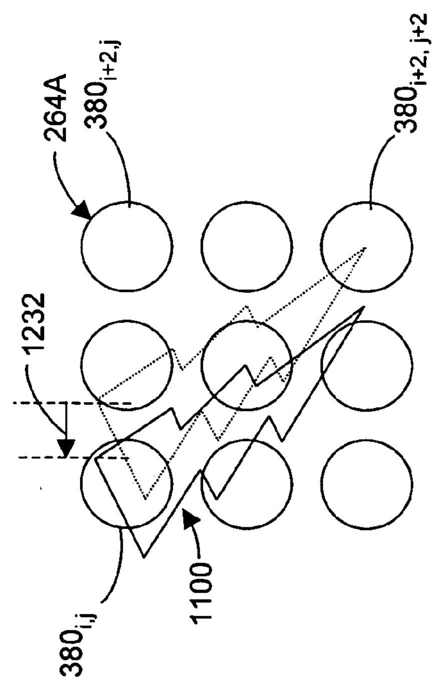

FIG. 48C shows the relationship between the position of the image of the object 1100 in FIG. 48A and the position of the image of the object in FIG. 48B. In FIG. 48C, dashed circles indicate the positioning of the image of the object 1100 relative to the sensor, e.g., sensor 264A, in the first image. Solid circles indicate the positioning of the image of the object 1100 relative to the sensor, e.g., sensor 264A, in the second image. As can be seen, the position of the image of the object 1100 relative to the sensor, e.g., sensor 264A, in the second image, is different than the positioning of the image of the object 1100 relative to sensor, e.g., sensor 264A, in the second image. The difference between the first positioning of the image of the object 1100 relative to the sensor, e.g., sensor 264A, and the second positioning of the image of the object 1100 relative to the sensor, e.g., sensor 264, may be represented by a vector 1232.

Referring again to FIG. 49, if the positions are not the same, then at a step 1234, the system identifies one or more movements that could be applied to the optics and/or sensor to counter the difference in position, at least in part, such that in subsequent images, the one or more features would appear at position(s) that are the same as, or reasonably close to, the position(s) at which they appeared in the first image. For example, movements that could be applied to the optics and/or sensor to cause the image to appear at a position, within the field of view of the sensor, that is the same as, or reasonably close to, the position, within the field of view of the sensor, at which the image appeared in the first image, so that the image will strike the sensor elements in the same way, or reasonably close thereto, that the first image struck the sensor elements.

The one or more movements may include movement in the x direction, y direction, z direction, tilting, rotation and/or combinations thereof. For example, the movement may comprises only an x direction component, only a y direction component, or a combination of an x direction component and a y direction component. In some other embodiments, one or more other types of movement or movements (e.g., z direction, tilting, rotation) are employed with or without one or more movements in the x direction and/or y direction.

At a step 1236, the system initiates one, some or all of the one or more movements identified at step 1234 to provide a second relative positioning of the optics and the sensor. The movement may be provided, for example, using any of the structure(s) and/or method(s) disclosed herein. In some embodiments, the movement is initiated by supplying one or more control signals to one or more actuators of the positioning system 280.

Figure 48D:
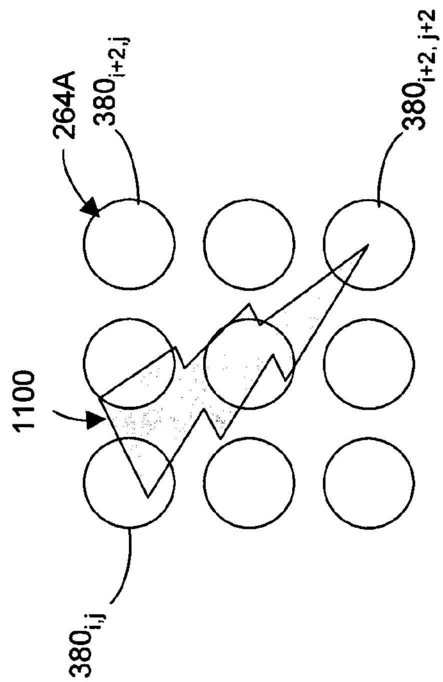

FIG. 48D shows an image of the object 1100 striking the portion of the sensor, e.g., sensor 264A, for example, at a point in time immediately after the optics, e.g., optics portion 262A, and the sensor, e.g., sensor portion 264A, of a camera channel, e.g., camera channel 260A, are in the second relative positioning. In FIG. 48D, the position of the image of the object 1100 relative to the sensor, e.g., sensor 264A, is the same or similar as the positioning of the image of the object 1100 relative to sensor, e.g., sensor 264A, in the first image. This may be the case if the positioning system 280 has the capability (e.g., resolution and/or sensitivity) to provide the movement desired to provide image stabilization, the digital camera apparatus was held still after the second image was captured and the object did not move after the second image was captured. The relative positioning may not be the same if the positioning system does not has the capability (e.g., resolution and/or sensitivity) to provide the desired movement, if the digital camera apparatus was not held still after the capture of the second image and/or if the object moved after the capture of the second image.

Referring again to FIG. 49, at a step 1238, the system determines whether it is desired to continue to provide image stabilization. If further stabilization is desired, then execution returns to step 1226. For example, a third image may be captured at step 1226, and at step 1228, the third image is examined for the presence of the one or more features. If the one or more features are present in the third image, their position(s) within the third image are determined. At step 1230, the system determines whether the position(s) of the one or more features in the third image are the same as their position(s) in the first image.

Figure 48F:
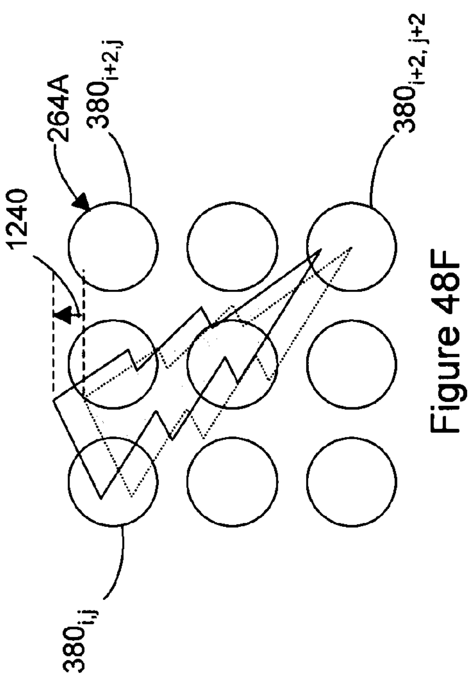
Figure 48E:
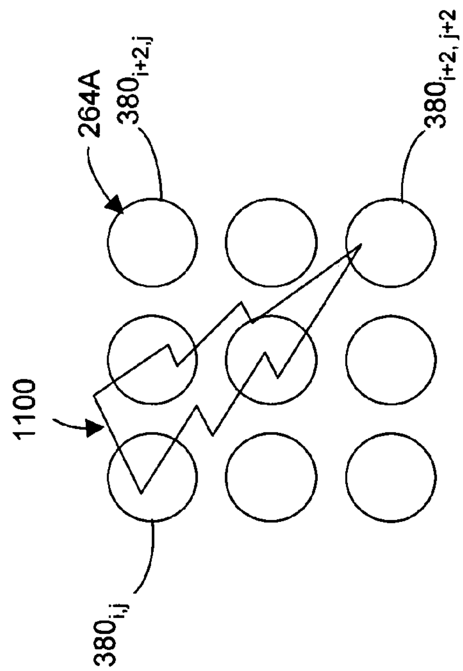

FIG. 48E shows an image of the object 1100 striking the portion of the sensor, e.g., sensor 264A, at another point in time, with the optics, e.g., optics portion 262A, and the sensor, e.g., sensor portion 264A, of a camera channel, e.g., camera channel 260A, in the second relative positioning.

FIG. 48F shows the relationship between the position of the image of the object 1100 in FIG. 48A and the position of the image of the object in FIG. 48E. In FIG. 48F, dashed circles indicate the positioning of the image of the object 1100 relative to the sensor, e.g., sensor 264A, in the first image. Solid circles indicate the positioning of the image of the object 1100 relative to the sensor, e.g., sensor 264A, in the third image. As can be seen, the position of the image of the object 1100 relative to the sensor, e.g., sensor 264A, in the third image, is different than the positioning of the image of the object 1100 relative to sensor, e.g., sensor 264A, in the first image. The difference between the first positioning of the image of the object 1100 relative to the sensor, e.g., sensor 264A, and the second positioning of the image of the object 1100 relative to the sensor, e.g., sensor 264, may be represented by a vector 1240.

If the position(s) are not the same, the system computes a difference in position and at step 1234, the system identifies one or more movements that could be applied to the optics and/or sensor to counter the difference in position, at least in part, and at step 1236, the system initiates one, some or all of the one or more movements identified at step 1234 to provide a third relative positioning of the optics and the sensor. The movement may be provided, for example, using any of the structure(s) and/or method(s) disclosed herein.

Figure 48G:
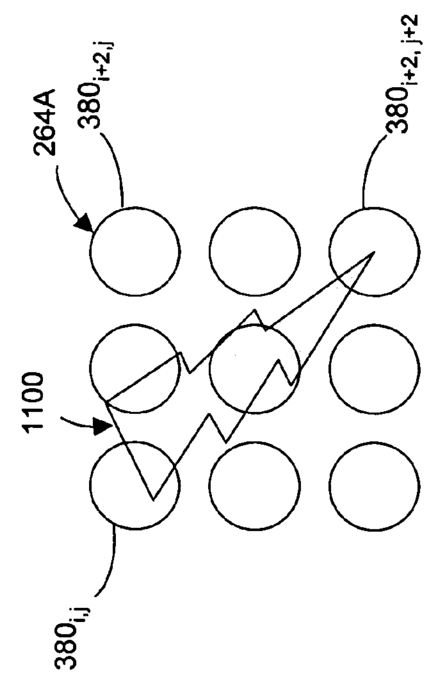

FIG. 48G shows an image of the object 1100 striking the portion of the sensor, e.g., sensor 264A, e.g., at a point in time immediately after the optics, e.g., optics portion 262A, and the sensor, e.g., sensor portion 264A, of a camera channel, e.g., camera channel 260A, are in the third relative positioning. As can be seen, the position of the image of the object 1100 relative to the sensor, e.g., sensor 264A, in the fifth image, is the same or similar as the positioning of the image of the object 1100 relative to sensor, e.g., sensor 264A, in the first and/or third image. This may be the case if the positioning system 280 has the capability (e.g., resolution and/or sensitivity) to provide the movement desired to provide image stabilization, the digital camera apparatus was held still after the third image was captured and the object did not move after the third image was captured. The relative positioning may not be the same if the positioning system does not has the capability (e.g., resolution and/or sensitivity) to provide the desired movement, if the digital camera apparatus was not held still after the capture of the third image and/or if the object moved after the capture of the third image.

Referring again to FIG. 49, if further stabilization is not desired, then stabilization is halted at step 1238.

In some embodiments an image from one camera channel may be combined, at least in part, directly or indirectly, with an image from another channel, for example, to provide a full color image.

In that regard, in some embodiments, the first image is captured from one or more camera channels that contribute to the image to be stabilized. In some other embodiments, the first image is captured from a camera channel that does not contribute to the image to be stabilized. In some embodiments, the first image (and subsequent images captured for image stabilization) may be a combined image based on images captured from two or more camera channels that contribute to the image to be stabilized.

The first image is captured with the optics and the sensor of each camera channel (that contributes to the image to be stabilized) in a first relative positioning. In some embodiments, the first positioning provided for one camera channel is the same or similar to the first positioning provided for each of the other channels. Notably, however, the first positioning provided for one camera channel may or may not be the same as or similar to the first positioning provided for another camera channel.

Referring again to FIG. 49, at a step 1224, one or more features are identified in the first image and their position(s), within the first image, are determined. A second image is captured at a step 1226. As with the first image, the second image is captured with the optics and the sensor of each camera channel (that contributes to the image to be stabilized) in the first relative positioning. For example, Referring again to FIG. 49, at a step 1228, the second image is examined for the presence of the one or more features, and if the one or more features are present in the second image, their position(s) within the second image are determined.

At a step 1230, the digital camera apparatus 210 determines whether the position(s) of the one or more features in the second image are the same as their position(s) in the first image. If the position(s) are not the same, the digital camera apparatus 210 computes a difference in position(s). The difference in position may be, for example, a vector, represented, for example, as multiple components (e.g., an x direction component and a y direction component) and/or as a magnitude component and a direction component.

In some embodiments, the system employs one or more techniques to insure the sampled items are not actually in motion themselves. In some embodiments, this can be done by sampling multiple items. Also, movement limits can be incorporated into algorithms that prevent compensation when movement exceeds certain levels. Finally, movement is limited to a very small displacement thus continuing motion (such as a moving vehicle) will go uncorrected. Another embodiment could employ one or more small commercially available gyroscopes affixed to the camera body to detect motion. The output of these sensors can provide input to the lens(es) actuator logic to cause the lenses to be repositioned.

Referring again to FIG. 49, if the positions are not the same, then at a step 1234, the system identifies one or more movements that could be applied to the optics and/or sensor to counter the difference in position, at least in part, such that in subsequent images, the one or more features would appear at position(s) that are the same as, or reasonably close to, the position(s) at which they appeared in the first image. For example, movements that could be applied to the optics and/or sensor to cause the image to appear at a position, within the field of view of the sensor, that is the same as, or reasonably close to, the position, within the field of view of the sensor, at which the image appeared in the first image, so that the image will strike the sensor elements in the same way, or reasonably close thereto, that the first image struck the sensor elements.

The one or more movements may include movement in the x direction, y direction, z direction, tilting, rotation and/or combinations thereof. For example, the movement may comprises only an x direction component, only a y direction component, or a combination of an x direction component and a y direction component. In some other embodiments, one or more other types of movement or movements (e.g., z direction, tilting, rotation) are employed with or without one or more movements in the x direction and/or y direction.

At a step 1236, the system initiates one, some or all of the one or more movements identified at step 1234 to provide a second relative positioning of the optics and the sensor for each camera channel that contributes to the image to be stabilized. The movement may be provided, for example, using any of the structure(s) and/or method(s) disclosed herein. In some embodiments, the movement is initiated by supplying one or more control signals to one or more actuators of the positioning system 280. In some embodiments, the second positioning provided for one camera channel is the same or similar to the second positioning provided for each of the other channels. However, as with the first (and any additional) positioning, the second positioning provided for one camera channel may or may not be the same as or similar to the second positioning provided for another camera channel.

Referring again to FIG. 49, at a step 1238, the system determines whether it is desired to continue to provide image stabilization. If further stabilization is desired, then execution returns to step 1226. For example, a third image may be captured at step 1226, and at step 1228, the third image is examined for the presence of the one or more features. If the one or more features are present in the third image, their position(s) within the third image are determined. At step 1230, the system determines whether the position(s) of the one or more features in the third image are the same as their position(s) in the first image.

If the position(s) are not the same, the system computes a difference in position and at step 1234, the system identifies one or more movements that could be applied to the optics and/or sensor to counter the difference in position, at least in part, and at step 1236, the system initiates one, some or all of the one or more movements identified at step 1234 to provide a third relative positioning of the optics and the sensor for each camera channel that contributes to the image. The movement may be provided, for example, using any of the structure(s) and/or method(s) disclosed herein. In some embodiments, the third positioning provided for one camera channel is the same or similar to the third positioning provided for each of the other channels. However, as with the first (and any additional) positioning, the third positioning provided for one camera channel may or may not be the same as or similar to the third positioning provided for another camera channel.

Referring again to FIG. 49, if further stabilization is not desired, then stabilization is halted at step 1238.

It should be understood that there is no requirement to employ image stabilization in association with every camera channel that is to contribute to an image to be stabilized (i.e., an image for which image stabilization is to be provided). Nor is image stabilization limited to camera channels that contribute to an image to be displayed. For example, the method described and/or illustrated in this example may be employed in association with in any type of application and/or any number of camera channels, e.g., camera channels 260A-260D, of the digital camera apparatus 210. For example, if the digital camera apparatus 210 includes four camera channels, e.g., camera channels 260A-260D, the methods described and/or illustrated in this example may be employed in association with one, two, three or four of such camera channels.

In some embodiments, the image stabilization process does not totally eliminate motion since the repositioning is reactive and thus occurs after the motion has been detected. However, in some such embodiments, positioning system operates at a speed and/or a frequency such that the lag between actual motion and the correction is small. As such, although "perfectly still" image may not be accomplished, the degree of improvement may be significant.

It should be understood that there is no requirement to employ image stabilization in association with every camera channel that is to contribute to an image to be stabilized (i.e., an image for which image stabilization is to be provided). Nor is image stabilization limited to camera channels that contribute to an image to be displayed. For example, the method described and/or illustrated in this example may be employed in association with in any type of application and/or any number of camera channels, e.g., camera channels 260A-260D, of the digital camera apparatus 210. For example, if the digital camera apparatus 210 includes four camera channels, e.g., camera channels 260A-260D, the methods described and/or illustrated in this example may be employed in association with one, two, three or four of such camera channels.

It should also be recognized that the examples set forth herein are illustrative. For example, exact pixel counts in each case will depend, at least in part, on the sensor.

Optics/Sensor Alignment

In some embodiments, it is desired to configure the digital camera such that a field of view for one or more camera channels matches a field of view for the digital camera. However, misalignments (e.g., as a result of manufacturing tolerances) may occur in the optics subsystem and/or the sensor subsystem thereby causing the field of view for the one or more camera channels to differ from the field of view of the digital camera.

In the event that the optics subsystem and/or the sensor subsystem are out of alignment with one another and/or one or more other parts of the digital camera, it may be desirable to introduce relative movement between an optics portion (e.g., one or more portions thereof) and a sensor portion (e.g., one or more portions thereof) to compensate for some or all of such misalignment and/or to reduce the effects of such misalignment. The positioning system may be used to introduce such movement.

FIGS. 50A-50N show examples of misalignment of one or more camera channels and movements that could be used to compensate for such. More particularly, FIG. 50A is a representation of an image of an object 1300, as would be viewed by a first camera channel, e.g., camera channel 260A (FIG. 4), striking a portion of a sensor 264A, for example, the portion of the sensor 264A illustrated in FIGS. 6A-6B, 7A-7B, of a first camera channel, without misalignment of the first camera channel 260A. The sensor 264A has a plurality of sensor elements, e.g., sensor elements $\mathbf{380}_{i,j}$-$\mathbf{380}_{i+2,j+2}$, shown schematically as circles.

FIG. 50B is a representation of an image of the object 1300, as viewed by the first camera channel 260A, striking the sensor 264A in the first camera channel, with misalignment of one or more portions of the first camera channel 260A.

FIG. 50C shows the image as would viewed by the first camera channel 264A without misalignment, superimposed with the image viewed by the first camera channel 264A with the misalignment of FIG. 50B. The dashed image indicates the position of the image of the object 1300 relative to the sensor 264A of the first camera channel 260A without misalignment. The shaded image indicates the position of the image of the object 1300 relative to the sensor 264A of the first camera channel 260A with the misalignment of FIG. 50B. The difference between the position of the object 1300 in the first image (FIG. 50A) (i.e., as would be viewed by the first camera channel 264A without misalignment (FIG. 50A)) and the position of the object 1300 in the second image (FIG. 50B) with misalignment) is indicated at vector 1302. In this example, the difference, which in this example is the result of misalignment, is in the x direction.

FIG. 50D shows the image as would be viewed by the first camera channel 264A superimposed with the image viewed by the first camera channel 264A if such misalignment is eliminated.

FIGS. 50E-50G show an example of misalignment in the y direction. In that regard, FIG. 50E is a representation of an image of the object 1300 striking the sensor 264A in the first camera channel with misalignment in the y direction. FIG. 50F shows the image as would be viewed by the first camera channel 264A without misalignment, superimposed with the image viewed by the first camera channel 264A with the misalignment of FIG. 50E. The dashed image indicates the position of the image of the object 1300 relative to the sensor 264A of the first camera channel 260A without misalignment. The shaded image indicates the position of the image of the object 1300 relative to the sensor 264A of the first camera channel 260A with the misalignment of FIG. 50E. The difference between the position of the object 1300 in the first image (FIG. 50A) (i.e., as would be viewed by the first camera channel 264A without misalignment) and the position of the object 1300 with misalignment in the y direction (FIG. 50E) is indicated at vector 1304. As stated above, in this example, the misalignment is in the y direction.

FIG. 50G shows the image as would be viewed by the first camera channel 264A superimposed with the image viewed by the first camera channel 264A if such misalignment is eliminated.

FIGS. 50H-50K show examples of misalignment between camera channels and movements that could be used to compensate for such. More particularly, FIG. 50H is a representation of an image of an object 1300, as viewed by a first camera channel, e.g., camera channel 260A (FIG. 4), striking a portion of a sensor 264A, for example, the portion of the sensor 264A illustrated in FIGS. 6A-6B, 7A-7B, of a first camera channel. The sensor 264A has a plurality of sensor elements, e.g., sensor elements $\mathbf{380}_{i,j}$-$\mathbf{380}_{i+2,j+2}$, shown schematically as circles.

FIG. 50I is a representation of an image of the object 1300, as viewed by a second camera channel, e.g., camera channel 260B, striking a portion of a sensor 264B, for example, a portion that is the same or similar to the portion of the sensor 264A illustrated in FIGS. 6A-6B, 7A-7B. The sensor 264B has a plurality of sensor elements, e.g., sensor elements $\mathbf{380}_{i,j}$-$\mathbf{380}_{i+2,j+2}$, shown schematically as circles.

FIG. 50J shows the image viewed by the first camera channel 264A superimposed with the image viewed by the second camera channel 264B. The dashed image indicates the position of the image of the object 1300 relative to the sensor 264A of the first camera channel 260A. The shaded image indicates the position of the image of the object 1300 relative to the sensor 264B of the second camera channel 260B. The difference between the position of the object 1300 in the first image (FIG. 50A) (i.e., as viewed by the first camera channel 264A) and the position of the object 1300 in the image of FIG. 50I (i.e., as viewed by the second camera channel 264B with misalignment between the camera channels) is indicated at vector 1306. In this example, the difference, which in this example is the result of misalignment between the camera channels, is in the x direction.

FIG. 50K shows the image viewed by the first camera channel superimposed with the image viewed by the second camera channel if such misalignment is eliminated.

Figure 50M:
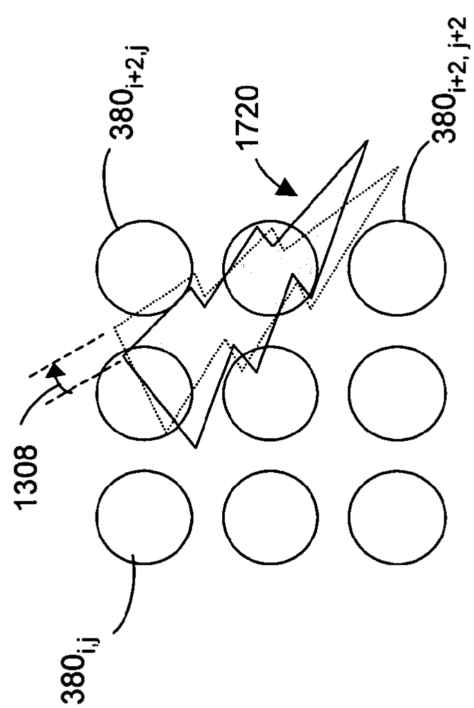

FIGS. 50L-50N show an example of rotational misalignment. In that regard, FIG. 50L is a representation of an image of the object 1300 striking the sensor 264B in the second camera channel, with rotational misalignment between the camera channels. FIG. 50M shows the image viewed by the first camera channel 264A superimposed with the image viewed by the second camera channel 264B. The dashed image indicates the position of the image of the object 1300 relative to the sensor 264A of the first camera channel 260A. The shaded image indicates the position of the image of the object 1300 relative to the sensor 264B of the second camera channel 260B. The difference between the position of the object 1300 in the first image (FIG. 50A) (i.e., as viewed by the first camera channel 264A) and the position of the object 1300 in the image of FIG. 50L (i.e., as viewed by the second camera channel 264B with rotational misalignment) is indicated at angle 1308. As stated above, in this example, the misalignment is rotational misalignment.

FIG. 50N shows the image viewed by the first camera channel superimposed with the image viewed by the second camera channel if such misalignment is eliminated.

In some embodiments, it may be advantageous to increase and/or decrease the misalignment between camera channels. For example, in some embodiments, it may be advantageous to decrease the misalignment so as to reduce differences between the images provided by two or more camera channels. In some embodiments, signal processing is used to decrease (e.g., compensate for the effects of) the misalignment.

Movement of one or more portions of the optics portion and/or movement of the sensor portion may also be used to decrease the misalignment. The movement may be, for example, movement(s) in the x direction, y direction, z direction, tilting, rotation and/or any combination thereof.

The positioning system 280 may be employed in providing such movement, e.g., to change the amount of parallax between camera channels from a first amount to a second amount.

FIG. 51A shows a flowchart of steps that may be employed in providing optics/sensor alignment, according to one embodiment of the present invention.

At a step 1322, one or more calibration objects having one or more features of known size(s), shape(s), and/or color(s) are positioned at one or more predetermined positions within the field of view of the digital camera apparatus.

At a step 1324, an image is captured, and at a step 1326, the image is examined for the presence of the one or more features. If the features are present, the position(s) of such features within the first image are determined and compared to one or more expected positions, i.e., the position(s), within the image, at which the features would be expected to appear based on the positioning of the one or more calibration objects and the one or more features within the field of view. If the position(s) within the first image are not the same as the expected position(s), the system determines the difference in position. The difference in position may be, for example, a vector, represented, for example, as multiple components (e.g., an x direction component and a y direction component) and/or as a magnitude component and a direction component.

At a step 1328, the system compares the magnitude of the difference to a reference magnitude. If the difference is less than the reference magnitude, then no movement or compensation is to be provided. If the difference is greater than the reference magnitude, then at a step 1330, the system identifies one or more movements that could be applied to the optics and/or sensor to compensate for the difference in position, at least in part, so that in subsequent images, the features would appear at position(s) that are the same as, or reasonably close to, the expected position(s). The one or more movements may be, for example, movements that could be applied to the optics and/or sensor to cause the image to appear at the expected position within the field of view of the sensor. The one or more movements may be, for example, movement(s) in the x direction, y direction, z direction, tilting, rotation and/or any combination thereof. The movement may be provided, for example, using any of the structure(s) and/or method(s) disclosed herein.

At a step 1332, the system initiates one, some or all of the one or more movements identified at step 1330. The one or more movements may be initiated, for example, by supplying one or more control signal to one or more actuator of the positioning system 280. At a step 1334, data indicative of the misalignment and/or the movement used to compensate for the misalignment is stored.

In some embodiments, further steps may be performed to determine whether the movements had the desired effect, and if the desired effect is not achieved, to make further adjustments.

For example, FIG. 51B, shows a flowchart 1340 employed in another embodiment. Referring to FIG. 51B, in this embodiment, steps 1342, 1344, 1346, 1348, 1350, 1352 are similar to the steps 1322, 1324, 1326, 1328, 1330, 1332 in the flowchart of FIG. 51A. In this embodiment, a second image is captured at step 1344. At step 1346, the second image is examined for the presence of the one or more features. If the feature are present in the second image, the position(s) of the features are determined and compared to one or more expected positions, i.e., the position(s), within the second image, at which the features would be expected to appear based on the positioning of the one or more calibration objects and the one or more features within the field of view. If the position(s) within the second image are not the same as the expected position(s), the system determines the difference in position.

At a step 1348, the system compares the magnitude of the difference to a reference magnitude. If the difference is less than the reference magnitude, then no further movement or compensation is to be provided. If the difference is greater than the reference magnitude, then at a step 1350, the system identifies one or more movements that could be applied to the optics and/or sensor to compensate for the difference in position, at least in part, so that in subsequent images, the features would appear at position(s) that are the same as, or reasonably close to, the expected position(s). The one or more movements may be, for example, movements that could be applied to the optics and/or sensor to cause the image to appear at the expected position within the field of view of the sensor. The one or more movements may be, for example, movement(s) in the x direction, y direction, z direction, tilting, rotation and/or any combination thereof. The movement may be provided, for example, using any of the structure(s) and/or method(s) disclosed herein.

At a step 1352, the system initiates one, some or all of the one or more movements identified at step 1350. The one or more movements may be initiated, for example, by supplying one or more control signal to one or more actuator of the positioning system 280.

In some embodiments, steps 1344-1352 are repeated until at step 1348, it is determined that no further movement or compensation is to be provided. At a step 1354, data indicative of the misalignment and/or the movement used to compensate for the misalignment is stored.

The steps set forth in FIG. 51A and/or FIG. 51B may be performed, for example, during manufacture and/or test of digital camera apparatus and/or the digital camera. Thereafter, the stored data may be used in initiating the desired movement(s) each time that the digital camera is powered up.

Channel/Channel Alignment

In some embodiments, it is desired to configure the digital camera such that the field of view for one or more camera channels matches the field of view for one or more other camera channels. However, misalignments (e.g., as a result of manufacturing tolerances) may occur in the optics subsystem and/or the sensor subsystem thereby causing the field of view for the one or more camera channels to differ from the field of view of one or more of the other camera channels.

In the event of misalignment between the camera channels, the positioning system may be used to introduce movement to compensate for (i.e., cancel some or all) such misalignment.

FIG. 52A shows a flowchart of steps that may be employed in providing channel/channel alignment, according to one embodiment of the present invention.

At a step 1362, one or more calibration objects having one or more features of known size(s), shape(s), and/or color(s) are positioned at one or more predetermined positions within the field of view of the digital camera apparatus.

At a step 1364, an image is captured from each of the channels to be aligned. At a step 1366, the position(s) of the one or more features, within each image, are determined. For example, if the digital camera has four camera channels, the system determines the position(s) of the one or more features within the image for the first channel, the position(s) of the one or more features within the image for the second channel, the position(s) of the one or more features within the image for the third channel and the position(s) of the one or more features within the image for the fourth channel. If the position(s) of the one or more features within the images are not the same, the system determines one or more difference(s) between the position(s).

At a step 1368, the system compares the magnitude(s) of the difference(s) to one or more reference magnitude(s). If one or more of the difference(s) are greater than the reference magnitude(s), then at a step 1370, the system identifies one or more movements that could be applied to the optics and/or sensor to compensate for one or more of the differences, at least in part, so that in subsequent images for the camera channels, the position(s) of the features in the image for one of the channels is the same as, or reasonably close to, the position(s) of the features in the images for the other channels.

The one or more movements may be, for example, movement(s) in the x direction, y direction, z direction, tilting, rotation and/or any combination thereof. The movement may be provided, for example, using any of the structure(s) and/or method(s) disclosed herein.

At a step 1372, the system initiates one, some or all of the one or more movements identified at step 1370. The one or more movements may be initiated, for example, by supplying one or more control signal to one or more actuator of the positioning system 280.

At a step 1374, data indicative of the misalignment and/or the movement used to compensate for the misalignment is stored.

In some embodiments, further steps may be performed to determine whether the movements had the desired effect, and if the desired effect is not achieved, to make further adjustments.

For example, FIG. 52B, shows a flowchart employed in another embodiment. Referring to FIG. 52B, in this embodiment, steps 1382, 1384, 1386, 1388, 1389, 1390 are similar to the steps performed in the flowchart of FIG. 52A.

In this embodiment, at step 1384, a second image is captured from each of the channels to be aligned. At step 1386, the position(s) of the one or more features, within each image, are determined. For example, if the digital camera has four camera channels, the system determines the position(s) of the one or more features within the image for the first channel, the position(s) of the one or more features within the image for the second channel, the position(s) of the one or more features within the image for the third channel and the position(s) of the one or more features within the image for the fourth channel. If the position(s) of the one or more features within the images are not the same, the system determines one or more difference(s) between the position(s).

At step 1388, the system compares the magnitude(s) of the difference(s) to one or more reference magnitude(s). If one or more of the difference(s) are greater than the reference magnitude(s), then at a step 1389, the system identifies one or more movements that could be applied to the optics and/or sensor to compensate for one or more of the differences, at least in part, so that in subsequent images for the camera channels, the position(s) of the features in the image for one of the channels is the same as, or reasonably close to, the position(s) of the features in the images for the other channels. The one or more movements may be, for example, movement(s) in the x direction, y direction, z direction, tilting, rotation and/or any combination thereof. The movement may be provided, for example, using any of the structure(s) and/or method(s) disclosed herein.

At a step 1390, the system initiates one, some or all of the one or more movements identified at step 1389. The one or more movements may be initiated, for example, by supplying one or more control signal to one or more actuator of the positioning system 280.

In some embodiments, steps 1384-1390 are repeated until at step 1388, it is determined that no further movement or compensation is to be provided. At a step 1391, data indicative of the misalignment and/or the movement used to compensate for the misalignment is stored.

The steps set forth in FIG. 52A and/or FIG. 52B may be performed, for example, during manufacture and/or test of digital camera apparatus and/or the digital camera. Thereafter, the stored data may be used in initiating the desired movement(s) each time that the digital camera is powered up.

FIG. 52C, shows a flowchart of the steps that may be employed. Referring to FIG. 52C, the digital camera is powered up at a step 1392. Data indicative of the misalignment and/or the movement to compensate is retrieved at a step 1393, and at a step 1394, the desired movement(s) are initiated.

In some embodiments, one or more other methods are employed to correct misalignment, in addition to and/or in lieu of the methods above, for example software algorithms (edge selection/alignment) and windowing (recombining individual channel images offset from each other to correct for the misalignment).

Masking

In some embodiments, it is desired to employ one or more masks in the optical path to provide or help provide one or more masking effects (e.g., a visual effect or effects). For example, masks and/or mask techniques may be used in hiding portions of an image and/or field of view in whole or in part, in enhancing one or more features (e.g., fine details and/or edges (e.g., edges that extend in a vertical direction or have a vertical component)) in an image and/or within a field of view and/or in "bringing out" (i.e., to make more apparent) one or more features within an image and/or within a field of view.

Some masks and/or mask techniques employ and/or take advantage of the principles of interference.

FIGS. 53A-53C show a portion of a digital camera apparatus 210 that includes a camera channel, e.g., camera channel 262A, that includes an optics portion, e.g., optics portion 262A, having a lens 1395 and a mask 1400 in accordance with one embodiment of aspects of the present invention. The lens 1395 may be, for example, the same as or similar to any of the lenses described and/or illustrated herein and/or incorporated by reference herein.

The mask 1400 may be positioned anywhere, for example, between a lens and a sensor portion, e.g., sensor portion 264A. In this embodiment, the mask 1400 includes a mask portion 1402 and a support portion 1404. The mask portion 1402 is light blocking or filtering, at least in part. The support portion 1404 supports the mask portion 1402, at least in part. The support portion 1404 may or may not transmit light. Thus, in some embodiments, the mask portion 1402 includes one or more portions of the support portion 1404 (i.e., one or more portions of the support portion are light blocking or filtering, at least in part, and help provide the masking effects, at least in part).

The mask portion 1402 may have any form and may be integral with the support portion 1404 and/or affixed thereto. In this embodiment, for example, the mask portion 1402 comprises a plurality of elements, e.g., elements $\mathbf{1402}_1$-$\mathbf{1402}_n$, disposed on and/or within the support portion 1404. In this embodiment, each of the plurality of elements $\mathbf{1402}_1$-$\mathbf{1402}_n$ is a linear element and the linear elements are arranged in a linear array. However, the elements $\mathbf{1402}_1$-$\mathbf{1402}_n$ may have any shape and may be arranged in a pattern. Light striking the mask portion 1402 is blocked, at least in part. Light striking between the elements $\mathbf{1402}_1$-$\mathbf{1402}_n$ is transmitted, at least in part. The pattern may be adapted to provide one or more effects and/or may have one or more characteristics selected to correspond to one or more characteristics of the sensor elements or arrangement thereof. The elements $\mathbf{1402}_1$-$\mathbf{1402}_n$ may also be arranged, for example, in a pattern that corresponds to the pattern of the sensor elements. For example, if the sensor elements are arranged in a grid pattern, the elements $\mathbf{1402}_1$-$\mathbf{1402}_n$ may be arranged in a grid pattern that corresponds therewith (e.g., the elements of the mask portion may be arranged in a grid pattern that is the same as, or a scaled version of, the grid pattern in which the sensor elements are arranged).

The positioning system 280 may be employed to position and/or move the mask 1400 into, within and/or out of the optical path 1410 of the sensor, e.g., sensor 264A, to provide a desired effect or effects.

For example, FIG. 53A shows the lens 1395, the mask 1400 and the sensor portion 264A in a first relative positioning, wherein the mask portion 1402 is in the optical path 1410 and blocks or filters portions of the light within the field of view of the sensor 264A. FIG. 53B shows the lens 1395, the mask 1400 and the sensor portion 264A in a second relative positioning, e.g., displaced from the first relative positioning by a distance or vector 1412, wherein the mask portion 1402 is in the optical path 1410 and blocks or filters a different portions of the light than that blocked or filtered by the mask portion 1402 in the first relative positioning. FIG. 53C shows the lens 1395, the mask 1400 and the sensor portion 264A in a third relative positioning. In such positioning, the mask 1400 is out of the optical path 1410 of the sensor 264A. Some embodiments may not be able to provide each of the types of movements shown. For example, some embodiments may not have a range of motion sufficient to move a mask (and/or any other portion of the optics portion) totally out of the optical path of all camera channel(s).

FIGS. 53D-53F show a portion of a digital camera apparatus 210 that includes an optics portion 262A having a mask 1400 in accordance with another embodiment of aspects of the present invention. In this embodiment, the mask 1400 includes a mask portion 1402 that comprises linear elements, e.g., elements $\mathbf{1402}_1$-$\mathbf{1402}_n$, arranged in a grid. The pattern may be adapted to provide one or more effects and/or may have one or more characteristics selected to correspond to one or more characteristics of the sensor elements of the sensor portion, e.g., sensor portion 264A, or arrangement thereof. If the sensor elements are arranged in a grid pattern, the elements of the mask portion 1402 may be arranged in a grid pattern that corresponds therewith (e.g., the elements of the mask portion 1402 may be arranged in a grid pattern that is the same as, or a scaled version of, the grid pattern in which the sensor elements are arranged).

FIG. 53D shows the lens 1395, the mask 1400 and the sensor portion 264A in a first relative positioning, wherein the mask portion 1402 is in the optical path 1410 and blocks or filters portions of the light within the field of view. FIG. 53E shows the lens 1395, the mask 1400 and the sensor portion 264A in a second relative positioning, e.g., offset from the first relative positioning by a distance or vector 1414, wherein the mask portion 1402 is in the optical path 1410 of the sensor portion 264A and blocks or filters a different portion of the light than that blocked or filtered by the mask portion 1402 in the first relative positioning. FIG. 53F shows the lens 1395, the mask 1400 and the sensor portion 264A in a third relative positioning. In such positioning, the mask 1400 is out of the optical path 1410.

FIGS. 53G-53I show a portion of a digital camera apparatus 210 that includes an optics portion 262A having a mask 1400 in accordance with another embodiment of aspects of the present invention. In this embodiment, the mask has first and second portions 1420, 1422 disposed, for example, between a lens 1395 and a sensor portion 264A. Each of the mask portions 1420, 1422 comprises a plurality of elements, e.g., elements $\mathbf{1402}_1$-$\mathbf{1420}_n$. The elements may have any shape and may be arranged in a pattern. In this embodiment, the elements of each of the mask portions comprise linear elements arranged in a linear array, such that the mask portions collectively define a grid. The pattern may be adapted to provide one or more effects and/or may have one or more characteristics selected to correspond to one or more characteristics of the sensor elements or arrangement thereof.

FIG. 53G shows the lens 1395, the mask 1400 and the sensor portion 264A in a first relative positioning, wherein the mask 1400 is in the optical path 1410 and blocks or filters portions of the light within the field of view. FIG. 53H shows the lens 1395, the mask 1400 and the sensor portion 264A in a second relative positioning, e.g., offset from the first relative positioning by distances or vectors 1426, 1428, respectively, wherein the mask 1400 blocks or filters a different portion of the light than that blocked or filtered by the mask 1400 in the first relative positioning. FIG. 53I shows the lens 1395, the mask 1400 and the sensor portion 264A in a third relative positioning. In such positioning, the mask 1400 is out of the optical path 1410.

FIG. 54 shows a flowchart 1430 of steps that may be employed in association with one or more masks to provide or help provide one or more masking effects, according to one embodiment of the present invention. At a step 1432, the system receives a signal indicative of one or more desired masking effects. At a step 1434, the system identifies one or more movements to provide or help provide the one or more masking effects, and initiates one, some or all of the one or more movements.

The one or movements may be movements to be applied to the mask and/or any other components in the optical path (e.g., movement of one or more other portions of the optic portion and/or movement of the sensor portion). The movement may be provided, for example, using any of the structure(s) and/or method(s) disclosed herein. The movement may be movement in the x direction, y direction, z direction, tilting, rotation and/or any combination thereof. In some embodiments, the movement is initiated by supplying one or more control signals to one or more actuators of the positioning system 280.

A first masked image is captured at a step 1436. In some embodiments, the first masked image may itself provide the desired masking effect. In some embodiments, one or more portions of the first masked image may be combined with one or more portions of one or more other images (masked or unmasked) to provide or help provide the desired masking effect, as indicated at a step 1438.

In some embodiments, the processor may not receive a signal indicative of the desired positioning. For example, in some embodiments, the processor may make the determination as to the desired positioning. This determination may be made, for example, based on one or more current or desired operating modes of the digital camera apparatus, one or more images captured by the processor, for example, in combination with one or more operating strategies and/or information employed by the processor. An operating strategy and/or information may be of any type and/or form.

Moreover, in some embodiments, the processor may not need to identify movements to provide the desired positioning. For example, in some embodiments, the processor may receive signals indicative of the movements to be employed.

Mechanical Shutter

In some embodiments, it is desired to configure the digital camera with a mechanical shutter for use in controlling transmission of light to the sensor portion.

FIGS. 55A-55C show a portion of a digital camera apparatus 210 that includes an optics portion, e.g., optics portion 262A, having a mechanical shutter 1440 in accordance with one embodiment of aspects of the present invention. In this embodiment, the mechanical shutter 1440 includes a mask 1450 that is disposed, for example, between a lens 1395 and a sensor portion, e.g., sensor portion 264A. The mask 1450 defines one or more openings, e.g., openings $\mathbf{1452}_{11}$-$\mathbf{1452}_{m,n}$. The openings, e.g., openings $\mathbf{1452}_{11}$-$\mathbf{1452}_{m,n}$, may be arranged, for example, in a pattern that corresponds with the pattern of the sensor elements of the sensor portion, e.g., sensor portion 264A. For example, if the sensor elements are arranged in a grid pattern, the openings $\mathbf{1452}_{11}$-$\mathbf{1452}_{m,n}$ of the mask 1450 may be arranged in a grid pattern that corresponds therewith (e.g., the openings $\mathbf{1452}_{11}$-$\mathbf{1452}_{m,n}$ of the mask 1450 may be arranged in a grid pattern that is the same as, or a scaled version of, the grid pattern in which the sensor elements are arranged).

The positioning system 280 may be employed to position the mechanical shutter 1440 and/or some other portion of the optics portion, e.g., optics portion 262A, and/or the sensor portion, e.g., sensor portion 264A, to facilitate control over the amount of light transmitted to one or more portions of the optics portion, e.g., optics portion 262A, and/or the sensor portion, e.g., sensor portion 264A.

For example, FIG. 55A shows the lens 1395, the mechanical shutter 1440 and the sensor portion 264A in a first relative positioning (sometimes referred to herein as a "fully open positioning"). In such positioning, each opening $\mathbf{1452}_{11}$-$\mathbf{1452}_{m,n}$ in the mask 1450 is in register with a respective sensor element of the sensor elements, e.g., sensor elements $\mathbf{380}_{11}$-$\mathbf{380}_{m,n}$, of the sensor portion 264A, such that a minimum amount of light, or no light, within the field of view is blocked by the mask 1450 and the balance of the light within the field of view passes through the openings and strikes the sensor elements, e.g., sensor elements $\mathbf{380}_{11}$-$\mathbf{380}_{m,n}$, of the sensor portion 264A.

FIG. 55B shows the lens 1395, the mechanical shutter 1440 and the sensor portion 264A in a second relative positioning (sometimes referred to herein as a "closed positioning"). In such positioning, the openings $\mathbf{1452}_{11}$-$\mathbf{1452}_{m,n}$ in the mask 1450 are out of register, at least in part, with respective sensor elements, e.g., sensor elements $\mathbf{380}_{11}$-$\mathbf{380}_{m,n}$, of the sensor portion 264A such that a minimum amount of light, or no light, within the field of view strikes the sensor elements of the sensor portion 264A but rather strikes regions, e.g., region 1454, between the sensor elements of the sensor portion 264A.

FIG. 55C shows the lens 1395, the mechanical shutter 1440 and the sensor portion 264A in a third relative positioning (sometimes also referred to herein as an "open positioning"). In such positioning, the mask 1450 is out of the optical path 1410 of the sensor portion 264A, such that a maximum amount of light within the field of view strikes the sensor elements, e.g., sensor elements $\mathbf{380}_{11}$-$\mathbf{380}_{m,n}$, of the sensor portion 264A.

Some embodiments may not be able to provide each of the types of movements shown. For example, some embodiments may not have a range of motion sufficient to move a mask (and/or any other portion of the optics portion) totally out of the optical path of all camera channel(s).

FIGS. 55D-55F show a portion of a digital camera apparatus 210 that includes an optics portion 262A having a mechanical shutter 1440 in accordance with another embodiment of aspects of the present invention. In this embodiment, the mechanical shutter 1440 has first and second masks 1450, 1460 disposed, for example, between a lens and a sensor portion 264A. Each mask 1450, 1460 defines one or more openings. For example, the first mask 1450 defines openings $\mathbf{1452}_{11}$-$\mathbf{1452}_{m,n}$. The second mask 1460 defines openings $\mathbf{1456}_{11}$-$\mathbf{1456}_{m,n}$. The openings may be arranged, for example, in a pattern that corresponds to the pattern of the sensor elements, e.g., sensor elements $\mathbf{380}_{11}$-$\mathbf{380}_{m,n}$. For example, if the sensor elements, e.g., sensor elements $\mathbf{380}_{11}$-$\mathbf{380}_{m,n}$, are arranged in a grid pattern, the openings of the masks 1450, 1460 may be arranged in a grid pattern that corresponds therewith (e.g., the openings of the masks may be arranged in a grid pattern that is the same as, or a scaled version of, the grid pattern in which the sensor elements are arranged).

The positioning system 280 may be employed to position one or more of the masks 1450, 1460 and/or some other portion of the optics portion, e.g., optics portion 262A, and/or the sensor portion, e.g., sensor portion 264A, to facilitate control over the amount of light transmitted to one or more portions of the optics portion and/or the sensor portion.

FIG. 55D shows the lens 1395, the mechanical shutter 1440 and the sensor portion 264A in a first relative positioning (sometimes referred to herein as a "fully open positioning"). In such positioning, each opening in the first mask 1450 is in register with a respective opening in the second mask 1460 and a respective sensor element of sensor array 264A, such that a minimum amount of light, or no light, within the field of view is blocked by the mechanical shutter 1440 and the balance of the light within the field of view passes through the openings and strikes the sensor elements, e.g., sensor elements $\mathbf{380}_{11}$-$\mathbf{380}_{m,n}$.

FIG. 55E shows the lens 1395, the mechanical shutter 1440 and the sensor portion 264A in a second relative positioning (sometimes referred to herein as a "partially closed positioning"). In such positioning, the openings in the first mask 1450 are out of register with respective openings in the second mask 1460, such that a minimum amount of light, or no light, within the field of view strikes the sensor elements. In such positioning, the light within the field of view strikes the second mask 1460 (rather than passing through the openings in the second mask), see for example, region 1464 of second mask 1460, and is therefore not transmitted to the sensor elements, e.g., sensor elements $\mathbf{380}_{11}$-$\mathbf{380}_{m,n}$, of the sensor portion 256A.

FIG. 55F shows the lens 1395, the mechanical shutter 1440 and the sensor portion 264A in a third relative positioning (sometimes also referred to herein as an "open positioning"). In such positioning, the shutter 1440 is out of the optical path 1410, such that a maximum amount of light within the field of view strikes the sensor elements, e.g., sensor elements $\mathbf{380}_{11}$-$\mathbf{380}_{m,n}$.

FIG. 56 shows a flowchart of steps 1470 that may be employed in association with a mechanical shutter, according to one embodiment of the present invention. In this embodiment, at a step 1472, the system receives a signal indicative of the amount of light to be transmitted and/or one or more movements to be applied to one or both of the masks and/or some other portion of the optics portion and/or the sensor portion to control the amount of light to be transmitted.

The signal may be supplied from any source, including, but not limited to, from the processor and/or the user peripheral interface. For example, in some embodiments, the peripheral user interface may include one or more input devices by which the user can indicate a preference in regard to the amount of light transmitted to the sensor portion, and the peripheral user interface may provide a signal that is indicative of such preference. The signal from the peripheral user interface may be supplied directly to the controller of the positioning system or to some other portion of the processor, which may in turn process the signal to generate one or more control signals to be provided to the controller of the positioning system to carry out the user's preference. In some other embodiments, the processor may capture one or more images and may process such images and make a determination as to whether a desired amount of light is being transmitted to the sensor and if not, whether the amount of light should be increased or decreased. Some other embodiments may employ combinations thereof. In some embodiments, the signal is indicative of absolute or relative positioning, the amount of movement, the amount of light to be transmitted or not transmitted and/or combinations thereof. The signal may have any form for example, a magnitude, a difference, a ratio, or any other suitable method.

At a step 1474, the system identifies one or more movements to facilitate control over the amount of light transmitted to one or more portions of the optics portion and/or the sensor portion. The movement may be movement in the x direction, y direction, z direction, tilting, rotation and/or combinations thereof. Note that the movements need not be computed every time but rather the movement may be computed once, stored and accessed as needed. The movements may be predetermined, adaptively determined and/or a combination thereof.

In some embodiments, the system includes a mapping of an overall relationship between the one or more inputs, e.g., the amount of light to be transmitted, and one or more output(s), e.g., the movement to facilitate the desired control and/or control signals to be supplied to actuators of the positioning system 280. The mapping may have any of various forms known to those skilled in the art, including but not limited to, a formula, a look-up table, a "curve read", fuzzy logic, neural networks. The mapping may be predetermined, adaptively determined and/or a combination thereof. Once generated, use of a mapping embodiment may entail considerably less processing overhead than that required other embodiments. A mapping may be generated "off-line" by providing one or more input output combinations. Each input/output combination includes one or more input values and one or more output values associated therewith.

Each combination of input values and the associated output value collectively represent one data point in the overall input output relation. The data points may be used to create a look-up table that provides one or more outputs values for each of a plurality of combinations of input(s), one o and output(s). Or, instead of a look-up table, the data points may be input to a statistical package to produce a formula for calculating the output based on the inputs. A formula can typically provide an appropriate output for any input combination in the sensor input range of interest, including combinations for which data points were not generated.

A look-up table embodiment may be responsive to absolute magnitudes and/or relative differences. A look-up table embodiment may use interpolation to determine an appropriate output for any input combination not in the table. A mapping embodiment may be implemented in software, hardware, firmware or any combination thereof.

At a step 1476, the system initiates one, some or all of the one or more movements identified at step 1474. The movement may be provided, for example, using any of the structure(s) and/or method(s) disclosed herein. In some embodiments, the movement is initiated by supplying one or more control signals to one or more actuators of the positioning system 280.

As stated above, in some embodiments, the processor may not receive a signal indicative of the desired positioning. For example, in some embodiments, the processor may make the determination as to the desired positioning. This determination may be made, for example, based on one or more current or desired operating modes of the digital camera apparatus, one or more images captured by the processor, for example, in combination with one or more operating strategies and/or information employed by the processor. An operating strategy and/or information may be of any type and/or form.

Moreover, in some embodiments, the processor may not need to identify movements to provide the desired positioning. For example, in some embodiments, the processor may receive signals indicative of the movements to be employed.

In some embodiments, further steps may be performed to determine whether the movements had the desired effect, and if the desired effect is not achieved, to make further adjustments.

For example, FIGS. 57A-57B show a flowchart 1480 of steps that may be employed in providing a mechanical shutter, according to another embodiment of the present invention. This embodiment includes steps 1482, 1484, 1486 that are the same as steps 1472, 1474, 1476, respectively, described above with respect to FIG. 56.

A first image is captured at a step 1488. At a step 1490, the system processes the image and generates a measure of the amount of light transmitted by the mechanical shutter.

At a step 1492, the system determines whether the amount of light transmitted by the mechanical shutter is the same as the desired amount, and if not, the system determines a difference between the two amounts. At a step 1494, the system compares the difference to a reference magnitude.

If the difference is greater than the reference magnitude, then at a step 1496, the system identifies one or more movements that could be applied to one or more portions of the optics portion and/or to the sensor portion to compensate for the difference.

That is, one or more movements to cause the amount of light transmitted by the mechanical shutter and/or the amount of light received by the sensor elements to be equal to or less than the amount of light that is desired. Data indicative of compensation and/or the movement used to compensate may be stored.

If the desired amount of shutter and/or transmitted light is not provided, execution returns to step 1484 and the system initiates one, some or all of the one or more movements identified at step 1488. At a step 1486, the system initiates one, some or all of the one or more movements identified at step 1496. The movement may be provided, for example, using any of the structure(s) and/or method(s) disclosed herein. In some embodiments, the movement is initiated by supplying one or more control signals to one or more actuators of the positioning system 280 to control the amount of shuttering and/or transmitted light, e.g., one or more control signals that will cause movement and result in a desired amount of shuttering and/or transmitted light.

In some embodiments, steps 1488-1496 are repeated until the desired amount of shuttering is provided, e.g., the difference is less than or equal to the reference magnitude or until a designated number of repetitions (e.g., two or more) do not result in significant improvement.

Although the mechanical shutter 1440 in FIGS. 55A-55C is shown having one portion (e.g., one mask) and although the mechanical shutter 1440 in FIGS. 55D-55F is shown having two portions (e.g., two masks), it should be understood that a shutter may have any configuration. For example, some other embodiments employ a shutter having more than two portions (e.g., more than two masks).

Moreover, although the shutter 1440 is shown disposed between the lens 1395 and the sensor portion 264A, the shutter 1440 or portions thereof may be disposed in any position or positions suitable to control or help control the amount of light transmitted to one or more portions of one or more optics portions and/or one or more portions of one or more sensor portions. In addition, although the two masks 1450, 1460 in FIGS. 55D-55F are shown disposed adjacent to one another, it should be understood that portions of a mechanical shutter may or may not be disposed adjacent to one another.

Mechanical Iris

In some embodiments, it is desired to configure the digital camera apparatus 210 with a mechanical iris for use in controlling the amount of light transmitted to the optics and/or sensor.

FIGS. 58A-58D show a portion of a digital camera apparatus 210 that includes an optics portion 262A having a mechanical iris 1490 in accordance with one embodiment of aspects of the present invention. In this embodiment, the mechanical iris 1490 includes a mask 1450, disposed, for example, between a lens 1395 and a sensor portion 264A. The mask 1450 defines one or more openings, e.g., openings $\mathbf{1452}_{11}$-$\mathbf{1452}_{m,n}$. The openings may be arranged, for example, in a pattern that corresponds to the pattern of the sensor elements, e.g., sensor elements $\mathbf{380}_{11}$-$\mathbf{380}_{m,n}$. For example, if the sensor elements are arranged in a grid pattern, the openings of the mask 1450 may be arranged in a grid pattern that corresponds therewith (e.g., the openings of the mask may be arranged in a grid pattern that is the same as, or a scaled version of, the grid pattern in which the sensor elements are arranged).

The positioning system 280 may be employed to position the mechanical iris 1490 and/or some other portion of the optics portion and/or the sensor portion to facilitate control over the amount of light transmitted to one or more portions of the optics portion and/or the sensor portion.

For example, FIG. 58A shows the lens 1395, the mechanical iris 1490 and the sensor portion 264A in a first relative positioning (sometimes referred to herein as a "fully open positioning"). In such positioning, each opening, e.g., openings $\mathbf{1452}_{11}$-$\mathbf{1452}_{m,n}$, in the mask 1450 is in register with a respective sensor element, such that a minimum amount of light, or no light, within the field of view is blocked by the mask and the balance of the light within the field of view passes through the openings and strikes the sensor elements.

FIG. 58B shows the lens 1395, the mechanical iris 1490 and the sensor portion 264A in a second relative positioning (sometimes referred to herein as a "partially closed positioning"). In such positioning, the openings, e.g., openings $\mathbf{1452}_{11}$-$\mathbf{1452}_{m,n}$, in the mask 1450 are partially out of register with respective sensor elements, e.g., sensor elements $\mathbf{380}_{11}$-$\mathbf{380}_{m,n}$, such that a portion of the light does not strike the sensor elements, e.g., sensor elements $\mathbf{380}_{11}$-$\mathbf{380}_{m,n}$, but rather strikes regions, for example, a region 1492, between the sensor elements.

FIG. 58C shows the lens 1395, the mechanical iris 1490 and the sensor portion 264A in a third relative positioning (sometimes referred to herein as a "closed positioning"). In such positioning, the openings, e.g., openings $\mathbf{1452}_{11}$-$\mathbf{1452}_{m,n}$, in the mask are out of register, at least in part, with respective sensor elements, e.g., sensor elements $\mathbf{380}_{11}$-$\mathbf{380}_{m,n}$, such that a minimum amount of light, or no light, within the field of view strikes the sensor elements, e.g., sensor elements $\mathbf{380}_{11}$-$\mathbf{380}_{m,n}$, but rather strikes regions, e.g., region 1454 between the sensor elements.

FIG. 58D shows the lens 1395, the mechanical iris 1490 and the sensor portion 264A in a fourth relative positioning (sometimes also referred to herein as an "open positioning"). In such positioning, the mask 1450 is out of the optical path, such that a maximum amount of light within the field of view strikes the sensor elements.

Some embodiments may not be able to provide each of the types of movements shown. For example, some embodiments may not have a range of motion sufficient to move a mask (and/or any other portion of the optics portion) totally out of the optical path of all camera channel(s).

The positioning system may be employed to position the mechanical iris and/or some other portion of the optics portion and/or the sensor portion to facilitate control over the amount of light transmitted to one or more portions of the optics portion and/or the sensor portion.

FIGS. 58E-58H show a portion of a digital camera apparatus that includes an optics portion, e.g., optics portion 262A, having a mechanical iris 1490 in accordance with one embodiment of another aspect of the present invention. In this embodiment, the mechanical iris 1490 has first and second masks 1450, 1460 disposed, for example, between a lens, e.g., lens 1395, and a sensor portion, e.g., sensor portion 264A. Each mask 1450, 1460 defines one or more openings. For example, the first mask defines openings $\mathbf{1452}_{11}$-$\mathbf{1452}_{m,n}$. The second mask defines openings $\mathbf{1462}_{11}$-$\mathbf{1462}_{m,n}$. The openings in the first and second masks may be arranged, for example, in a pattern that corresponds to the pattern of the sensor elements, e.g., sensor elements $\mathbf{380}_{11}$-$\mathbf{380}_{m,n}$, of the sensor array 264A. For example, if the sensor elements are arranged in a grid pattern, the openings $\mathbf{1452}_{11}$-$\mathbf{1452}_{m,n}$, $\mathbf{1462}_{11}$-$\mathbf{1462}_{m,n}$ may be arranged in a grid pattern that corresponds therewith (e.g., the openings of the masks may be arranged in a grid pattern that is the same as, or a scaled version of, the grid pattern in which the sensor elements, e.g., sensor elements $\mathbf{380}_{11}$-$\mathbf{380}_{m,n}$, are arranged).

FIG. 58E shows the lens 1395, the mechanical iris 1490 and the sensor portion 264A in a first relative positioning (sometimes referred to herein as a "fully open positioning"). In such positioning, each opening $\mathbf{1452}_{11}$-$\mathbf{1452}_{m,n}$ in the first mask 1450 is in register with a respective opening $\mathbf{1462}_{11}$-$\mathbf{1462}_{m,n}$ in the second mask and a respective sensor element, such that a minimum amount of light, or no light, within the field of view is blocked by the mechanical iris and the balance of the light within the field of view passes through the openings and strikes the sensor elements.

FIG. 58F shows the lens 1395, the mechanical iris 1490 and the sensor portion 264A in a second relative positioning (sometimes referred to herein as a "partially closed positioning"). In such positioning, the openings $\mathbf{1452}_{11}$-$\mathbf{1452}_{m,n}$ in the first mask 1450 are partially out of register with respective openings $\mathbf{1462}_{11}$-$\mathbf{1462}_{m,n}$ in the second mask 1460, such that some of the light strikes the second mask (rather than passing through the openings in the second mask), e.g., region 1494, and is therefore not transmitted to the sensor elements, e.g., sensor elements $\mathbf{380}_{11}$-$\mathbf{380}_{m\ n}$, of the sensor portion 264A.

FIG. 58G shows the lens 1395, the mechanical iris 1490 and the sensor portion 264A in a third relative positioning (sometimes referred to herein as a "closed positioning"). In such positioning, the openings $\mathbf{1452}_{11}$-$\mathbf{1452}_{m,n}$ in the first mask 1450 are out of register with respective openings $\mathbf{1462}_{11}$-$\mathbf{1462}_{m,n}$ in the second mask 1460, such that a minimum amount of light, or no light, within the field of view strikes the sensor elements. In such positioning, the light within the field of view strikes the second mask (rather than passing through the openings in the second mask), e.g., region 1464, and is therefore not transmitted to the sensor elements, e.g., sensor elements $\mathbf{380}_{11}$-$\mathbf{380}_{m,n}$, of the sensor portion 264A.

FIG. 58H shows the lens, the mechanical iris and the sensor portion in a fourth relative positioning (sometimes also referred to herein as an "open positioning"). In such positioning, the iris is out of the optical path, such that a maximum amount of light within the field of view strikes the sensor elements.

FIG. 59 shows a flowchart 1500 of steps that may be employed in association with a mechanical iris, according to one embodiment of the present invention.

At a step 1502, the system receives a signal indicative of the amount of light to be transmitted and/or one or more movements to be applied to one or both of the masks and/or some other portion of the optics portion and/or the sensor portion to control the amount of light to be transmitted.

The signal may be supplied from any source, including, but not limited to, from the processor and/or the user peripheral interface. For example, in some embodiments, the peripheral user interface may include one or more input devices by which the user can indicate a preference in regard to the amount of light transmitted to the sensor portion, and the peripheral user interface may provide a signal that is indicative of such preference. The signal from the peripheral user interface may be supplied directly to the controller of the or to some other portion of the processor, which may in turn process the signal to generate one or more control signals to be provided to the controller to carry out the user's preference. In some other embodiments, the processor may capture one or more images and may process such images and make a determination as to whether a desired amount of light is being transmitted to the sensor and if not, whether the amount of light should be increased or decreased. Some other embodiments may employ combinations thereof.

At a step 1504, the system identifies one or more movements to facilitate control over the amount of light transmitted to one or more portions of the optics portion and/or the sensor portion. The movement may be relative movement in the x direction and/or y direction, relative movement in the z direction, tilting, rotation and/or combinations thereof.

As used herein identifying, determining, and generating includes identifying, determining, and generating, respectively, in any way including but not limited to, computing, accessing stored data and/or mapping (e.g., in a look up table) and/or combinations thereof.

Note that the movements need not be computed every time but rather the movement may be computed once (or alternatively predetermined), stored and accessed as needed.

The signal may be indicative of absolute or relative positioning, the amount of movement, the amount of light to be transmitted or not transmitted and/or combinations thereof. The signal may have any form for example, a magnitude, a difference, a ratio, or any other suitable method.

An alternative embodiment comprises a mapping of an overall relationship between the inputs and the output(s). The mapping may have any of various forms known to those skilled in the art, including but not limited to, a look-up table, a formula, a "curve read", fuzzy logic, neural networks. The mapping may be predetermined or adaptively. Once generated, use of a mapping embodiment may entail considerably less processing overhead than that required other embodiments. A mapping may be generated "off-line". For example, different combinations of input magnitudes may be presented. For each combination, an output is produced. Each combination and its associated output together represent one data point in the overall input output relation. The data points may be used to create a look-up table that provides, for each of a plurality of combinations of inputs, an associated output. Or, instead of a look-up table, the data points may be input to a statistical package to produce a formula for calculating the output based on the inputs. Such a formula may be able to provide an output for any input combination in a range of interest, including combinations for which data points were not generated. A look-up table embodiment may be responsive to absolute magnitudes or alternatively to relative differences (or some other indication) between the inputs. A look-up table embodiment may use interpolation to determine an appropriate output for any input combination that is not in the table.

A mapping embodiment may have any type of implementation, such as, for example, software, hardware, firmware or any combination thereof.

At a step 1506, the system initiates one, some or all of the one or more movements identified at step 1504. The movement may be provided, for example, using any of the structure(s) and/or method(s) disclosed herein. In some embodiments, the movement is initiated by supplying one or more control signals to one or more actuators of the positioning system 280.

In some embodiments, the processor may not receive a signal indicative of the desired positioning. For example, in some embodiments, the processor may make the determination as to the desired positioning. This determination may be made, for example, based on one or more current or desired operating modes of the digital camera apparatus, one or more images captured by the processor, for example, in combination with one or more operating strategies and/or information employed by the processor. An operating strategy and/or information may be of any type and/or form.

Moreover, in some embodiments, the processor may not need to identify movements to provide the desired positioning. For example, in some embodiments, the processor may receive signals indicative of the movements to be employed.

In some embodiments, further steps may be performed to determine whether the movements had the desired effect, and if the desired effect is not achieved, to make further adjustments.

For example, FIG. 60 shows a flowchart 1510 of steps that may be employed in providing mechanical iris. This embodiment includes steps 1512, 1514, 1516 that are the same as steps 1502, 1504, 1506, respectively, described above with respect to FIG. 59.

A first image is captured at a step 1518. At a step 1520, the system processes the image and generates a measure of the amount of light transmitted by the mechanical iris. At a step 1522, the system determine whether the amount of light transmitted by the mechanical iris is the same as the desired amount, and if not, the system determines a difference between the two amounts. At a step 1524, the system compares the difference to a reference magnitude.

If the difference is greater than the reference magnitude, then at a step 1526, the system identifies one or more movements that could be applied to one or more portions of the optics portion and/or to the sensor portion to compensate for the difference. That is, one or more movements to cause the amount of light transmitted by the mechanical iris and/or the amount of light received by the sensor elements to be equal to the amount of light that is desired.

If the desired amount of iris and/or transmitted light is not provided, execution returns to step 1516 and the system initiates one, some or all of the one or more movements identified at step 1526. The movement may be provided, for example, using any of the structure(s) and/or method(s) disclosed herein. In some embodiments, the movement is initiated by supplying one or more control signals to one or more actuators of the positioning system 280.

In some embodiments, steps 1518-1526 are repeated until the desired amount of iris is provided, e.g., the difference is less than or equal to the reference magnitude, or until a designated number of repetitions (e.g., two or more) do not result in significant improvement.

Data indicative of the compensation and/or the movement used to compensate is stored.

Although the iris in FIGS. 58A-58C is shown having one portion (e.g., one mask), and the iris in FIGS. 58D-58F is shown having two portions (e.g., two masks), it should be understood that an iris may have any configuration. For example, some other embodiments employ an iris having more than two portions (e.g., more than two masks).

Moreover, although the iris is shown disposed between the lens and the sensor portion, the iris or portions thereof may be disposed in any position or positions suitable to control or help control the amount of light transmitted to one or more portions of one or more optics portions and/or one or more portions of one or more sensor portions. In addition, although the two masks in FIGS. 55D-55F are shown disposed adjacent to one another, it should be understood that portions of a mechanical iris may or may not be disposed adjacent to one another.

Multispectral and Hyperspectral Imaging

In some embodiments, one or more filters, prisms, and/or glass elements (e.g., glass elements of different thicknesses), which can each pass, alter and/or block light, are employed in the optical path of one or more of the camera channels. In such embodiments, it may be desirable to have the ability to change and/or move one or more filters, prisms, and/or glass elements (e.g., glass elements of different thicknesses) into, within, and/or out of an optical path. The positioning system may be used to introduce movement to change and/or move one or more of such filters, prisms, and/or glass elements (e.g., glass elements of different thicknesses) into, within and/or out of an optical path. As stated above, some embodiments may not be able to provide every possible type of movement. For example, some embodiments may not have a range of motion sufficient to move a filter, prisms, and/or glass elements (e.g., glass elements of different thicknesses) (and/or any other portion of the optics portion) totally out of the optical path of all camera channel(s).

In some embodiments, one or more filters are employed in the optical path of one or more of the camera channels. In such embodiments, it may be desirable to have the ability to change one or more of the filtering characteristics of a filter in an optical path.

To this effect, it may be advantageous to employ a filter that is adapted to provide different sets of filtering characteristics. The ability to select multiple filters within one or more camera channels can provide multi-spectral imaging (typically 2-10 spectral bands) or hyper-spectral imaging (typically 10-100 s spectral bands) capability.

FIGS. 61A-61C show a portion of a digital camera apparatus 210 that includes an optics portion 262A having a hyperspectral filter 1600 in accordance with one embodiment of aspects of the present invention. The hyperspectral filter 1600 is adapted to provide different sets of filtering characteristics. The hyperspectral filter defines one or more filter portions, e.g., filter portions 1602, 1604, 1606. Each of the filter portions, e.g., filter portions 1602, 1604, 1606, provides one or more filtering characteristics different than the filtering characteristics provided by one, some or all of the other filter portions. In some embodiments, for example, each portion transmits only one color (or band of colors) and/or a wavelength (or band of wavelengths). For example, the first filter portion 1602 may transmit only green light, the second filter portion 1604 may transmit only red light and the third filter 1606 portion may transmit only blue light. The filter 1600 may further define one or more transition regions, e.g., transition regions 1608, 1610, 1612, that separate the adjacent filter portions 1602, 1604, 1606. The transition regions, e.g., transition regions 1608, 1610, 1612, may be discrete (e.g., abrupt) transition regions, continuous (e.g., gradual) transition regions and/or any combination thereof.

The filter 1600 and filter portions, e.g., filter portions 1602, 1604, 1606, may have any shape. In this embodiment, for example, the filter is cylindrical 1600 and each filter portion 1602, 1604, 1606 is a wedge shaped portion of the overall filter 1600.

The filter 1600 may be positioned anywhere, for example, between a lens, e.g., lens 1395, and a sensor portion 264A.

In this embodiment, however, only one of the filter portions, e.g., filter portions 1602, 1604, 1606, is positioned in the optical path, e.g., optical path 1410, at any given time.

The positioning system 280 may be used to introduce movement to one or more portions of the optics portion, e.g., optics portion 262A, and/or to move the sensor portion, e.g., sensor portion 264A, so as to insert a filter portion into the optical path, move a filter portion within the optical path, and/or remove a filter portion from the optical path and/or any combination thereof. The movement may be movement in the x direction, y direction, z direction, tilting, rotation and/or any combination thereof. The movement may be provided, for example, using any of the structure(s) and/or method(s) disclosed herein. In some embodiments, the movement is initiated by supplying one or more control signals to one or more actuators of the positioning system 280.

For example, FIG. 61A shows the lens 1395, the filter 1600 and the sensor portion 264A in a first relative positioning. In such positioning, the first filter portion 1602 is in the optical path, e.g., optical path 1410 (e.g., in register with the lens 1395 and the sensor portion 1600). The second and third filter portions 1604, 1606 are out of the optical path 1410 (e.g., out of register with the lens 1395 and the sensor portion 1600).

FIG. 61B shows the lens 1395, the filter 1600 and the sensor portion 264A in a second relative positioning. In such positioning, the second filter portion 1604 is in the optical path 1410 (e.g., in register with the lens and the sensor portion). The first and third filters 1602, 1606 are out of the optical path 1410 (e.g., out of register with the lens and the sensor portion).

FIG. 61C shows the lens 1395, the filter 1600 and the sensor portion 264A in a third relative positioning. In such positioning, the third filter portion 1606 is in the optical path 1410 (e.g., in register with the lens and the sensor portion). The first and second filters 1602, 1604 are out of the optical path 1410 (e.g., out of register with the lens 1395 and the sensor portion 264A).

In some embodiments, a digital camera apparatus 210 includes an optics portion 262A having a filter in accordance with any other embodiments of any aspects of the present invention. Notably, in these embodiments, the filter may be any filter now known or later developed.

FIG. 62A shows a flowchart 1620 of steps that may be employed in association with the filter 1600 according to one embodiment of the present invention. In this embodiment, a first image is captured at a step 1622, for example, with the optics portion and the sensor portion of a camera channel in a first relative positioning. At a step 1624, the system identifies one or more movements to provide or help provide the desired hyperspectral imaging. In some embodiments, the one or more movements provide a second relative positioning between the optics portion and sensor portion of the camera channel, wherein with optics portion and the sensor portion in the second relative positioning, one or more filters, or portions thereof, are in the optical path 1410 and/or one or more filters, or portions thereof, are out of the optical path 1410 of one or more sensors. The one or more movements may be movement in the x direction, y direction, z direction, tilting, rotation and/or combinations thereof. The one or movements may be movements to be applied to the filter and/or any other portions of the optic portion and/or movement of the sensor portion. The movement may be provided, for example, using any of the structure(s) and/or method(s) disclosed herein.

At a step 1626, the system initiates one, some or all of the one or more movements identified at step 1624. In some embodiments, the movement is initiated by supplying one or more control signals to one or more actuators of the positioning system 280.

A second image is captured at a step 1628, for example, with the optics portion and sensor portion of the camera channel in the second relative positioning provide by the movement initiated by step 1624. In some embodiments, the image capture process is repeated with different wavelength band pass filters as desired.

At a step 1630, the system combines the images to provide or help provide the desired multispectral and/or hyperspectral imaging.

In some embodiments, one or more portions of the first image may be combined with one or more portions of one or more other images (filtered or unfiltered) to provide or help provide the desired effect.

FIG. 62B is a block diagram representation of one embodiment of a combiner 1630 for generating a multispectral and/or hyperspectral image. The combiner 1630 has one or more inputs, e.g. to receive images captured from one or more camera channels of the digital camera apparatus 210. In this embodiment, for example, n inputs are provided. The first input receives a first image captured from each of one or more of the camera channels. The second input receives a second image captured from each of one or more of the camera channels. The nth input receives an nth image captured from each of one or more of the camera channels.

The combiner 1630 further includes one or more inputs to receive one or more signals indicative of one or more desired effects, e.g., one or more desired hyperspectral effects. The combiner 1630 generates one or more output signals indicative of one or more images having the one or more desired effects. In this embodiment, the combiner 1630 generates one output signal, e.g., hyperspectral image, which is indicative of an image having the one or more desired hyperspectral effects.

FIG. 63 shows a flowchart 1640 of steps that may be employed in providing multispectral and/or hyperspectral imaging, according to another embodiment of the present invention. In this embodiment, a first image is captured at a step 1642, for example, with the optics portion and the sensor portion of a camera channel in a first relative positioning. At a step 1644, the system identifies one or more movements to provide or help provide the desired hyperspectral imaging. In some embodiments, the one or more movements provide a second relative positioning between the optics portion and sensor portion of the camera channel, wherein with optics portion and the sensor portion in the second relative positioning, one or more filters, or portions thereof, are in the optical path 1410 and/or one or more filters, or portions thereof, are out of the optical path 1410 of one or more sensors. The one or more movements may be movement in the x direction, y direction, z direction, tilting, rotation and/or combinations thereof. The one or movements may be movements to be applied to the filter and/or any other portions of the optic portion and/or movement of the sensor portion. The movement may be provided, for example, using any of the structure(s) and/or method(s) disclosed herein.

At a step 1646, the system initiates one, some or all of the one or more movements identified at step 1644. In some embodiments, the movement is initiated by supplying one or more control signals to one or more actuators of the positioning system 280.

A second image is captured at a step 1648, for example, with the optics portion and sensor portion of the camera channel in the second relative positioning provide by the movement initiated by step 1644.

A step 1650 determines whether the imaging is done. If the imaging is not done, execution returns to step 1644 and the system identifies one or more movements to provide or help provide the desired hyperspectral imaging. In some embodiments, the one or more movements provide a third relative positioning between the optics portion and sensor portion of the camera channel, wherein with optics portion and the sensor portion in the third relative positioning, one or more filters, or portions thereof, are in the optical path 1410 and/or one or more filters, or portions thereof, are out of the optical path 1410 of one or more sensors. The one or more movements may be movement in the x direction, y direction, z direction, tilting, rotation and/or combinations thereof. The one or movements may be movements to be applied to the filter and/or any other portions of the optic portion and/or movement of the sensor portion. The movement may be provided, for example, using any of the structure(s) and/or method(s) disclosed herein.

At step 1646, the system initiates one, some or all of the one or more movements identified at step 1644. In some embodiments, the movement is initiated by supplying one or more control signals to one or more actuators of the positioning system 280. A third image is thereafter captured at a step 1648, for example, with the optics portion and sensor portion of the camera channel in the third relative positioning provide by the movement initiated by step 1644.

In some embodiments, steps 1644-1650 are repeated until the hyperspectral imaging is done. Thereafter, at a step 1652, the system combines the images to provided or help provide the desired hyperspectral imaging.

In some embodiments, one or more portions of the first image may be combined with one or more portions of one or more other images (filtered or unfiltered) to provide or help provide the desired effect.

Figure 64A:
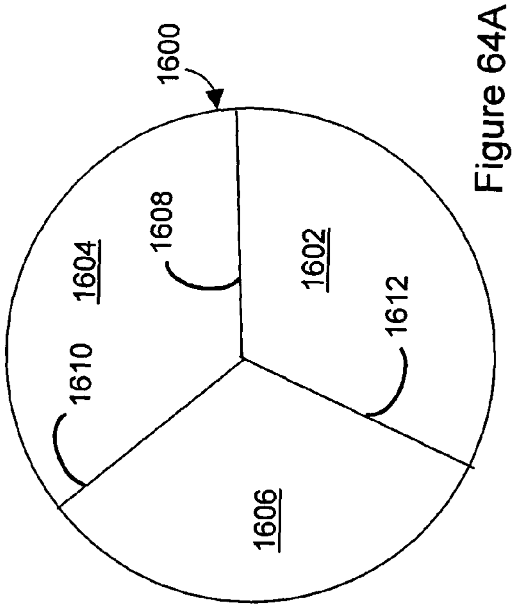
Figure 64B:
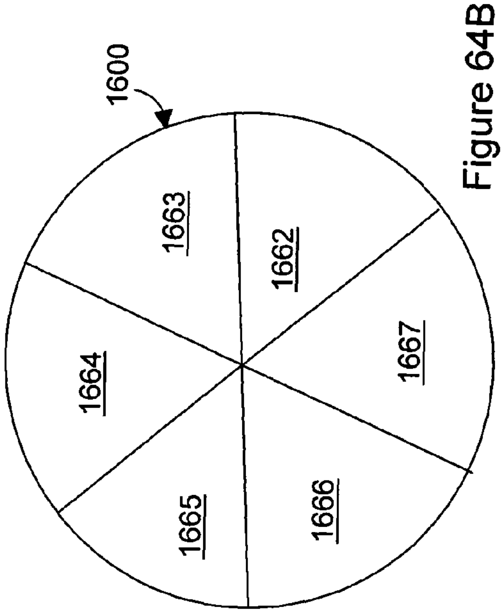
Figure 64C:
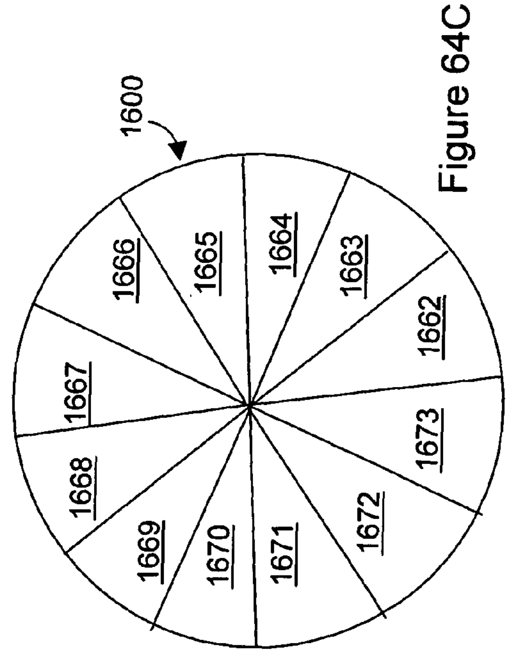
Figure 64D:
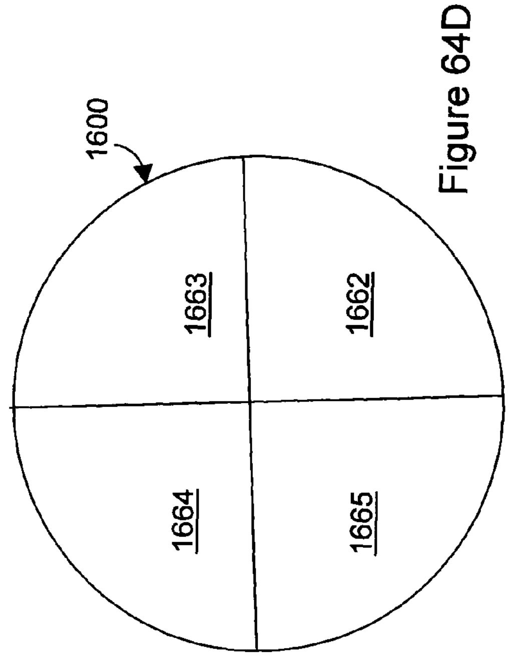
Figure 64F:
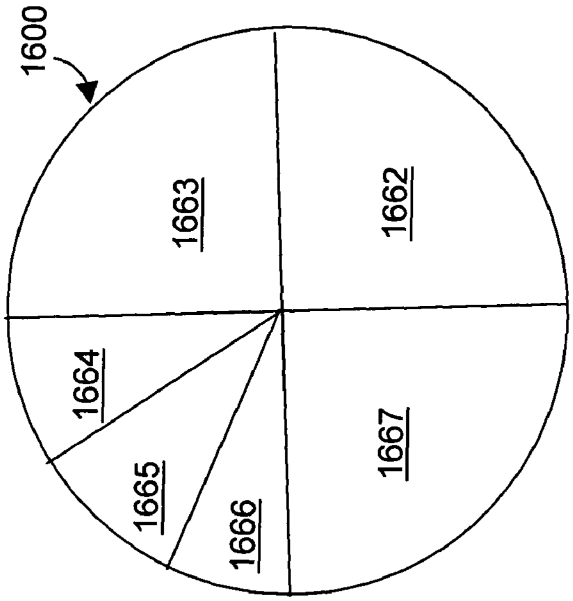
Figure 64E:
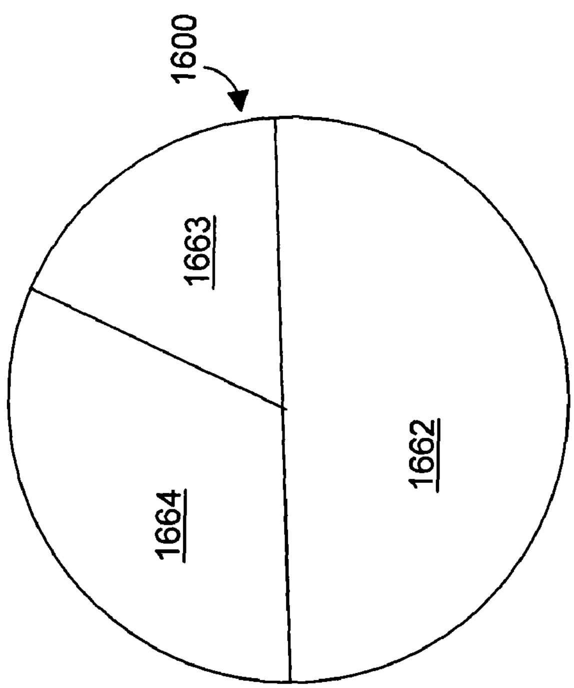

FIGS. 64A-64F shows some embodiments of filters that may be employed in multispectral and/or hyperspectral imaging. For example, FIG. 64A shows one embodiment of a hyperspectral filter 1600 adapted to provide different sets of filtering characteristics. In this embodiment, the hyperspectral filter 1600 defines three filter portions 1602, 1604, 1606. The filter 1600 may further define one or more transition regions, e.g., transition regions 1608, 1610, 1612, that separate adjacent filter portions. FIG. 64B shows another embodiment of a hyperspectral filter 1600 adapted to provide different sets of filtering characteristics. In this embodiment, the hyperspectral filter 1600 defines six filter portions 1662-1667. The filter 1600 may further define one or more transition regions that separate adjacent filter portions. FIG. 64C shows another embodiment of a hyperspectral filter 1600 adapted to provide different sets of filtering characteristics. In this embodiment, the hyperspectral filter 1600 defines twelve filter portions 1662-1673. The filter 1600 may further define one or more transition regions that separate adjacent filter portions. FIG. 64D shows another embodiment of a hyperspectral filter 1600 adapted to provide different sets of filtering characteristics. In this embodiment, the hyperspectral filter 1600 defines four filter portions 1662-1665. The filter 1600 may further define one or more transition regions that separate adjacent filter portions. FIG. 64E shows another embodiment of a hyperspectral filter 1600 adapted to provide different sets of filtering characteristics. In this embodiment, the hyperspectral filter 1600 defines three filter portions 1662-1664. The filter 1600 may further define one or more transition regions that separate adjacent filter portions. FIG. 64F shows another embodiment of a hyperspectral filter 1600 adapted to provide different sets of filtering characteristics. In this embodiment, the hyperspectral filter 1600 defines six filter portions 1662-1667. The filter 1600 may further define one or more transition regions that separate adjacent filter portions.

As stated above, each of the filter portions, e.g., filter portions 1602, 1604, 1606, provides one or more filtering characteristics different than the filtering characteristics provided by one, some or all of the other filter portions. In some embodiments, for example, each portion transmits only one color (or band of colors) and/or a wavelength (or band of wavelengths). The transition regions may be discrete (e.g., abrupt) transition regions, continuous (e.g., gradual) transition regions and/or any combination thereof. The filter 1600 and filter portions may have any shape. In this embodiment, for example, the filter is cylindrical 1600 and each filter portion is a wedge shaped portion of the overall filter 1600.

FIGS. 65A-65D show a portion of a digital camera apparatus that includes a hyperspectral filter 1600 in accordance with another embodiment of aspects of the present invention. In this embodiment, the hyperspectral filter 1600 defines three filter portions 1602, 1604, 1606. FIG. 65A shows a first relative positioning of the filter 1600, lenses, e.g., lenses 1700A-1700C, and sensor portions, e.g., sensor portions 264A-264C, of three camera channels, e.g., camera channels 260A-260C. In the first positioning, the first filter portion 1602 is disposed in the optical path of the first sensor portion 264A, between the sensor portion 264A and the lens 1700A of camera channel 260A. The second filter portion 1604 is disposed in the optical path of second sensor portion 264B, between the sensor portion 264B and the lens 1700B of camera channel 260B. The third filter portion 1606 is disposed in the optical path of third sensor portion 264C, between the third sensor portion 264C and the lens 1700C of camera channel 260C. The positioning system 280 of the digital camera apparatus 210 may be used to introduce movement to change the relative positioning described above. In this embodiment, for example, the positioning system 280 provides rotational movement to the filter 1600 to change the relative positioning.

FIG. 65B shows a second relative positioning of the filter 1600, lenses 1700A-1700C and sensor portions 264A-264D of camera channels 260A-260C. In the second relative positioning, the first filter portion 1602 is disposed in the optical path of the second sensor portion 264B, between the sensor portion 264B and the lens 1700B of camera channel 260B. The second filter portion 1604 is disposed in the optical path of third sensor portion 264C, between the sensor portion 264C and the lens 1700C of camera channel 260C. The third filter portion 1606 is disposed in the optical path of first sensor portion 264A, between the sensor portion 264A and the lens 1700A of camera channel 260A.

FIG. 65C shows a third relative positioning of the filter 1600, lenses 1700A-1700C and sensor portions 264A-264D of camera channels 260A-260C. In the third relative positioning, the first filter portion 1602 is disposed in the optical path of the third sensor portion 264C, between the sensor portion 264C and the lens 1700C of camera channel 260C. The second filter portion 1604 is disposed in the optical path of first sensor portion 264A, between the sensor portion 264A and the lens 1700A of camera channel 260A. The third filter portion 1606 is disposed in the optical path of second sensor portion 264B, between the sensor portion 264B and the lens 1700B of camera channel 260B.

FIG. 65D shows a fourth relative positioning of the filter 1600, lenses 1700A-1700C and sensor portions 264A-264D of camera channels 260A-260C. In the fourth positioning, the first filter portion 1602 is disposed in the optical path of the first sensor portion 264A, between the sensor portion 264A and the lens 1700A of camera channel 260A. The second filter portion 1604 is disposed in the optical path of second sensor portion 264B, between the sensor portion 264B and the lens 1700B of camera channel 260B. The third filter portion 1606 is disposed in the optical path of third sensor portion 264C, between the third sensor portion 264C and the lens 1700C of camera channel 260C.

FIGS. 66A-66D show a portion of a digital camera apparatus that includes a hyperspectral filter 1600 in accordance with another embodiment of aspects of the present invention. In this embodiment, the hyperspectral filter 1600 defines four filter portions 1662-1665. FIG. 66A shows a first relative positioning of the filter 1600, a lens, e.g., lens 1700A, and a sensor portion, e.g., sensor portion 264A, of camera channel 260A. In the first positioning, the first filter portion 1662 is disposed in the optical path of the sensor portion 264A, between the sensor portion 264A and the lens 1700A of camera channel 260A. The positioning system 280 of the digital camera apparatus 210 may be used to introduce movement to change the relative positioning described above. In this embodiment, for example, the positioning system 280 provides rotational movement to the filter 1600 to change the relative positioning.

FIG. 66B shows a second relative positioning of the filter 1600, lens 1700A and sensor portion 264A of camera channel 260A. In the second positioning, the second filter portion 1663 is disposed in the optical path of the sensor portion 264A, between the sensor portion 264A and the lens 1700A of camera channel 260A. FIG. 66C shows a third relative positioning of the filter 1600, lens 1700A and sensor portion 264A of camera channel 260A. In the third positioning, the third filter portion 1664 is disposed in the optical path of the sensor portion 264A, between the sensor portion 264A and the lens 1700A of camera channel 260A. FIG. 66D shows a fourth relative positioning of the filter 1600, lens 1700A and sensor portion 264A of camera channel 260A. In the fourth positioning, the fourth filter portion 1665 is disposed in the optical path of the sensor portion 264A, between the sensor portion 264A and the lens 1700A of camera channel 260A.

FIGS. 66E-66F show a portion of a digital camera apparatus that includes a hyperspectral filter 1600 in accordance with another embodiment of aspects of the present invention. In this embodiment, the hyperspectral filter 1600 defines twelve filter portions 1662-1673. FIG. 66E shows a first relative positioning of the filter 1600, a lens, e.g., lens 1700A, and a sensor portion, e.g., sensor portion 264A, of camera channel 260A. In the first positioning, the first filter portion 1662 is disposed in the optical path of the sensor portion 264A, between the sensor portion 264A and the lens 1700A of camera channel 260A. FIG. 66F shows a second relative positioning of the filter 1600, lens 1700A and sensor portion 264A of camera channel 260A. In the second positioning, the second filter portion 1663 is disposed in the optical path of the sensor portion 264A, between the sensor portion 264A and the lens 1700A of camera channel 260A.

FIGS. 67A-67D show a portion of a digital camera apparatus that includes a hyperspectral filter 1600 in accordance with another embodiment of aspects of the present invention. In this embodiment, the hyperspectral filter 1600 defines four filter portions 1662-1665. FIG. 67A shows a first relative positioning of the filter 1600, lenses, e.g., lenses 1700A-1700D, and sensor portions, e.g., sensor portions 264A-264D, of four camera channels, e.g., camera channels 260A-260D. In the first positioning, the first filter portion 1662 is disposed in the optical path of the first sensor portion 264A, between the sensor portion 264A and the lens 1700A of camera channel 260A. The second filter portion 1663 is disposed in the optical path of second sensor portion 264B, between the sensor portion 264B and the lens 1700B of camera channel 260B. The third filter portion 1664 is disposed in the optical path of third sensor portion 264C, between the sensor portion 264C and the lens 1700C of camera channel 260C. The third filter portion 1665 is disposed in the optical path of fourth sensor portion 264D, between the sensor portion 264D and the lens 1700D of camera channel 260D.

FIG. 67B shows a second relative positioning of the filter 1600, lenses 1700A-1700D and sensor portions 264A-264D of camera channels 260A-260D. In the second positioning, the first filter portion 1662 is disposed in the optical path of the second sensor portion 264B, between the sensor portion 264B and the lens 1700B of camera channel 260B. The second filter portion 1663 is disposed in the optical path of fourth sensor portion 264D, between the sensor portion 264D and the lens 1700D of camera channel 260D. The third filter portion 1664 is disposed in the optical path of first sensor portion 264A, between the sensor portion 264A and the lens 1700A of camera channel 260A. The fourth filter portion 1665 is disposed in the optical path of third sensor portion 264C, between the sensor portion 264C and the lens 1700C of camera channel 260C.

FIG. 67C shows a third relative positioning of the filter 1600, lenses 1700A-1700D and sensor portions 264A-264D of camera channels 260A-260D. In the third positioning, the first filter portion 1662 is disposed in the optical path of the fourth sensor portion 264D, between the sensor portion 264D and the lens 1700D of camera channel 260D. The second filter portion 1663 is disposed in the optical path of third sensor portion 264C, between the sensor portion 264C and the lens 1700C of camera channel 260C. The third filter portion 1664 is disposed in the optical path of second sensor portion 264B, between the sensor portion 264B and the lens 1700B of camera channel 260B. The fourth filter portion 1665 is disposed in the optical path of first sensor portion 264A, between the sensor portion 264A and the lens 1700A of camera channel 260A.

FIG. 67D shows a fourth relative positioning of the filter 1600, lenses 1700A-1700D and sensor portions 264A-264D of camera channels 260A-260D. In the fourth positioning, the first filter portion 1662 is disposed in the optical path of the first sensor portion 264A, between the sensor portion 264A and the lens 1700A of camera channel 260A. The second filter portion 1663 is disposed in the optical path of second sensor portion 264B, between the sensor portion 264B and the lens 1700B of camera channel 260B. The third filter portion 1664 is disposed in the optical path of third sensor portion 264C, between the sensor portion 264C and the lens 1700C of camera channel 260C. The third filter portion 1665 is disposed in the optical path of fourth sensor portion 264D, between the sensor portion 264D and the lens 1700D of camera channel 260D Some embodiments may employ multiple filters in combination to provide a desired set or sets of filtering characteristics.

In some embodiments, one or more prisms and/or glass elements (e.g., glass elements of different thicknesses) are employed in multispectral and/or hyperspectral imaging, in addition to and/or in lieu the one or more filters shown in FIGS. 61A-61C, 64A-64F, 65A-65D, 66A-66F and/or 67A-67D.

Increase/Decrease Parallax

If the digital camera apparatus has more than one camera channel, the camera channels will necessarily be spatially offset from one another (albeit, potentially by a small distance). This spatial offset can introduce a parallax between the camera channels, e.g., an apparent change in position of an object as a result of changing the position from which the object is viewed.

Figure 68A:
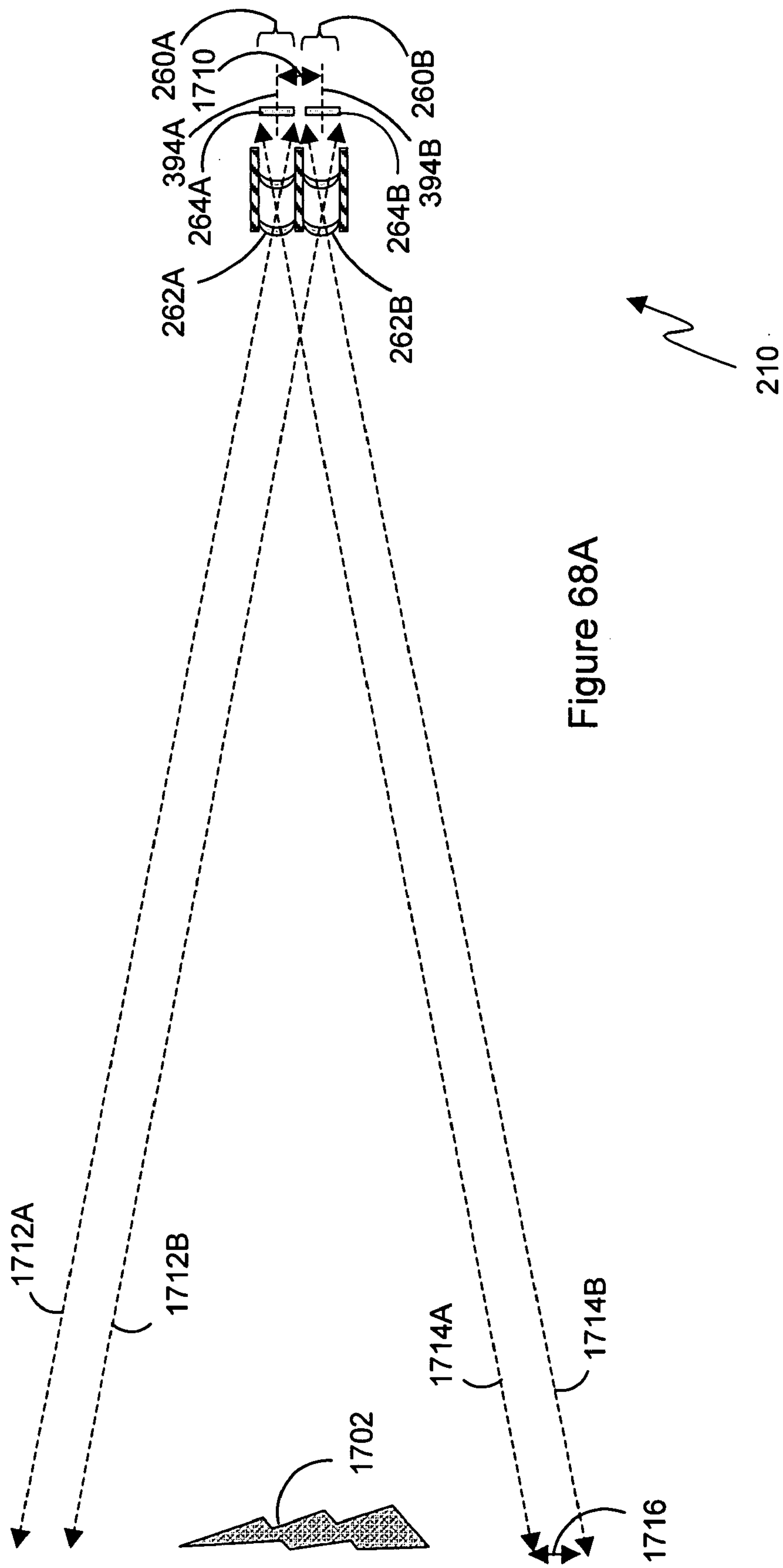

FIGS. 68A-68E show an example of parallax in the digital camera apparatus 210. More particularly, FIG. 68A shows an object (i.e., a lightning bolt) 1702 and a digital camera apparatus 210 having two camera channels, e.g., camera channels 260A-260B, spatially offset from one another by a distance 1710. The first camera channel 260A has a sensor 264A and a first field of view (between dotted lines 1712A, 1714A) centered about a first axis 394A. The second camera channel 260B has a sensor 264B and a second field of view (between dotted lines 1712B, 1714B) that is centered about a second axis 394B and spatially offset from the first field of view by an amount 1716. The offset 1716 between the fields of view causes the position of the object within the first field of view to differ from the position of the object within the second field of view.

Figure 68B:
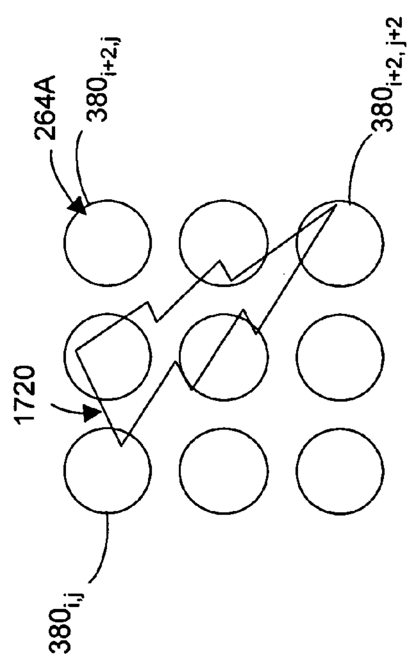

FIG. 68B is a representation of an image of the object 1720, as viewed by the first camera channel 260A, striking a portion of the sensor 264A, for example, the portion of the sensor 264A illustrated in FIGS. 6A-6B, 7A-7B, of the first camera channel 260A. The sensor has a plurality of sensor elements, e.g., sensor elements $\mathbf{380}_{i,j}$-$\mathbf{380}_{i+2,j+2}$, shown schematically as circles.

Figure 68C:
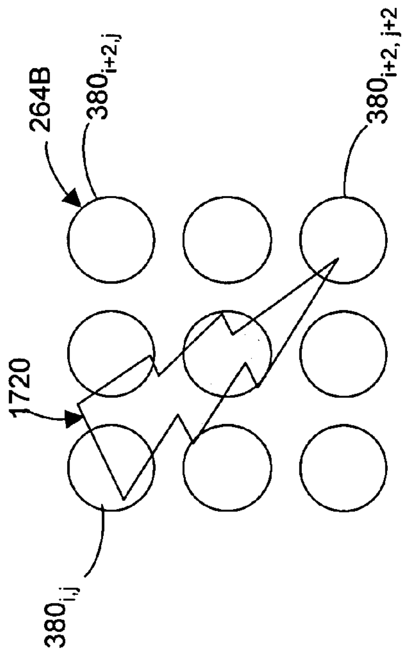

FIG. 68C is a representation of an image of the object 1720, as viewed by the second camera channel 260B, striking a portion of the sensor 264B, for example, a portion that is the same or similar to the portion of the sensor 264A illustrated in FIGS. 6A-6B, 7A-7B, in the second camera channel. The sensor has a plurality of sensor elements, e.g., sensor elements $\mathbf{380}_{i,j}$-$\mathbf{380}_{i+2,j+2}$, shown schematically as circles.

Figure 68D:
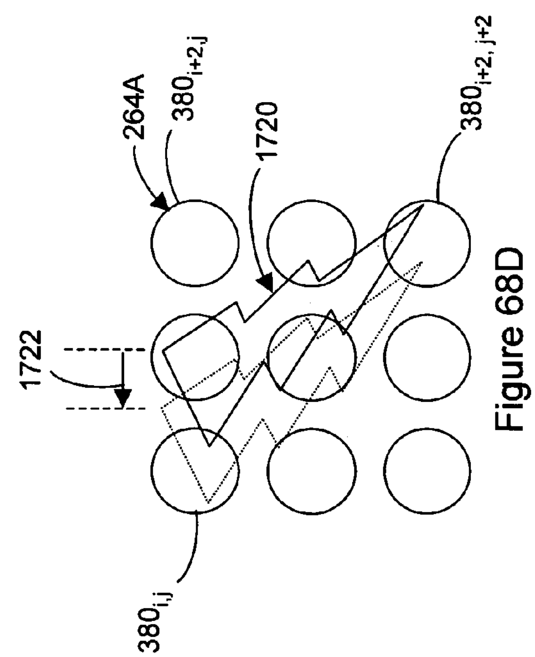

FIG. 68D shows the image viewed by the first camera channel 264A superimposed with the image viewed by the second camera channel 264B. The shaded image indicates the position of the image of the object 1720 relative to the sensor 264A of the first camera channel 260. The dashed image indicates the position of the image of the object 1720 relative to the sensor 264B of the second camera channel 260B. The difference between the position of the object 1720 in the first image (i.e., as viewed by the first camera channel 264A (FIG. 68B)) and the position of the object 1720 in the second image (i.e., as viewed by the second camera channel 264B (FIG. 68C)) is indicated at vector 1722. In this example, the parallax is in the x direction.

Figure 68E:
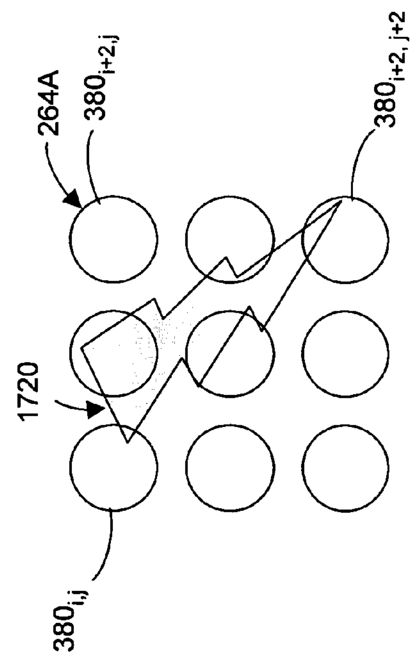

FIG. 68E shows the image viewed by the first camera channel 264A superimposed with the image viewed by the second camera channel 264B if such parallax is eliminated.

Figure 68F:
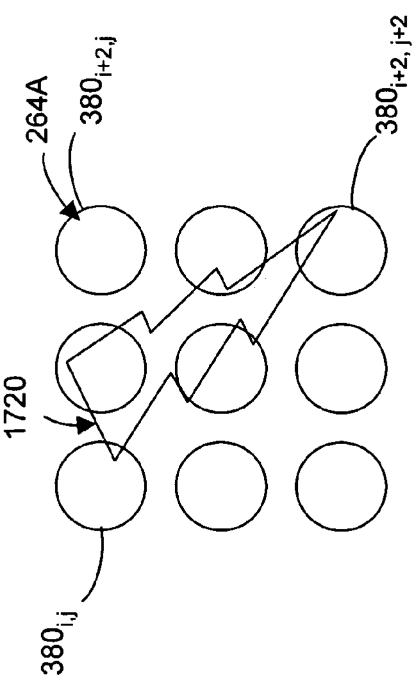
Figure 68G:
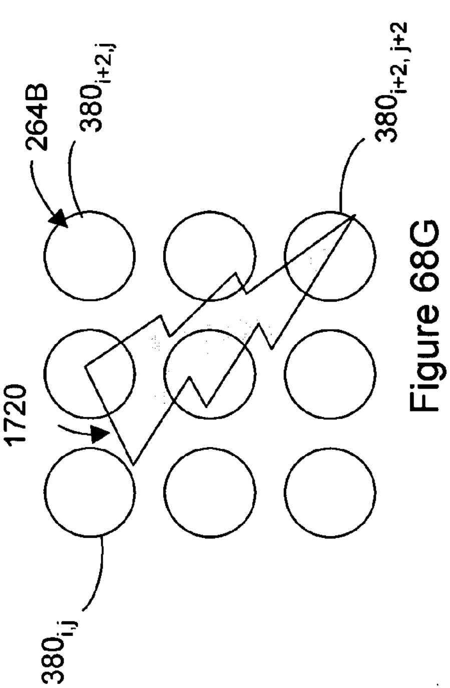
Figure 68H:
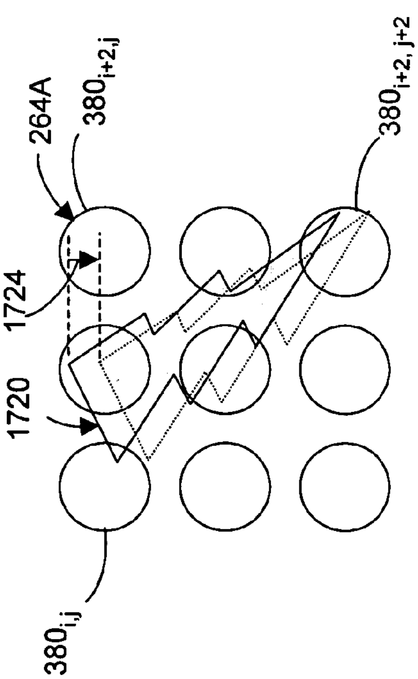

FIGS. 68F-68I show an example of parallax in the y direction. In that regard, FIG. 68F is a representation of an image of the object 1720, as viewed by the first camera channel 260A, striking the sensor 264A of the first camera channel 260A. FIG. 68G is a representation of an image of the object 1720, as viewed by the second camera channel 260B, striking the sensor 264B in the second camera channel. FIG. 68H shows the image viewed by the first camera channel 264A superimposed with the image viewed by the second camera channel 264B. The shaded image indicates the position of the image of the object 1720 relative to the sensor 264A of the first camera channel 260. The dashed image indicates the position of the image of the object 1720 relative to the sensor 264B of the second camera channel 260B. The difference between the position of the object 1720 in the first image (i.e., as viewed by the first camera channel 264A (FIG. 68F)) and the position of the object 1720 in the second image (i.e., as viewed by the second camera channel 264B (FIG. 68G)) is indicated at vector 1724. In this example, the parallax is in the y direction.

Figure 68I:
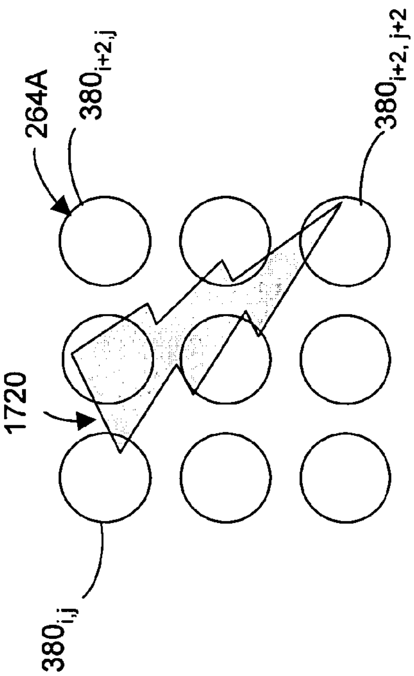

FIG. 68I shows the image viewed by the first camera channel superimposed with the image viewed by the second camera channel if such parallax is eliminated.

Figure 68J:
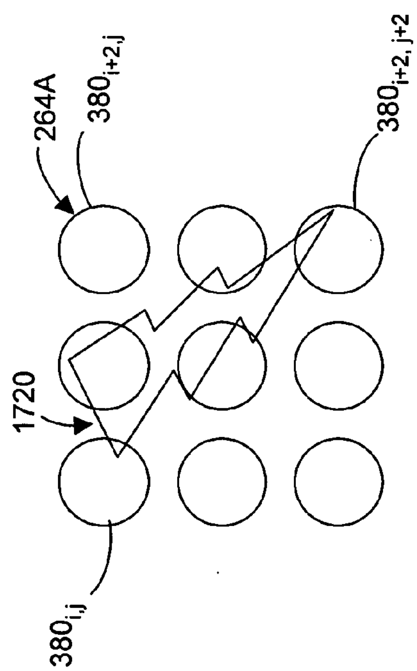
Figure 68K:
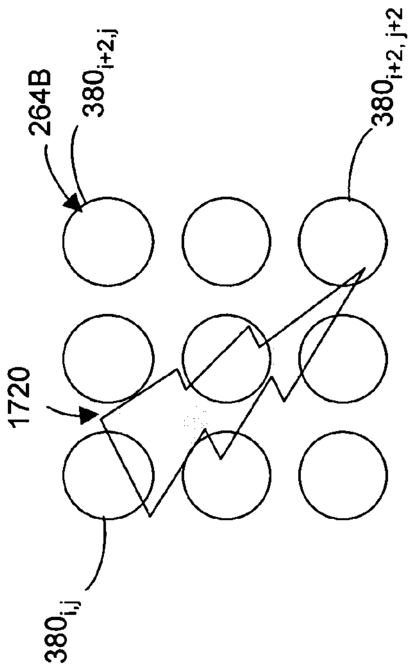
Figure 68L:
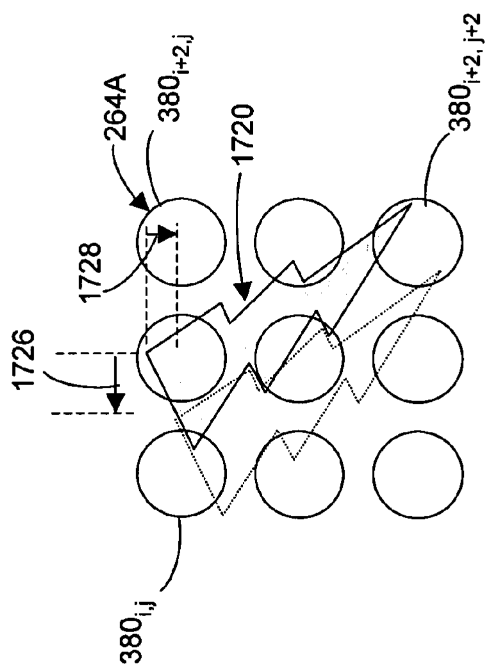

FIGS. 68J-68M show an example of parallax having an x component and a y component. In that regard, FIG. 68J is a representation of an image of the object 1720, as viewed by the first camera channel 260A, striking the sensor 264A of the first camera channel 260A. FIG. 68K is a representation of an image of the object 1720, as viewed by the second camera channel 260B, striking the sensor 264B in the second camera channel. FIG. 68L shows the image viewed by the first camera channel 264A superimposed with the image viewed by the second camera channel 264B. The shaded image indicates the position of the image of the object 1720 relative to the sensor 264A of the first camera channel 260. The dashed image indicates the position of the image of the object 1720 relative to the sensor 264B of the second camera channel 260B. The difference between the position of the object 1720 in the first image (i.e., as viewed by the first camera channel 264A (FIG. 68J)) and the position of the object 1720 in the second image (i.e., as viewed by the second camera channel 264B (FIG. 68K)) is indicated by an x component 1726 and a y component 1728 of a vector. In this example, the parallax is in the x and y direction.

Figure 68M:
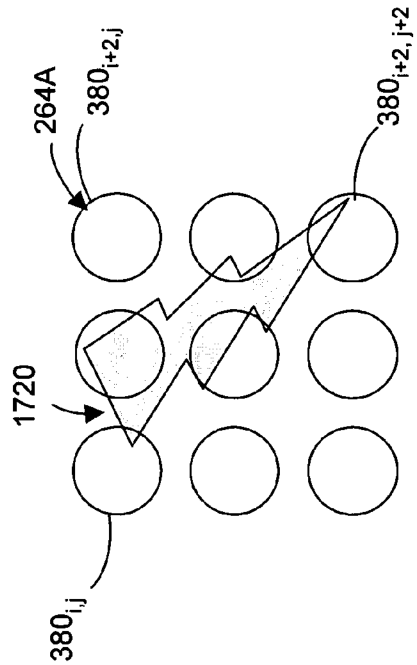

FIG. 68M shows the image viewed by the first camera channel superimposed with the image viewed by the second camera channel if such parallax is eliminated.

In some embodiments, it may be advantageous to increase and/or decrease the amount of parallax that is introduced between camera channels. For example, it may be advantageous to decrease the parallax so as to reduce differences between the images provided by two or more camera channels. It may advantageous to increase the parallax, for example, if providing a 3-D effect and/or if determining an estimate of a distance to an object within the field of view.

In some embodiments, signal processing is used to increase (e.g., exaggerate the effects of) and/or decrease (e.g., compensate for the effects of) the parallax.

Movement of one or more portions of the optics portion and/or movement of the sensor portion may also be used to increase and/or decrease parallax. The movement may be, for example, movement(s) in the x direction, y direction, z direction, tilting, rotation and/or any combination thereof.

The positioning system 280 may be employed in providing such movement, e.g., to change the amount of parallax between camera channels from a first amount to a second amount. FIGS. 68N-68R show an example of the effect of using movement to help decrease parallax in the digital camera apparatus. In this example, the positioning system 280 has been employed to provide movement to reduce the amount of parallax between the camera channels. The movement may be provided, for example, using any of the structure(s) and/or method(s) disclosed herein. In some embodiments, the movement is initiated by supplying one or more control signals to one or more actuators of the positioning system 280 to change the position of one camera channel relative to another channel and/or to change the relative positioning between the optics portion (or portions thereof) and the sensor portion (or portions thereof) of at least one camera channel.

Figure 68N:
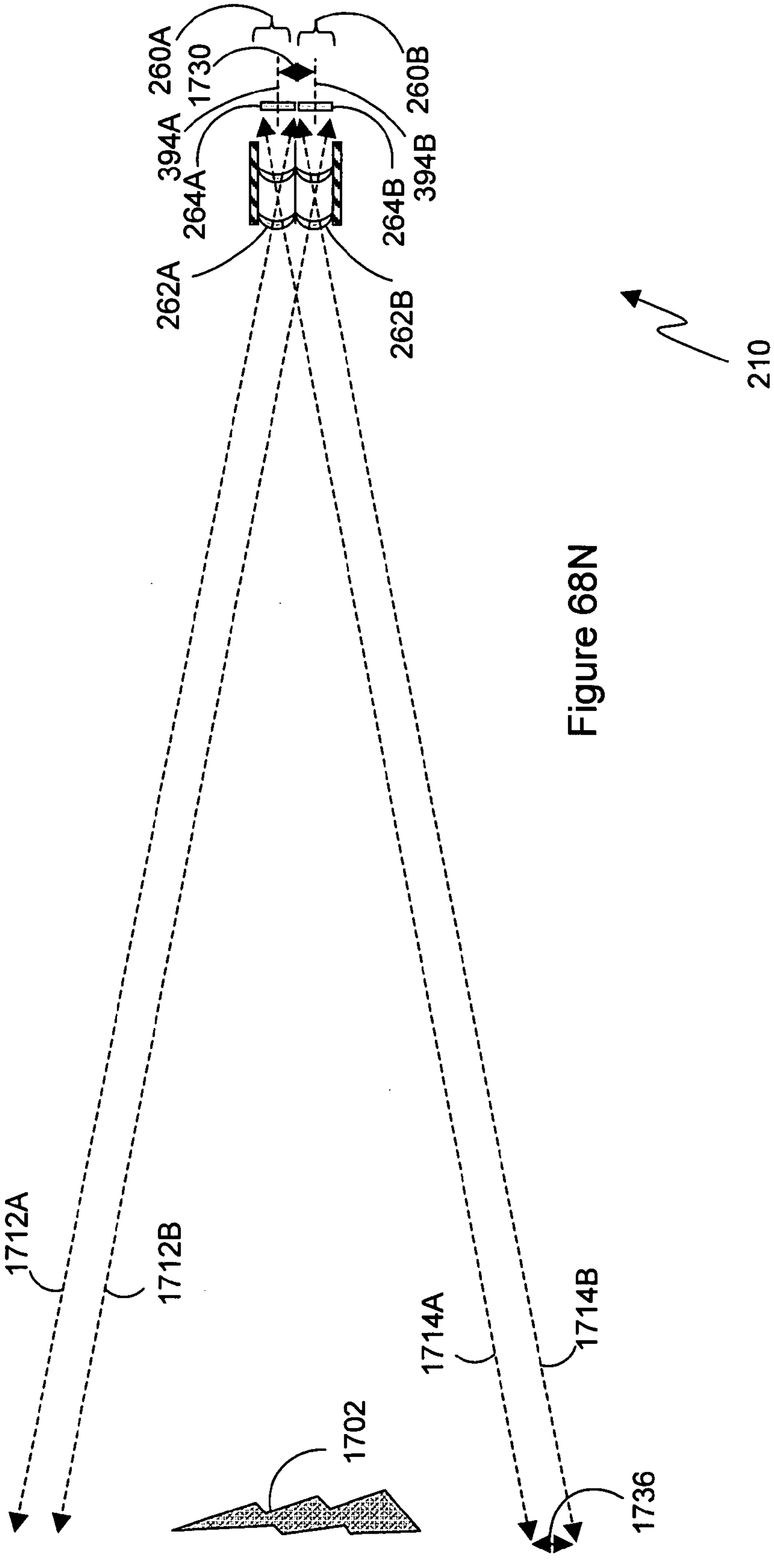

More particularly, FIG. 68N shows an object (i.e., a lightning bolt) 1702 and a digital camera apparatus 210 having two camera channels 260A, 260B spatially offset by a distance 1730. The first camera channel 260A has a sensor 264A and a first field of view (between dotted lines 1712A, 1714A) centered about a first axis 394A. The second camera channel 260B has a sensor 264A and a second field of view (between dotted lines 1712B, 1714B) that is centered about a second axis 394A and spatially offset from the first field of view. The offset between the fields of view causes the position of the object within the first field of view to differ from the position of the object within the second field of view by an amount 1736.

As can be seen, the offset 1736 is less than the offset 1716 between the first field of view (between dotted lines 1712A, 1714A) and the second field of view (between dotted lines 1712B, 1714B) in FIG. 68A.

Figure 68O:
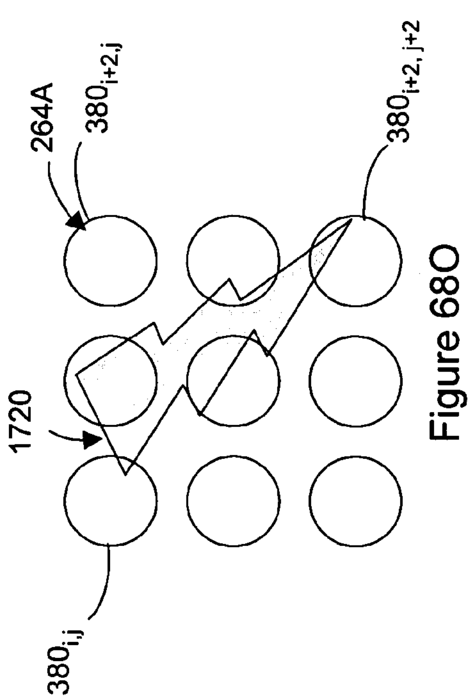

FIG. 68O is a representation of an image of the object 1720, as viewed by the first camera channel 260A, striking a portion of the sensor 264A, for example, the portion of the sensor 264A illustrated in FIGS. 6A-6B, 7A-7B, of the first camera channel 260A. The sensor has a plurality of sensor elements, e.g., sensor elements $\mathbf{380}_{i,j}$-$\mathbf{380}_{i+2,j+2}$, shown schematically as circles.

Figure 68P:
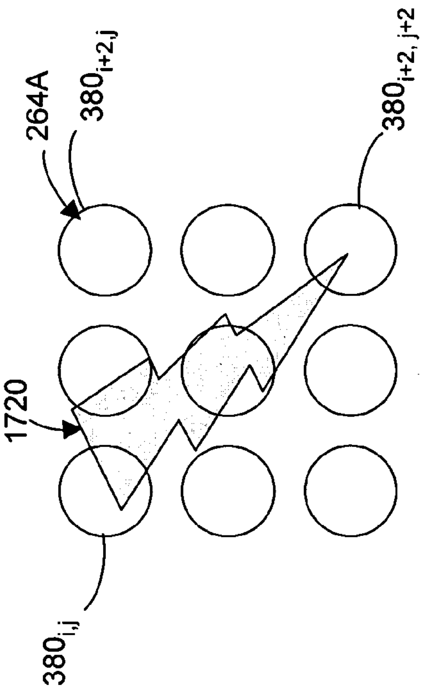

FIG. 68P is a representation of an image of the object 1720, as viewed by the second camera channel 260B, striking a portion of the sensor 264B, for example, a portion that is the same as or similar to the portion of the sensor 264A illustrated in FIGS. 6A-6B, 7A-7B, in the second camera channel. The sensor has a plurality of sensor elements, e.g., sensor elements $\mathbf{380}_{i,j}$-$\mathbf{380}_{i+2,j+2}$, shown schematically as circles.

Figure 68Q:
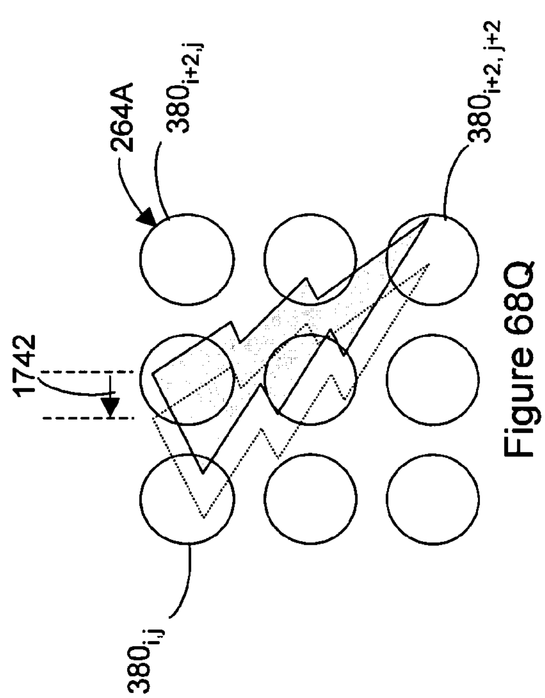

FIG. 68Q shows the image viewed by the first camera channel 264A superimposed with the image viewed by the second camera channel 264B. The shaded image indicates the position of the image of the object 1720 relative to the sensor 264A of the first camera channel 260. The dashed image indicates the position of the image of the object 1720 relative to the sensor 264B of the second camera channel 260B. The difference between the position of the object 1720 in the first image (i.e., as viewed by the first camera channel 264A (FIG. 68P)) and the position of the object 1720 in the second image (i.e., as viewed by the second camera channel 264B (FIG. 68Q)) is indicated at vector 1742. In this example, the parallax is in the x direction. As can be seen, the difference 1742 is less than the difference 1722 in FIG. 68C.

Figure 68R:
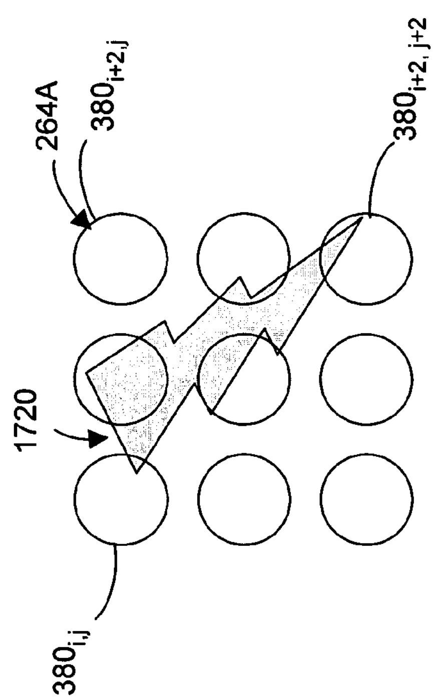

FIG. 68R shows the image viewed by the first camera channel 264A superimposed with the image viewed by the second camera channel 264B if such parallax is eliminated.

FIGS. 68S-68W show an example of the effect of using movement to help increase parallax in the digital camera apparatus. In this example, the positioning system 280 has been employed to provide movement to increase the amount of parallax between the camera channels. The movement may be provided, for example, using any of the structure(s) and/or method(s) disclosed herein. In some embodiments, the movement is initiated by supplying one or more control signals to one or more actuators of the positioning system 280 to change the position of one camera channel relative to another channel and/or to change the relative positioning between the optics portion (or portions thereof) and the sensor portion (or portions thereof) of at least one camera channel.

Figure 68S:
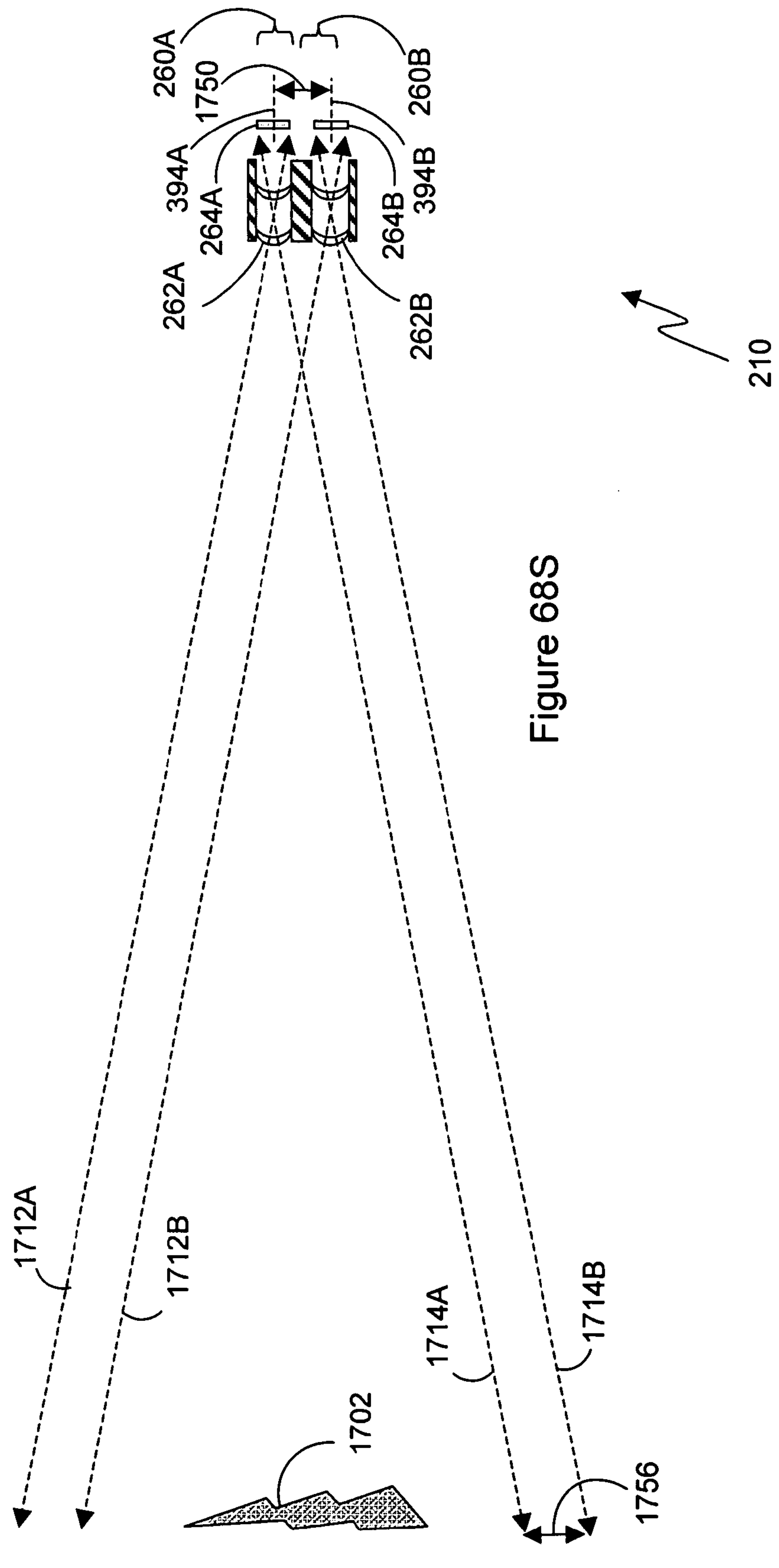

More particularly, FIG. 68S shows an object (i.e., a lightning bolt) 1702 and a digital camera apparatus 210 having two camera channels 260A, 260B spatially offset by a distance 1750. The first camera channel 260A has a sensor 264A and a first field of view (between dotted lines 1712A, 1714A) centered about a first axis 394A. The second camera channel 260B has a sensor 264A and a second field of view (between dotted lines 1712B, 1714B) that is centered about a second axis 394A and spatially offset from the first field of view. The offset between the fields of view causes the position of the object within the first field of view to differ from the position of the object within the second field of view by an amount 1756.

As can be seen, the offset 1756 is greater than the offset 1716 between the first field of view (between dotted lines 1712A, 1714A) and the second field of view (between dotted lines 1712B, 1714B) in FIG. 68A.

Figure 68U:
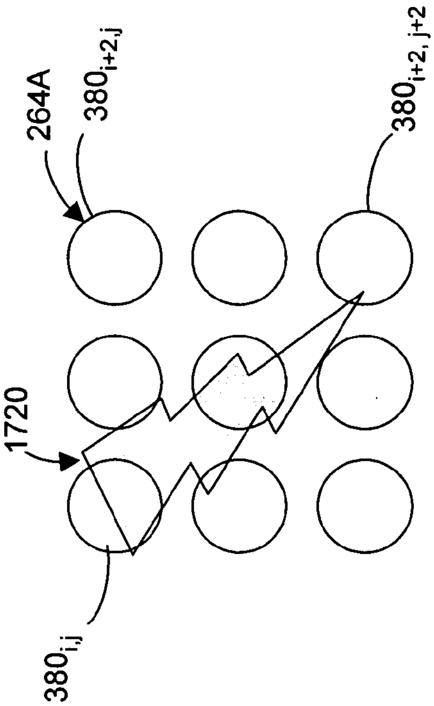
Figure 68W:
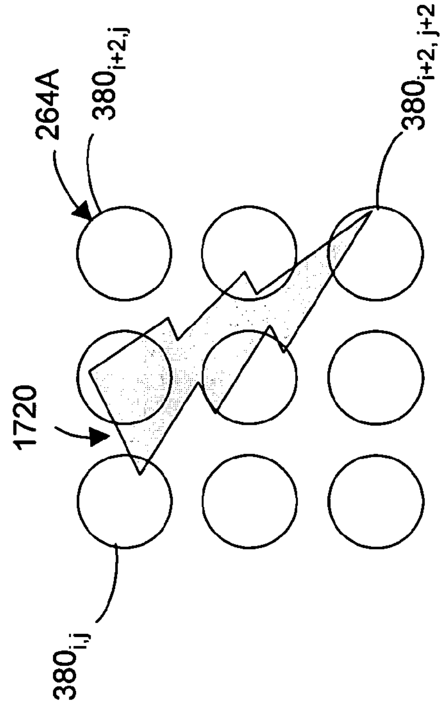
Figure 68T:
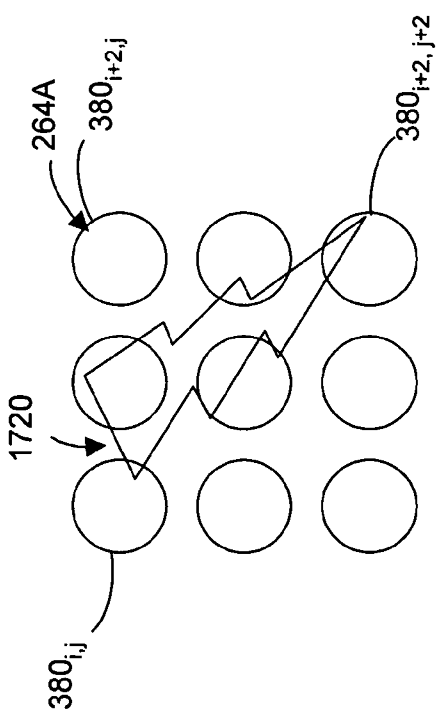

FIG. 68T is a representation of an image of the object 1720, as viewed by the first camera channel 260A, striking a portion of the sensor 264A, for example, the portion of the sensor 264A illustrated in FIGS. 6A-6B, 7A-7B, of the first camera channel 260A. The sensor has a plurality of sensor elements, e.g., sensor elements $\mathbf{380}_{i,j}$-$\mathbf{380}_{i+2,j+2}$, shown schematically as circles.

FIG. 68U is a representation of an image of the object 1720, as viewed by the second camera channel 260B, striking a portion of the sensor 264B, for example, a portion that is the same as or similar to the portion of the sensor 264A illustrated in FIGS. 6A-6B, 7A-7B, in the second camera channel. The sensor has a plurality of sensor elements, e.g., sensor elements $\mathbf{380}_{i,j}$-$\mathbf{380}_{i+2,j+2}$, shown schematically as circles.

Figure 68V:
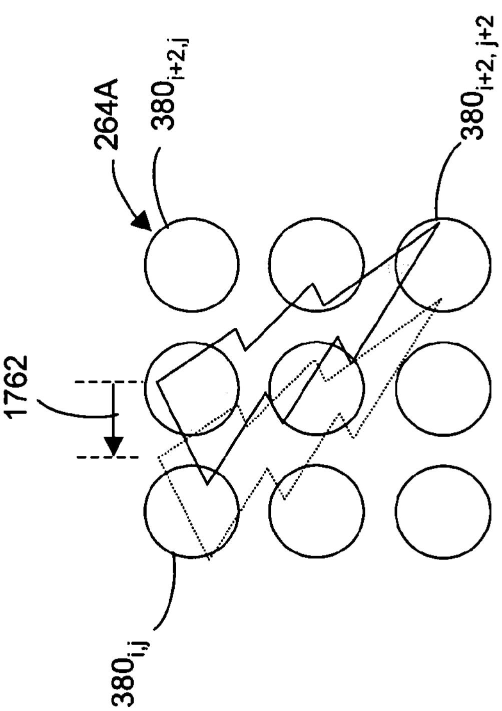

FIG. 68V shows the image viewed by the first camera channel 264A superimposed with the image viewed by the second camera channel 264B. The shaded image indicates the position of the image of the object 1720 relative to the sensor 264A of the first camera channel 260. The dashed image indicates the position of the image of the object 1720 relative to the sensor 264B of the second camera channel 260B. The difference between the position of the object 1720 in the first image (i.e., as viewed by the first camera channel 264A (FIG. 68P)) and the position of the object 1720 in the second image (i.e., as viewed by the second camera channel 264B (FIG. 68Q)) is indicated at vector 1762. In this example, the parallax is in the x direction. As can be seen, the difference 1762 is greater than the difference 1722 in FIG. 68C.

FIG. 68W shows the image viewed by the first camera channel 264A superimposed with the image viewed by the second camera channel 264B if such parallax is eliminated.

FIG. 69 shows a flowchart 1770 of steps that may be employed to increase and/or decrease parallax, according to one embodiment of the present invention. In this embodiment, at a step 1772, the system receives a signal indicative of a desired amount of parallax. At a step 1774, the system identifies one or more movements to provide or help provide the desired amount of parallax. The one or movements may be movements to be applied to one or more portions of the optic portion and/or movement of the sensor portion. The one or more movement may be movement in the x direction, y direction, z direction, tilting, rotation and/or any combination thereof. At a step 1776, the system initiates one, some or all of the one or more movements identified at step 1774.

As stated above, in some embodiments, the processor may not receive a signal indicative of the desired positioning. For example, in some embodiments, the processor may make the determination as to the desired positioning. This determination may be made, for example, based on one or more current or desired operating modes of the digital camera apparatus, one or more images captured by the processor, for example, in combination with one or more operating strategies and/or information employed by the processor. An operating strategy and/or information may be of any type and/or form.

Moreover, in some embodiments, the processor may not need to identify movements to provide the desired positioning. For example, in some embodiments, the processor may receive signals indicative of the movements to be employed.

In some embodiments, further steps may be performed to determine whether the movements had the desired effect, and if the desired effect is not achieved, to make further adjustments.

For example, FIGS. 70-71, shows a flowchart 1780 employed in another embodiment of the present invention. Steps 1782, 1784 and 1786 of this embodiment are the same as steps 1772, 1774 and 1776, respectively, described above with respect to FIG. 69

Thereafter, images are captured at a step 1788, and at a step 1790, the images are processed to determine the amount of parallax, which is compared to the desired amount of parallax to determine the difference therebetween.

At a step 1792, the system compares the difference to a reference magnitude, and if the difference is less than or equal to the reference magnitude, then at step 1796, processing stops.

If the difference is greater than the reference magnitude, then processing returns to step 1784, where the system identifies one or more movements that could be applied to one or more portions of the optics portion and/or to the sensor portion to compensate for the difference, at least in part. At step 1786, the system initiates one, some or all of the one or more movements identified at step 1784. Images are captured at step 1788, and at a step 1790, the images are processed to determine the amount of parallax, which is compared to the desired amount of parallax to determine the difference therebetween. If the difference is less than or equal to the reference magnitude, then processing stops at step 1796. Otherwise, steps 1784-1794 are repeated until the difference between the parallax and the desired parallax is less than or equal to the reference magnitude, or until a designated number of repetitions (e.g., two or more) do not result in significant improvement.

In some embodiments, the amount of increase/decrease in parallax that can be obtained by shifting in the x direction and/or y direction is small compared to the overall amount of parallax between camera channels. For example, in some embodiments, the optical path of the first camera channel and the optical path of the second camera channel are spaced about 5 mm apart (center to center) and the range of motion in the x direction and/or the y direction is limited to the width of about one pixel.

In some embodiments, tilting is employed, in addition to and/or in lieu of movement in the x direction and/or y direction. In some embodiments, a small amount of tilt is sufficient to eliminate the parallax or increase the parallax. In some such embodiments, the amount of tilt to be employed in increasing and/or decreasing parallax is based, at least in part, on the distance to one or more object within the field of view of one or more camera channels. For example, in some embodiments, a first amount of tilt is employed if one or more objects in a field of view are at a first distance or first range of distances and a second amount of tilt is employed if the one or more objects in the field of view are at a second distance or second range of distances that are different than the first distance or first range of distances, respectively. In some embodiments, the amount of tilt employed is indirectly proportional to the distance or range of distances to the one or more object. In such embodiments, the first amount of tilt may be greater than the second amount of tilt if the first distance or first range of distances is less than the second distance or second range of distances, respectively. The first amount of tilt may be less than the second amount of tilt if the first distance or first range of distances is greater than the second distance or second range of distances, respectively. The distance may be determined in any manner. Some embodiments, may employ one or more of the distance or range finding techniques described herein. Some such embodiments employ one or more of the distance or range finding techniques disclosed herein that employ parallax.

Range Finding

In some embodiments, it is desirable to be able to generate an estimate of the distance to an object within the field of view. This capability is sometimes referred to as "range finding".

One method for determining an estimate of a distance to an object is to employ parallax.

In this regard, it may be advantageous to have the ability to provide movement of one or more portions of the optic portion and/or movement of the sensor portion to increase the amount of parallax. Increasing the amount of parallax may help improve the accuracy of the estimate.

The movement may be movement in the x direction, y direction, z direction, tilting, rotation and/or any combination thereof.

The positioning system 280 may be employed in providing such movement.

FIGS. 72A-72B show a flowchart 1800 of steps that may be employed in generating an estimate of a distance to an object, or portion thereof, according to one embodiment of the present invention. Range finding may be employed with or without changing the parallax. At a step 1802, the system receives a signal indicative of a desired amount of parallax. At a step 1804, the system identifies one or more movements to provide or help provide the desired amount of parallax. At a step 1806, the system initiates one, some or all of the one or more movements identified at step 1804.

At a step 1808, an image is captured from each camera channel to be used in generating the estimate of the distance to the object (or portion thereof). For example, if two camera channels are to be used in generating the estimate, then an image is captured from the first camera channel and an image is captured from the second camera channel.

In some embodiments, at a step 1810, the system receives one or more signals indicative of the position of the object in the images or determines the position of the object within each image. For example, if two camera channels are to be used in generating the estimate of the distance to the object, the system may receive one or more signals indicative of the position of the object in the image from the first camera channel and the position of the object in the image from the second camera channel. In some other embodiments, the system determines the position of the object within each image, e.g., the position of the object within the image for the first channel and the position of the object within the image for the second channel.

At a step 1812, the system generates a signal indicative of the difference between the positions in the images. For example, if two camera channels are being used, the system generates a signal indicative of the difference between the position of the object in the image for the first camera channel and the position of the object in the image for the second camera channel.

At a step 1814, the system generates an estimate of the distance to the object (or portion thereof) based at least in part on (1) the signal indicative of the difference between the position of the object in the image for the first camera channel and the position of the object in the image for the second camera channel (2) the signal indicative of the relative positioning of the first camera channel and the second camera channel and (3) data indicative of a correlation between (a) the difference between the position of the object in the image for the first camera channel and the position of the object in the image for second camera channel, (b) the relative positioning of the first camera channel and the second camera channel and (c) the distance to an object.

In some embodiments, the processor may not receive a signal indicative of the desired positioning. For example, in some embodiments, the processor may make the determination as to the desired positioning. This determination may be made, for example, based on one or more current or desired operating modes of the digital camera apparatus, one or more images captured by the processor, for example, in combination with one or more operating strategies and/or information employed by the processor. An operating strategy and/or information may be of any type and/or form.

Moreover, in some embodiments, the processor may not need to identify movements to provide the desired positioning. For example, in some embodiments, the processor may receive signals indicative of the movements to be employed.

As stated above, in some embodiments, the amount of increase/decrease in parallax that can be obtained by shifting in the x direction and/or y direction is a small compared to the overall amount of parallax between camera channels. For example, in some embodiments, the optical path of the first camera channel and the optical path of the second camera channel are spaced about 5 mm apart (center to center) and the range of motion in the x direction and/or the y direction is limited to the width of about one pixel.

In some embodiments, tilting is employed, in addition to and/or in lieu of movement in the x direction and/or y direction. In some embodiments, a small amount of tilt is sufficient to eliminate the parallax or increase the parallax. In some such embodiments, the amount of tilt to be employed in increasing and/or decreasing parallax is based, at least in part, on the distance to one or more object within the field of view of one or more camera channels. For example, in some embodiments, a first amount of tilt is employed if one or more objects in a field of view are at a first distance or first range of distances and a second amount of tilt is employed if the one or more objects in the field of view are at a second distance or second range of distances that are different than the first distance or first range of distances, respectively. In some embodiments, the amount of tilt employed is indirectly proportional to the distance or range of distances to the one or more object. In such embodiments, the first amount of tilt may be greater than the second amount of tilt if the first distance or first range of distances is less than the second distance or second range of distances, respectively. The first amount of tilt may be less than the second amount of tilt if the first distance or first range of distances is greater than the second distance or second range of distances, respectively. The distance may be determined in any manner. Some embodiments, may employ one or more of the distance or range finding techniques described herein. Some such embodiments employ one or more of the distance or range finding techniques disclosed herein that employ parallax.

FIG. 73 is a block diagram showing a portion of one embodiment of a range finder 1820. In this embodiment, the range finder 1820 includes a differencer 1822 and an estimator 1824. The differencer 1822 has one or more inputs that receive one or more signals, e.g., Position in First Image and Position in Second Image, indicative of the position of the object in a first image and the position of the object in a second image. The differencer 1822 further includes one or more outputs that supply a difference signal, e.g, Difference, indicative of the difference between the position of the object in the first image and the position of the object in the second image.

The difference signal, Difference, is supplied to the estimator 1824, which also receives a signal, e.g., Relative Positioning, indicative of the relative positioning between the camera channel that provided the first image and the camera channel that provided the second image. In response, the estimator 1824 provides an output signal, Estimate, indicate of an estimate of the distance to the object (or portion thereof).

In order to accomplish this, the estimator 1820 includes data indicative of the relationship between (a) the difference between the position of the object in the first image and the position of the object in the second image, (b) the relative positioning of the camera channel generating the first image and the camera channel generating the second image and (c) the distance to an object. This data may be in any form, including for example, but not limited to, a mapping of a relationship between inputs (e.g., (a) the difference between the position of the object in the first image and the position of the object in the second image and (b) the relative positioning of the camera channel generating the first image and the camera channel generating the second image) and the output (e.g., an estimate of the distance to the object).

A mapping may have any of various forms known to those skilled in the art, including but not limited to a formula and/or a look-up table. The mapping may be implemented in hardware, software, firmware or any combination thereof. A mapping is preferably generated "off-line" by placing an object at a known distance from the digital camera apparatus, capturing two or more images with two or more camera channels having a known relative positioning and determining the difference between the position of the object in the image from the first camera channel and the position of the object in the image from the second camera channel.

This above process may be repeated so as to cover different combinations of known distance to the object and relative positioning of the camera channels. It may be advantageous to cover an entire range of interest (e.g. known distances and relative positioning), however, as explained below, it is generally not be necessary to cover every conceivable combination. Each combination of known distance to object, relative positioning of camera channels and difference between the position of the object in the image from the first camera channel and the position of the object in the image from the second camera channel represents one data point in the overall input output relation.

The data points may be used to create a look-up table that provides, for each of a plurality of combinations of input magnitudes, an associated output. Or, instead of a look-up table, the data points may be input to a statistical package to produce a formula for calculating the output based on the inputs. The formula can typically provide an appropriate output for any input combination in the sensor input range of interest, including combinations for which data points were not generated.

A look-up table embodiment may employ interpolation to determine an appropriate output for any input combination not in the look-up table.

The differencer 1822 may be any type of differencer that is adapted to provide one or more difference signals indicative of the difference between the position of the object in the first image and the position of the object in the second image. In this embodiment, for example, the differencer comprises an absolute value subtractor that generates a difference signal equal to the absolute value of the difference between the position of the object in the first image and the position of the object in the second image. In some other embodiments, the differencer 1822 may be a ratiometric type of differencer that generates a ratiometric difference signal indicative of the difference between the position of the object in the first image and the position of the object in the second image.

The signal indicative of the relative position of the camera channels may have any form. For example, the signal may be in the form of a single signal that is directly indicative of the difference in position between the camera channels. The signal may also be in the form of a plurality of signals, for example, two or more signals each of which indicates the position of a respective one of the camera channels such that the plurality of signals are indirectly indicative of the relative position of the camera channels.

Although the portion of the range finder 1820 is shown having a differencer 1822 preceding the estimator 1824, the range finder 1820 is not limited to such. For example, a differencer 1822 may be embodied within the estimator 1824 and/or a difference signal may be provided or generated in some other way. In some embodiments, the estimator may be responsive to absolute magnitudes rather than difference signals.

Furthermore, while the disclosed embodiment includes three inputs and one output, the range finder is not limited to such. The range finder 1820 may be employed with any number of inputs and outputs.

Range finding may also be carried out using only one camera channel. For example, one of the camera channels may be provided with a first view of an object and an image may be captured. Thereafter, one or more movements may be applied to one or more portions of the camera channel so as to provide the camera channel with a second view of the object (the second view being different that the first view). Such movements may be provided by the positioning system 280. A second image may be captured with the second view of the object. The first and second images may thereafter be processed by the range finder using the steps set forth above to generate an estimate of a distance to the object (or portion thereof).

3D Imaging

In some embodiments, it is desired to be able to produce images for use in providing one or more 3D effects, sometimes referred to herein as "3D imaging". One type of 3D imaging is referred to as stereovision. Stereovision is based, at least in part, on the ability to provide two views of an object, e.g., one to be provided to the right eye, one to be provided the left eye. In some embodiment, the views are combined into a single stereo image. In one embodiment, for example, the view for the right eye may be blue and the view for the left eye may be red, in which case, a person wearing appropriate eyewear (e.g., blue eyepiece in front of left eye, red eyepiece in front of right eye) will see the appropriate view in the appropriate eye (i.e., right view in the right eye and the left view in the left eye). In another embodiment, the view for the right eye may be polarized in a first direction(s) and the view for the left eye may be polarized in a second direction(s) different than the first, in which case, a person wearing appropriate eyewear (e.g., eyepiece polarized in first direction(s) in front of left eye, eyepiece polarized in second direction(s) in front of left eye) will see the appropriate view in the appropriate eye (i.e., right view in the right eye and the left view in the left eye).

FIGS. 74A-74B show an example of images that may be employed in providing stereovision. More particularly, FIG. 74A is a representation of an image of an object 1840A, as viewed by a first camera channel 260A, striking a portion of the sensor 264A, for example, the portion of the sensor 264A illustrated in FIGS. 6A-6B, 7A-7B, of the first camera channel 260A. The sensor 264A has a plurality of sensor elements, e.g., sensor elements $\mathbf{380}_{i,j}$-$\mathbf{380}_{i+2,j+2}$, shown schematically as circles.

FIG. 74B is a representation of an image of the object 1840B, as viewed by a second camera channel 260B, striking a portion of the sensor 264B, for example, a portion that is the same or similar to the portion of the sensor 264A illustrated in FIG. 74A, in the second camera channel. The sensor 264B has a plurality of sensor elements, e.g., sensor elements $\mathbf{380}_{i,j}$-$\mathbf{380}_{i+2,j+2}$, shown schematically as circles.

As can be seen, the first and second camera channels have different views of the object. In that regard, the first camera channel has a "left view" of the object. The second camera channel has a "right view" of the object.

FIG. 75 is a representation of the image viewed by the first camera channel 264A superimposed with the image viewed by the second camera channel 264B, in conjunction with one example of eyewear 1850 to facilitate a stereo view of the image of the object. In that regard, the eyewear 1850 has a left eyepiece 1852 and a right eyepiece 1854. The left eyepiece 1852 transmits the image from the first camera channel 260A and filters out the image from the second camera channel 260B. The right eyepiece filters out the image from the first camera channel 260A and transmits the image from the second camera channel 260B. As a result, a wearer of the eyewear receives a left eye view is the left eye and a right eye view in the right eye.

Referring to FIG. 76, another type of 3D imaging is referred to as 3D graphics, which is based, at least in part, on the ability to provide an image, e.g., image 1860, with an appearance of depth.

It is desirable to employ parallax when producing images for use in providing 3D effects. To that effect, increasing the amount of parallax may improve one or more characteristics of 3D imaging. Thus, it is advantageous to have the ability to provide movement of one or more portions of an optic portion and/or movement of one or more portions of a sensor portion to increase the amount of parallax. The positioning system 280 may be employed in providing such movement. The movement may be movement in the x direction, y direction, z direction, tilting, rotation and/or any combination thereof.

FIGS. 77A-77B show a flowchart of steps that may be employed in providing 3D imaging, according to one embodiment of the present invention. At a step 1872, the system receives a signal indicative of a desired amount of parallax and/or one or movements. At a step 1874, the system identifies one or more movements to provide or help provide the desired amount of parallax. At a step 1876, the system initiates one, some or all of the one or more movements identified at step 1874.

At a step 1878, an image is captured from each camera channel to be used in the 3D imaging. For example, if two camera channels are to be used in the 3D imaging, then an image is captured from the first camera channel and an image is captured from the second camera channel.

At a step 1880, the system determines whether stereovision is desired or whether 3D graphics is desired. If stereovision is desired, then at a step 1882, the image captured from the first camera channel and the image captured from the second camera channel are each supplied to a formatter, which generates two images, one suitable to be provided to one eye and one suitable to be provided to the other eye. For example, in one embodiment, for example, the view for the right eye may be blue and the view for the left eye may be red, in which case, a person wearing appropriate eyewear will see the appropriate view in the appropriate eye (i.e., right view in the right eye and the left view in the left eye). In another embodiment, the view for the right eye may be polarized in a first direction(s) and the view for the left eye may be polarized in a second direction(s) different than the first, in which case, a person wearing appropriate eyewear will see the appropriate view in the appropriate eye (i.e., right view in the right eye and the left view in the left eye). The two images may be combined into a single stereo image.

If 3D graphics is desired instead of stereovision, then at a step 1884, the system characterizes the images using one or more characterization criteria. In one embodiment, for example, the characterization criteria include identifying one or more features (e.g., edges) in the images and an estimate of the distance to one or more portions of such features. A range finder as set forth above may be used to generate estimates of distances to features or portions thereof. At a step 1886, the system generates a 3D graphical image having the appearance of depth, at least in part, based, at least in part, on (1) the characterization data and (2) 3D rendering criteria.

The characterization criteria and the 3D graphical criteria may be predetermined, adaptively determined, and or combinations thereof.

It should be understood that 3D imaging may also be carried out using only one camera channel. For example, one of the camera channels may be provided with a first view of an object and an image may be captured. Thereafter, one or more movements may be applied to one or more portions of the camera channel so as to provide the camera channel with a second view of the object (the second view being different that the first view). Such movements may be provided by the positioning system. A second image may be captured with the second view of the object. The first and second images may thereafter be processed by the 3D imager using the steps set forth above to generate an estimate of a distance to the object (or portion thereof).

Steps 1888 determines whether additional 3D imaging is desired, and if so, execution returns to step 1878.

As stated above, in some embodiments, the processor may not receive a signal indicative of the desired positioning. For example, in some embodiments, the processor may make the determination as to the desired positioning. This determination may be made, for example, based on one or more current or desired operating modes of the digital camera apparatus, one or more images captured by the processor, for example, in combination with one or more operating strategies and/or information employed by the processor. An operating strategy and/or information may be of any type and/or form.

Moreover, in some embodiments, the processor may not need to identify movements to provide the desired positioning. For example, in some embodiments, the processor may receive signals indicative of the movements to be employed.

FIG. 78 is a block diagram representation of one embodiment of a 3D effect generator 1890 for generating one or more images for stereovision. In this embodiment, the 3D effect generator 1890 receives one or more input signals indicative of different views of one or more objects. For example, the 3D effect generator 1890 may receive a first signal indicative of a first image from a first channel and a second signal indicative of a second image from a second channel. The 3D effect generator 1890 generates one or more one output signals based at least in part on one or more of the input signals. The one or more output signals may provide and/or may be used to provide a 3D effect. In this embodiment, for example, the 3D effect generator provides a first output signal indicative of a first image having a right view and a second image having a left view. In some embodiments, each output signal is adapted for use in association with a specific viewing apparatus. In one embodiment, for example, the view for the right eye may be blue and the view for the left eye may be red, in which case, a person wearing appropriate eyewear (e.g., blue eyepiece in front of left eye, red eyepiece in front of right eye) will see the appropriate view in the appropriate eye (i.e., right view in the right eye and the left view in the left eye). In another embodiment, the view for the right eye may be polarized in a first direction(s) and the view for the left eye may be polarized in a second direction(s) different than the first, in which case, a person wearing appropriate eyewear (e.g., eyepiece polarized in first direction(s) in front of left eye, eyepiece polarized in second direction(s) in front of left eye) will see the appropriate view in the appropriate eye (i.e., right view in the right eye and the left view in the left eye). In some embodiment, the views are combined into a single stereo image.

FIG. 79 is a block diagram representation of one embodiment of a 3D effect generator 1900 for generating an image with 3D graphics. In this embodiment, the 3D effect generator 1900 includes a differencer 1902, an estimator 1904 and a 3D graphics generator 1906. The differencer 1902 receives one or more input signals, e.g., Position of objects in first image and Position of objects in second image, indicative of the position of one or more features of one more objects in a first image and the position of the one or more features of one or more objects in a second image. The differencer 1902 generates a difference signal, Differences, indicative of the difference between the position of the one or more features of the one or more object in the first image and the position of the one or more features of the one or more objects in the second image. The difference signal, Differences, is supplied to the estimator 1904, which also receives a signal, e.g., Relative Positioning, indicative of the relative positioning between the camera channel that provided the first image and the camera channel that provided the second image. In response, the estimator 1904 provides an output signal, Estimate, indicate of an estimate of the distance to the one or more features of the one or more objects (or portion thereof).

In some embodiments, the estimator 1904 is the same as or similar to the estimator 1820 (FIG. 73) described above. In order to generate the estimate, the estimator 1904 includes data indicative of the relationship between (a) the difference between the position of the object in the first image and the position of the object in the second image, (b) the relative positioning of the camera channel generating the first image and the camera channel generating the second image and (c) the distance to an object. As described above, this data may be in any form.

The estimate, Estimates, is supplied to the 3D graphics generator 1906, which also receives a signal, e.g., Objects, indicative of the objects in the image. In response, the 3D graphics generator 1906 provides an output signal, e.g., 3D graphics image, indicate of an image with 3D graphics.

Image Discrimination

In some embodiments, it is desirable to have the ability to identify an object (or portions thereof) in an image, sometimes referred to as image discrimination. For example, the ability to identify an object in images may be employed in range finding and/or in generating images with 3D graphics. In some embodiments, the ability to identify an object in an image may be enhanced by moving one or more portions of one or more camera channels. For example, increasing the parallax between camera channels may make it easier to identify an object in images captured from the camera channels. The positioning system 280 of the digital camera apparatus 210 may be used to introduce such movement.

FIG. 80 shows a flowchart 1910 of steps that may be employed in association with providing image discrimination, according to one embodiment of the present invention.

At a step 1912, a signal indicative of the desired positioning, e.g., the desired parallax, is received. At a step 1914, the system identifies one or more movements to provide or help provide the desired positioning. At a step 1916, the system initiates one, some or all of the one or more movements identified at step 1914. As stated above, movement may be provided, for example, using any of the structure(s) and/or method(s) disclosed herein. The movement may be relative movement in the x direction and/or y direction, relative movement in the z direction, tilting, rotation and/or combinations thereof. In some embodiments, the movement is initiated by supplying one or more control signals to one or more actuators of the positioning system 280.

At a step 1918, an image is captured from each camera channel to be used in image discrimination.

At a step 1920, one or more objects or portions thereof are identified in the captured images. One or more of the methods disclosed herein, and or any other methods may be employed.

In some embodiments, the processor may not receive a signal indicative of the desired positioning. For example, in some embodiments, the processor may make the determination as to the desired positioning. This determination may be made, for example, based on one or more current or desired operating modes of the digital camera apparatus, one or more images captured by the processor, for example, in combination with one or more operating strategies and/or information employed by the processor. An operating strategy and/or information may be of any type and/or form.

Moreover, in some embodiments, the processor may not need to identify movements to provide the desired positioning. For example, in some embodiments, the processor may receive signals indicative of the movements to be employed.

In some embodiments, one or more of the above described methods and/or apparatus for image discrimination are employed in conjunction with range finding, for example, to help enhance the image discrimination and/or to help provide a more accurate estimate of a distance to an object.

For example, FIGS. 81A-81B shows a flowchart 1930 of steps that may be employed in providing image discrimination, according to another embodiment of the present invention. In this embodiment, at a step 1932, a signal indicative of the desired positioning, e.g., the desired parallax, is received. At a step 1914, the system identifies one or more movements to provide or help provide the desired positioning. At a step 1916, the system initiates one, some or all of the one or more movements identified at step 1914. As stated above, movement may be provided, for example, using any of the structure(s) and/or method(s) disclosed herein. The movement may be relative movement in the x direction and/or y direction, relative movement in the z direction, tilting, rotation and/or combinations thereof. In some embodiments, the movement is initiated by supplying one or more control signals to one or more actuators of the positioning system 280.

At a step 1932, an image is captured from each camera channel to be used in image discrimination and/or range finding.

At a step 1934, one or more objects or portions thereof are identified in the captured images. One or more of the methods disclosed herein, and or any other methods may be employed.

At a step 1936, the system generates an estimate of a distance to one or more of the object (or portions thereof). One or more of the methods disclosed herein, and or any other methods may be employed.

At a step 1938, the system identifies one or more movements to enhance the image discrimination and/or to help provide a more accurate estimate of a distance to an object, based on, for example, (1) one or more characteristics of the objects or portions of the objects identified in step 1932 and/or (2) the estimate of the distance to one or more of the objects or portions of the objected generated in step 1936. The system initiates one, some or all of the one or more movements identified at step 1938. As stated above, movement may be provided, for example, using any of the structure(s) and/or method(s) disclosed herein. The movement may be relative movement in the x direction and/or y direction, relative movement in the z direction, tilting, rotation and/or combinations thereof. In some embodiments, the movement is initiated by supplying one or more control signals to one or more actuators of the positioning system 280.

At a step 1940, an image is captured from each camera channel to be used in image discrimination and/or range finding.

At a step 1942, one or more objects or portions thereof are identified in the captured images. One or more of the methods disclosed herein, and or any other methods may be employed.

At a step 1944, the system generates an estimate of a distance to one or more of the object (or portions thereof). One or more of the methods disclosed herein, and or any other methods may be employed.

At a step 1946, a determination is made as to whether the desired information has been obtained and if so, execution ends at a step 1948. If the desired information has not been obtained, e.g., enhanced image discrimination and/or range finding is desired, execution returns to step 1938.

In some embodiments, the steps 1938-1946 are repeated until the desired information is obtained or until a designated number of repetitions (e.g., two or more) do not result in significant improvement.

Auto Focus

In some embodiments, the positioning system 280 is employed in an auto focus operation.

FIG. 82 shows a flowchart of steps that may be employed in providing auto focus, according to one embodiment of the present invention.

In this embodiment, an image is captured at a step 1952.

At a step 1954, one or more characteristics, e.g., features, objects and/or portions thereof, are identified in the image. One or more of the methods disclosed herein, and or any other methods may be employed. In some embodiments, a measure of focus is generated for one or more of the characteristics.

At a step 1956, the system identifies one or movements to potentially enhance the focus of the image. In some embodiments, this determination is based at least in part on a measure of focus of one or more features and/objects identified in the image. The system initiates one, some or all of the one or more movements. As stated above, movement may be provided, for example, using any of the structure(s) and/or method(s) disclosed herein. The movement may be relative movement in the x direction and/or y direction, relative movement in the z direction, tilting, rotation and/or combinations thereof. In some embodiments, the movement is initiated by supplying one or more control signals to one or more actuators of the positioning system 280.

At step 1958, another image is captured.

At a step 1960, one or more characteristics, e.g., features, objects and/or portions thereof, are identified in the image. One or more of the methods disclosed herein, and or any other methods may be employed. In some embodiments, a measure of focus is generated for one or more of the characteristics.

At a step 1962, the system determines whether the movement initiated at step 1956 improved the focus of the image. If so execution may return to step 1956.

In some embodiments, steps 1956-1962 may be repeated until the captured images are in focus, e.g., have a measure of focus that it as least a certain degree or until a predetermined number of repetitions (e.g., two or more) do not result in significant improvement.

If a previous movement or movements decreased the measure of focus, it may be desirable to employ one or movements expected to have the opposite effect (i.e., in the opposite direction) on the measure of focus.

Position Sensors

In some embodiments, it is advantageous to incorporate position sensors within the positioning system, for example, to help the positioning system provide the desired movements with a desired degree of accuracy.

Some of the possible advantages of the positioning system are: 1) higher resolution image without increasing the number of pixels; 2), eliminate (or reduce) a need for a more complex and costly zoom lens assembly; 3) no requirement to move in the outward direction, thus increasing the thickness of the image capturing device; 4) maintains the same light sensitivity (F-stop) whereas a traditional zoom lens reduces sensitivity (increases F-stop) when in the zoom mode.

Notably, although various features, attributes and advantages of various embodiments have been described above, it should be understood that such features, attributes and advantages are not required in every embodiment of the present invention and thus need not be present in every embodiment of the present invention.

It should also be understood that there are many different types of digital cameras. The present inventions are not limited to use in association with any particular type of digital camera.

For example, as stated above, a digital camera apparatus may have one or more camera channels. Thus, although the digital camera apparatus 210 is shown having four camera channels, it should be understood that digital camera apparatus are not limited to such. Rather, a digital camera apparatus may have any number of camera channels, for example, but not limited to one camera channel, two camera channels, three camera channels, four camera, or more than four camera channels.

FIG. 83A is a cross sectional view (taken, for example, in a direction such as direction A-A shown on FIGS. 15A, 17A) of another embodiment of the digital camera apparatus 210 and a circuit board 236 of the digital camera on which the digital camera apparatus 210 may be mounted. In this embodiment, the digital camera apparatus 210 includes a stack-up having a first integrated circuit die 2010 that defines one or more sensor portions, e.g., 264A-264D) disposed superjacent the circuit board 236, a spacer 2012 disposed superjacent the integrated circuit die 2010, and a positioner 310 disposed superjacent the spacer 2012. A plurality of optics portions 262A-262D are seated in and/or affixed to the positioner 310. A second integrated circuit 2014 (FIG. 83D) is mounted on a surface of the positioner 310 that faces toward the spacer 2012. In this embodiment, the second integrated circuit 2014 (FIG. 83D) comprises the drivers, e.g., drivers 602 (FIG. 35A, 35C-35D), of the controller 300 for the positioning system 280. The first integrated circuit die 2010 has a major outer surface 2016 (FIG. 83E) that faces toward the spacer 2012. As further described herein, the first integrated circuit die 2010 includes the one or more sensor portions, e.g., sensor portions 264A-264D, of the digital camera apparatus 210 and may further include one, some or all portions of the processor 265 of the digital camera apparatus 210.

FIG. 83E is a plan view of the upper side (i.e., the major outer surface 2016 facing the spacer) of one embodiment of the first integrated circuit die 2010. FIG. 83F shows a cross section view of the first integrated circuit die 2010.

In this embodiment, the first integrated circuit die 2010 includes a plurality of portions. A first portion comprises sensor portion 264A. A second portion comprises sensor portion 264B. A third portion comprises sensor portion 264C. A fourth portion comprises sensor portion 264D. One or more other portions, e.g., 2023A-2023E, of the first integrated circuit die 2010 comprises one or more portions of the processor 265. The first integrated circuit die 2010 further includes a plurality of electrically conductive pads (e.g., pads 2020, 2022 (FIG. 83F) disposed in one or more pad regions, e.g., 2024A-2025D (e.g., for example on the perimeter, or vicinity of the perimeter, on one, two, three or four sides of the first integrated circuit die 2010). Some of the pads (e.g., example pad 2020 (FIG. 83F) are used in supplying one or more output signals from the image processor 270 to the circuit board 236 of the digital camera 200. Some of the other pads (e.g., pad 2022 (FIG. 83F) are used to provide control signals to the second integrated circuit 2014 (FIG. 83D), which as stated above is mounted on the underside of the positioner 310 and comprises the drivers, e.g., drivers 602 (FIG. 35A, 35C-35D), of the controller 300. The first integrated circuit die 2010 may further include electrical conductors (not shown) to connect one or more of the sensor portions, e.g., sensor portions 264A-264D, to one or more portions of the processor 265 and/or to connect one or more portions of the processor 265 to one or more pads (e.g., pads 2020, 2022). The one or more electrical conductors may comprise, for example, copper, copper foil, and/or any other suitably conductive material(s).

The spacer 2012 and/or positioner 310, in one embodiment, collectively define one or more passages, see for example, passages 2026A-2026B, for transmission of light. Each of the passages is associated with a respective one of the camera channels and provides for transmission of light between the optics portion and the sensor portion of such camera channel while limiting, minimizing and/or eliminating light "cross talk" from the other camera channels. For example, passage 2026A provides for transmission of light between the optics portion 262A and the sensor portion 264A of first camera channel 260A. Passage 2026B provides for transmission of light between the optics portion 262B and the sensor portion 264B of second camera channel 260B. A third passage (not shown), which may be the same or similar to the first and second passages 2026A, 2026B, provides for passage of light between the optics portion 262C and the sensor portion 264C of the third camera channel 260C. A fourth passage (not shown), which may be the same or similar to the first and second passages 2026A, 2026B, may provide for passage of light between the optics portion 262D and the sensor portion 264D of the fourth camera channel 260D.

FIG. 83C shows a plan view of the underside of the positioner 310 (i.e., the major surface 2016 facing toward the spacer 2012) and the second integrated circuit die 2014 mounted thereon. As stated above, the second integrated circuit 2014 comprises the drivers, e.g., drivers 602 (FIG. 35A, 35C-35D), of the controller 300, which are used to drive the actuators portions, e.g., actuators 430A-430D, 434A-434D, 438A-438D, 442A-442D, of the positioner 310. In the illustrated embodiment, each of the actuators, e.g., actuators 430A-430D, 434A-434D, 438A-438D, 442A-442D, includes two contacts to receive a respective control signal, e.g., a respective differential control signal, from one or more drivers of the controller 300. For example, actuator 430A includes contacts 2028, 2030 to receive a differential signal, e.g., control camera channel 260A actuator A from driver 610A (FIGS. 35C-35D) of driver bank 604A (FIGS. 35A, 35C-35D).

Actuator 430B includes contacts 2032, 2034 to receive a differential control signal, e.g., control camera channel 260A actuator B (FIGS. 35C-35D) from driver 610A (FIGS. 35C-35D) of driver bank 604A (FIGS. 35A, 35C-35D). Actuator 430C includes contacts 2036, 2038 to receive a differential control signal, e.g., control camera channel 260A actuator C (FIGS. 35C-35D) from driver 610A (FIGS. 35C-35D) of driver bank 604A (FIGS. 35A, 35C-35D). Actuator 430D includes contacts 2040, 2042 to receive a differential control signal, e.g., control camera channel 260A actuator D (FIGS. 35C-35D) from driver 610A (FIGS. 35C-35D) of driver bank 604A (FIGS. 35A, 35C-35D).

Similarly, actuators 434A-434D each include two contacts to receive a respective control signal, e.g., a respective control signal from driver bank 604B (FIG. 35A). Actuators 438A-438D each include two contacts to receive a respective control signal, e.g., a respective control signal from driver bank 604C (FIG. 35A). Actuators 442A-4442D each include two contacts to receive a respective control signal control, e.g., a respective control signal from driver bank 604D (FIG. 35A). For example, actuator 442B includes contacts 2042, 2044 to receive a differential control signal to control actuator 442B. Actuator 442D includes contacts 2046, 2048 to receive a differential signal to control actuator 442D.

A plurality of electrically conductive traces (some of which are shown, e.g., electrically conductive traces 2050) connect the outputs of the drivers, e.g., drivers 602 (FIG. 35A, 35C-35D), to the respective actuator portions of the positioner 310. For example, one of the electrically conductive traces 2052 connects a first output from a driver, e.g., driver 610D (FIGS. 35C-35D), in the second integrated circuit 2014 to the first contact 2040 of actuator 442B. Electrically conductive trace 2054 connects a second output from a driver, e.g., driver 610D (FIGS. 35C-35D), in the second integrated circuit 2014 to the second contact 2042 of actuator 442B. An electrically conductive trace 2056 connects a first output from a driver, e.g., a driver of driver bank 604D (FIGS. 35C-35D), in the second integrated circuit 2014 to the first contact 2042 of actuator 442B. An electrically conductive trace 2056 connects a second output from the driver, e.g., a driver of driver bank 604D (FIGS. 35C-35D), in the second integrated circuit 2014 to the second contact 2044 of actuator 442B. Although shown on the surface, it should be understood that one, some or all of such traces may be disposed within the positioner 310 so as not to reside on the outer surface thereof.

A plurality of electrically conductive pads 2060, see for example a pad 2062, are provided on the second integrated circuit 2014 and/or the positioner 310 for use in electrically connecting the second integrated circuit 2014 to the first integrated circuit die 2010. In that regard, a first plurality of electrical conductors 2064 pass through the spacer 2012 and/or along the outside of the spacer 2012 to electrically connect some of the pads, e.g., pad 2022, on the first integrated circuit 2010 to the pads 2060 on the second integrated circuit die 2014 (which as stated above, includes the drivers).

A second plurality of electrical conductors 2066 connect the pads, e.g., pad 2020, that supply the one or more outputs from the image processor 270 to one or more pads, e.g., a pad 2068, on a major outer surface 2070 of the circuit board 236 for the digital camera 200.

The first integrated circuit die 2010, the spacer 2012, and the positioner 310 are bonded to the circuit board 236, the integrated circuit die 2010 and the spacer 2012, respectively, using any suitable method or methods, for example, but not limited to adhesive. Bonding material (e.g., adhesive) between the first integrated circuit die 2010 and the circuit board 236 is indicated schematically at 2072.

Although shown as two separate parts, it should be understood that the positioner 310 and the spacer 2012 could be a single integral component (i.e., a positioner with a spacer portion), for example, the positioner and spacer could be fabricated as a single integral part or fabricated separately and thereafter joined together.

In some embodiments, the electrical interconnect between component layers may be formed by lithography and metallization, bump bonding or other methods. Organic or inorganic bonding methods can be used to join the component layers. The layered assembly process may start with a "host" wafer with electronics used for the entire camera and/or each camera channel. Then another wafer or individual chips are aligned and bonded to the host wafer. The transferred wafers or chips can have bumps to make electrical interconnect or connects can be made after bonding and thinning. The support substrate from the second wafer or individual chips is removed, leaving only a few microns material thickness attached to the host wafer containing the transferred electronics. Electrical interconnects are then made (if needed) between the host and the bonded wafer or die using standard integrated circuit processes. The process can be repeated multiple times.

A spacer 2012 may be any type of spacer. Various embodiments of spacers and digital camera apparatus employing such spacers are disclosed in the Apparatus for Multiple Camera Devices and Method of Operating Same patent application publication. As stated above, the structures and/or methods described and/or illustrated in the Apparatus for Multiple Camera Devices and Method of Operating Same patent application publication may be employed in conjunction with one or more of aspects and/or embodiments of the present inventions.

Thus, for example, one or more embodiments of a spacer disclosed in the Apparatus for Multiple Camera Devices and Methods of Operating Same patent application publication may be employed in a digital camera apparatus having one or more actuators, e.g., e.g., actuator 430A-430D, 434A-434D, 438A-438D, 442A-442D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), for example, to move one or more portions of one or more optics portion and/or to move one or more portions of one or more sensor portions. In addition, for example, one or more actuators, e.g., e.g., actuator 430A-430D, 434A-434D, 438A-438D, 442A-442D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), may be employed in one or more embodiments of the digital camera apparatus 300 disclosed in the Apparatus for Multiple Camera Devices and Method of Operating Same patent application publication, for example, to move one or more portions of one or more optics portion and/or to move one or more portions of one or more sensor portions.

For the sake of brevity, the structures and/or methods described and/or illustrated in the Apparatus for Multiple Camera Devices and Method of Operating Same patent application publication will not be repeated. It is expressly noted, however, that the entire contents of the Apparatus for Multiple Camera Devices and Method of Operating Same patent application publication, including, for example, the features, attributes, alternatives, materials, techniques and advantages of all of the inventions, are incorporated by reference herein, although, unless stated otherwise, the aspects and/or embodiments of the present invention are not limited to such features, attributes alternatives, materials, techniques and advantages.

FIG. 83B is a cross sectional view (taken, for example, in a direction such as direction A-A shown on FIGS. 15A, 17A) of another embodiment of the digital camera apparatus 210 and a circuit board 236 of the digital camera 200 on which the digital camera apparatus 210 may be mounted. In this embodiment, the stack up further includes an additional device 2080 disposed between the circuit board 236 and the first integrated circuit die 2010. The additional device 2080 may comprise one or more integrated circuits including for example, one or more portions of the post processor 744 (FIG. 36A) and/or additional memory for the digital camera apparatus 310. One or more electrical connectors, e.g., connector 2082, may be provided to electrically connect the additional device 2080 to the first integrated circuit 2010, the second integrated circuit 2014 and/or the positioner 310.

FIGS. 84A-84C, 85A-85C, 87A-87B, 89, 92D, 93, 94, 95A-95B, 96, 107A-107B, 108A-108B and 109A-109B are representations of some other optics configurations that may be employed in one or more of the camera channels. It should be understood that any of the features and/or methods shown and/or employed in any of these configurations may also be used in any of the other configurations and/or in any other embodiments or aspects disclosed herein.

FIGS. 86A-86B, 87A-87B, 88, 101A-101F and 102A-102D are representations of some other configurations of the camera channels that may be employed in the digital camera apparatus. It should be understood that any of the features and/or methods shown and/or employed in any of these configurations may also be used in any of the other configurations and/or in any other embodiments or aspects disclosed herein.

FIGS. 86A-86B, 87A-87B, 88, 99, 100, 103A-103D and 104A-104D are representations of some other sensor configurations that may be employed in one or more of the camera channels. It should be understood that any of the features and/or methods shown and/or employed in any of these configurations may also be used in any of the other configurations and/or in any other embodiments or aspects disclosed herein. It should also be understood that the camera channels may be employed in any desired number, for example, one, two or more. Further examples include 4 array/lenses: red, blue, green, emerald (for color enhancement), 4 array/lenses: red, blue, green, infrared (for low light conditions) and 8 array/lenses: double the above configurations for additional pixel count and image quality.

FIGS. 85A-85E, 86A-86B, 87A-87B, 88, 91, 99, 100, 103A-103D and 104A-104D, 105A-105D and 106 are representations of some other configurations that may be employed in association with the processor. It should be understood that any of the features and/or methods shown and/or employed in any of these configurations may also be used in any of the other configurations and/or in any other embodiments or aspects disclosed herein.

For example, FIG. 84A is a cross sectional view of another embodiment of an optics portion, e.g., optics portion 262A, mounted in another embodiment of the positioner 310. In this embodiment, the optics portion includes a lens stack having three lenslets 2100, 2102, 2104. The positioner 310 has three seats 2106, 2108, 2110. Each seat supports and/or helps position a respective one of the lenslets, at least in part. A first seat 2106 defines a mounting position for a first one of the lenslets 2100 in the stack (i.e., an outer/lowermost lenslet). A second seat 2108 defines a mounting position for a second one of the lenslets 2102 (i.e., a center lenslet in the stack). A third seat 2110 supports a third lenslet 2104 (i.e., outer/uppermost lenslet) in the stack and defines a mounting position or such lenslet.

The upper lenslet 2104 may be inserted, for example, through an upper portion of an aperture, e.g., aperture 416, defined by the positioner 310. The middle lenslet 2102 and the lower lenslet 2100 may be inserted, for example, through a lower portion of an aperture, e.g., aperture 416 defined by the positioner 310, one at a time, or alternatively, the middle lenslet and the bottom lenslet may be built into one assembly, and inserted together. In some embodiments, one or more of the lenslets 2100, 2102, 2104 are attached to the positioner 310, e.g., using adhesive (e.g., glue), an electronic or another type of bond between the positioner 310 and one or more lenslets and/or a press fit between the positioner and one or more lenslets (e.g., one or more lenslets may be press fit into the positioner 310

FIG. 84B is a cross sectional view of another embodiment of an optics portion, e.g., optics portion 262A, mounted in another embodiment of the positioner 310. In this embodiment, the optics portion includes a lens stack having three lenslets 2120, 2122, 2124. The positioner 310 has three seats 2126, 2128, 2130. Each seat supports a respective one of the lenslets in the stack, at least in part.

The middle lenslet 2122 and the upper lenslet 2124 may be inserted, for example, through an upper portion of an aperture, e.g., aperture 416 of the positioner 310, one at a time, or alternatively, the middle lenslet 2122 and the upper lenslet 2124 may be built into one assembly, and inserted together. The lower lenslet 2120 is inserted through a lower portion of the aperture 416. In some embodiments, one or more of the lenslets are attached to the positioner 310, e.g., using adhesive (e.g., glue), an electronic or another type of bond between the positioner 310 and one or more lenslets and/or a press fit between the positioner and one or more lenslets (e.g., one or more lenslets may be press fit into the positioner 310

FIG. 84C is a cross sectional view of another embodiment of an optics portion, e.g., optics portion 262A, mounted in another embodiment of the positioner 310. In this embodiment, the optics portion includes a lens stack having three lenslets 2140, 2142, and 2144. The positioner has one seat 2146 that supports and defines a mounting position for an outer/lowermost lenslet 2140 in the stack, which in turn supports and defines mounting positions for the other lenslets (i.e., the center lenslet and the outer/uppermost lenslet) in the stack.

In some embodiments, the lens stack is a single assembly, e.g., one lens with three lenslets. In some embodiments, the upper lenslet 2144, middle lenslet 2142 and lower lenslet 2140 are each inserted through an upper portion of an aperture, e.g., aperture 416, or through a bottom portion of the aperture, one at a time, as an assembly, or a combination thereof. In some embodiments, one or more of the lenslets are attached to the positioner 310, e.g., using adhesive (e.g., glue), an electronic or another type of bond between the positioner 310 and one or more lenslets and/or a press fit between the positioner and one or more lenslets (e.g., one or more lenslets may be press fit into the positioner 310

FIG. 85A is a digital camera apparatus 210 employing the optics portion and positioner of FIG. 84A. The digital camera apparatus is otherwise the same as the digital camera apparatus 210 of FIG. 83A. FIG. 85B is a digital camera apparatus 210 employing the optics portion and positioner of FIG. 84B. The digital camera apparatus is otherwise the same as the digital camera apparatus 210 of FIG. 83A.

FIG. 85C is a digital camera apparatus 210 employing the optics portion and positioner of FIG. 84C. The digital camera apparatus is otherwise the same as the digital camera apparatus 210 of FIG. 83A.

FIGS. 86A-86B are representations of a digital camera apparatus 210 having three camera channels (i.e., red, green, blue). In this embodiment, a first camera channel is dedicated to a first color, e.g., red, and has an optics portion 262A and a sensor portion 264A. A second camera channel is dedicated to a second color, e.g., green, and has an optics portion 262B and a sensor portion 264B. A third camera channel is dedicated to a third color, e.g., blue, has an optics portion 262C and a sensor portion 264C. In some embodiments, the three or more camera channels are arranged in a triangle, as shown to help provide compactness and/or symmetry in optical collection.

In this embodiment, the digital camera apparatus 210 includes an integrated circuit die 2010 defining the sensor portions 264A-264C. The digital camera apparatus 210 further includes a processor 265 having one or more portions, e.g., portions 2100-2110, disposed on the integrated circuit die 2010, e.g., disposed between the sensor arrays 264A-264C. One of such portions, e.g., portion 2100, may comprise one or more analog to digital converters 794 (FIG. 37A) of one or more channel processors, e.g., channel processors 740A-740D (FIG. 36A). The digital camera apparatus 210 further includes an additional device 2080. The additional device 2080 may comprise one or more integrated circuits including for example, one or more portions of the post processor 744 (FIG. 36A) and/or additional memory for the digital camera apparatus 210.

The three optics portions 262A-262C are shown mounted in a positioner 310. In some embodiments, positioner 310 is a stationary positioner that does not provide movement of the three optics portions 262A-262C. In some alternative embodiments, the optics portions may be mounted in a positioner 310 having one or more actuator portions, e.g., actuator 430A-430D, 434A-434D, 438A-438D, 442A-442D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), to provide movement of one or more of the three optics portions 262A-262C.

Some other embodiments, may employ other quantities of camera channels and/or camera channels dedicated to one or more other colors (or bands of colors) or wavelengths (or bands of wavelengths). In some embodiments, one or more of the camera channels may employ an optics portions and/or a sensor portion having a shape and/or size that is different than the shape and/or size of the optics portions 262A-262C and/or sensor portions 264A-264C illustrated in FIGS. 86A-86B.

Other quantities of camera channels and other configurations of camera channels and portions thereof are disclosed in the Apparatus for Multiple Camera Devices and Method of Operating Same patent application publication. As stated above, the structures and/or methods described and/or illustrated in the Apparatus for Multiple Camera Devices and Method of Operating Same patent application publication may be employed in conjunction with one or more of the aspects and/or embodiments of the present inventions.

For example, other quantities of camera channels and other configurations of camera channels and portions thereof are disclosed in the Apparatus for Multiple Camera Devices and Method of Operating Same patent application publication. As stated above, the structures and/or methods described and/or illustrated in the Apparatus for Multiple Camera Devices and Method of Operating Same patent application publication may be employed in conjunction with one or more of the aspects and/or embodiments of the present inventions.

Thus, for example, one or more portions of one or more embodiments of the digital camera apparatus disclosed in the Apparatus for Multiple Camera Devices and Methods of Operating Same patent application publication may be employed in a digital camera apparatus 210 having one or more actuators, e.g., e.g., actuator 430A-430D, 434A-434D, 438A-438D, 442A-442D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), for example, to move one or more portions of one or more optics portion and/or to move one or more portions of one or more sensor portions. In addition, in some embodiments, for example, one or more actuators, e.g., e.g., actuator 430A-430D, 434A-434D, 438A-438D, 442A-442D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), may be employed in one or more embodiments of the digital camera apparatus 300 disclosed in the Apparatus for Multiple Camera Devices and Method of Operating Same patent application publication, for example, to move one or more portions of one or more optics portion and/or to move one or more portions of one or more sensor portions.

For the sake of brevity, the structures and/or methods described and/or illustrated in the Apparatus for Multiple Camera Devices and Method of Operating Same patent application publication will not be repeated. It is expressly noted, however, that the entire contents of the Apparatus for Multiple Camera Devices and Method of Operating Same patent application publication, including, for example, the features, attributes, alternatives, materials, techniques and advantages of all of the inventions, are incorporated by reference herein, although, unless stated otherwise, the aspects and/or embodiments of the present invention are not limited to such features, attributes alternatives, materials, techniques and advantages.

In addition, other layouts of a processor 265 may be employed. For example, other layouts of a processor are disclosed in the Apparatus for Multiple Camera Devices and Method of Operating Same patent application publication. As stated above, the structures and/or methods described and/or illustrated in the Apparatus for Multiple Camera Devices and Method of Operating Same patent application publication may be employed in conjunction with one or more of the aspects and/or embodiments of the present inventions. The entire contents of the Apparatus for Multiple Camera Devices and Method of Operating Same patent application publication, including, for example, the features, attributes, alternatives, materials, techniques and advantages of all of the inventions, are incorporated by reference herein, although, unless stated otherwise, the aspects and/or embodiments of the present invention are not limited to such features, attributes alternatives, materials, techniques and advantages.

Thus, for example, one or more portions of one or more embodiments of the digital camera apparatus disclosed in the Apparatus for Multiple Camera Devices and Methods of Operating Same patent application publication may be employed in a digital camera apparatus 210 having one or more actuators, e.g., e.g., actuator 430A-430D, 434A-434D, 438A-438D, 442A-442D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), for example, to move one or more portions of one or more optics portion and/or to move one or more portions of one or more sensor portions. In addition, in some embodiments, for example, one or more actuators, e.g., e.g., actuator 430A-430D, 434A-434D, 438A-438D, 442A-442D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), may be employed in one or more embodiments of the digital camera apparatus 300 disclosed in the Apparatus for Multiple Camera Devices and Method of Operating Same patent application publication, for example, to move one or more portions of one or more optics portion and/or to move one or more portions of one or more sensor portions.

FIGS. 87A-87C are representations of another digital camera apparatus 210 having three camera channels (i.e., red, green, blue). In this embodiment, a first camera channel is dedicated to a first color, e.g., red, and has an optics portion 262A and a sensor portion 264A. A second camera channel is dedicated to a second color, e.g., green, and has an optics portion 262B and a sensor portion 264B. A third camera channel is dedicated to a third color, e.g., blue, has an optics portion 262C and a sensor portion 264C. Each of the sensor portions 264A-264C includes a plurality of sensor elements, e.g., pixels, represented by circles.

In this embodiment, the digital camera apparatus 210 includes an integrated circuit die 2010 defining the sensor portions 264A-264C. The digital camera apparatus 210 further includes an additional device 2080. The additional device 2080 may comprise one or more integrated circuits including for example, one or more portions of the post processor 744 (FIG. 36A) and/or additional memory for the digital camera apparatus 210.

The three optics portions 262A-262C are shown mounted in a positioner 310. In some embodiments, positioner 310 is a stationary positioner that does not provide movement of the three optics portions 262A-262C. In some alternative embodiments, the optics portions may be mounted in a positioner 310 having one or more actuator portions, e.g., actuator 430A-430D, 434A-434D, 438A-438D, 442A-442D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), to provide movement of one or more of the three optics portions 262A-262C.

Each of the optics portions 262A-262C comprises a stack of three lenslets. In some embodiments, one or more of the stacks has a configuration that is the same as or similar to the stacks employed in one or more of the optics portions 262A illustrated in FIGS. 84A-84C.

In this embodiment, the digital camera apparatus 210 further includes a spacer, e.g., spacer 2012, disposed between the positioner 310 and the integrated circuit die 2010.

The optics portion of each camera channel transmits light of the color to which the respective camera channel is dedicated and filters out light of one some or all other colors. For example, optics portion 262A transmits red light and filters out light of other colors, e.g., blue light and green light. Optics portion 262B transmits green light and filters out light of other colors, e.g., red light and blue light. Optics portion 262C transmits blue light and filters out light of other colors, e.g., red light and green light.

FIG. 88 is a schematic perspective representation of a digital camera apparatus 210, in assembled form, having three camera channels (e.g., red, green, blue), a positioner 310, a spacer 2012, an integrated circuit die 2010 and an additional device 2080.

In some embodiments, a digital camera apparatus 210 provides optical zoom at various multiples, auto focus, high fidelity imaging, small physical size, various outputs, a hermetic self package and/or die on board mounting.

FIG. 89 is a representation of the digital camera apparatus of FIG. 88, in exploded view form. In some embodiments, each of the optics portions 262A-262C comprises a stack of three lenslets, however, stacks with fewer than three lenslets or more than three lenslets may also be employed. A plurality of pads, see for example, pad 2020, may be provided on integrated circuit die 2010 to supply one or more outputs from the processor 265. The additional device 2080, which may comprise a post processor, is affixed to a rear facing, major outer surface of the integrated circuit die 2010. In one embodiment, the digital camera apparatus 210 has a height (e.g., z direction) of 2 millimeters (mm) and a footprint (e.g., x direction and y direction) of 6 mm by 6 mm.

A digital camera apparatus 210 may have any number of camera channel(s). Each camera channel may have any configuration. Moreover, the configuration of one camera channel may or may not be the same as the configuration of one or more other camera channels. For example, in some embodiments, each camera channel has the same size and shape. In some other embodiments, one or more camera channels has a size and/or shape that is different than the size and/or shape of one or more other camera channels. In some embodiments, for example, one or more of the camera channels may employ an optics portions and/or a sensor portion having a shape and/or size that is different than the shape and/or size of the optics portions and/or sensor portion of another camera channel.

In some embodiments, one or more camera channels is tailored to a color or band of colors or wavelength or band of wavelengths. In some embodiments, each camera channel is dedicated to a color or band of colors or wavelength or band of wavelengths. The color or band of colors or wavelength or band of wavelengths of one camera channel may or may not be the same as the color or band of colors or wavelength or band of wavelengths of one or more other camera channels. For example, in some embodiments, each camera channel is dedicated to a different color or band of colors or wavelength or band of wavelengths. In some other embodiments, the color or band of colors or wavelength or band of wavelengths of one camera channel is the same as the color or band of colors or wavelength or band of wavelengths of one or more other camera channels.

Each optics portion may have any number of lenses and/or lenslets of any configuration including but not limited to configurations disclosed herein. The lenses may have any shape, size and/or prescription. Lenses may comprise any suitable material or materials, for example, but not limited to, glass and plastic. Lenses can be rigid or flexible. If color filtering is employed, any suitable configuration for color filtering may be employed. In some embodiments, lenses are doped such as to impart a color filtering, polarization, or other property. In some embodiments one or more of the optics portions employs a lens having three lenslets. However, some other embodiments may employ less than three lenslets and/or more than three lenslets.

Each sensor may have any number of sensor elements, e.g., pixels. The sensor elements may have any configuration. In that regard, the number and/or configuration of the sensor elements in the sensor of one camera channel may or may not be the same as the number and/or configuration of the sensor elements in the sensor of another camera channel. For example, in some embodiments, each sensor has the same number and configuration of sensor elements. In some other embodiments, one or more sensors has a different number of sensor elements and/or sensor elements with a different configuration than one or more other sensor. Each sensor may or may not be optimized for a wavelength or range of wavelengths. In some embodiments, none of the sensors are optimized for a wavelength or range of wavelengths. In some other embodiments, at least one sensor is optimized for a wavelength or range of wavelengths. In some such embodiments, each sensor is optimized for a different wavelength or range of wavelengths than each of the other sensors.

A positioner 310 may be employed to position one or more of the optics portions (or portions thereof) relative to one or more sensor portions (or portions thereof). In some embodiments, the positioner 310 is a stationary positioner. In some other embodiments, the positioner moves one or more of the optics portions or portions thereof in an x direction, a y direction and/or a z direction. The positioner 310 may comprise any suitable material. In some embodiments the positioner comprises glass, silicon and/or a combination thereof. In some embodiments, the positioner does not comprise glass or silicon but rather comprises a material that is compatible with glass and/or silicon material in one or more respects (e.g., thermal coefficient of expansion).

The one or more optics portions (or portions thereof) may be retained to the positioner 310 in any suitable manner. The stack of lenses may be secured in the mounting hole in any suitable manner, for example, but not limited to, mechanically (e.g., press fit, physical stops), chemically (e.g., adhesive), electronically (e.g., electronic bonding) and/or any combination thereof. Thus, in some embodiments one or more lenses are press fit into the positioner 310. In some embodiments, one or more lenses are bonded to the positioner 310. In the latter embodiments, any suitable bonding method may be employed. In some embodiments, the lenses and the positioner are fabricated as a single integral part. In some such embodiments, the lenses and the positioner are manufactured together as one mold. In some embodiments the lenses are manufactured with tabs that are used to create the positioner.

The digital camera apparatus may or may not include a spacer. In some embodiments, for example, the focal length of one or more optics portions is greater than the thickness of the positioner 310 and a spacer is thus employed between the positioner 310 and the sensor portions so as to provide the ability to position such one or more optics portions at one or more desired distances (e.g., z dimension) from the associated sensor portions. In some other embodiments, the focal length of each optical portions is less than the thickness of the positioner 310 and a spacer is not employed. In some embodiments, the positioner and spacer are separate parts. In some other embodiments, the positioner and spacer are integrated, for example, fabricated as a single integral part or fabricated separately and thereafter joined together. In some embodiments, the lenses, the positioner and the spacer are fabricated as a single integral part. In some such embodiments, the lenses, the positioner and the spacer are manufactured together as one mold. In some embodiments the lenses are manufactured with tabs that are used to create the positioner and/or spacer.

Other types and/or embodiments of additional devices are disclosed in the Apparatus for Multiple Camera Devices and Method of Operating Same patent application publication. As stated above, the structures and/or methods described and/or illustrated in the Apparatus for Multiple Camera Devices and Method of Operating Same patent application publication may be employed in conjunction with one or more of the aspects and/or embodiments of the present inventions.

Thus, for example, one or more portions of one or more embodiments of the digital camera apparatus disclosed in the Apparatus for Multiple Camera Devices and Methods of Operating Same patent application publication may be employed in a digital camera apparatus 210 having one or more actuators, e.g., e.g., actuator 430A-430D, 434A-434D, 438A-438D, 442A-442D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), for example, to move one or more portions of one or more optics portion and/or to move one or more portions of one or more sensor portions. In addition, in some embodiments, for example, one or more actuators, e.g., e.g., actuator 430A-430D, 434A-434D, 438A-438D, 442A-442D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), may be employed in one or more embodiments of the digital camera apparatus 300 disclosed in the Apparatus for Multiple Camera Devices and Method of Operating Same patent application publication, for example, to move one or more portions of one or more optics portion and/or to move one or more portions of one or more sensor portions.

For the sake of brevity, the structures and/or methods described and/or illustrated in the Apparatus for Multiple Camera Devices and Method of Operating Same patent application publication will not be repeated. It is expressly noted, however, that the entire contents of the Apparatus for Multiple Camera Devices and Method of Operating Same patent application publication, including, for example, the features, attributes, alternatives, materials, techniques and advantages of all of the inventions, are incorporated by reference herein, although, unless stated otherwise, the aspects and/or embodiments of the present invention are not limited to such features, attributes alternatives, materials, techniques and advantages.

In some embodiments, the processor 265 is disposed entirely on the integrated circuit die 2010. In some other embodiments, one or more portions of the processor 265 are not disposed on the integrated circuit die 2010 and/or do not fit on the integrated circuit die 2010 and are instead disposed on an additional device, e.g., additional device 2080.

The digital camera apparatus may be assembled and mounted in any manner.

FIGS. 90A-90H depict one method for assembling and mounting a digital camera apparatus 210. In this embodiment, the digital camera apparatus 210 includes four camera channels, e.g., camera channels 260A-260D (FIG. 4) that include optics portions, e.g., optics portion 262A-262D, respectively. In some embodiments, each optics portion 262A-262D includes a lens having a two or more lenslets e.g., three lenslets. The digital camera apparatus further includes a positioner 310, a spacer 2012, an integrated circuit die 2010 and an additional device, e.g., additional device 2080. As stated above, in some embodiments, the positioner 310 includes a plurality of actuators, e.g., actuator 430A-430D, 434A-434D, 438A-438D, 442A-442D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), to move one or more portions of one or more optics portion, e.g., optics portion 262A-262D. In some such embodiments, the positioner 310 may comprise a frame and a plurality of MEMS actuators. The spacer 2012 may be a glass spacer, e.g., comprising one or more glass materials.

Figure 90A:
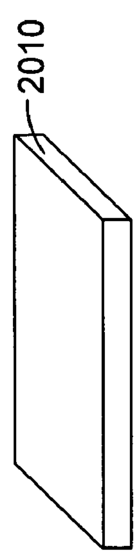
Figure 90B:
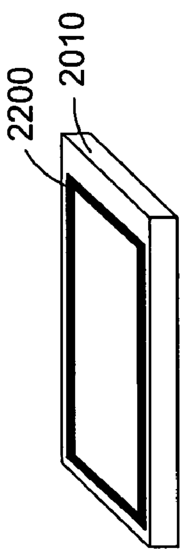
Figure 90C:
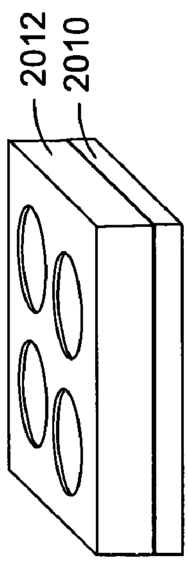
Figure 90D:
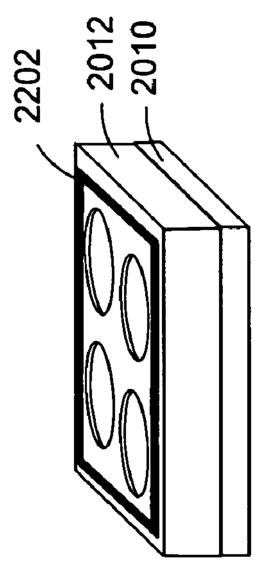
Figure 90E:
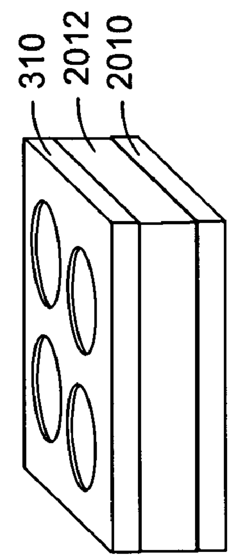
Figure 90F:
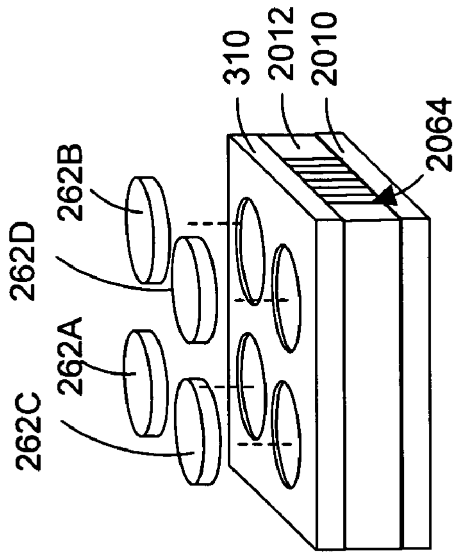

With reference to FIG. 90A, in this embodiment, an integrated circuit die 2010 is provided. Referring to FIG. 90B, a bond layer 2200 is provided on one or more regions of one or more surfaces of the integrated circuit die 2010. Such regions define one or more mounting regions for the spacer 2012. Referring to FIG. 90C, the spacer 2012 is thereafter positioned on the bond layer 2200. In some embodiments, force may be applied to help drive any trapped air out from between the spacer 2012 and the integrated circuit die 2010. In some embodiments, heat and/or force may be applied to provide conditions to activate and/or cure the bond layer to form a bond between the spacer 2012 and the integrated circuit die 2010. Referring to FIG. 90D, a bond layer 2202 is provided on one or more regions of one or more surfaces of the spacer 2012. Such regions define one or more mounting regions for one or more support portions of the positioner 310. Referring to FIG. 90E, the positioner 310 is thereafter positioned on the bond layer 2202. In some embodiments, force may be applied to help drive any trapped air out from between the spacer 2012 and the positioner 310. In some embodiments, heat and/or force may be applied to provide conditions to activate and/or cure the bond layer to form a bond between the spacer 2012 and the positioner 310. Referring to FIG. 90F, one or more optics portions, e.g., optics portions 262A-262D may thereafter be seated in and/or affixed to the positioner 310 and one or more electrical conductors, e.g., connector 2064, may be installed to connect one or more of the pads, e.g., pad 2020 on the second integrated circuit 2014 (FIG. 83C-83D) to one or more pads on the first integrated circuit die 2010 (FIG. 83A).

Figure 90G:
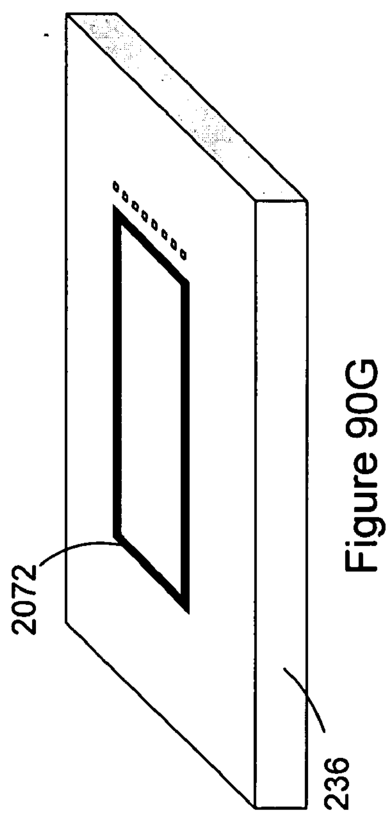
Figure 90H:
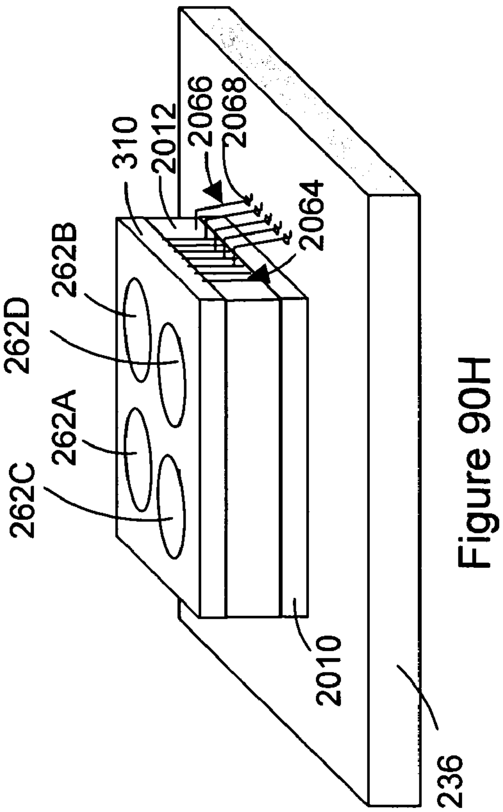

Referring to FIG. 90G, if the digital camera apparatus 210 is to be affixed to the printed circuit board 236 (FIGS. 2, 83A-83B, 85A-85C) of the digital camera 200, a bond layer, e.g., bond layer 2072, is provided on one or more regions of one or more surfaces of the printed circuit board 236. Such regions define one or more mounting regions for the digital camera apparatus 210. Referring to FIG. 90H, the digital camera apparatus 210 is thereafter positioned on the bond layer 2204. One or more electrical conductors, e.g., connector 2066, may be installed to connect one or more of the pads, e.g., pad 2020 on the integrated circuit die 2010 to one or more pads, e.g., pad 2062, on the circuit board 236.

Figures 90I, 90J, 90K, 90L, 90M, 90N:
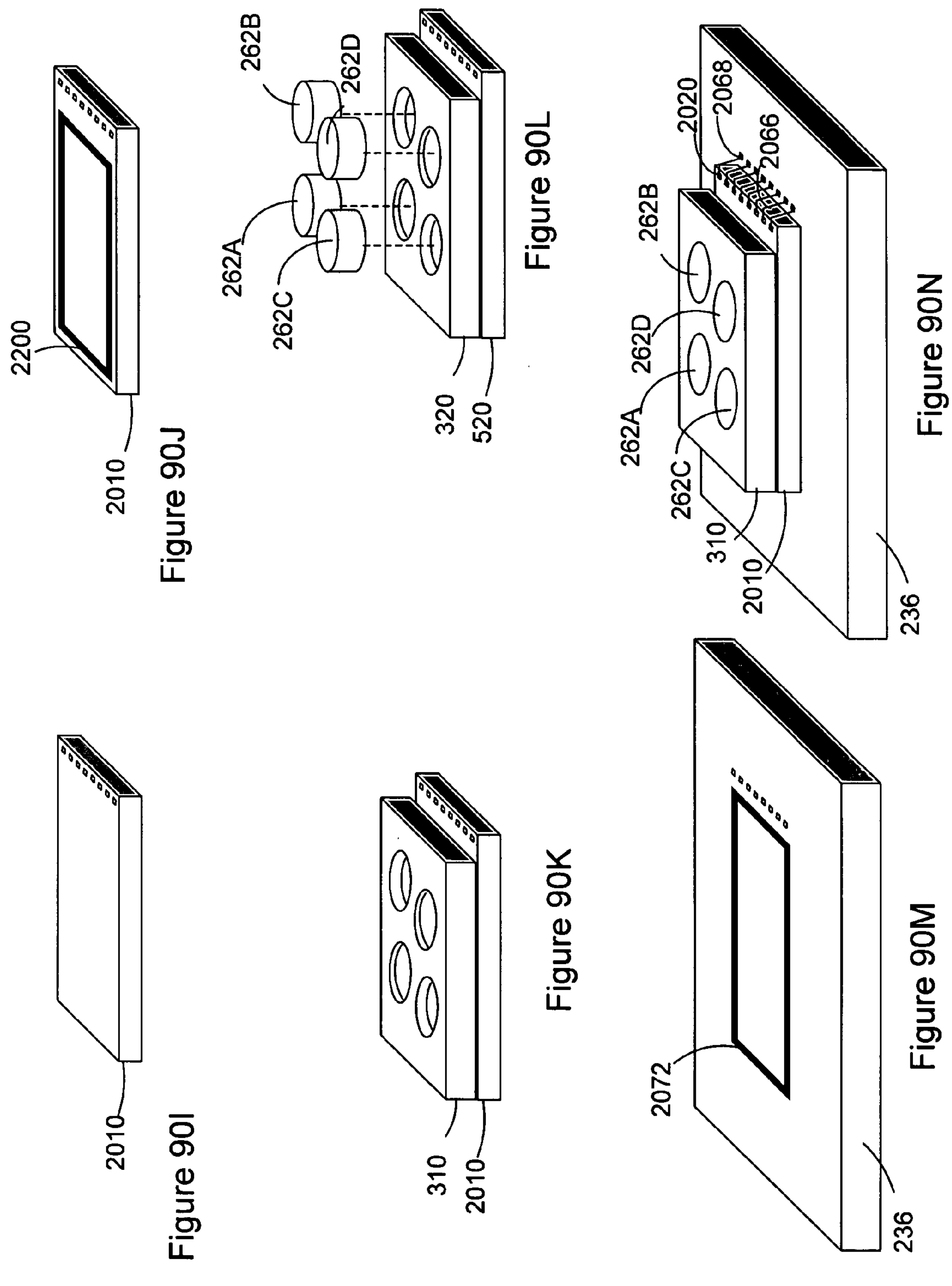

FIGS. 90I-90N shows one embodiment for assembling and mounting a digital camera apparatus 210 without a spacer 2012. Referring to FIG. 90I, initially, the integrated circuit die 2010 is provided. Referring to FIG. 90J, a first bond layer 2200 is provided on one or more regions of one or more surfaces of the integrated circuit die 2010. Such regions define one or more mounting regions for the positioner 310. Referring to FIG. 90K, the positioner 310 is thereafter positioned on the bond layer 2200. In some embodiments, force may be applied to help drive any trapped air out from between the integrated circuit die 2010 and positioner 310. In some embodiments, heat and/or force may be applied to provide conditions to activate and/or cure the bond layer to form a bond between the integrated circuit die 2010 and the positioner 310. Referring to FIG. 90L, one or more optics portions, e.g., optics portions 262A-262D may thereafter be seated in and/or affixed to the positioner 310. Referring to FIG. 90M, a bond layer 2072 is provided on one or more regions of one or more surfaces of the printed circuit board 236. Such regions define one or more mounting regions for the digital camera apparatus 210. Referring to FIG. 90N, the digital camera apparatus 300 is thereafter positioned on the bond layer 2072. One or more electrical conductors 2066 may be installed to connect one or more of pads, e.g., pad 2020, on the integrated circuit die 2010 to one or more pads, e.g., pad 2068, on circuit board 2362.

Figures 90O, 90P, 90Q, 90R, 90S, 90T, 90U, 90V:
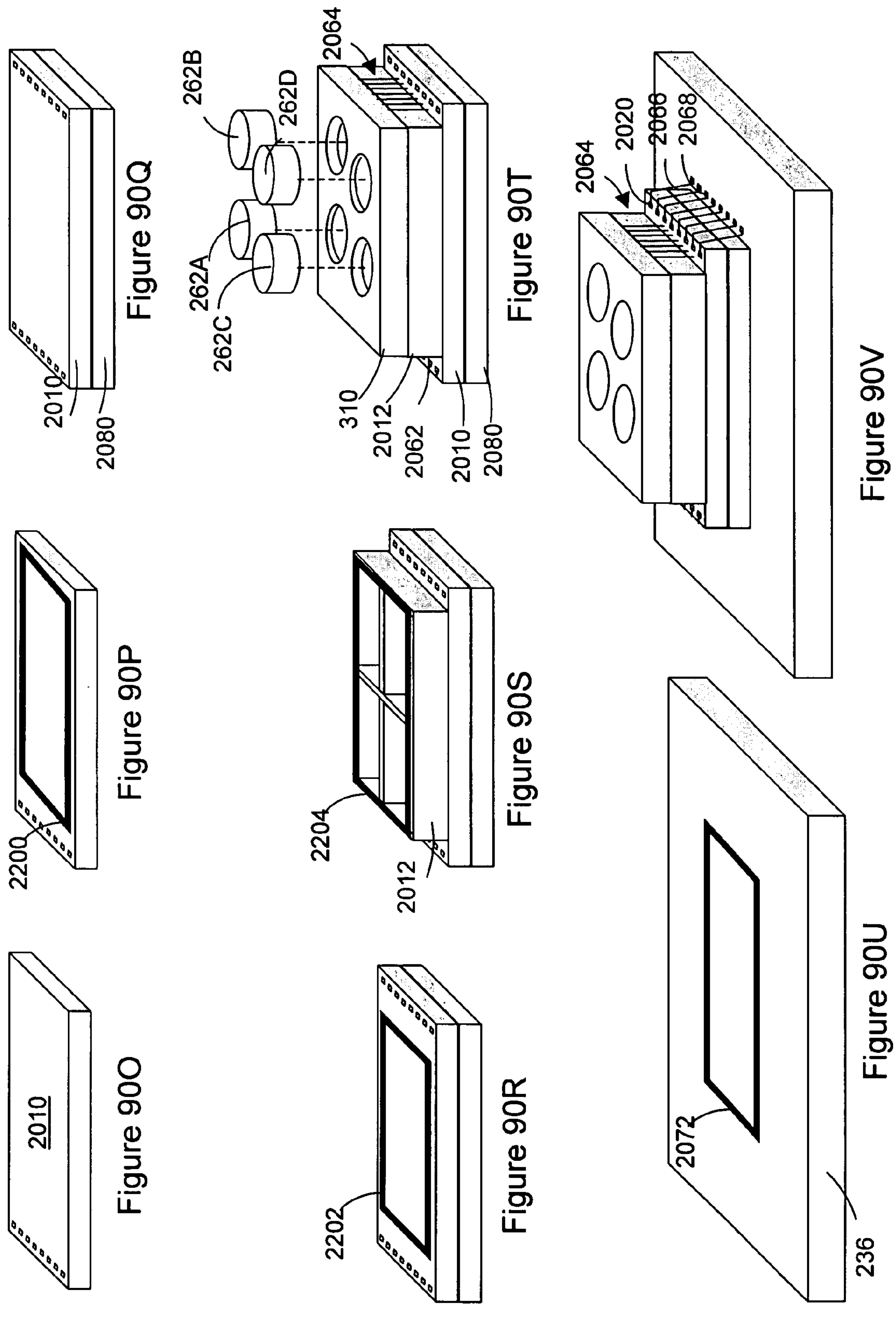

FIGS. 90O-90V shows one embodiment for assembling and mounting a digital camera apparatus 210 having an additional device, e.g., additional device 2080, and another embodiment of a spacer 2012. Referring to FIG. 90O, initially, the additional device 2080 is provided. Referring to FIG. 90P, a bond layer 2200 is provided on one or more regions of one or more surfaces of the second device 2080. Such regions define one or more mounting regions for the integrated circuit die 2010. Referring to FIG. 90Q, the integrated circuit die 2010 is thereafter positioned on the bond layer 2200. In some embodiments, force may be applied to help drive any trapped air out from between the integrated circuit die 2010 and second device 2080. In some embodiments, heat and/or force may be applied to provide conditions to activate and/or cure the bond layer to form a bond between the integrated circuit die 2010 and the additional device 2080. One or more electrical conductors, e.g., connector 2082, may be installed to connect one or more of the pads on the additional device 2080 to one or more pads on the first integrated circuit die 2010 (FIG. 83A). Referring to FIG. 90R, a bond layer 2202 is provided on one or more regions of one or more surfaces of the integrated circuit die 2010. Such regions define one or more mounting regions for the spacer 2012. Referring to FIG. 90S, the spacer 2012 is thereafter positioned on the bond layer 2202. In some embodiments, force may be applied to help drive any trapped air out from between the spacer 2012 and the integrated circuit die 2010. In some embodiments, heat and/or force may be applied to provide conditions to activate and/or cure the bond layer to form a bond between the spacer 2012 and the integrated circuit die 2010. A bond layer 2204 is provided on one or more regions of one or more surfaces of the spacer 2012. Referring to FIG. 90S, such regions define one or more mounting regions for the one or more portions of the positioner 310, which is thereafter positioned on the bond layer 2204. In some embodiments, force may be applied to help drive any trapped air out from between the spacer 2012 and the one or more portions of the positioner 310. In some embodiments, heat and/or force may be applied to provide conditions to activate and/or cure the bond layer to form a bond between the spacer 2012 and the one or more portions of the positioner 310. Referring to FIG. 90T, one or more optics portions, e.g., optics portions 262A-262D may thereafter be seated in and/or affixed to the positioner 310. One or more electrical conductors, e.g., connector 2064, may be installed to connect one or more of the pads, e.g., pad 2020 on the second integrated circuit 2014 (FIG. 83C-83D) to one or more pads on the first integrated circuit die 2010 (FIG. 83A). Referring to FIG. 90U, a bond layer 2072 is provided on one or more regions of one or more surfaces of the printed circuit board 236. Such regions define one or more mounting regions for the digital camera apparatus 210. Referring to FIG. 90V, the digital camera apparatus 210 is thereafter positioned on the bond layer 2072. One or more electrical conductors, e.g., connector 2066, may be installed to connect one or more of the pads, e.g., pad 2020 on the integrated circuit die 2010 to one or more pads, e.g., pad 2062, on the circuit board 236. One or more electrical conductors 790 may be installed to connect one or more of the pads 742 on the integrated circuit die 2010 to one or more pads on the second device 780.

In some embodiments, the electrical interconnect between component layers may be formed by lithography and metallization, bump bonding or other methods. Organic or inorganic bonding methods can be used to join the component layers.

In some embodiments, the assembly process may start with a "host" wafer with electronics used for the entire camera and/or each camera channel. Then another wafer or individual chips are aligned and bonded to the host wafer. The transferred wafers or chips can have bumps to make electrical interconnect or connects can be made after bonding and thinning. Electrical interconnects are then made (if needed) between the host and the bonded wafer or die using standard integrated circuit processes. The process can be repeated multiple times.

Some embodiments may employ one or more of the structures and/or methods disclosed in N. Miki, X. Zhang, R. Khanna, A. A. Ayon, D. Ward, S. M. Spearling, "A Study of Multi-Stack Silicon-Direct Wafer Bonding For MEMS Manufacturing", IEEE, Proceeding for the 15th IEEE International Conference on Micro Electro Mechanical Systems, Las Vegas, Nev., USA, Jan. 20-24, 2002, pages 407-410, the entire contents of which are incorporated by reference herein, however, unless stated otherwise, the aspects and/or embodiments of the present invention are not limited in any way by the description and/or illustrations set forth in such paper.

FIG. 91 is a partially exploded schematic representation of a digital camera apparatus having an additional device, e.g., additional device 2080, that includes an optional memory. In this embodiment, the digital camera apparatus 210 includes four camera channels, e.g., camera channels 260A-260D (FIG. 4), that include four optics portions, e.g., optics portion 262A-262D, respectively. In some embodiments, each optics portion 262A-262D includes a lens having a two or more lenslets e.g., three lenslets. The digital camera apparatus 210 further includes a positioner 310, an integrated circuit die 2010 and additional device, e.g., additional device 2080, that includes optionally memory and/or one or more portions of the processor 265. In some embodiments, the positioner 310 includes a plurality of actuators, e.g., actuator 430A-430D, 434A-434D, 438A-438D, 442A-442D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), to move one or more portions of one or more optics portion. In some such embodiments, the positioner 310 may comprise a frame and a plurality of MEMS actuators. The additional device 2080 may be disposed in any location(s).

FIGS. 92A-92D are representations of one embodiment of a positioner 310 and optics, e.g., optics portions 262A-262D, for a digital camera apparatus 210 having four camera channels, e.g., camera channels 260A-260D (FIG. 4). In this embodiment, the positioner 310 comprises a plate (e.g., a thin plate) defining a plurality of mounting holes 2216A-2216D. Each mounting hole 616A-616D is adapted to receive a respective one of the optics portions 262A-262D (or portion thereof). In this embodiment, the openings are formed by machining (e.g., boring). However, any suitable methods may be employed. In some other embodiments, for example, the positioner 310 is fabricated as a casting with the mounting holes defined therein (e.g., using a mold with projections that define the openings through the positioner 310).

In this embodiment, each of the optics portions 262A-262D comprises a lens stack. Each lens stack includes one or more lenses (e.g., two lenses). The stack of lenses may be secured in the respective mounting hole in any suitable manner, for example, but not limited to, mechanically (e.g., press fit, physical stops), chemically (e.g., adhesive), electronically (e.g., electronic bonding) and/or any combination thereof.

In this embodiment, the mounting holes define a seat to control the depth at which the lens is positioned (e.g., seated) within the positioner. The depth may be different for each lens and is based, at least in part, on the focal length of the lens. For example, if a camera channel is dedicated to a specific color (or band of colors), the lens or lenses for that camera channel may have focal length specifically adapted to the color (or band of colors) to which the camera channel is dedicated. If each camera channels is dedicated to a different color (or band of colors) than the other camera channels, then each of the lenses may have a different focal length, for example, to tailor the lens to the respective sensor portion, and each of the seats have a different depth.

In this embodiment, the positioner 310 is a solid device that may offer a wide range of options for manufacturing and material. Of course, other suitable positioners can be employed.

In some embodiments, the lens of optics portions 262A-262D and the positioner 310 may be manufactured as a single molded component and/or the lens may be manufactured with tabs that may be used to form the positioner 310.

In this embodiment, the positioner 310 does not provide movement of the optic portions 262A-262D, however, in some alternative embodiments the optics portions 262A-262D may be mounted in a positioner 310 having one or more actuator portions, e.g., actuator 430A-430D, 434A-434D, 438A-438D, 442A-442D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), to provide movement thereof.

FIG. 93 is a representation of another embodiment of a positioner 310 and optics portions, e.g., optics portions 262A-262B, for a digital camera apparatus 210 having two or more camera channels. In this embodiment, each of the optics portions 262A-262B has two lenslets. The lenslets may be color and IR coated, for example, in a manner that is the same as or similar to as described and/or illustrated above with respect to the compound aspherical lens 376 (FIG. 5X).

In this embodiment, positioner 310 defines a plurality of seats, e.g, seats 418A, 418B. Each seat is adapted to receive a respective one of the one or more optical portions, e.g., optics portions 262A-262B. In this regard, each seat may include one or more surfaces (e.g., surfaces 420, 422) adapted to abut one or more surfaces of a respective optics portion to support and/or assist in positioning the optics portion relative to the positioner 310, the positioner 320 and/or one or more of the sensor portions 264A-264D.

The positioner 310 may include one or more actuators, e.g., actuator 430A-430D, 434A-434D, 438A-438D, 442A-442D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), to provide movement of one or more portions of the optics portions 262A-262B.

One or more of the optics portions 262A-262D may have different focal lengths For example, one or more of the optics portions 262A-262D may have a focal length that is different than the focal length of one or more of the other optics portions 262A-262D. In this regard, the first seat 418A may be disposed at a first height or first depth (e.g., positioning in z direction). The second seat 418B may be disposed at a second height or second depth that is different than the first height or first depth. As stated above, the depth may be different for each lens and is based, at least in part, on the focal length of the lens.

In some embodiments, the positioner 310 and lenslets form a hermetic seal. In some such embodiments, for example, the lenslets of optics portions 262A, 262C may be press fit into the positioner 310, e.g., to form hermetic seals 2220A, 2220B, thereby helping to eliminate the possibility of outgassing (which might occur if adhesive was used).

Wafer to wafer alignment may be carried out using IR alignment marks. In some embodiments, the tolerances associated with the positioner 310 and/or optics portion are 1.0 micron (um). In some embodiments, the positioner 310 and/or optics portions, e.g., optics portions 262A-262B, may be manufactured and/or assembled using a suitable high volume manufacturing process.

FIG. 94 is a schematic representation of another embodiment of a positioner 310 and optics portions, e.g., optics portions 262A-262D, for a digital camera apparatus 210 having two or more camera channels. In this embodiment, each of the optics portions 262A-262B has one or more lenslets.

In some embodiments, the positioner 310 and the lenslets form a hermetic seal. Thus, the need for additional packaging may be reduced or eliminated, which may help reduce one or more dimensions, e.g., the height, of the digital camera apparatus 210. To that effect, some embodiments of the digital camera apparatus have a height of 2.5 mm. In one such embodiment, the digital camera system has a footprint of 6 mm×6 mm and includes 1.3 Meg pixels.

In some embodiments, positioner 310 is a stationary positioner and does not provide movement of the optic portions. In some other embodiments, however, positioner 310 may include one or more actuator portions to provide movement for one or more optics portions or portions thereof. In some embodiments, the use of positioner 310 reduces or eliminates the need for lens alignment and/or lens to sensor alignment. This may in turn reduce or eliminate one or more test operations.

FIG. 95A is a representation of another embodiment of a positioner 310 and optics, e.g., optics portions 262A, 262C, for a digital camera apparatus 210. In this embodiment, one or more optics portions, e.g., optics portions 262A, 262C, have a convex surface in contact with a seat defined by the positioner 310. For example, optics portion 262A may have a convex surface 2230A in contact with a seat defined by the positioner 310. Optics portion 262C may also have a convex surface 2230C in contact with a seat defined by the positioner 310

In some embodiments, positioner 310 is a stationary positioner and does not provide movement of the optic portions. In some other embodiments, however, positioner 310 may include one or more actuator portions to provide movement for one or more optics portions or portions thereof.

FIG. 95B is a representation of another embodiment of a positioner 310 and optics portions, e.g., optics portions 262A, 262C, for a digital camera apparatus 210. In this embodiment, each of the optics portions 262A, 262C has a single lens element having a first portion 2240A, 2240C, respectively, seated on a surface of positioner 310 that faces in a direction away from the sensor arrays (not shown). Each lens element may further include a second portion 2242A, 2242C, respectively, disposed in a respective aperture defined by the positioner 310 and facing in a direction toward the sensor arrays (not shown).

In some embodiments, positioner 310 is a stationary positioner and does not provide movement of the optic portions. In some other embodiments, positioner 310 may include one or more actuator portions to provide movement for one or more optics portions or portions thereof.

As stated above, it should be understood that the features of the various embodiments described herein may be used alone and/or in any combination thereof.

FIG. 96 is a partially exploded schematic representation of one embodiment a digital camera apparatus 210. In this embodiment, the digital camera apparatus 210 includes four camera channels, e.g., camera channels 260A-260D (FIG. 4), that include four optics portions, e.g., optics portion 262A-262D, respectively. In some embodiments, each optics portion 262A-262D includes a lens having a two or more lenslets e.g., three lenslets. The digital camera apparatus 210 further includes a positioner 310 and an integrated circuit die 2010. The positioner 310 includes a plurality of actuators, e.g., actuator 430A-430D, 434A-434D, 438A-438D, 442A-442D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), to move one or more portions of one or more optics portion, e.g., optics portions 262A-262D. In some such embodiments, the positioner 310 may comprise a frame and a plurality of MEMS actuators.

FIG. 97 is a partially exploded schematic representation of one embodiment of a digital camera apparatus 210 that includes one or more additional devices 2250. In some embodiments, the one or more additional devices 2250 include a microdisplay 2252 and/or a silicon microphone 2254, which may be mounted thereto.

In this embodiment, the digital camera apparatus 210 includes four camera channels, e.g., camera channels 260A-260D (FIG. 4), that include four optics portions, e.g., optics portion 262A-262D, respectively. In some embodiments, each optics portion 262A-262D includes a lens having a two or more lenslets e.g., three lenslets. The digital camera apparatus 210 further includes a positioner 310 and an integrated circuit die 2010. The positioner 310 includes a plurality of actuators, e.g., actuator 430A-430D, 434A-434D, 438A-438D, 442A-442D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), to move one or more portions of one or more optics portion, e.g., optics portions 262A-262D. In some such embodiments, the positioner 310 may comprise a frame and a plurality of MEMS actuators.

In some embodiments, the one or more additional devices 2250 include a microdisplay 2252 and/or a silicon microphone 2254, which may be mounted thereto.

A microdisplay 2252 and/or silicon microphone 2254 may be any type of microdisplay and/or silicon microphone, respectively. Various embodiments of microdisplays, silicon microphones and digital camera apparatus employing such microdisplays and/or silicon microphones are disclosed in the Apparatus for Multiple Camera Devices and Method of Operating Same patent application publication. As stated above, the structures and/or methods described and/or illustrated in the Apparatus for Multiple Camera Devices and Method of Operating Same patent application publication may be employed in conjunction with one or more of aspects and/or embodiments of the present inventions.

Thus, for example, one or more embodiments of a microdisplay and/or silicon microphone disclosed in the Apparatus for Multiple Camera Devices and Methods of Operating Same patent application publication may be employed in a digital camera apparatus having one or more actuators, e.g., e.g., actuator 430A-430D, 434A-434D, 438A-438D, 442A-442D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), for example, to move one or more portions of one or more optics portion and/or to move one or more portions of one or more sensor portions. In addition, for example, one or more actuators, e.g., e.g., actuator 430A-430D, 434A-434D, 438A-438D, 442A-442D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), may be employed in one or more embodiments of the digital camera apparatus 300 disclosed in the Apparatus for Multiple Camera Devices and Method of Operating Same patent application publication, for example, to move one or more portions of one or more optics portion and/or to move one or more portions of one or more sensor portions.

For the sake of brevity, the structures and/or methods described and/or illustrated in the Apparatus for Multiple Camera Devices and Method of Operating Same patent application publication will not be repeated. It is expressly noted, however, that the entire contents of the Apparatus for Multiple Camera Devices and Method of Operating Same patent application publication, including, for example, the features, attributes, alternatives, materials, techniques and advantages of all of the inventions, are incorporated by reference herein, although, unless stated otherwise, the aspects and/or embodiments of the present invention are not limited to such features, attributes alternatives, materials, techniques and advantages.

FIG. 98 is a representation of a camera system having two digital camera apparatus 210A, 210B, in accordance with another embodiment of the present invention. The plurality of digital camera apparatus 210A, 210B may be arranged in any desired manner. In some embodiments, it may be desired to collect images from opposing directions. In some embodiments, the digital camera apparatus 210A, 210B are mounted back to back, as shown. Some of such embodiments may allow concurrent imaging in opposing directions.

In some embodiments, one or more optics portions, e.g., optics portions 262A-262D, for the first camera apparatus 210A face in a first direction that is opposite to a second direction that the one or more optics portions for the second digital camera apparatus face 210B.

In some embodiments, each of the digital camera apparatus 210A, 210B has its own sets of optics, filters and sensors arrays, and may or may not have the same applications and/or configurations as one another, for example, in some embodiments, one of the apparatus may be a color system and the other may be a monochromatic system, one of the apparatus may have a first field of view and the other may have a separate field of view, one of the apparatus may provide video imaging and the other may provide still imaging. Some embodiments may employ plastic lenses. Some other embodiment may employ glass lenses. In some embodiments, the system defines a hermetic package, although this is not required.

Each camera channel may include a positioner 310. In some embodiments, the positioner 310 for the first camera channel 210A includes a plurality of actuators, e.g., actuator 430A-430D, 434A-434D, 438A-438D, 442A-442D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), to move one or more portions of one or more optics portion, e.g., optics portions 262A-262D, of the second camera apparatus 210B.

In some embodiments, the positioner 310 for the second camera channel 210B includes a plurality of actuators, e.g., actuator 430A-430D, 434A-434D, 438A-438D, 442A-442D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), to move one or more portions of one or more optics portion, e.g., optics portions 262A-262D, of the second camera apparatus 210B.

The plurality of digital camera apparatus 210A, 210B may have any size and shape and may or may not have the same configuration as one another (e.g., type, size, shape, resolution).

In some embodiments, one or more sensor portions for the second digital camera apparatus 210B are disposed on the same device (e.g., integrated circuit die 2010) as one or more sensor portions for the first digital camera apparatus 210A. In some embodiments, one or more sensor portions for the second digital camera apparatus 210B are disposed on a second device (e.g., an integrated circuit similar to integrated circuit 2010), which may be disposed, for example, adjacent to the integrated circuit 2010 on which the one or more sensor portions for the first digital camera apparatus are disposed.

In some embodiments, two or more of the digital camera apparatus 210A, 210B share a processor, or a portion thereof. In some other embodiments, each of the digital camera apparatus 210A, 210B has its own dedicated processor separate from the processor for the other digital camera apparatus.

The digital camera apparatus may be assembled and/or mounted in any manner, for example, but not limited to in a manner similar to that employed in one or more of the embodiments disclosed herein.

As with each of the embodiments disclosed herein, this embodiment of the present invention may be employed alone or in combination with one or more of the other embodiments disclosed herein, or portion thereof.

For example, other quantities of camera channels and other configurations of camera channels and portions thereof are disclosed in the Apparatus for Multiple Camera Devices and Method of Operating Same patent application publication. As stated above, the structures and/or methods described and/or illustrated in the Apparatus for Multiple Camera Devices and Method of Operating Same patent application publication may be employed in conjunction with one or more of the aspects and/or embodiments of the present inventions.

Thus, for example, one or more portions of one or more embodiments of the digital camera apparatus disclosed in the Apparatus for Multiple Camera Devices and Methods of Operating Same patent application publication may be employed in a digital camera apparatus 210 having one or more actuators, e.g., e.g., actuator 430A-430D, 434A-434D, 438A-438D, 442A-442D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), for example, to move one or more portions of one or more optics portion and/or to move one or more portions of one or more sensor portions. In addition, in some embodiments, for example, one or more actuators, e.g., e.g., actuator 430A-430D, 434A-434D, 438A-438D, 442A-442D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), may be employed in one or more embodiments of the digital camera apparatus 300 disclosed in the Apparatus for Multiple Camera Devices and Method of Operating Same patent application publication, for example, to move one or more portions of one or more optics portion and/or to move one or more portions of one or more sensor portions.

For the sake of brevity, the structures and/or methods described and/or illustrated in the Apparatus for Multiple Camera Devices and Method of Operating Same patent application publication will not be repeated. It is expressly noted, however, that the entire contents of the Apparatus for Multiple Camera Devices and Method of Operating Same patent application publication, including, for example, the features, attributes, alternatives, materials, techniques and advantages of all of the inventions, are incorporated by reference herein, although, unless stated otherwise, the aspects and/or embodiments of the present invention are not limited to such features, attributes alternatives, materials, techniques and advantages.

As stated above, the digital camera apparatus 210 may have any number of camera channels each of which may have any configuration. In some embodiments, the digital camera apparatus 210 includes a housing, for example, but not limited to a hermetic package. One or more portions of a housing may be defined by one or more of the structures described herein, for example, one or more of the optics portions, one or more portions of the frame, one or more portions of the integrated circuit die and/or combinations thereof. In some embodiments, one or more portions of the housing are defined by plastic material(s), ceramic material(s) and/or any combination thereof. Plastic packaging may be employed in combination with any one or more of the embodiments disclosed herein FIG. 99 is a representation of a digital camera apparatus 210 that includes molded plastic packaging. In some embodiments, the molded plastic package includes a lead frame 2270 that supports one or more die, e.g., integrated circuit die 2010 (FIG. 83A), and/or one or more MEMS actuator structures, e.g., actuators 430A-430D. The lead frame may be single sided or dual sided. The package may have any size and shape for example, PLCC, TQFP and/or DIP. In some embodiments, one or more portions of the optics portions 262A-262D (e.g., lenses of optics portions 262A-262D) provide isolation during molding.

Other embodiments of plastic packaging and digital camera apparatus employing plastic packaging are disclosed in the Apparatus for Multiple Camera Devices and Method of Operating Same patent application publication. As stated above, the structures and/or methods described and/or illustrated in the Apparatus for Multiple Camera Devices and Method of Operating Same patent application publication may be employed in conjunction with one or more of aspects and/or embodiments of the present inventions.

Thus, for example, one or more embodiments of plastic packaging disclosed in the Apparatus for Multiple Camera Devices and Methods of Operating Same patent application publication may be employed in a digital camera apparatus having one or more actuators, e.g., e.g., actuator 430A-430D, 434A-434D, 438A-438D, 442A-442D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), for example, to move one or more portions of one or more optics portion and/or to move one or more portions of one or more sensor portions. In addition, in some embodiments, for example, one or more actuators, e.g., e.g., actuator 430A-430D, 434A-434D, 438A-438D, 442A-442D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), may be employed in one or more embodiments of the digital camera apparatus 300 disclosed in the Apparatus for Multiple Camera Devices and Method of Operating Same patent application publication, for example, to move one or more portions of one or more optics portion and/or to move one or more portions of one or more sensor portions. In some For the sake of brevity, the structures and/or methods described and/or illustrated in the Apparatus for Multiple Camera Devices and Method of Operating Same patent application publication will not be repeated. It is expressly noted, however, that the entire contents of the Apparatus for Multiple Camera Devices and Method of Operating Same patent application publication, including, for example, the features, attributes, alternatives, materials, techniques and advantages of all of the inventions, are incorporated by reference herein, although, unless stated otherwise, the aspects and/or embodiments of the present invention are not limited to such features, attributes, alternatives, materials, techniques and advantages.

Other configurations may also be employed. In some embodiments, for example, one or more portions of a housing are formed of any type of hermetic material(s), for example, but not limited to ceramic material(s). The use of ceramic packaging may be advantageous in harsh environments and/or in applications (e.g., vacuum systems) where outgassing from plastics present a problem, although this is not required. Ceramic packaging may be employed in combination with any one or more of the embodiments disclosed herein.

FIG. 100 is a representation of one embodiment of a digital camera apparatus 210 that includes a ceramic packaging. In some embodiments, the ceramic packaging defines a cavity that supports one or more die, e.g., integrated circuit die 2010 (FIG. 83A), and/or one or more MEMS actuator structures, e.g., actuators 430A-430D. The ceramic packaging may provide a level of protection against harsh environments. The lead frame 2276 may be single sided or dual sided.

Other embodiments of ceramic packaging and digital camera apparatus employing ceramic packaging are disclosed in the Apparatus for Multiple Camera Devices and Method of Operating Same patent application publication. As stated above, the structures and/or methods described and/or illustrated in the Apparatus for Multiple Camera Devices and Method of Operating Same patent application publication may be employed in conjunction with one or more of aspects and/or embodiments of the present inventions.

Thus, for example, one or more embodiments of ceramic packaging disclosed in the Apparatus for Multiple Camera Devices and Methods of Operating Same patent application publication may be employed in a digital camera apparatus having one or more actuators, e.g., e.g., actuator 430A-430D, 434A-434D, 438A-438D, 442A-442D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), for example, to move one or more portions of one or more optics portion and/or to move one or more portions of one or more sensor portions. In addition, in some embodiments, for example, one or more actuators, e.g., e.g., actuator 430A-430D, 434A-434D, 438A-438D, 442A-442D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), may be employed in one or more embodiments of the digital camera apparatus 300 disclosed in the Apparatus for Multiple Camera Devices and Method of Operating Same patent application publication, for example, to move one or more portions of one or more optics portion and/or to move one or more portions of one or more sensor portions.

For the sake of brevity, the structures and/or methods described and/or illustrated in the Apparatus for Multiple Camera Devices and Method of Operating Same patent application publication will not be repeated. It is expressly noted, however, that the entire contents of the Apparatus for Multiple Camera Devices and Method of Operating Same patent application publication, including, for example, the features, attributes, alternatives, materials, techniques and advantages of all of the inventions, are incorporated by reference herein, although, unless stated otherwise, the aspects and/or embodiments of the present invention are not limited to such features, attributes alternatives, materials, techniques and advantages.

Figure 101A:
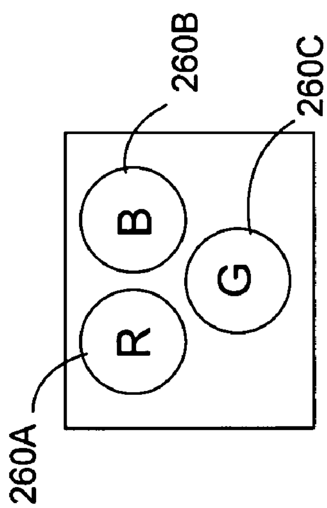

FIGS. 101A-101F are representations of some symmetric configurations of camera channels that may be employed in the digital camera apparatus 210. FIG. 101A is a representation of a camera configuration that includes three color camera channels, e.g., camera channel 260A-260C. Each of the camera channels may be a color camera channel dedicated to one color or multiple colors. In one embodiment, one of the camera channels, e.g., camera channel 260A, is a red camera channel, one camera channel, e.g., camera channel 260B, is a blue color channel and one camera channel, e.g., camera channel 260C, is a green camera channel. Other color configurations may also be employed. In some embodiments, one or more of the camera channels is optimized to the color(s) to which the camera channel is dedicated.

Figure 101B:
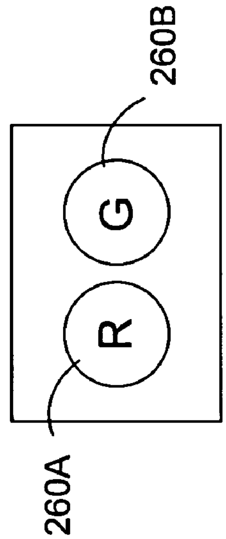

FIG. 101B is a representation of a camera configuration that includes two color camera channels, e.g., camera channel 260A-260B. Each of the camera channels may be a color camera channel dedicated to one color or multiple colors. In one embodiment, one of the camera channels, e.g., camera channel 260A, is a red camera channel and one camera channel, e.g., camera channel 260B, is a green color channel. Other color configurations may also be employed. In some embodiments, one of the color camera channels provides a first polarizing effect and the other color camera channel provides a second polarizing effect. Some such embodiments may facilitate, stereo imaging, for example, as described hereinabove.

Figure 101C:
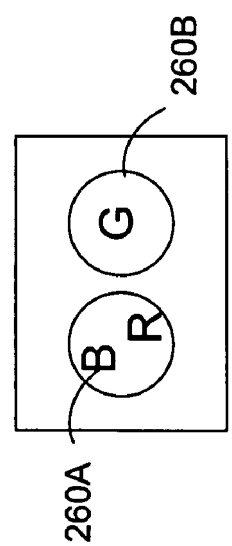

FIG. 101C is a representation of a camera configuration that includes two color camera channels, e.g., camera channel 260A-260B. Each of the camera channels may be a color camera channel dedicated to one color or multiple colors. In some embodiments, at least one of the camera channels detects two colors. In one such embodiment, one of the camera channels, e.g., camera channel 260A, is a blue and red camera channel. The other camera channel, e.g., camera channel 260B, is a green color channel. Other color configurations may also be employed.

Figure 101D:
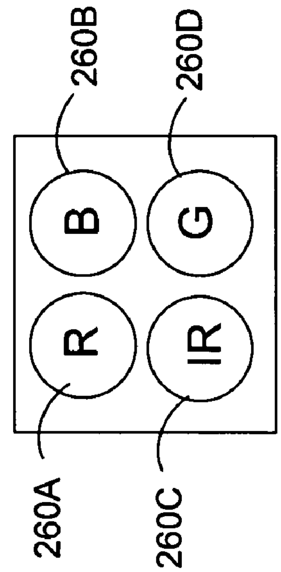

FIG. 101D is a representation of a camera configuration that includes four color camera channels, e.g., camera channel 260A-260D. Each of the camera channels may be a color camera channel dedicated to one color or multiple colors. In one embodiment, one of the camera channels, e.g., camera channel 260A, is a red camera channel, one camera channel, e.g., camera channel 260B, is a blue color channel, one of the camera channels, e.g., camera channel 260D, is a green color channel and one of the camera channels, e.g., camera channel 260C, is an infrared camera channel. In some embodiments, an infrared camera channel is employed to help provide or increase the sensitivity of the digital camera apparatus under low light conditions. In another configuration, one of the camera channels, e.g., camera channel 260A, detects cyan light, one of the camera channels, e.g., camera channel 260B, detects yellow light, one of the camera channels, e.g., camera channel 260C, detects magenta light and one of the camera channels, e.g., camera channel 260D, detects clear light (black and white). Other color configurations may also be employed.

Figure 101E:
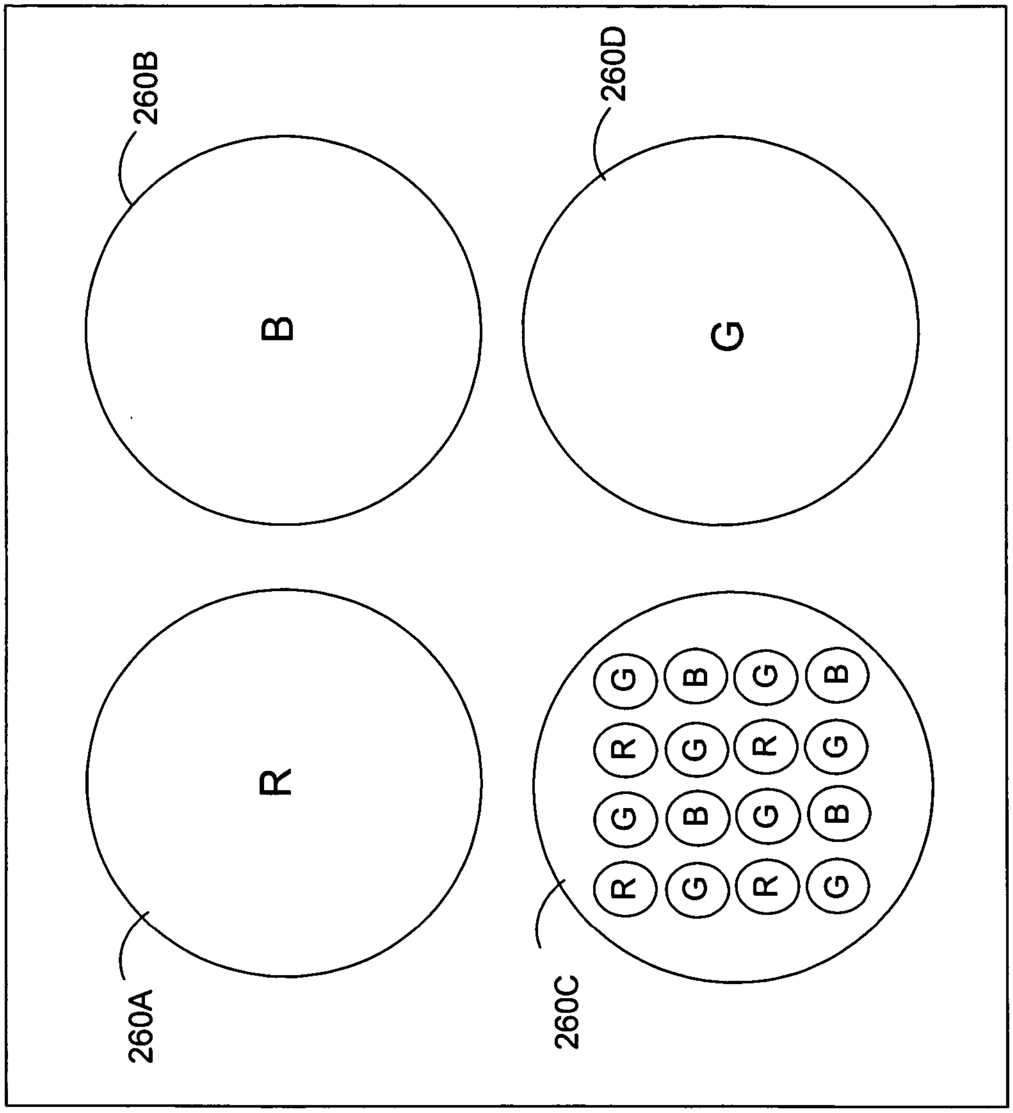

FIG. 101E is a representation of another camera configuration that includes four color camera channels, e.g., camera channel 260A-260D. Each of the camera channels may be a color camera channel dedicated to one color, multiple colors and/or full spectrum. In some embodiments, a full spectrum camera channel is employed for image processing and/or close up images. In one embodiment, one of the camera channels, e.g., camera channel 260A, is a red camera channel, one camera channel, e.g., camera channel 260B, is a blue color channel, one of the camera channels, e.g., camera channel 260D, is a green color channel and one of the camera channels, e.g., camera channel 260C, is a camera channel that employs a Bayer pattern. Other color configurations may also be employed.

Figure 101F:
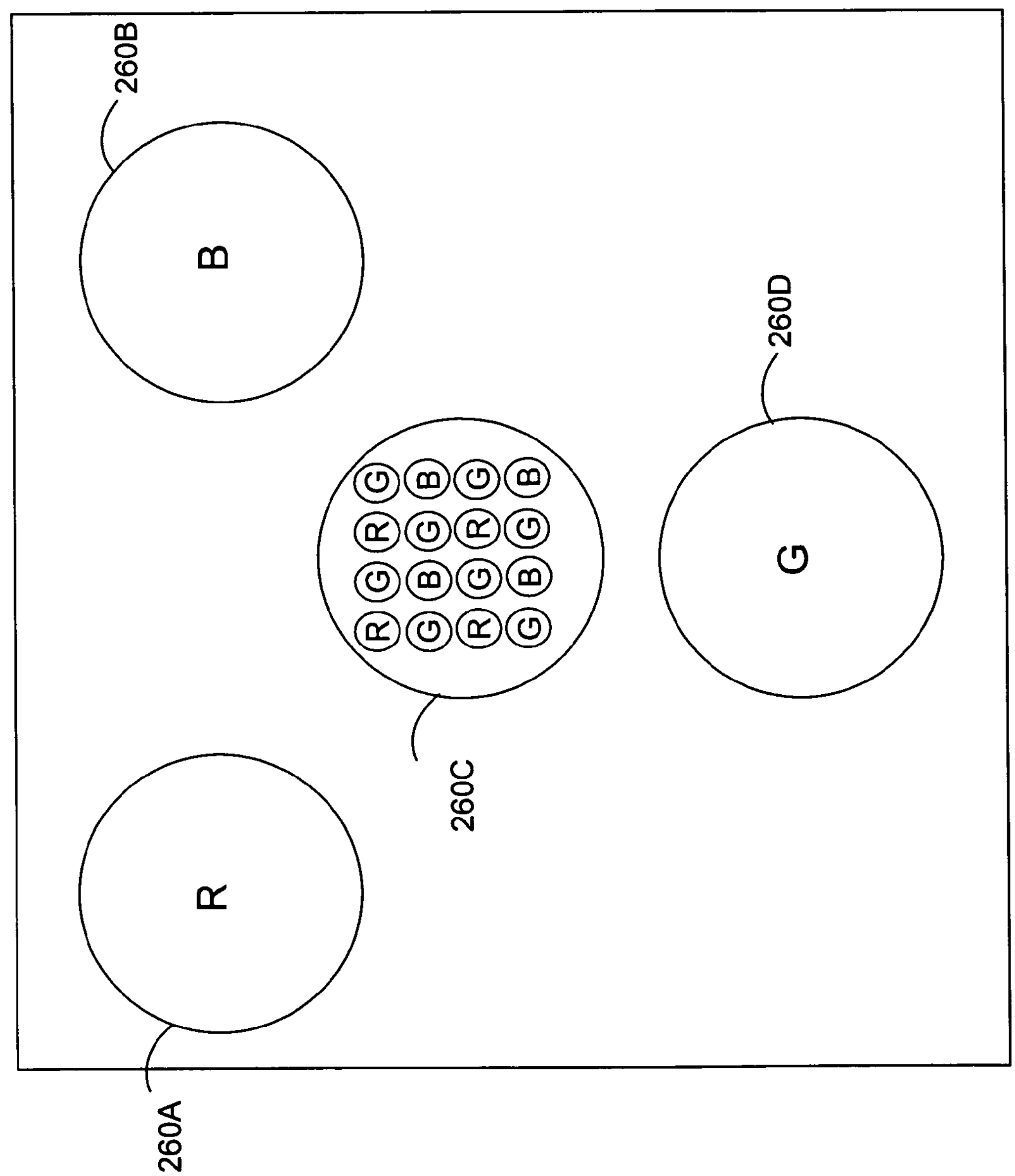

FIG. 101F is a representation of another camera configuration that includes four color camera channels, e.g., camera channel 260A-260D. Each of the camera channels may be a color camera channel dedicated to one color, multiple colors and/or full spectrum. In some embodiments, a full spectrum camera channel is employed for image processing and/or close up images. In one embodiment, one of the camera channels, e.g., camera channel 260A, is a red camera channel, one camera channel, e.g., camera channel 260B, is a blue color channel, one of the camera channels, e.g., camera channel 260D, is a green color channel and one of the camera channels, e.g., camera channel 260C, is a camera channel that employs a Bayer pattern. Other color configurations may also be employed. In this embodiment, the camera channels are arranged in a "Y" pattern.

In some embodiments described herein, one or more of the camera channels is optimized to one or more color(s) to which the camera channel is dedicated.

Figure 102A:
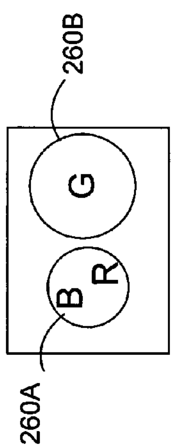

FIGS. 102A-102D are representations of some asymmetrical configurations of camera channels that may be employed in the digital camera apparatus 210. FIG. 102A is a representation of a camera configuration that includes two color camera channels, e.g., camera channel 260A-260B. Each of the camera channels may be a color camera channel dedicated to one color or multiple colors. In some embodiments, one of the camera channels has a different topology than the other camera channel. In one embodiment, one of the camera channels, e.g., camera channel 260A, is a blue and red vertical camera channel and one camera channel, e.g., camera channel 260B, is an extended resolution, narrow band, green color channel. Other color configurations may also be employed. In some embodiments one or more of the camera channels is optimized for its purpose.

Figure 102B:
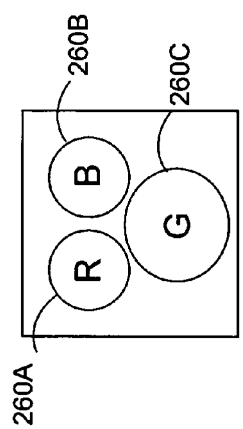

FIG. 102B is a representation of a camera configuration that includes three color camera channels, e.g., camera channel 260A-260C. Each of the camera channels may be a color camera channel dedicated to one color or multiple colors. In one embodiment, one of the camera channels, e.g., camera channel 260A, is a red camera channel, one camera channel, e.g., camera channel 260B, is a blue color channel and one camera channel, e.g., camera channel 260C, is a green camera channel. Other color configurations may also be employed. In some embodiments, one or more of the camera channels is optimized to the color(s) to which the camera channel is dedicated. In some embodiments, one or more of the camera channels has a different resolution than one or more of the other camera channels. In one embodiment, two of the camera channels, e.g., the red camera channel and the blue camera channel, are standard resolution, and one or more of the camera channels, e.g., the green camera channel is a higher resolution narrow band camera channel.

Figure 102C:
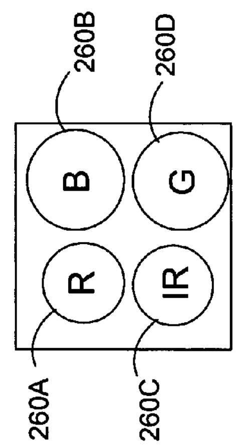

FIG. 102C is a representation of another camera configuration that includes four color camera channels, e.g., camera channel 260A-260D. Each of the camera channels may be a color camera channel dedicated to one color, multiple colors. In one embodiment, one of the camera channels, e.g., camera channel 260A, is a red camera channel, one camera channel, e.g., camera channel 260B, is a blue color channel, one of the camera channels, e.g., camera channel 260D, is a green color channel and one of the camera channels, e.g., camera channel 260C, is an infrared camera channel. Other color configurations may also be employed. In some embodiments, the camera channels have the same resolution but one or more of the camera channels has an optimized and/or custom spectrum specific architecture. In such embodiments, the camera channels may have different pixel sizes, architectures and readouts per band.

Figure 102D:
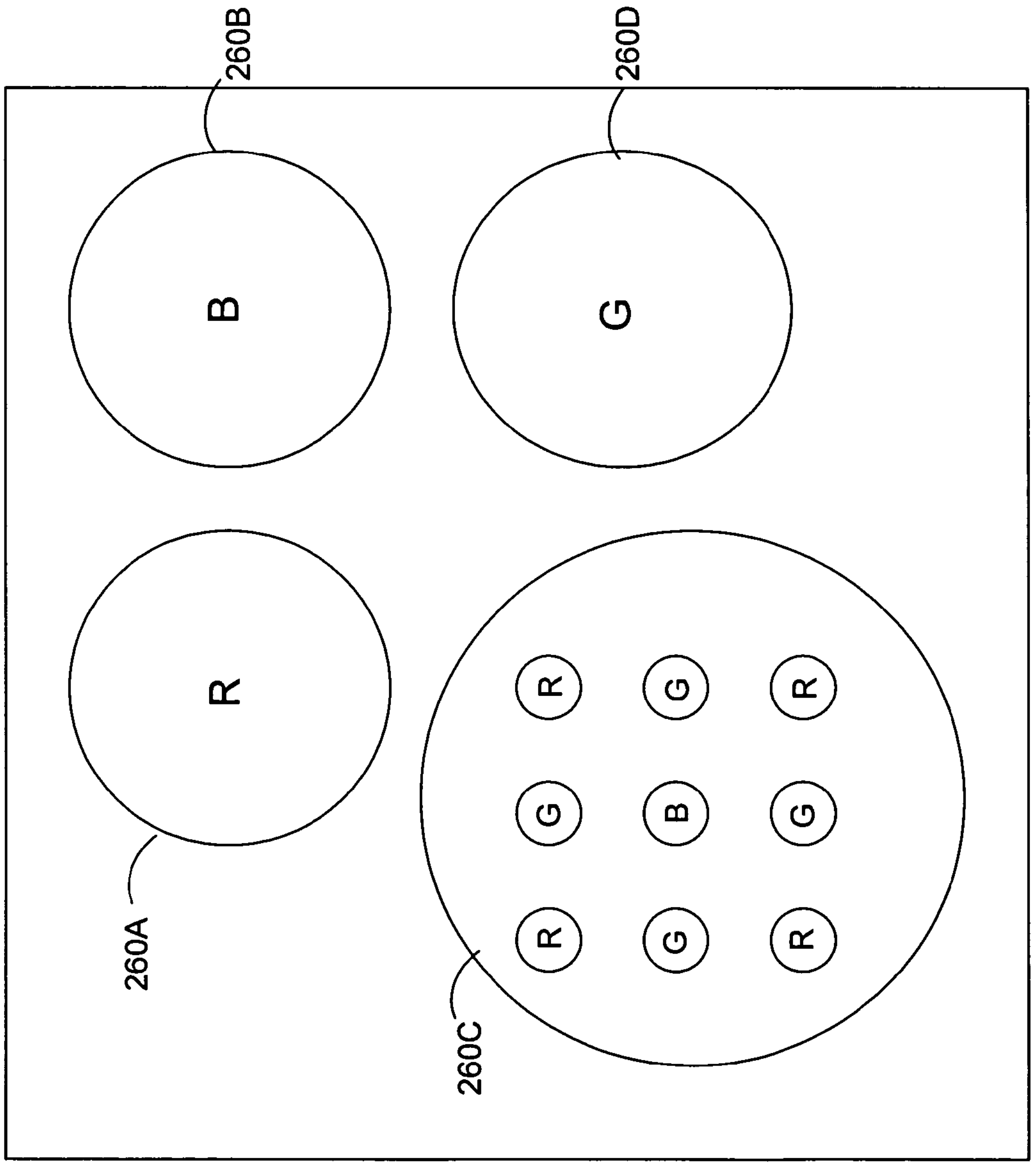

FIG. 102D is a representation of another camera configuration that includes four color camera channels, e.g., camera channel 260A-260D. Each of the camera channels may be a color camera channel dedicated to one color, multiple colors. In one embodiment, one of the camera channels, e.g., camera channel 260A, is a red camera channel, one camera channel, e.g., camera channel 260B, is a blue color channel, one of the camera channels, e.g., camera channel 260D, is a green color channel and one of the camera channels, e.g., camera channel 260C, is a camera channel employing a Bayer pattern. Some embodiments employ several narrow band cameras integrated with alternative resolution and mode of operation cameras. In some embodiments, the red, blue and green camera channels are narrow band camera channels and the Bayer pattern camera channel is a wideband camera channel.

FIGS. 103A-103D are representations of some other sensor and or processor configurations that may be employed in the digital camera apparatus 210.

Figure 103A:
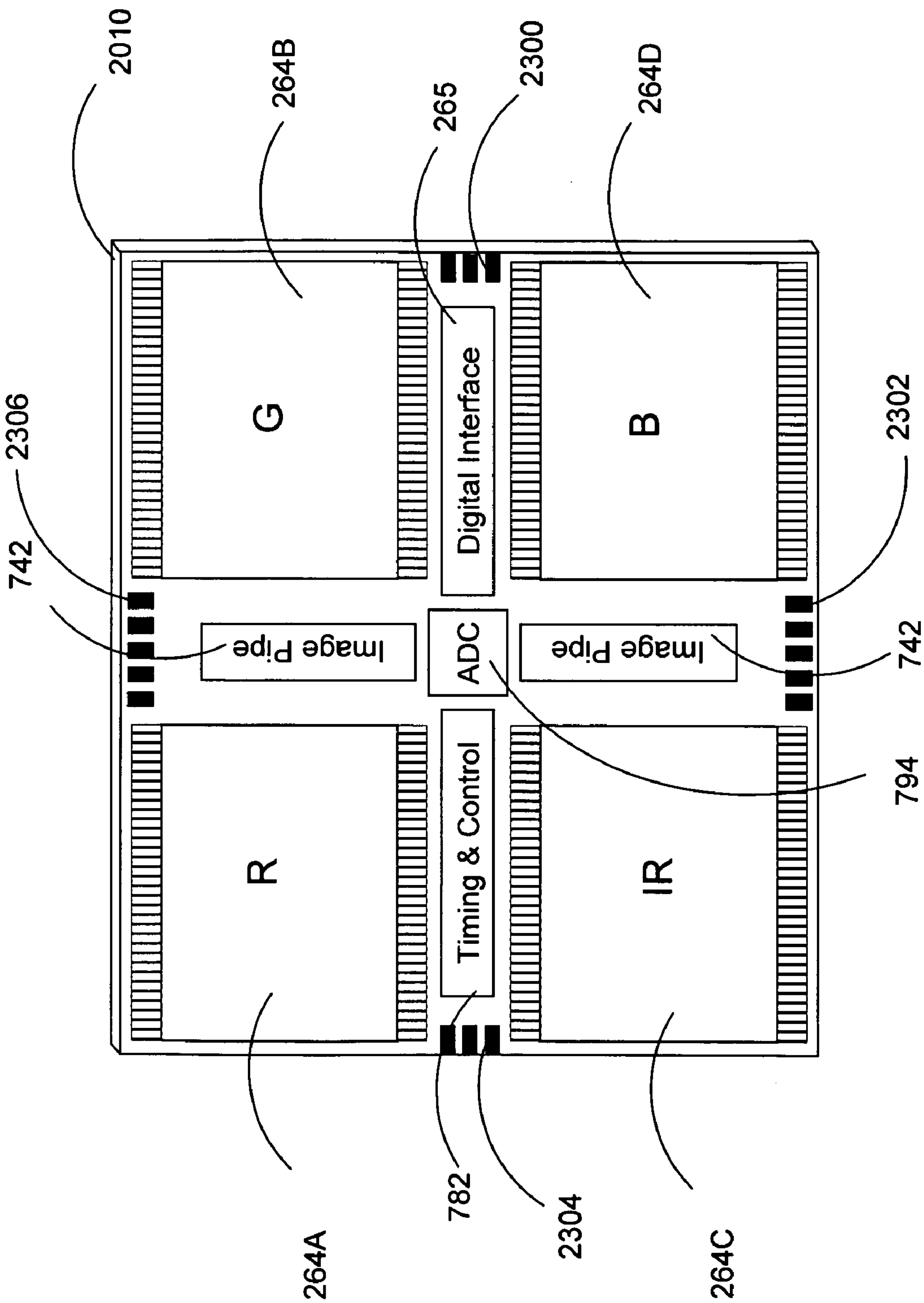

Referring to FIG. 103A, in one such configuration, the first integrated circuit 2010 includes four sensor portions, e.g., sensor portions 264A-264D, of four camera channels, e.g., camera channels 260A-260D (FIG. 4). One of such camera channels, e.g., camera channel 264A, is a red camera channel, one of such camera channels, e.g., camera channel 260B, is a green camera channel, one of such camera channels, e.g., camera channel 260D is a blue camera channel, and one camera channel, e.g., camera channel 260C is an infrared camera channel.

The first integrated circuit 2010 further includes a plurality of portions of the processor 265 (FIG. 4), including an analog converter 794, image pipeline 742, timing and control 782, and a digital interface for the processor 265. The first integrated circuit 2010 further includes a plurality of conductive pads, e.g., pads 2300, 2302, 2304, 2306, disposed in a plurality of pad regions.

Figure 103B:
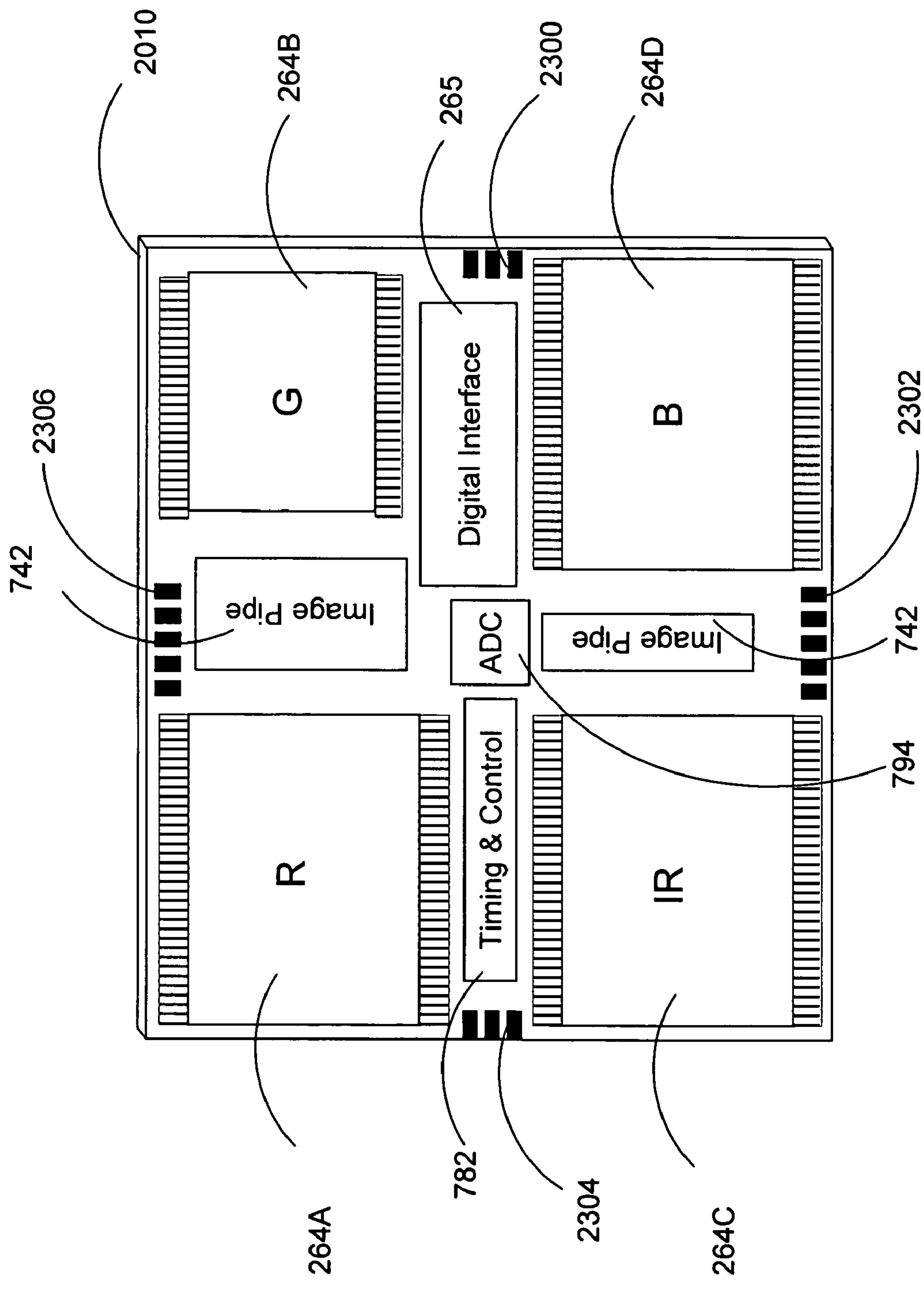

Referring to FIG. 103B, in another such configuration, the first integrated circuit 2010 includes four sensor portions, e.g., sensor portions 264A-264D, of four camera channels, e.g., camera channels 260A-260D (FIG. 4). One of such camera channels, e.g., camera channel 264A, is a red camera channel, one of such camera channels, e.g., camera channel 260B, is a green camera channel, one of such camera channels, e.g., camera channel 260D is a blue camera channel, and one camera channel, e.g., camera channel 260C is an infrared camera channel.

The first integrated circuit 2010 further includes a plurality of portions of the processor 265 (FIG. 4), including an analog converter 794, image pipeline 742, timing and control 782, and a digital interface for the processor 265.

The first integrated circuit die 2010 further includes a plurality of conductive pads, e.g., pads 2300, 2302, 2304, 2306, disposed in a plurality of pad regions.

Figure 103C:
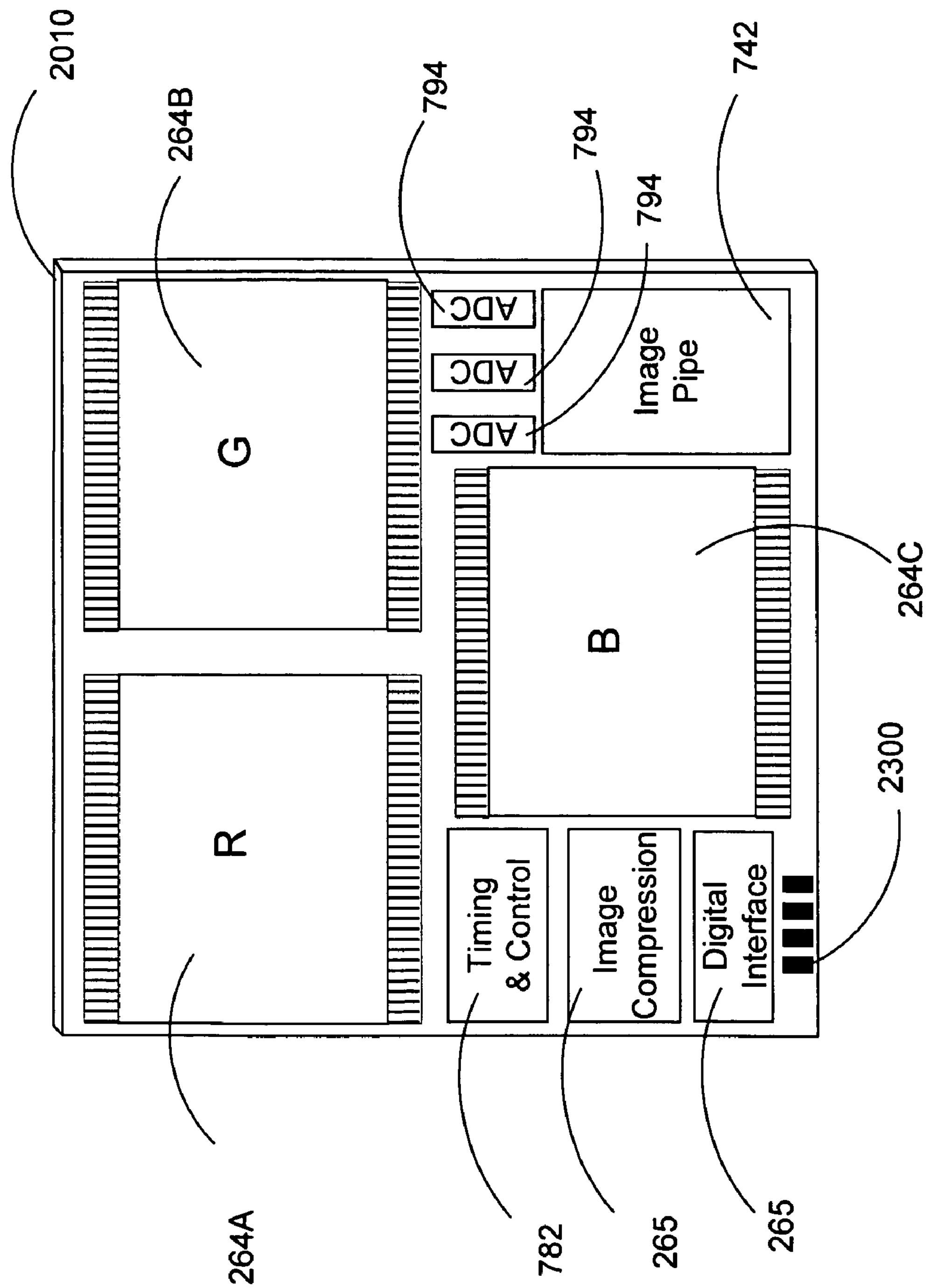

Referring to FIG. 103C, in another such configuration, the first integrated circuit 2010 includes three sensor portions, e.g., sensor portions 264A-264C, of three camera channels, e.g., camera channels 260A-260C (FIG. 4). One of such camera channels, e.g., camera channel 264A, is a red camera channel, one of such camera channels, e.g., camera channel 260B, is a green camera channel, one of such camera channels, e.g., camera channel 260D is a blue camera channel. The three sensors may be located in a symmetrical arrangement, for example, for circuitry compactness and symmetry in optical collection.

The first integrated circuit 2010 further includes a plurality of portions of the processor 265 (FIG. 4), including analog converters 794, image pipeline 742, timing and control 782, an image compression portion of the processor 265 and a digital interface for the processor 265.

The first integrated circuit die 2010 further includes a plurality of conductive pads, e.g., pad 2300, disposed in a pad region.

Figure 103D:
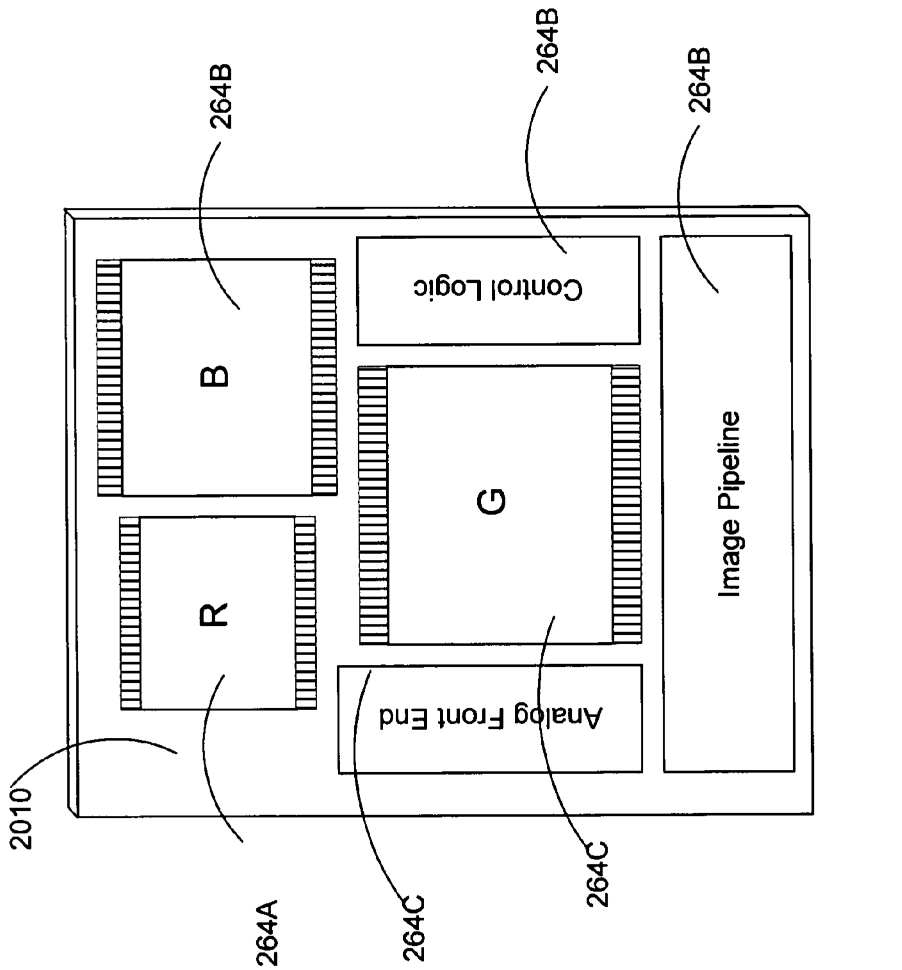

Referring to FIG. 103D, in another such configuration, the first integrated circuit 2010 includes three sensor portions, e.g., sensor portions 264A-264C, of three camera channels, e.g., camera channels 260A-260C (FIG. 4). One of such camera channels, e.g., camera channel 264A, is a red camera channel, one of such camera channels, e.g., camera channel 260B, is a green camera channel, one of such camera channels, e.g., camera channel 260D is a blue camera channel. In some embodiments, each sensor design, operation, array, pixel size and optical design is optimized for each color.

The first integrated circuit 2010 further includes a plurality of portions of the processor 265 (FIG. 4), including a control logic portion of the processor 265, image pipeline 742, timing and control 782, and an analog front end portion of the processor 265.

FIG. 104A is a representation of another sensor configuration that may be employed in one or more camera channels of the digital camera apparatus 210. This configuration includes three sensor portions, e.g., sensor portions 264A-264C, each of which has a different size than the others. For example, a first one of the sensor portions, e.g., sensor portion 264A, is smaller in size than a second one of the sensor portions, e.g., sensor portion 264B, which is in turn smaller in size than a third one of the sensor portions, e.g., sensor portion 264C.

In some embodiments, one of the sensor portions, e.g., first sensor portion 264A, is employed in a red camera channel. One of the sensor portions, e.g., sensor portion 264B, is employed in a blue camera channel. One of the sensor portions, e.g., sensor portion 264C, is employed in a green camera channel.

FIGS. 104B-104C are representations of the sensor portion 264A and circuits connected thereto. FIGS. 104D-104E are representations of the sensor portion 264B and circuits connected thereto. FIGS. 104F-104G are representations of the sensor portion 264C and circuits connected thereto. In some embodiments, the smallest sensor portion, e.g., sensor portion 264A, has a resolution that is smaller than the resolution of the second smallest sensor portion, e.g., sensor portion 264B, which has a resolution that is smaller than the resolution of the largest sensor portion, e.g., sensor portion 264C. For example, the smallest sensor portion, e.g., sensor portion 264A, may have fewer pixels than is provided in the second smallest sensor portion, e.g., sensor portion 264B, for a comparable portion of the field of view, and the second smallest sensor portion, e.g., sensor portion 264B, may fewer pixels than is provided in the largest sensor portion, e.g., sensor portion 264C, for a comparable portion of the field of view. In one embodiment, for example, the number of pixels in the second smallest sensor portion, e.g., sensor portion 264B, is forty four percent greater than the number of pixels in the smallest sensor portion, e.g., sensor portion 264A, for a comparable portion of the field of view, and the number of pixels in the largest sensor portion, e.g., sensor portion 264C, is thirty six percent greater than the number of pixels in the second smallest sensor portion 264B, for a comparable portion of the field of view. It should be understood, however, that any other sizes and/or architectures may also be employed.

As stated above, a camera channel may have any configuration. For example, some embodiments employ an optics design having a single lens element. Some other embodiments employ a lens having multiple lens elements (e.g., two or more elements). Lenses with multiple lens elements may be used, for example, to help provide better optical performance over a broad wavelength band (such as conventional digital imagers with color filter arrays on the sensor arrays). In some embodiments, additional features such as polarizers can be added to the optical system, for example, to enhance image quality. Further, a filter may be implemented, for example, as a separate element or as a coating disposed on the surface of a lens. The coating may have any suitable thickness and may be, for example, relatively thin compared to the thickness of a lens. In some embodiments, the optical portion of each camera channel is a single color band, multiple color band or broadband. In some embodiments, color filtering is provided by the optical portion of color camera channel.

As stated above, the portions of an optics portion may be separate from one another, integral with one another and/or any combination thereof. If the portions are separate, they may be spaced apart from one another, in contact with one another or any combination thereof. For example, two or more separate lens elements may be spaced apart from one another, in contact with one another, or any combination thereof. Thus, some embodiments of the optics portion may be implemented with the lens elements spaced apart from one another or with two or more of the lens elements in contact with one another.

In some embodiments, a Bayer pattern is disposed on the sensor. In some embodiments, the sensor portion for a camera channel may be adapted for optimized operation by features such as array size, pixel size, pixel design, image sensor design, image sensor integrated circuit process and/or electrical circuit operation.

As with each of the embodiments disclosed herein, it should be understood that any of such techniques may be employed in combination with any of the embodiments disclosed herein, however, for purposes of brevity, such embodiments may or may not be individually shown and/or discussed herein.

FIGS. 105A-105D are a block diagram representation of an integrated circuit die 2010, and a post processor 744 coupled thereto. In this embodiment, the integrated circuit die 2010 includes three sensors, e.g., 264A-264C, an image pipeline 742 and system control 746. The inputs of channel processors 740A-740C are coupled to outputs of sensors 264A-264C, respectively. The outputs of the channel processors 740A-740C is supplied to the input of the image pipeline 742. The output of the image pipeline 742 is supplied to post processor 744.

The image pipeline includes a color plane integrator 830, parallax increase/decrease 2320, a channel mapper 2322, pixel binning and windowing 762, image interpolation 2324, auto white balance 850, sharpening 844, color balance 2326, gamma correction 840, color space conversion 856.

The post processor 744 includes down sampling 792, a JPEG encoder 770, frame buffer 2328 and output interface (e.g., CCIR 656/Parallel Interface) 772. The system control 746 includes configuration registers 780, timing and control 782, camera control/HLL IF 784, serial control interface 786, power management 788, and voltage regulations power control 790.

Other embodiments of sensors, channel processors, image pipelines, image post processors, and system control are disclosed in the Apparatus for Multiple Camera Devices and Method of Operating Same patent application publication. As stated above, the structures and/or methods described and/or illustrated in the Apparatus for Multiple Camera Devices and Method of Operating Same patent application publication may be employed in conjunction with one or more of aspects and/or embodiments of the present inventions.

Thus, for example, one or more portions of one or more embodiments of sensors, channel processors, image pipelines, image post processors, and/or system control disclosed in the Apparatus for Multiple Camera Devices and Methods of Operating Same patent application publication may be employed in a digital camera apparatus 210 having one or more actuators, e.g., e.g., actuator 430A-430D, 434A-434D, 438A-438D, 442A-442D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), for example, to move one or more portions of one or more optics portion and/or to move one or more portions of one or more sensor portions. In addition, in some embodiments, for example, one or more actuators, e.g., e.g., actuator 430A-430D, 434A-434D, 438A-438D, 442A-442D (see, for example, FIGS. 15A-15L, 16A-16E, 17A-17I, 18A-18E, 19A-19J, 20A-20D, 21A-21D, 22, 23A-23D, 24A-24D, 25A-25D, 26A-26D, 27A-27D, 28A-28D, 29, 30, 31A-31N, 32A-32P), may be employed in one or more embodiments of the digital camera apparatus 300 disclosed in the Apparatus for Multiple Camera Devices and Method of Operating Same patent application publication, for example, to move one or more portions of one or more optics portion and/or to move one or more portions of one or more sensor portions. In some For the sake of brevity, the structures and/or methods described and/or illustrated in the Apparatus for Multiple Camera Devices and Method of Operating Same patent application publication will not be repeated. It is expressly noted, however, that the entire contents of the Apparatus for Multiple Camera Devices and Method of Operating Same patent application publication, including, for example, the features, attributes, alternatives, materials, techniques and advantages of all of the inventions, are incorporated by reference herein, although, unless stated otherwise, the aspects and/or embodiments of the present invention are not limited to such features, attributes alternatives, materials, techniques and advantages.

FIG. 106 is a block diagram representation of another embodiment. This embodiment includes channel processors 740A-740C, an image pipeline 742, a post processor 744 and system control 746. The outputs of the channel processors 740A-740C is supplied to the input of the image pipeline 742. The output of the image pipeline 742 is supplied to the input of the post processor 744.

Each channel processor 740A-740C includes active noise reduction, analog signal processor, exposure control, an analog to digital converter, black level clamp and deviant pixel correction. The image pipeline includes a color plane integrator 830, parallax increase/decrease 2320, a channel mapper 2322, pixel binning and windowing 762, image interpolation 2324, auto white balance 850, sharpening 844, color balance 2326, gamma correction 840, and color space conversion 856.

The post processor 744 includes down sampling 792, a JPEG encoder 770, frame buffer 2328 and output interface (e.g., CCIR 656/Parallel Interface) 772. The system control 746 includes configuration registers 780, timing and control 782, camera control/HLL IF 784, serial control interface 786, power management 788, and voltage regulations power control 790.

FIGS. 107A-107B are views of one embodiment of a lens used an optics portion that is adapted for use in a red camera channel and comprises a stack of three lenslets. Also represented is the light transmitted by the stack. In this embodiment, the lens 2410 includes three lenslets, i.e., a first lenslet 2412, a second lenslet 2414 and a third lenslet 2416, arranged in a stack 2418. The lens 2410 receives light from within a field of view and transmits and/or shapes at least a portion of such light to produce an image in an image area at an image plane 2419. More particularly, the first lenslet 2412 receives light from within a field of view and transmits and/or shapes at least a portion of such light. The second lenslet 2414 receives at least a portion of the light transmitted and/or shaped by the first lenslet and transmits and/or shapes a portion of such light. The third lenslet 2416 receives at least a portion of the light transmitted and/or shaped by the second lenslet and transmits and/or shapes a portion of such light to produce the image in the image area at the image plane 2419.

FIGS. 108A-108B are views of one embodiment of a lens used in an optics portion that is adapted for use in a green camera channel and comprises a stack of three lenslets. Also represented is the light transmitted by the stack. In this embodiment, the lens 2420 includes three lenslets, i.e., a first lenslet 2422, a second lenslet 2424 and a third lenslet 2426, arranged in a stack 2428. The stack 2428 receives light from within a field of view and transmits and/or shapes at least a portion of such light to produce an image in an image area at an image plane 2429. More particularly, the first lenslet 2422 receives light from within a field of view and transmits and/or shapes at least a portion of such light. The second lenslet 2424 receives at least a portion of the light transmitted and/or shaped by the first lenslet and transmits and/or shapes a portion of such light. The third lenslet 2426 receives at least a portion of the light transmitted and/or shaped by the second lenslet and transmits and/or shapes a portion of such light to produce the image in the image area at the image plane 2429.

FIGS. 109A-109B are views of one embodiment of a lens used in an optics portion that is adapted for use in a blue camera channel and comprises a stack of three lenslets. Also represented is the light transmitted by the stack. In this embodiment, the lens 2430 includes three lenslets, i.e., a first lenslet 2432, a second lenslet 2434 and a third lenslet 2436, arranged in a stack 2438. The lens 2430 receives light from within a field of view and transmits and/or shapes at least a portion of such light to produce an image in an image area at an image plane 2439. More particularly, the first lenslet 2432 receives light from within the field of view and transmits and/or shapes at least a portion of such light. The second lenslet 2434 receives at least a portion of the light transmitted and/or shaped by the first lenslet and transmits and/or shapes a portion of such light. The third lenslet 2436 receives at least a portion of the light transmitted and/or shaped by the second lenslet and transmits and/or shapes a portion of such light to produce the image in the image area at the image plane 2439.

As with each of the aspects and/or embodiments disclosed herein, these embodiments may be employed alone or in combination with one or more of the other embodiments (or portions thereof) disclosed and/or illustrated herein. In addition, each of the aspects and/or embodiments disclosed herein may also be employed in association with other structures and/or methods now known or later developed.

It should also be understood that although the digital camera apparatus 210 is shown employed in a digital camera 200, the present invention is not limited to such. Indeed, the digital camera apparatus 210 and/or any of the methods and/or apparatus that may be employed therein may be used by itself or in any type of device, including for example, but not limited to, still and video cameras, cell phones, other personal communications devices, surveillance equipment, automotive applications, computers, manufacturing and inspection devices, toys, and/or a wide range of other and continuously expanding applications.

Moreover, other devices that may employ a digital camera apparatus and/or any of the methods and/or apparatus that may be employed therein may or may not include the housing 240, circuit board 236, peripheral user interface 232, power supply 224, electronic image storage media 220 and aperture 250 depicted in FIG. 3 (for example, the circuit board may not be unique to the camera function but rather the digital camera apparatus may be an add-on to an existing circuit board, such as in a cell phone) and may or may not employ methods and/or apparatus not shown in FIG. 3.

A digital camera may be a stand-alone product or may be imbedded in other appliances, such as cell phones, computers or the myriad of other imaging platforms now available or may be created in the future, including, but not limited to, those that become feasible as a result of this invention.

One or more aspects and/or embodiments of the present invention may have one or more of the advantages below. A device according to the present invention can have multiple separate arrays on a single image sensor, each with its own lens. The simple geometry of a smaller, multiple arrays allows for a smaller lens (diameter, thickness and focal length), which allows for reduced stack height in the digital camera.

Each array can advantageously be focused on one band of visible spectrum. Among other things, each lens may be tuned for passage of that one specific band of wavelength. Since each lens would therefore not need to pass the entire light spectrum, the number of elements will be reduced, likely to one or two.

Further, due to the focused bandwidth for each lens, each of the lenses may be dyed during the manufacturing process for its respective bandwidth (e.g., red for the array targeting the red band of visible spectrum). Alternatively, a single color filter may be applied across each lens. This process eliminates the traditional color filters (the sheet of individual pixel filters) thereby reducing cost, improving signal strength and eliminating the pixel reduction barrier.

In some embodiments, once the integrated circuit die with the sensor portions (and possibly one or more portions of the processor) have been assembled, the assembly is in the form of a hermetically sealed device. Consequently, such device does not need a "package" and as such, if desired, can be mounted directly to a circuit board which in some embodiments saves part cost and/or manufacturing costs. However, unless stated otherwise, such advantages are not required and need not be present in aspects and/or embodiments of the present invention.

As stated above, the method and apparatus of the present invention is not limited to use in digital camera systems but rather may be used in any type of system including but not limited to any type of information system. In addition, it should be understood that the features disclosed herein can be used in any combination.

A mechanical structure may have any configuration. Moreover, a mechanical structure may be, for example, a whole mechanical structure, a portion of a mechanical structure and/or a mechanical structure that together with one or more other mechanical structures forms a whole mechanical structure, element and/or assembly.

As used herein, the term "portion" includes, but is not limited to, a part of an integral structure and/or a separate part or parts that together with one or more other parts forms a whole element or assembly. For example, some mechanical structures may be of single piece construction or may be formed of two or more separate pieces. If the mechanical structure is of a single piece construction, the single piece may have one or more portions (i.e., any number of portions). Moreover, if a single piece has more than one portion, there may or may not be any type of demarcation between the portions. If the mechanical structure is of separate piece construction, each piece may be referred to as a portion. In addition, each of such separate pieces may itself have one or more portions. A group of separate pieces that collectively represent part of a mechanical structure may also be referred to collectively as a portion. If the mechanical structure is of separate piece construction, each piece may or may not physically contact one or more of the other pieces.

Note that, except where otherwise stated, terms such as, for example, “comprises”, “has”, “includes”, and all forms thereof, are considered open-ended, so as not to preclude additional elements and/or features. Also note that, except where otherwise stated, terms such as, for example, “in response to” and “based on” mean “in response at least to” and “based at least on”, respectively, so as not to preclude being responsive to and/or based on, more than one thing. Also note that, except where otherwise stated, terms such as, for example, “move in the direction” and “movement in the direction” mean “move in at least the direction” and “movement in at least the direction”, respectively, so as not to preclude moving and/or movement in more than one direction at a time and/or at different times. It should be further noted that unless specified otherwise, the term MEMS, as used herein, includes microelectromechanical systems, nanoelectromechanical systems and combinations thereof.

In addition, as used herein identifying, determining, and generating includes identifying, determining, and generating, respectively, in any way, including, but not limited to, computing, accessing stored data and/or mapping (e.g., in a look up table) and/or combinations thereof.

While there have been shown and described various embodiments, it will be understood by those skilled in the art that the present invention is not limited to such embodiments, which have been presented by way of example only, and various changes and modifications may be made without departing from the scope of the invention.

What is claimed is:

1. A digital camera comprising:

an array of photo detectors configured to sample an intensity of light;

an optics portion disposed in an optical path of the array of photo detectors;

a processor operatively coupled to the array of photo detectors, wherein the processor is configured to generate an image based at least in part on data which is representative of the intensity of light sampled by the array of photo detectors; and a first actuator configured to provide relative movement between at least a portion of the array of photo detectors and at least a portion of the optics portion, wherein the first actuator is further configured to receive an actuator control signal from the processor, and wherein the movement between at least the portion of the array of photo detectors and at least the portion of the optics portion is in response to the actuator control signal.

2. The digital camera of claim 1, wherein the first actuator is coupled to the array of photo detectors so that the array of photo detectors moves relative to the optics portion.

3. The digital camera of claim 1, wherein the first actuator is coupled to the array of photo detectors, and further comprising a second actuator coupled to the optics portion.

4. The digital camera of claim 1, wherein the first actuator is configured to move at least the portion of the optics portion in a direction parallel to an image plane defined by the array of photo detectors.

5. The digital camera of claim 1, wherein the first actuator is configured to move at least the portion of the optics portion in a direction perpendicular to an image plane defined by the array of photo detectors.

6. The digital camera of claim 1, wherein the first actuator is configured to move at least the portion of the optics portion in a direction oblique to an image plane defined by the array of photo detectors.

7. The digital camera of claim 1, wherein the first actuator is configured to provide angular movement of at least the portion of the array of photo detectors relative to at least the portion of the optics portion.

8. The digital camera of claim 1, wherein the array of photo detectors-and the processor are integrated on or in a semiconductor substrate.

9. The digital camera of claim 1, wherein the image is based on first data representative of the intensity of light sampled by the array of photo detectors when the array of photo detectors is at a first position relative to the optics portion, and second data representative of the intensity of light sampled by the array of photo detectors when the array of photo detectors is at a second position relative to the optics portion.

10. The digital camera of claim 1, wherein the portion of the optics portion comprises a lens.

11. The digital camera of claim 1, wherein the portion of the optics portion comprises a filter.

12. The digital camera of claim 1, wherein the portion of the optics portion comprises at least one of a mask or a polarizer.

13. The digital camera of claim 1, wherein the processor is further configured to receive an input signal indicative of an operating mode, and to control the first actuator based at least in part on the input signal.

14. The digital camera of claim 1, wherein the light sampled by the array of photo detectors has a wavelength specific to the array of photo detectors.

15. The digital camera of claim 14, wherein the optics portion passes the light having the wavelength onto an image plane of the array of photo detectors.

16. The digital camera of claim 14, wherein the optics portion is configured to filter light that does not have the wavelength specific to the array of photo detectors.

17. The digital camera of claim 1, further comprising a positioner configured to define a seat for the optics portion.

18. The digital camera of claim 17, wherein the positioner is further configured to define the optical path.

19. The digital camera of claim 17, wherein the first actuator is coupled to the positioner to provide movement of at least the portion of the optics portion.

20. The digital camera of claim 17, further including an integrated circuit die that includes the array of photo detectors.

21. The digital camera of claim 20, wherein the positioner is disposed superjacent the integrated circuit die.

22. The digital camera of claim 20, wherein the positioner is bonded to the integrated circuit die.

23. The digital camera of claim 20, further comprising a spacer disposed between the positioner and the integrated circuit die, wherein the spacer is bonded to the integrated circuit die and the positioner is bonded to the spacer.

24. The digital camera of claim 1, wherein the first actuator is configured to move the portion of the optics portion along a first axis.

25. The digital camera of claim 24, wherein the first actuator is further configured to move at least the portion of the optics portion along a second axis, wherein the second axis is different than the first axis.

26. The digital camera of claim 1, wherein the first actuator comprises a micro-electromechanical systems (MEMS) actuator.

27. A method comprising:

causing a first actuator to provide movement between an array of photo detectors of a digital camera and a lens of the digital camera so that the array of photo detectors and the lens are in a first position, wherein the lens is disposed in an optical path of the array of photo detectors, wherein the first actuator is caused to provide the movement in response to an actuator control signal;

sampling an intensity of light with the array of photo detectors and the lens while the array of photo detectors and the lens are in the first position; and generating an image based at least in part on data which is representative of the intensity of the light.

28. The method of claim 27, wherein the first actuator is configured to move the array of photo detectors relative to the lens.

29. The method of claim 27, wherein the first actuator is configured to move the lens relative to the array of photo detectors.

30. The method of claim 27, further comprising causing a second actuator to provide additional movement between the array of photo detectors and the lens so that the array of photo detectors and the lens are in the first position, wherein the first actuator is configured to move the array of photo detectors and the second actuator is configured to move the lens.

31. The method of claim 27, further comprising:

causing the first actuator to provide movement between the array of photo detectors and the lens so that the array of photo detectors and the lens are in a second position; and sampling the intensity of the light with the array of photo detectors and the lens while the array of photo detectors and the lens are in the second position, wherein the data used to generate the image comprises first data representative of the intensity of the light sampled from the first position and second data representative of the intensity of the light sampled from the second position.

32. The method of claim 27, wherein the actuator control signal is based at least in part on a signal provided by the array of photo detectors.

33. The method of claim 27, wherein the actuator control signal is based at least in part on an operating mode of the digital camera.

34. The method of claim 27, wherein the first actuator is configured to move the lens in a direction parallel to an image plane defined by the array of photo detectors.

35. The method of claim 27, wherein the first actuator is configured to move the lens in a direction perpendicular to an image plane defined by the array of photo detectors.

36. The method of claim 27, further comprising filtering the light with the lens so that the light sampled by the array of photo detectors has a wavelength that is specific to the array of photo detectors.

37. An apparatus comprising:

first means for providing movement between an array of photo detectors of a digital camera and an optics portion of the digital camera so that the array of photo detectors and the optics portion are in a first position;

means for receiving an actuator control signal to control an amount of the movement between the array of photo detectors and the optics portion;

means for sampling an intensity of light incident on the array of photo detectors while the optics portion and the array of photo detectors are in the first position; and means for generating an image based at least in part on data which is representative of the intensity of the light.

38. The apparatus of claim 37, further comprising means for filtering the light with the lens so that the light sampled by the array of photo detectors has a wavelength that is specific to the array of photo detectors.

39. The apparatus of claim 37, wherein the actuator control signal is based at least in part on a signal provided by the array of photo detectors.

40. The apparatus of claim 37, wherein the means for sampling is further configured to sample the intensity of the light with the array of photo detectors and the optics portion in a second position, wherein the data used to generate the image comprises first data representative of the intensity of the light sampled from the first position and second data representative of the intensity of the light sampled from the second position.

41. The apparatus of claim 37, wherein the first means for providing movement is configured to move the array of photo detectors, and further comprising second means for providing movement that is configured to move the optics portion.

42. The apparatus of claim 37, wherein the first means for providing movement is configured to move the optics portion in a direction that is parallel or perpendicular to an image plane defined by the array of photo detectors.

43. A tangible computer-readable medium having computer-executable instructions stored thereon that, upon execution by a digital camera, cause the digital camera to perform a method comprising:

adjusting a position of a lens of the digital camera relative to an array of photo detectors of the digital camera so that the array of photo detectors and the lens are in a first position;

receiving an actuator control signal to control the adjusting of the position of the lens and the adjusting of the position of the array of photo detectors;

sampling an intensity of light with the array of photo detectors and the lens while the array of photo detectors and the lens are in the first position; and generating an image based at least in part on data which is representative of the intensity of the light.

44. The tangible computer-readable medium of claim 43, further comprising adjusting a position of the array of photo detectors relative to the lens so that the array of photo detectors and the lens are in the first position.

45. The tangible computer-readable medium of claim 43, wherein the actuator control signal is based at least in part on one or more of a signal provided by the array of photo detectors or an operating mode of the digital camera.

* * * * *